US012583878B2

(12) United States Patent
Chen et al.

(10) Patent No.: US 12,583,878 B2
(45) **Date of Patent: *Mar. 24, 2026**

(54) ORGANIC ELECTROLUMINESCENT MATERIALS AND DEVICES

(71) Applicant: UNIVERSAL DISPLAY CORPORATION, Ewing, NJ (US)

(72) Inventors: Hsiao-Fan Chen, Lawrence Township, NJ (US); Rasha Hamze, Philadelphia, PA (US); Neil Palmer, Frenchtown, NJ (US); Morgan C. MacInnis, Yardley, PA (US); George Fitzgerald, Lambertville, NJ (US); Elena Sheina, Langhorne, PA (US); Scott Beers, Flemington, NJ (US); Jason Brooks, Philadelphia, PA (US); Alexey Borisovich Dyatkin, Ambler, PA (US); Suman Layek, Pennington, NJ (US); Jui-Yi Tsai, Newtown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 1074 days.

This patent is subject to a terminal disclaimer.

(21) Appl. No.: 17/584,471

(22) Filed: Jan. 26, 2022

(65) Prior Publication Data

US 2022/0162246 A1 May 26, 2022

Related U.S. Application Data

(63) Continuation-in-part of application No. 17/482,695, filed on Sep. 23, 2021, now Pat. No. 12,460,128.

(Continued)

(51) Int. Cl.
*C07F 15/00* (2006.01)
*H10K 85/30* (2023.01)
(Continued)

(52) U.S. Cl.
CPC ....... *C07F 15/0086* (2013.01); *H10K 85/346* (2023.02); *H10K 85/40* (2023.02);
(Continued)

(58) Field of Classification Search
CPC ....... H10K 85/341–348; H10K 85/371; H10K 85/346
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 113793910 12/2021
CN 115448932 12/2022
(Continued)

OTHER PUBLICATIONS

FIT translation of JP_6119375_B2 (Year: 2025).*
Google Translation of KR 20160082871 A (Year: 2025).*

*Primary Examiner* — Michael M Dollinger
(74) *Attorney, Agent, or Firm* — DUANE MORRIS LLP

(57) ABSTRACT

Provided are organometallic compounds including a ligand $L_A$ of a structure of Formula I
(Continued)

Formula I

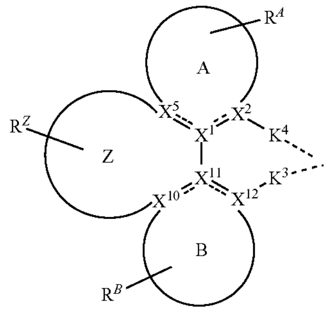

Also provided are formulations including these organometallic compounds. Further provided are OLEDs and related consumer products that utilize these organometallic compounds.

20 Claims, 2 Drawing Sheets

Related U.S. Application Data

(60) Provisional application No. 63/179,695, filed on Apr. 26, 2021, provisional application No. 63/086,993, filed on Oct. 2, 2020.

(51) Int. Cl.
*H10K 85/40* (2023.01)
*H10K 85/60* (2023.01)
*H10K 50/11* (2023.01)
*H10K 50/12* (2023.01)
*H10K 101/10* (2023.01)
*H10K 101/30* (2023.01)
*H10K 101/40* (2023.01)

(52) U.S. Cl.
CPC ......... *H10K 85/622* (2023.02); *H10K 85/624* (2023.02); *H10K 85/626* (2023.02); *H10K 85/633* (2023.02); *H10K 85/654* (2023.02); *H10K 85/6572* (2023.02); *H10K 85/6574* (2023.02); *H10K 85/6576* (2023.02); *H10K 85/658* (2023.02); *H10K 50/11* (2023.02); *H10K 50/12* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 11,081,659 | B2 | 8/2021 | Chen et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Garashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2013/0082248 | A1* | 4/2013 | Groarke .............. C07F 15/0033 257/40 |
| 2020/0017536 | A1* | 1/2020 | Boudreault ........ H10K 85/6576 |
| 2020/0295281 | A1 | 9/2020 | Chen et al. |
| 2021/0040129 | A1 | 2/2021 | Macinnis et al. |
| 2024/0284785 | A1* | 8/2024 | Lee .................... H10K 85/6572 |

FOREIGN PATENT DOCUMENTS

| | | | | |
|---|---|---|---|---|
| JP | 2012164731 A | * | 8/2012 | |
| JP | 6119375 B2 | | 4/2017 | |
| KR | 10-2016-0082871 | | 7/2016 | |
| WO | WO-2011134013 A1 | * | 11/2011 | ............. H05B 33/10 |
| WO | WO-2019079508 A2 | * | 4/2019 | ........... H10K 85/341 |

* cited by examiner

ORGANIC ELECTROLUMINESCENT MATERIALS AND DEVICES

This application is a continuation-in-part of co-pending U.S. patent application Ser. No. 17/482,695, filed on Sep. 23, 2021, which in turn claims priority under 35 U.S.C. § 119(e) to U.S. Provisional Application No. 63/086,993, filed on Oct. 2, 2020, and to U.S. Provisional Application No. 63/179,695, filed on Apr. 26, 2021, the entire contents of all the above applications are incorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising a ligand $L_A$ of a structure of Formula I

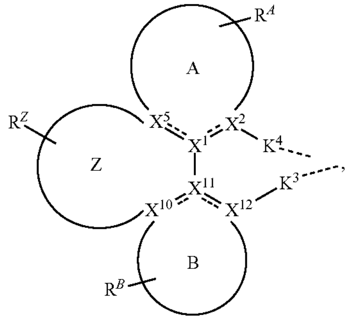

wherein moieties A and B can be each independently a monocyclic or polycyclic fused ring structure comprising 5-membered and/or 6-membered carbocyclic or heterocyclic rings; ring Z is a 7-, 8-, 9-, or 10-membered ring; $X^1$, $X^2$, $X^5$, $X^{10}$, $X^{11}$, and $X^{12}$ are each independently C or N, with at least one of $X^1$ or $X^{11}$ being C; ---- is either a single bond or a double bond; $K^3$ and $K^4$ are each independently selected from the group consisting of a direct bond, O, and S; $R^A$, $R^B$, and $R^Z$ each independently represent zero, mono, or up to a maximum allowed number of substitutions to its associated ring; each of $R^A$, $R^B$, and $R^Z$ is independently a hydrogen or a substituent selected from the group consisting of the general substituents defined herein; and any two adjacent $R^A$, $R^B$, or $R^Z$ can be joined or fused to form a ring, wherein the ligand $L_A$ is coordinated to a metal M through the two indicated dashed lines; wherein M is selected from the group consisting of Ru, Os, Ir, Pd, Pt, Cu, Ag, and Au, and can be coordinated to other ligands; and wherein the ligand $L_A$ can be joined with other ligands to form a tridentate, tetradentate, pentadentate, or hexadentate ligand.

In another aspect, the present disclosure provides a formulation of a compound comprising a ligand $L_A$ of Formula I as described herein.

In yet another aspect, the present disclosure provides an OLED having an organic layer comprising a compound comprising a ligand $L_A$ of Formula I as described herein.

In yet another aspect, the present disclosure provides a consumer product comprising an OLED with an organic layer comprising a ligand $L_A$ of Formula I as described herein.

DETAILED DESCRIPTION

A. Terminology

Figure 1:
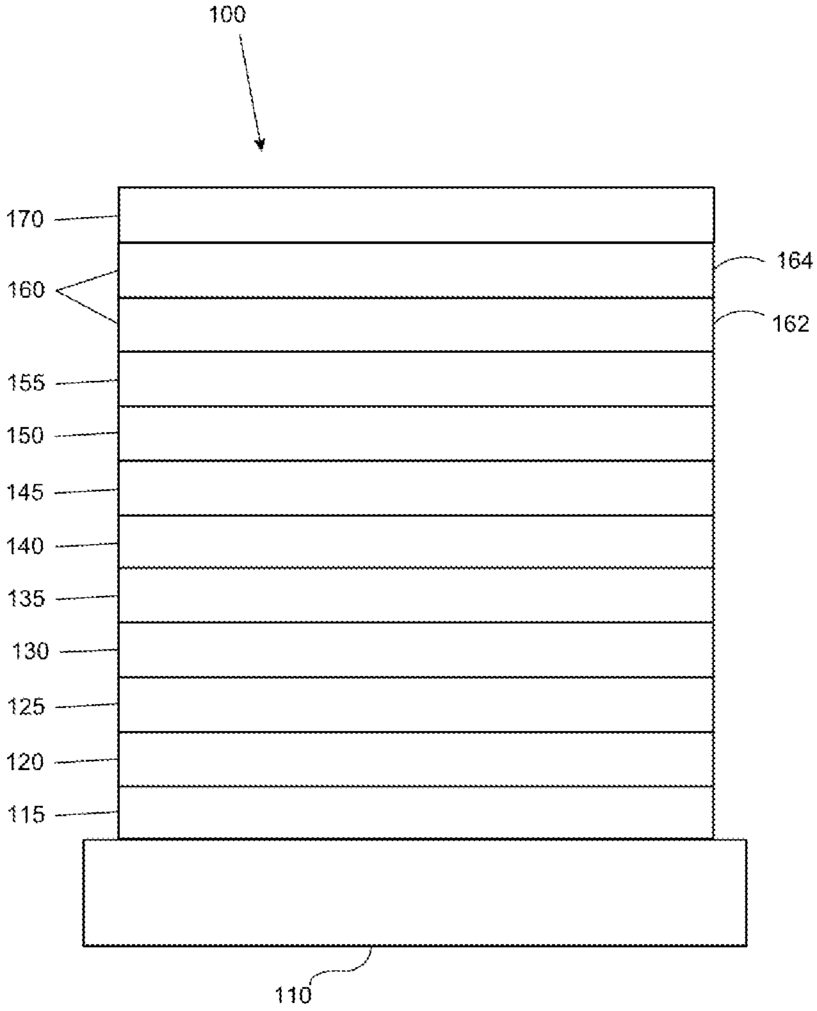
FIG. 1 shows an organic light emitting device.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "selenyl" refers to a $—SeR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each $R_s$ can be same or different.

The term "silyl" refers to a $—Si(R_s)_3$ radical, wherein each $R_s$ can be same or different.

The term "germyl" refers to a $—Ge(R_s)_3$ radical, wherein each $R_s$ can be same or different.

The term "boryl" refers to a $—B(R_s)_2$ radical or its Lewis adduct $—B(R_s)_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in abiphenyl, or 1, 8 position in a naphthalene, as long as they can form a stable fused ring system.

B. The Compounds of the Present Disclosure

In one aspect, the present disclosure provides a compound comprising a ligand $L_A$ of a structure of Formula I

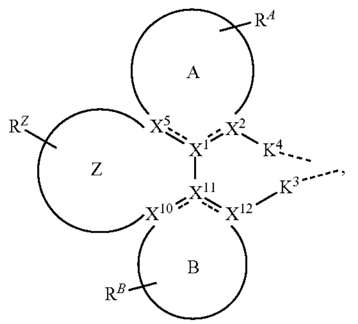

wherein:

moieties A and B can be each independently a monocyclic or polycyclic fused ring structure comprising 5-membered and/or 6-membered carbocyclic or heterocyclic rings;

ring Z is a 7-, 8-, 9-, or 10-membered ring;

$X^1$, $X^2$, $X^5$, $X^{10}$, $X^{11}$, and $X^{12}$ are each independently C or N, with at least one of $X^1$ or $X^{11}$ being C;

==== is either a single bond or a double bond;

$K^3$ and $K^4$ are each independently selected from the group consisting of a direct bond, O, and S;

$R^A$, $R^B$, and $R^Z$ each independently represent zero, mono, or up to a maximum allowed number of substitutions to its associated ring;

each of $R^A$, $R^B$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two adjacent $R^A$, $R^B$, or $R^Z$ can be joined or fused to form a ring, wherein the ligand $L_A$ is coordinated to a metal M through the two indicated dashed lines;

wherein M is selected from the group consisting of Ru, Os, Ir, Pd, Pt, Cu, Ag, and Au, and can be coordinated to other ligands; and wherein the ligand $L_A$ can be joined with other ligands to form a tridentate, tetradentate, pentadentate, or hexadentate ligand.

In some embodiments, each of $R^A$, $R^B$, and $R^Z$ can be independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some embodiments, at least one of $K^3$ and $K^4$ can be a direct bond. In some embodiments, each of $K^3$ and $K^4$ can be a direct bond. In some embodiments, one of $K^3$ and $K^4$ can be O, and the other can be a direct bond. It should be understood that $K^3$ or $K^4$ can be O or S only when $X^2$ or $X^{11}$ to which $K^4$ or $K^3$ is attached is C. In another words, when $K^3$ is S or O, $X^{12}$ is C, or when $K^4$ is S or O, $X^2$ is C.

In some embodiments, when one of moiety A and moiety B is pyridine and the other is phenyl, and when ring Z is carbocyclic, then at least one $R^Z$ is not a hydrogen. In some embodiments, when moiety A is pyridine and moiety B is phenyl, and when ring Z is carbocyclic, then at least one $R^Z$ is not hydrogen. when moiety A is pyridine and moiety B is phenyl, and when ring Z is carbocyclic, then at least one $R^Z$ is a hydrogen nor an alkyl group. In some embodiments, when moiety A is pyridine and moiety B is phenyl, and when ring Z is carbocyclic, then at least one $R^Z$ is selected from the group consisting of deuterium, fluorine, cycloalkyl, heteroalkyl, alkoxy, aryloxy, amino, silyl, germyl, boryl, selenyl, alkenyl, cycloalkenyl, heteroalkenyl, aryl, heteroaryl, nitrile, isonitrile, sulfanyl, and combinations thereof. In some embodiments, when moiety A is pyridine and moiety B is phenyl, then ring Z is heterocyclic. In some embodiments, when moiety A is pyridine and moiety B is phenyl, then ring Z comprises at least one ring atom that is selected from the group consisting of N, B, O, Si, and S.

In some embodiments, $X^1$ and $X^{11}$ can be each C. In some embodiments, $X^{10}$, $X^{11}$, and $X^{12}$ can be each C. In some embodiments, $X^2$ and $X^5$ can be each N. In some embodiments, one of $X^2$ and $X^{12}$ can be N, and the other can be C. In some embodiments, both $X^2$ and $X^{12}$ can be C. In some embodiments, wherein $X^1$, $X^5$, $X^{11}$, and $X^{12}$ are each C, $X^2$ is N. Alternatively, when $X^1$, $X^2$, $X^{10}$, and $X^{11}$ are each C, $X^{12}$ is N. In some embodiments when one or both of $X^1$ and $X^{11}$ are N, at least two $R^A$ or two $R^B$ are joined to form a ring. In some embodiments when one or both of $X^1$ and $X^{11}$ are N, at least one $R^A$ or $R^B$ is joined with $R^Z$ to form a ring.

In some embodiments, moiety A and moiety B can be each a 6-membered aromatic ring. In some embodiments, moiety A can be a 5-membered aromatic ring, and moiety B can be a 6-membered aromatic ring. In some embodiments, moiety A and moiety B can be each selected from the group consisting of benzene, pyridine, pyrimidine, pyridazine, pyrazine, imidazole, pyrazole, pyrrole, oxazole, furan, thiophene, thiazole, naphthalene, quinoline, isoquinoline, quinazoline, benzofuran, benzoxazole, benzothiophene, benzothiazole, benzoselenophene, indene, indole, benzimidazole, carbazole, dibenzofuran, dibenzothiophene, quinoxaline, phthalazine, phenanthrene, phenanthridine, and fluorene.

In some embodiments, when ring A is a 5-membered or 6-membered heteroaryl group, one $R^A$ and one $R^Z$ are joined to form a ring. In some embodiments, when ring A is a 5-membered or 6-membered heteroaryl group, one $R^A$ and two or more $R^Z$ are joined to form a polycyclic fused ring system. In some embodiments, when ring A is a 5-membered heteroaryl group, one $R^A$ and one $R^Z$ are joined to form a ring. In some embodiments, when ring A is a 5-membered heteroaryl group, one $R^A$ and two or more $R^Z$ are joined to form a ring. In some embodiments, when ring A is an imidazole ring, one $R^A$ and one $R^Z$ are joined to form a ring. In some embodiments, when ring A is an imidazole ring, one $R^A$ and two or more $R^Z$ are joined to form a polycyclic fused ring system. In some of these embodiments, $X^2$ may be N, and $X^{12}$ may be C. In some of these embodiments, $X^2$ and $X^{12}$ may be both C. In these, when ring A is an imidazole ring, ring Z comprises at least one B and one O as its ring atoms. In these embodiments, when ring A is an imidazole ring, ring Z comprises at least one B and one N as its ring atoms.

In some embodiments, ring Z can be a 7-membered ring. In some embodiments, ring Z can be an 8-membered ring. In some embodiments, ring Z can be a 9-membered ring. In some embodiments, ring Z can be a 10-membered ring. In some of these embodiments when ring Z is 8-membered ring and both $X^2$ and $X^{12}$ are N, then at least one $R^Z$ is not hydrogen. In some of these embodiments when ring Z is 8-membered ring and both $X^2$ and $X^{12}$ are N, then at least one $R^Z$ may be selected from the group consisting of deuterium, fluorine, cycloalkyl, heteroalkyl, alkoxy, aryloxy, amino, silyl, germyl, boryl, selenyl, alkenyl, cycloalkenyl, heteroalkenyl, aryl, heteroaryl, nitrile, isonitrile, sulfanyl, and combinations thereof. In some of these embodiments when ring Z is 8-membered ring and both $X^2$ and $X^{12}$ are N, two or more sets of $R^Z$ may be joined to form a ring. In some embodiments, ring Z can comprise ring atoms selected from the group consisting of C, N, B, O, Si, and S. In some embodiments, ring Z can comprise ring atoms selected from the group consisting of C, N, B, and O. In some embodiments, ring Z can comprise O only once as ring atoms.

In some embodiments, two adjacent $R^Z$ can be joined to form a ring. In some embodiments, one $R^Z$ and one $R^A$ can be joined to form a ring. In some embodiments, one $R^Z$ and one $R^B$ can be joined to form a ring. In some embodiments, two adjacent $R^A$ can be joined to form a ring. In some embodiments, two adjacent $R^B$ can be joined to form a ring. In some embodiments, one $R^A$ and two or more $R^Z$ can be joined to form a polycyclic ring structure. In some embodiments, the ring can be a 5-membered or 6-membered carbocyclic or heterocyclic ring. In some embodiments, the ring can be a 5-membered or 6-membered carbocyclic or heterocyclic aromatic ring.

In some embodiments the compound can comprise a ligand $L_A$ of

Formula IA

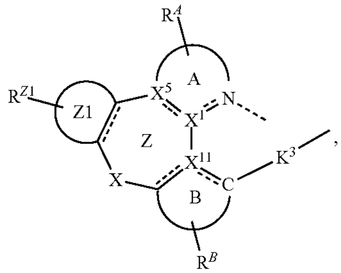

, or

Formula IB

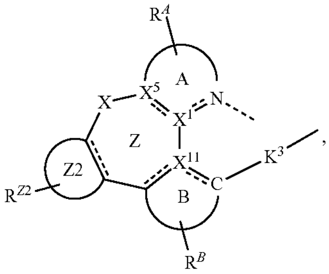

, wherein: rings Z1 and Z2 are each independently 5-membered or 6-membered carbocyclic or heterocyclic rings; X is selected from the group consisting of CRR', SiRR', C=CRR', NR, CRR'—CRR', C=NR, CR=CR, CR—NR, CRR'—O and BRR'; $R^{Z1}$ and $R^{Z2}$ each independently represent zero, mono, or up to the maximum allowed number of substitutions to its associated ring; and each of $R^{Z1}$ and $R^{Z2}$ is independently a hydrogen or a substituent selected from the group consisting of the general substituents defined herein; any two adjacent R, R', $R^A$, $R^B$, $R^{Z1}$, and $R^{Z2}$ can be joined or fused to form a ring, wherein when the ligand $L_A$ is of Formula IA, if X is CRR', SiRR', NR, or C=CRR', then R or R' forms a ring with $R^B$ or $R^{Z1}$, and R and R' do not form a ring with each other; when the ligand $L_A$ is of Formula IB, if X is CRR', SiRR', NR, or C=CRR', then R or R' does not form a ring with $R^A$, and R and R' do not form ring with each other.

In some of the above embodiments, each of R, R', $R^A$, $R^B$, $R^{Z1}$, and $R^{Z2}$ can be independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

In some of the above embodiments, each of $X^1$, $X^5$, and $X^{11}$ can be C. In some of the above embodiments, $X^5$ can be N, and each of $X^1$ and $X^{11}$ can be C.

In some of the above embodiments, moiety A can be 5-membered or 6-membered heteroaryl group. In some of the above embodiments, moiety A can be selected from the group consisting of pyridine, pyrimidine, pyridazine, pyrazine, imidazole, pyrazole, pyrrole, oxazole, thiazole, quinoline, isoquinoline, quinazoline, benzoxazole, benzothiazole, indole, benzimidazole, carbazole, quinoxaline, phthalazine, and phenanthridine.

In some of the above embodiments, moiety B can be 6-membered aryl or heteroaryl group. In some of the above embodiments, moiety B can be selected from the group consisting of benzene, pyridine, pyrimidine, pyridazine, pyrazine, naphthalene, quinoline, isoquinoline, quinazoline, benzofuran, benzoxazole, benzothiophene, benzothiazole, benzoselenophene, indene, indole, benzimidazole, carbazole, dibenzofuran, dibenzothiophene, quinoxaline, phthalazine, phenanthrene, phenanthridine, and fluorene.

In some of the above embodiments, each of ring Z1 and ring Z2 can be an aryl or heteroaryl group. In some of the above embodiments, each of ring Z1 and ring Z2 can be independently selected from the group consisting of benzene, pyridine, pyrimidine, pyridazine, pyrazine, imidazole, pyrazole, pyrrole, oxazole, furan, thiophene, thiazole, naphthalene, quinoline, isoquinoline, quinazoline, benzofuran, benzoxazole, benzothiophene, benzothiazole, benzoselenophene, indene, indole, benzimidazole, carbazole, dibenzofuran, dibenzothiophene, quinoxaline, phthalazine, phenanthrene, phenanthridine, and fluorene.

In some of the above embodiments, X can be selected from the group consisting of CRR'—CRR', C═NR, CR═CR, CR—NR, CRR'—O and BRR'. In some of the above embodiments, X can be selected from the group consisting of CRR', SiRR', NR, C═CRR', and R forms a ring with $R^B$. In some of the above embodiments, X can be selected from the group consisting of CRR', SiRR', NR, C═CRR', and R' forms a ring with $R^B$. In some of the above embodiments, X can be selected from the group consisting of CRR', SiRR', NR, C═CRR', and R forms a ring with $R^{Z1}$. In some of the above embodiments, X can be selected from the group consisting of CRR', SiRR', NR, C═CRR', and R' forms a ring with $R^{Z1}$.

In some embodiments the compound can comprise a ligand $L_A$ of a structure of

Formula IC

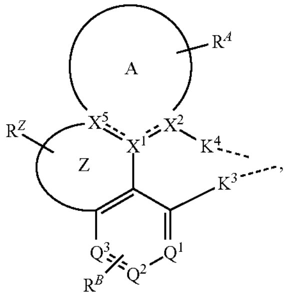

or

Formula ID

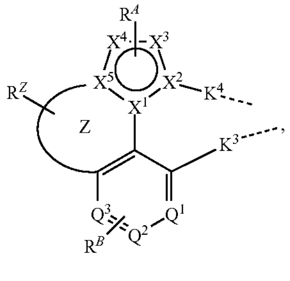

wherein:

$X^3$ and $X^4$ are each independently C or N, with at least two of $X^1$-$X^5$ being C for Formula ID;

$Q^1$-$Q^3$ are each independently C or N, with at least one of $Q^1$-$Q^3$ being C;

$K^3$ and $K^4$ are each independently selected from the group consisting of a direct bond, O, and S, with $K^4$ being a direct bond when $X^2$ is N;

the remaining variables are the same as defined with respect to Formula I of claim 1; and wherein for Formula ID, if $X^2$ and $X^5$ are both N, two neighboring $R^Z$ do not form a benzene ring fused to ring Z if ring Z is a 7-membered ring.

In some of the above embodiments, $Q^1$-$Q^3$ can be each independently C. In some of the above embodiments, one of $Q^1$-$Q^3$ can be N.

In some of the above embodiments for Formula IC or Formula ID, $X^1$ can be C. In these embodiments, $X^2$ and $X^5$ can be each N. In these embodiments, moiety A can be selected from the group consisting of benzene, pyridine, pyrimidine, pyridazine, pyrazine, imidazole, pyrazole, pyrrole, oxazole, furan, thiophene, thiazole, naphthalene, quinoline, isoquinoline, quinazoline, benzofuran, benzoxazole, benzothiophene, benzothiazole, benzoselenophene, indene, indole, benzimidazole, carbazole, dibenzofuran, dibenzothiophene, quinoxaline, phthalazine, phenanthrene, phenanthridine, and fluorene.

In some of the above embodiments for Formula ID, two of $X^1$-$X^5$ can be N, and the remaining three can be C. In these embodiments, $X^1$ and $X^3$ can be N, and $X^2$, $X^4$, and $X^5$ can be each C. In these embodiments, $X^2$ and $X^5$ can be N, and $X^1$, $X^3$, and $X^4$ can be each C. In these embodiments, $X^1$ and $X^2$ can be N, and $X^3$, $X^4$, and $X^5$ can be each C.

In some of the above embodiments, ring Z can be a 7-membered ring. In some of the above embodiments, ring Z can be an 8-membered ring. In some of the above embodiments, ring Z can be a 9-membered ring. In some of the above embodiments, the 7-, 8-, or 9-membered ring can each comprise ring atoms selected from C, N, B, O, Si, and S. In some of the above embodiments, the 7-, 8-, or 9-membered ring can each comprise one N ring atom, and the remaining ring atoms can be all C. In some of the above embodiments, the 7-, 8-, or 9-membered ring can each comprise one N ring atom, and one O atom, and the remaining ring atoms can be all C. In some of the above embodiments, the 7-, 8-, or 9-membered ring can each comprise one N ring atom, and one Si atom, and the remaining ring atoms can be all C. In some of the above embodiments, the 7-, 8-, or 9-membered ring can each comprise two N ring atoms, and the remaining ring atoms can be all C. In some of the above embodiments, the 7-, 8-, or 9-membered ring can each comprise two N ring atoms, one B atom, and the remaining ring atoms can be all C. In some of the above embodiments, the 7-, 8-, or 9-membered ring can each comprise two N ring atoms, one B atom, one O atom, and the remaining ring atoms can be all C. In some of the above embodiments, the 7-, 8-, or 9-membered ring can each comprise three N ring atoms, and the remaining ring atoms can be all C.

In some of the above embodiments, one $R^A$ substituent and one $R^Z$ substituent can be joined to form a fused 5-, or 6-membered aromatic ring. In some of the above embodiments, two adjacent $R^Z$ substituents can be joined to form a fused 5- or 6-membered aromatic ring. In some of the above embodiments, four adjacent $R^Z$ substituents can be joined to form two fused 5- or 6-membered aromatic ring when ring Z is an 8-, 9-, or 10-membered ring. In some of the above embodiments, one $R^A$ and two or more $R^Z$ can be joined to form a polycyclic ring structure. In some of the above embodiments, the 5- or 6-membered aromatic ring can be benzene, pyridine, pyrimidine, pyridazine, pyrazine, imidazole, pyrazole, pyrrole, oxazole, furan, thiophene, or thiazole.

In some embodiments, M can be Ir or Pt.

In some embodiments, the ligand $L_A$ can be selected from the group consisting of:

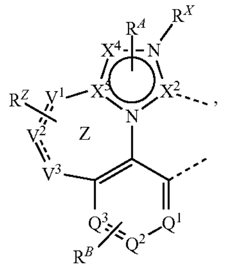
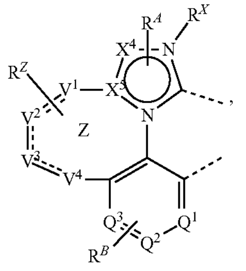
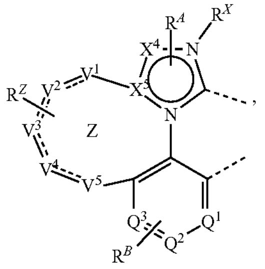
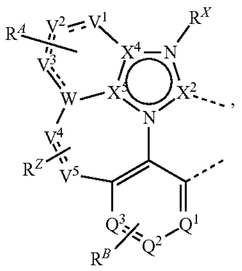
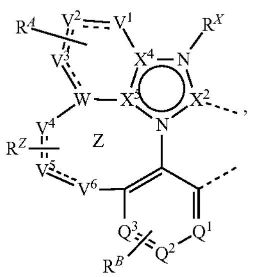
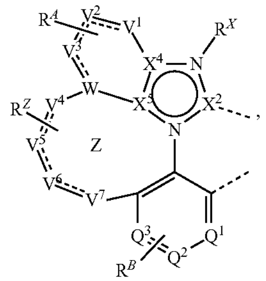
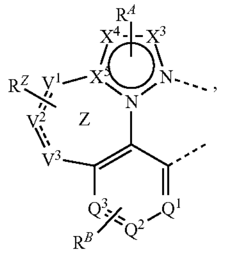
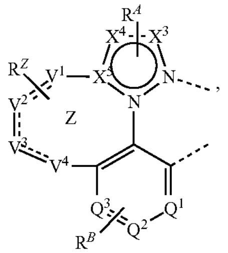
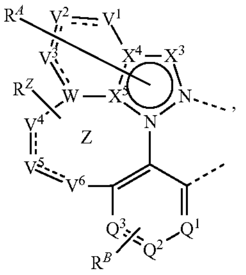
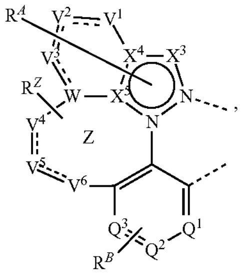
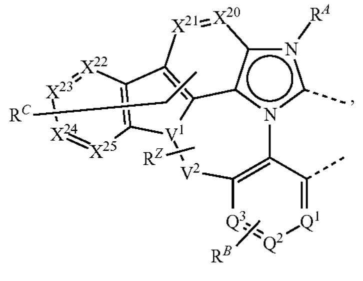

-continued

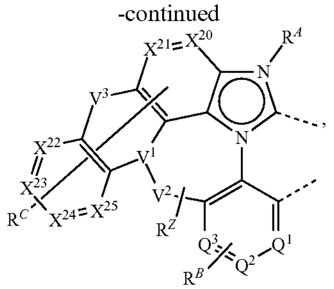
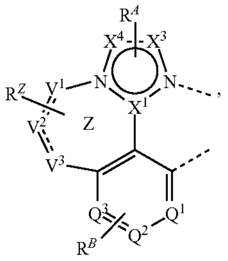
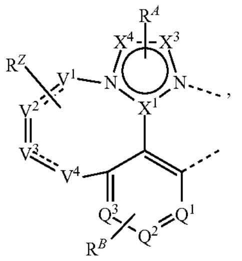
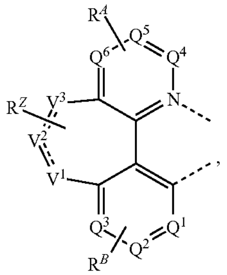
and
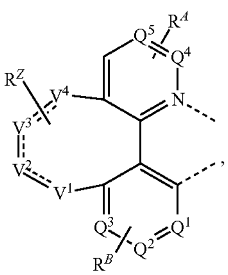
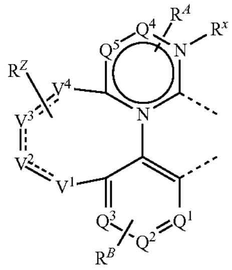

wherein W for each occurrence is independently C or N; each of $V^1$, $V^2$, $V^3$, $V^4$, $V^5$, and $V^6$ is independently C, N, S, O, B, or Si; $R^X$ for each occurrence is independently a hydrogen or a substituent selected from the group consisting of hydrogen, deuterium, halide, alkyl, cycloalkyl, heteroalkyl, arylalkyl, alkoxy, aryloxy, amino, silyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; ═ is a single bond or double bond; $X^{20}$-$X^{25}$ are each independently C or N; $Q^4$, $Q^5$, and $Q^6$ are each independently C or N; and the remaining variables are the same as previously defined herein.

In some embodiments, the ligand $L_A$ can be selected from the group consisting of:

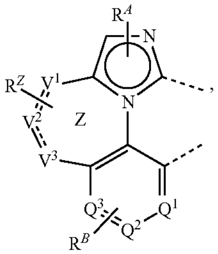
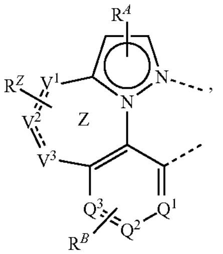
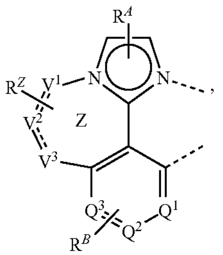
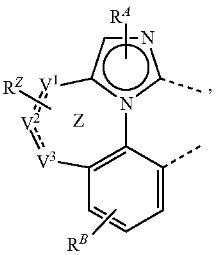
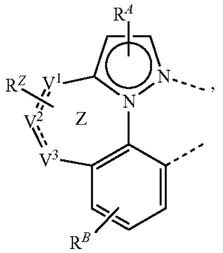
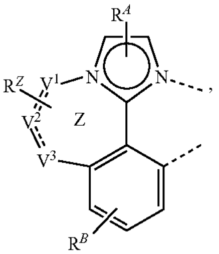
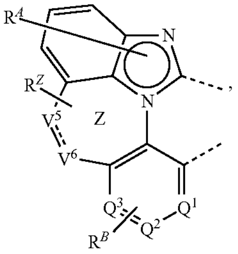
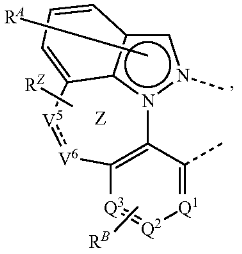
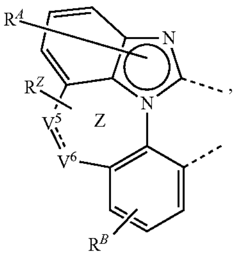
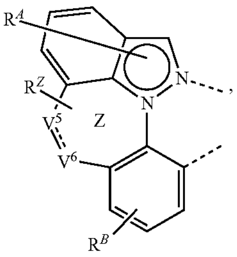
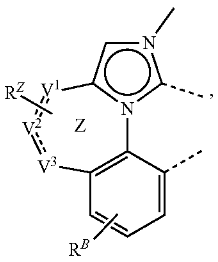
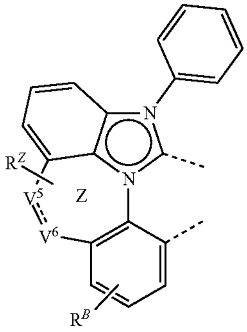
,
-continued
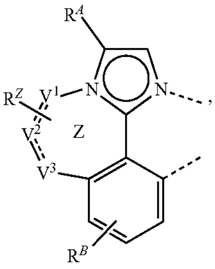
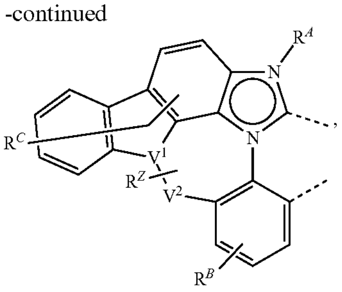
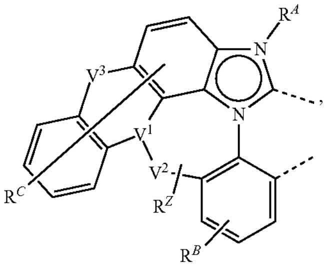
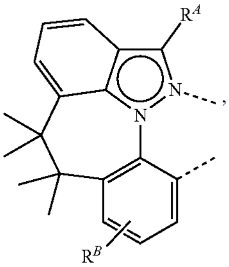
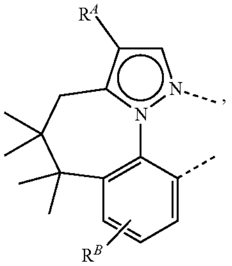
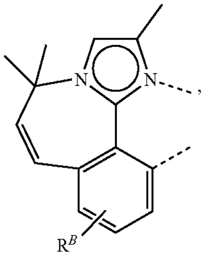
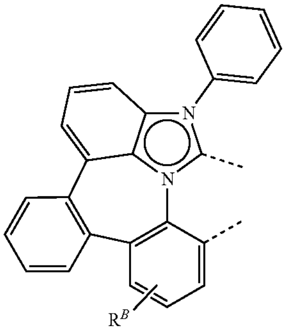
,
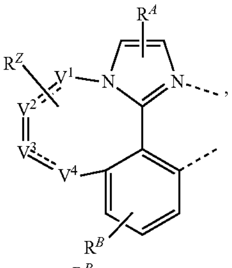
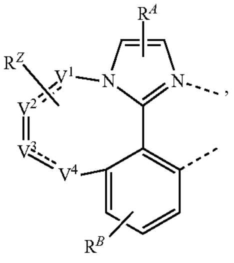
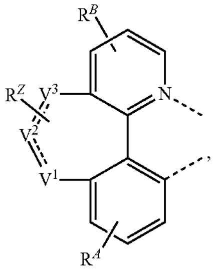
and
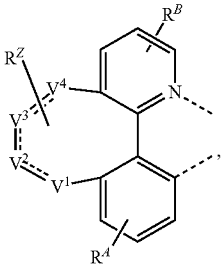
wherein the variables are the same as previously defined herein.

In some embodiments, the ligand $L_A$ can be selected from the group consisting of the structures in LIST 1 below, wherein l, m, n, and o are each independently an integer from 1 to 307:

| Ligand $L_A$ | Structure of $L_A$ |
|---|---|
| $L_A1$-(Rl)(Rm)(Rn)(Ro), wherein $L_A1$-(R1)(R1)(R1)(R1) to $L_A1$-(R307)(R307)(R307)(R307), having the structure | 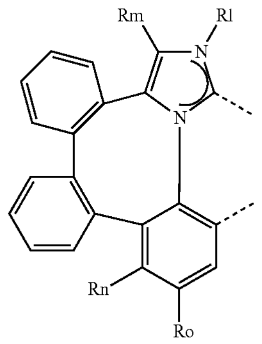 |
| $L_A2$-(Rl)(Rm)(Rn)(Ro), wherein $L_A2$-(R1)(R1)(R1)(R1) to $L_A2$-(R307)(R307)(R307)(R307), having the structure | 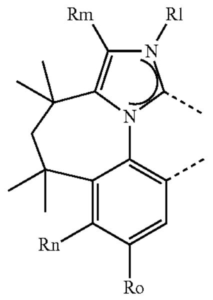 |
| $L_A3$-(Rl)(Rm)(Rn)(Ro), wherein $L_A3$-(R1)(R1)(R1)(R1) to $L_A3$-(R307)(R307)(R307)(R307), having the structure | 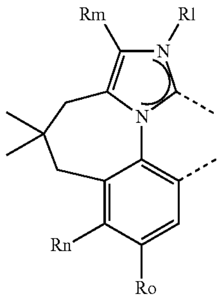 |
| $L_A4$-(Rl)(Rm)(Rn)(Ro), wherein $L_A4$-(R1)(R1)(R1)(R1) to $L_A4$-(R307)(R307)(R307)(R307), having the structure | 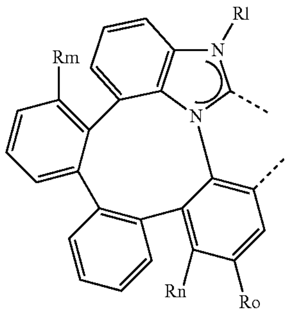 |

-continued
| Ligand $L_A$ | Structure of $L_A$ |
| --- | --- |
| $L_A$5-(Rl)(Rm)(Rn)(Ro), wherein $L_A$5-(R1)(R1)(R1)(R1) to $L_A$5-(R307)(R307)(R307)(R307), having the structure | 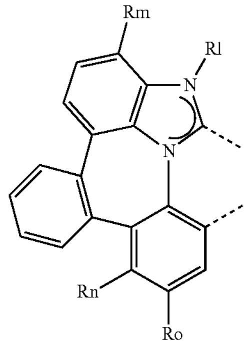 |
| $L_A$6-(Rl)(Rm)(Rn)(Ro), wherein $L_A$6-(R1)(R1)(R1)(R1) to $L_A$6-(R307)(R307)(R307)(R307), having the structure | 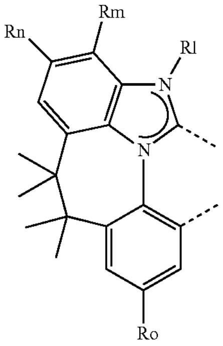 |
| $L_A$7-(Rl)(Rm)(Rn)(Ro), wherein $L_A$7-(R1)(R1)(R1)(R1) to $L_A$7-(R307)(R307)(R307)(R307), having the structure | 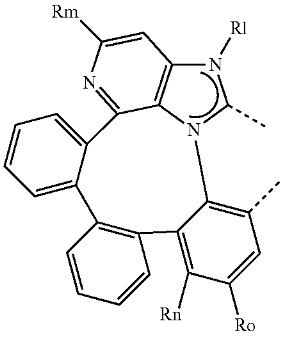 |
| $L_A$8-(Rl)(Rm)(Rn)(Ro), wherein $L_A$8-(R1)(R1)(R1)(R1) to $L_A$8-(R307)(R307)(R307)(R307), having the structure | 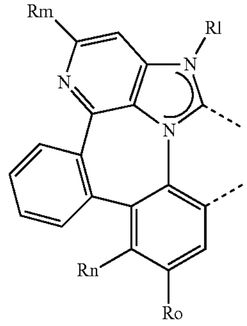 |

-continued
| Ligand $L_A$ | Structure of $L_A$ |
| --- | --- |
| $L_A$9-(Rl)(Rm)(Rn)(Ro), wherein $L_A$9-(R1)(R1)(R1)(R1) to $L_A$9-(R307)(R307)(R307)(R307), having the structure | 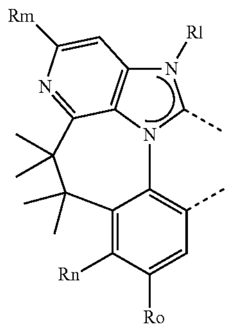 |
| $L_A$10-(Rl)(Rm)(Rn)(Ro), wherein $L_A$10-(R1)(R1)(R1)(R1) to $L_A$10-(R307)(R307)(R307)(R307), having the structure | 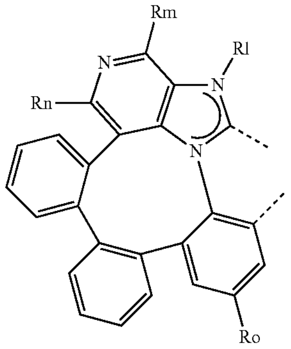 |
| $L_A$11-(Rl)(Rm)(Rn)(Ro), wherein $L_A$11-(R1)(R1)(R1)(R1) to $L_A$11-(R307)(R307)(R307)(R307), having the structure | 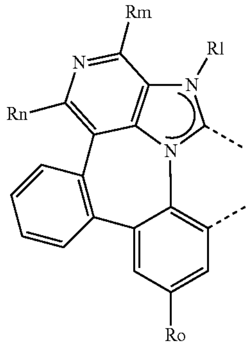 |
| $L_A$12-(Rl)(Rm)(Rn)(Ro), wherein $L_A$12-(R1)(R1)(R1)(R1) to $L_A$12-(R307)(R307)(R307)(R307), having the structure | 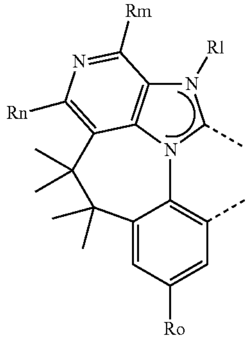 |

-continued
| Ligand $L_A$ | Structure of $L_A$ |
|---|---|
| $L_A$13-(Rl)(Rm)(Rn)(Ro), wherein $L_A$13-(R1)(R1)(R1)(R1) to $L_A$13-(R307)(R307)(R307)(R307), having the structure | 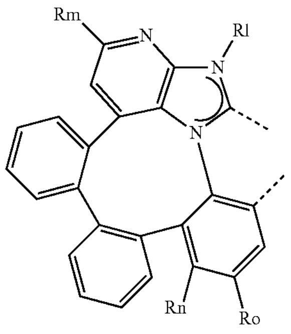 |
| $L_A$14-(Rl)(Rm)(Rn)(Ro), wherein $L_A$14-(R1)(R1)(R1)(R1) to $L_A$14-(R307)(R307)(R307)(R307), having the structure | 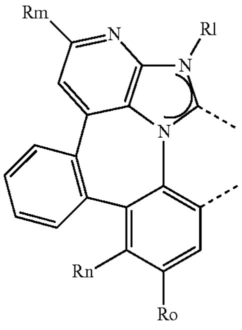 |
| $L_A$15-(Rl)(Rm)(Rn)(Ro), wherein $L_A$15-(R1)(R1)(R1)(R1) to $L_A$15-(R307)(R307)(R307)(R307), having the structure | 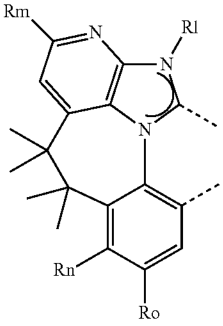 |
| $L_A$16-(Rl)(Rm)(Rn)(Ro), wherein $L_A$16-(R1)(R1)(R1)(R1) to $L_A$16-(R307)(R307)(R307)(R307), having the structure | 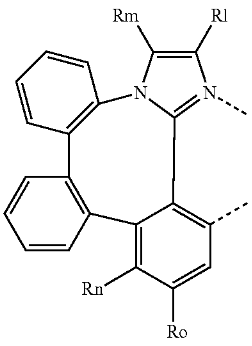 |

-continued

| Ligand $L_A$ | Structure of $L_A$ |
|---|---|
| $L_A$17-(Rl)(Rm)(Rn)(Ro), wherein $L_A$17-(R1)(R1)(R1)(R1) to $L_A$17-(R307)(R307)(R307)(R307), having the structure | 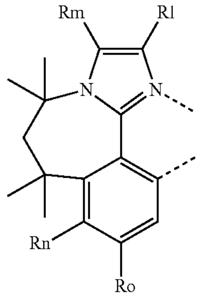 |
| $L_A$18-(Rl)(Rm)(Rn)(Ro), wherein $L_A$18-(R1)(R1)(R1)(R1) to $L_A$18-(R307)(R307)(R307)(R307), having the structure | 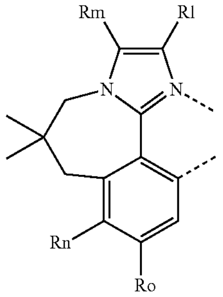 |
| $L_A$19-(Rl)(Rm)(Rn)(Ro), wherein $L_A$19-(R1)(R1)(R1)(R1) to $L_A$19-(R307)(R307)(R307)(R307), having the structure | 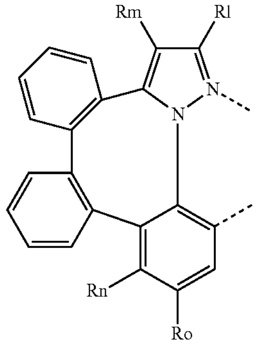 |
| $L_A$20-(Rl)(Rm)(Rn)(Ro), wherein $L_A$20-(R1)(R1)(R1)(R1) to $L_A$20-(R307)(R307)(R307)(R307), having the structure | 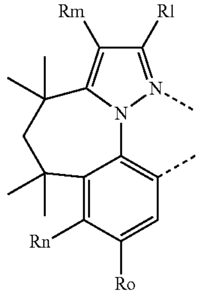 |
| $L_A$21-(Rl)(Rm)(Rn)(Ro), wherein $L_A$21-(R1)(R1)(R1)(R1) to $L_A$21-(R307)(R307)(R307)(R307), having the structure | 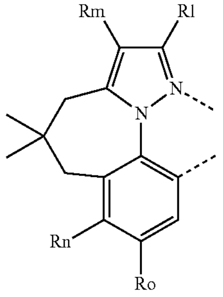 |

-continued

| Ligand $L_A$ | Structure of $L_A$ |
|---|---|
| $L_A$22-(Rl)(Rm)(Rn)(Ro), wherein $L_A$22-(R1)(R1)(R1)(R1) to $L_A$22-(R307)(R307)(R307)(R307), having the structure | 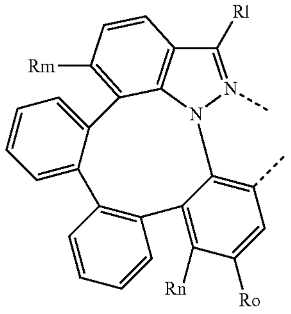 |
| $L_A$23-(Rl)(Rm)(Rn)(Ro), wherein $L_A$23-(R1)(R1)(R1)(R1) to $L_A$23-(R307)(R307)(R307)(R307), having the structure | 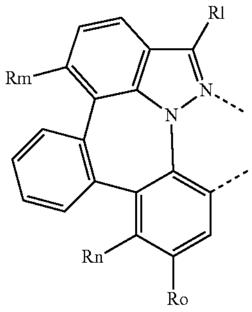 |
| $L_A$24-(Rl)(Rm)(Rn)(Ro), wherein $L_A$24-(R1)(R1)(R1)(R1) to $L_A$24-(R307)(R307)(R307)(R307), having the structure | 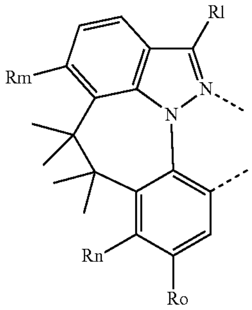 |
| $L_A$25-(Rl)(Rm)(Rn)(Ro), wherein $L_A$25-(R1)(R1)(R1)(R1) to $L_A$25-(R307)(R307)(R307)(R307), having the strucutre | 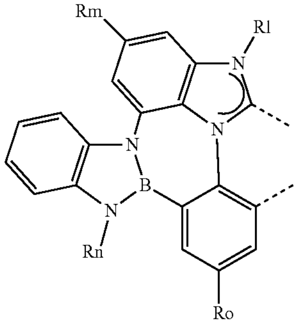 |
| $L_A$26-(Rl)(Rm)(Rn)(Ro), wherein $L_A$26-(R1)(R1)(R1)(R1) to $L_A$26-(R307)(R307)(R307)(R307), having the structure | 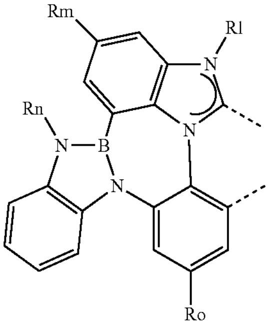 |

-continued
| Ligand $L_A$ | Structure of $L_A$ |
| --- | --- |
| $L_A$27-(Rl)(Rm)(Rn)(Ro), wherein $L_A$27-(R1)(R1)(R1)(R1) to $L_A$27-(R307)(R307)(R307)(R307), having the structure | 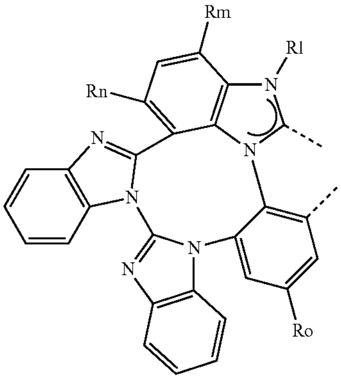 |
| $L_A$28-(Rl)(Rm)(Rn)(Ro), wherein $L_A$28-(R1)(R1)(R1)(R1) to $L_A$28-(R307)(R307)(R307)(R307), having the structure | 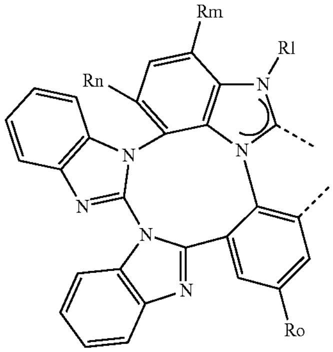 |
| $L_A$29-(Rl)(Rm)(Rn)(Ro), wherein $L_A$29-(R1)(R1)(R1)(R1) to $L_A$29-(R307)(R307)(R307(R307), having the structure | 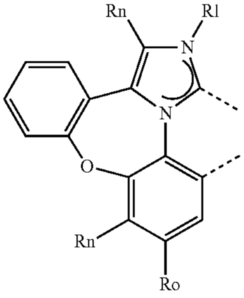 |
| $L_A$30-(Rl)(Rm)(Rn)(Ro), wherein $L_A$30-(R1)(R1)(R1)(R1) to $L_A$30-(R307)(R307)(R307)(R307), having the structure | 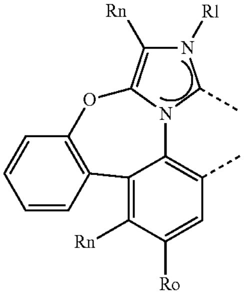 |

-continued
| Ligand $L_A$ | Structure of $L_A$ |
|---|---|
| $L_A$31-(Rl)(Rm)(Rn)(Ro), wherein $L_A$31-(R1)(R1)(R1)(R1) to $L_A$31-(R307)(R307)(R307)(R307), having the structure | 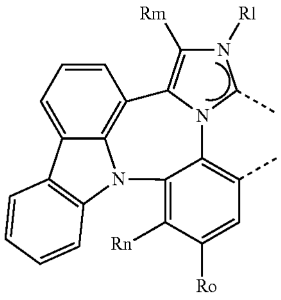 |
| $L_A$32-(Rl)(Rm)(Rn)(Ro), wherein $L_A$32-(R1)(R1)(R1)(R1) to $L_A$32-(R307)(R307)(R307)(R307), having the structure | 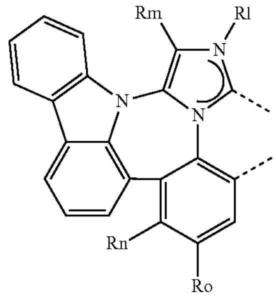 |
| $L_A$33-(Rl)(Rm)(Rn)(Ro), wherein $L_A$33-(R1)(R1)(R1)(R1) to $L_A$33-(R307)(R307)(R307)(R307), having the structure | 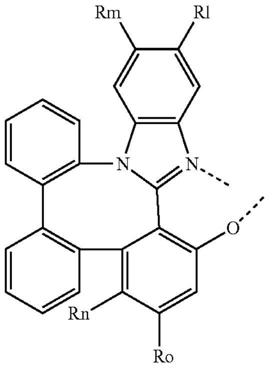 |
| $L_A$34-(Rl)(Rm)(Rn)(Ro), wherein $L_A$34-(R1)(R1)(R1)(R1) to $L_A$34-(R307)(R307)(R307)(R307), having the structure | 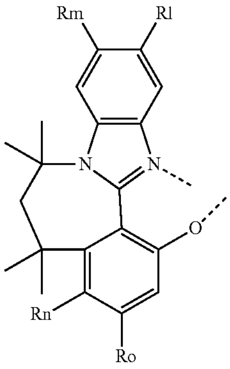 |

-continued
| Ligand $L_A$ | Structure of $L_A$ |
| --- | --- |
| $L_A$35-(Rl)(Rm)(Rn)(Ro), wherein $L_A$35-(R1)(R1)(R1)(R1) to $L_A$35-(R307)(R307)(R307)(R307), having the structure | 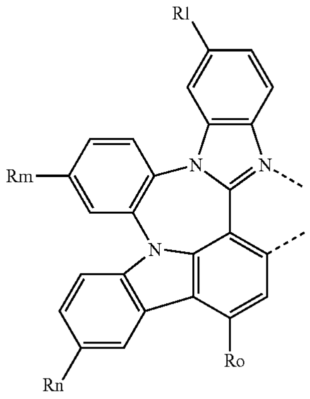 |
| $L_A$36-(Rl)(Rm)(Rn)(Ro), wherein $L_A$36-(R1)(R1)(R1)(R1) to $L_A$36-(R307)(R307)(R307)(R307), having the structure | 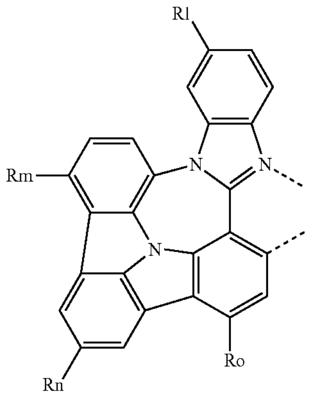 |
| $L_A$37-(Rl)(Rm)(Rn)(Ro), wherein $L_A$37-(R1)(R1)(R1)(R1) to $L_A$37-(R307)(R307)(R307)(R307), having the structure | 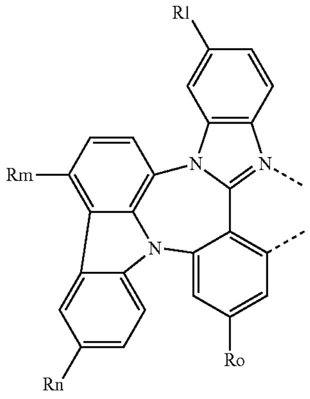 |
| $L_A$38-(Rl)(Rm)(Rn)(Ro), wherein $L_A$38-(R1)(R1)(R1)(R1) to $L_A$38-(R307)(R307)(R307)(R307), having the structure | 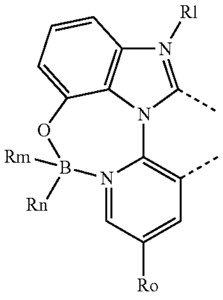 |

-continued

| Ligand $L_A$ | Structure of $L_A$ |
| --- | --- |
| $L_A$39-(R1)(Rm)(Rn)(Ro)(Rq), wherein $L_A$39-(R1)(R1)(R1)(R1)(R1) to $L_A$39-(R307)(R307)(R307)(R307)(R307), having the structure | 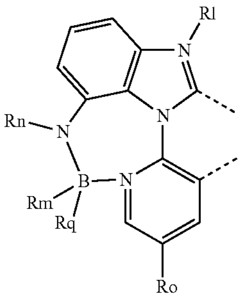 |
| $L_A$40-(Rl)(Rm)(Rn)(Ro)(Rp), wherein $L_A$40-(R1)(R1)(R1)(R1)(R1) to $L_A$40-(R307)(R307)(R307)(R307)(R307), having the structure | 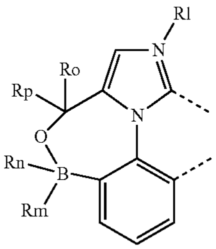 |
| $L_A$41-(Rm)(Rn)(Ro)(Rq)(Rr), wherein $L_A$41-(R1)(R1)(R1)(R1)(R1) to $L_A$41-(R307)(R307)(R307)(R307), (R307), having the structure | 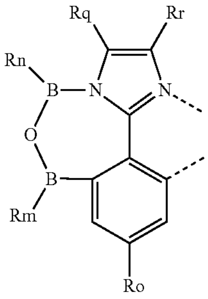 |
| $L_A$42-(Rl)(Rm)(Ro)(Rp), wherein $L_A$42-(R1)(R1)(R1)(R1) to $L_A$42-(R307)(R307)(R307)(R307), having the structure | 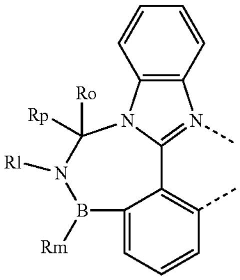 |
| $L_A$43-(Rm)(Ro)(Rp), wherein $L_A$43-(R1)(R1)(R1) to $L_A$43-(R307)(R307)(R307), having the structure | 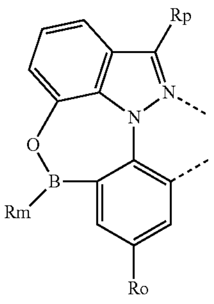 |

-continued
| Ligand $L_A$ | Structure of $L_A$ |
|---|---|
| $L_A$44-(Rl)(Rm)(Rn)(Ro)(Rp), wherein $L_A$44-(R1)(R1)(R1)(R1)(R1) to $L_A$44-(R307)(R307)(R307)(R307)(R307), having the structure | 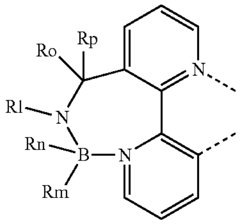 |
| $L_A$45-(Rl)(Rm)(Ro)(Rp), wherein $L_A$45-(R1)(R1)(R1)(R1) to $L_A$45-(R307)(R307)(R307)(R307), having the structure | 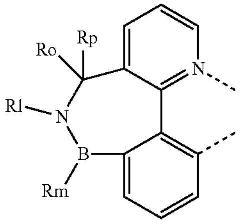 |
| $L_A$46-(Rl)(Rm)(Rn)(Ro), wherein $L_A$46-(R1)(R1)(R1)(R1) to $L_A$46-(R307)(R307)(R307)(R307), having the structure | 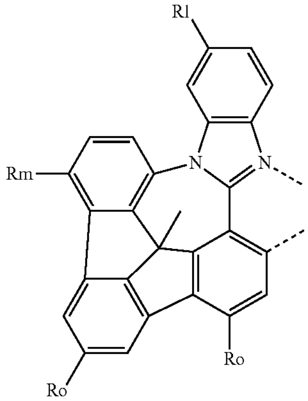 |
| $L_A$47-(Rl)(Rm)(Rn)(Ro), wherein $L_A$47-(R1)(R1)(R1)(R1) to $L_A$47-(307)(R307)(R307)(R307), having the structure | 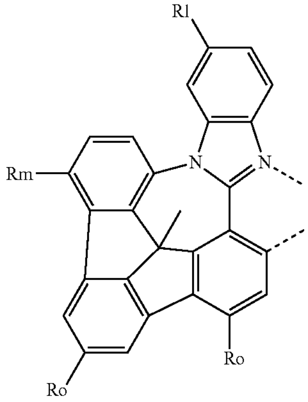 |

-continued
| Ligand $L_A$ | Structure of $L_A$ |
|---|---|
| $L_A$48-(Rl)(Rm)(Rn)(Ro), wherein, $L_A$48-(R1)(R1)(R1)(R1) to $L_A$48-(R307)(R307)(R307)(R307), having the structure | 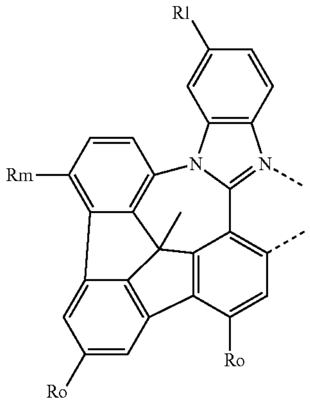 |
| $L_A$49-(Rl)(Rm)(Rn)(Ro), wherein $L_A$49-(R1)(R1)(R1)(R1) to $L_A$49-(R307)(R307)(R307)(R307), having the structure | 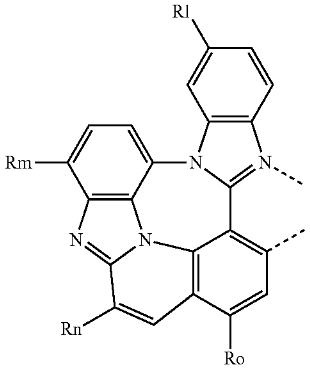 |
| $L_A$50-(Rl)(Rm)(Rn)(Ro), wherein $L_A$50-(R1)(R1)(R1)(R1) to $L_A$50-(R307)(R307)(R307)(R307), having the structure | 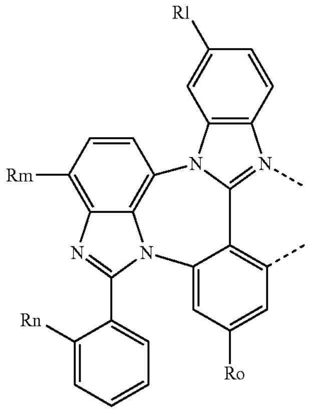 |
| $L_A$51-(Rl)(Rm)(Rn)(Ro), wherein $L_A$51-(R1)(R1)(R1)(R1) to $L_A$51-(R307)(R307)(R307)(R307), having the structure | 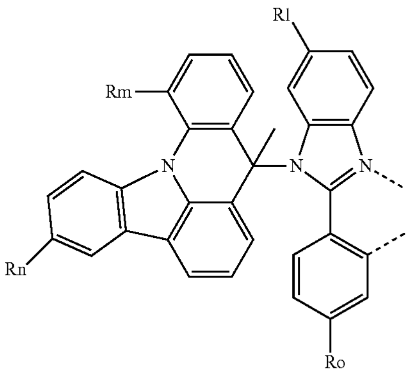 |

-continued
| Ligand $L_A$ | Structure of $L_A$ |
| --- | --- |
| $L_A$52-(Rl)(Rm)(Rn)(Ro), wherein $L_A$52-(R1)(R1)(R1)(R1) to $L_A$52-(R307)(R307)(R307)(R307), having the structure | 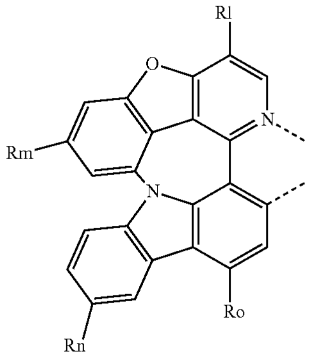 |
| $L_A$53-(Rl)(Rm)(Rn)(Ro), wherein $L_A$53-(R1)(R1)(R1)(R1) to $L_A$53-(R307)(R307)(R307)(R307), having the structure | 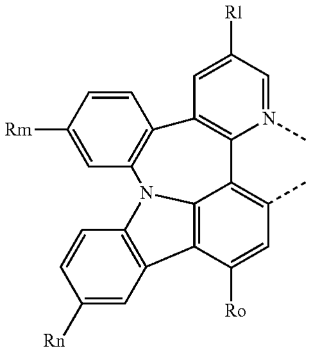 |
| $L_A$54-(Rl)(Rm)(Rn)(Ro), wherein $L_A$54-(R1)(R1)(R1)(R1) to $L_A$54-(R307)(R307)(R307)(R307), having the structure | 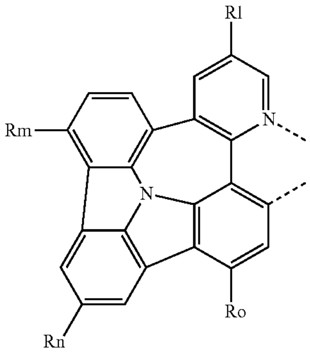 |
| $L_A$55-(Rl)(Rm)(Rn)(Ro), wherein $L_A$55-(R1)(R1)(R1)(R1) to $L_A$55-(R307)(R307)(R307)(R307), having the structure | 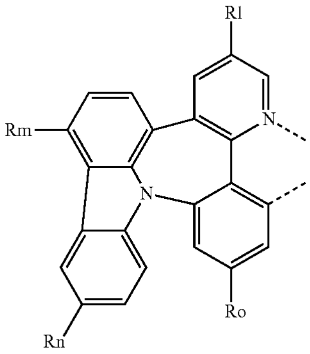 |

-continued
| Ligand $L_A$ | Structure of $L_A$ |
| --- | --- |
| $L_A$56-(Rl)(Rm)(Rn)(Ro), wherein $L_A$56-(R1)(R1)(R1)(R1) to $L_A$56-(R307)(R307)(R307)(R307), having the structure | 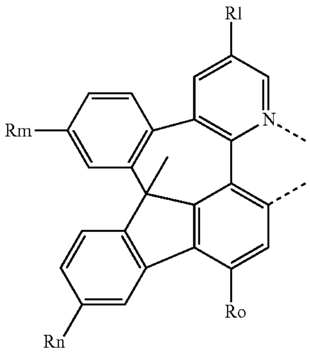 |
| $L_A$57-(Rl)(Rm)(Rn)(Ro), wherein $L_A$57-(R1)(R1)(R1)(R1) to $L_A$57-(R307)(R307)(R307)(R307), having the structure | 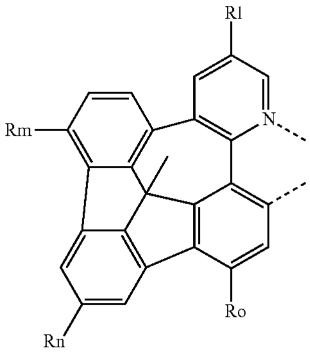 |
| $L_A$58-(Rl)(Rm)(Rn)(Ro), wherein $L_A$58-(R1)(R1)(R1)(R1) to $L_A$58-(R307)(R307)(R307)(R307), having the structure | 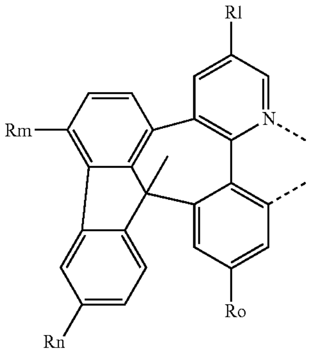 |
| $L_A$59-(Rl)(Rm)(Rn)(Ro), wherein $L_A$59-(R1)(R1)(R1)(R1) to $L_A$59-(R307)(R307)(R307)(R307), having the structure | 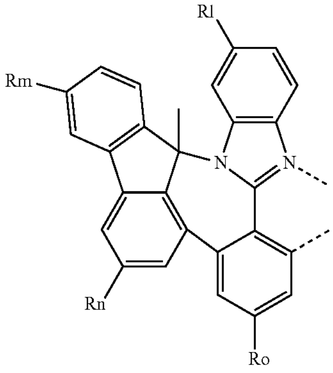 |

-continued
| Ligand $L_A$ | Structure of $L_A$ |
|---|---|
| $L_A$60-(Rl)(Rm)(Rn)(Ro), wherein $L_A$60-(R1)(R1)(R1)(R1) to $L_A$60-(R307)(R307)(R307)(R307), having the structure | 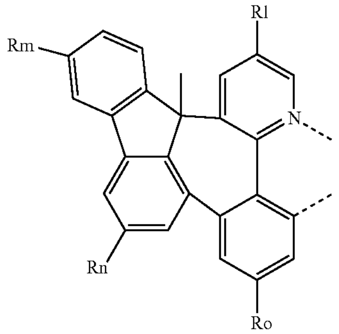 |
| $L_A$61-(Rl)(Rm)(Rn)(Ro), wherein $L_A$61-(R1)(R1)(R1)(R1) to $L_A$61-(R307)(R307)(R307)(R307), having the structure | 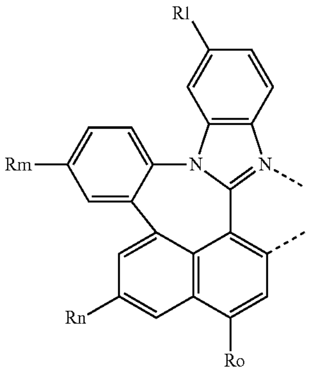 |
| $L_A$62-(Rl)(Rm)(Rn)(Ro), wherein $L_A$62-(R1)(R1)(R1)(R1) to $L_A$62-(R307)(R307)(R307)(R307), having the structure | 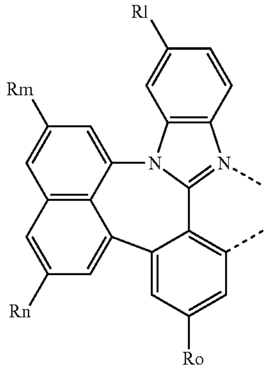 |
| $L_A$63-(Rl)(Rm)(Rn)(Ro), wherein $L_A$63-(R1)(R1)(R1)(R1) to $L_A$63-(R307)(R307)(R307)(R307), having the structure | 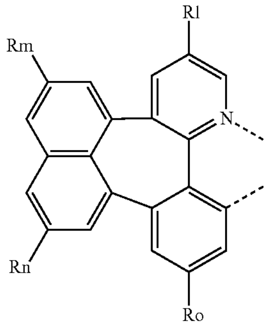 |

-continued
| Ligand $L_A$ | Structure of $L_A$ |
|---|---|
| $L_A$64-(Rl)(Rm)(Rn)(Ro), wherein $L_A$64-(R1)(R1)(R1)(R1) to $L_A$64-(R307)(R307)(R307)(R307), having the structure | 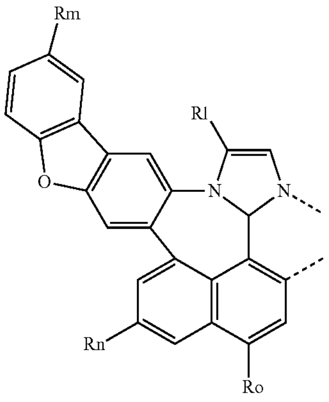 |
| $L_A$65-(Rl)(Rm)(Rn)(Ro), wherein $L_A$65-(R1)(R1)(R1)(R1) to $L_A$65-(R307)(R307)(R307)(R307), having the structure | 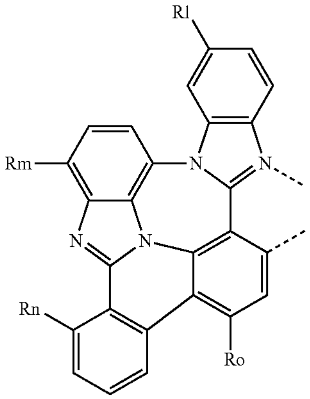 |
| $L_A$66-(Rl)(Rm)(Rn)(Ro), wherein $L_A$66-(R1)(R1)(R1)(R1) to $L_A$66-(R307)(R307)(R307)(R307), having the structure | 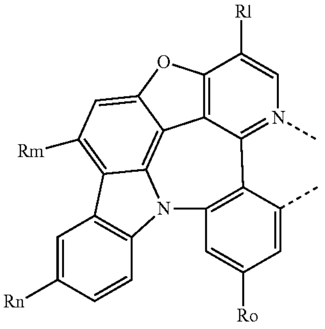 |
| $L_A$67-(Rl)(Rm)(Rn)(Ro), wherein $L_A$67-(R1)(R1)(R1)(R1) to $L_A$67-(R307)(R307)(R307)(R307), having the structure | 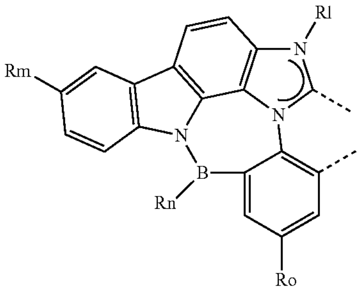 |

-continued

| Ligand $L_A$ | Structure of $L_A$ |
|---|---|
| $L_A$68-(Rl)(Rm)(Rn)(Ro), wherein $L_A$68-(R1)(R1)(R1)(R1) to $L_A$68-(R307)(R307)(R307)(R307), having the structure | 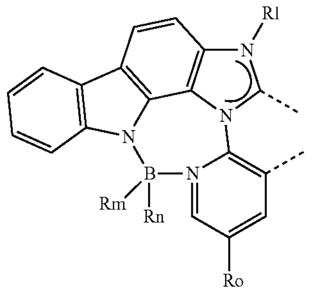 |
| $L_A$69-(Rl)(Rm)(Rn)(Ro), wherein $L_A$69-(R1)(R1)(R1)(R1) to $L_A$69-(R307)(R307)(R307)(R307), having the structure | 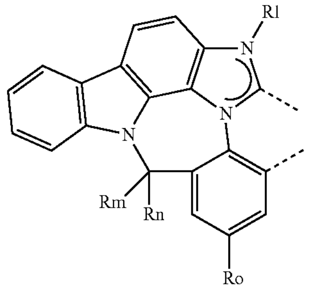 |
| $L_A$7-(Rl)(Rm)(Rn)(Ro), wherein $L_A$70-0(R1)(R1)(R1)(R1) to $L_A$70-(R307)(R307)(R307)(R307), having the structure | 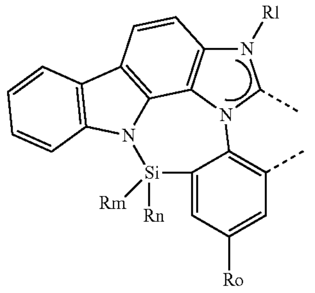 |
| $L_A$71-(Rl)(Rm)(Rn)(Ro), wherein $L_A$71-(R1)(R1)(R1)(R1) to $L_A$71-(R307)(R307)(R307)(R307), having the structure | 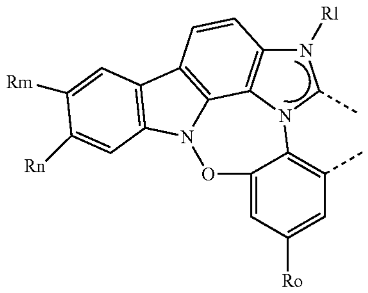 |
| $L_A$72-(Rl)(Rm)(Rn)(Ro), wherein $L_A$72-(R1)(R1)(R1)(R1) to $L_A$72-(R307)(R307)(R307)(R307), having the structure | 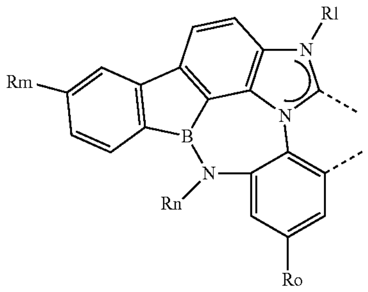 |

-continued
| Ligand $L_A$ | Structure of $L_A$ |
|---|---|
| $L_A$73-(Rl)(Rm)(Rn)(Ro), wherein $L_A$73-(R1)(R1)(R1)(R1) to $L_A$73-(R307)(R307)(R307)(R307), having the structure | 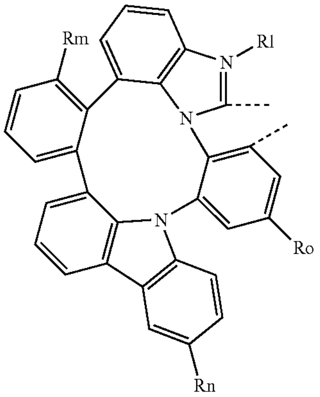 |
| $L_A$74-(Rl)(Rm)(Rn)(Ro), wherein $L_A$74-(R1)(R1)(R1)(R1) to $L_A$74-(R307)(R307)(R307)(R307), having the structure | 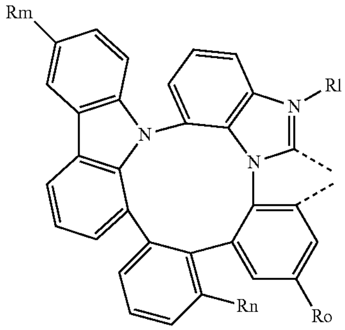 |
| $L_A$75-(Rl)(Rm)(Rn)(Ro), wherein $L_A$75-(R1)(R1)(R1)(R1) to $L_A$75-(R307)(R307)(R307)(R307), having the structure | 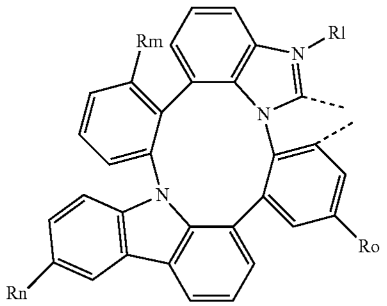 |
| $L_A$76-(Rl)(Rm)(Rn)(Ro), wherein $L_A$76-(R1)(R1)(R1)(R1) to $L_A$76-(R307)(R307)(R307)(R307), having the structure | 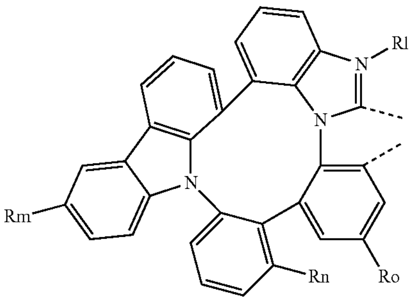 |

-continued

| Ligand $L_A$ | Structure of $L_A$ |
|---|---|
| $L_A$77-(Rl)(Rm)(Rn)(Ro), wherein $L_A$77-(R1)(R1)(R1)(R1) to $L_A$77-(R307)(R307)(R307)(R307), having the structure | 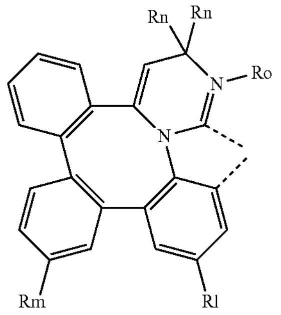 |
| $L_A$78-(Rl)(Rm)(Rn)(Ro), wherein $L_A$78-(R1)(R1)(R1)(R1) to $L_A$78-(R307)(R307)(R307)(R307), having the structure | 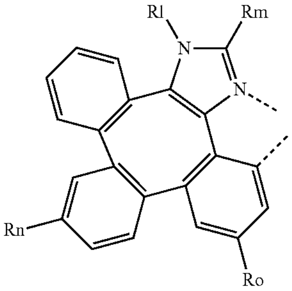 |
| $L_A$79-(Rl)(Rm)(Rn)(Ro), wherein $L_A$79-(R1)(R1)(R1)(R1) to $L_A$79-(R307)(R307)(R307)(R307), having the structure | 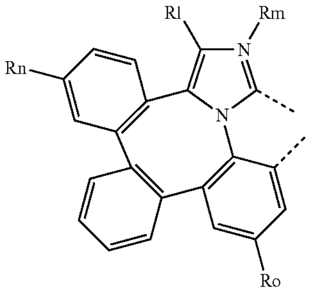 |
| $L_A$80-(Rl)(Rm)(Rn)(Ro), wherein $L_A$80-(R1)(R1)(R1)(R1) to $L_A$80-(R307)(R307)(R307)(R307), having the structure | 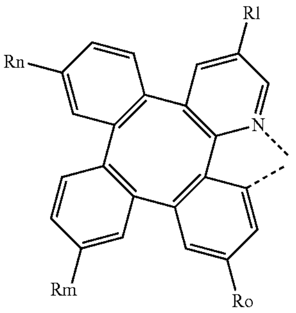 |
| $L_A$81-(Rl)(Rm)(Rn)(Ro), wherein $L_A$81-(R1)(R1)(R1)(R1) to $L_A$81-(R307)(R307)(R307)(R307), having the structure | 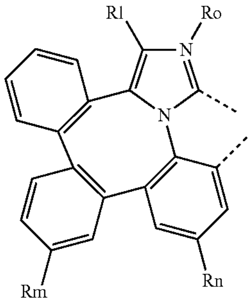 |

-continued

| Ligand $L_A$ | Structure of $L_A$ |
|---|---|
| $L_A$82-(Rl)(Rm)(Rn)(Ro), wherein $L_A$82-(R1)(R1)(R1)(R1) to $L_A$82-(R307)(R307)(R307)(R307), having the structure | 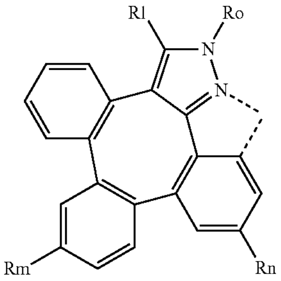 |
| $L_A$83-(Rl)(Rm)(Ro)(Rq), wherein $L_A$83-(R1)(R1)(R1)(R1) to $L_A$83-(R307)(R307)(R307)(R307), having the structure | 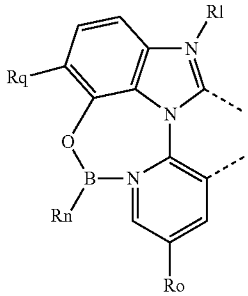 |
| $L_A$84-(Rl)(Rm)(Rn)(Ro)(Rp), wherein $L_A$84-(R1)(R1)(R1)(R1)(R1) to $L_A$84-(R307)(R307)(R307)(R307)(R307), having the structure | 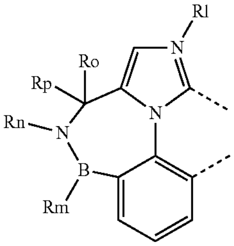 |
| $L_A$85-(Rm)(Ro)(Rp)(Rq)(Rr), wherein $L_A$85-(R1)(R1)(R1)(R1)(R1) to $L_A$85-(R307)(R307)(R307)(R307)(R307), having the structure | 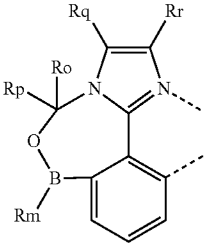 |
| $L_A$86-(Rl)(Rm)(Ro)(Rq)(Rr), wherein $L_A$86-(R1)(R1)(R1)(R1)(R1) to $L_A$86-(R307)(R307)(R307)(R307)(R307), having the structure | 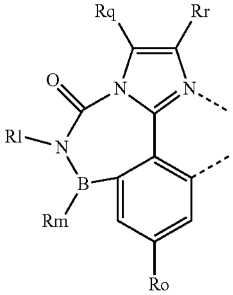 |

-continued

| Ligand $L_A$ | Structure of $L_A$ |
|---|---|
| $L_A$87-(Rm)(Ro)(Rp)(Rq), wherein $L_A$87-(R1)(R1)(R1)(R1) to $L_A$87-(R307)(R307)(R307)(R307), having the structure | 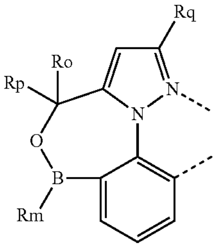 |
| $L_A$88-(Rm)(Rn)(Rl)(Rp), wherein $L_A$88-(R1)(R1)(R1)(R1) to $L_A$88-(R307)(R307)(R307)(R307), having the structure | 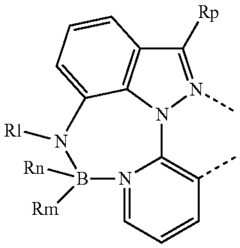 |
| $L_A$89-(Rm)(Rn)(Ro)(Rp), wherein $L_A$89-(R1)(R1)(R1)(R1) to $L_A$89-(R307)(R307)(R307)(R307), having the structure | 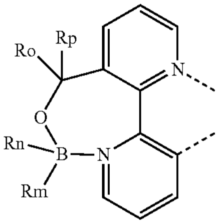 |
| $L_A$90-(Rm)(Ro)(Rp)(Rr), wherein $L_A$90-(R1)(R1)(R1)(R1) to $L_A$90-(R307)(R307)(R307)(R307), having the structure | 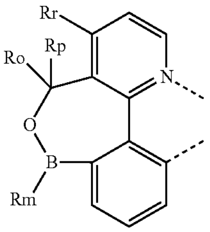 |

wherein R1 to R307 have the structures defined in the following R-LIST:

R1

Me,

R2 iPr,

R3 tBu,

R4

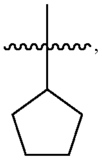

-continued

R5

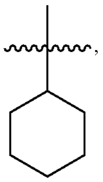

R6

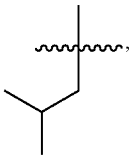

R7

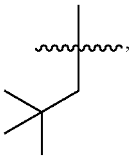

-continued
R8
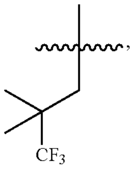
R9
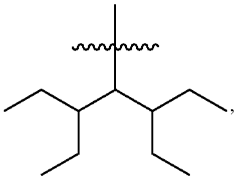
R10
$CD_3$,
R11
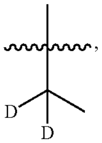
R12
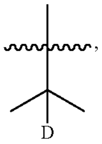
R13
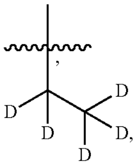
R14
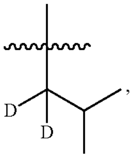
R15
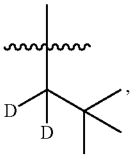
R16
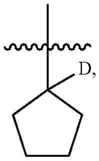
R17
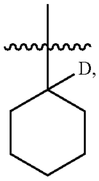
-continued
R18
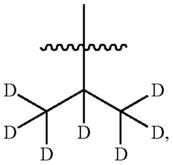
R19
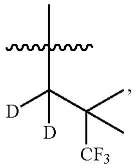
R20
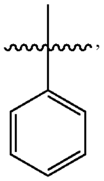
R21
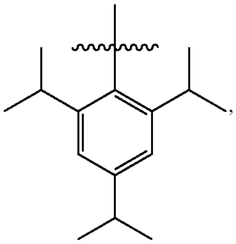
R22
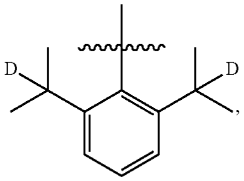
R23
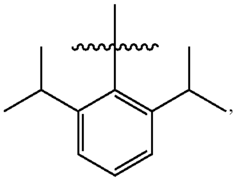
R24
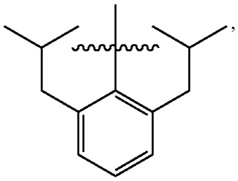
R25
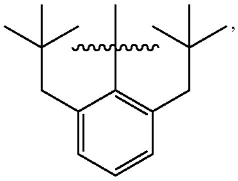

-continued
R26
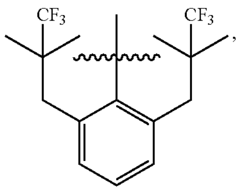
R27
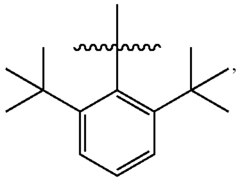
R28
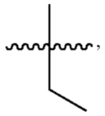
R29
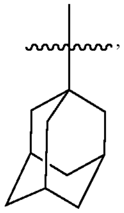
R30
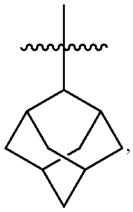
R31
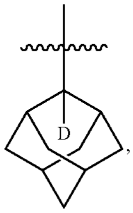
R32
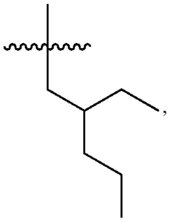
-continued
R33
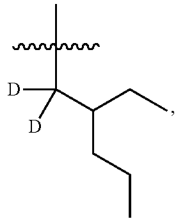
R34
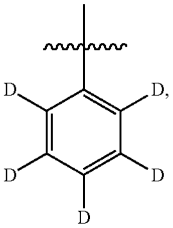
R35
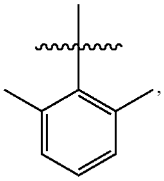
R36
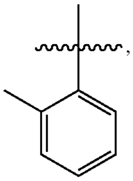
R37
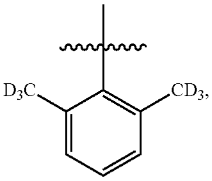
R38
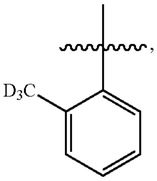
R39
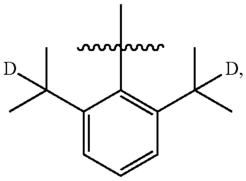
R40
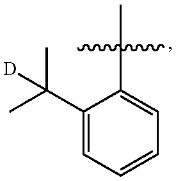

-continued
R41
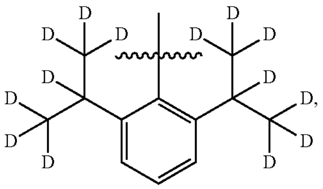
R42
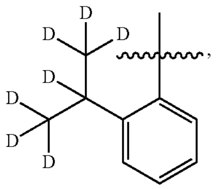
R43
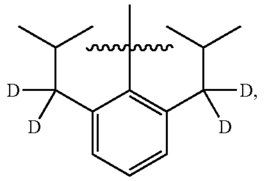
R44
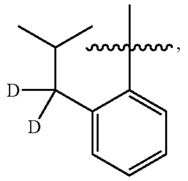
R45
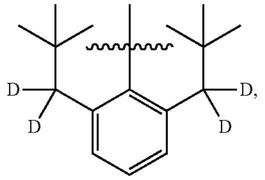
R46
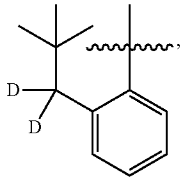
R47
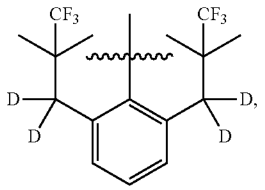
R48
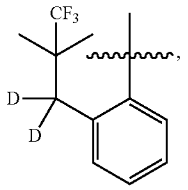
-continued
R49
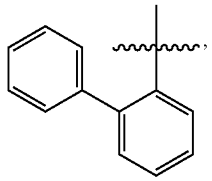
R50
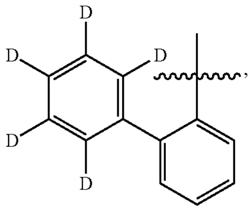
R51
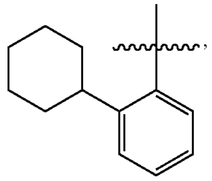
R52
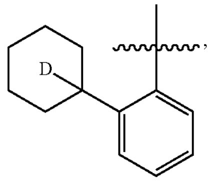
R53
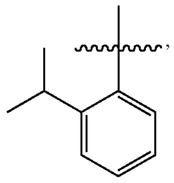
R54
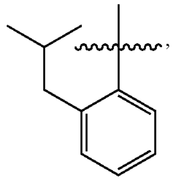
R55
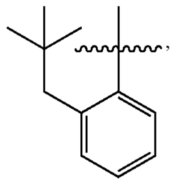
R56
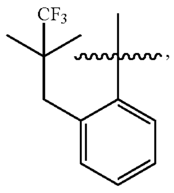

-continued
R57
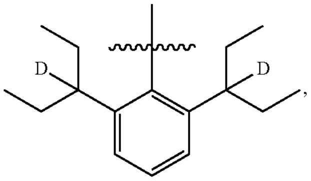
R58
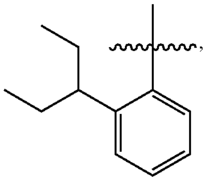
R59
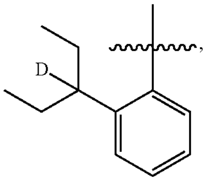
R60
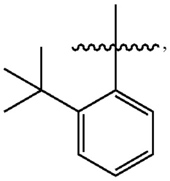
R61
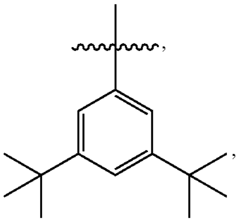
R62
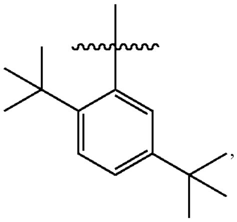
R63
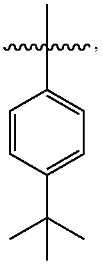
-continued
R64
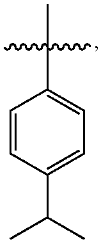
R65
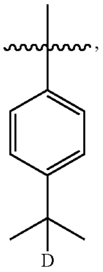
R66
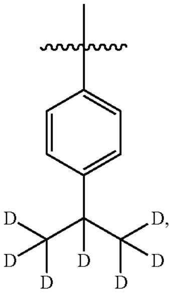
R67
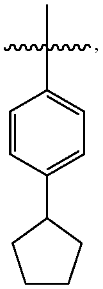
R68
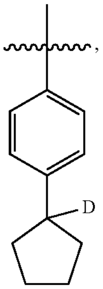

-continued
R69
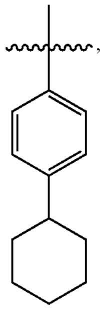
R70
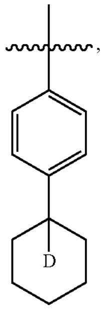
R71
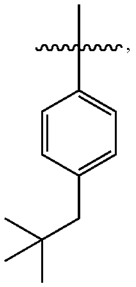
R72
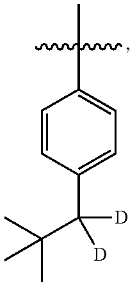
R73
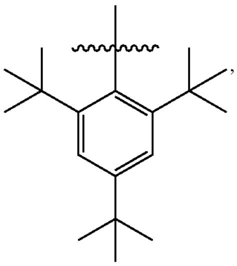
-continued
R74
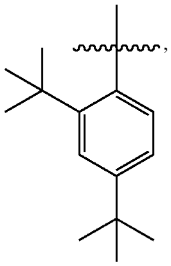
R75
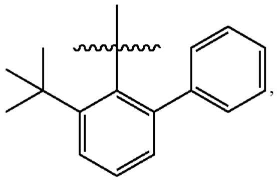
R76
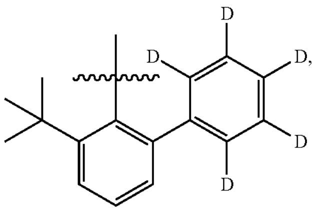
R77
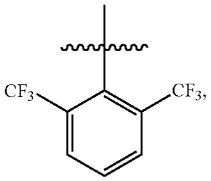
R78
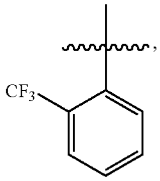
R79
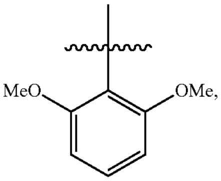
R80
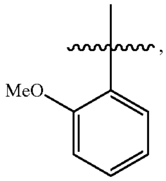
R81
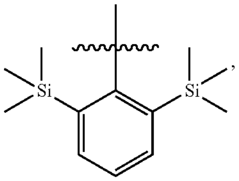

-continued
R92
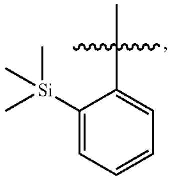
R83
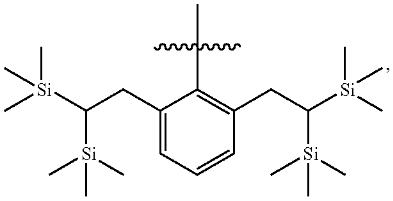
R84
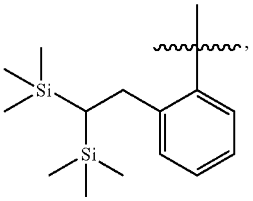
R85
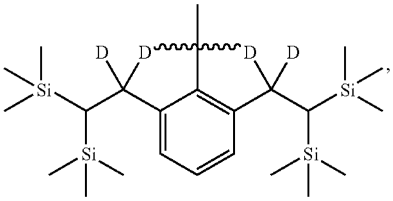
R86
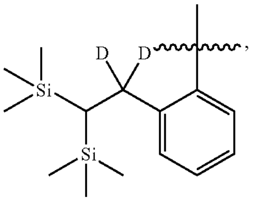
R87
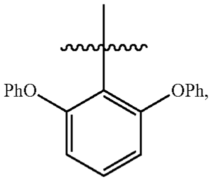
R88
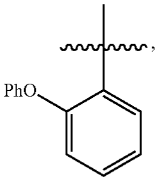
R89
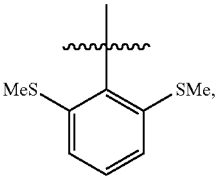
-continued
R90
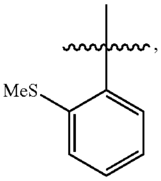
R91
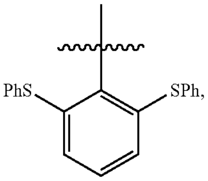
R92
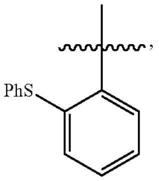
R93
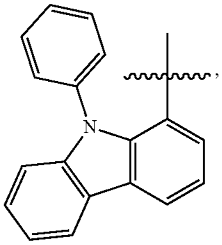
R94
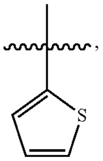
R95
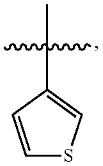
R96
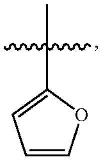
R97
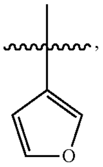

-continued
R98
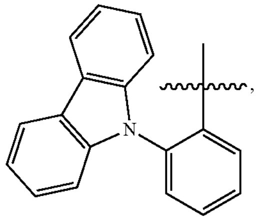
R99
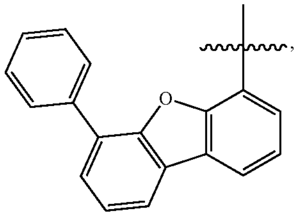
R100
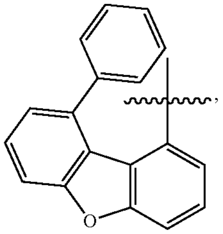
R101
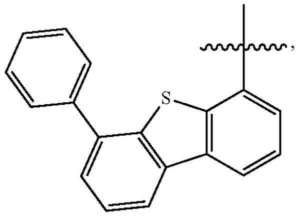
R102
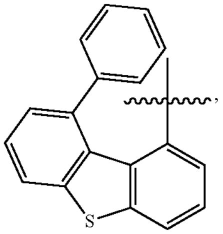
R103
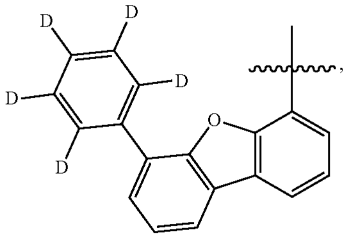
-continued
R104
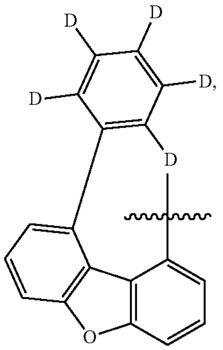
R105
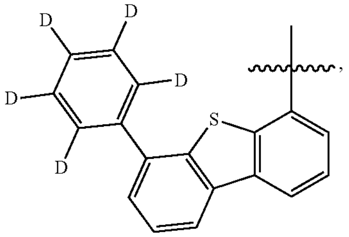
R106
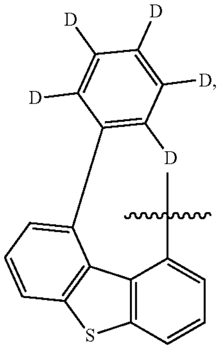
R107
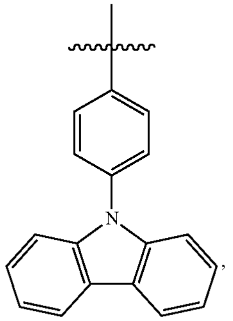
R108
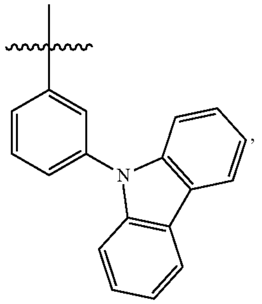

-continued
R109
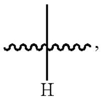
R110
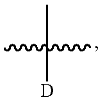
R111
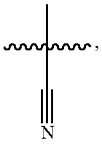
R112
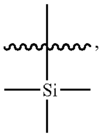
R113
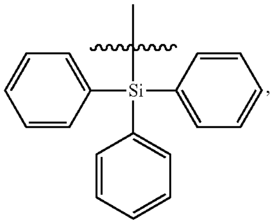
R114
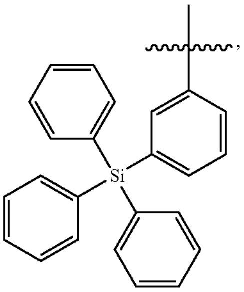
R115
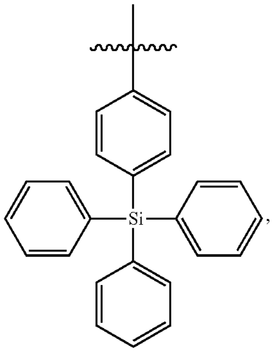
R116
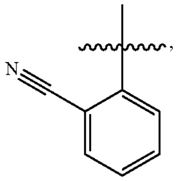
-continued
R117
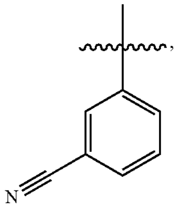
R118
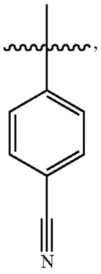
R119
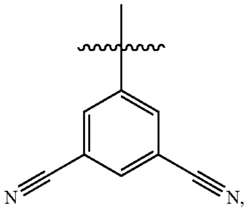
R120
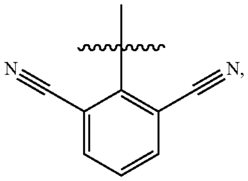
R121
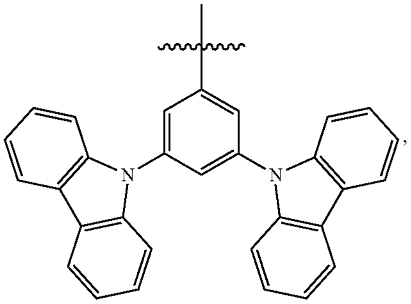
R122
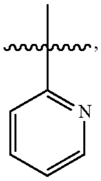

-continued
R123
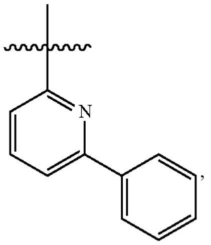
R124
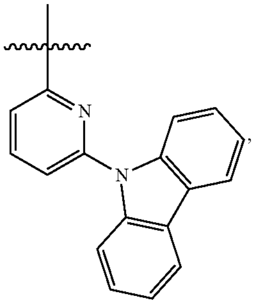
R125
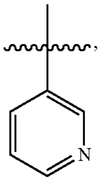
R126
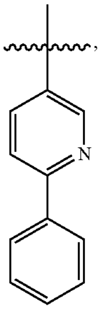
R127
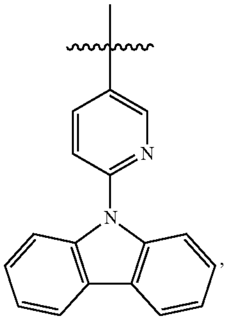
R128
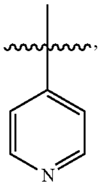
-continued
R129
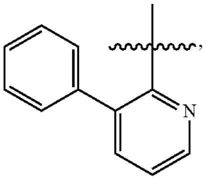
R130
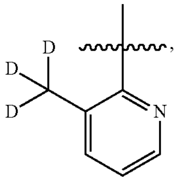
R131
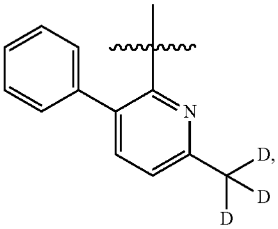
R132
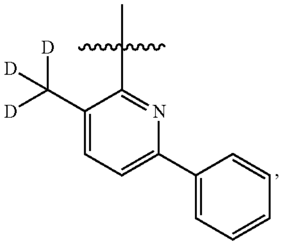
R133
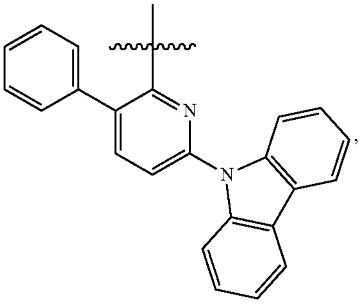
R134
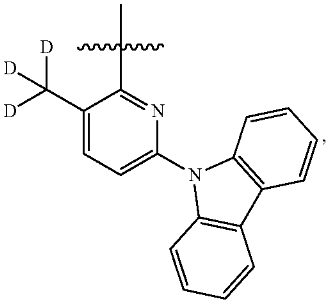

-continued
R135
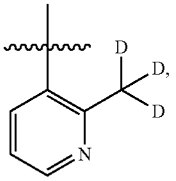
R136
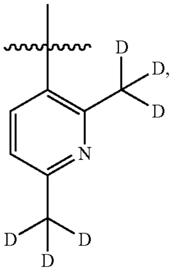
R137
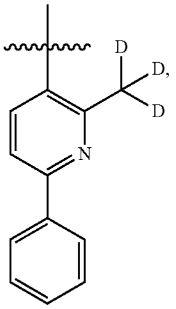
R138
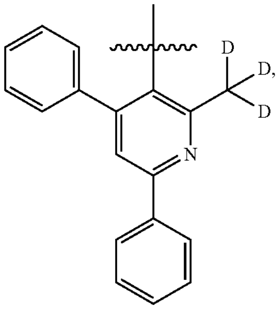
R139
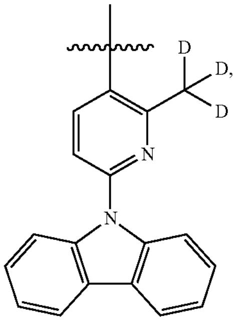
-continued
R140
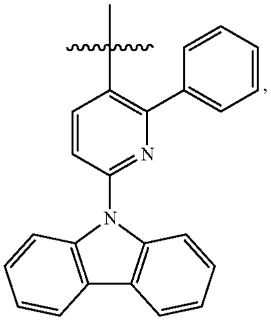
R141
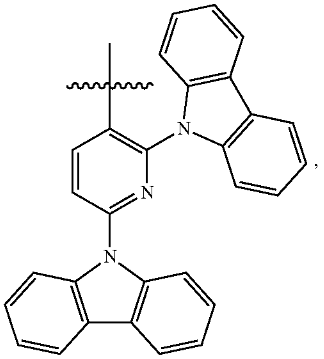
R142
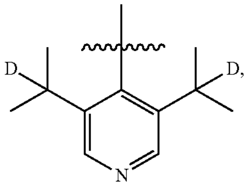
R143
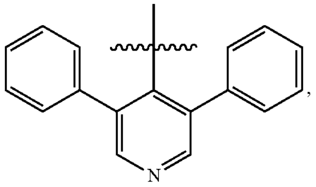
R144
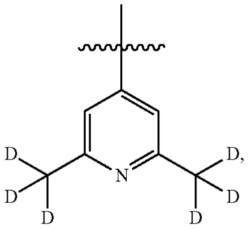
R145
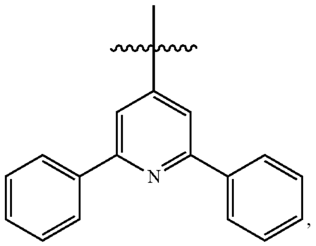

-continued
R146
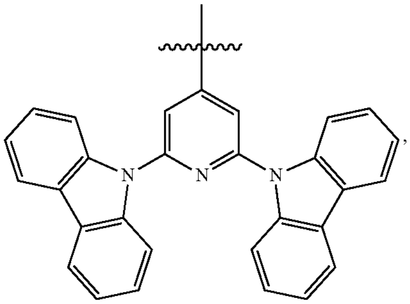
R147
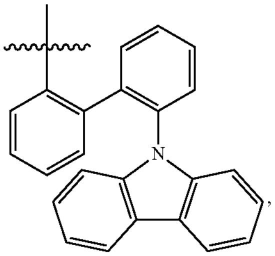
R148
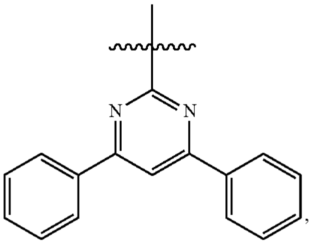
R149
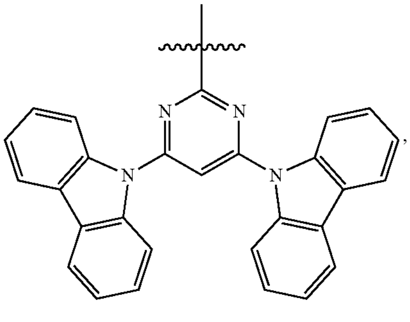
R150
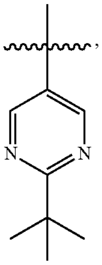
-continued
R151
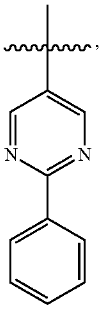
R152
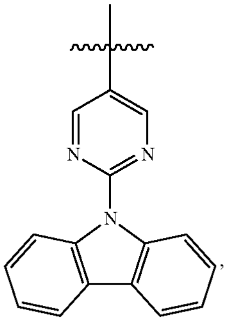
R153
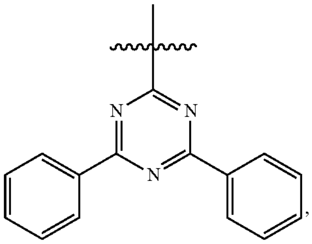
R154
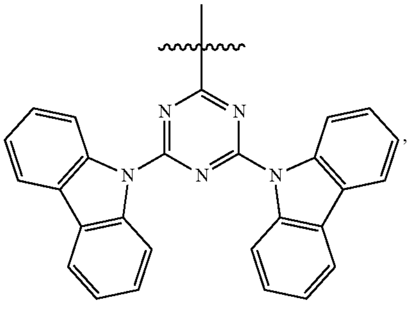
R155
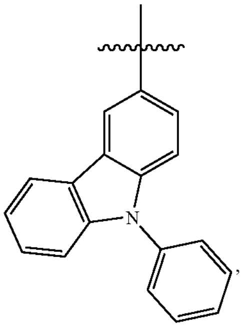

-continued
R156
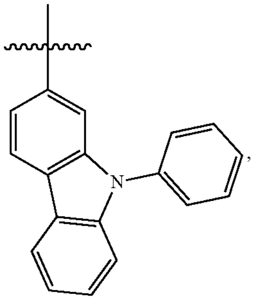
R157
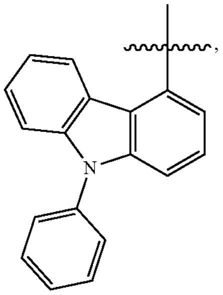
R158
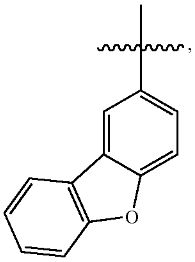
R159
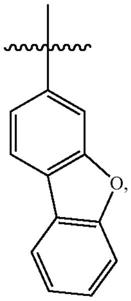
R160
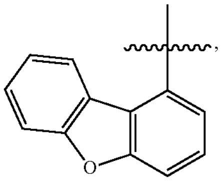
R161
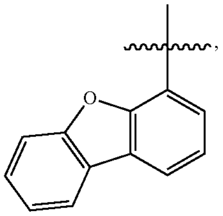
-continued
R162
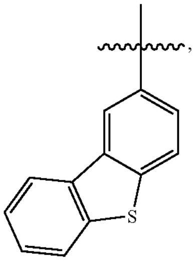
R163
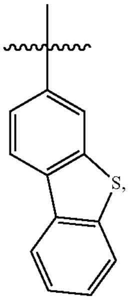
R164
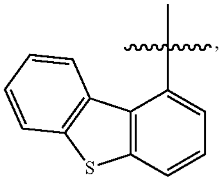
R165
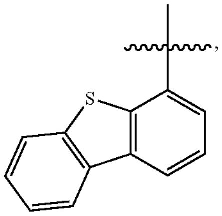
R166
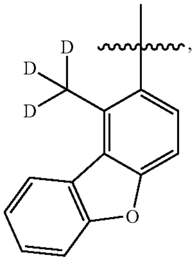
R167
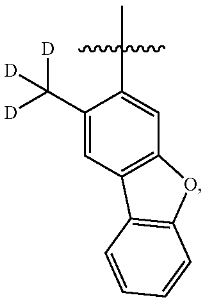

R168
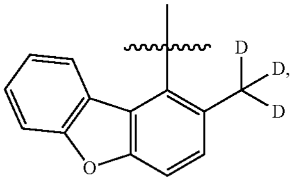
R169
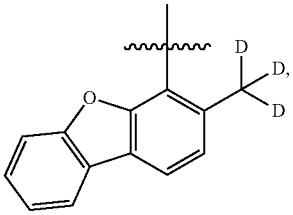
R170
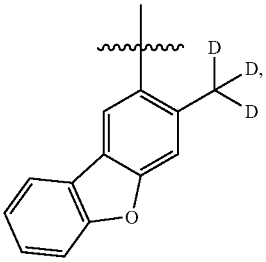
R171
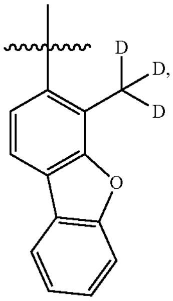
R172
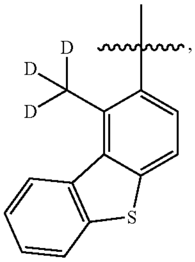
R173
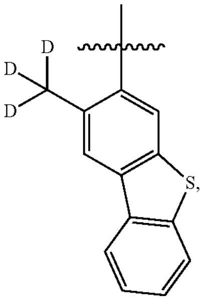
R174
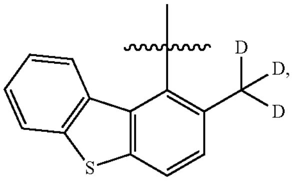
R175
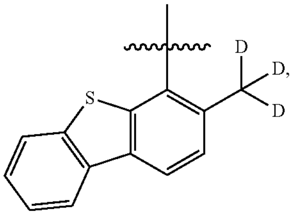
R176
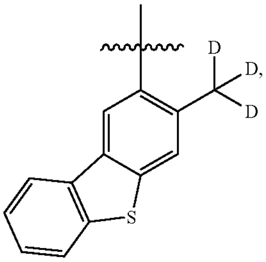
R177
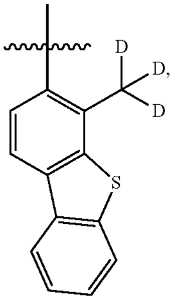
R178
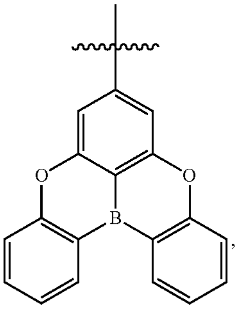
R179
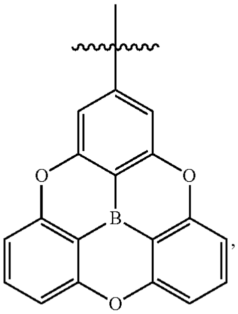

-continued
R180
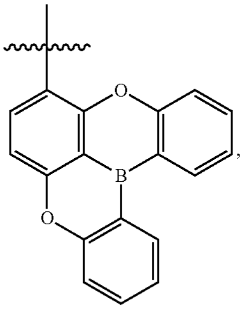
R181
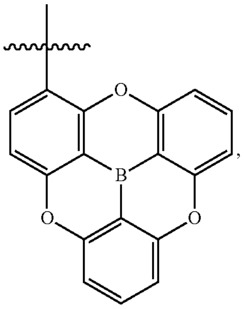
R182
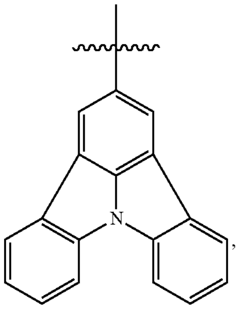
R183
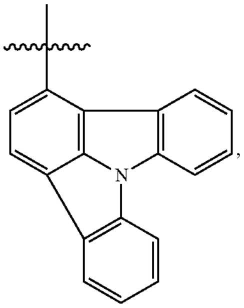
R184
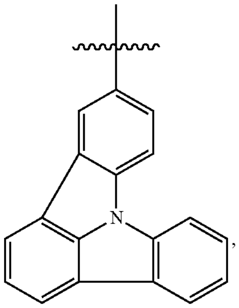
-continued
R185
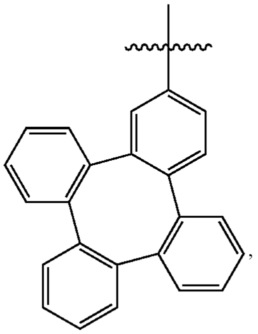
R186
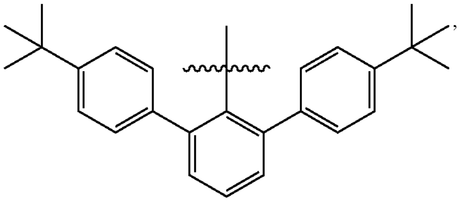
R187
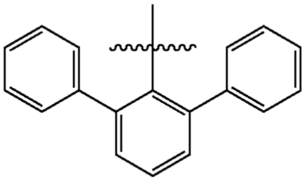
R188
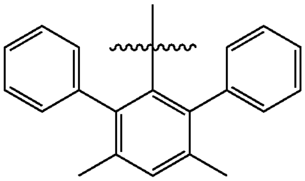
R189
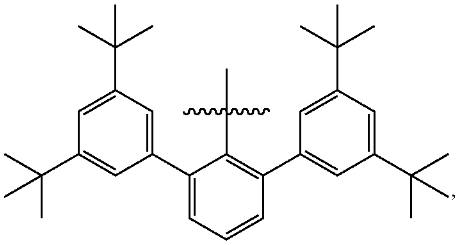
R190
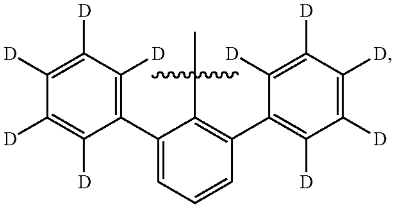
R191
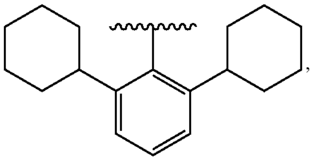

-continued
R192
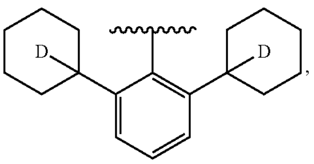
R193
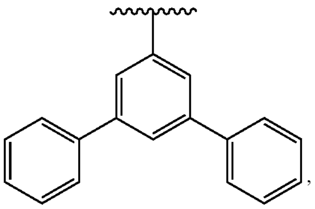
R194
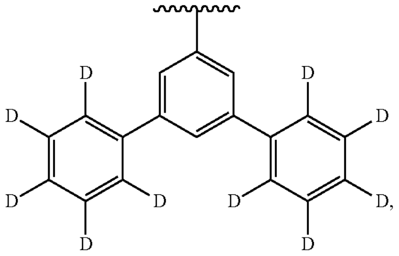
R195
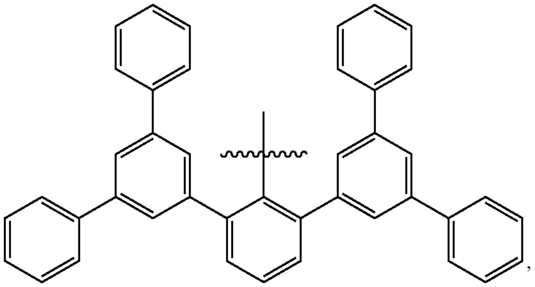
R196
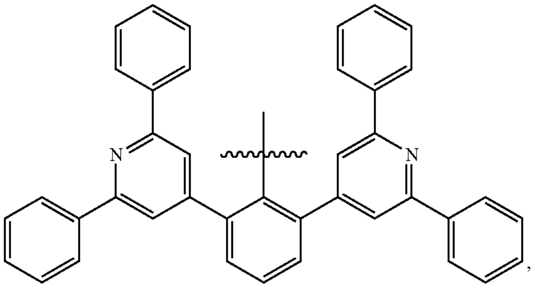
R197
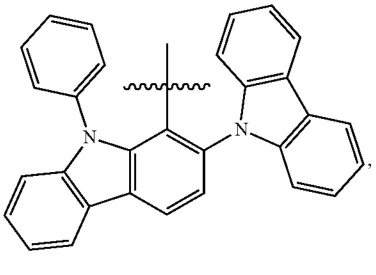
-continued
R198
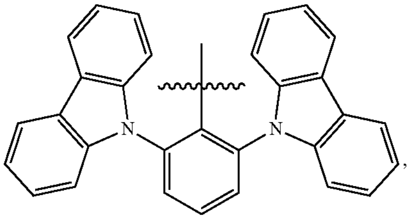
R199
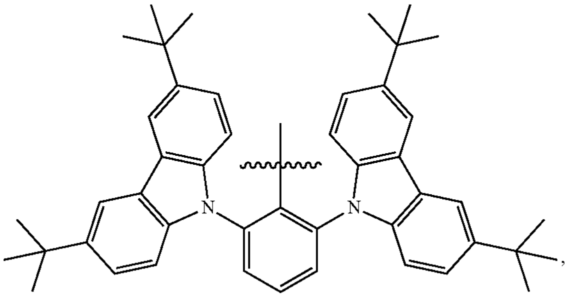
R200
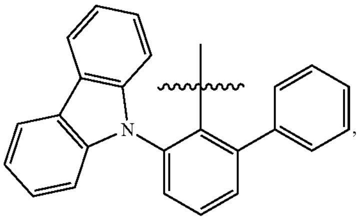
R201
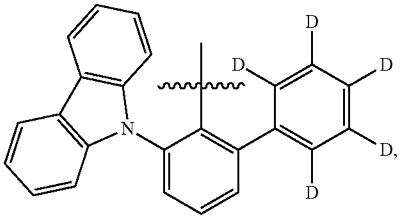
R202
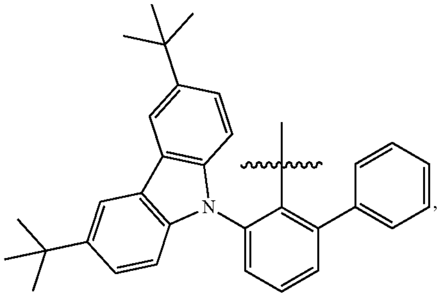
R203
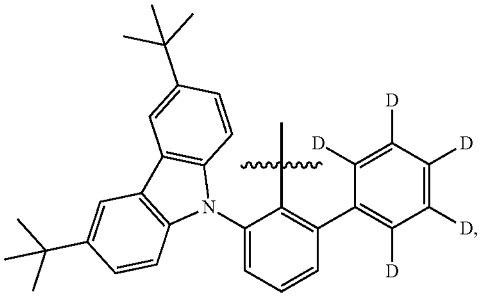

-continued
R204
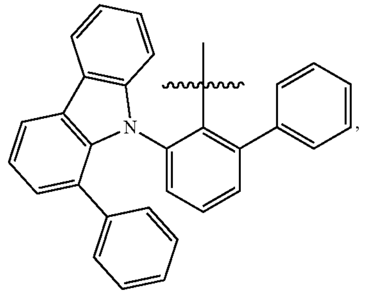
R205
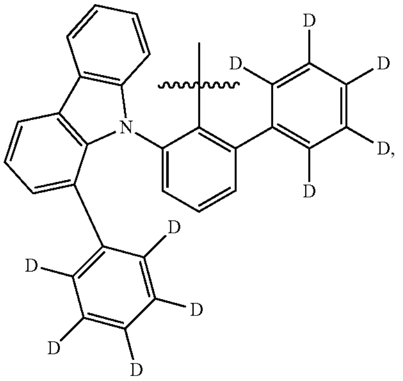
R206
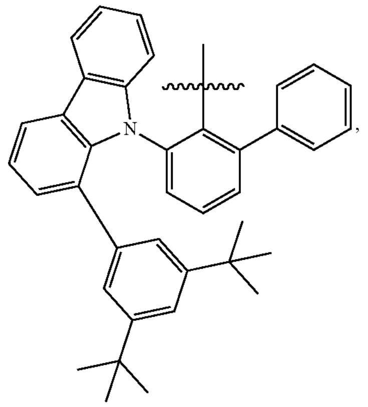
R207
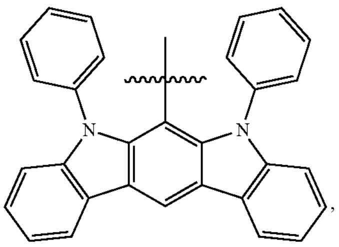
R208
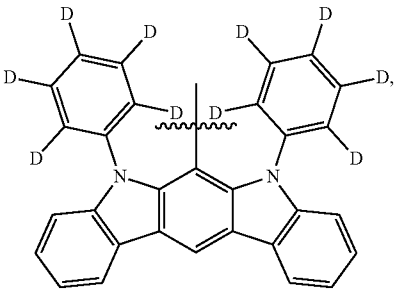
-continued
R209
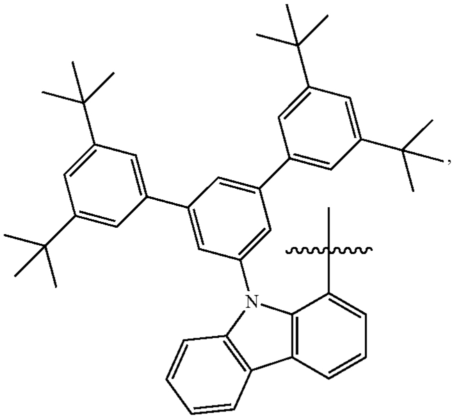
R210
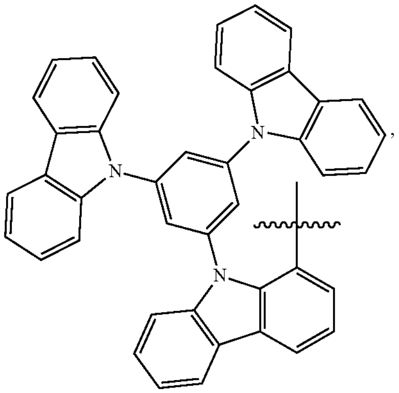
R211
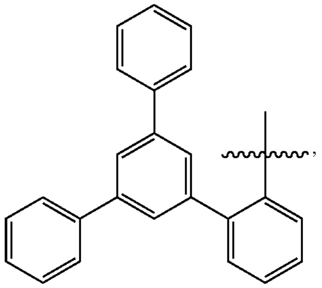
R212
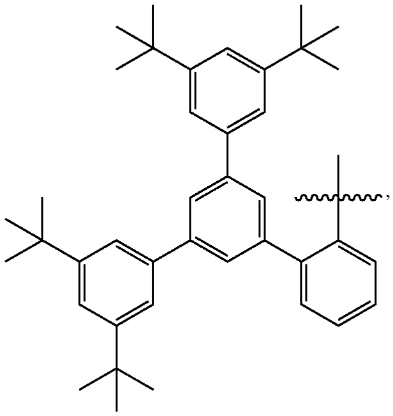

-continued
R213
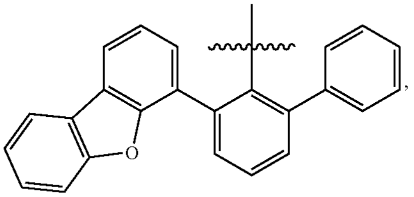
R214
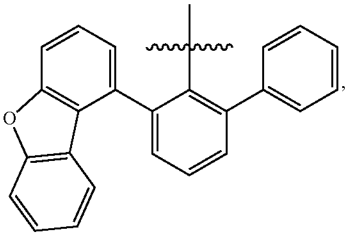
R215
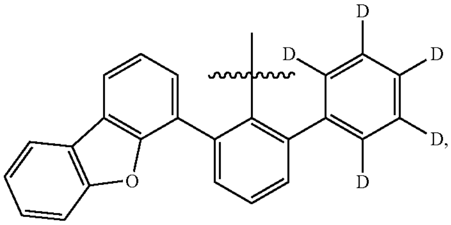
R216
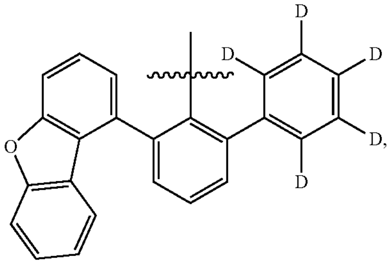
R217
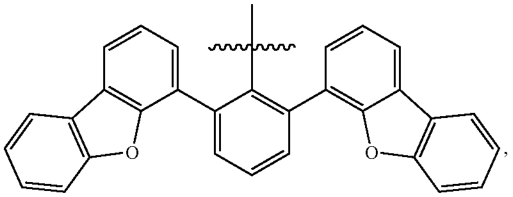
R218
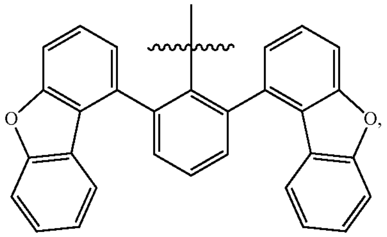
R219
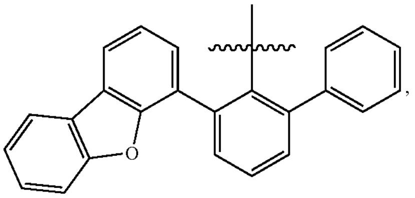
-continued
R220
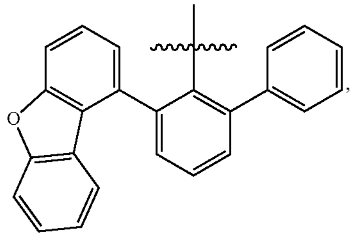
R221
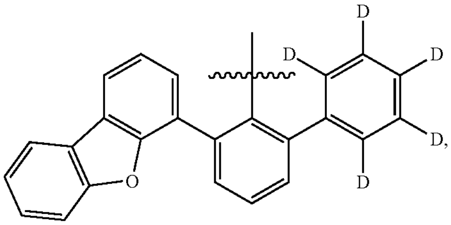
R222
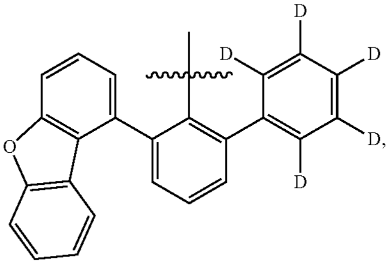
R223
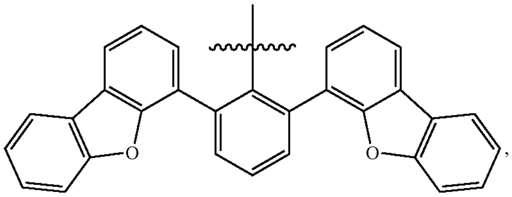
R224
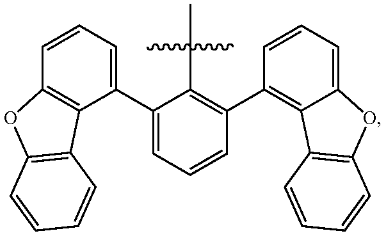
R225
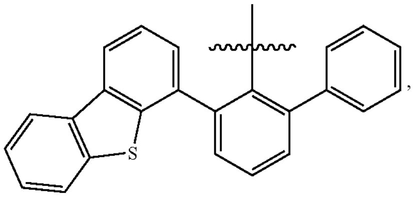

-continued
R226
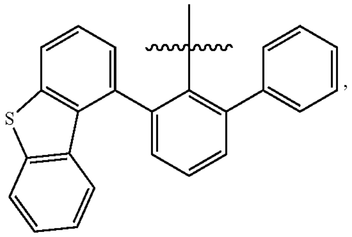
R227
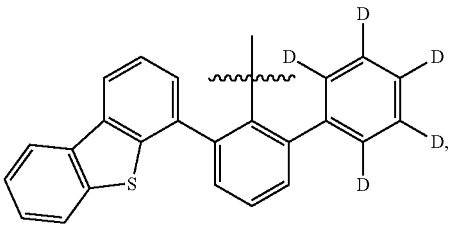
R228
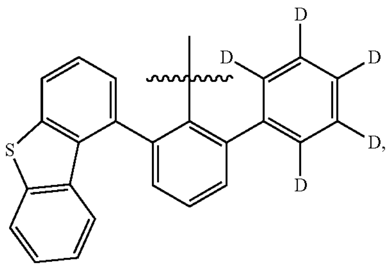
R229
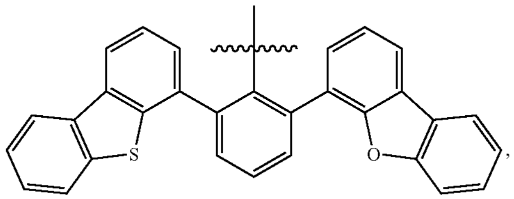
R230
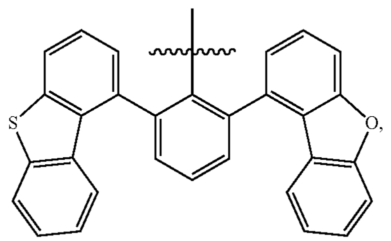
R231
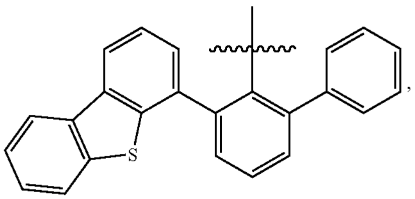
-continued
R232
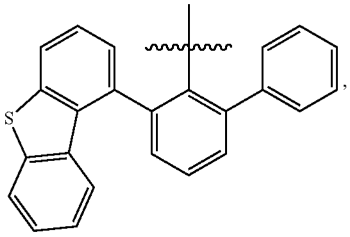
R233
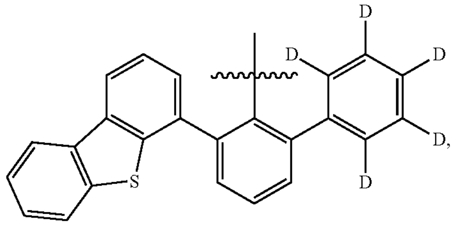
R234
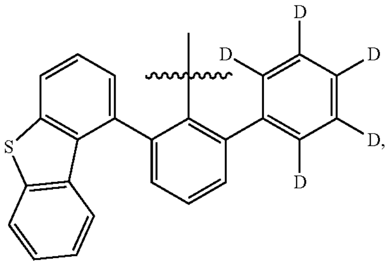
R235
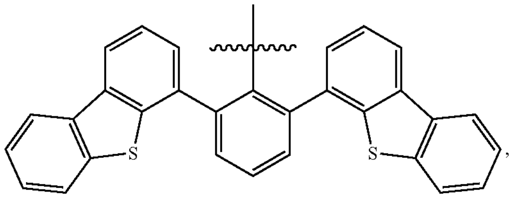
R236
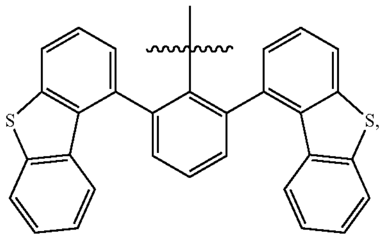
R237
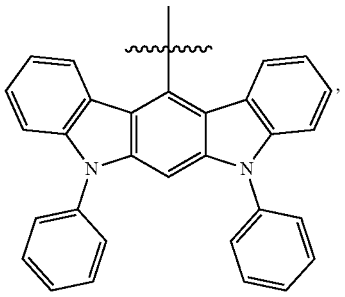

-continued
R238
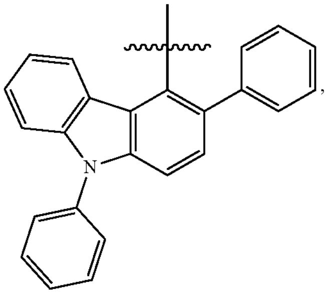
,
R239
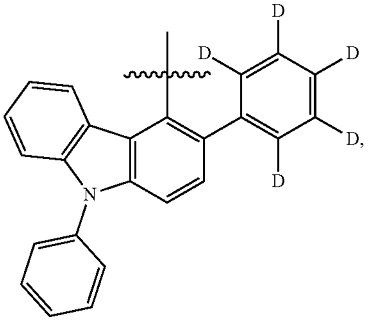
,
R240
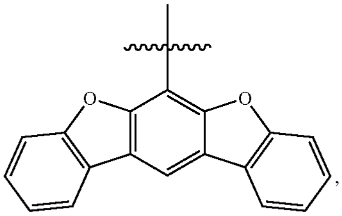
,
R241
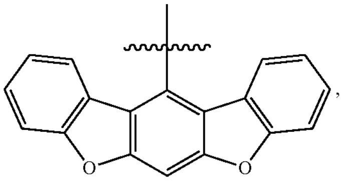
,
R242
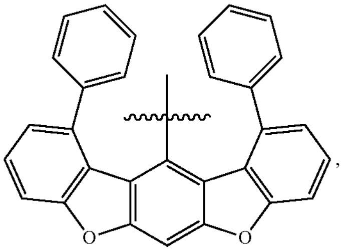
,
R243
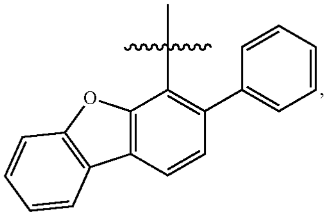
,
-continued
R244
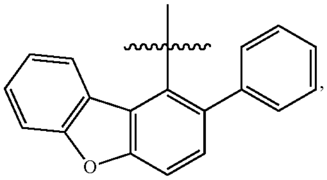
,
R245
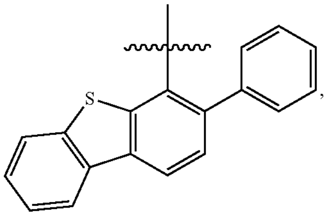
,
R246
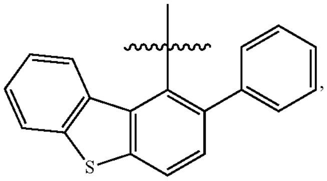
,
R247
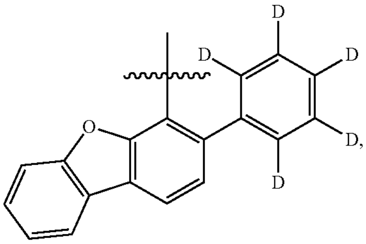
,
R248
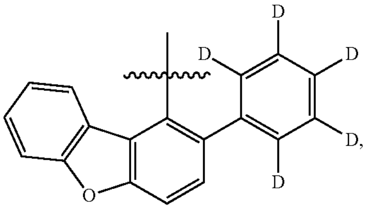
,
R249
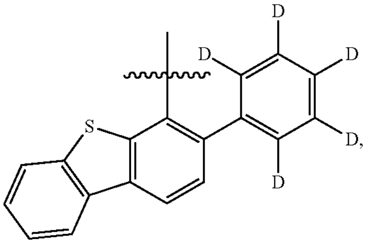
,
R250
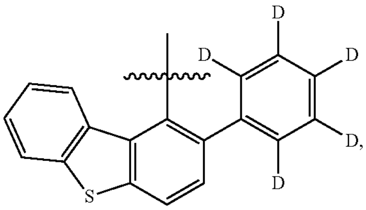
, -continued
R251
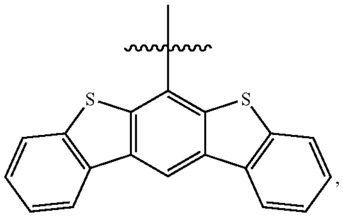
R252
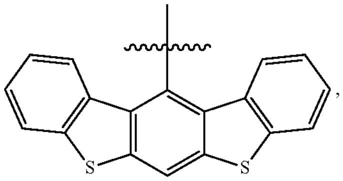
R253
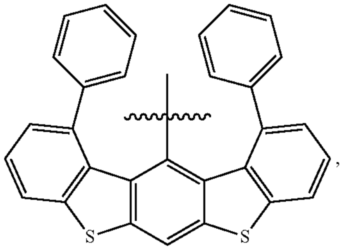
R254
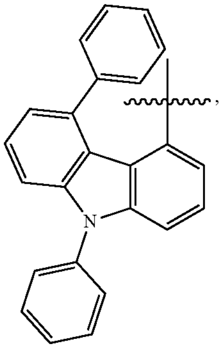
R255
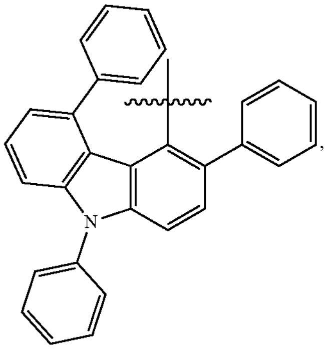
-continued
R256
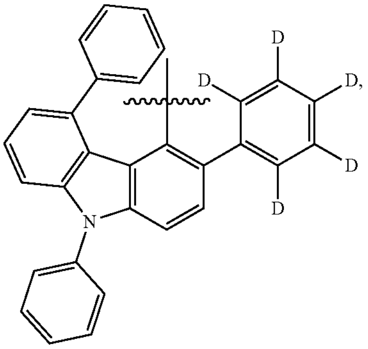
R257
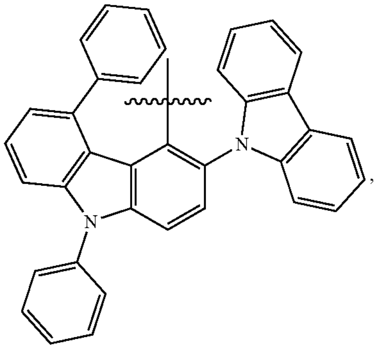
R258
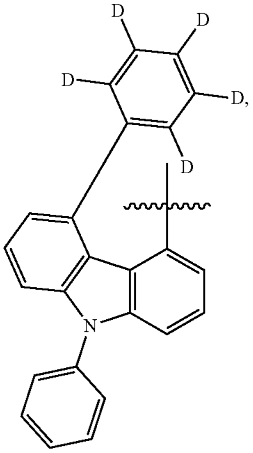
R259
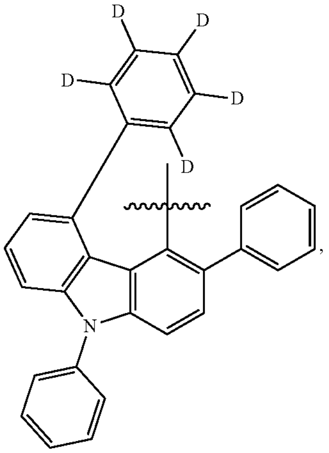

-continued
R260
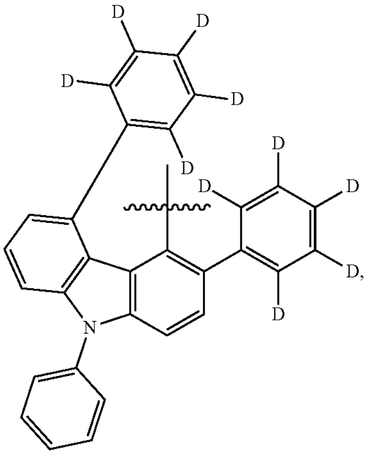
R261
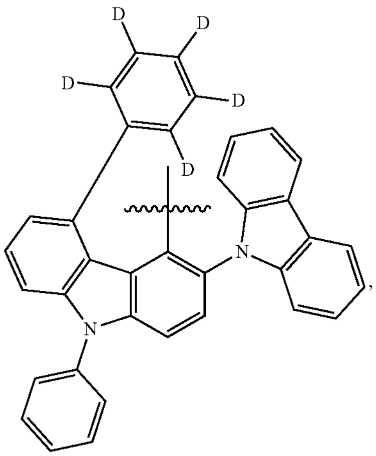
R262
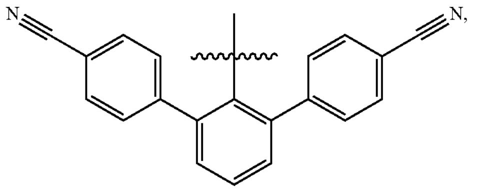
R263
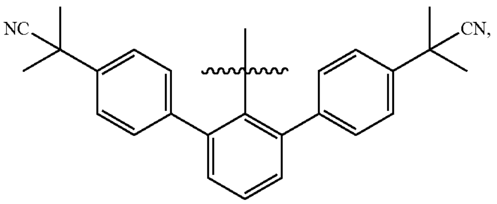
-continued
R264
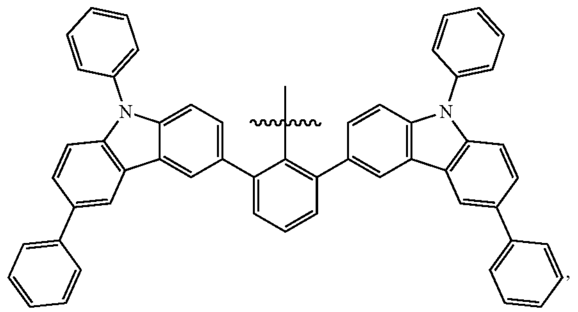
R265
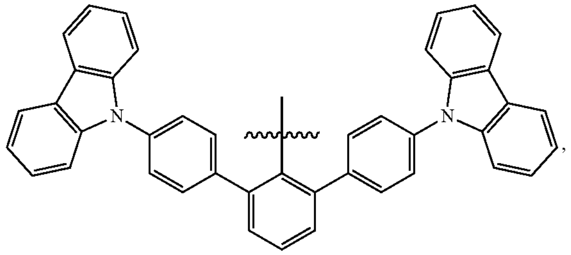
R266
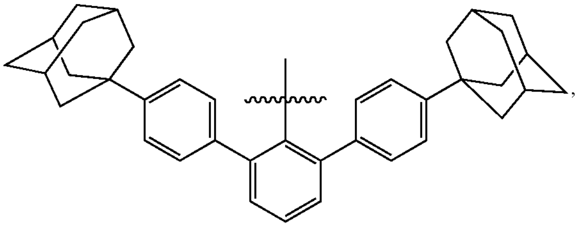
R267
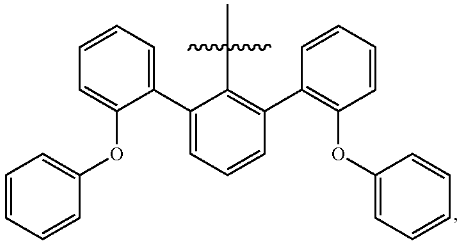
R268
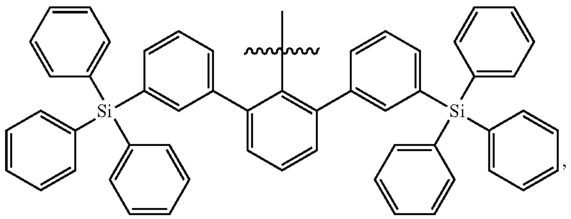
R269
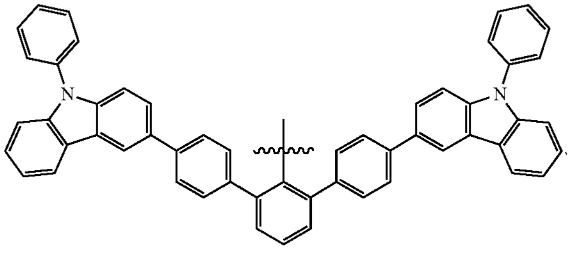

R270
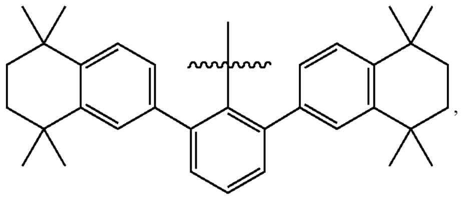
R271
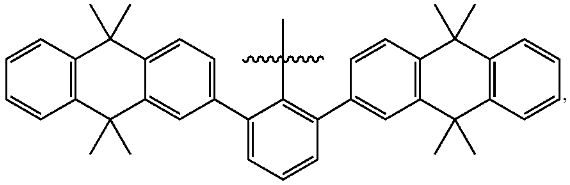
R272
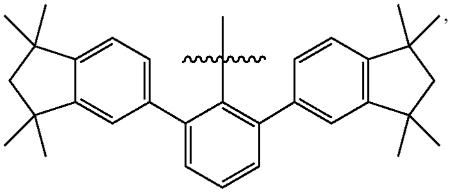
R273
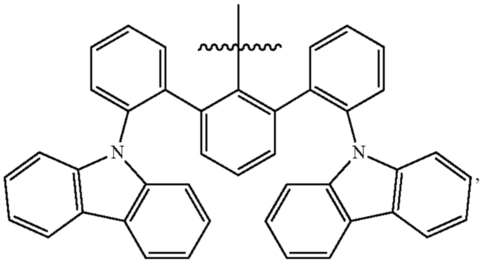
R274
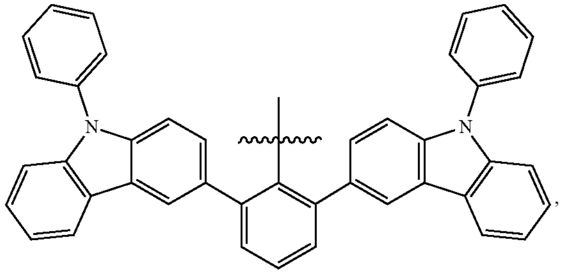
R275
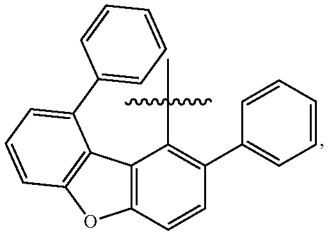
R276
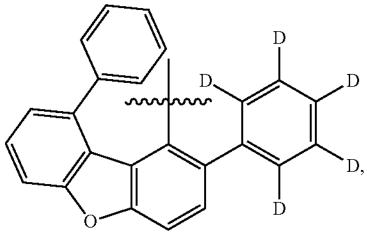
R277
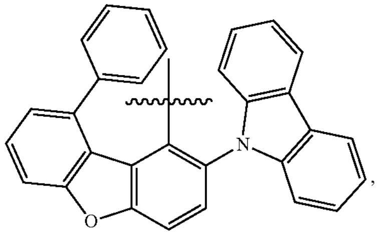
R278
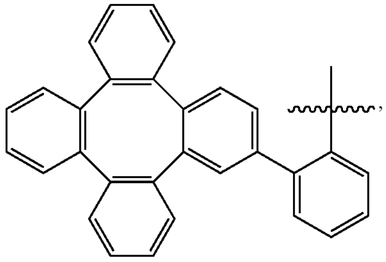
R279
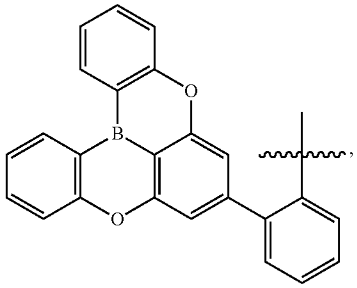
R280
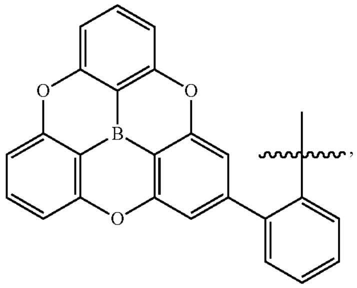
R281
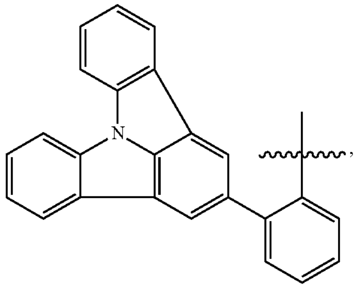

-continued
R282
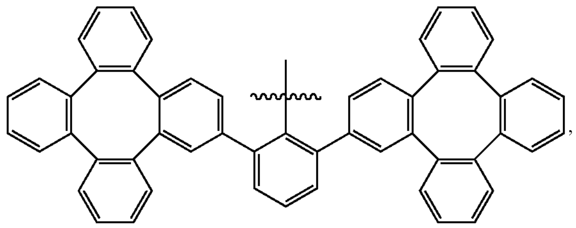
R283
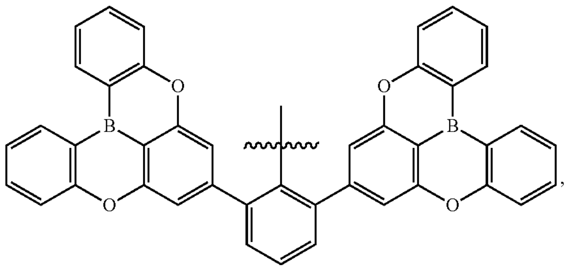
R284
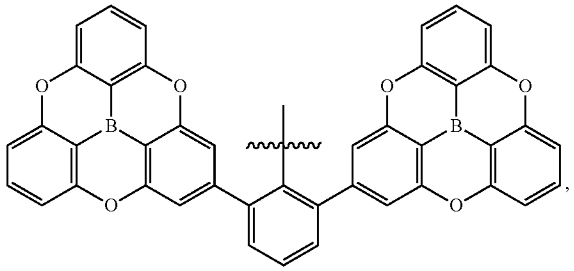
R285
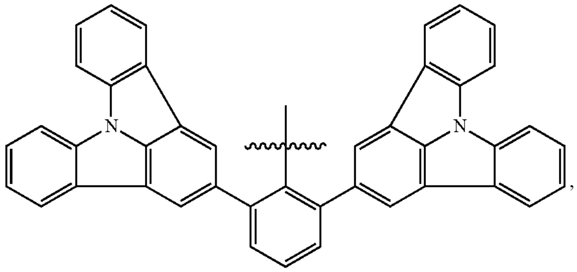
R286
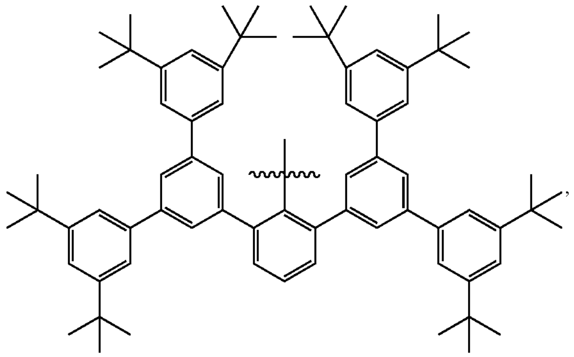
-continued
R287
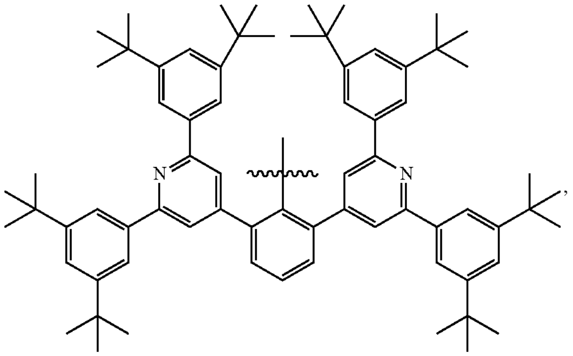
R288
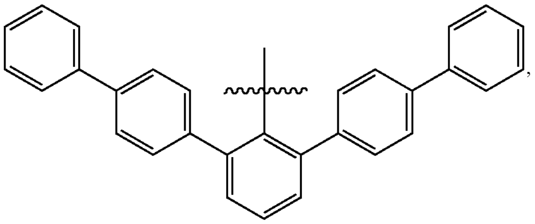
R289
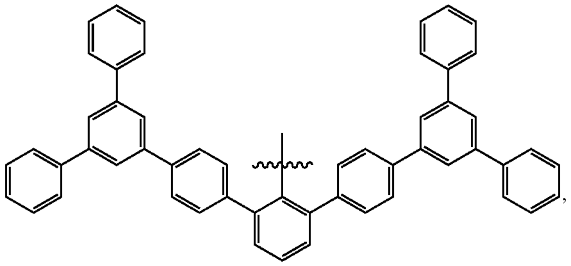
R290
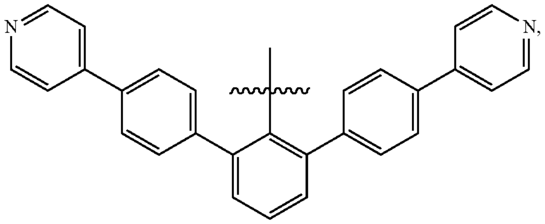
R291
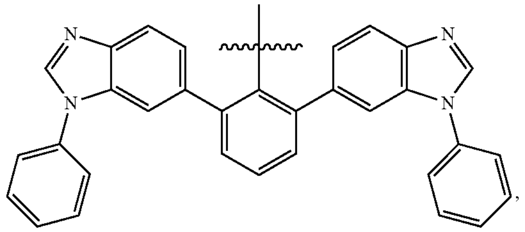

-continued
R292
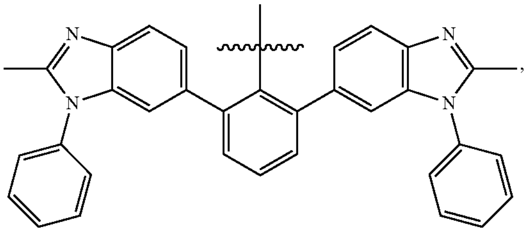
R293
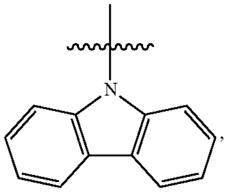
R294
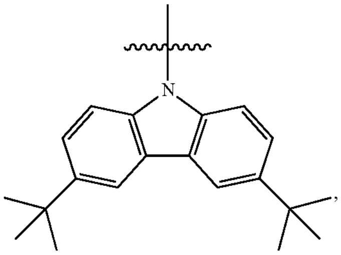
R295
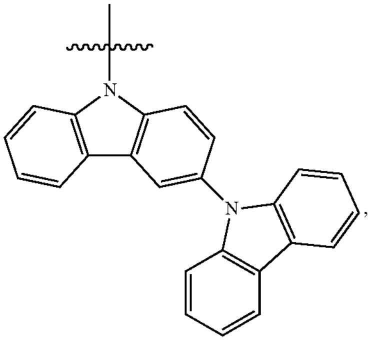
R296
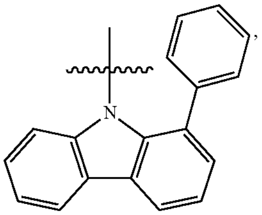
R297
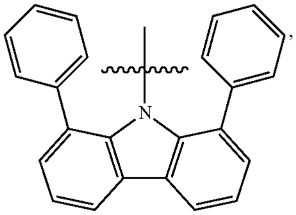
-continued
R298
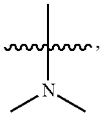
R299
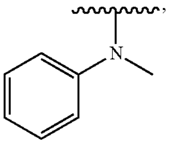
R300
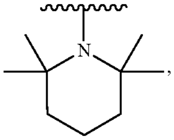
R301
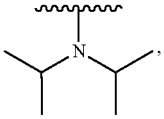
R302
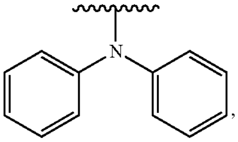
R303
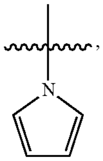
R304
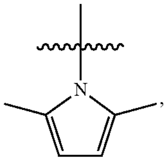
R305
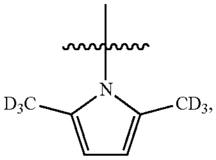
R306
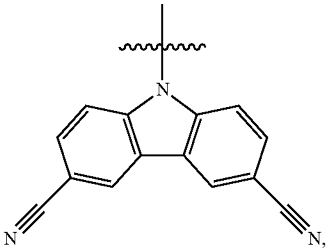
and -continued

R307

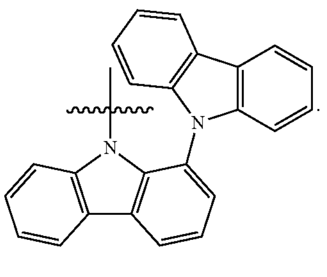

In some embodiments, the compound can have a formula of $M(L_A)_p(L_B)_q(L_C)_r$ wherein $L_B$ and $L_C$ are each a bidentate ligand; and wherein p is 1, 2, or 3; q is 0, 1, or 2; r is 0, 1, or 2; and p+q+r is the oxidation state of the metal M.

In some embodiments, the compound can have a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other.

In some embodiments, $L_B$ can be a substituted or unsubstituted phenylpyridine, and $L_C$ can be a substituted or unsubstituted acetylacetonate.

In some embodiments, the compound can have a formula of $Pt(L_A)(L_B)$; and wherein $L_A$ and $L_B$ can be same or different. In some embodiments, $L_A$ and $L_B$ can be connected to form a tetradentate ligand.

In some embodiments, $L_B$ and $L_C$ can be each independently selected from the group consisting of the following structures in LIST 2:

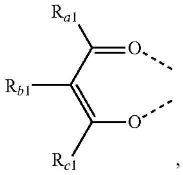
,
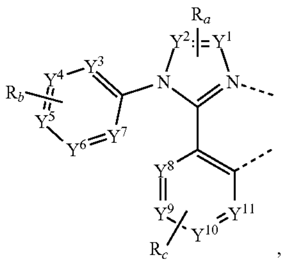
,
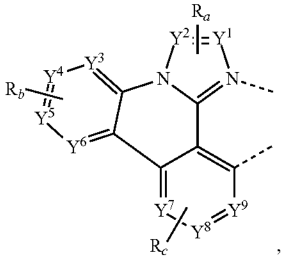
,
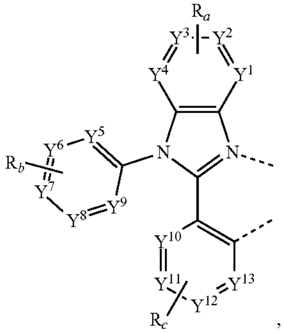
,

-continued

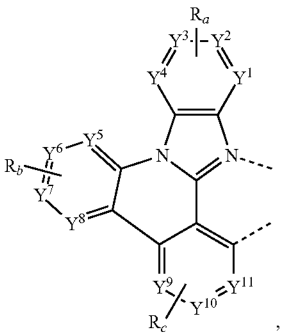
,
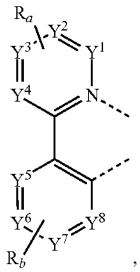
,
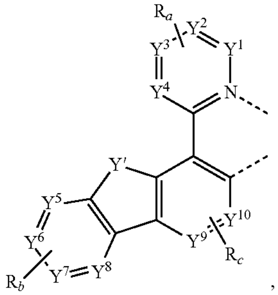
,
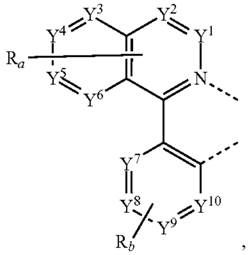
,
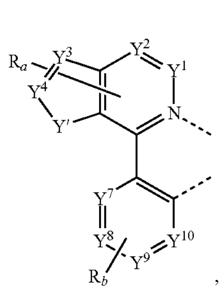
,
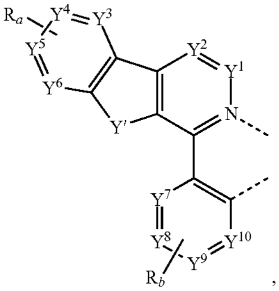
,
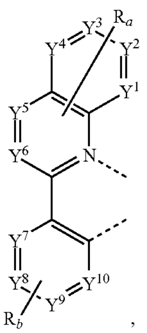
,
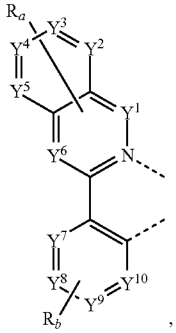
,
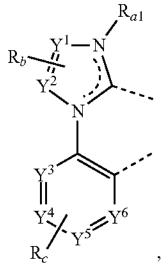
,
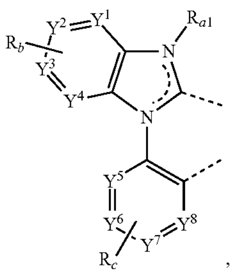
,
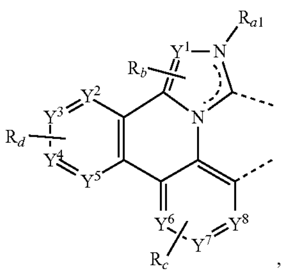
, -continued

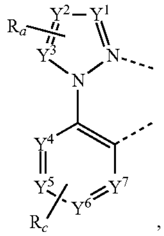

,

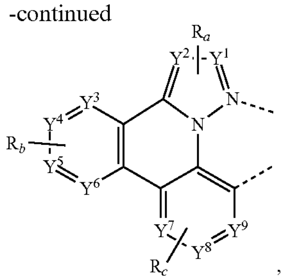

,

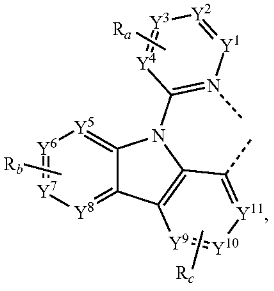

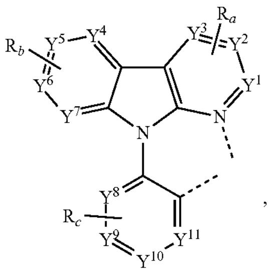

,

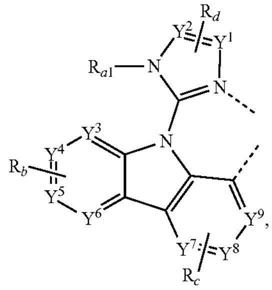

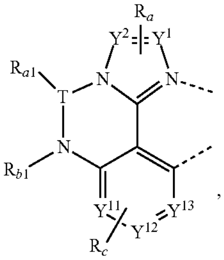

,

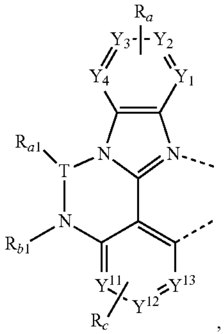

,

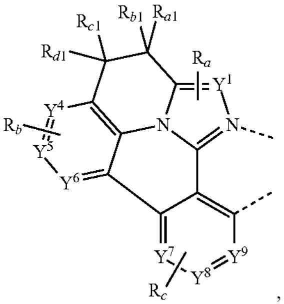

,

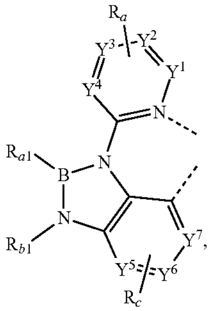

and

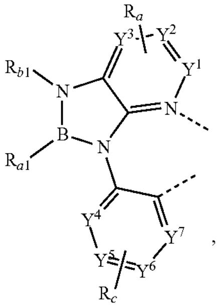

, wherein:

T is selected from the group consisting of B, Al, Ga, and In;

each of $Y^1$ to $Y^{13}$ is independently selected from the group consisting of carbon and nitrogen;

Y' is selected from the group consisting of $BR_e$, $BR_eR_f$, $NR_e$, $PR_e$, $P(O)R_e$, O, S, Se, C═O, C═S, C═Se, $C═NR_e$, $C═CR_eR_f$, S═O, $SO_2$, $CR_eR_f$, $SiR_eR_f$, and $GeR_eR_f$;

$R_e$ and $R_f$ can be fused or joined to form a ring;

each of $R_a$, $R_b$, $R_c$, and $R_d$ independently represents zero, mono, or up to a maximum allowed number of substitutions to its associated ring;

each of $R_{a1}$, $R_{b1}$, $R_{c1}$, $R_{d1}$, $R_a$, $R_b$, $R_c$, $R_d$, $R_e$ and $R_f$ is independently a hydrogen or a substituent selected from the group consisting of the general substituents as defined herein; and any two adjacent $R_a$, $R_b$, $R_c$, $R_d$, $R_e$ and $R_f$ can be fused or joined to form a ring or form a multidentate ligand.

In some embodiments, $L_B$ and $L_C$ can each be independently selected from the group consisting of the following structures in LIST 3:

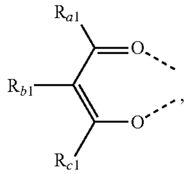

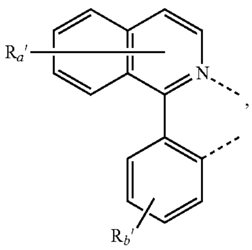

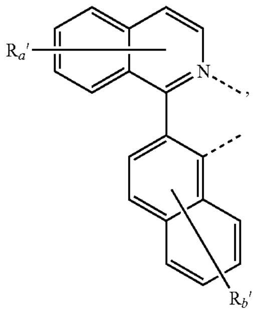

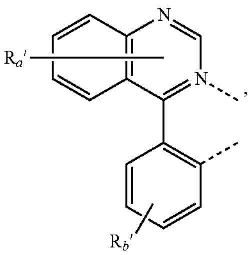

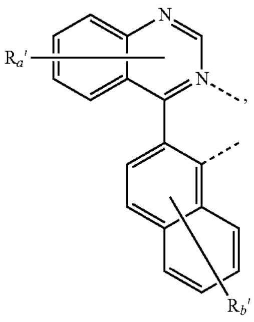

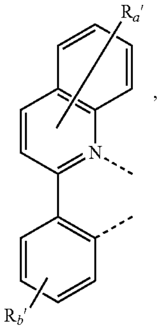

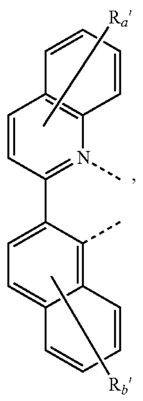

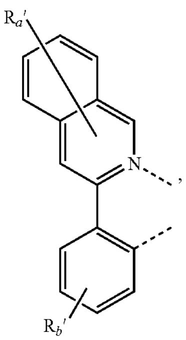

-continued
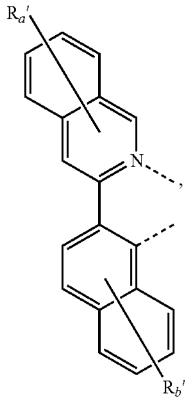
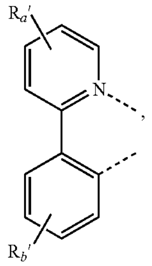
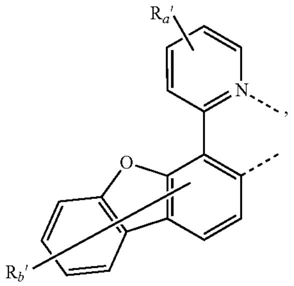
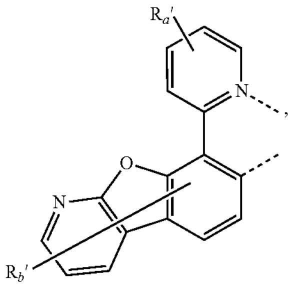
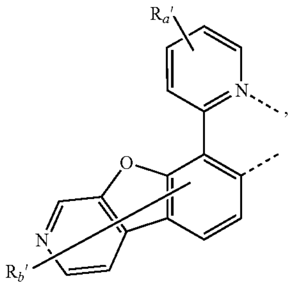
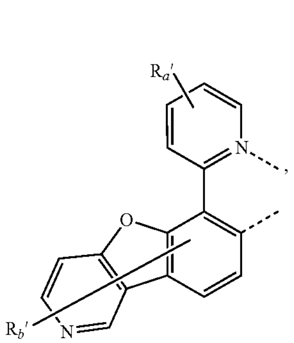
-continued
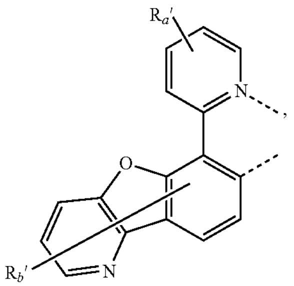
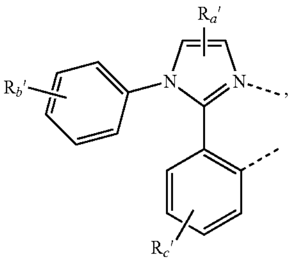
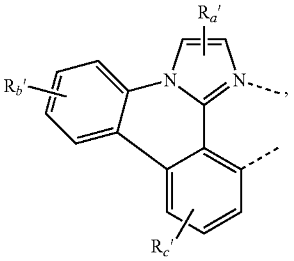
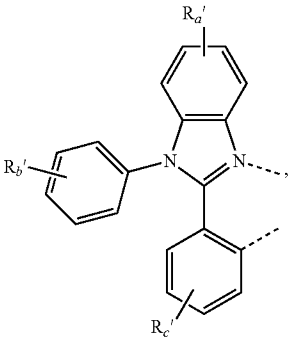
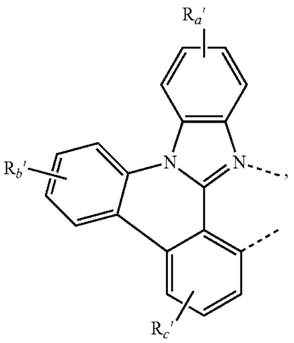

-continued
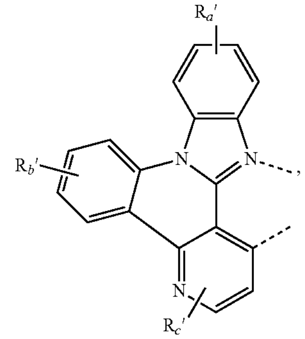
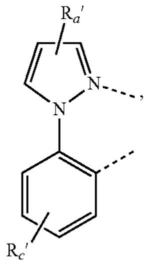
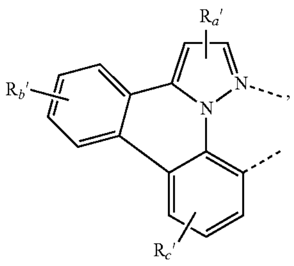
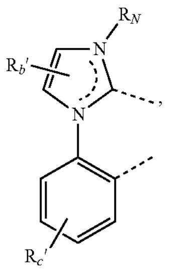
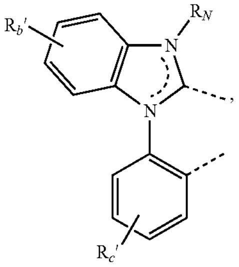
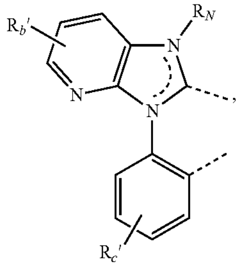
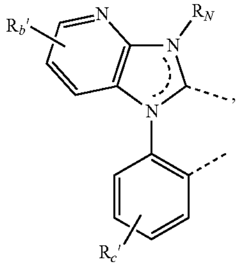
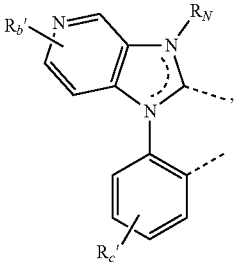
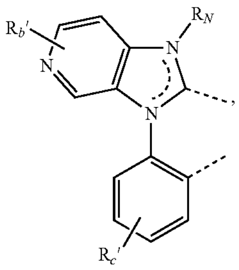
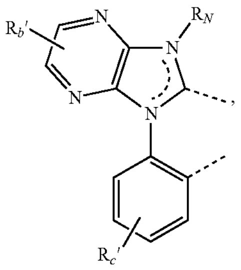
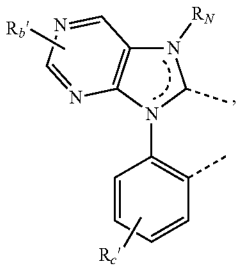
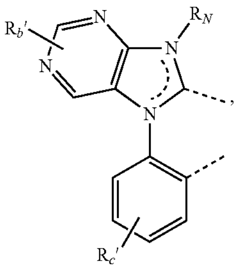
-continued
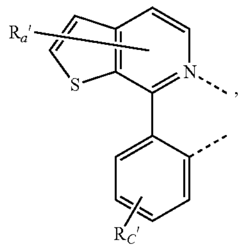
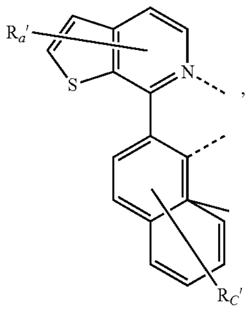
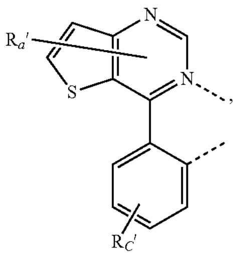
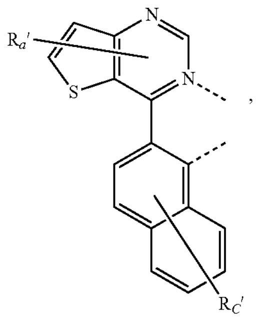
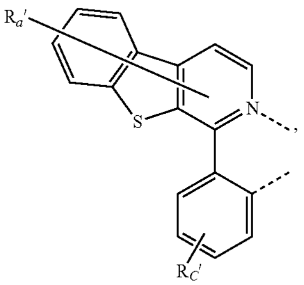
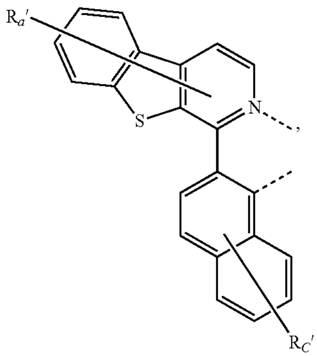
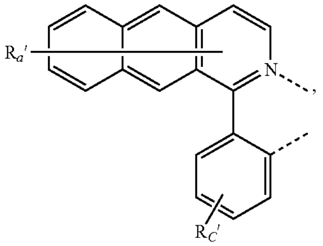

-continued
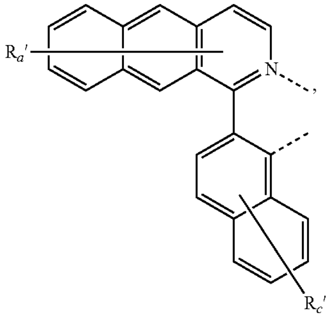
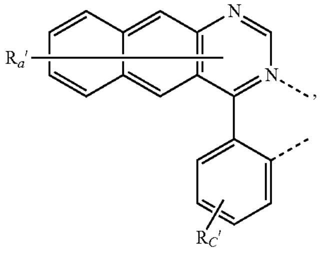
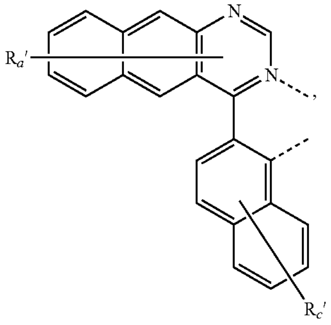
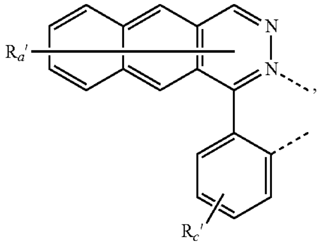
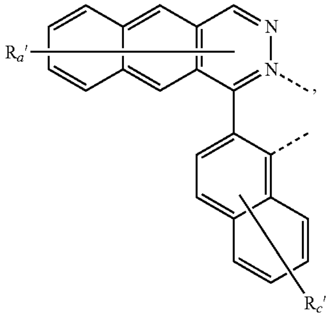
-continued
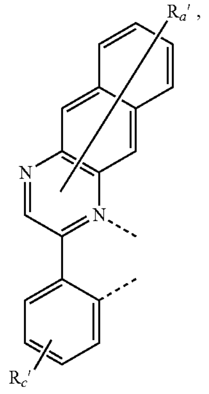
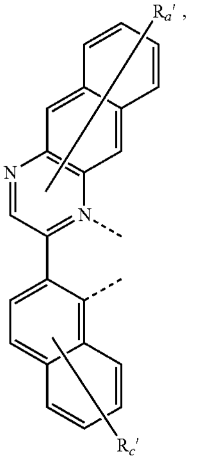
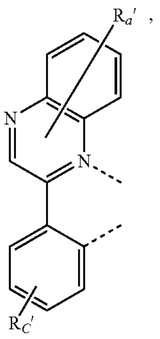
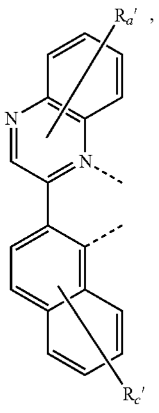
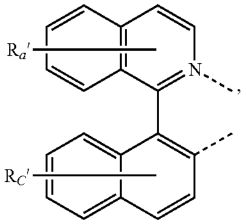
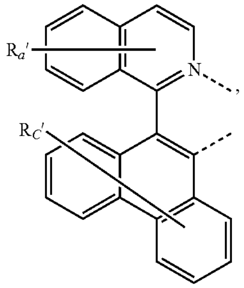
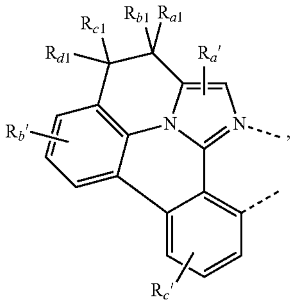
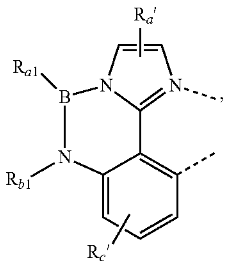

-continued

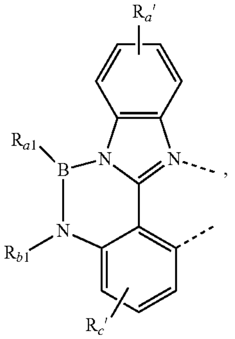

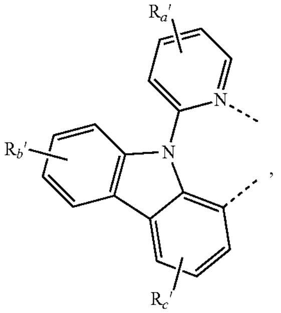

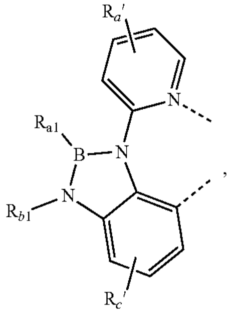

and

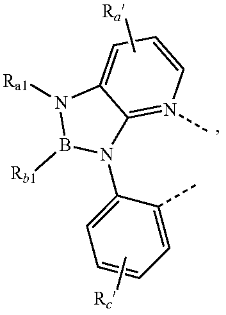

wherein $R_a'$, $R_b'$, and $R_c'$ each independently represent zero, mono, or up to the maximum allowed number of substitutions to its associated ring; each of $R_{a1}$, $R_{b1}$, $R_{c1}$, $R_N$, $R_a'$, $R_b'$, and $R_c'$ can be independently hydrogen or a substituent selected from the group consisting of the general substituents defined herein; and any two adjacent $R_a'$, $R_b'$, and $R_c'$ can be fused or joined to form a ring or form a multidentate ligand.

In some embodiments, the compound can be selected from the group consisting of $Ir(L_A)_3$, $Ir(L_A)(L_{Bk})_2$, $Ir(L_A)(L_{BBn})_2$, $Ir(L_A)_2(L_{Bk})$, $Ir(L_A)_2(L_{BBn})$, $Ir(L_A)_2(L_{Cj-I})$, and $Ir(L_A)_2(L_{Cj-II})$, wherein $L_A$ is a ligand defined herein; wherein k is an integer from 1 to 324, n is an integer from 1 to 195, and $L_{B1}$ to $L_{B324}$ are defined as follows in LIST 4:

$L_{B1}$

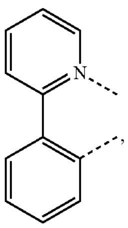

-continued $L_{B2}$

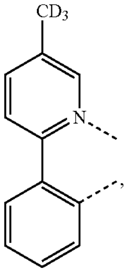

$L_{B3}$

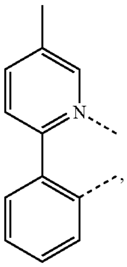

$L_{B4}$

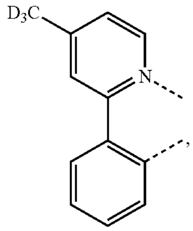

$L_{B5}$

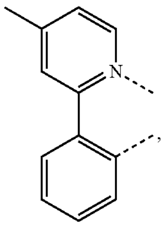

$L_{B6}$

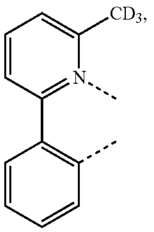

$L_{B7}$

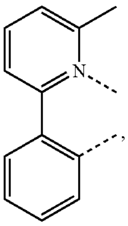

-continued
$L_{B8}$
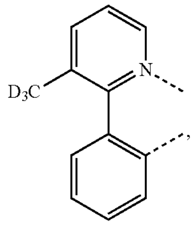
$L_{B9}$
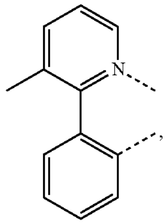
$L_{B10}$
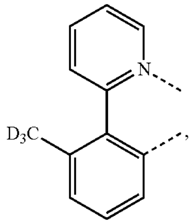
$L_{B11}$
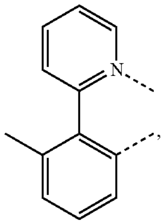
$L_{B12}$
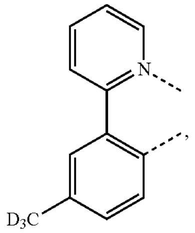
$L_{B13}$
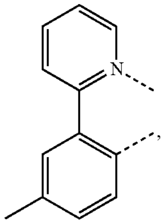
-continued
$L_{B14}$
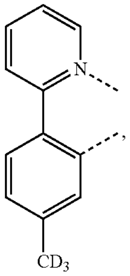
$L_{B15}$
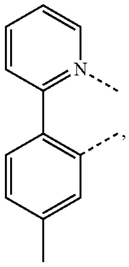
$L_{B16}$
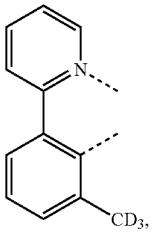
$L_{B17}$
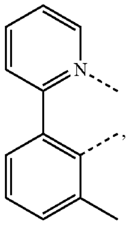
$L_{B18}$
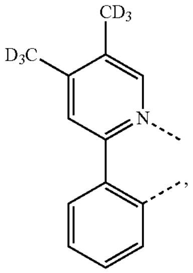
$L_{B19}$
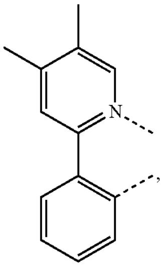

$L_{B20}$
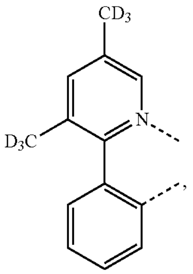
$L_{B21}$
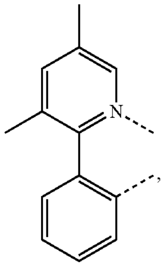
$L_{B22}$
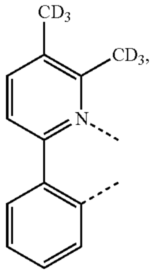
$L_{B23}$
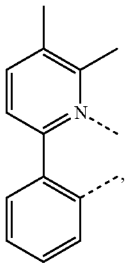
$L_{B24}$
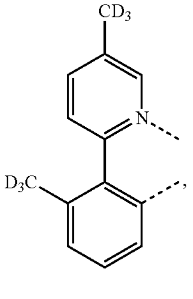
$L_{B25}$
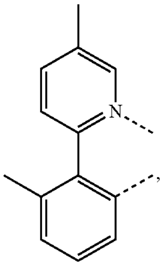
$L_{B26}$
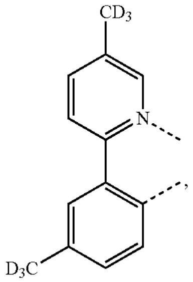
$L_{B27}$
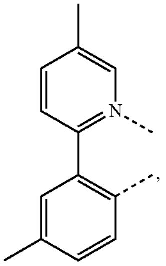
$L_{B28}$
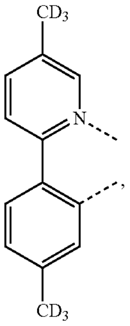
$L_{B29}$
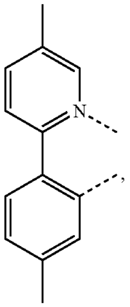

-continued
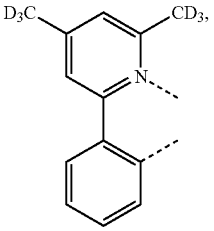
$L_{B30}$
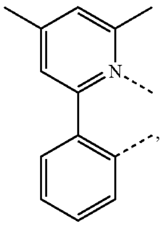
$L_{B31}$
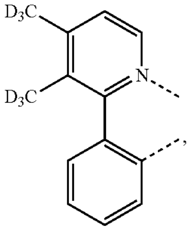
$L_{B32}$
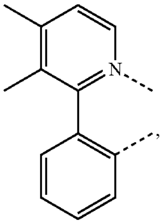
$L_{B33}$
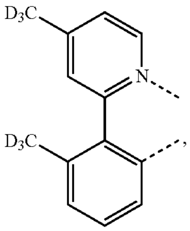
$L_{B34}$
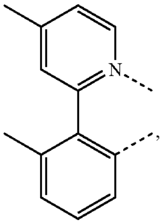
$L_{B35}$
-continued
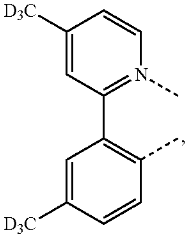
$L_{B36}$
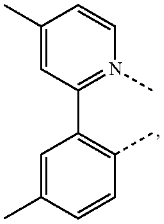
$L_{B37}$
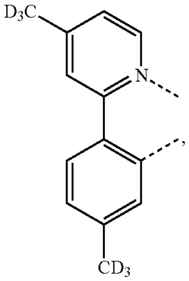
$L_{B38}$
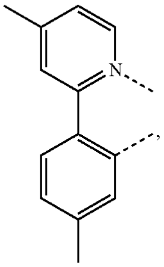
$L_{B39}$
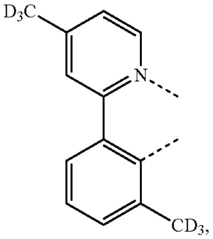
$L_{B40}$
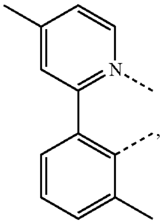
$L_{B41}$ -continued
$L_{B42}$
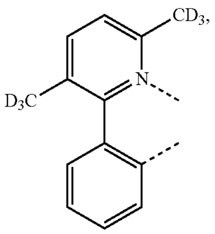
$L_{B43}$
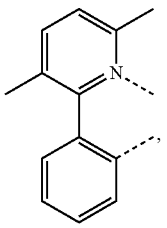
$L_{B44}$
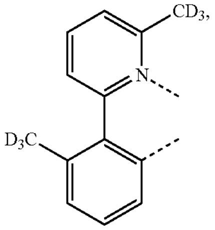
$L_{B45}$
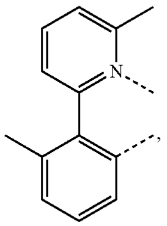
$L_{B46}$
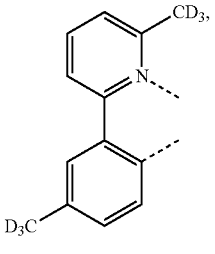
$L_{B47}$
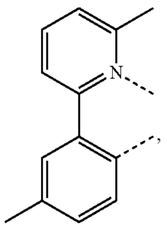
-continued
$L_{B48}$
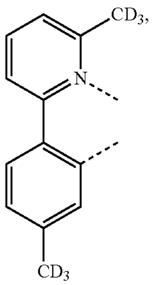
$L_{B49}$
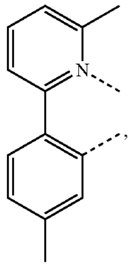
$L_{B50}$
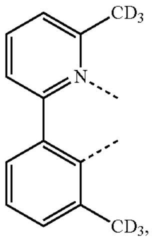
$L_{B51}$
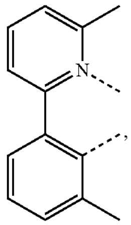
$L_{B52}$
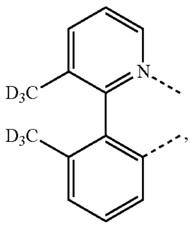
$L_{B53}$
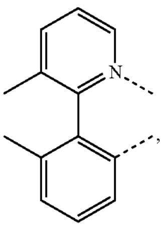

-continued
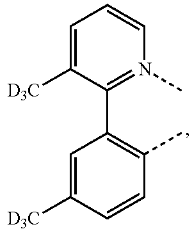
$L_{B54}$
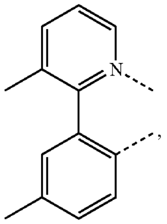
$L_{B55}$
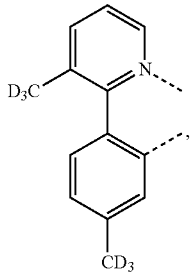
$L_{B56}$
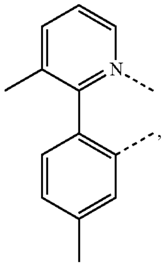
$L_{B57}$
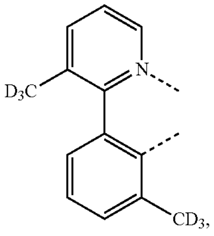
$L_{B58}$
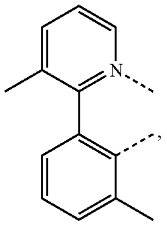
$L_{B59}$
-continued
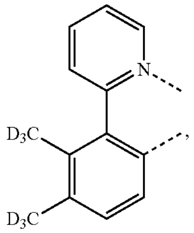
$L_{B60}$
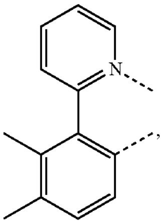
$L_{B61}$
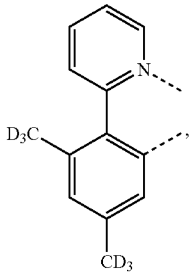
$L_{B62}$
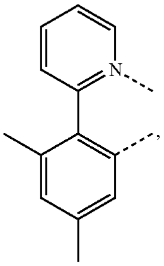
$L_{B63}$
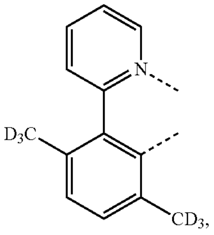
$L_{B64}$
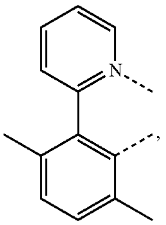
$L_{B65}$ -continued
$L_{B66}$
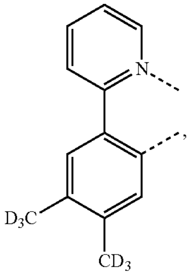
$L_{B67}$
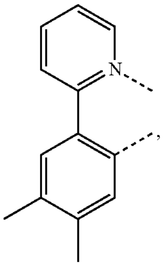
$L_{B68}$
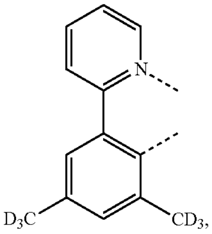
$L_{B69}$
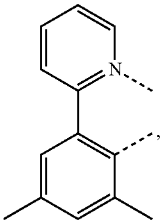
$L_{B70}$
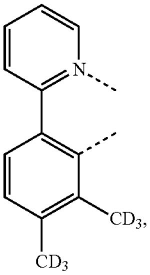
$L_{B71}$
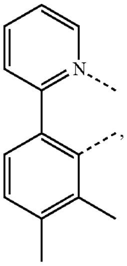
-continued
$L_{B72}$
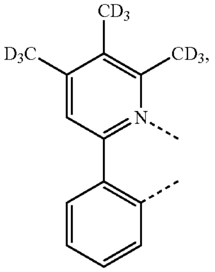
$L_{B73}$
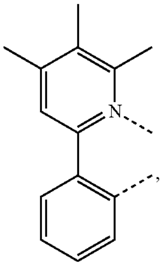
$L_{B74}$
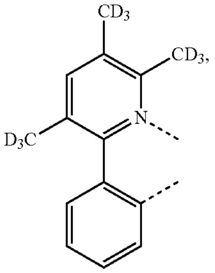
$L_{B75}$
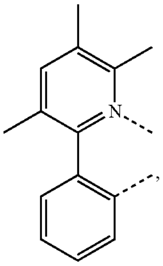
$L_{B76}$
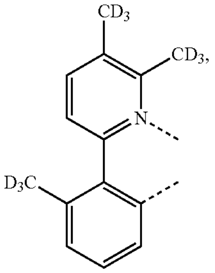

-continued
$L_{B77}$
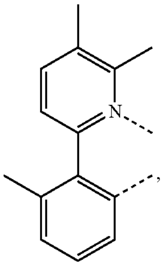
$L_{B78}$
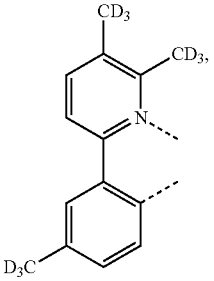
$L_{B79}$
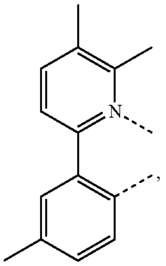
$L_{B80}$
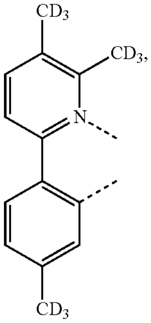
$L_{B81}$
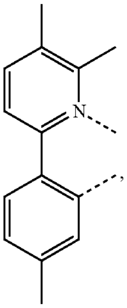
-continued
$L_{B82}$
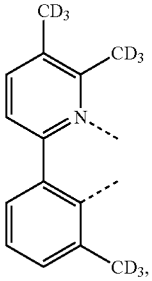
$L_{B83}$
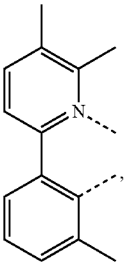
$L_{B84}$
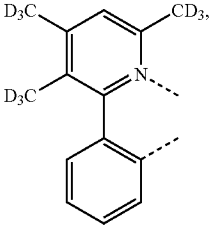
$L_{B85}$
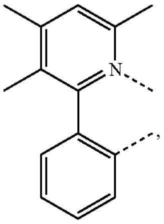
$L_{B86}$
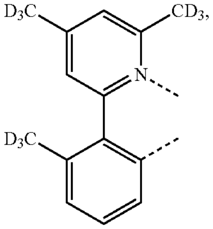
$L_{B87}$
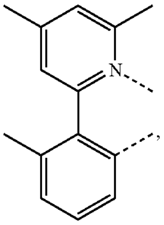

-continued
$L_{B88}$
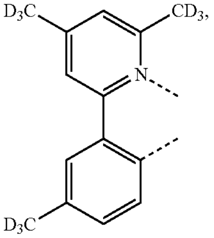
$L_{B89}$
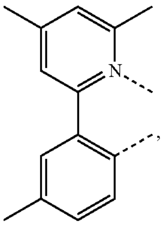
$L_{B90}$
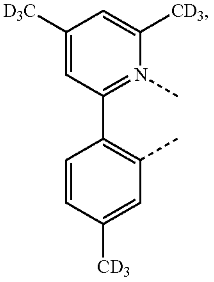
$L_{B91}$
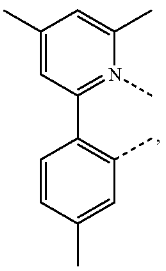
$L_{B92}$
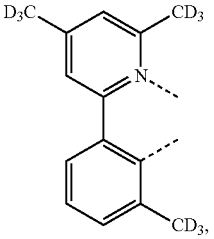
$L_{B93}$
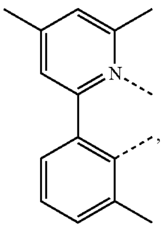
-continued
$L_{B94}$
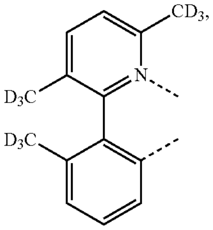
$L_{B95}$
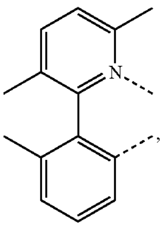
$L_{B96}$
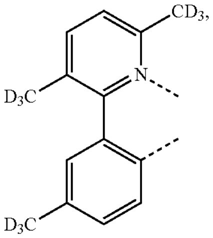
$L_{B97}$
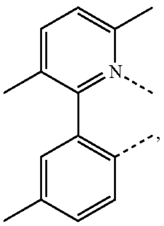
$L_{B98}$
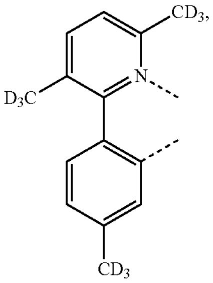
$L_{B99}$
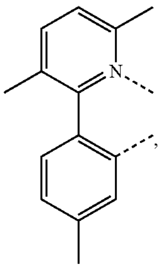

-continued
L$_{B100}$
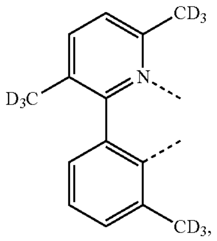
L$_{B101}$
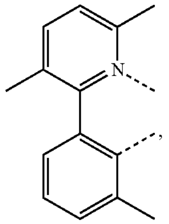
L$_{B102}$
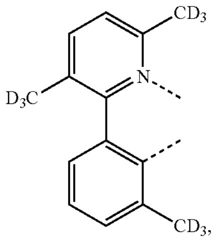
L$_{B103}$
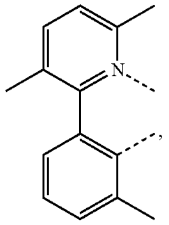
L$_{B104}$
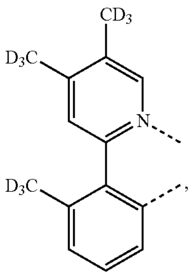
L$_{B105}$
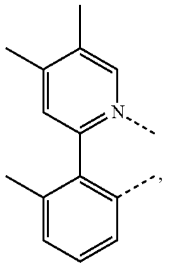
-continued
L$_{B106}$
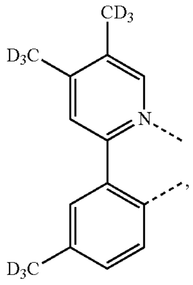
L$_{B107}$
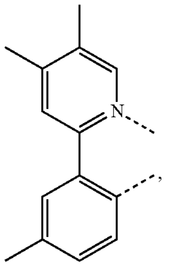
L$_{B108}$
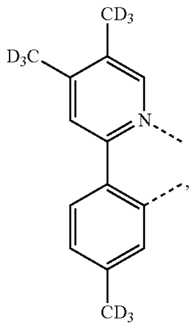
L$_{B109}$
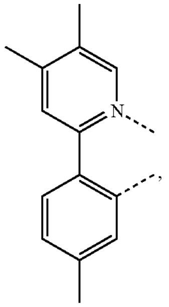
L$_{B110}$
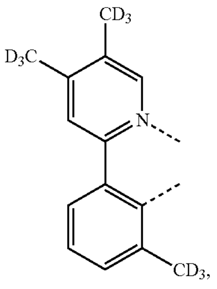

-continued
$L_{B111}$
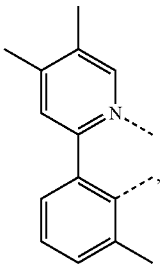
$L_{B112}$
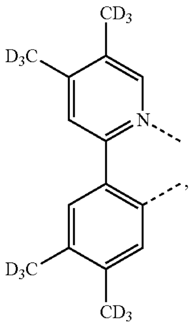
$L_{B113}$
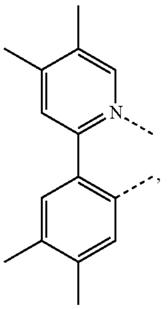
$L_{B114}$
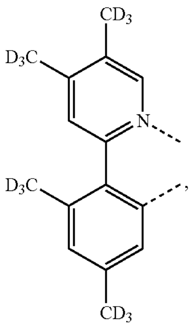
$L_{B115}$
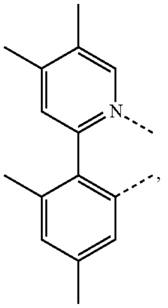
-continued
$L_{B116}$
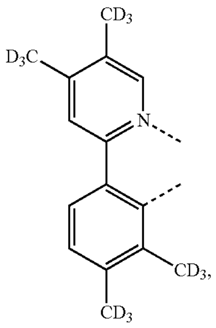
$L_{B117}$
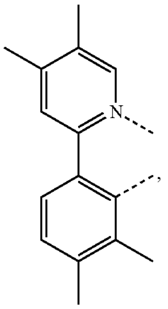
$L_{B118}$
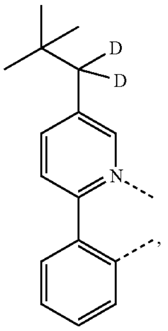
$L_{B119}$
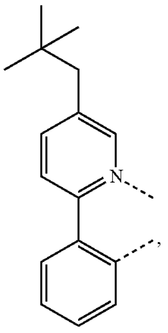
$L_{B120}$
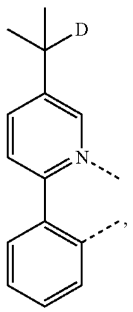

-continued
$L_{B121}$
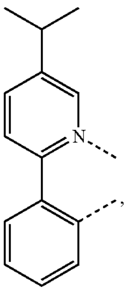
$L_{B122}$
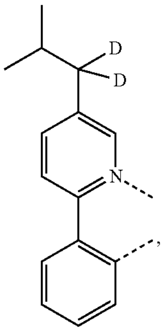
$L_{B123}$
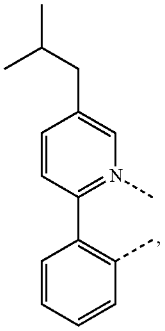
$L_{B124}$
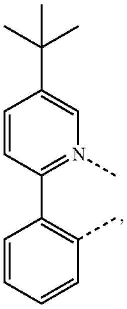
$L_{B125}$
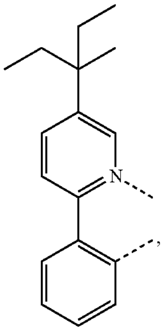
-continued
$L_{B126}$
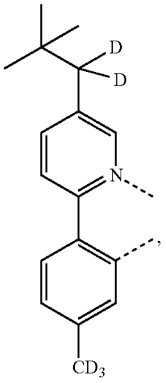
$L_{B127}$
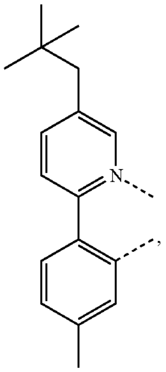
$L_{B128}$
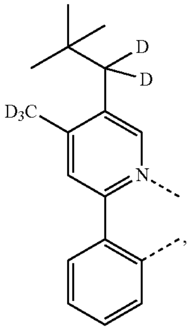
$L_{B129}$
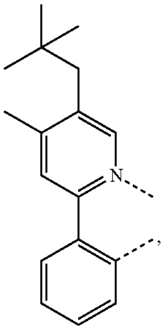

-continued
$L_{B130}$
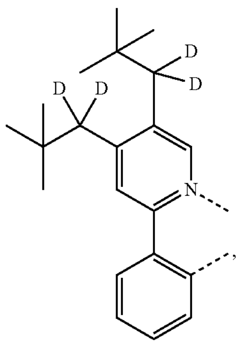
$L_{B131}$
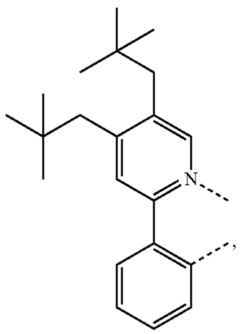
$L_{B132}$
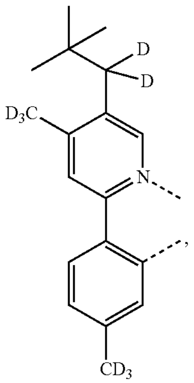
$L_{B133}$
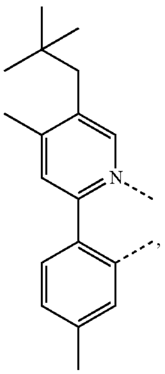
-continued
$L_{B134}$
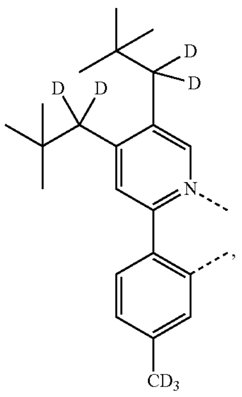
$L_{B135}$
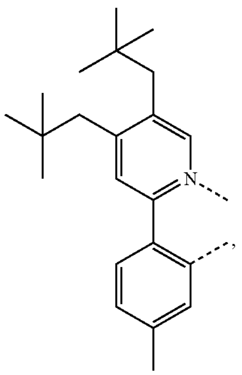
$L_{B136}$
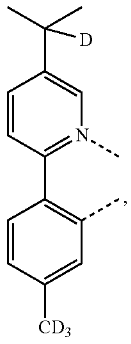
$L_{B137}$
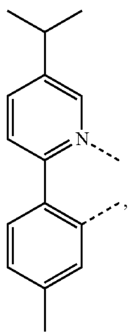

$L_{B138}$
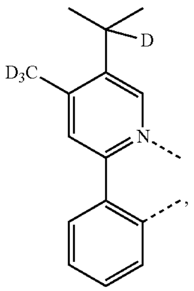
$L_{B139}$
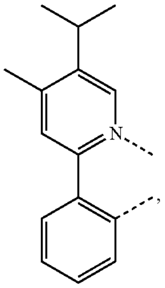
$L_{B140}$
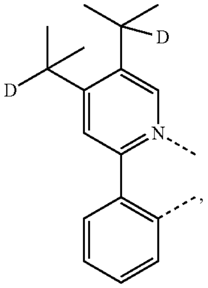
$L_{B141}$
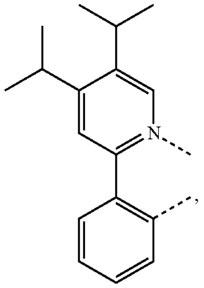
$L_{B142}$
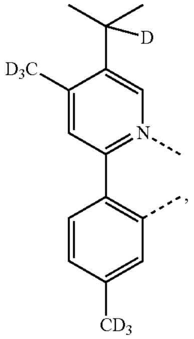
$L_{B143}$
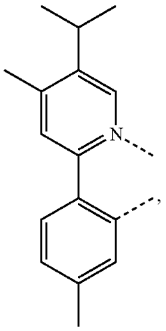
$L_{B144}$
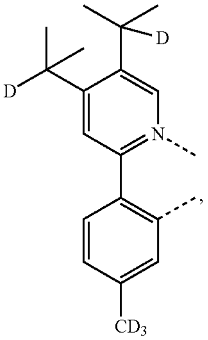
$L_{B145}$
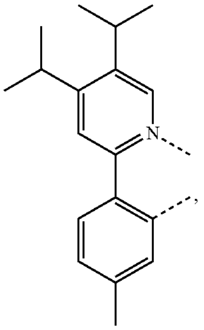
$L_{B146}$
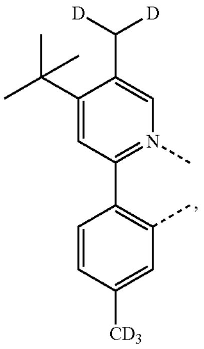

-continued
$L_{B147}$
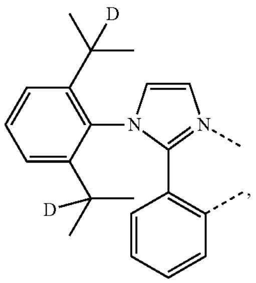
$L_{B148}$
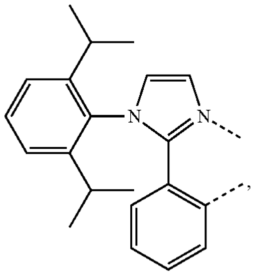
$L_{B149}$
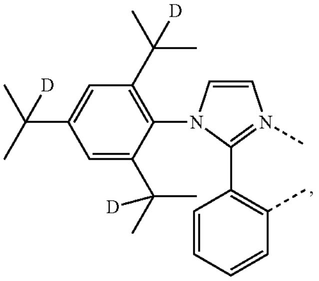
$L_{B150}$
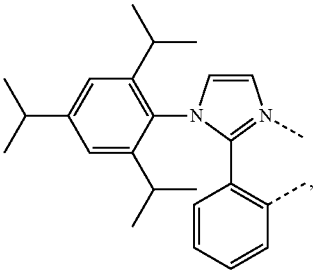
$L_{B151}$
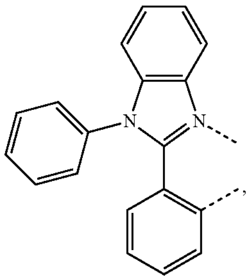
-continued
$L_{B152}$
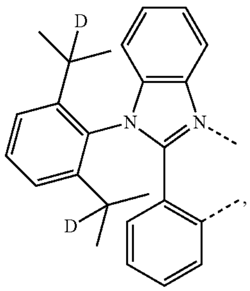
$L_{B153}$
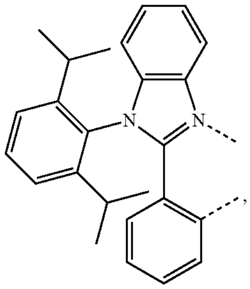
$L_{B154}$
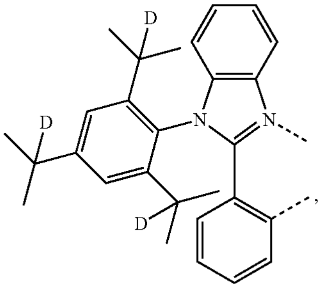
$L_{B155}$
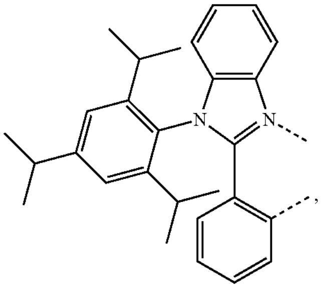
$L_{B156}$
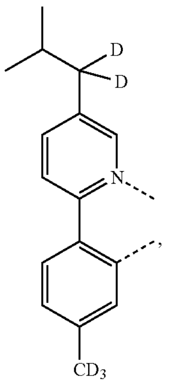

-continued
$L_{B157}$
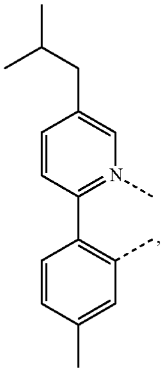
$L_{B158}$
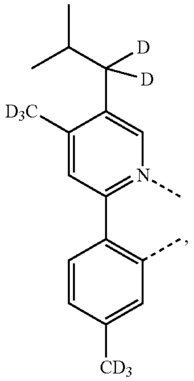
$L_{B159}$
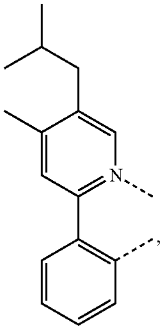
$L_{B160}$
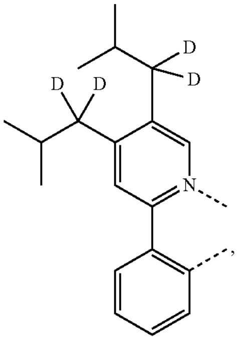
-continued
$L_{B161}$
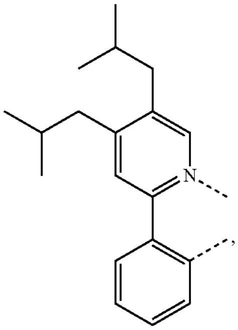
$L_{B162}$
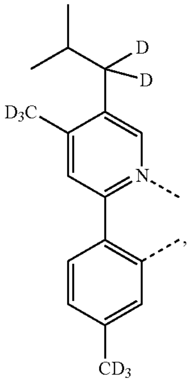
$L_{B163}$
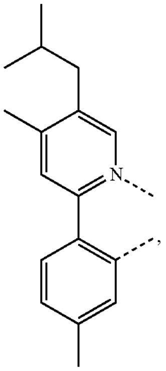
$L_{B164}$
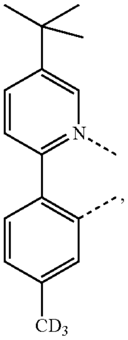

-continued
$L_{B165}$
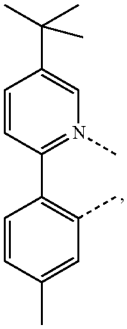
$L_{B166}$
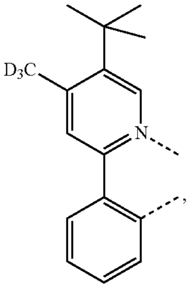
$L_{B167}$
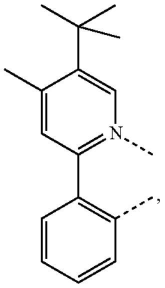
$L_{B168}$
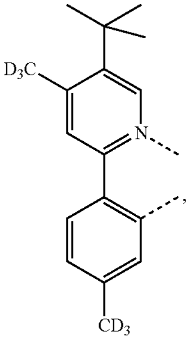
$L_{B169}$
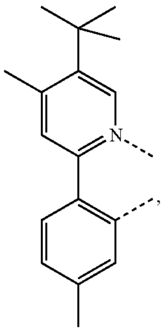
-continued
$L_{B170}$
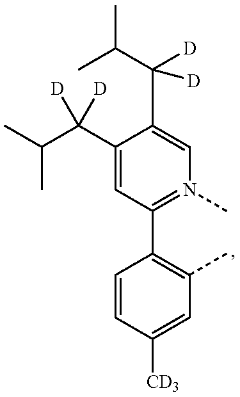
$L_{B171}$
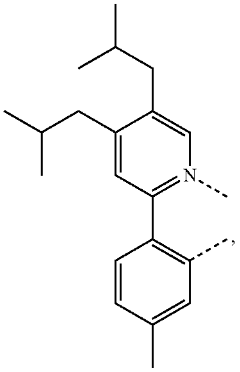
$L_{B172}$
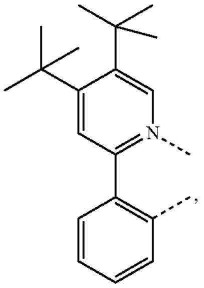
$L_{B173}$
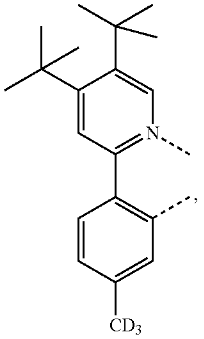

-continued
$L_{B174}$
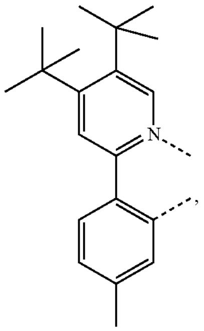
$L_{B175}$
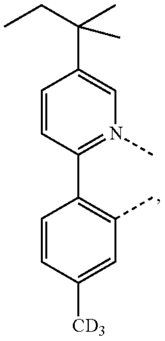
$L_{B176}$
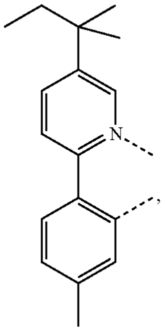
$L_{B177}$
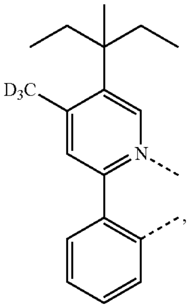
-continued
$L_{B178}$
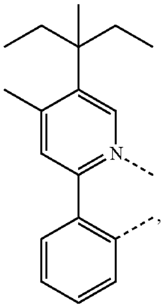
$L_{B179}$
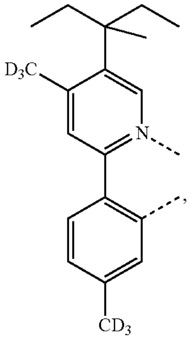
$L_{B180}$
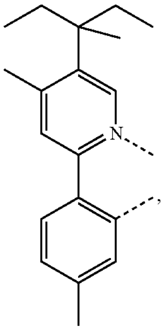
$L_{B181}$
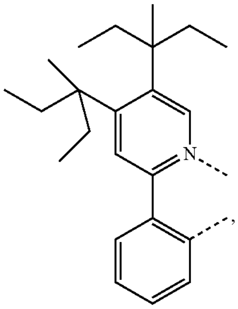

-continued
$L_{B182}$
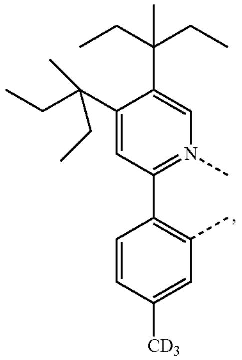
$L_{B183}$
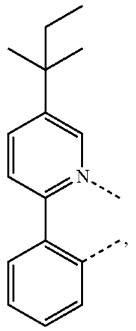
$L_{B184}$
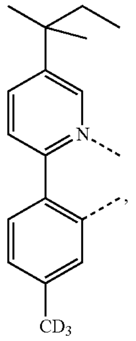
$L_{B185}$
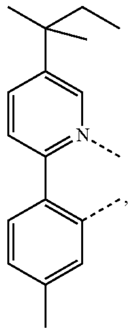
-continued
$L_{B186}$
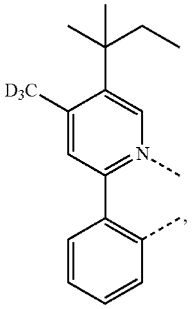
$L_{B187}$
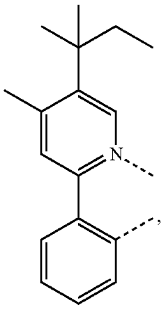
$L_{B188}$
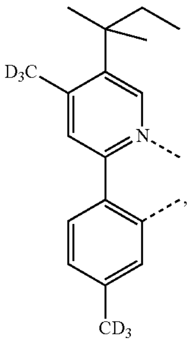
$L_{B189}$
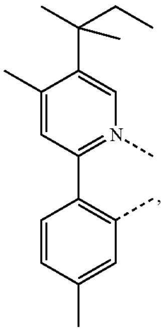
$L_{B190}$
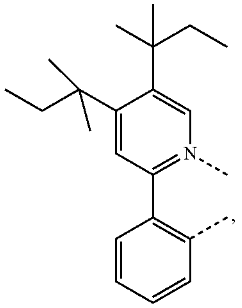

-continued
$L_{B191}$
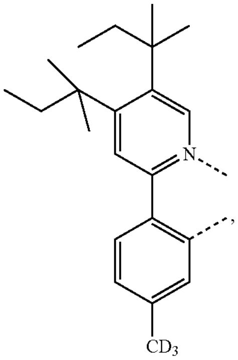
$L_{B192}$
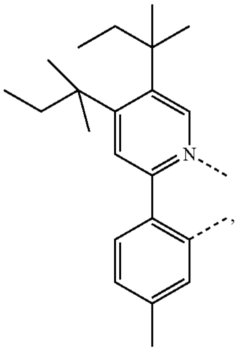
$L_{B193}$
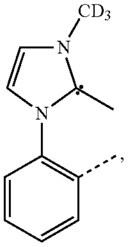
$L_{B194}$
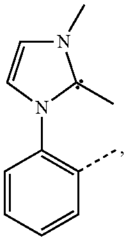
$L_{B195}$
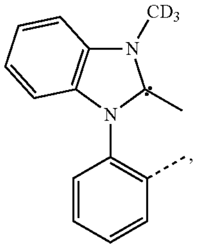
-continued
$L_{B196}$
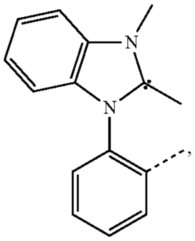
$L_{B197}$
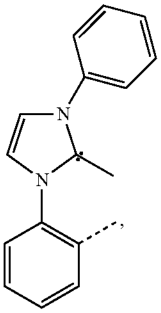
$L_{B198}$
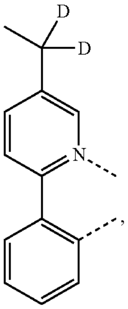
$L_{B199}$
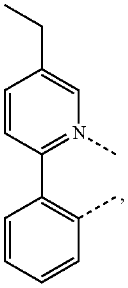
$L_{B200}$
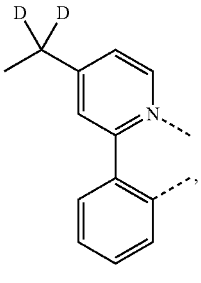

-continued
$L_{B201}$
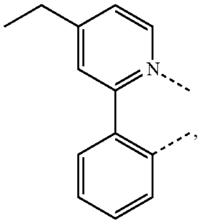
$L_{B202}$
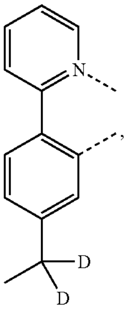
$L_{B203}$
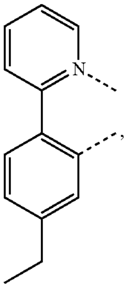
$L_{B204}$
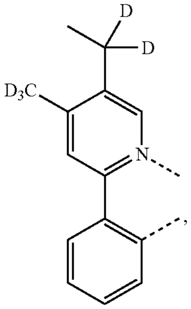
$L_{B205}$
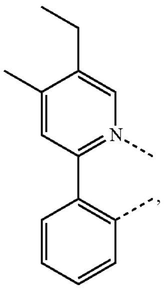
-continued
$L_{B206}$
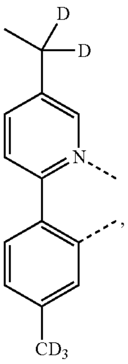
$L_{B207}$
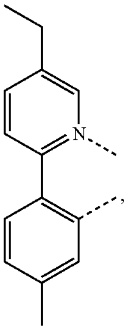
$L_{B208}$
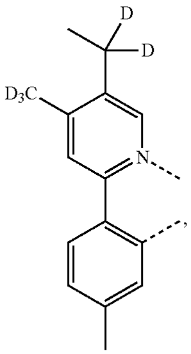
$L_{B209}$
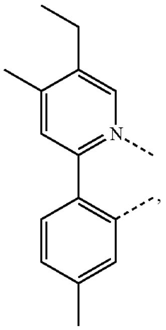

-continued
$L_{B210}$
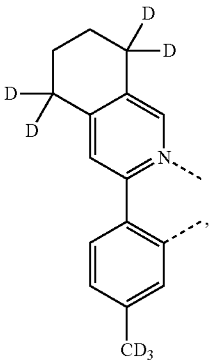
$L_{B211}$
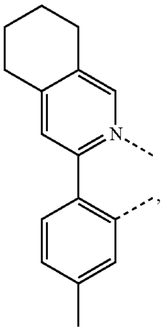
$L_{B212}$
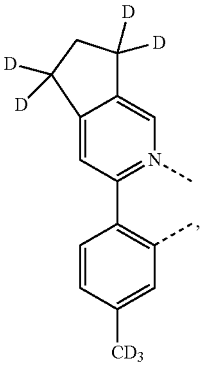
$L_{B213}$
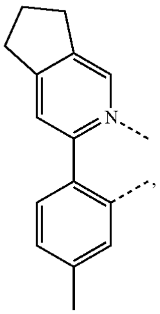
-continued
$L_{B214}$
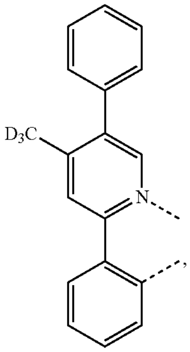
$L_{B215}$
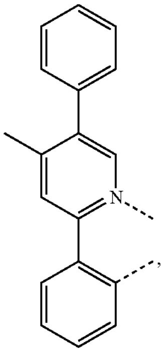
$L_{B216}$
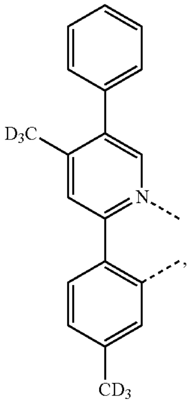
$L_{B217}$
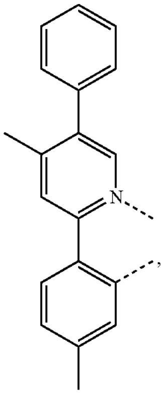

-continued
L$_{B218}$
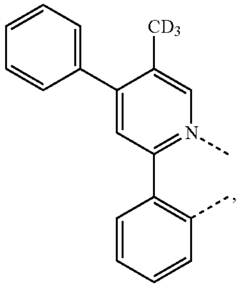
L$_{B219}$
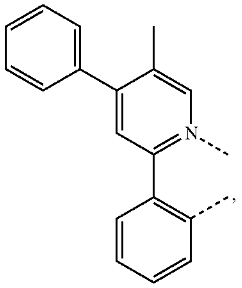
L$_{B220}$
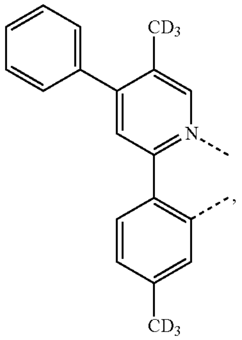
L$_{B221}$
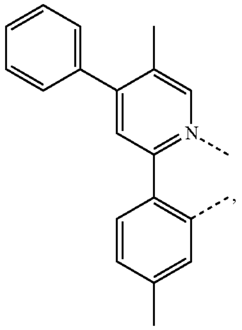
-continued
L$_{B222}$
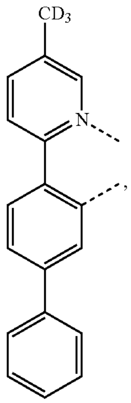
L$_{B223}$
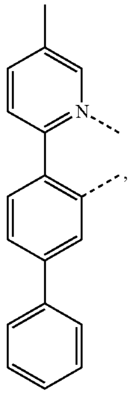
L$_{B224}$
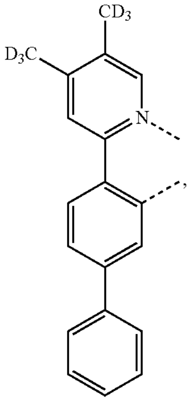
L$_{B225}$
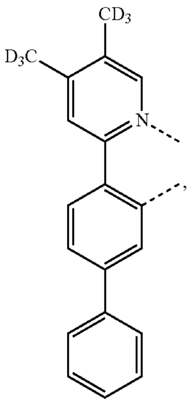

-continued
$L_{B226}$
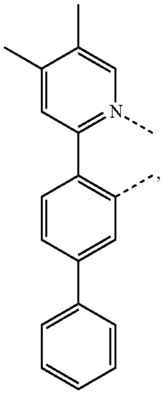
$L_{B227}$
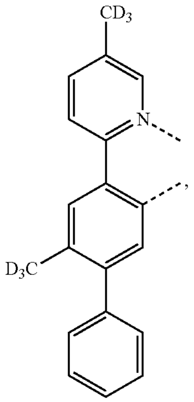
$L_{B228}$
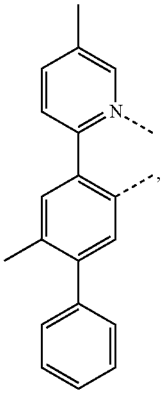
$L_{B229}$
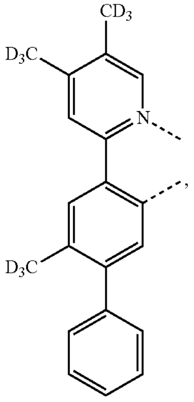
-continued
$L_{B230}$
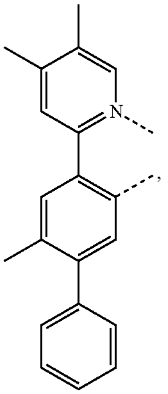
$L_{B231}$
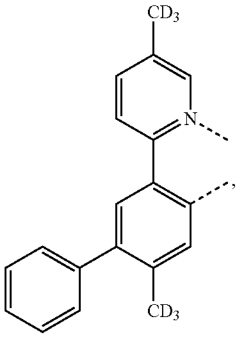
$L_{B232}$
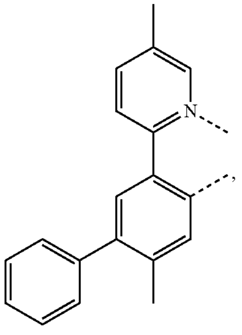
$L_{B233}$
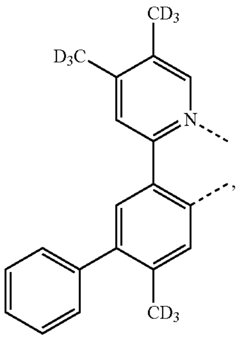

-continued
$L_{B234}$
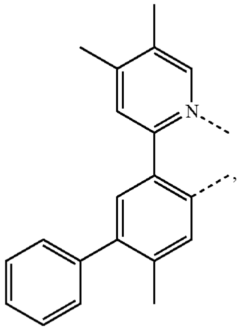
$L_{B235}$
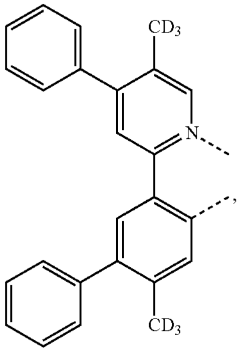
$L_{B236}$
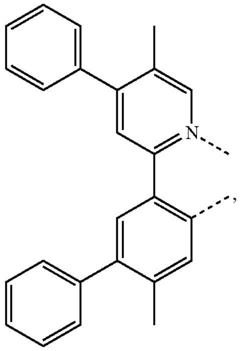
$L_{B237}$
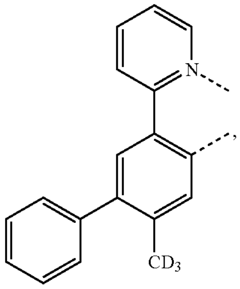
$L_{B238}$
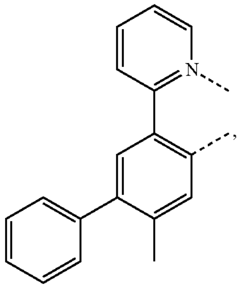
-continued
$L_{B239}$
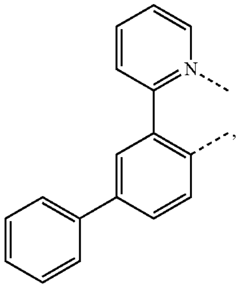
$L_{B240}$
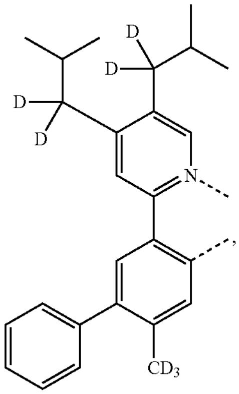
$L_{B241}$
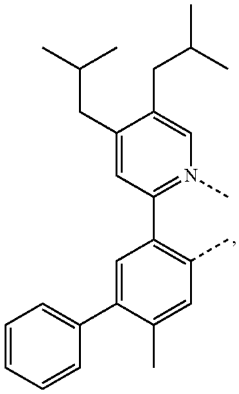
$L_{B242}$
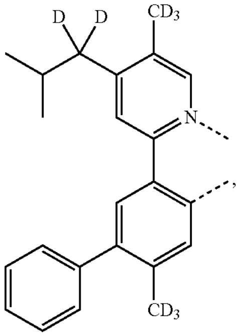

-continued
$L_{B243}$
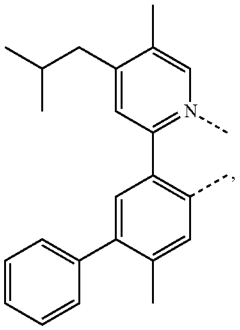
$L_{B244}$
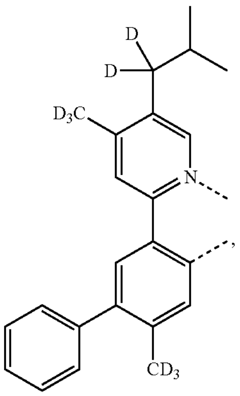
$L_{B245}$
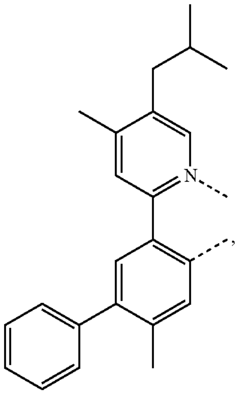
$L_{B246}$
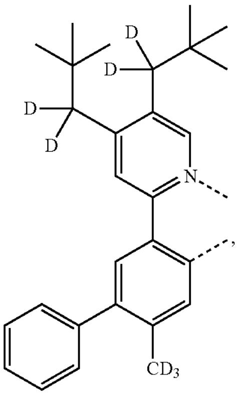
-continued
$L_{B247}$
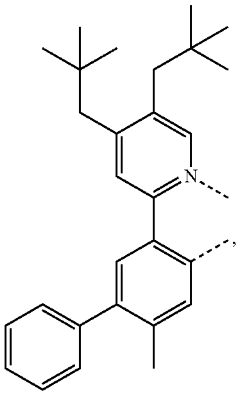
$L_{B248}$
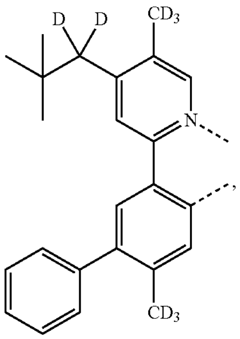
$L_{B249}$
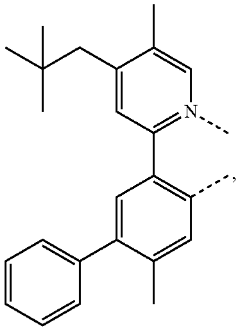
$L_{B250}$
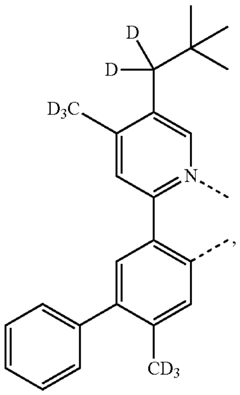

-continued
$L_{B251}$
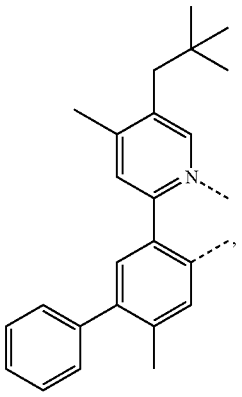
$L_{B252}$
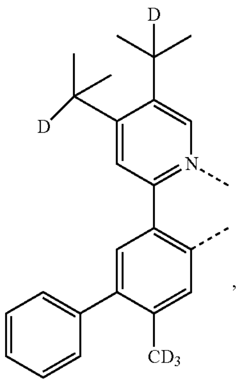
$L_{B253}$
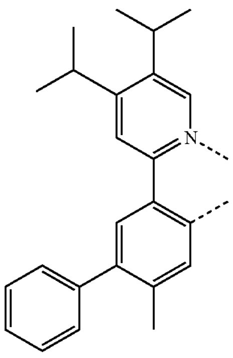
$L_{B254}$
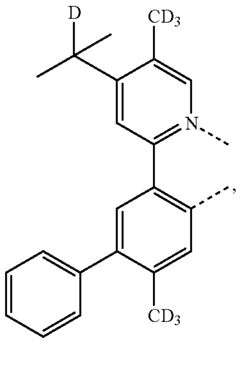
-continued
$L_{B255}$
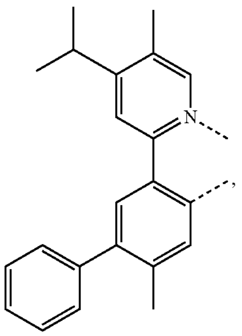
$L_{B256}$
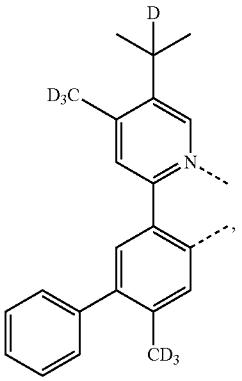
$L_{B257}$
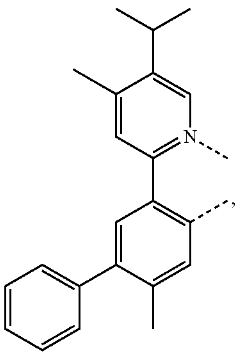
$L_{B258}$
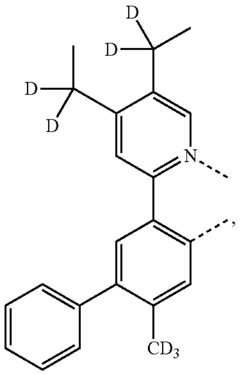

-continued
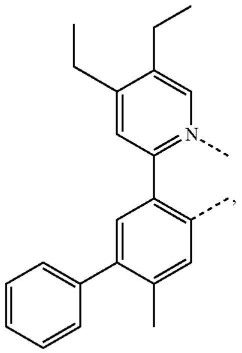
$L_{B259}$
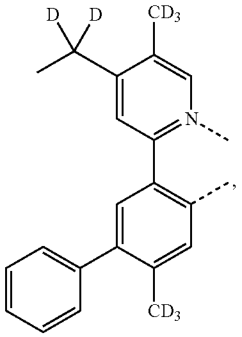
$L_{B260}$
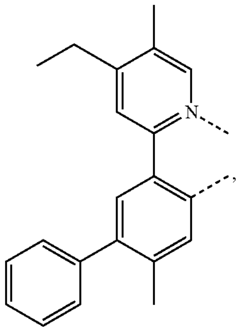
$L_{B261}$
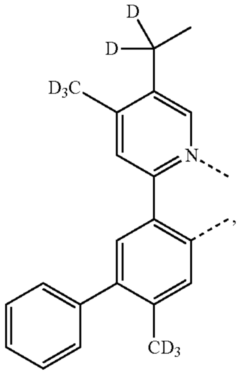
$L_{B262}$
-continued
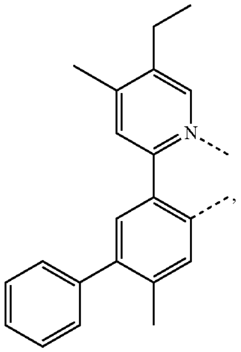
$L_{B263}$
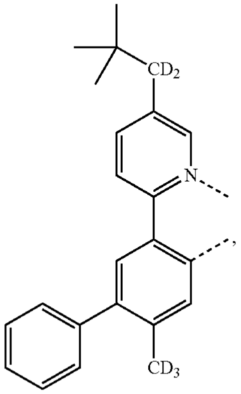
$L_{B264}$
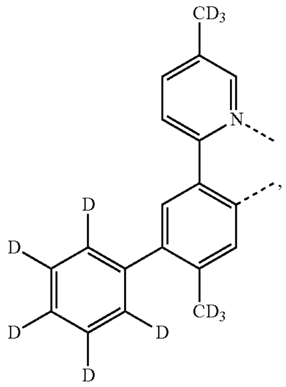
$L_{B265}$
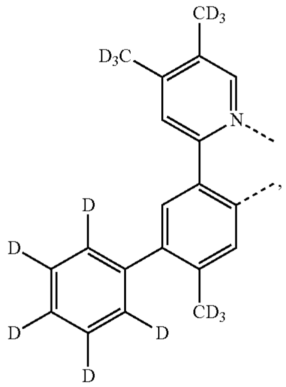
$L_{B266}$ $L_{B267}$
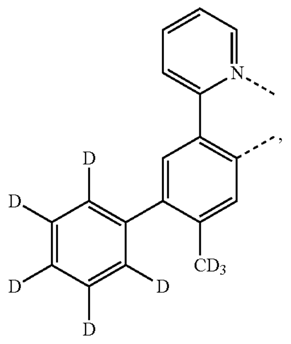
$L_{B268}$
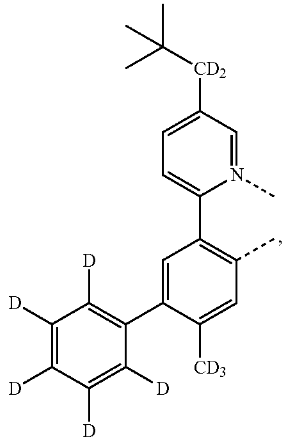
$L_{B269}$
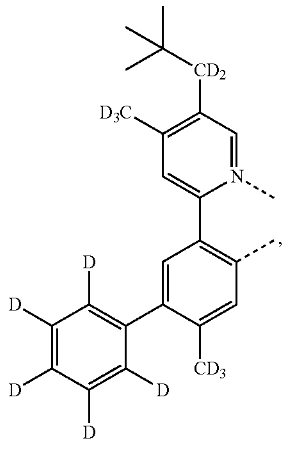
$L_{B270}$
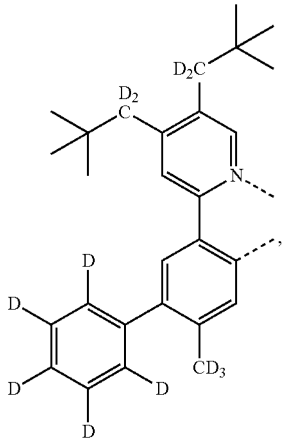
$L_{B271}$
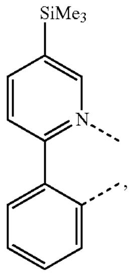
$L_{B272}$
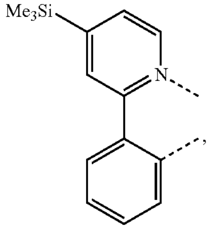
$L_{B273}$
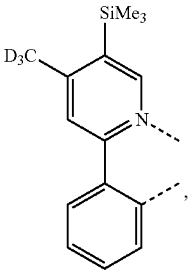
$L_{B274}$
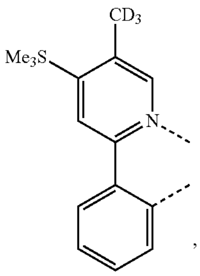
, -continued
$L_{B275}$
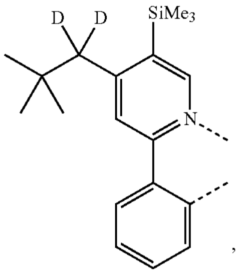
,
$L_{B276}$
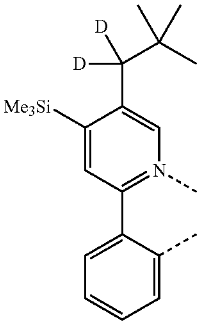
,
$L_{B277}$
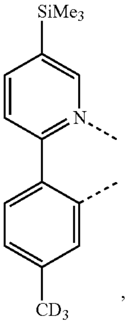
,
$L_{B278}$
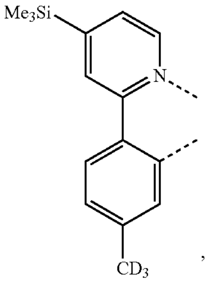
,
$L_{B279}$
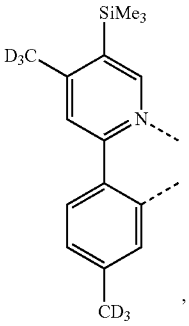
,
-continued
$L_{B280}$
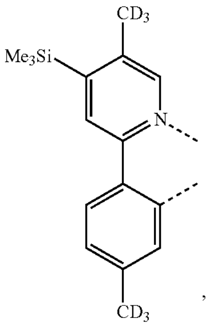
,
$L_{B281}$
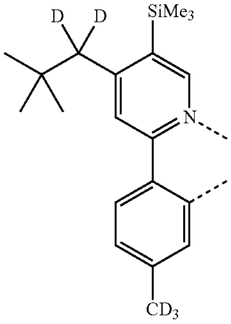
,
$L_{B282}$
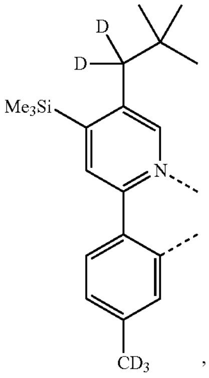
,
$L_{B283}$
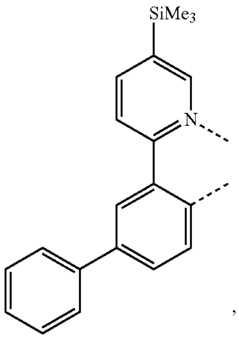
, $L_{B284}$
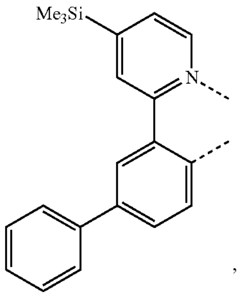
,
$L_{B285}$
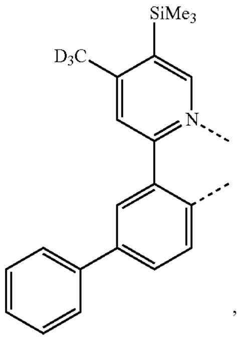
,
$L_{B286}$
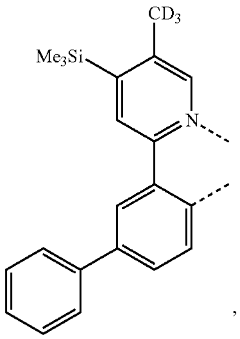
,
$L_{B287}$
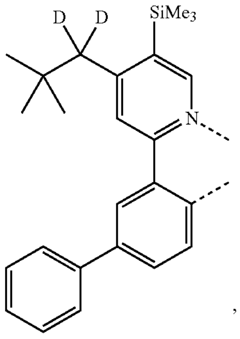
,
$L_{B288}$
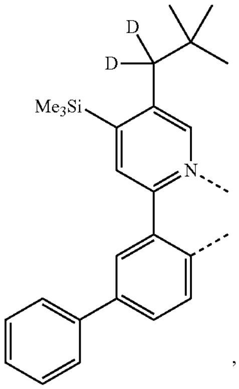
,
$L_{B289}$
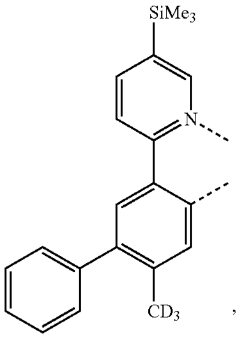
,
$L_{B290}$
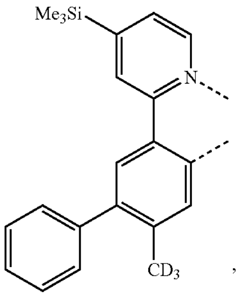
,
$L_{B291}$
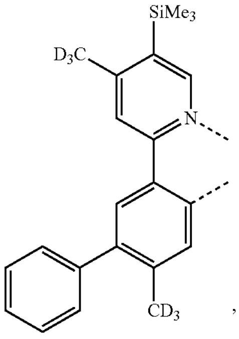
, -continued
LB292
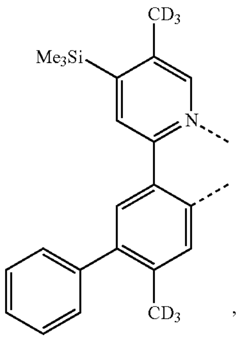
LB293
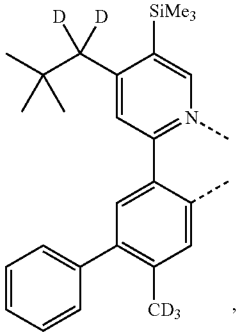
LB294
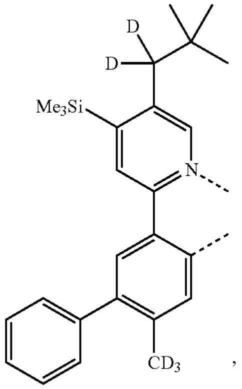
LB295
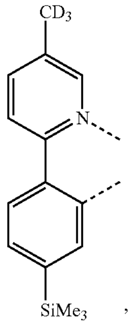
-continued
LB296
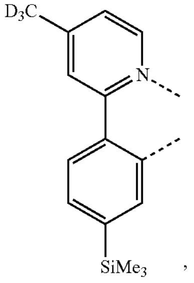
LB297
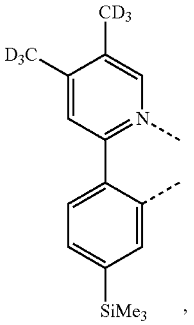
LB298
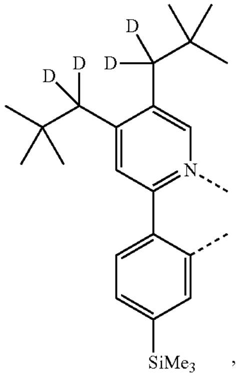
LB299
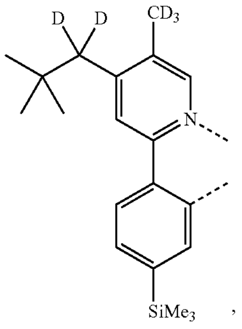

-continued
$L_{B300}$
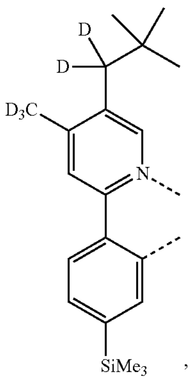
,
$L_{B301}$
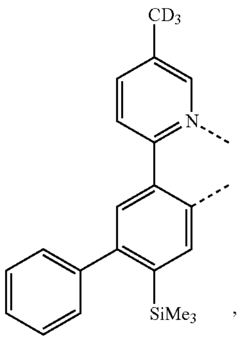
,
$L_{B302}$
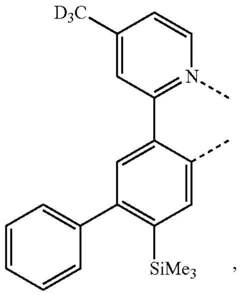
,
$L_{B303}$
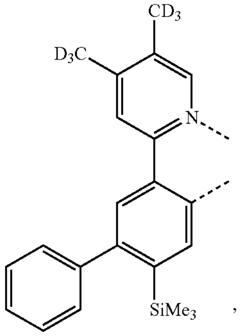
,
-continued
$L_{B304}$
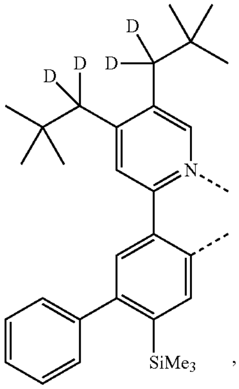
,
$L_{B305}$
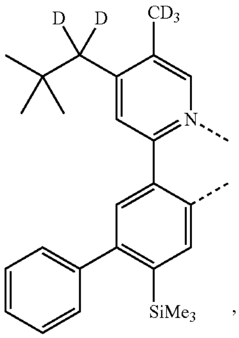
,
$L_{B306}$
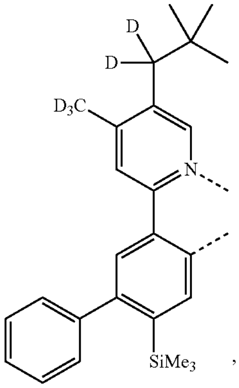
,
$L_{B307}$
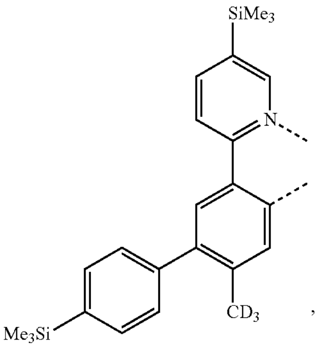
, -continued
$L_{B308}$
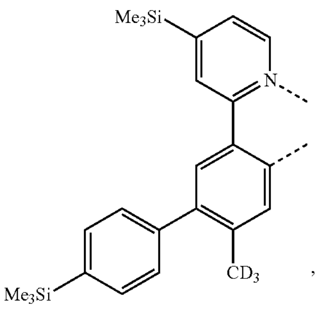
,
$L_{B309}$
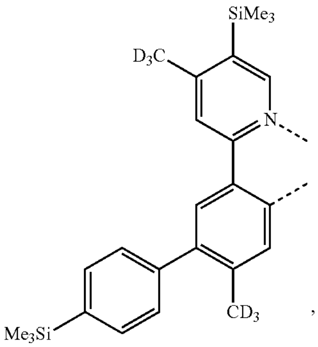
,
$L_{B310}$
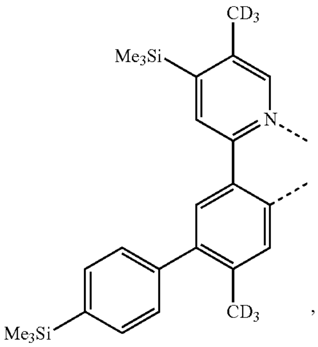
,
$L_{B311}$
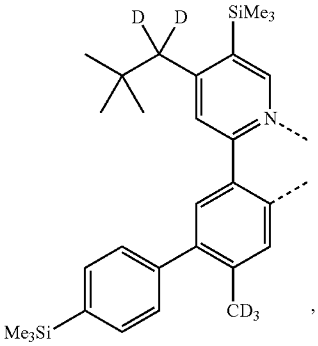
,
-continued
$L_{B312}$
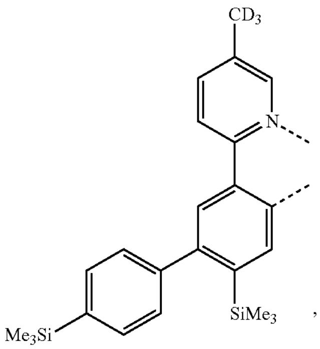
,
$L_{B313}$
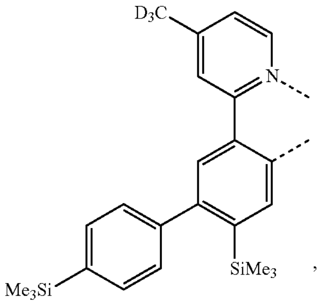
,
$L_{B314}$
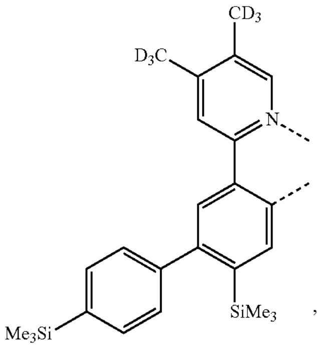
,
$L_{B315}$
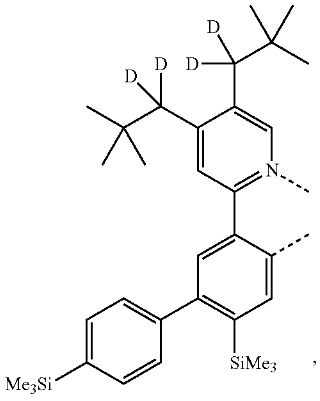
, $L_{B316}$
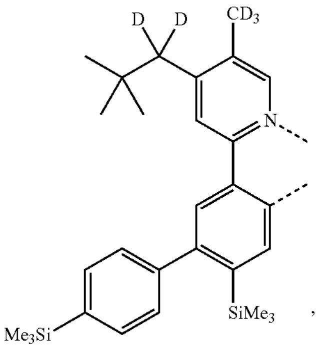
,
$L_{B317}$
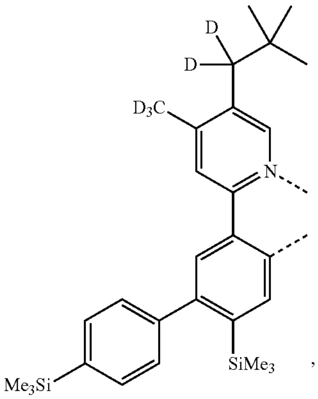
,
$L_{B318}$
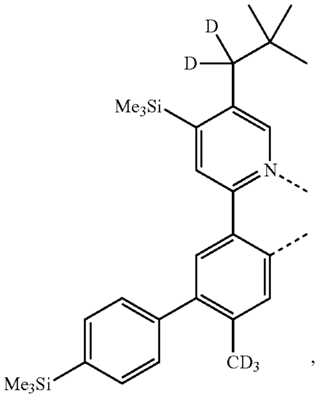
,
$L_{B319}$
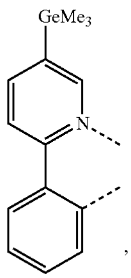
,
$L_{B320}$
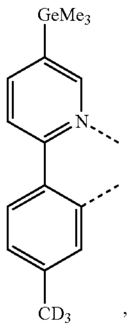
,
$L_{B321}$
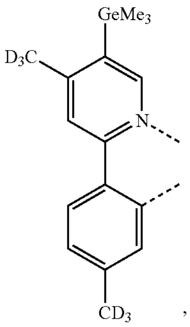
,
$L_{B322}$
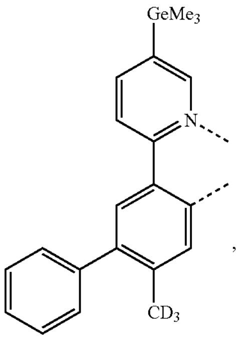
,
$L_{B323}$
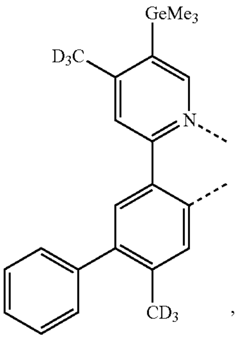
, and -continued
$L_{B324}$
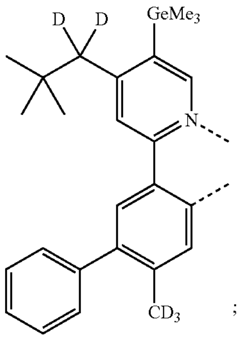
;
and $L_{BB1}$ to $L_{BB195}$ are defined as follows in LIST 5:
$L_{BB1}$
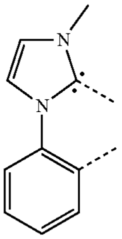
,
$L_{BB2}$
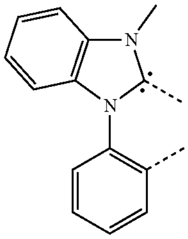
,
$L_{BB3}$
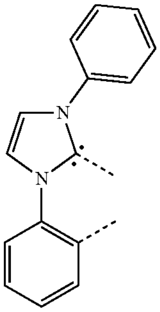
,
$L_{BB4}$
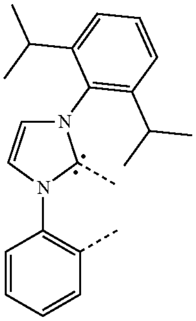
,
-continued
$L_{BB5}$
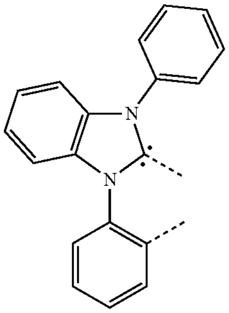
,
$L_{BB6}$
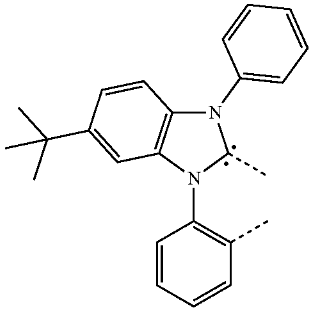
,
$L_{BB7}$
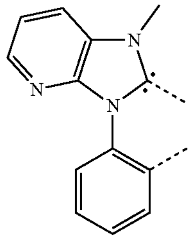
,
$L_{BB8}$
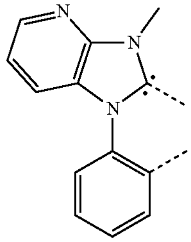
,
$L_{BB9}$
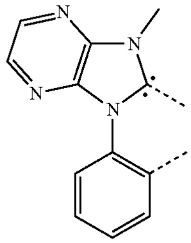
, -continued
$L_{BB10}$
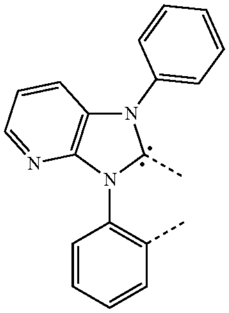
,
$L_{BB11}$
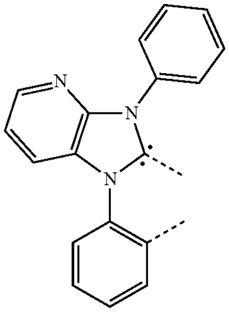
,
$L_{BB12}$
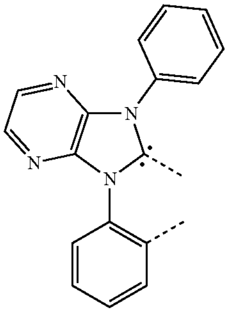
,
$L_{BB13}$
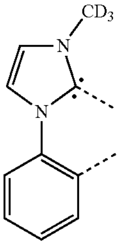
,
$L_{BB14}$
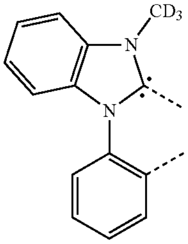
,
-continued
$L_{BB15}$
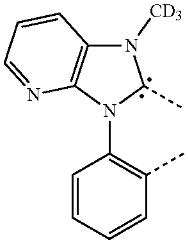
,
$L_{BB16}$
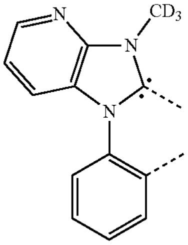
,
$L_{BB17}$
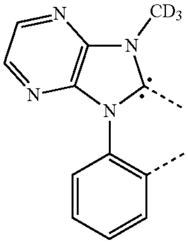
,
$L_{BB18}$
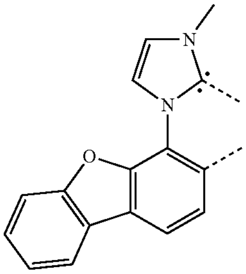
,
$L_{BB19}$
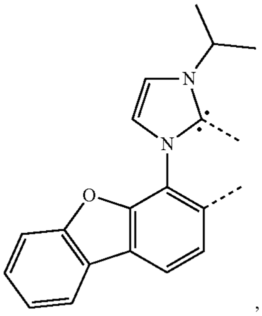
, -continued
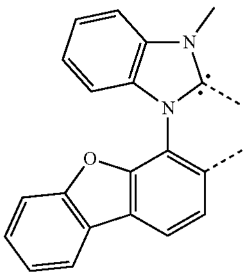
$L_{BB20}$
,
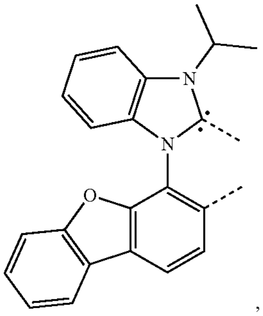
$L_{BB21}$
,
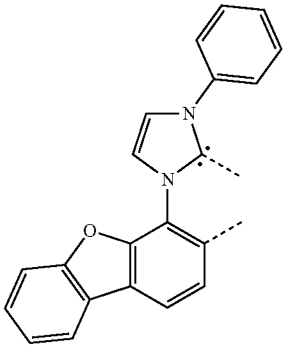
$L_{BB22}$
,
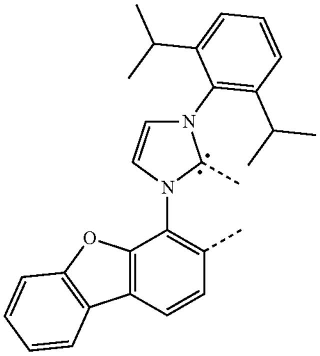
$L_{BB23}$
,
-continued
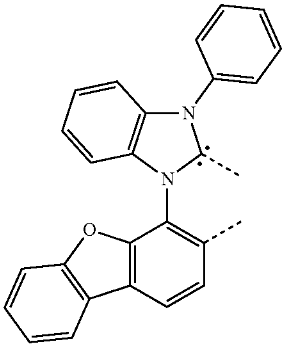
$L_{BB24}$
,
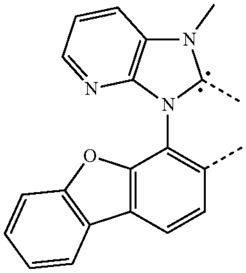
$L_{BB25}$
,
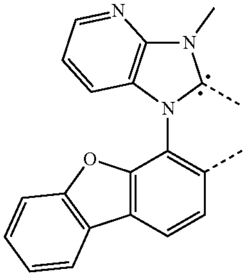
$L_{BB26}$
,
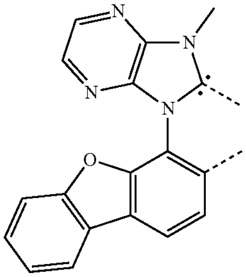
$L_{BB27}$
,
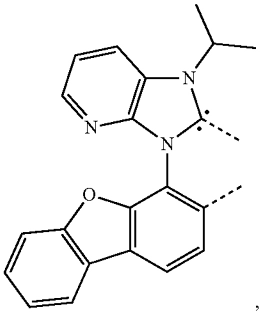
$L_{BB28}$
, -continued
$L_{BB29}$
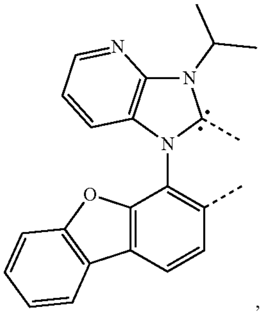
,
$L_{BB30}$
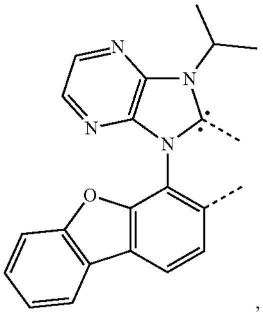
,
$L_{BB31}$
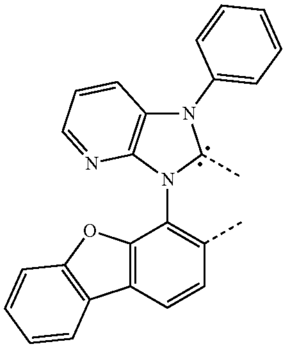
,
$L_{BB32}$
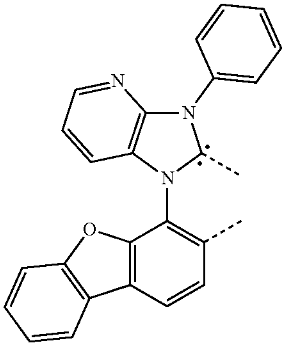
,
-continued
$L_{BB33}$
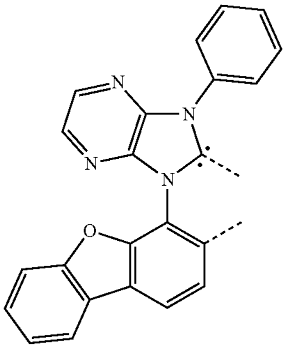
,
$L_{BB34}$
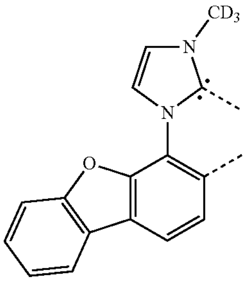
,
$L_{BB35}$
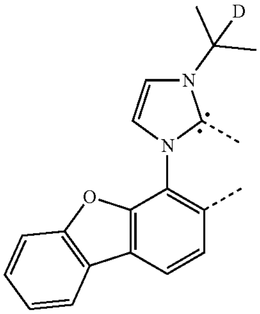
,
$L_{BB36}$
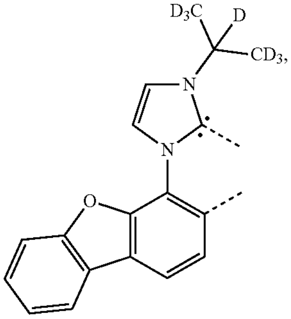
$L_{BB37}$
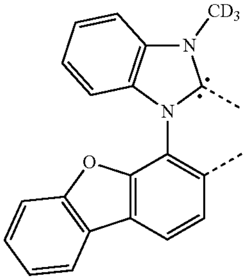
, -continued
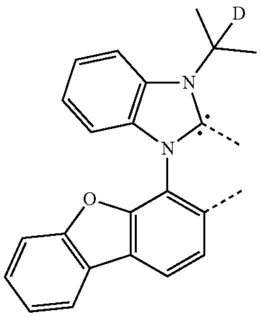
,
$L_{BB38}$
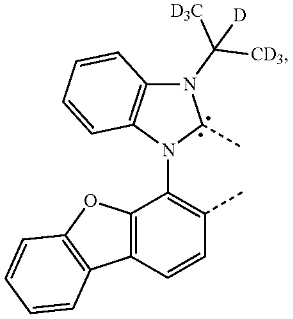
$L_{BB39}$
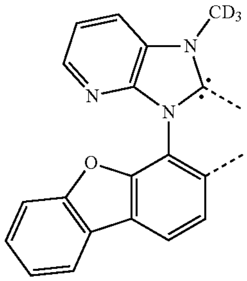
,
$L_{BB40}$
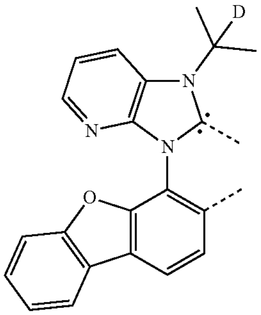
,
$L_{BB41}$
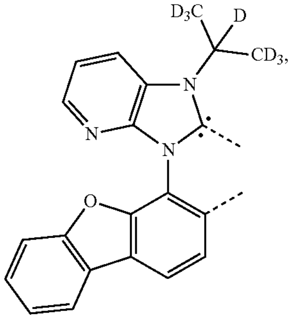
$L_{BB42}$
-continued
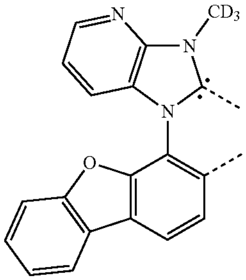
,
$L_{BB43}$
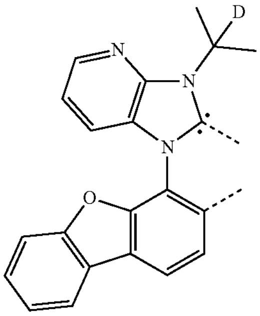
,
$L_{BB44}$
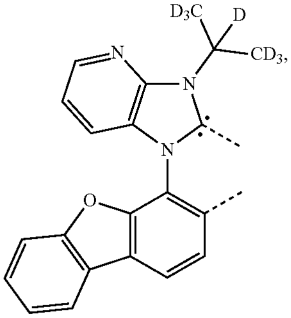
$L_{BB45}$
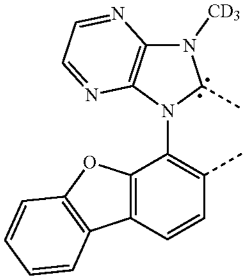
,
$L_{BB46}$
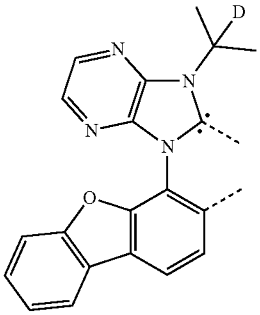
,
$L_{BB47}$ -continued
$L_{BB48}$
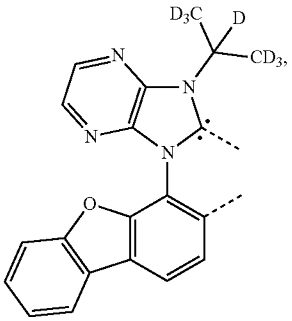
$L_{BB49}$
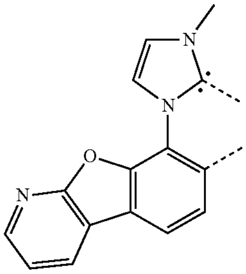
,
$L_{BB50}$
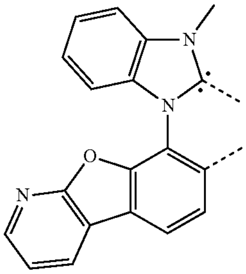
,
$L_{BB51}$
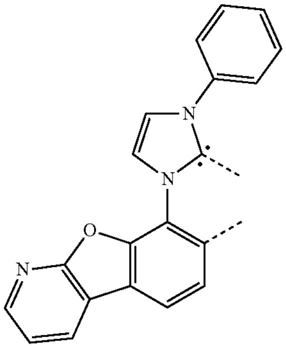
,
$L_{BB52}$
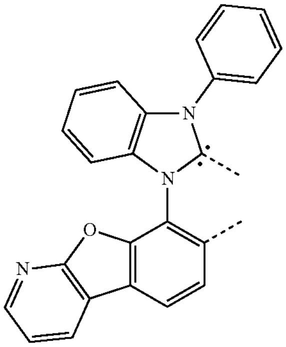
,
-continued
$L_{BB53}$
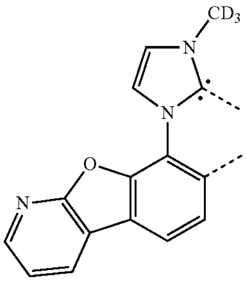
,
$L_{BB54}$
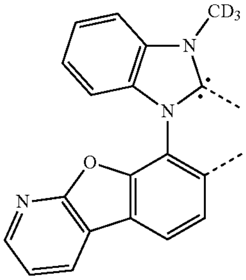
,
$L_{BB55}$
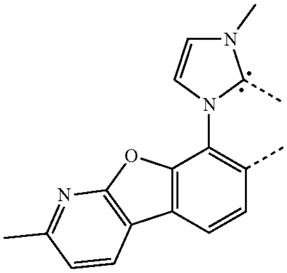
,
$L_{BB56}$
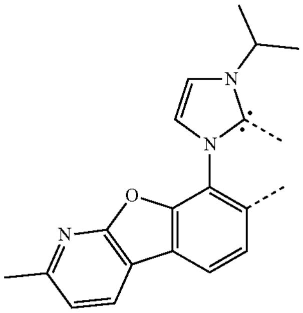
,
$L_{BB57}$
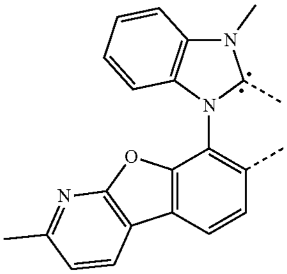
, -continued
$L_{BB58}$
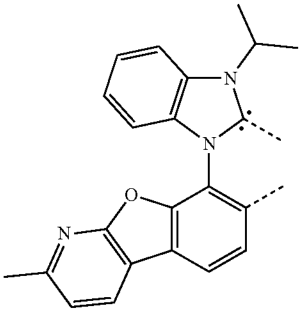
,
$L_{BB59}$
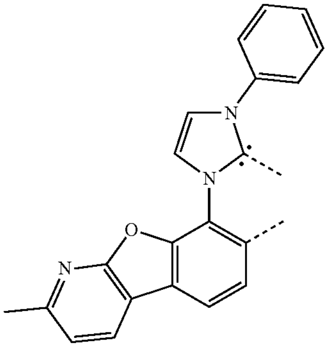
,
$L_{BB60}$
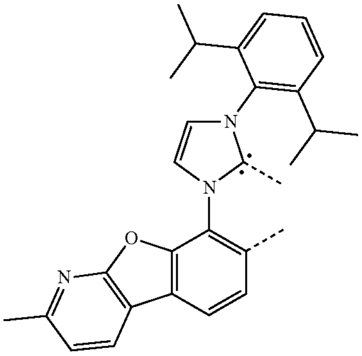
,
$L_{BB61}$
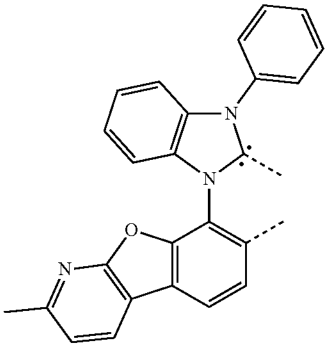
,
-continued
$L_{BB62}$
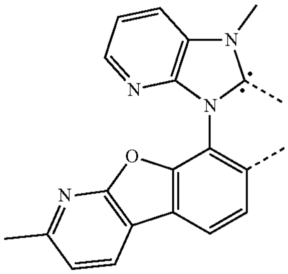
,
$L_{BB63}$
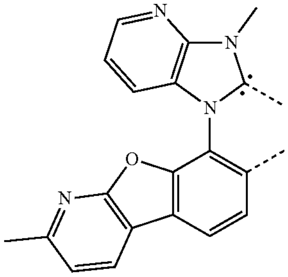
,
$L_{BB64}$
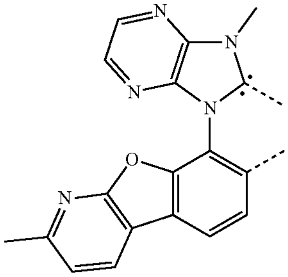
,
$L_{BB65}$
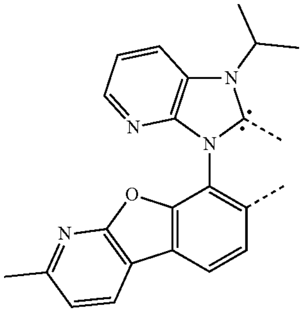
,
$L_{BB66}$
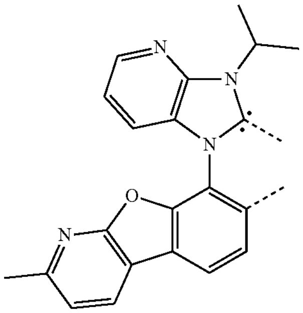
, -continued
$L_{BB67}$
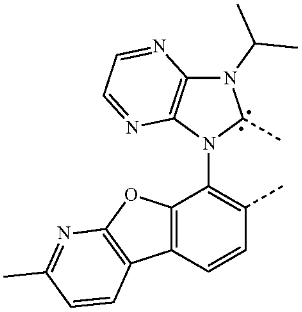
,
$L_{BB68}$
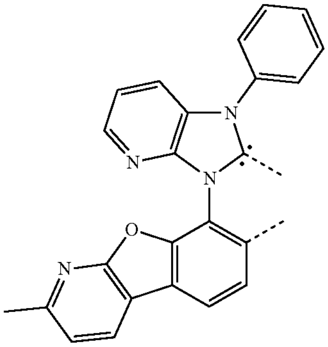
,
$L_{BB69}$
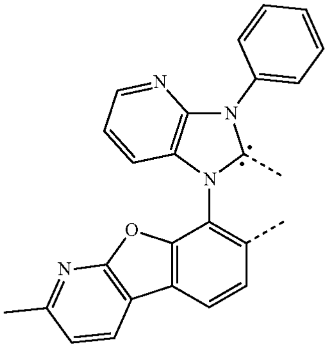
,
$L_{BB70}$
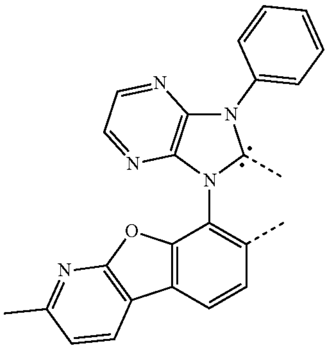
,
-continued
$L_{BB71}$
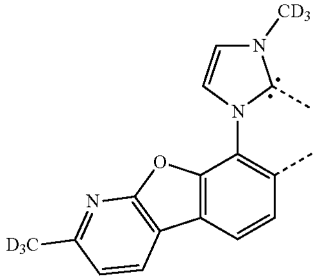
,
$L_{BB72}$
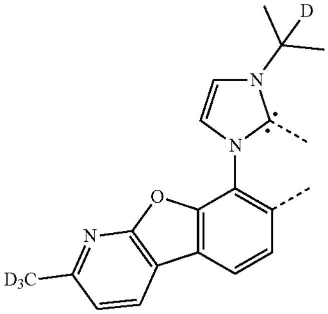
,
$L_{BB73}$
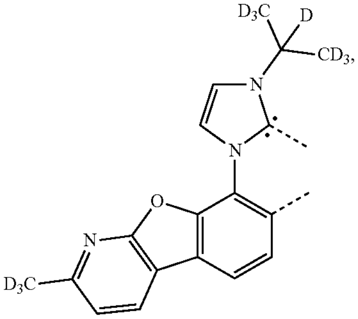
$L_{BB74}$
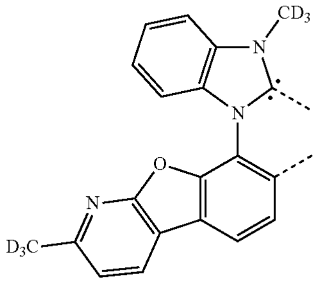
,
$L_{BB75}$
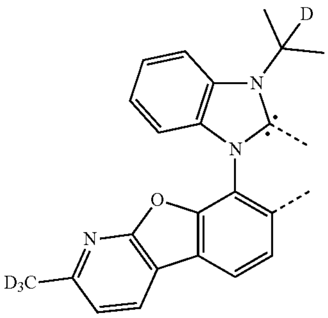
, -continued
$L_{BB76}$
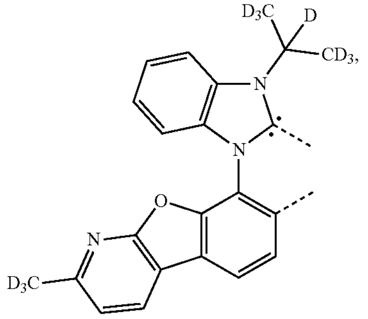
$L_{BB77}$
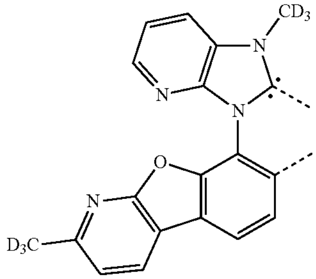
,
$L_{BB78}$
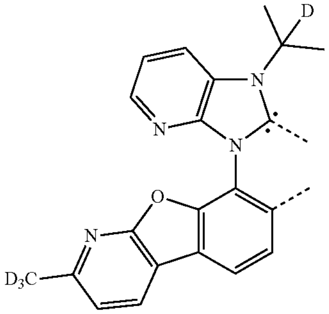
,
$L_{BB79}$
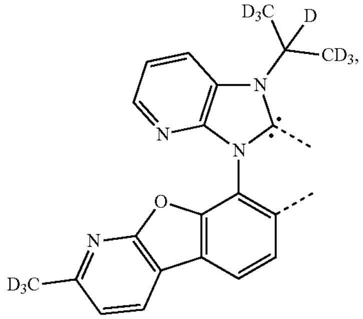
$L_{BB80}$
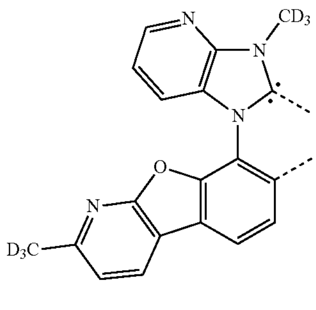
,
-continued
$L_{BB81}$
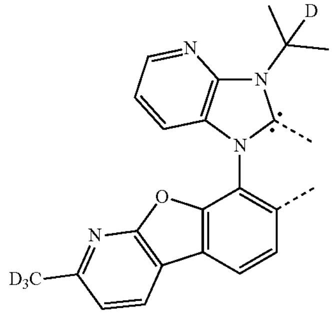
,
$L_{BB82}$
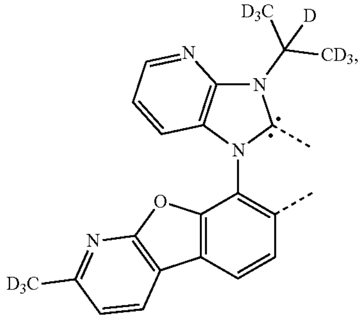
$L_{BB83}$
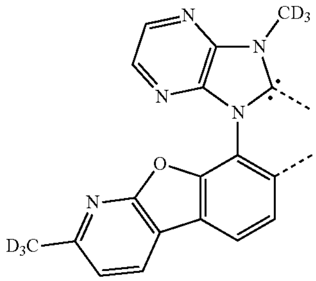
,
$L_{BB84}$
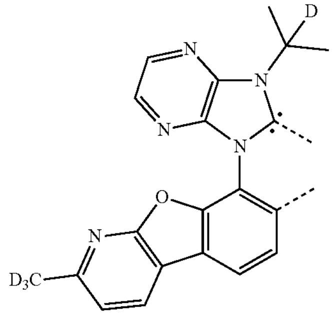
,
$L_{BB85}$
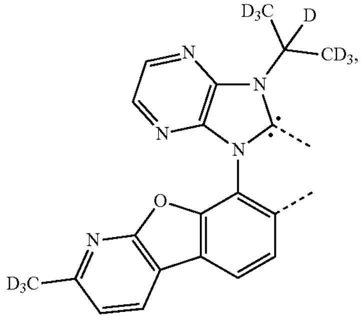

-continued
$L_{BB86}$
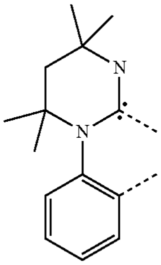
,
$L_{BB87}$
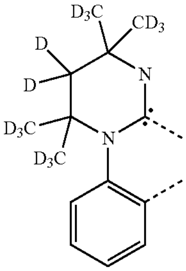
,
$L_{BB88}$
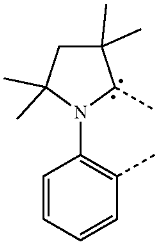
,
$L_{BB89}$
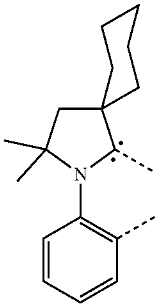
,
$L_{BB90}$
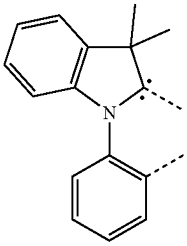
,
-continued
$L_{BB91}$
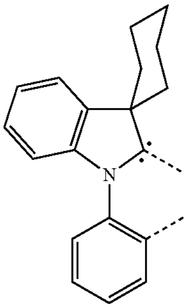
,
$L_{BB92}$
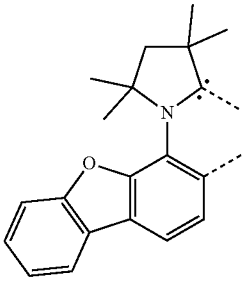
,
$L_{BB93}$
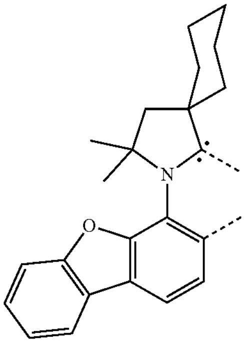
,
$L_{BB94}$
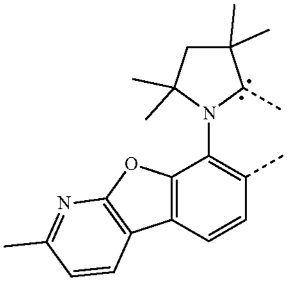
,
$L_{BB95}$
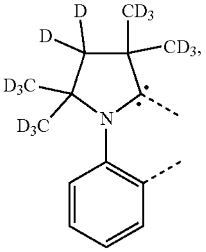

-continued
$L_{BB96}$
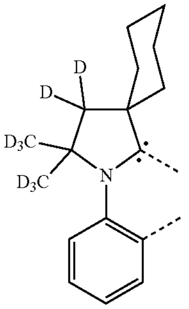
,
$L_{BB97}$
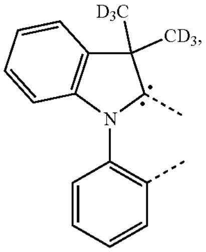
$L_{BB98}$
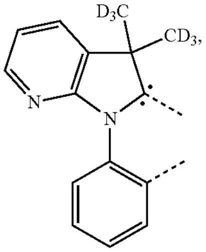
$L_{BB99}$
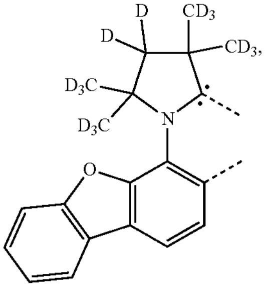
$L_{BB100}$
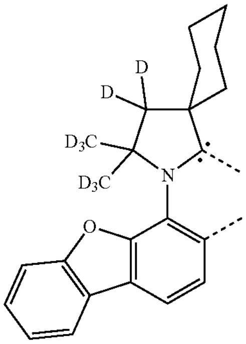
,
-continued
$L_{BB101}$
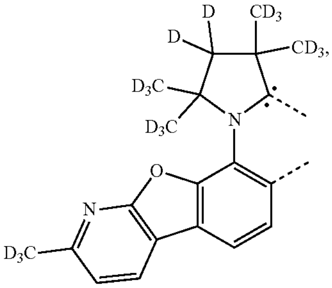
$L_{BB102}$
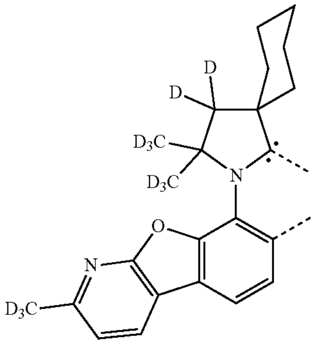
,
$L_{BB103}$
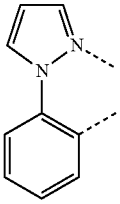
,
$L_{BB104}$
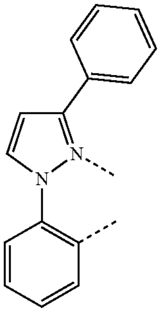
,
$L_{BB105}$
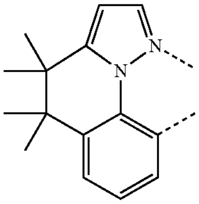
, -continued
$L_{BB106}$
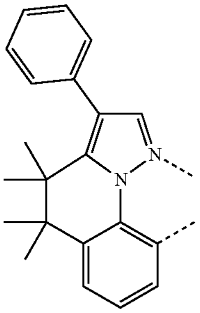
,
$L_{BB107}$
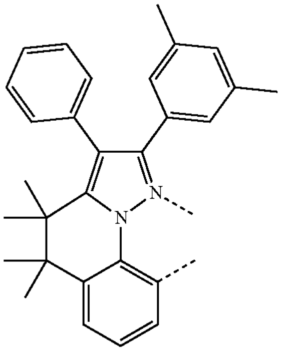
,
$L_{BB108}$
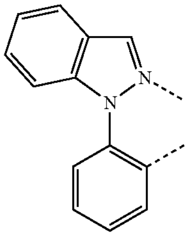
,
$L_{BB109}$
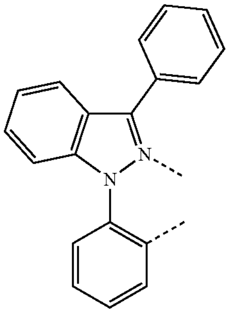
,
$L_{BB110}$
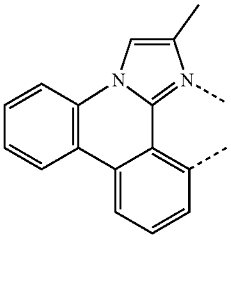
,
-continued
$L_{BB111}$
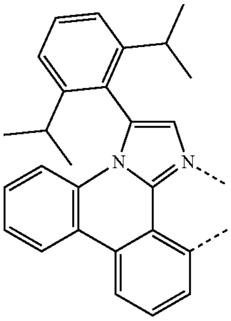
,
$L_{BB112}$
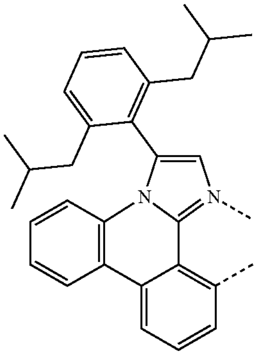
,
$L_{BB113}$
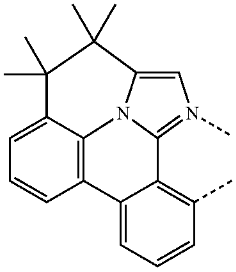
,
$L_{BB114}$
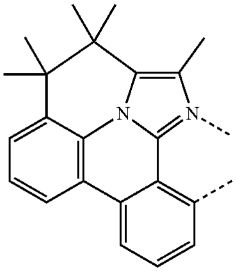
,
$L_{BB115}$
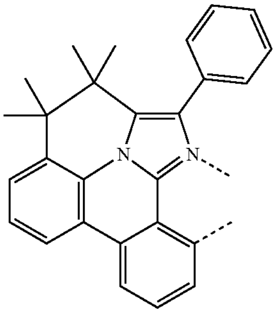
, -continued
L$_{BB116}$
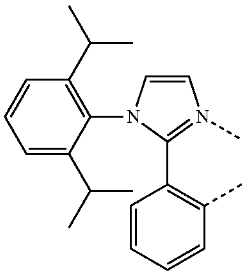
,
L$_{BB117}$
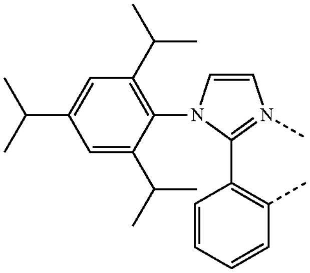
,
L$_{BB118}$
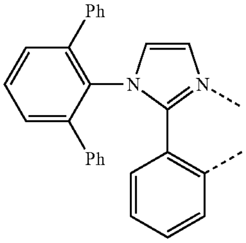
,
L$_{BB119}$
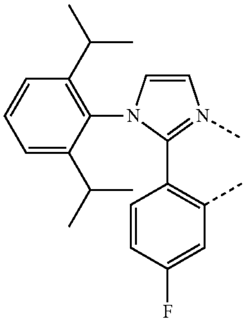
,
L$_{BB120}$
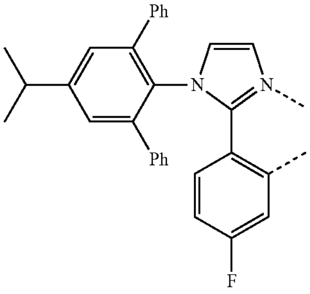
,
-continued
L$_{BB121}$
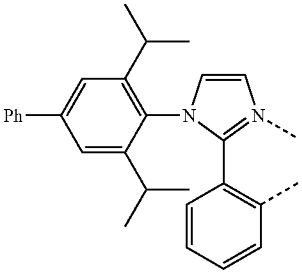
,
L$_{BB122}$
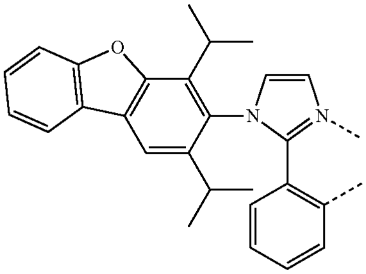
,
L$_{BB123}$
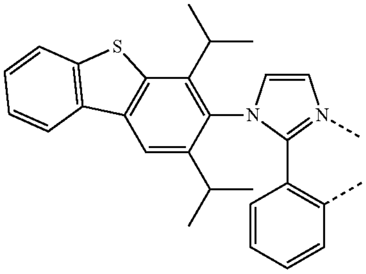
,
L$_{BB124}$
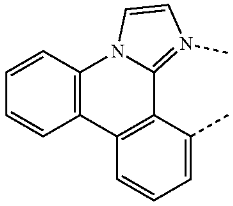
,
L$_{BB125}$
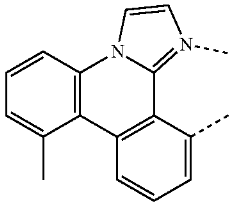
,
L$_{BB126}$
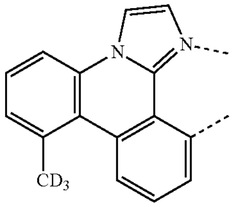
, $L_{BB127}$
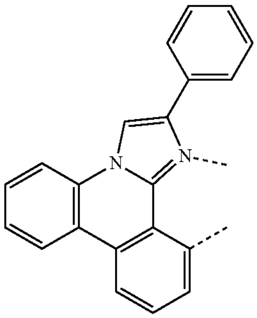
,
$L_{BB128}$
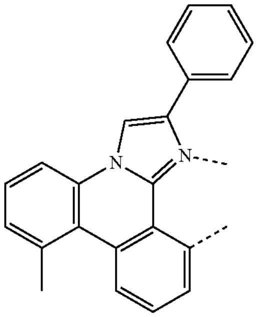
,
$L_{BB129}$
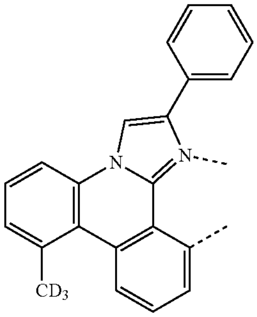
,
$L_{BB130}$
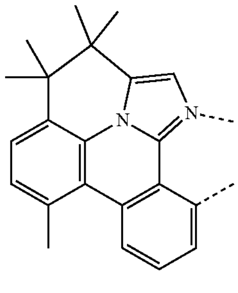
,
$L_{BB131}$
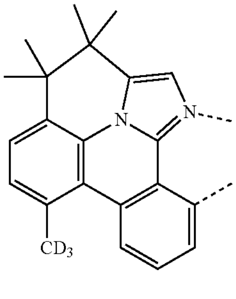
,
$L_{BB132}$
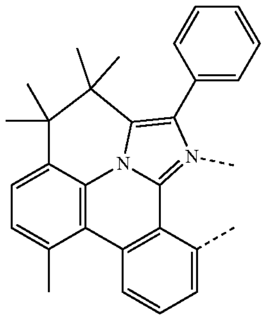
,
$L_{BB133}$
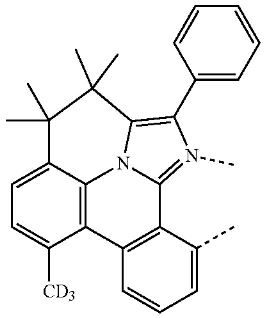
,
$L_{BB134}$
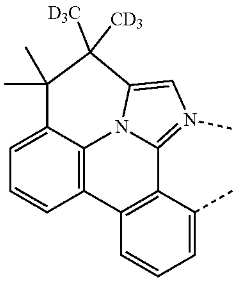
,
$L_{BB135}$
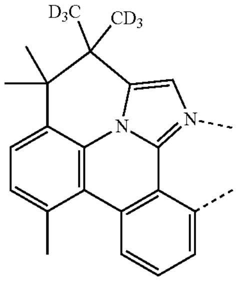
,
$L_{BB136}$
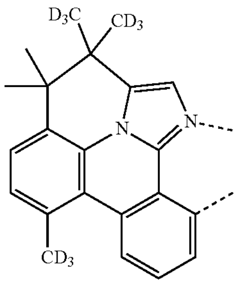
, -continued
$L_{BB137}$
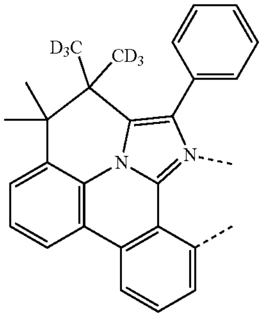
,
$L_{BB138}$
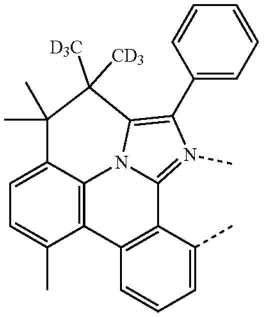
,
$L_{BB139}$
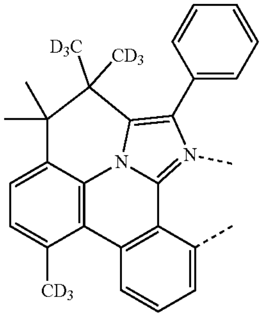
,
$L_{BB140}$
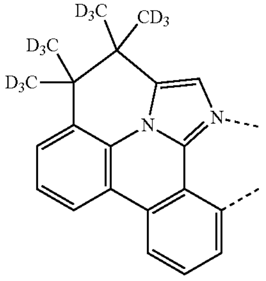
,
$L_{BB141}$
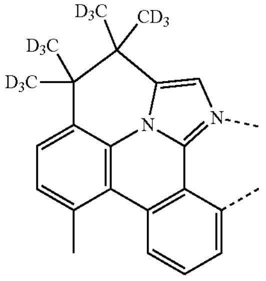
,
-continued
$L_{BB142}$
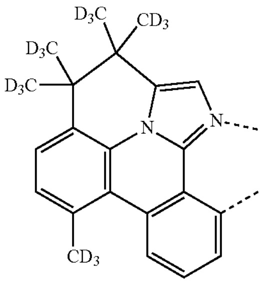
,
$L_{BB143}$
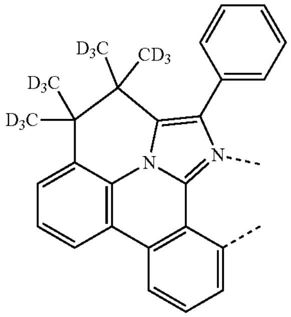
,
$L_{BB144}$
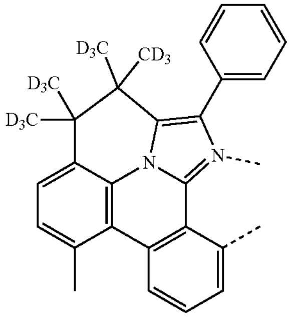
,
$L_{BB145}$
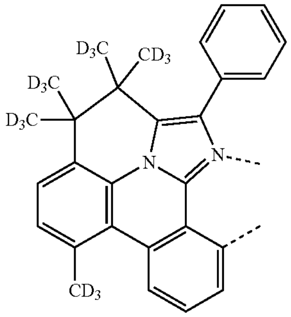
,
$L_{BB146}$
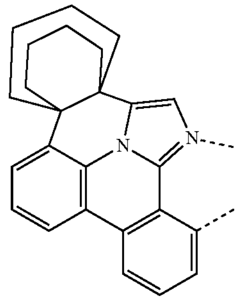
, -continued
$L_{BB147}$
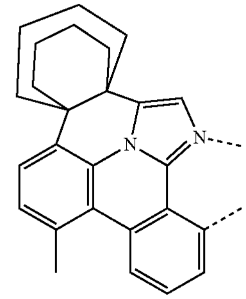
,
$L_{BB148}$
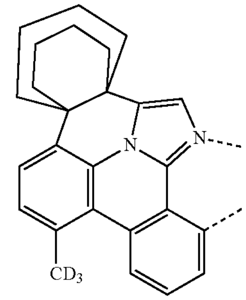
,
$L_{BB149}$
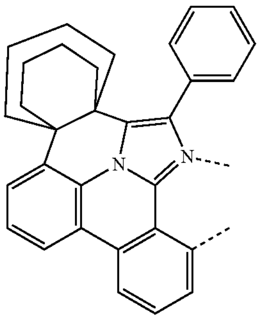
,
$L_{BB150}$
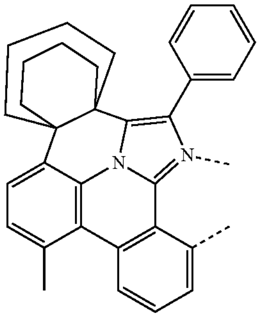
,
$L_{BB151}$
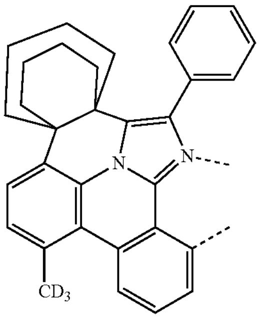
,
-continued
$L_{BB152}$
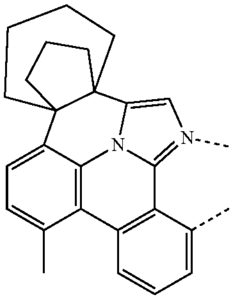
,
$L_{BB153}$
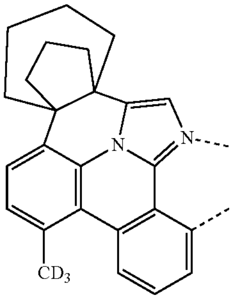
,
$L_{BB154}$
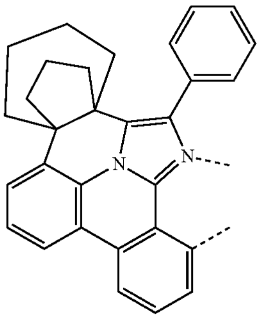
,
$L_{BB155}$
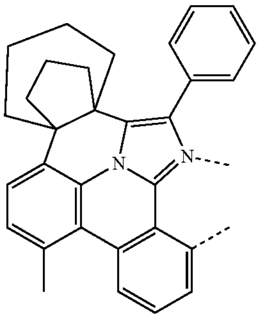
,
$L_{BB156}$
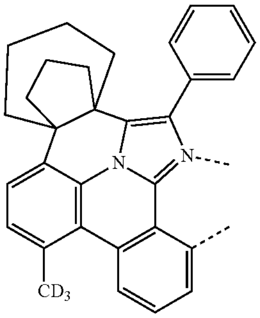
, -continued
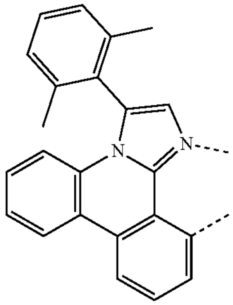
,
$L_{BB157}$
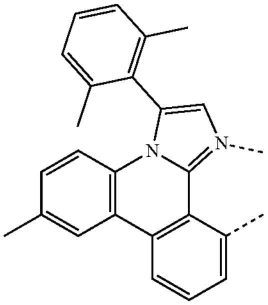
,
$L_{BB158}$
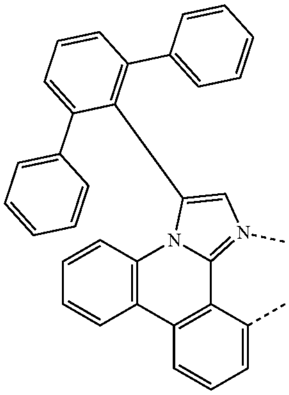
,
$L_{BB159}$
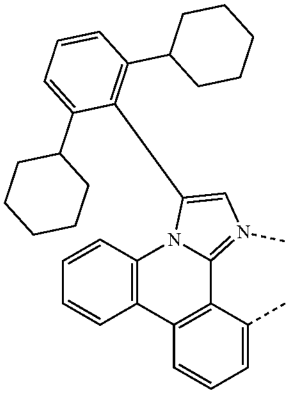
,
$L_{BB160}$
-continued
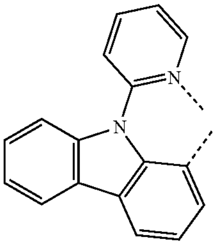
,
$L_{BB161}$
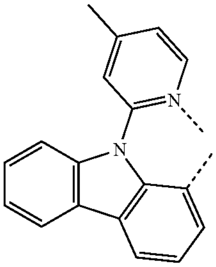
,
$L_{BB162}$
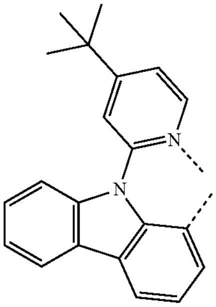
,
$L_{BB163}$
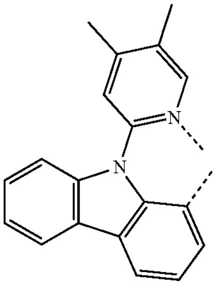
,
$L_{BB164}$
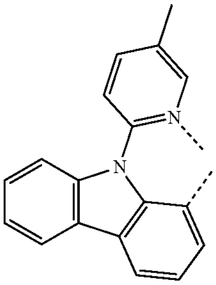
,
$L_{BB165}$ -continued
$L_{BB166}$
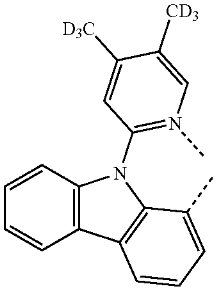
,
$L_{BB167}$
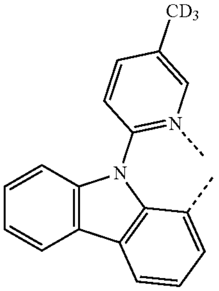
,
$L_{BB168}$
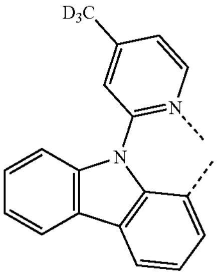
,
$L_{BB169}$
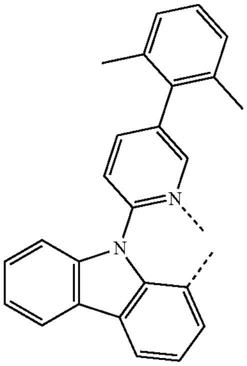
,
-continued
$L_{BB170}$
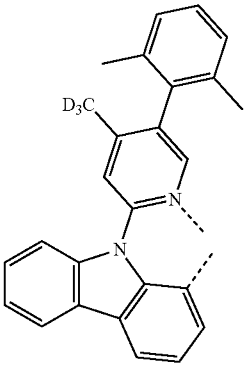
,
$L_{BB171}$
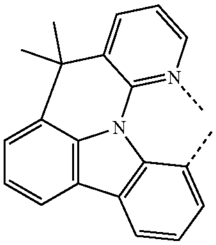
,
$L_{BB172}$
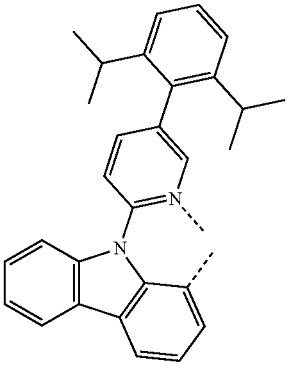
,
$L_{BB173}$
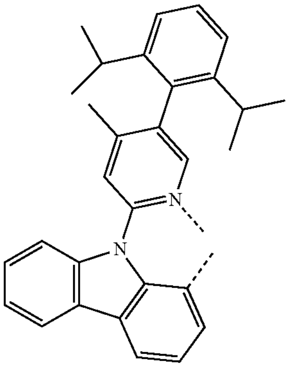
, -continued
$L_{BB174}$
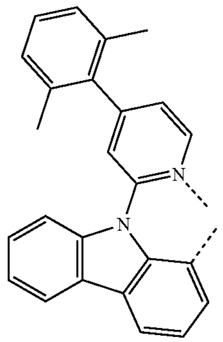
,
$L_{BB175}$
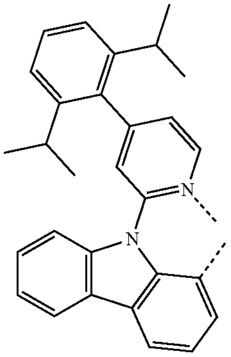
,
$L_{BB176}$
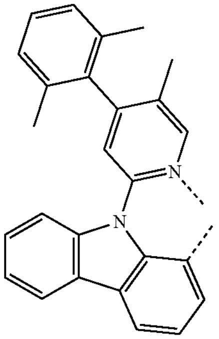
,
$L_{BB177}$
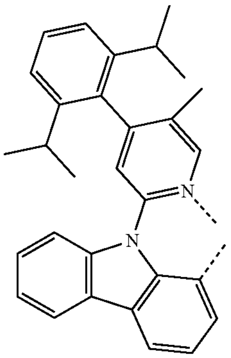
,
-continued
$L_{BB178}$
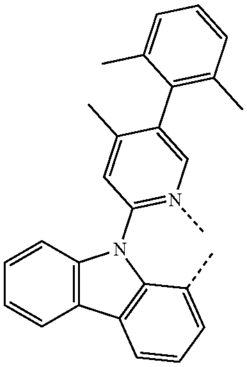
,
$L_{BB179}$
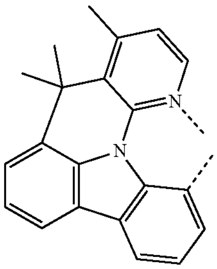
,
$L_{BB180}$
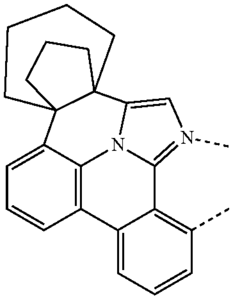
,
$L_{BB181}$
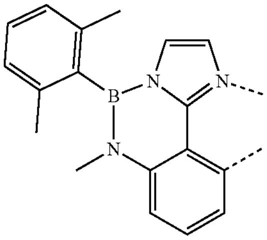
,
$L_{BB182}$
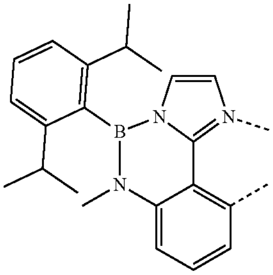
, -continued
$L_{BB183}$
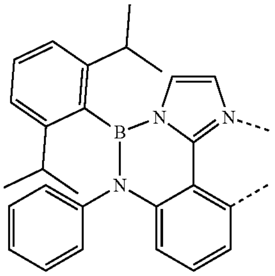
,
$L_{BB184}$
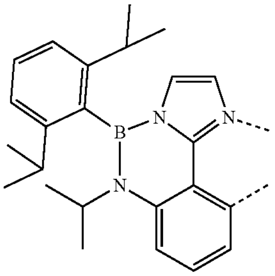
,
$L_{BB185}$
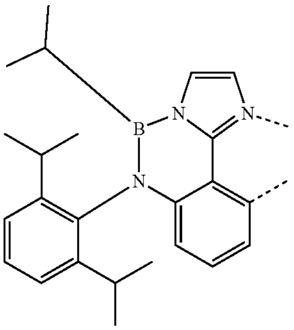
,
$L_{BB186}$
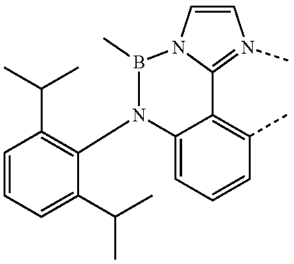
,
$L_{BB187}$
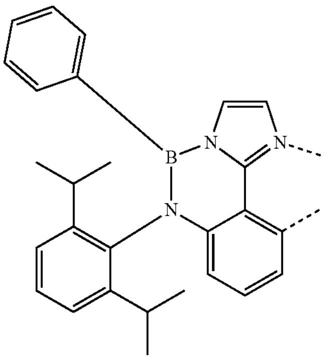
,
-continued
$L_{BB188}$
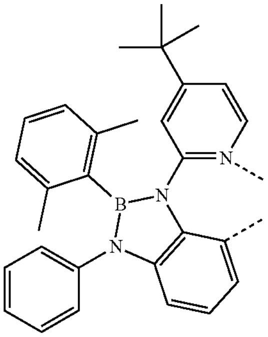
,
$L_{BB189}$
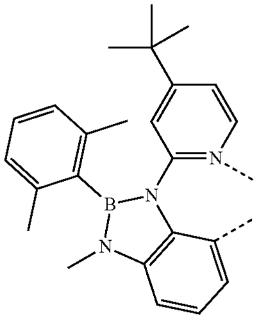
,
$L_{BB190}$
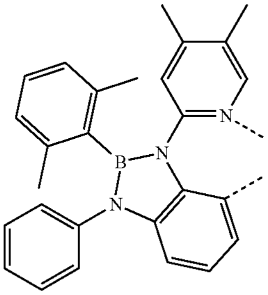
,
$L_{BB191}$
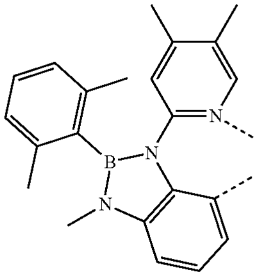
,
$L_{BB192}$
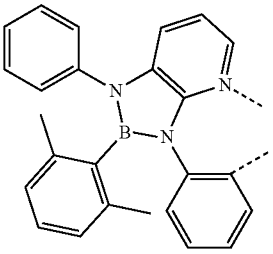
, -continued $L_{BB193}$

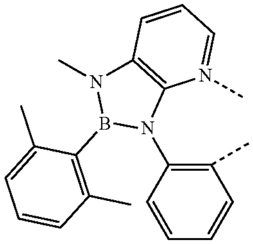

, $L_{BB194}$

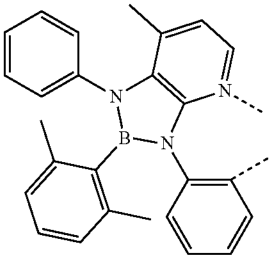

, and $L_{BB195}$

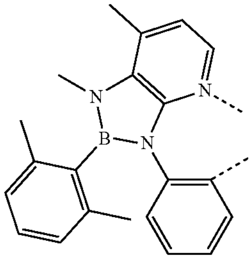

;

wherein each $L_{Cj-I}$ has a structure based on formula

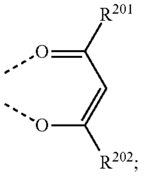

and each $L_{Cj-II}$ has a structure based on formula

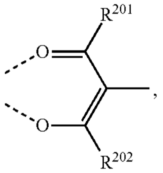

wherein for each $L_{Cj}$ in $L_{Cj-I}$ and $L_{Cj-II}$, j is an integer from 1 to 1416, $R^{201}$ and $R^{202}$ are each independently defined as follows in LIST 6:

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1}$ | $R^{D1}$ | $R^{D1}$ | $L_{C193}$ | $R^{D1}$ | $R^{D3}$ | $L_{C385}$ | $R^{D17}$ | $R^{D40}$ | $L_{C577}$ | $R^{D143}$ | $R^{D120}$ |
| $L_{C2}$ | $R^{D2}$ | $R^{D2}$ | $L_{C194}$ | $R^{D1}$ | $R^{D4}$ | $L_{C386}$ | $R^{D17}$ | $R^{D41}$ | $L_{C578}$ | $R^{D143}$ | $R^{D133}$ |
| $L_{C3}$ | $R^{D3}$ | $R^{D3}$ | $L_{C195}$ | $R^{D1}$ | $R^{D5}$ | $L_{C387}$ | $R^{D17}$ | $R^{D42}$ | $L_{C579}$ | $R^{D143}$ | $R^{D134}$ |
| $L_{C4}$ | $R^{D4}$ | $R^{D4}$ | $L_{C196}$ | $R^{D1}$ | $R^{D9}$ | $L_{C388}$ | $R^{D17}$ | $R^{D43}$ | $L_{C580}$ | $R^{D143}$ | $R^{D135}$ |
| $L_{C5}$ | $R^{D5}$ | $R^{D5}$ | $L_{C197}$ | $R^{D1}$ | $R^{D10}$ | $L_{C389}$ | $R^{D17}$ | $R^{D48}$ | $L_{C581}$ | $R^{D143}$ | $R^{D136}$ |
| $L_{C6}$ | $R^{D6}$ | $R^{D6}$ | $L_{C198}$ | $R^{D1}$ | $R^{D17}$ | $L_{C390}$ | $R^{D17}$ | $R^{D49}$ | $L_{C582}$ | $R^{D143}$ | $R^{D144}$ |
| $L_{C7}$ | $R^{D7}$ | $R^{D7}$ | $L_{C199}$ | $R^{D1}$ | $R^{D18}$ | $L_{C391}$ | $R^{D17}$ | $R^{D50}$ | $L_{C583}$ | $R^{D143}$ | $R^{D145}$ |
| $L_{C8}$ | $R^{D8}$ | $R^{D8}$ | $L_{C200}$ | $R^{D1}$ | $R^{D20}$ | $L_{C392}$ | $R^{D17}$ | $R^{D54}$ | $L_{C584}$ | $R^{D143}$ | $R^{D146}$ |
| $L_{C9}$ | $R^{D9}$ | $R^{D9}$ | $L_{C201}$ | $R^{D1}$ | $R^{D22}$ | $L_{C393}$ | $R^{D17}$ | $R^{D55}$ | $L_{C585}$ | $R^{D143}$ | $R^{D147}$ |
| $L_{C10}$ | $R^{D10}$ | $R^{D10}$ | $L_{C202}$ | $R^{D1}$ | $R^{D37}$ | $L_{C394}$ | $R^{D17}$ | $R^{D58}$ | $L_{C586}$ | $R^{D143}$ | $R^{D149}$ |
| $L_{C11}$ | $R^{D11}$ | $R^{D11}$ | $L_{C203}$ | $R^{D1}$ | $R^{D40}$ | $L_{C395}$ | $R^{D17}$ | $R^{D59}$ | $L_{C587}$ | $R^{D143}$ | $R^{D151}$ |
| $L_{C12}$ | $R^{D12}$ | $R^{D12}$ | $L_{C204}$ | $R^{D1}$ | $R^{D41}$ | $L_{C396}$ | $R^{D17}$ | $R^{D78}$ | $L_{C588}$ | $R^{D143}$ | $R^{D154}$ |
| $L_{C13}$ | $R^{D13}$ | $R^{D13}$ | $L_{C205}$ | $R^{D1}$ | $R^{D42}$ | $L_{C397}$ | $R^{D17}$ | $R^{D79}$ | $L_{C589}$ | $R^{D143}$ | $R^{D155}$ |
| $L_{C14}$ | $R^{D14}$ | $R^{D14}$ | $L_{C206}$ | $R^{D1}$ | $R^{D43}$ | $L_{C398}$ | $R^{D17}$ | $R^{D81}$ | $L_{C590}$ | $R^{D143}$ | $R^{D161}$ |
| $L_{C15}$ | $R^{D15}$ | $R^{D15}$ | $L_{C207}$ | $R^{D1}$ | $R^{D48}$ | $L_{C399}$ | $R^{D17}$ | $R^{D87}$ | $L_{C591}$ | $R^{D143}$ | $R^{D175}$ |
| $L_{C16}$ | $R^{D16}$ | $R^{D16}$ | $L_{C208}$ | $R^{D1}$ | $R^{D49}$ | $L_{C400}$ | $R^{D17}$ | $R^{D88}$ | $L_{C592}$ | $R^{D144}$ | $R^{D3}$ |
| $L_{C17}$ | $R^{D17}$ | $R^{D17}$ | $L_{C209}$ | $R^{D1}$ | $R^{D50}$ | $L_{C401}$ | $R^{D17}$ | $R^{D89}$ | $L_{C593}$ | $R^{D144}$ | $R^{D5}$ |
| $L_{C18}$ | $R^{D18}$ | $R^{D18}$ | $L_{C210}$ | $R^{D1}$ | $R^{D54}$ | $L_{C402}$ | $R^{D17}$ | $R^{D93}$ | $L_{C594}$ | $R^{D144}$ | $R^{D17}$ |
| $L_{C19}$ | $R^{D19}$ | $R^{D19}$ | $L_{C211}$ | $R^{D1}$ | $R^{D55}$ | $L_{C403}$ | $R^{D17}$ | $R^{D116}$ | $L_{C595}$ | $R^{D144}$ | $R^{D18}$ |
| $L_{C20}$ | $R^{D20}$ | $R^{D20}$ | $L_{C212}$ | $R^{D1}$ | $R^{D58}$ | $L_{C404}$ | $R^{D17}$ | $R^{D117}$ | $L_{C596}$ | $R^{D144}$ | $R^{D20}$ |
| $L_{C21}$ | $R^{D21}$ | $R^{D21}$ | $L_{C213}$ | $R^{D1}$ | $R^{D59}$ | $L_{C405}$ | $R^{D17}$ | $R^{D118}$ | $L_{C597}$ | $R^{D144}$ | $R^{D22}$ |
| $L_{C22}$ | $R^{D22}$ | $R^{D22}$ | $L_{C214}$ | $R^{D1}$ | $R^{D78}$ | $L_{C406}$ | $R^{D17}$ | $R^{D119}$ | $L_{C598}$ | $R^{D144}$ | $R^{D37}$ |
| $L_{C23}$ | $R^{D23}$ | $R^{D23}$ | $L_{C215}$ | $R^{D1}$ | $R^{D79}$ | $L_{C407}$ | $R^{D17}$ | $R^{D120}$ | $L_{C599}$ | $R^{D144}$ | $R^{D40}$ |
| $L_{C24}$ | $R^{D24}$ | $R^{D24}$ | $L_{C216}$ | $R^{D1}$ | $R^{D81}$ | $L_{C408}$ | $R^{D17}$ | $R^{D133}$ | $L_{C600}$ | $R^{D144}$ | $R^{D41}$ |
| $L_{C25}$ | $R^{D25}$ | $R^{D25}$ | $L_{C217}$ | $R^{D1}$ | $R^{D87}$ | $L_{C409}$ | $R^{D17}$ | $R^{D134}$ | $L_{C601}$ | $R^{D144}$ | $R^{D42}$ |
| $L_{C26}$ | $R^{D26}$ | $R^{D26}$ | $L_{C218}$ | $R^{D1}$ | $R^{D88}$ | $L_{C410}$ | $R^{D17}$ | $R^{D135}$ | $L_{C602}$ | $R^{D144}$ | $R^{D43}$ |
| $L_{C27}$ | $R^{D27}$ | $R^{D27}$ | $L_{C219}$ | $R^{D1}$ | $R^{D89}$ | $L_{C411}$ | $R^{D17}$ | $R^{D136}$ | $L_{C603}$ | $R^{D144}$ | $R^{D48}$ |
| $L_{C28}$ | $R^{D28}$ | $R^{D28}$ | $L_{C220}$ | $R^{D1}$ | $R^{D93}$ | $L_{C412}$ | $R^{D17}$ | $R^{D143}$ | $L_{C604}$ | $R^{D144}$ | $R^{D49}$ |
| $L_{C29}$ | $R^{D29}$ | $R^{D29}$ | $L_{C221}$ | $R^{D1}$ | $R^{D116}$ | $L_{C413}$ | $R^{D17}$ | $R^{D144}$ | $L_{C605}$ | $R^{D144}$ | $R^{D54}$ |
| $L_{C30}$ | $R^{D30}$ | $R^{D30}$ | $L_{C222}$ | $R^{D1}$ | $R^{D117}$ | $L_{C414}$ | $R^{D17}$ | $R^{D145}$ | $L_{C606}$ | $R^{D144}$ | $R^{D58}$ |
| $L_{C31}$ | $R^{D31}$ | $R^{D31}$ | $L_{C223}$ | $R^{D1}$ | $R^{D118}$ | $L_{C415}$ | $R^{D17}$ | $R^{D146}$ | $L_{C607}$ | $R^{D144}$ | $R^{D59}$ |
| $L_{C32}$ | $R^{D32}$ | $R^{D32}$ | $L_{C224}$ | $R^{D1}$ | $R^{D119}$ | $L_{C416}$ | $R^{D17}$ | $R^{D147}$ | $L_{C608}$ | $R^{D144}$ | $R^{D78}$ |
| $L_{C33}$ | $R^{D33}$ | $R^{D33}$ | $L_{C225}$ | $R^{D1}$ | $R^{D120}$ | $L_{C417}$ | $R^{D17}$ | $R^{D149}$ | $L_{C609}$ | $R^{D144}$ | $R^{D79}$ |
| $L_{C34}$ | $R^{D34}$ | $R^{D34}$ | $L_{C226}$ | $R^{D1}$ | $R^{D133}$ | $L_{C418}$ | $R^{D17}$ | $R^{D151}$ | $L_{C610}$ | $R^{D144}$ | $R^{D81}$ |
| $L_{C35}$ | $R^{D35}$ | $R^{D35}$ | $L_{C227}$ | $R^{D1}$ | $R^{D134}$ | $L_{C419}$ | $R^{D17}$ | $R^{D154}$ | $L_{C611}$ | $R^{D144}$ | $R^{D87}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C36}$ | $R^{D36}$ | $R^{D36}$ | $L_{C228}$ | $R^{D1}$ | $R^{D135}$ | $L_{C420}$ | $R^{D17}$ | $R^{D155}$ | $L_{C612}$ | $R^{D144}$ | $R^{D88}$ |
| $L_{C37}$ | $R^{D37}$ | $R^{D37}$ | $L_{C229}$ | $R^{D1}$ | $R^{D136}$ | $L_{C421}$ | $R^{D17}$ | $R^{D161}$ | $L_{C613}$ | $R^{D144}$ | $R^{D89}$ |
| $L_{C38}$ | $R^{D38}$ | $R^{D38}$ | $L_{C230}$ | $R^{D1}$ | $R^{D143}$ | $L_{C422}$ | $R^{D17}$ | $R^{D175}$ | $L_{C614}$ | $R^{D144}$ | $R^{D93}$ |
| $L_{C39}$ | $R^{D39}$ | $R^{D39}$ | $L_{C231}$ | $R^{D1}$ | $R^{D144}$ | $L_{C423}$ | $R^{D50}$ | $R^{D3}$ | $L_{C615}$ | $R^{D144}$ | $R^{D116}$ |
| $L_{C40}$ | $R^{D40}$ | $R^{D40}$ | $L_{C232}$ | $R^{D1}$ | $R^{D145}$ | $L_{C424}$ | $R^{D50}$ | $R^{D5}$ | $L_{C616}$ | $R^{D144}$ | $R^{D117}$ |
| $L_{C41}$ | $R^{D41}$ | $R^{D41}$ | $L_{C233}$ | $R^{D1}$ | $R^{D146}$ | $L_{C425}$ | $R^{D50}$ | $R^{D18}$ | $L_{C617}$ | $R^{D144}$ | $R^{D118}$ |
| $L_{C42}$ | $R^{D42}$ | $R^{D42}$ | $L_{C234}$ | $R^{D1}$ | $R^{D147}$ | $L_{C426}$ | $R^{D50}$ | $R^{D20}$ | $L_{C618}$ | $R^{D144}$ | $R^{D119}$ |
| $L_{C43}$ | $R^{D43}$ | $R^{D43}$ | $L_{C235}$ | $R^{D1}$ | $R^{D149}$ | $L_{C427}$ | $R^{D50}$ | $R^{D22}$ | $L_{C619}$ | $R^{D144}$ | $R^{D120}$ |
| $L_{C44}$ | $R^{D44}$ | $R^{D44}$ | $L_{C236}$ | $R^{D1}$ | $R^{D151}$ | $L_{C428}$ | $R^{D50}$ | $R^{D37}$ | $L_{C620}$ | $R^{D144}$ | $R^{D133}$ |
| $L_{C45}$ | $R^{D45}$ | $R^{D45}$ | $L_{C237}$ | $R^{D1}$ | $R^{D154}$ | $L_{C429}$ | $R^{D50}$ | $R^{D40}$ | $L_{C621}$ | $R^{D144}$ | $R^{D134}$ |
| $L_{C46}$ | $R^{D46}$ | $R^{D46}$ | $L_{C238}$ | $R^{D1}$ | $R^{D155}$ | $L_{C430}$ | $R^{D50}$ | $R^{D41}$ | $L_{C622}$ | $R^{D144}$ | $R^{D135}$ |
| $L_{C47}$ | $R^{D47}$ | $R^{D47}$ | $L_{C239}$ | $R^{D1}$ | $R^{D161}$ | $L_{C431}$ | $R^{D50}$ | $R^{D42}$ | $L_{C623}$ | $R^{D144}$ | $R^{D136}$ |
| $L_{C48}$ | $R^{D48}$ | $R^{D48}$ | $L_{C240}$ | $R^{D1}$ | $R^{D175}$ | $L_{C432}$ | $R^{D50}$ | $R^{D43}$ | $L_{C624}$ | $R^{D144}$ | $R^{D145}$ |
| $L_{C49}$ | $R^{D49}$ | $R^{D49}$ | $L_{C241}$ | $R^{D1}$ | $R^{D3}$ | $L_{C433}$ | $R^{D50}$ | $R^{D48}$ | $L_{C625}$ | $R^{D144}$ | $R^{D146}$ |
| $L_{C50}$ | $R^{D50}$ | $R^{D50}$ | $L_{C242}$ | $R^{D4}$ | $R^{D5}$ | $L_{C434}$ | $R^{D50}$ | $R^{D49}$ | $L_{C626}$ | $R^{D144}$ | $R^{D147}$ |
| $L_{C51}$ | $R^{D51}$ | $R^{D51}$ | $L_{C243}$ | $R^{D4}$ | $R^{D9}$ | $L_{C435}$ | $R^{D50}$ | $R^{D54}$ | $L_{C627}$ | $R^{D144}$ | $R^{D149}$ |
| $L_{C52}$ | $R^{D52}$ | $R^{D52}$ | $L_{C244}$ | $R^{D4}$ | $R^{D10}$ | $L_{C436}$ | $R^{D50}$ | $R^{D55}$ | $L_{C628}$ | $R^{D144}$ | $R^{D151}$ |
| $L_{C53}$ | $R^{D53}$ | $R^{D53}$ | $L_{C245}$ | $R^{D4}$ | $R^{D17}$ | $L_{C437}$ | $R^{D50}$ | $R^{D58}$ | $L_{C629}$ | $R^{D144}$ | $R^{D154}$ |
| $L_{C54}$ | $R^{D54}$ | $R^{D54}$ | $L_{C246}$ | $R^{D4}$ | $R^{D18}$ | $L_{C438}$ | $R^{D50}$ | $R^{D59}$ | $L_{C630}$ | $R^{D144}$ | $R^{D155}$ |
| $L_{C55}$ | $R^{D55}$ | $R^{D55}$ | $L_{C247}$ | $R^{D4}$ | $R^{D20}$ | $L_{C439}$ | $R^{D50}$ | $R^{D78}$ | $L_{C631}$ | $R^{D144}$ | $R^{D161}$ |
| $L_{C56}$ | $R^{D56}$ | $R^{D56}$ | $L_{C248}$ | $R^{D4}$ | $R^{D22}$ | $L_{C440}$ | $R^{D50}$ | $R^{D79}$ | $L_{C632}$ | $R^{D144}$ | $R^{D175}$ |
| $L_{C57}$ | $R^{D57}$ | $R^{D57}$ | $L_{C249}$ | $R^{D4}$ | $R^{D37}$ | $L_{C441}$ | $R^{D50}$ | $R^{D81}$ | $L_{C633}$ | $R^{D145}$ | $R^{D3}$ |
| $L_{C58}$ | $R^{D58}$ | $R^{D58}$ | $L_{C250}$ | $R^{D4}$ | $R^{D40}$ | $L_{C442}$ | $R^{D50}$ | $R^{D87}$ | $L_{C634}$ | $R^{D145}$ | $R^{D5}$ |
| $L_{C59}$ | $R^{D59}$ | $R^{D59}$ | $L_{C251}$ | $R^{D4}$ | $R^{D41}$ | $L_{C443}$ | $R^{D50}$ | $R^{D88}$ | $L_{C635}$ | $R^{D145}$ | $R^{D17}$ |
| $L_{C60}$ | $R^{D60}$ | $R^{D60}$ | $L_{C252}$ | $R^{D4}$ | $R^{D42}$ | $L_{C444}$ | $R^{D50}$ | $R^{D89}$ | $L_{C636}$ | $R^{D145}$ | $R^{D18}$ |
| $L_{C61}$ | $R^{D61}$ | $R^{D61}$ | $L_{C253}$ | $R^{D4}$ | $R^{D43}$ | $L_{C445}$ | $R^{D50}$ | $R^{D93}$ | $L_{C637}$ | $R^{D145}$ | $R^{D20}$ |
| $L_{C62}$ | $R^{D62}$ | $R^{D62}$ | $L_{C254}$ | $R^{D4}$ | $R^{D48}$ | $L_{C446}$ | $R^{D50}$ | $R^{D116}$ | $L_{C638}$ | $R^{D145}$ | $R^{D22}$ |
| $L_{C63}$ | $R^{D63}$ | $R^{D63}$ | $L_{C255}$ | $R^{D4}$ | $R^{D49}$ | $L_{C447}$ | $R^{D50}$ | $R^{D117}$ | $L_{C639}$ | $R^{D145}$ | $R^{D37}$ |
| $L_{C64}$ | $R^{D64}$ | $R^{D64}$ | $L_{C256}$ | $R^{D4}$ | $R^{D50}$ | $L_{C448}$ | $R^{D50}$ | $R^{D118}$ | $L_{C640}$ | $R^{D145}$ | $R^{D40}$ |
| $L_{C65}$ | $R^{D65}$ | $R^{D65}$ | $L_{C257}$ | $R^{D4}$ | $R^{D54}$ | $L_{C449}$ | $R^{D50}$ | $R^{D119}$ | $L_{C641}$ | $R^{D145}$ | $R^{D41}$ |
| $L_{C66}$ | $R^{D66}$ | $R^{D66}$ | $L_{C258}$ | $R^{D4}$ | $R^{D55}$ | $L_{C450}$ | $R^{D50}$ | $R^{D120}$ | $L_{C642}$ | $R^{D145}$ | $R^{D42}$ |
| $L_{C67}$ | $R^{D67}$ | $R^{D67}$ | $L_{C259}$ | $R^{D4}$ | $R^{D58}$ | $L_{C451}$ | $R^{D50}$ | $R^{D133}$ | $L_{C643}$ | $R^{D145}$ | $R^{D43}$ |
| $L_{C68}$ | $R^{D68}$ | $R^{D68}$ | $L_{C260}$ | $R^{D4}$ | $R^{D59}$ | $L_{C452}$ | $R^{D50}$ | $R^{D134}$ | $L_{C644}$ | $R^{D145}$ | $R^{D48}$ |
| $L_{C69}$ | $R^{D69}$ | $R^{D69}$ | $L_{C261}$ | $R^{D4}$ | $R^{D78}$ | $L_{C453}$ | $R^{D50}$ | $R^{D135}$ | $L_{C645}$ | $R^{D145}$ | $R^{D49}$ |
| $L_{C70}$ | $R^{D70}$ | $R^{D70}$ | $L_{C262}$ | $R^{D4}$ | $R^{D79}$ | $L_{C454}$ | $R^{D50}$ | $R^{D136}$ | $L_{C646}$ | $R^{D145}$ | $R^{D54}$ |
| $L_{C71}$ | $R^{D71}$ | $R^{D71}$ | $L_{C263}$ | $R^{D4}$ | $R^{D81}$ | $L_{C455}$ | $R^{D50}$ | $R^{D143}$ | $L_{C647}$ | $R^{D145}$ | $R^{D58}$ |
| $L_{C72}$ | $R^{D72}$ | $R^{D72}$ | $L_{C264}$ | $R^{D4}$ | $R^{D87}$ | $L_{C456}$ | $R^{D50}$ | $R^{D144}$ | $L_{C648}$ | $R^{D145}$ | $R^{D59}$ |
| $L_{C73}$ | $R^{D73}$ | $R^{D73}$ | $L_{C265}$ | $R^{D4}$ | $R^{D88}$ | $L_{C457}$ | $R^{D50}$ | $R^{D145}$ | $L_{C649}$ | $R^{D145}$ | $R^{D78}$ |
| $L_{C74}$ | $R^{D74}$ | $R^{D74}$ | $L_{C266}$ | $R^{D4}$ | $R^{D89}$ | $L_{C458}$ | $R^{D50}$ | $R^{D146}$ | $L_{C650}$ | $R^{D145}$ | $R^{D79}$ |
| $L_{C75}$ | $R^{D75}$ | $R^{D75}$ | $L_{C267}$ | $R^{D4}$ | $R^{D93}$ | $L_{C459}$ | $R^{D50}$ | $R^{D147}$ | $L_{C651}$ | $R^{D145}$ | $R^{D81}$ |
| $L_{C76}$ | $R^{D76}$ | $R^{D76}$ | $L_{C268}$ | $R^{D4}$ | $R^{D116}$ | $L_{C460}$ | $R^{D50}$ | $R^{D149}$ | $L_{C652}$ | $R^{D145}$ | $R^{D87}$ |
| $L_{C77}$ | $R^{D77}$ | $R^{D77}$ | $L_{C269}$ | $R^{D4}$ | $R^{D117}$ | $L_{C461}$ | $R^{D50}$ | $R^{D151}$ | $L_{C653}$ | $R^{D145}$ | $R^{D88}$ |
| $L_{C78}$ | $R^{D78}$ | $R^{D78}$ | $L_{C270}$ | $R^{D4}$ | $R^{D118}$ | $L_{C462}$ | $R^{D50}$ | $R^{D154}$ | $L_{C654}$ | $R^{D145}$ | $R^{D89}$ |
| $L_{C79}$ | $R^{D79}$ | $R^{D79}$ | $L_{C271}$ | $R^{D4}$ | $R^{D119}$ | $L_{C463}$ | $R^{D50}$ | $R^{D155}$ | $L_{C655}$ | $R^{D145}$ | $R^{D93}$ |
| $L_{C80}$ | $R^{D80}$ | $R^{D80}$ | $L_{C272}$ | $R^{D4}$ | $R^{D120}$ | $L_{C464}$ | $R^{D50}$ | $R^{D161}$ | $L_{C656}$ | $R^{D145}$ | $R^{D116}$ |
| $L_{C81}$ | $R^{D81}$ | $R^{D81}$ | $L_{C273}$ | $R^{D4}$ | $R^{D133}$ | $L_{C465}$ | $R^{D50}$ | $R^{D175}$ | $L_{C657}$ | $R^{D145}$ | $R^{D117}$ |
| $L_{C82}$ | $R^{D82}$ | $R^{D82}$ | $L_{C274}$ | $R^{D4}$ | $R^{D134}$ | $L_{C466}$ | $R^{D55}$ | $R^{D3}$ | $L_{C658}$ | $R^{D145}$ | $R^{D118}$ |
| $L_{C83}$ | $R^{D83}$ | $R^{D83}$ | $L_{C275}$ | $R^{D4}$ | $R^{D135}$ | $L_{C467}$ | $R^{D55}$ | $R^{D5}$ | $L_{C659}$ | $R^{D145}$ | $R^{D119}$ |
| $L_{C84}$ | $R^{D84}$ | $R^{D84}$ | $L_{C276}$ | $R^{D4}$ | $R^{D136}$ | $L_{C468}$ | $R^{D55}$ | $R^{D18}$ | $L_{C660}$ | $R^{D145}$ | $R^{D120}$ |
| $L_{C85}$ | $R^{D85}$ | $R^{D85}$ | $L_{C277}$ | $R^{D4}$ | $R^{D143}$ | $L_{C469}$ | $R^{D55}$ | $R^{D20}$ | $L_{C661}$ | $R^{D145}$ | $R^{D133}$ |
| $L_{C86}$ | $R^{D86}$ | $R^{D86}$ | $L_{C278}$ | $R^{D4}$ | $R^{D144}$ | $L_{C470}$ | $R^{D55}$ | $R^{D22}$ | $L_{C662}$ | $R^{D145}$ | $R^{D134}$ |
| $L_{C87}$ | $R^{D87}$ | $R^{D87}$ | $L_{C279}$ | $R^{D4}$ | $R^{D145}$ | $L_{C471}$ | $R^{D55}$ | $R^{D37}$ | $L_{C663}$ | $R^{D145}$ | $R^{D135}$ |
| $L_{C88}$ | $R^{D88}$ | $R^{D88}$ | $L_{C280}$ | $R^{D4}$ | $R^{D146}$ | $L_{C472}$ | $R^{D55}$ | $R^{D40}$ | $L_{C664}$ | $R^{D145}$ | $R^{D136}$ |
| $L_{C89}$ | $R^{D89}$ | $R^{D89}$ | $L_{C281}$ | $R^{D4}$ | $R^{D147}$ | $L_{C473}$ | $R^{D55}$ | $R^{D41}$ | $L_{C665}$ | $R^{D145}$ | $R^{D146}$ |
| $L_{C90}$ | $R^{D90}$ | $R^{D90}$ | $L_{C282}$ | $R^{D4}$ | $R^{D149}$ | $L_{C474}$ | $R^{D55}$ | $R^{D42}$ | $L_{C666}$ | $R^{D145}$ | $R^{D147}$ |
| $L_{C91}$ | $R^{D91}$ | $R^{D91}$ | $L_{C283}$ | $R^{D4}$ | $R^{D151}$ | $L_{C475}$ | $R^{D55}$ | $R^{D43}$ | $L_{C667}$ | $R^{D145}$ | $R^{D149}$ |
| $L_{C92}$ | $R^{D92}$ | $R^{D92}$ | $L_{C284}$ | $R^{D4}$ | $R^{D154}$ | $L_{C476}$ | $R^{D55}$ | $R^{D48}$ | $L_{C668}$ | $R^{D145}$ | $R^{D151}$ |
| $L_{C93}$ | $R^{D93}$ | $R^{D93}$ | $L_{C285}$ | $R^{D4}$ | $R^{D155}$ | $L_{C477}$ | $R^{D55}$ | $R^{D49}$ | $L_{C669}$ | $R^{D145}$ | $R^{D154}$ |
| $L_{C94}$ | $R^{D94}$ | $R^{D94}$ | $L_{C286}$ | $R^{D4}$ | $R^{D161}$ | $L_{C478}$ | $R^{D55}$ | $R^{D54}$ | $L_{C670}$ | $R^{D145}$ | $R^{D155}$ |
| $L_{C95}$ | $R^{D95}$ | $R^{D95}$ | $L_{C287}$ | $R^{D4}$ | $R^{D175}$ | $L_{C479}$ | $R^{D55}$ | $R^{D58}$ | $L_{C671}$ | $R^{D145}$ | $R^{D161}$ |
| $L_{C96}$ | $R^{D96}$ | $R^{D96}$ | $L_{C288}$ | $R^{D9}$ | $R^{D3}$ | $L_{C480}$ | $R^{D55}$ | $R^{D59}$ | $L_{C672}$ | $R^{D145}$ | $R^{D175}$ |
| $L_{C97}$ | $R^{D97}$ | $R^{D97}$ | $L_{C289}$ | $R^{D9}$ | $R^{D5}$ | $L_{C481}$ | $R^{D55}$ | $R^{D78}$ | $L_{C673}$ | $R^{D146}$ | $R^{D3}$ |
| $L_{C98}$ | $R^{D98}$ | $R^{D98}$ | $L_{C290}$ | $R^{D9}$ | $R^{D10}$ | $L_{C482}$ | $R^{D55}$ | $R^{D79}$ | $L_{C674}$ | $R^{D146}$ | $R^{D5}$ |
| $L_{C99}$ | $R^{D99}$ | $R^{D99}$ | $L_{C291}$ | $R^{D9}$ | $R^{D17}$ | $L_{C483}$ | $R^{D55}$ | $R^{D81}$ | $L_{C675}$ | $R^{D146}$ | $R^{D17}$ |
| $L_{C100}$ | $R^{D100}$ | $R^{D100}$ | $L_{C292}$ | $R^{D9}$ | $R^{D18}$ | $L_{C484}$ | $R^{D55}$ | $R^{D87}$ | $L_{C676}$ | $R^{D146}$ | $R^{D18}$ |
| $L_{C101}$ | $R^{D101}$ | $R^{D101}$ | $L_{C293}$ | $R^{D9}$ | $R^{D20}$ | $L_{C485}$ | $R^{D55}$ | $R^{D88}$ | $L_{C677}$ | $R^{D146}$ | $R^{D20}$ |
| $L_{C102}$ | $R^{D102}$ | $R^{D102}$ | $L_{C294}$ | $R^{D9}$ | $R^{D22}$ | $L_{C486}$ | $R^{D55}$ | $R^{D89}$ | $L_{C678}$ | $R^{D146}$ | $R^{D22}$ |
| $L_{C103}$ | $R^{D103}$ | $R^{D103}$ | $L_{C295}$ | $R^{D9}$ | $R^{D37}$ | $L_{C487}$ | $R^{D55}$ | $R^{D93}$ | $L_{C679}$ | $R^{D146}$ | $R^{D37}$ |
| $L_{C104}$ | $R^{D104}$ | $R^{D104}$ | $L_{C296}$ | $R^{D9}$ | $R^{D40}$ | $L_{C488}$ | $R^{D55}$ | $R^{D116}$ | $L_{C680}$ | $R^{D146}$ | $R^{D40}$ |
| $L_{C105}$ | $R^{D105}$ | $R^{D105}$ | $L_{C297}$ | $R^{D9}$ | $R^{D41}$ | $L_{C489}$ | $R^{D55}$ | $R^{D117}$ | $L_{C681}$ | $R^{D146}$ | $R^{D41}$ |
| $L_{C106}$ | $R^{D106}$ | $R^{D106}$ | $L_{C298}$ | $R^{D9}$ | $R^{D42}$ | $L_{C490}$ | $R^{D55}$ | $R^{D118}$ | $L_{C682}$ | $R^{D146}$ | $R^{D42}$ |
| $L_{C107}$ | $R^{D107}$ | $R^{D107}$ | $L_{C299}$ | $R^{D9}$ | $R^{D43}$ | $L_{C491}$ | $R^{D55}$ | $R^{D119}$ | $L_{C683}$ | $R^{D146}$ | $R^{D43}$ |
| $L_{C108}$ | $R^{D108}$ | $R^{D108}$ | $L_{C300}$ | $R^{D9}$ | $R^{D48}$ | $L_{C492}$ | $R^{D55}$ | $R^{D120}$ | $L_{C684}$ | $R^{D146}$ | $R^{D48}$ |
| $L_{C109}$ | $R^{D109}$ | $R^{D109}$ | $L_{C301}$ | $R^{D9}$ | $R^{D49}$ | $L_{C493}$ | $R^{D55}$ | $R^{D133}$ | $L_{C685}$ | $R^{D146}$ | $R^{D49}$ |
| $L_{C110}$ | $R^{D110}$ | $R^{D110}$ | $L_{C302}$ | $R^{D9}$ | $R^{D50}$ | $L_{C494}$ | $R^{D55}$ | $R^{D134}$ | $L_{C686}$ | $R^{D146}$ | $R^{D54}$ |
| $L_{C111}$ | $R^{D111}$ | $R^{D111}$ | $L_{C303}$ | $R^{D9}$ | $R^{D54}$ | $L_{C495}$ | $R^{D55}$ | $R^{D135}$ | $L_{C687}$ | $R^{D146}$ | $R^{D58}$ |
| $L_{C112}$ | $R^{D112}$ | $R^{D112}$ | $L_{C304}$ | $R^{D9}$ | $R^{D55}$ | $L_{C496}$ | $R^{D55}$ | $R^{D136}$ | $L_{C688}$ | $R^{D146}$ | $R^{D59}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C113}$ | $R^{D113}$ | $R^{D113}$ | $L_{C305}$ | $R^{D9}$ | $R^{D58}$ | $L_{C497}$ | $R^{D55}$ | $R^{D143}$ | $L_{C689}$ | $R^{D146}$ | $R^{D78}$ |
| $L_{C114}$ | $R^{D114}$ | $R^{D114}$ | $L_{C306}$ | $R^{D9}$ | $R^{D59}$ | $L_{C498}$ | $R^{D55}$ | $R^{D144}$ | $L_{C690}$ | $R^{D146}$ | $R^{D79}$ |
| $L_{C115}$ | $R^{D115}$ | $R^{D115}$ | $L_{C307}$ | $R^{D9}$ | $R^{D78}$ | $L_{C499}$ | $R^{D55}$ | $R^{D145}$ | $L_{C691}$ | $R^{D146}$ | $R^{D81}$ |
| $L_{C116}$ | $R^{D116}$ | $R^{D116}$ | $L_{C308}$ | $R^{D9}$ | $R^{D79}$ | $L_{C500}$ | $R^{D55}$ | $R^{D146}$ | $L_{C692}$ | $R^{D146}$ | $R^{D87}$ |
| $L_{C117}$ | $R^{D117}$ | $R^{D117}$ | $L_{C309}$ | $R^{D9}$ | $R^{D81}$ | $L_{C501}$ | $R^{D55}$ | $R^{D147}$ | $L_{C693}$ | $R^{D146}$ | $R^{D88}$ |
| $L_{C118}$ | $R^{D118}$ | $R^{D118}$ | $L_{C310}$ | $R^{D9}$ | $R^{D87}$ | $L_{C502}$ | $R^{D55}$ | $R^{D149}$ | $L_{C694}$ | $R^{D146}$ | $R^{D89}$ |
| $L_{C119}$ | $R^{D119}$ | $R^{D119}$ | $L_{C311}$ | $R^{D9}$ | $R^{D88}$ | $L_{C503}$ | $R^{D55}$ | $R^{D151}$ | $L_{C695}$ | $R^{D146}$ | $R^{D93}$ |
| $L_{C120}$ | $R^{D120}$ | $R^{D120}$ | $L_{C312}$ | $R^{D9}$ | $R^{D89}$ | $L_{C504}$ | $R^{D55}$ | $R^{D154}$ | $L_{C696}$ | $R^{D146}$ | $R^{D117}$ |
| $L_{C121}$ | $R^{D121}$ | $R^{D121}$ | $L_{C313}$ | $R^{D9}$ | $R^{D93}$ | $L_{C505}$ | $R^{D55}$ | $R^{D155}$ | $L_{C697}$ | $R^{D146}$ | $R^{D118}$ |
| $L_{C122}$ | $R^{D122}$ | $R^{D122}$ | $L_{C314}$ | $R^{D9}$ | $R^{D116}$ | $L_{C506}$ | $R^{D55}$ | $R^{D161}$ | $L_{C698}$ | $R^{D146}$ | $R^{D119}$ |
| $L_{C123}$ | $R^{D123}$ | $R^{D123}$ | $L_{C315}$ | $R^{D9}$ | $R^{D117}$ | $L_{C507}$ | $R^{D55}$ | $R^{D175}$ | $L_{C699}$ | $R^{D146}$ | $R^{D120}$ |
| $L_{C124}$ | $R^{D124}$ | $R^{D124}$ | $L_{C316}$ | $R^{D9}$ | $R^{D118}$ | $L_{C508}$ | $R^{D116}$ | $R^{D3}$ | $L_{C700}$ | $R^{D146}$ | $R^{D133}$ |
| $L_{C125}$ | $R^{D125}$ | $R^{D125}$ | $L_{C317}$ | $R^{D9}$ | $R^{D119}$ | $L_{C509}$ | $R^{D116}$ | $R^{D5}$ | $L_{C701}$ | $R^{D146}$ | $R^{D134}$ |
| $L_{C126}$ | $R^{D126}$ | $R^{D126}$ | $L_{C318}$ | $R^{D9}$ | $R^{D120}$ | $L_{C510}$ | $R^{D116}$ | $R^{D17}$ | $L_{C702}$ | $R^{D146}$ | $R^{D135}$ |
| $L_{C127}$ | $R^{D127}$ | $R^{D127}$ | $L_{C319}$ | $R^{D9}$ | $R^{D133}$ | $L_{C511}$ | $R^{D116}$ | $R^{D18}$ | $L_{C703}$ | $R^{D146}$ | $R^{D136}$ |
| $L_{C128}$ | $R^{D128}$ | $R^{D128}$ | $L_{C320}$ | $R^{D9}$ | $R^{D134}$ | $L_{C512}$ | $R^{D116}$ | $R^{D20}$ | $L_{C704}$ | $R^{D146}$ | $R^{D146}$ |
| $L_{C129}$ | $R^{D129}$ | $R^{D129}$ | $L_{C321}$ | $R^{D9}$ | $R^{D135}$ | $L_{C513}$ | $R^{D116}$ | $R^{D22}$ | $L_{C705}$ | $R^{D146}$ | $R^{D147}$ |
| $L_{C130}$ | $R^{D130}$ | $R^{D130}$ | $L_{C322}$ | $R^{D9}$ | $R^{D136}$ | $L_{C514}$ | $R^{D116}$ | $R^{D37}$ | $L_{C706}$ | $R^{D146}$ | $R^{D149}$ |
| $L_{C131}$ | $R^{D131}$ | $R^{D131}$ | $L_{C323}$ | $R^{D9}$ | $R^{D143}$ | $L_{C515}$ | $R^{D116}$ | $R^{D40}$ | $L_{C707}$ | $R^{D146}$ | $R^{D151}$ |
| $L_{C132}$ | $R^{D132}$ | $R^{D132}$ | $L_{C324}$ | $R^{D9}$ | $R^{D144}$ | $L_{C516}$ | $R^{D116}$ | $R^{D41}$ | $L_{C708}$ | $R^{D146}$ | $R^{D154}$ |
| $L_{C133}$ | $R^{D133}$ | $R^{D133}$ | $L_{C325}$ | $R^{D9}$ | $R^{D145}$ | $L_{C517}$ | $R^{D116}$ | $R^{D42}$ | $L_{C709}$ | $R^{D146}$ | $R^{D155}$ |
| $L_{C134}$ | $R^{D134}$ | $R^{D134}$ | $L_{C326}$ | $R^{D9}$ | $R^{D146}$ | $L_{C518}$ | $R^{D116}$ | $R^{D43}$ | $L_{C710}$ | $R^{D146}$ | $R^{D161}$ |
| $L_{C135}$ | $R^{D135}$ | $R^{D135}$ | $L_{C327}$ | $R^{D9}$ | $R^{D147}$ | $L_{C519}$ | $R^{D116}$ | $R^{D48}$ | $L_{C711}$ | $R^{D146}$ | $R^{D175}$ |
| $L_{C136}$ | $R^{D136}$ | $R^{D136}$ | $L_{C328}$ | $R^{D9}$ | $R^{D149}$ | $L_{C520}$ | $R^{D116}$ | $R^{D49}$ | $L_{C712}$ | $R^{D133}$ | $R^{D3}$ |
| $L_{C137}$ | $R^{D137}$ | $R^{D137}$ | $L_{C329}$ | $R^{D9}$ | $R^{D151}$ | $L_{C521}$ | $R^{D116}$ | $R^{D54}$ | $L_{C713}$ | $R^{D133}$ | $R^{D5}$ |
| $L_{C138}$ | $R^{D138}$ | $R^{D138}$ | $L_{C330}$ | $R^{D9}$ | $R^{D154}$ | $L_{C522}$ | $R^{D116}$ | $R^{D58}$ | $L_{C714}$ | $R^{D133}$ | $R^{D3}$ |
| $L_{C139}$ | $R^{D139}$ | $R^{D139}$ | $L_{C331}$ | $R^{D9}$ | $R^{D155}$ | $L_{C523}$ | $R^{D116}$ | $R^{D59}$ | $L_{C715}$ | $R^{D133}$ | $R^{D18}$ |
| $L_{C140}$ | $R^{D140}$ | $R^{D140}$ | $L_{C332}$ | $R^{D9}$ | $R^{D161}$ | $L_{C524}$ | $R^{D116}$ | $R^{D78}$ | $L_{C716}$ | $R^{D133}$ | $R^{D20}$ |
| $L_{C141}$ | $R^{D141}$ | $R^{D141}$ | $L_{C333}$ | $R^{D9}$ | $R^{D175}$ | $L_{C525}$ | $R^{D116}$ | $R^{D79}$ | $L_{C717}$ | $R^{D133}$ | $R^{D20}$ |
| $L_{C142}$ | $R^{D142}$ | $R^{D142}$ | $L_{C334}$ | $R^{D10}$ | $R^{D3}$ | $L_{C526}$ | $R^{D116}$ | $R^{D81}$ | $L_{C718}$ | $R^{D133}$ | $R^{D37}$ |
| $L_{C143}$ | $R^{D143}$ | $R^{D143}$ | $L_{C335}$ | $R^{D10}$ | $R^{D5}$ | $L_{C527}$ | $R^{D116}$ | $R^{D87}$ | $L_{C719}$ | $R^{D133}$ | $R^{D40}$ |
| $L_{C144}$ | $R^{D144}$ | $R^{D144}$ | $L_{C336}$ | $R^{D10}$ | $R^{D17}$ | $L_{C528}$ | $R^{D116}$ | $R^{D88}$ | $L_{C720}$ | $R^{D133}$ | $R^{D41}$ |
| $L_{C145}$ | $R^{D145}$ | $R^{D145}$ | $L_{C337}$ | $R^{D10}$ | $R^{D18}$ | $L_{C529}$ | $R^{D116}$ | $R^{D89}$ | $L_{C721}$ | $R^{D133}$ | $R^{D42}$ |
| $L_{C146}$ | $R^{D146}$ | $R^{D146}$ | $L_{C338}$ | $R^{D10}$ | $R^{D20}$ | $L_{C530}$ | $R^{D116}$ | $R^{D93}$ | $L_{C722}$ | $R^{D133}$ | $R^{D43}$ |
| $L_{C147}$ | $R^{D147}$ | $R^{D147}$ | $L_{C339}$ | $R^{D10}$ | $R^{D22}$ | $L_{C531}$ | $R^{D116}$ | $R^{D117}$ | $L_{C723}$ | $R^{D133}$ | $R^{D48}$ |
| $L_{C148}$ | $R^{D148}$ | $R^{D148}$ | $L_{C340}$ | $R^{D10}$ | $R^{D37}$ | $L_{C532}$ | $R^{D116}$ | $R^{D118}$ | $L_{C724}$ | $R^{D133}$ | $R^{D49}$ |
| $L_{C149}$ | $R^{D149}$ | $R^{D149}$ | $L_{C341}$ | $R^{D10}$ | $R^{D40}$ | $L_{C533}$ | $R^{D116}$ | $R^{D119}$ | $L_{C725}$ | $R^{D133}$ | $R^{D54}$ |
| $L_{C150}$ | $R^{D150}$ | $R^{D150}$ | $L_{C342}$ | $R^{D10}$ | $R^{D41}$ | $L_{C534}$ | $R^{D116}$ | $R^{D120}$ | $L_{C726}$ | $R^{D133}$ | $R^{D58}$ |
| $L_{C151}$ | $R^{D151}$ | $R^{D151}$ | $L_{C343}$ | $R^{D10}$ | $R^{D42}$ | $L_{C535}$ | $R^{D116}$ | $R^{D133}$ | $L_{C727}$ | $R^{D133}$ | $R^{D59}$ |
| $L_{C152}$ | $R^{D152}$ | $R^{D152}$ | $L_{C344}$ | $R^{D10}$ | $R^{D43}$ | $L_{C536}$ | $R^{D116}$ | $R^{D134}$ | $L_{C728}$ | $R^{D133}$ | $R^{D78}$ |
| $L_{C153}$ | $R^{D153}$ | $R^{D153}$ | $L_{C345}$ | $R^{D10}$ | $R^{D48}$ | $L_{C537}$ | $R^{D116}$ | $R^{D135}$ | $L_{C729}$ | $R^{D133}$ | $R^{D79}$ |
| $L_{C154}$ | $R^{D154}$ | $R^{D154}$ | $L_{C346}$ | $R^{D10}$ | $R^{D49}$ | $L_{C538}$ | $R^{D116}$ | $R^{D136}$ | $L_{C730}$ | $R^{D133}$ | $R^{D81}$ |
| $L_{C155}$ | $R^{D155}$ | $R^{D155}$ | $L_{C347}$ | $R^{D10}$ | $R^{D50}$ | $L_{C539}$ | $R^{D116}$ | $R^{D143}$ | $L_{C731}$ | $R^{D133}$ | $R^{D87}$ |
| $L_{C156}$ | $R^{D156}$ | $R^{D156}$ | $L_{C348}$ | $R^{D10}$ | $R^{D54}$ | $L_{C540}$ | $R^{D116}$ | $R^{D144}$ | $L_{C732}$ | $R^{D133}$ | $R^{D88}$ |
| $L_{C157}$ | $R^{D157}$ | $R^{D157}$ | $L_{C349}$ | $R^{D10}$ | $R^{D55}$ | $L_{C541}$ | $R^{D116}$ | $R^{D145}$ | $L_{C733}$ | $R^{D133}$ | $R^{D89}$ |
| $L_{C158}$ | $R^{D158}$ | $R^{D158}$ | $L_{C350}$ | $R^{D10}$ | $R^{D58}$ | $L_{C542}$ | $R^{D116}$ | $R^{D146}$ | $L_{C734}$ | $R^{D133}$ | $R^{D93}$ |
| $L_{C159}$ | $R^{D159}$ | $R^{D159}$ | $L_{C351}$ | $R^{D10}$ | $R^{D59}$ | $L_{C543}$ | $R^{D116}$ | $R^{D147}$ | $L_{C735}$ | $R^{D133}$ | $R^{D117}$ |
| $L_{C160}$ | $R^{D160}$ | $R^{D160}$ | $L_{C352}$ | $R^{D10}$ | $R^{D78}$ | $L_{C544}$ | $R^{D116}$ | $R^{D149}$ | $L_{C736}$ | $R^{D133}$ | $R^{D118}$ |
| $L_{C161}$ | $R^{D161}$ | $R^{D161}$ | $L_{C353}$ | $R^{D10}$ | $R^{D79}$ | $L_{C545}$ | $R^{D116}$ | $R^{D151}$ | $L_{C737}$ | $R^{D133}$ | $R^{D119}$ |
| $L_{C162}$ | $R^{D162}$ | $R^{D162}$ | $L_{C354}$ | $R^{D10}$ | $R^{D81}$ | $L_{C546}$ | $R^{D116}$ | $R^{D154}$ | $L_{C738}$ | $R^{D133}$ | $R^{D120}$ |
| $L_{C163}$ | $R^{D163}$ | $R^{D163}$ | $L_{C355}$ | $R^{D10}$ | $R^{D87}$ | $L_{C547}$ | $R^{D116}$ | $R^{D155}$ | $L_{C739}$ | $R^{D133}$ | $R^{D133}$ |
| $L_{C164}$ | $R^{D164}$ | $R^{D164}$ | $L_{C356}$ | $R^{D10}$ | $R^{D88}$ | $L_{C548}$ | $R^{D116}$ | $R^{D161}$ | $L_{C740}$ | $R^{D133}$ | $R^{D134}$ |
| $L_{C165}$ | $R^{D165}$ | $R^{D165}$ | $L_{C357}$ | $R^{D10}$ | $R^{D89}$ | $L_{C549}$ | $R^{D116}$ | $R^{D175}$ | $L_{C741}$ | $R^{D133}$ | $R^{D135}$ |
| $L_{C166}$ | $R^{D166}$ | $R^{D166}$ | $L_{C358}$ | $R^{D10}$ | $R^{D93}$ | $L_{C550}$ | $R^{D143}$ | $R^{D3}$ | $L_{C742}$ | $R^{D133}$ | $R^{D136}$ |
| $L_{C167}$ | $R^{D167}$ | $R^{D167}$ | $L_{C359}$ | $R^{D10}$ | $R^{D116}$ | $L_{C551}$ | $R^{D143}$ | $R^{D5}$ | $L_{C743}$ | $R^{D133}$ | $R^{D146}$ |
| $L_{C168}$ | $R^{D168}$ | $R^{D168}$ | $L_{C360}$ | $R^{D10}$ | $R^{D117}$ | $L_{C552}$ | $R^{D143}$ | $R^{D17}$ | $L_{C744}$ | $R^{D133}$ | $R^{D147}$ |
| $L_{C169}$ | $R^{D169}$ | $R^{D169}$ | $L_{C361}$ | $R^{D10}$ | $R^{D118}$ | $L_{C553}$ | $R^{D143}$ | $R^{D18}$ | $L_{C745}$ | $R^{D133}$ | $R^{D149}$ |
| $L_{C170}$ | $R^{D170}$ | $R^{D170}$ | $L_{C362}$ | $R^{D10}$ | $R^{D119}$ | $L_{C554}$ | $R^{D143}$ | $R^{D20}$ | $L_{C746}$ | $R^{D133}$ | $R^{D151}$ |
| $L_{C171}$ | $R^{D171}$ | $R^{D171}$ | $L_{C363}$ | $R^{D10}$ | $R^{D120}$ | $L_{C555}$ | $R^{D143}$ | $R^{D22}$ | $L_{C747}$ | $R^{D133}$ | $R^{D154}$ |
| $L_{C172}$ | $R^{D172}$ | $R^{D172}$ | $L_{C364}$ | $R^{D10}$ | $R^{D133}$ | $L_{C556}$ | $R^{D143}$ | $R^{D37}$ | $L_{C748}$ | $R^{D133}$ | $R^{D155}$ |
| $L_{C173}$ | $R^{D173}$ | $R^{D173}$ | $L_{C365}$ | $R^{D10}$ | $R^{D134}$ | $L_{C557}$ | $R^{D143}$ | $R^{D40}$ | $L_{C749}$ | $R^{D133}$ | $R^{D161}$ |
| $L_{C174}$ | $R^{D174}$ | $R^{D174}$ | $L_{C366}$ | $R^{D10}$ | $R^{D135}$ | $L_{C558}$ | $R^{D143}$ | $R^{D41}$ | $L_{C750}$ | $R^{D133}$ | $R^{D175}$ |
| $L_{C175}$ | $R^{D175}$ | $R^{D175}$ | $L_{C367}$ | $R^{D10}$ | $R^{D136}$ | $L_{C559}$ | $R^{D143}$ | $R^{D42}$ | $L_{C751}$ | $R^{D175}$ | $R^{D3}$ |
| $L_{C176}$ | $R^{D176}$ | $R^{D176}$ | $L_{C368}$ | $R^{D10}$ | $R^{D143}$ | $L_{C560}$ | $R^{D143}$ | $R^{D43}$ | $L_{C752}$ | $R^{D175}$ | $R^{D5}$ |
| $L_{C177}$ | $R^{D177}$ | $R^{D177}$ | $L_{C369}$ | $R^{D10}$ | $R^{D144}$ | $L_{C561}$ | $R^{D143}$ | $R^{D48}$ | $L_{C753}$ | $R^{D175}$ | $R^{D18}$ |
| $L_{C178}$ | $R^{D178}$ | $R^{D178}$ | $L_{C370}$ | $R^{D10}$ | $R^{D145}$ | $L_{C562}$ | $R^{D143}$ | $R^{D49}$ | $L_{C754}$ | $R^{D175}$ | $R^{D20}$ |
| $L_{C179}$ | $R^{D179}$ | $R^{D179}$ | $L_{C371}$ | $R^{D10}$ | $R^{D146}$ | $L_{C563}$ | $R^{D143}$ | $R^{D54}$ | $L_{C755}$ | $R^{D175}$ | $R^{D22}$ |
| $L_{C180}$ | $R^{D180}$ | $R^{D180}$ | $L_{C372}$ | $R^{D10}$ | $R^{D147}$ | $L_{C564}$ | $R^{D143}$ | $R^{D58}$ | $L_{C756}$ | $R^{D175}$ | $R^{D37}$ |
| $L_{C181}$ | $R^{D181}$ | $R^{D181}$ | $L_{C373}$ | $R^{D10}$ | $R^{D149}$ | $L_{C565}$ | $R^{D143}$ | $R^{D59}$ | $L_{C757}$ | $R^{D175}$ | $R^{D40}$ |
| $L_{C182}$ | $R^{D182}$ | $R^{D182}$ | $L_{C374}$ | $R^{D10}$ | $R^{D151}$ | $L_{C566}$ | $R^{D143}$ | $R^{D78}$ | $L_{C758}$ | $R^{D175}$ | $R^{D41}$ |
| $L_{C183}$ | $R^{D183}$ | $R^{D183}$ | $L_{C375}$ | $R^{D10}$ | $R^{D154}$ | $L_{C567}$ | $R^{D143}$ | $R^{D79}$ | $L_{C759}$ | $R^{D175}$ | $R^{D42}$ |
| $L_{C184}$ | $R^{D184}$ | $R^{D184}$ | $L_{C376}$ | $R^{D10}$ | $R^{D155}$ | $L_{C568}$ | $R^{D143}$ | $R^{D81}$ | $L_{C760}$ | $R^{D175}$ | $R^{D43}$ |
| $L_{C185}$ | $R^{D185}$ | $R^{D185}$ | $L_{C377}$ | $R^{D10}$ | $R^{D161}$ | $L_{C569}$ | $R^{D143}$ | $R^{D87}$ | $L_{C761}$ | $R^{D175}$ | $R^{D48}$ |
| $L_{C186}$ | $R^{D186}$ | $R^{D186}$ | $L_{C378}$ | $R^{D10}$ | $R^{D175}$ | $L_{C570}$ | $R^{D143}$ | $R^{D88}$ | $L_{C762}$ | $R^{D175}$ | $R^{D49}$ |
| $L_{C187}$ | $R^{D187}$ | $R^{D187}$ | $L_{C379}$ | $R^{D17}$ | $R^{D3}$ | $L_{C571}$ | $R^{D143}$ | $R^{D89}$ | $L_{C763}$ | $R^{D175}$ | $RD^{54}$ |
| $L_{C188}$ | $R^{D188}$ | $R^{D188}$ | $L_{C380}$ | $R^{D17}$ | $R^{D5}$ | $L_{C572}$ | $R^{D143}$ | $R^{D93}$ | $L_{C764}$ | $R^{D175}$ | $R^{D58}$ |
| $L_{C189}$ | $R^{D189}$ | $R^{D189}$ | $L_{C381}$ | $R^{D17}$ | $R^{D18}$ | $L_{C573}$ | $R^{D143}$ | $R^{D116}$ | $L_{C765}$ | $R^{D175}$ | $R^{D59}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C190}$ | $R^{D190}$ | $R^{D190}$ | $L_{C382}$ | $R^{D17}$ | $R^{D20}$ | $L_{C574}$ | $R^{D143}$ | $R^{D117}$ | $L_{C766}$ | $R^{D175}$ | $R^{D78}$ |
| $L_{C191}$ | $R^{D191}$ | $R^{D191}$ | $L_{C383}$ | $R^{D17}$ | $R^{D22}$ | $L_{C575}$ | $R^{D143}$ | $R^{D118}$ | $L_{C767}$ | $R^{D175}$ | $R^{D79}$ |
| $L_{C192}$ | $R^{D192}$ | $R^{D192}$ | $L_{C384}$ | $R^{D17}$ | $R^{D37}$ | $L_{C576}$ | $R^{D143}$ | $R^{D119}$ | $L_{C768}$ | $R^{D175}$ | $R^{D81}$ |
| $L_{C769}$ | $R^{D193}$ | $R^{D193}$ | $L_{C877}$ | $R^{D1}$ | $R^{D193}$ | $L_{C985}$ | $R^{D4}$ | $R^{D193}$ | $L_{C1093}$ | $R^{D9}$ | $R^{D193}$ |
| $L_{C770}$ | $R^{D194}$ | $R^{D194}$ | $L_{C878}$ | $R^{D1}$ | $R^{D194}$ | $L_{C986}$ | $R^{D4}$ | $R^{D194}$ | $L_{C1094}$ | $R^{D9}$ | $R^{D194}$ |
| $L_{C771}$ | $R^{D195}$ | $R^{D195}$ | $L_{C879}$ | $R^{D1}$ | $R^{D195}$ | $L_{C987}$ | $R^{D4}$ | $R^{D195}$ | $L_{C1095}$ | $R^{D9}$ | $R^{D195}$ |
| $L_{C772}$ | $R^{D196}$ | $R^{D196}$ | $L_{C880}$ | $R^{D1}$ | $R^{D196}$ | $L_{C988}$ | $R^{D4}$ | $R^{D196}$ | $L_{C1096}$ | $R^{D9}$ | $R^{D196}$ |
| $L_{C773}$ | $R^{D197}$ | $R^{D197}$ | $L_{C881}$ | $R^{D1}$ | $R^{D197}$ | $L_{C989}$ | $R^{D4}$ | $R^{D197}$ | $L_{C1097}$ | $R^{D9}$ | $R^{D197}$ |
| $L_{C774}$ | $R^{D198}$ | $R^{D198}$ | $L_{C882}$ | $R^{D1}$ | $R^{D198}$ | $L_{C990}$ | $R^{D4}$ | $R^{D198}$ | $L_{C1098}$ | $R^{D9}$ | $R^{D198}$ |
| $L_{C775}$ | $R^{D199}$ | $R^{D199}$ | $L_{C883}$ | $R^{D1}$ | $R^{D199}$ | $L_{C991}$ | $R^{D4}$ | $R^{D199}$ | $L_{C1099}$ | $R^{D9}$ | $R^{D199}$ |
| $L_{C776}$ | $R^{D200}$ | $R^{D200}$ | $L_{C884}$ | $R^{D1}$ | $R^{D200}$ | $L_{C992}$ | $R^{D4}$ | $R^{D200}$ | $L_{C1100}$ | $R^{D9}$ | $R^{D200}$ |
| $L_{C777}$ | $R^{D201}$ | $R^{D201}$ | $L_{C885}$ | $R^{D1}$ | $R^{D201}$ | $L_{C993}$ | $R^{D4}$ | $R^{D201}$ | $L_{C1101}$ | $R^{D9}$ | $R^{D201}$ |
| $L_{C778}$ | $R^{D202}$ | $R^{D202}$ | $L_{C886}$ | $R^{D1}$ | $R^{D202}$ | $L_{C994}$ | $R^{D4}$ | $R^{D202}$ | $L_{C1102}$ | $R^{D9}$ | $R^{D202}$ |
| $L_{C779}$ | $R^{D203}$ | $R^{D203}$ | $L_{C887}$ | $R^{D1}$ | $R^{D203}$ | $L_{C995}$ | $R^{D4}$ | $R^{D203}$ | $L_{C1103}$ | $R^{D9}$ | $R^{D203}$ |
| $L_{C780}$ | $R^{D204}$ | $R^{D204}$ | $L_{C888}$ | $R^{D1}$ | $R^{D204}$ | $L_{C996}$ | $R^{D4}$ | $R^{D204}$ | $L_{C1104}$ | $R^{D9}$ | $R^{D204}$ |
| $L_{C781}$ | $R^{D205}$ | $R^{D205}$ | $L_{C889}$ | $R^{D1}$ | $R^{D205}$ | $L_{C997}$ | $R^{D4}$ | $R^{D205}$ | $L_{C1105}$ | $R^{D9}$ | $R^{D205}$ |
| $L_{C782}$ | $R^{D206}$ | $R^{D206}$ | $L_{C890}$ | $R^{D1}$ | $R^{D206}$ | $L_{C998}$ | $R^{D4}$ | $R^{D206}$ | $L_{C1106}$ | $R^{D9}$ | $R^{D206}$ |
| $L_{C783}$ | $R^{D207}$ | $R^{D207}$ | $L_{C891}$ | $R^{D1}$ | $R^{D207}$ | $L_{C999}$ | $R^{D4}$ | $R^{D207}$ | $L_{C1107}$ | $R^{D9}$ | $R^{D207}$ |
| $L_{C784}$ | $R^{D208}$ | $R^{D208}$ | $L_{C892}$ | $R^{D1}$ | $R^{D208}$ | $L_{C1000}$ | $R^{D4}$ | $R^{D208}$ | $L_{C1108}$ | $R^{D9}$ | $R^{D208}$ |
| $L_{C785}$ | $R^{D209}$ | $R^{D209}$ | $L_{C893}$ | $R^{D1}$ | $R^{D209}$ | $L_{C1001}$ | $R^{D4}$ | $R^{D209}$ | $L_{C1109}$ | $R^{D9}$ | $R^{D209}$ |
| $L_{C786}$ | $R^{D210}$ | $R^{D210}$ | $L_{C894}$ | $R^{D1}$ | $R^{D210}$ | $L_{C1002}$ | $R^{D4}$ | $R^{D210}$ | $L_{C1110}$ | $R^{D9}$ | $R^{D210}$ |
| $L_{C787}$ | $R^{D211}$ | $R^{D211}$ | $L_{C895}$ | $R^{D1}$ | $R^{D211}$ | $L_{C1003}$ | $R^{D4}$ | $R^{D211}$ | $L_{C1111}$ | $R^{D9}$ | $R^{D211}$ |
| $L_{C788}$ | $R^{D212}$ | $R^{D212}$ | $L_{C896}$ | $R^{D1}$ | $R^{D212}$ | $L_{C1004}$ | $R^{D4}$ | $R^{D212}$ | $L_{C1112}$ | $R^{D9}$ | $R^{D212}$ |
| $L_{C789}$ | $R^{D213}$ | $R^{D213}$ | $L_{C897}$ | $R^{D1}$ | $R^{D213}$ | $L_{C1005}$ | $R^{D4}$ | $R^{D213}$ | $L_{C1113}$ | $R^{D9}$ | $R^{D213}$ |
| $L_{C790}$ | $R^{D214}$ | $R^{D214}$ | $L_{C898}$ | $R^{D1}$ | $R^{D214}$ | $L_{C1006}$ | $R^{D4}$ | $R^{D214}$ | $L_{C1114}$ | $R^{D9}$ | $R^{D214}$ |
| $L_{C791}$ | $R^{D215}$ | $R^{D215}$ | $L_{C899}$ | $R^{D1}$ | $R^{D215}$ | $L_{C1007}$ | $R^{D4}$ | $R^{D215}$ | $L_{C1115}$ | $R^{D9}$ | $R^{D215}$ |
| $L_{C792}$ | $R^{D216}$ | $R^{D216}$ | $L_{C900}$ | $R^{D1}$ | $R^{D216}$ | $L_{C1008}$ | $R^{D4}$ | $R^{D216}$ | $L_{C1116}$ | $R^{D9}$ | $R^{D216}$ |
| $L_{C793}$ | $R^{D217}$ | $R^{D217}$ | $L_{C901}$ | $R^{D1}$ | $R^{D217}$ | $L_{C1009}$ | $R^{D4}$ | $R^{D217}$ | $L_{C1117}$ | $R^{D9}$ | $R^{D217}$ |
| $L_{C794}$ | $R^{D218}$ | $R^{D218}$ | $L_{C902}$ | $R^{D1}$ | $R^{D218}$ | $L_{C1010}$ | $R^{D4}$ | $R^{D218}$ | $L_{C1118}$ | $R^{D9}$ | $R^{D218}$ |
| $L_{C795}$ | $R^{D219}$ | $R^{D219}$ | $L_{C903}$ | $R^{D1}$ | $R^{D219}$ | $L_{C1011}$ | $R^{D4}$ | $R^{D219}$ | $L_{C1119}$ | $R^{D9}$ | $R^{D219}$ |
| $L_{C796}$ | $R^{D220}$ | $R^{D220}$ | $L_{C904}$ | $R^{D1}$ | $R^{D220}$ | $L_{C1012}$ | $R^{D4}$ | $R^{D220}$ | $L_{C1120}$ | $R^{D9}$ | $R^{D220}$ |
| $L_{C797}$ | $R^{D221}$ | $R^{D221}$ | $L_{C905}$ | $R^{D1}$ | $R^{D221}$ | $L_{C1013}$ | $R^{D4}$ | $R^{D221}$ | $L_{C1121}$ | $R^{D9}$ | $R^{D221}$ |
| $L_{C798}$ | $R^{D222}$ | $R^{D222}$ | $L_{C906}$ | $R^{D1}$ | $R^{D222}$ | $L_{C1014}$ | $R^{D4}$ | $R^{D222}$ | $L_{C1122}$ | $R^{D9}$ | $R^{D222}$ |
| $L_{C799}$ | $R^{D223}$ | $R^{D223}$ | $L_{C907}$ | $R^{D1}$ | $R^{D223}$ | $L_{C1015}$ | $R^{D4}$ | $R^{D223}$ | $L_{C1123}$ | $R^{D9}$ | $R^{D223}$ |
| $L_{C800}$ | $R^{D224}$ | $R^{D224}$ | $L_{C908}$ | $R^{D1}$ | $R^{D224}$ | $L_{C1016}$ | $R^{D4}$ | $R^{D224}$ | $L_{C1124}$ | $R^{D9}$ | $R^{D224}$ |
| $L_{C801}$ | $R^{D225}$ | $R^{D225}$ | $L_{C909}$ | $R^{D1}$ | $R^{D225}$ | $L_{C1017}$ | $R^{D4}$ | $R^{D225}$ | $L_{C1125}$ | $R^{D9}$ | $R^{D225}$ |
| $L_{C802}$ | $R^{D226}$ | $R^{D226}$ | $L_{C910}$ | $R^{D1}$ | $R^{D226}$ | $L_{C1018}$ | $R^{D4}$ | $R^{D226}$ | $L_{C1126}$ | $R^{D9}$ | $R^{D226}$ |
| $L_{C803}$ | $R^{D227}$ | $R^{D227}$ | $L_{C911}$ | $R^{D1}$ | $R^{D227}$ | $L_{C1019}$ | $R^{D4}$ | $R^{D227}$ | $L_{C1127}$ | $R^{D9}$ | $R^{D227}$ |
| $L_{C804}$ | $R^{D228}$ | $R^{D228}$ | $L_{C912}$ | $R^{D1}$ | $R^{D228}$ | $L_{C1020}$ | $R^{D4}$ | $R^{D228}$ | $L_{C1128}$ | $R^{D9}$ | $R^{D228}$ |
| $L_{C805}$ | $R^{D229}$ | $R^{D229}$ | $L_{C913}$ | $R^{D1}$ | $R^{D229}$ | $L_{C1021}$ | $R^{D4}$ | $R^{D229}$ | $L_{C1129}$ | $R^{D9}$ | $R^{D229}$ |
| $L_{C806}$ | $R^{D230}$ | $R^{D230}$ | $L_{C914}$ | $R^{D1}$ | $R^{D230}$ | $L_{C1022}$ | $R^{D4}$ | $R^{D230}$ | $L_{C1130}$ | $R^{D9}$ | $R^{D230}$ |
| $L_{C807}$ | $R^{D231}$ | $R^{D231}$ | $L_{C915}$ | $R^{D1}$ | $R^{D231}$ | $L_{C1023}$ | $R^{D4}$ | $R^{D231}$ | $L_{C1131}$ | $R^{D9}$ | $R^{D231}$ |
| $L_{C808}$ | $R^{D232}$ | $R^{D232}$ | $L_{C916}$ | $R^{D1}$ | $R^{D232}$ | $L_{C1024}$ | $R^{D4}$ | $R^{D232}$ | $L_{C1132}$ | $R^{D9}$ | $R^{D232}$ |
| $L_{C809}$ | $R^{D233}$ | $R^{D233}$ | $L_{C917}$ | $R^{D1}$ | $R^{D233}$ | $L_{C1025}$ | $R^{D4}$ | $R^{D233}$ | $L_{C1133}$ | $R^{D9}$ | $R^{D233}$ |
| $L_{C810}$ | $R^{D234}$ | $R^{D234}$ | $L_{C918}$ | $R^{D1}$ | $R^{D234}$ | $L_{C1026}$ | $R^{D4}$ | $R^{D234}$ | $L_{C1134}$ | $R^{D9}$ | $R^{D234}$ |
| $L_{C811}$ | $R^{D235}$ | $R^{D235}$ | $L_{C919}$ | $R^{D1}$ | $R^{D235}$ | $L_{C1027}$ | $R^{D4}$ | $R^{D235}$ | $L_{C1135}$ | $R^{D9}$ | $R^{D235}$ |
| $L_{C812}$ | $R^{D236}$ | $R^{D236}$ | $L_{C920}$ | $R^{D1}$ | $R^{D236}$ | $L_{C1028}$ | $R^{D4}$ | $R^{D236}$ | $L_{C1136}$ | $R^{D9}$ | $R^{D236}$ |
| $L_{C813}$ | $R^{D237}$ | $R^{D237}$ | $L_{C921}$ | $R^{D1}$ | $R^{D237}$ | $L_{C1029}$ | $R^{D4}$ | $R^{D237}$ | $L_{C1137}$ | $R^{D9}$ | $R^{D237}$ |
| $L_{C814}$ | $R^{D238}$ | $R^{D238}$ | $L_{C922}$ | $R^{D1}$ | $R^{D238}$ | $L_{C1030}$ | $R^{D4}$ | $R^{D238}$ | $L_{C1138}$ | $R^{D9}$ | $R^{D238}$ |
| $L_{C815}$ | $R^{D239}$ | $R^{D239}$ | $L_{C923}$ | $R^{D1}$ | $R^{D239}$ | $L_{C1031}$ | $R^{D4}$ | $R^{D239}$ | $L_{C1139}$ | $R^{D9}$ | $R^{D239}$ |
| $L_{C816}$ | $R^{D240}$ | $R^{D240}$ | $L_{C924}$ | $R^{D1}$ | $R^{D240}$ | $L_{C1032}$ | $R^{D4}$ | $R^{D240}$ | $L_{C1140}$ | $R^{D9}$ | $R^{D240}$ |
| $L_{C817}$ | $R^{D241}$ | $R^{D241}$ | $L_{C925}$ | $R^{D1}$ | $R^{D241}$ | $L_{C1033}$ | $R^{D4}$ | $R^{D241}$ | $L_{C1141}$ | $R^{D9}$ | $R^{D241}$ |
| $L_{C818}$ | $R^{D242}$ | $R^{D242}$ | $L_{C926}$ | $R^{D1}$ | $R^{D242}$ | $L_{C1034}$ | $R^{D4}$ | $R^{D242}$ | $L_{C1142}$ | $R^{D9}$ | $R^{D242}$ |
| $L_{C819}$ | $R^{D243}$ | $R^{D243}$ | $L_{C927}$ | $R^{D1}$ | $R^{D243}$ | $L_{C1035}$ | $R^{D4}$ | $R^{D243}$ | $L_{C1143}$ | $R^{D9}$ | $R^{D243}$ |
| $L_{C820}$ | $R^{D244}$ | $R^{D244}$ | $L_{C928}$ | $R^{D1}$ | $R^{D244}$ | $L_{C1036}$ | $R^{D4}$ | $R^{D244}$ | $L_{C1144}$ | $R^{D9}$ | $R^{D244}$ |
| $L_{C821}$ | $R^{D245}$ | $R^{D245}$ | $L_{C929}$ | $R^{D1}$ | $R^{D245}$ | $L_{C1037}$ | $R^{D4}$ | $R^{D245}$ | $L_{C1145}$ | $R^{D9}$ | $R^{D245}$ |
| $L_{C822}$ | $R^{D246}$ | $R^{D246}$ | $L_{C930}$ | $R^{D1}$ | $R^{D246}$ | $L_{C1038}$ | $R^{D4}$ | $R^{D246}$ | $L_{C1146}$ | $R^{D9}$ | $R^{D246}$ |
| $L_{C823}$ | $R^{D17}$ | $R^{D193}$ | $L_{C931}$ | $R^{D50}$ | $R^{D193}$ | $L_{C1039}$ | $R^{D145}$ | $R^{D193}$ | $L_{C1147}$ | $R^{D168}$ | $R^{D193}$ |
| $L_{C824}$ | $R^{D17}$ | $R^{D194}$ | $L_{C932}$ | $R^{D50}$ | $R^{D194}$ | $L_{C1040}$ | $R^{D145}$ | $R^{D194}$ | $L_{C1148}$ | $R^{D168}$ | $R^{D194}$ |
| $L_{C825}$ | $R^{D17}$ | $R^{D195}$ | $L_{C933}$ | $R^{D50}$ | $R^{D195}$ | $L_{C1041}$ | $R^{D145}$ | $R^{D195}$ | $L_{C1149}$ | $R^{D168}$ | $R^{D195}$ |
| $L_{C826}$ | $R^{D17}$ | $R^{D196}$ | $L_{C934}$ | $R^{D50}$ | $R^{D196}$ | $L_{C1042}$ | $R^{D145}$ | $R^{D196}$ | $L_{C1150}$ | $R^{D168}$ | $R^{D196}$ |
| $L_{C827}$ | $R^{D17}$ | $R^{D197}$ | $L_{C935}$ | $R^{D50}$ | $R^{D197}$ | $L_{C1043}$ | $R^{D145}$ | $R^{D197}$ | $L_{C1151}$ | $R^{D168}$ | $R^{D197}$ |
| $L_{C828}$ | $R^{D17}$ | $R^{D198}$ | $L_{C936}$ | $R^{D50}$ | $R^{D198}$ | $L_{C1044}$ | $R^{D145}$ | $R^{D198}$ | $L_{C1152}$ | $R^{D168}$ | $R^{D198}$ |
| $L_{C829}$ | $R^{D17}$ | $R^{D199}$ | $L_{C937}$ | $R^{D50}$ | $R^{D199}$ | $L_{C1045}$ | $R^{D145}$ | $R^{D199}$ | $L_{C1153}$ | $R^{D168}$ | $R^{D199}$ |
| $L_{C830}$ | $R^{D17}$ | $R^{D200}$ | $L_{C938}$ | $R^{D50}$ | $R^{D200}$ | $L_{C1046}$ | $R^{D145}$ | $R^{D200}$ | $L_{C1154}$ | $R^{D168}$ | $R^{D200}$ |
| $L_{C831}$ | $R^{D17}$ | $R^{D201}$ | $L_{C939}$ | $R^{D50}$ | $R^{D201}$ | $L_{C1047}$ | $R^{D145}$ | $R^{D201}$ | $L_{C1155}$ | $R^{D168}$ | $R^{D201}$ |
| $L_{C832}$ | $R^{D17}$ | $R^{D202}$ | $L_{C940}$ | $R^{D50}$ | $R^{D202}$ | $L_{C1048}$ | $R^{D145}$ | $R^{D202}$ | $L_{C1156}$ | $R^{D168}$ | $R^{D202}$ |
| $L_{C833}$ | $R^{D17}$ | $R^{D203}$ | $L_{C941}$ | $R^{D50}$ | $R^{D203}$ | $L_{C1049}$ | $R^{D145}$ | $R^{D203}$ | $L_{C1157}$ | $R^{D168}$ | $R^{D203}$ |
| $L_{C834}$ | $R^{D17}$ | $R^{D204}$ | $L_{C942}$ | $R^{D50}$ | $R^{D204}$ | $L_{C1050}$ | $R^{D145}$ | $R^{D204}$ | $L_{C1158}$ | $R^{D168}$ | $R^{D204}$ |
| $L_{C835}$ | $R^{D17}$ | $R^{D205}$ | $L_{C943}$ | $R^{D50}$ | $R^{D205}$ | $L_{C1051}$ | $R^{D145}$ | $R^{D205}$ | $L_{C1159}$ | $R^{D168}$ | $R^{D205}$ |
| $L_{C836}$ | $R^{D17}$ | $R^{D206}$ | $L_{C944}$ | $R^{D50}$ | $R^{D206}$ | $L_{C1052}$ | $R^{D145}$ | $R^{D206}$ | $L_{C1160}$ | $R^{D168}$ | $R^{D206}$ |
| $L_{C837}$ | $R^{D17}$ | $R^{D207}$ | $L_{C945}$ | $R^{D50}$ | $R^{D207}$ | $L_{C1053}$ | $R^{D145}$ | $R^{D207}$ | $L_{C1161}$ | $R^{D168}$ | $R^{D207}$ |
| $L_{C838}$ | $R^{D17}$ | $R^{D208}$ | $L_{C946}$ | $R^{D50}$ | $R^{D208}$ | $L_{C1054}$ | $R^{D145}$ | $R^{D208}$ | $L_{C1162}$ | $R^{D168}$ | $R^{D208}$ |
| $L_{C839}$ | $R^{D17}$ | $R^{D209}$ | $L_{C947}$ | $R^{D50}$ | $R^{D209}$ | $L_{C1055}$ | $R^{D145}$ | $R^{D209}$ | $L_{C1163}$ | $R^{D168}$ | $R^{D209}$ |
| $L_{C840}$ | $R^{D17}$ | $R^{D210}$ | $L_{C948}$ | $R^{D50}$ | $R^{D210}$ | $L_{C1056}$ | $R^{D145}$ | $R^{D210}$ | $L_{C1164}$ | $R^{D168}$ | $R^{D210}$ |
| $L_{C841}$ | $R^{D17}$ | $R^{D211}$ | $L_{C949}$ | $R^{D50}$ | $R^{D211}$ | $L_{C1057}$ | $R^{D145}$ | $R^{D211}$ | $L_{C1165}$ | $R^{D168}$ | $R^{D211}$ |
| $L_{C842}$ | $R^{D17}$ | $R^{D212}$ | $L_{C950}$ | $R^{D50}$ | $R^{D212}$ | $L_{C1058}$ | $R^{D145}$ | $R^{D212}$ | $L_{C1166}$ | $R^{D168}$ | $R^{D212}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C843}$ | $R^{D17}$ | $R^{D213}$ | $L_{C951}$ | $R^{D50}$ | $R^{D213}$ | $L_{C1059}$ | $R^{D145}$ | $R^{D213}$ | $L_{C1167}$ | $R^{D168}$ | $R^{D213}$ |
| $L_{C844}$ | $R^{D17}$ | $R^{D214}$ | $L_{C952}$ | $R^{D50}$ | $R^{D214}$ | $L_{C1060}$ | $R^{D145}$ | $R^{D214}$ | $L_{C1168}$ | $R^{D168}$ | $R^{D214}$ |
| $L_{C845}$ | $R^{D17}$ | $R^{D215}$ | $L_{C953}$ | $R^{D50}$ | $R^{D215}$ | $L_{C1061}$ | $R^{D145}$ | $R^{D215}$ | $L_{C1169}$ | $R^{D168}$ | $R^{D215}$ |
| $L_{C846}$ | $R^{D17}$ | $R^{D216}$ | $L_{C954}$ | $R^{D50}$ | $R^{D216}$ | $L_{C1062}$ | $R^{D145}$ | $R^{D216}$ | $L_{C1170}$ | $R^{D168}$ | $R^{D216}$ |
| $L_{C847}$ | $R^{D17}$ | $R^{D217}$ | $L_{C955}$ | $R^{D50}$ | $R^{D217}$ | $L_{C1063}$ | $R^{D145}$ | $R^{D217}$ | $L_{C1171}$ | $R^{D168}$ | $R^{D217}$ |
| $L_{C848}$ | $R^{D17}$ | $R^{D218}$ | $L_{C956}$ | $R^{D50}$ | $R^{D218}$ | $L_{C1064}$ | $R^{D145}$ | $R^{D218}$ | $L_{C1172}$ | $R^{D168}$ | $R^{D217}$ |
| $L_{C849}$ | $R^{D17}$ | $R^{D219}$ | $L_{C957}$ | $R^{D50}$ | $R^{D219}$ | $L_{C1065}$ | $R^{D145}$ | $R^{D219}$ | $L_{C1173}$ | $R^{D168}$ | $R^{D217}$ |
| $L_{C850}$ | $R^{D17}$ | $R^{D220}$ | $L_{C958}$ | $R^{D50}$ | $R^{D220}$ | $L_{C1066}$ | $R^{D145}$ | $R^{D220}$ | $L_{C1174}$ | $R^{D168}$ | $R^{D217}$ |
| $L_{C851}$ | $R^{D17}$ | $R^{D221}$ | $L_{C959}$ | $R^{D50}$ | $R^{D221}$ | $L_{C1067}$ | $R^{D145}$ | $R^{D221}$ | $L_{C1175}$ | $R^{D168}$ | $R^{D217}$ |
| $L_{C852}$ | $R^{D17}$ | $R^{D222}$ | $L_{C960}$ | $R^{D50}$ | $R^{D222}$ | $L_{C1068}$ | $R^{D145}$ | $R^{D222}$ | $L_{C1176}$ | $R^{D168}$ | $R^{D217}$ |
| $L_{C853}$ | $R^{D17}$ | $R^{D223}$ | $L_{C961}$ | $R^{D50}$ | $R^{D223}$ | $L_{C1069}$ | $R^{D145}$ | $R^{D223}$ | $L_{C1177}$ | $R^{D168}$ | $R^{D217}$ |
| $L_{C854}$ | $R^{D17}$ | $R^{D224}$ | $L_{C962}$ | $R^{D50}$ | $R^{D224}$ | $L_{C1070}$ | $R^{D145}$ | $R^{D224}$ | $L_{C1178}$ | $R^{D168}$ | $R^{D217}$ |
| $L_{C855}$ | $R^{D17}$ | $R^{D225}$ | $L_{C963}$ | $R^{D50}$ | $R^{D225}$ | $L_{C1071}$ | $R^{D145}$ | $R^{D225}$ | $L_{C1179}$ | $R^{D168}$ | $R^{D217}$ |
| $L_{C856}$ | $R^{D17}$ | $R^{D226}$ | $L_{C964}$ | $R^{D50}$ | $R^{D226}$ | $L_{C1072}$ | $R^{D145}$ | $R^{D226}$ | $L_{C1180}$ | $R^{D168}$ | $R^{D217}$ |
| $L_{C857}$ | $R^{D17}$ | $R^{D227}$ | $L_{C965}$ | $R^{D50}$ | $R^{D227}$ | $L_{C1073}$ | $R^{D145}$ | $R^{D227}$ | $L_{C1181}$ | $R^{D168}$ | $R^{D217}$ |
| $L_{C858}$ | $R^{D17}$ | $R^{D228}$ | $L_{C966}$ | $R^{D50}$ | $R^{D228}$ | $L_{C1074}$ | $R^{D145}$ | $R^{D228}$ | $L_{C1182}$ | $R^{D168}$ | $R^{D217}$ |
| $L_{C859}$ | $R^{D17}$ | $R^{D229}$ | $L_{C967}$ | $R^{D50}$ | $R^{D229}$ | $L_{C1075}$ | $R^{D145}$ | $R^{D229}$ | $L_{C1183}$ | $R^{D168}$ | $R^{D217}$ |
| $L_{C860}$ | $R^{D17}$ | $R^{D230}$ | $L_{C968}$ | $R^{D50}$ | $R^{D230}$ | $L_{C1076}$ | $R^{D145}$ | $R^{D230}$ | $L_{C1184}$ | $R^{D168}$ | $R^{D217}$ |
| $L_{C861}$ | $R^{D17}$ | $R^{D231}$ | $L_{C969}$ | $R^{D50}$ | $R^{D231}$ | $L_{C1077}$ | $R^{D145}$ | $R^{D231}$ | $L_{C1185}$ | $R^{D168}$ | $R^{D217}$ |
| $L_{C862}$ | $R^{D17}$ | $R^{D232}$ | $L_{C970}$ | $R^{D50}$ | $R^{D232}$ | $L_{C1078}$ | $R^{D145}$ | $R^{D232}$ | $L_{C1186}$ | $R^{D168}$ | $R^{D217}$ |
| $L_{C863}$ | $R^{D17}$ | $R^{D233}$ | $L_{C971}$ | $R^{D50}$ | $R^{D233}$ | $L_{C1079}$ | $R^{D145}$ | $R^{D233}$ | $L_{C1187}$ | $R^{D168}$ | $R^{D217}$ |
| $L_{C864}$ | $R^{D17}$ | $R^{D234}$ | $L_{C972}$ | $R^{D50}$ | $R^{D234}$ | $L_{C1080}$ | $R^{D145}$ | $R^{D234}$ | $L_{C1188}$ | $R^{D168}$ | $R^{D217}$ |
| $L_{C865}$ | $R^{D17}$ | $R^{D235}$ | $L_{C973}$ | $R^{D50}$ | $R^{D235}$ | $L_{C1081}$ | $R^{D145}$ | $R^{D235}$ | $L_{C1189}$ | $R^{D168}$ | $R^{D217}$ |
| $L_{C866}$ | $R^{D17}$ | $R^{D236}$ | $L_{C974}$ | $R^{D50}$ | $R^{D236}$ | $L_{C1082}$ | $R^{D145}$ | $R^{D236}$ | $L_{C1190}$ | $R^{D168}$ | $R^{D217}$ |
| $L_{C867}$ | $R^{D17}$ | $R^{D237}$ | $L_{C975}$ | $R^{D50}$ | $R^{D237}$ | $L_{C1083}$ | $R^{D145}$ | $R^{D237}$ | $L_{C1191}$ | $R^{D168}$ | $R^{D217}$ |
| $L_{C868}$ | $R^{D17}$ | $R^{D238}$ | $L_{C976}$ | $R^{D50}$ | $R^{D238}$ | $L_{C1084}$ | $R^{D145}$ | $R^{D238}$ | $L_{C1192}$ | $R^{D168}$ | $R^{D217}$ |
| $L_{C869}$ | $R^{D17}$ | $R^{D239}$ | $L_{C977}$ | $R^{D50}$ | $R^{D239}$ | $L_{C1085}$ | $R^{D145}$ | $R^{D239}$ | $L_{C1193}$ | $R^{D168}$ | $R^{D217}$ |
| $L_{C870}$ | $R^{D17}$ | $R^{D240}$ | $L_{C978}$ | $R^{D50}$ | $R^{D240}$ | $L_{C1086}$ | $R^{D145}$ | $R^{D240}$ | $L_{C1194}$ | $R^{D168}$ | $R^{D217}$ |
| $L_{C871}$ | $R^{D17}$ | $R^{D241}$ | $L_{C979}$ | $R^{D50}$ | $R^{D241}$ | $L_{C1087}$ | $R^{D145}$ | $R^{D241}$ | $L_{C1195}$ | $R^{D168}$ | $R^{D217}$ |
| $L_{C872}$ | $R^{D17}$ | $R^{D242}$ | $L_{C980}$ | $R^{D50}$ | $R^{D242}$ | $L_{C1088}$ | $R^{D145}$ | $R^{D242}$ | $L_{C1196}$ | $R^{D168}$ | $R^{D217}$ |
| $L_{C873}$ | $R^{D17}$ | $R^{D243}$ | $L_{C981}$ | $R^{D50}$ | $R^{D243}$ | $L_{C1089}$ | $R^{D145}$ | $R^{D243}$ | $L_{C1197}$ | $R^{D168}$ | $R^{D217}$ |
| $L_{C874}$ | $R^{D17}$ | $R^{D244}$ | $L_{C982}$ | $R^{D50}$ | $R^{D244}$ | $L_{C1090}$ | $R^{D145}$ | $R^{D244}$ | $L_{C1198}$ | $R^{D168}$ | $R^{D217}$ |
| $L_{C875}$ | $R^{D17}$ | $R^{D245}$ | $L_{C983}$ | $R^{D50}$ | $R^{D245}$ | $L_{C1091}$ | $R^{D145}$ | $R^{D245}$ | $L_{C1199}$ | $R^{D168}$ | $R^{D217}$ |
| $L_{C876}$ | $R^{D17}$ | $R^{D246}$ | $L_{C984}$ | $R^{D50}$ | $R^{D246}$ | $L_{C1092}$ | $R^{D145}$ | $R^{D246}$ | $L_{C1200}$ | $R^{D168}$ | $R^{D217}$ |
| $L_{C1201}$ | $R^{D10}$ | $R^{D193}$ | $L_{C1255}$ | $R^{D55}$ | $R^{D193}$ | $L_{C1309}$ | $R^{D37}$ | $R^{D193}$ | $L_{C1363}$ | $R^{D143}$ | $R^{D217}$ |
| $L_{C1202}$ | $R^{D10}$ | $R^{D194}$ | $L_{C1256}$ | $R^{D55}$ | $R^{D194}$ | $L_{C1310}$ | $R^{D37}$ | $R^{D194}$ | $L_{C1364}$ | $R^{D143}$ | $R^{D217}$ |
| $L_{C1203}$ | $R^{D10}$ | $R^{D195}$ | $L_{C1257}$ | $R^{D55}$ | $R^{D195}$ | $L_{C1311}$ | $R^{D37}$ | $R^{D195}$ | $L_{C1365}$ | $R^{D143}$ | $R^{D217}$ |
| $L_{C1204}$ | $R^{D10}$ | $R^{D196}$ | $L_{C1258}$ | $R^{D55}$ | $R^{D196}$ | $L_{C1312}$ | $R^{D37}$ | $R^{D196}$ | $L_{C1366}$ | $R^{D143}$ | $R^{D217}$ |
| $L_{C1205}$ | $R^{D10}$ | $R^{D197}$ | $L_{C1259}$ | $R^{D55}$ | $R^{D197}$ | $L_{C1313}$ | $R^{D37}$ | $R^{D197}$ | $L_{C1367}$ | $R^{D143}$ | $R^{D217}$ |
| $L_{C1206}$ | $R^{D10}$ | $R^{D198}$ | $L_{C1260}$ | $R^{D55}$ | $R^{D198}$ | $L_{C1314}$ | $R^{D37}$ | $R^{D198}$ | $L_{C1368}$ | $R^{D143}$ | $R^{D217}$ |
| $L_{C1207}$ | $R^{D10}$ | $R^{D199}$ | $L_{C1261}$ | $R^{D55}$ | $R^{D199}$ | $L_{C1315}$ | $R^{D37}$ | $R^{D199}$ | $L_{C1369}$ | $R^{D143}$ | $R^{D217}$ |
| $L_{C1208}$ | $R^{D10}$ | $R^{D200}$ | $L_{C1262}$ | $R^{D55}$ | $R^{D200}$ | $L_{C1316}$ | $R^{D37}$ | $R^{D200}$ | $L_{C1370}$ | $R^{D143}$ | $R^{D217}$ |
| $L_{C1209}$ | $R^{D10}$ | $R^{D201}$ | $L_{C1263}$ | $R^{D55}$ | $R^{D201}$ | $L_{C1317}$ | $R^{D37}$ | $R^{D201}$ | $L_{C1371}$ | $R^{D143}$ | $R^{D201}$ |
| $L_{C1210}$ | $R^{D10}$ | $R^{D202}$ | $L_{C1264}$ | $R^{D55}$ | $R^{D202}$ | $L_{C1318}$ | $R^{D37}$ | $R^{D202}$ | $L_{C1372}$ | $R^{D143}$ | $R^{D202}$ |
| $L_{C1211}$ | $R^{D10}$ | $R^{D203}$ | $L_{C1265}$ | $R^{D55}$ | $R^{D203}$ | $L_{C1319}$ | $R^{D37}$ | $R^{D203}$ | $L_{C1373}$ | $R^{D143}$ | $R^{D203}$ |
| $L_{C1212}$ | $R^{D10}$ | $R^{D204}$ | $L_{C1266}$ | $R^{D55}$ | $R^{D204}$ | $L_{C1320}$ | $R^{D37}$ | $R^{D204}$ | $L_{C1374}$ | $R^{D143}$ | $R^{D204}$ |
| $L_{C1213}$ | $R^{D10}$ | $R^{D205}$ | $L_{C1267}$ | $R^{D55}$ | $R^{D205}$ | $L_{C1321}$ | $R^{D37}$ | $R^{D205}$ | $L_{C1375}$ | $R^{D143}$ | $R^{D205}$ |
| $L_{C1214}$ | $R^{D10}$ | $R^{D206}$ | $L_{C1268}$ | $R^{D55}$ | $R^{D206}$ | $L_{C1322}$ | $R^{D37}$ | $R^{D206}$ | $L_{C1376}$ | $R^{D143}$ | $R^{D206}$ |
| $L_{C1215}$ | $R^{D10}$ | $R^{D207}$ | $L_{C1269}$ | $R^{D55}$ | $R^{D207}$ | $L_{C1323}$ | $R^{D37}$ | $R^{D207}$ | $L_{C1377}$ | $R^{D143}$ | $R^{D207}$ |
| $L_{C1216}$ | $R^{D10}$ | $R^{D208}$ | $L_{C1270}$ | $R^{D55}$ | $R^{D208}$ | $L_{C1324}$ | $R^{D37}$ | $R^{D208}$ | $L_{C1378}$ | $R^{D143}$ | $R^{D208}$ |
| $L_{C1217}$ | $R^{D10}$ | $R^{D209}$ | $L_{C1271}$ | $R^{D55}$ | $R^{D209}$ | $L_{C1325}$ | $R^{D37}$ | $R^{D209}$ | $L_{C1379}$ | $R^{D143}$ | $R^{D209}$ |
| $L_{C1218}$ | $R^{D10}$ | $R^{D210}$ | $L_{C1272}$ | $R^{D55}$ | $R^{D210}$ | $L_{C1326}$ | $R^{D37}$ | $R^{D210}$ | $L_{C1380}$ | $R^{D143}$ | $R^{D210}$ |
| $L_{C1219}$ | $R^{D10}$ | $R^{D211}$ | $L_{C1273}$ | $R^{D55}$ | $R^{D211}$ | $L_{C1327}$ | $R^{D37}$ | $R^{D211}$ | $L_{C1381}$ | $R^{D143}$ | $R^{D211}$ |
| $L_{C1220}$ | $R^{D10}$ | $R^{D212}$ | $L_{C1274}$ | $R^{D55}$ | $R^{D212}$ | $L_{C1328}$ | $R^{D37}$ | $R^{D212}$ | $L_{C1382}$ | $R^{D143}$ | $R^{D212}$ |
| $L_{C1221}$ | $R^{D10}$ | $R^{D213}$ | $L_{C1275}$ | $R^{D55}$ | $R^{D213}$ | $L_{C1329}$ | $R^{D37}$ | $R^{D213}$ | $L_{C1383}$ | $R^{D143}$ | $R^{D213}$ |
| $L_{C1222}$ | $R^{D10}$ | $R^{D214}$ | $L_{C1276}$ | $R^{D55}$ | $R^{D214}$ | $L_{C1330}$ | $R^{D37}$ | $R^{D214}$ | $L_{C1384}$ | $R^{D143}$ | $R^{D214}$ |
| $L_{C1223}$ | $R^{D10}$ | $R^{D215}$ | $L_{C1277}$ | $R^{D55}$ | $R^{D215}$ | $L_{C1331}$ | $R^{D37}$ | $R^{D215}$ | $L_{C1385}$ | $R^{D143}$ | $R^{D215}$ |
| $L_{C1224}$ | $R^{D10}$ | $R^{D216}$ | $L_{C1278}$ | $R^{D55}$ | $R^{D216}$ | $L_{C1332}$ | $R^{D37}$ | $R^{D216}$ | $L_{C1386}$ | $R^{D143}$ | $R^{D216}$ |
| $L_{C1225}$ | $R^{D10}$ | $R^{D217}$ | $L_{C1279}$ | $R^{D55}$ | $R^{D217}$ | $L_{C1333}$ | $R^{D37}$ | $R^{D217}$ | $L_{C1387}$ | $R^{D143}$ | $R^{D217}$ |
| $L_{C1226}$ | $R^{D10}$ | $R^{D218}$ | $L_{C1280}$ | $R^{D55}$ | $R^{D218}$ | $L_{C1334}$ | $R^{D37}$ | $R^{D218}$ | $L_{C1388}$ | $R^{D143}$ | $R^{D218}$ |
| $L_{C1227}$ | $R^{D10}$ | $R^{D219}$ | $L_{C1281}$ | $R^{D55}$ | $R^{D219}$ | $L_{C1335}$ | $R^{D37}$ | $R^{D219}$ | $L_{C1389}$ | $R^{D143}$ | $R^{D219}$ |
| $L_{C1228}$ | $R^{D10}$ | $R^{D220}$ | $L_{C1282}$ | $R^{D55}$ | $R^{D220}$ | $L_{C1336}$ | $R^{D37}$ | $R^{D220}$ | $L_{C1390}$ | $R^{D143}$ | $R^{D220}$ |
| $L_{C1229}$ | $R^{D10}$ | $R^{D221}$ | $L_{C1283}$ | $R^{D55}$ | $R^{D221}$ | $L_{C1337}$ | $R^{D37}$ | $R^{D221}$ | $L_{C1391}$ | $R^{D143}$ | $R^{D221}$ |
| $L_{C1230}$ | $R^{D10}$ | $R^{D222}$ | $L_{C1284}$ | $R^{D55}$ | $R^{D222}$ | $L_{C1338}$ | $R^{D37}$ | $R^{D222}$ | $L_{C1392}$ | $R^{D143}$ | $R^{D222}$ |
| $L_{C1231}$ | $R^{D10}$ | $R^{D223}$ | $L_{C1285}$ | $R^{D55}$ | $R^{D223}$ | $L_{C1339}$ | $R^{D37}$ | $R^{D223}$ | $L_{C1393}$ | $R^{D143}$ | $R^{D223}$ |
| $L_{C1232}$ | $R^{D10}$ | $R^{D224}$ | $L_{C1286}$ | $R^{D55}$ | $R^{D224}$ | $L_{C1340}$ | $R^{D37}$ | $R^{D224}$ | $L_{C1394}$ | $R^{D143}$ | $R^{D224}$ |
| $L_{C1233}$ | $R^{D10}$ | $R^{D225}$ | $L_{C1287}$ | $R^{D55}$ | $R^{D225}$ | $L_{C1341}$ | $R^{D37}$ | $R^{D225}$ | $L_{C1395}$ | $R^{D143}$ | $R^{D225}$ |
| $L_{C1234}$ | $R^{D10}$ | $R^{D226}$ | $L_{C1288}$ | $R^{D55}$ | $R^{D226}$ | $L_{C1342}$ | $R^{D37}$ | $R^{D226}$ | $L_{C1396}$ | $R^{D143}$ | $R^{D226}$ |
| $L_{C1235}$ | $R^{D10}$ | $R^{D227}$ | $L_{C1289}$ | $R^{D55}$ | $R^{D227}$ | $L_{C1343}$ | $R^{D37}$ | $R^{D227}$ | $L_{C1397}$ | $R^{D143}$ | $R^{D227}$ |
| $L_{C1236}$ | $R^{D10}$ | $R^{D228}$ | $L_{C1290}$ | $R^{D55}$ | $R^{D228}$ | $L_{C1344}$ | $R^{D37}$ | $R^{D228}$ | $L_{C1398}$ | $R^{D143}$ | $R^{D228}$ |
| $L_{C1237}$ | $R^{D10}$ | $R^{D229}$ | $L_{C1291}$ | $R^{D55}$ | $R^{D229}$ | $L_{C1345}$ | $R^{D37}$ | $R^{D229}$ | $L_{C1399}$ | $R^{D143}$ | $R^{D229}$ |
| $L_{C1238}$ | $R^{D10}$ | $R^{D230}$ | $L_{C1292}$ | $R^{D55}$ | $R^{D230}$ | $L_{C1346}$ | $R^{D37}$ | $R^{D230}$ | $L_{C1400}$ | $R^{D143}$ | $R^{D230}$ |
| $L_{C1239}$ | $R^{D10}$ | $R^{D231}$ | $L_{C1293}$ | $R^{D55}$ | $R^{D231}$ | $L_{C1347}$ | $R^{D37}$ | $R^{D231}$ | $L_{C1401}$ | $R^{D143}$ | $R^{D231}$ |
| $L_{C1240}$ | $R^{D10}$ | $R^{D232}$ | $L_{C1294}$ | $R^{D55}$ | $R^{D232}$ | $L_{C1348}$ | $R^{D37}$ | $R^{D232}$ | $L_{C1402}$ | $R^{D143}$ | $R^{D232}$ |
| $L_{C1241}$ | $R^{D10}$ | $R^{D233}$ | $L_{C1295}$ | $R^{D55}$ | $R^{D233}$ | $L_{C1349}$ | $R^{D37}$ | $R^{D233}$ | $L_{C1403}$ | $R^{D143}$ | $R^{D233}$ |
| $L_{C1242}$ | $R^{D10}$ | $R^{D234}$ | $L_{C1296}$ | $R^{D55}$ | $R^{D234}$ | $L_{C1350}$ | $R^{D37}$ | $R^{D234}$ | $L_{C1404}$ | $R^{D143}$ | $R^{D234}$ |
| $L_{C1243}$ | $R^{D10}$ | $R^{D235}$ | $L_{C1297}$ | $R^{D55}$ | $R^{D235}$ | $L_{C1351}$ | $R^{D37}$ | $R^{D235}$ | $L_{C1405}$ | $R^{D143}$ | $R^{D235}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1244}$ | $R^{D10}$ | $R^{D236}$ | $L_{C1298}$ | $R^{D55}$ | $R^{D236}$ | $L_{C1352}$ | $R^{D37}$ | $R^{D236}$ | $L_{C1406}$ | $R^{D143}$ | $R^{D236}$ |
| $L_{C1245}$ | $R^{D10}$ | $R^{D237}$ | $L_{C1299}$ | $R^{D55}$ | $R^{D237}$ | $L_{C1353}$ | $R^{D37}$ | $R^{D237}$ | $L_{C1407}$ | $R^{D143}$ | $R^{D237}$ |
| $L_{C1246}$ | $R^{D10}$ | $R^{D238}$ | $L_{C1300}$ | $R^{D55}$ | $R^{D238}$ | $L_{C1354}$ | $R^{D37}$ | $R^{D238}$ | $L_{C1408}$ | $R^{D143}$ | $R^{D238}$ |
| $L_{C1247}$ | $R^{D10}$ | $R^{D239}$ | $L_{C1301}$ | $R^{D55}$ | $R^{D239}$ | $L_{C1355}$ | $R^{D37}$ | $R^{D239}$ | $L_{C1409}$ | $R^{D143}$ | $R^{D239}$ |
| $L_{C1248}$ | $R^{D10}$ | $R^{D240}$ | $L_{C1302}$ | $R^{D55}$ | $R^{D240}$ | $L_{C1356}$ | $R^{D37}$ | $R^{D240}$ | $L_{C1410}$ | $R^{D143}$ | $R^{D240}$ |
| $L_{C1249}$ | $R^{D10}$ | $R^{D241}$ | $L_{C1303}$ | $R^{D55}$ | $R^{D241}$ | $L_{C1357}$ | $R^{D37}$ | $R^{D241}$ | $L_{C1411}$ | $R^{D143}$ | $R^{D241}$ |
| $L_{C1250}$ | $R^{D10}$ | $R^{D242}$ | $L_{C1304}$ | $R^{D55}$ | $R^{D242}$ | $L_{C1358}$ | $R^{D37}$ | $R^{D242}$ | $L_{C1412}$ | $R^{D143}$ | $R^{D242}$ |
| $L_{C1251}$ | $R^{D10}$ | $R^{D243}$ | $L_{C1305}$ | $R^{D55}$ | $R^{D243}$ | $L_{C1359}$ | $R^{D37}$ | $R^{D243}$ | $L_{C1413}$ | $R^{D143}$ | $R^{D243}$ |
| $L_{C1252}$ | $R^{D10}$ | $R^{D244}$ | $L_{C1306}$ | $R^{D55}$ | $R^{D244}$ | $L_{C1360}$ | $R^{D37}$ | $R^{D244}$ | $L_{C1414}$ | $R^{D143}$ | $R^{D244}$ |
| $L_{C1253}$ | $R^{D10}$ | $R^{D245}$ | $L_{C1307}$ | $R^{D55}$ | $R^{D245}$ | $L_{C1361}$ | $R^{D37}$ | $R^{D245}$ | $L_{C1415}$ | $R^{D143}$ | $R^{D245}$ |
| $L_{C1254}$ | $R^{D10}$ | $R^{D246}$ | $L_{C1308}$ | $R^{D55}$ | $R^{D246}$ | $L_{C1362}$ | $R^{D37}$ | $R^{D246}$ | $L_{C1416}$ | $R^{D143}$ | $R^{D246}$ |

wherein $R^{D1}$ to $R^{D246}$ have the following structures:

$R^{D1}$

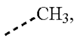

$R^{D2}$

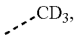

$R^{D3}$

$R^{D4}$

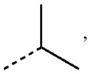

$R^{D5}$

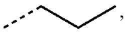

$R^{D6}$

$R^{D7}$

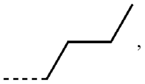

$R^{D8}$

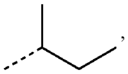

$R^{D9}$

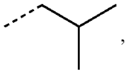

$R^{D10}$

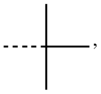

$R^{D11}$

$R^{D12}$

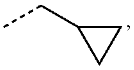

$R^{D13}$

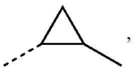

$R^{D14}$

-continued $R^{D15}$

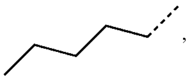

$R^{D16}$

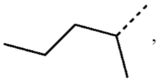

$R^{D17}$

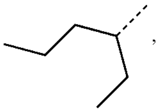

$R^{D18}$

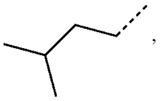

$R^{D19}$

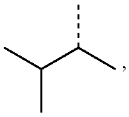

$R^{D20}$

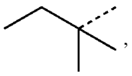

$R^{D21}$

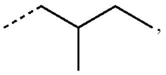

$R^{D22}$

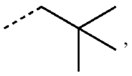

$R^{D23}$

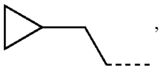

$R^{D24}$

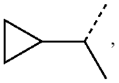

$R^{D25}$

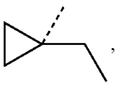

-continued
$R^{D26}$
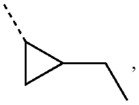,
$R^{D27}$
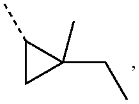,
$R^{D28}$
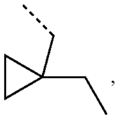,
$R^{D29}$
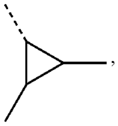,
$R^{D30}$
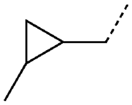,
$R^{D31}$
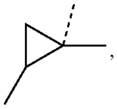,
$R^{D32}$
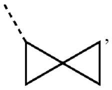,
$R^{D33}$
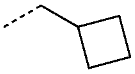,
$R^{D34}$
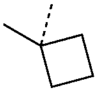,
$R^{D35}$
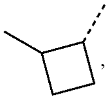,
$R^{D36}$
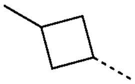,
$R^{D37}$
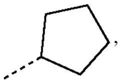,
$R^{D38}$
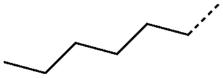,
$R^{D39}$
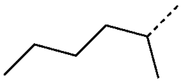,
-continued
$R^{D40}$
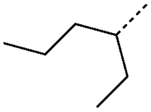,
$R^{D41}$
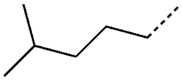,
$R^{D42}$
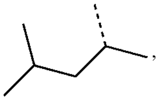,
$R^{D43}$
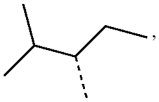,
$R^{D44}$
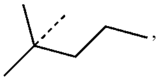,
$R^{D45}$
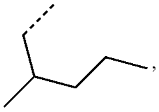,
$R^{D46}$
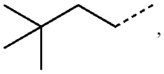,
$R^{D47}$
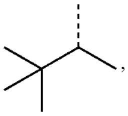,
$R^{D48}$
,
$R^{D49}$
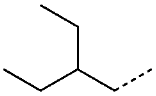,
$R^{D50}$
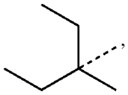,
$R^{D51}$
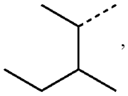,
$R^{D52}$
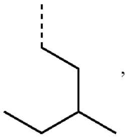, -continued
$R^{D53}$
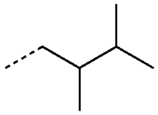,
$R^{D54}$
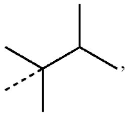,
$R^{D55}$
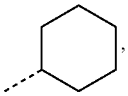,
$R^{D56}$
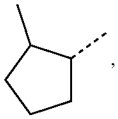,
$R^{D57}$
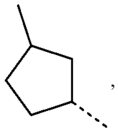,
$R^{D58}$
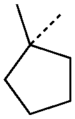,
$R^{D59}$
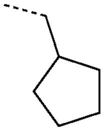,
$R^{D60}$
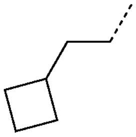,
$R^{D61}$
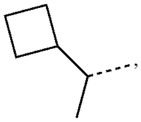,
$R^{D62}$
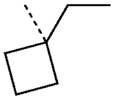,
$R^{D63}$
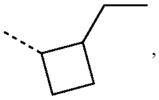,
$R^{D64}$
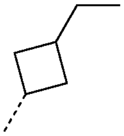,
-continued
$R^{D65}$
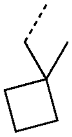,
$R^{D66}$
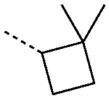,
$R^{D67}$
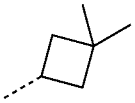,
$R^{D68}$
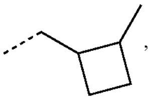,
$R^{D69}$
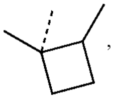,
$R^{D70}$
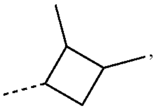,
$R^{D71}$
,
$R^{D72}$
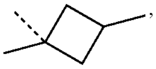,
$R^{D73}$
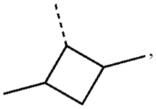,
$R^{D74}$
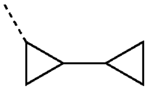,
$R^{D75}$
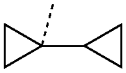,
$R^{D76}$
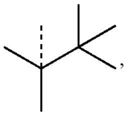,
$R^{D77}$
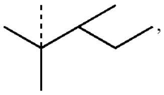, -continued
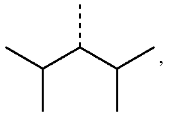
$R^{D78}$
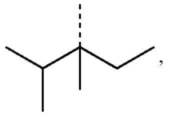
$R^{D79}$
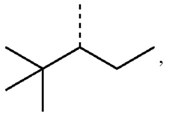
$R^{D80}$
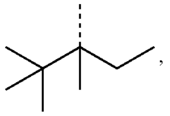
$R^{D81}$
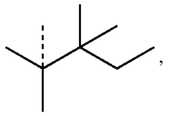
$R^{D82}$
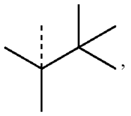
$R^{D83}$
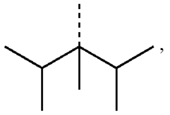
$R^{D84}$
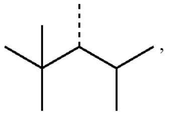
$R^{D85}$
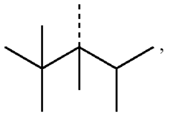
$R^{D86}$
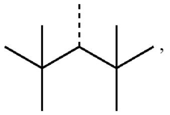
$R^{D87}$
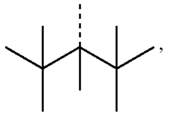
$R^{D88}$
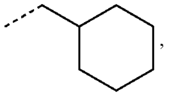
$R^{D89}$
-continued
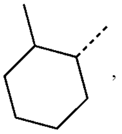
$R^{D90}$
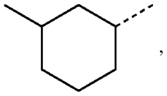
$R^{D91}$
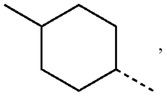
$R^{D92}$
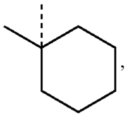
$R^{D93}$
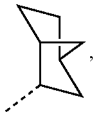
$R^{D94}$
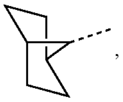
$R^{D95}$
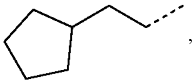
$R^{D96}$
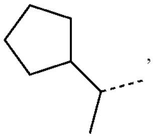
$R^{D97}$
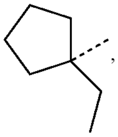
$R^{D98}$
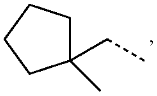
$R^{D99}$
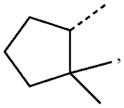
$R^{D100}$
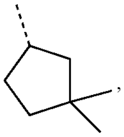
$R^{D101}$ -continued
$R^{D102}$
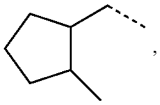
$R^{D103}$
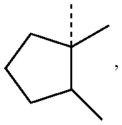
$R^{D104}$
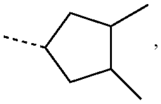
$R^{D105}$
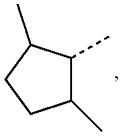
$R^{D106}$
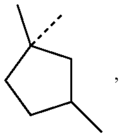
$R^{D107}$
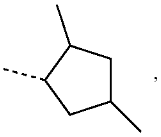
$R^{D108}$
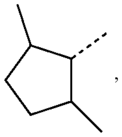
$R^{D109}$
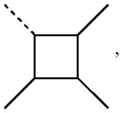
$R^{D110}$
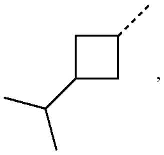
$R^{D111}$
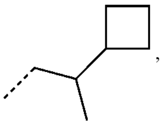
$R^{D112}$
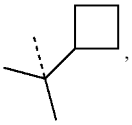
-continued
$R^{D113}$
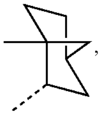
$R^{D114}$
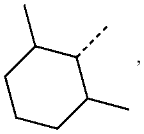
$R^{D115}$
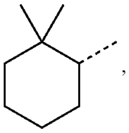
$R^{D116}$
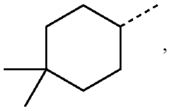
$R^{D117}$
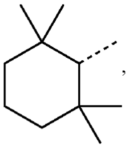
$R^{D118}$
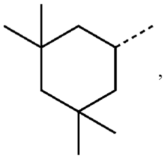
$R^{D119}$
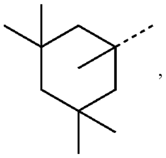
$R^{D120}$
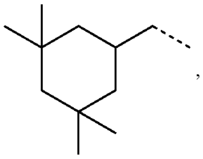
$R^{D121}$
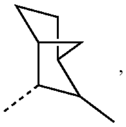
$R^{D122}$
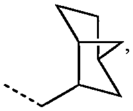

-continued
$R^{D123}$
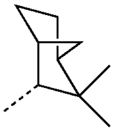,
$R^{D124}$
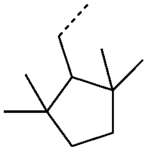,
$R^{D125}$
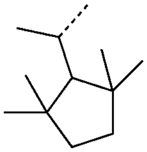,
$R^{D126}$
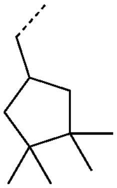,
$R^{D127}$
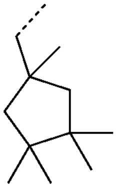,
$R^{D128}$
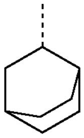,
$R^{D129}$
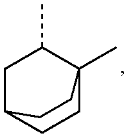,
$R^{D130}$
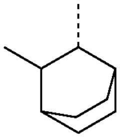,
$R^{D131}$
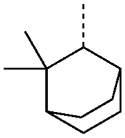,
-continued
$R^{D132}$
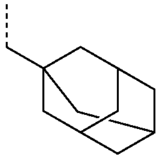,
$R^{D133}$
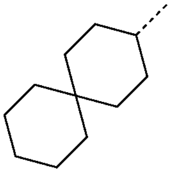,
$R^{D134}$
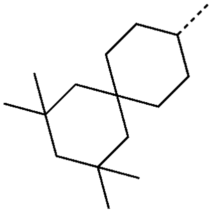,
$R^{D135}$
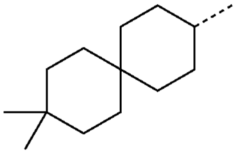,
$R^{D136}$
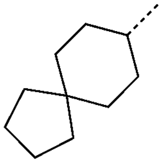,
$R^{D137}$
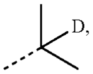,
$R^{D138}$
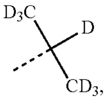,
$R^{D139}$
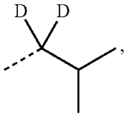,
$R^{D140}$
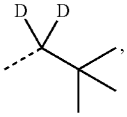,
$R^{D141}$
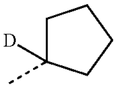,
$R^{D142}$
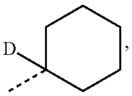, -continued
$R^{D143}$
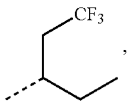
$R^{D144}$
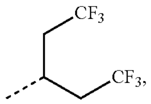
$R^{D145}$
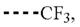
$R^{D146}$
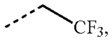
$R^{D147}$
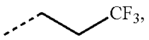
$R^{D148}$
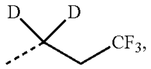
$R^{D149}$
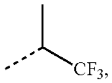
$R^{D150}$
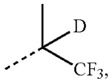
$R^{D151}$
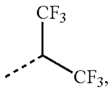
$R^{D152}$
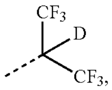
$R^{D153}$
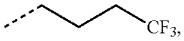
$R^{D154}$
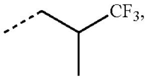
$R^{D155}$
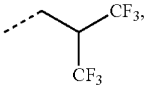
$R^{D156}$
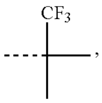
$R^{D157}$
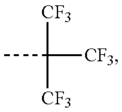
$R^{D158}$
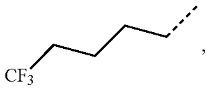
-continued
$R^{D159}$
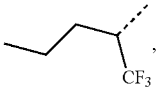
$R^{D160}$
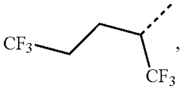
$R^{D161}$
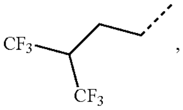
$R^{D162}$
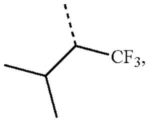
$R^{D163}$
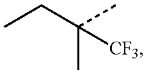
$R^{D164}$
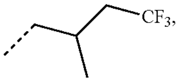
$R^{D165}$
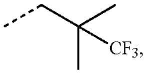
$R^{D166}$
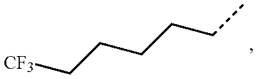
$R^{D167}$
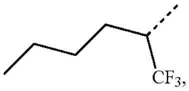
$R^{D168}$
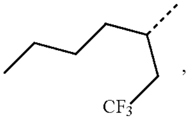
$R^{D169}$
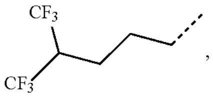
$R^{D170}$
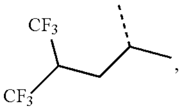
$R^{D171}$
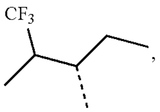
$R^{D172}$
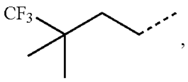

-continued
$R^{D173}$
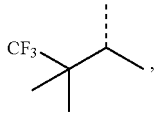
$R^{D174}$
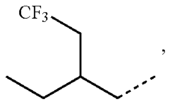
$R^{D175}$
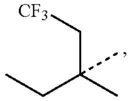
$R^{D176}$
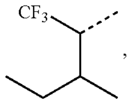
$R^{D177}$
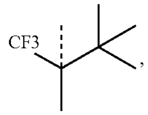
$R^{D178}$
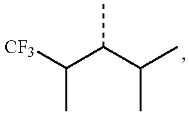
$R^{D179}$
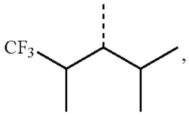
$R^{D180}$
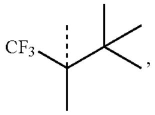
$R^{D181}$
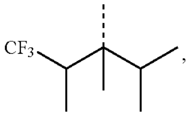
$R^{D182}$
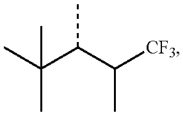
$R^{D183}$
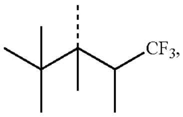
$R^{D184}$
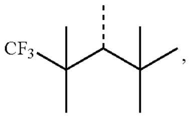
-continued
$R^{D185}$
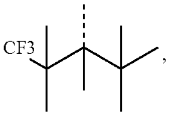
$R^{D186}$
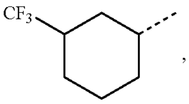
$R^{D187}$
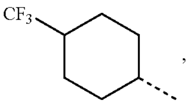
$R^{D188}$
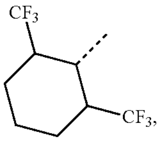
$R^{D189}$
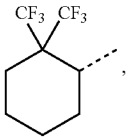
$R^{D190}$
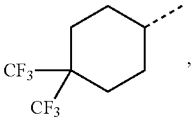
$R^{D191}$
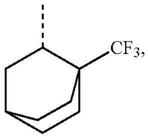
$R^{D192}$
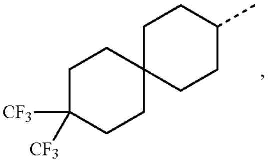
$R^{D193}$
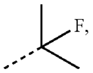
$R^{D194}$
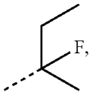
$R^{D195}$
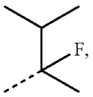
$R^{D196}$
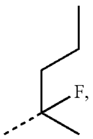

-continued
$R^{D197}$
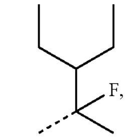
$R^{D198}$
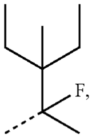
$R^{D199}$
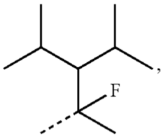
,
$R^{D200}$
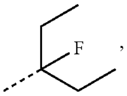
,
$R^{D201}$
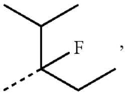
,
$R^{D202}$
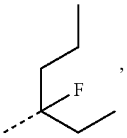
,
$R^{D203}$
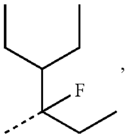
,
$R^{D204}$
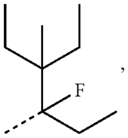
,
$R^{D205}$
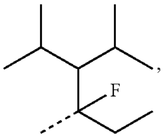
,
$R^{D206}$
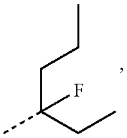
,
$R^{D207}$
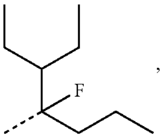
,
-continued
$R^{D208}$
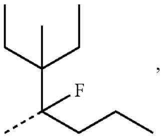
,
$R^{D209}$
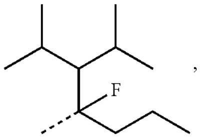
,
$R^{D210}$
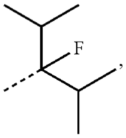
,
$R^{D211}$
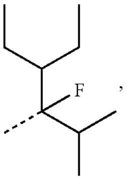
,
$R^{D212}$
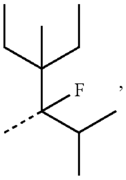
,
$R^{D213}$
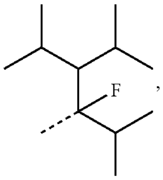
,
$R^{D214}$
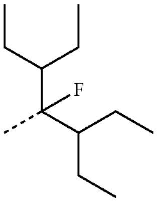
,
$R^{D215}$
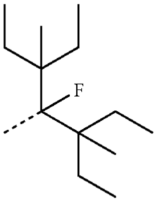
, -continued
$R^{D216}$
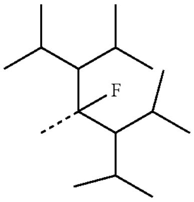,
$R^{D217}$
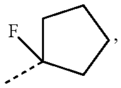,
$R^{D218}$
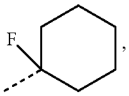,
$R^{D219}$
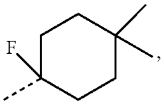,
$R^{D220}$
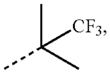,
$R^{D221}$
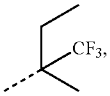,
$R^{D222}$
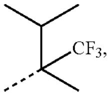,
$R^{D223}$
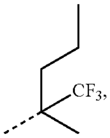,
$R^{D224}$
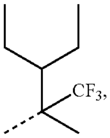,
$R^{D225}$
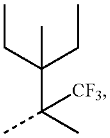,
$R^{D226}$
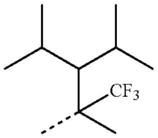,
$R^{D227}$
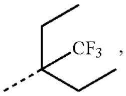,
-continued
$R^{D228}$
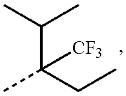,
$R^{D229}$
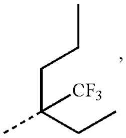,
$R^{D230}$
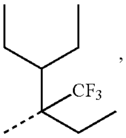,
$R^{D231}$
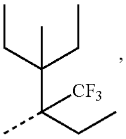,
$R^{D232}$
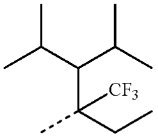,
$R^{D233}$
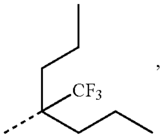,
$R^{D234}$
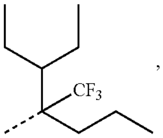,
$R^{D235}$
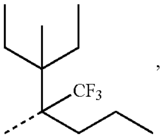,
$R^{D236}$
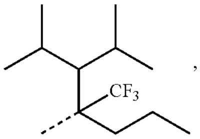,
$R^{D237}$
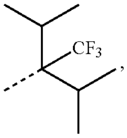, -continued $R^{D238}$

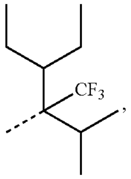

, $R^{D239}$

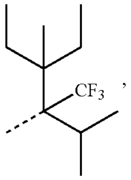

, $R^{D240}$

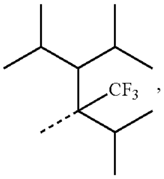

, $R^{D241}$

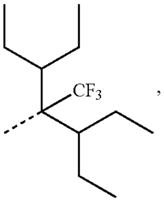

, $R^{D242}$

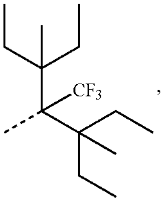

, $R^{D243}$

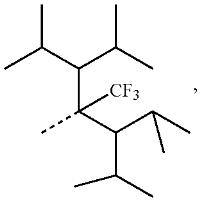

, $R^{D244}$

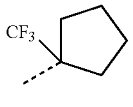

, $R^{D245}$

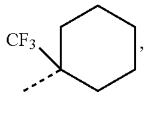

, and $R^{D246}$

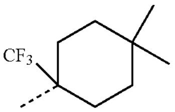

.

In some embodiments, the compound can have the formula $Ir(L_A)(L_{Bk})_2$, $Ir(L_A)(L_{BBn})_2$, $Ir(L_A)_2(L_{Bk})$, or $Ir(L_A)_2(L_{BBn})$, wherein k is an integer from 1 to 324 and n is an integer from 1 to 195, wherein the compound is selected from the group consisting of only those compounds whose $L_{Bk}$ or $L_{BBn}$ ligand is one of the structures in the following LIST 7:

$L_{B1}$

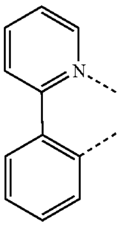

, $L_{B2}$

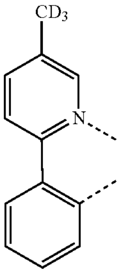

, $L_{B18}$

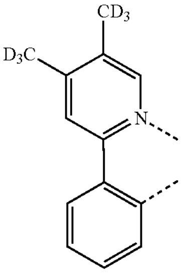

, $L_{B28}$

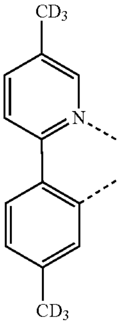

, $L_{B38}$

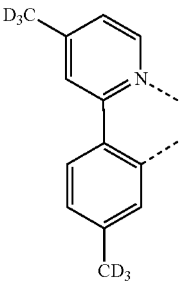

,

-continued
$L_{B108}$
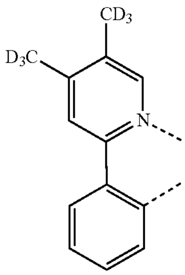
,
$L_{B118}$
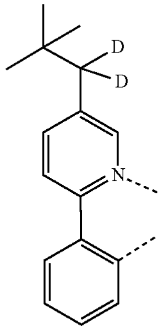
,
$L_{B122}$
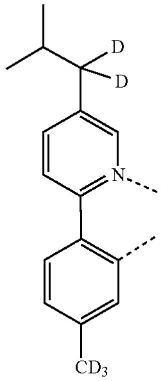
,
$L_{B126}$
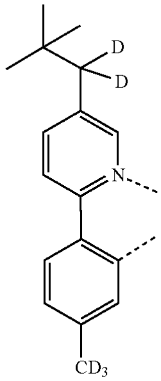
,
-continued
$L_{B128}$
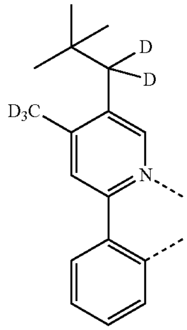
,
$L_{B130}$
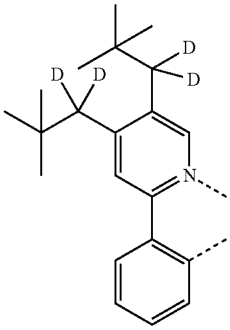
,
$L_{B132}$
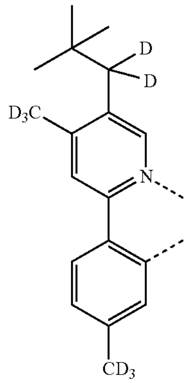
,
$L_{B134}$
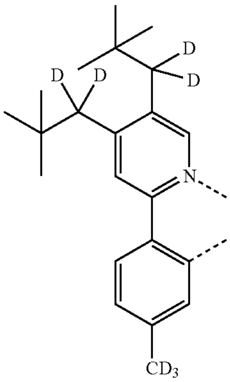
, -continued
L$_{B136}$
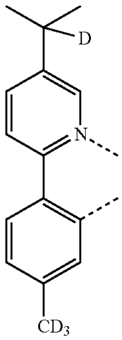
,
L$_{B138}$
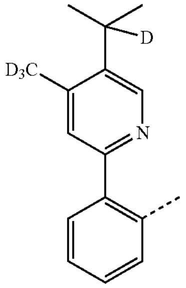
,
L$_{B140}$
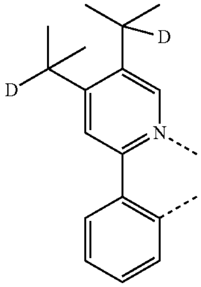
,
L$_{B142}$
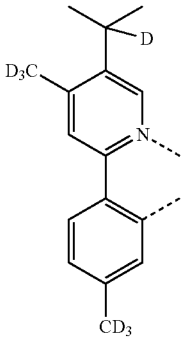
,
L$_{B144}$
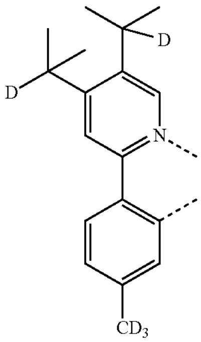
,
-continued
L$_{B156}$
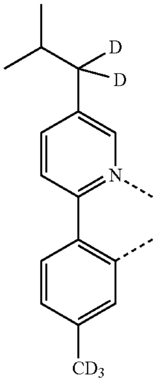
,
L$_{B158}$
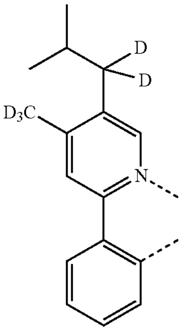
,
L$_{B160}$
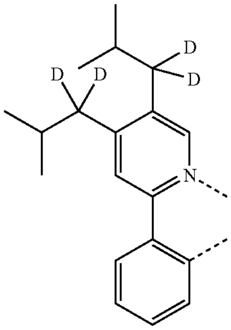
,
L$_{B162}$
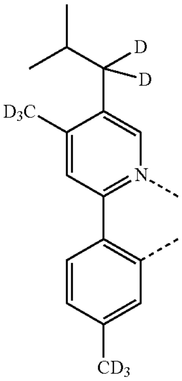
, L$_{B204}$
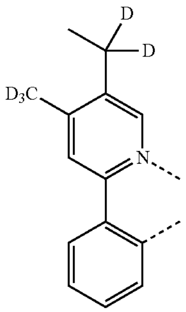
,
L$_{B206}$
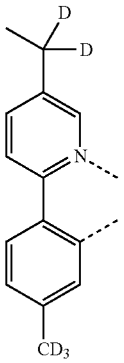
,
L$_{B214}$
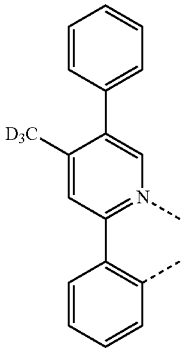
,
L$_{B216}$
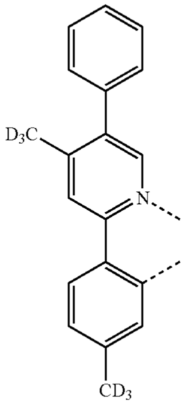
,
L$_{B218}$
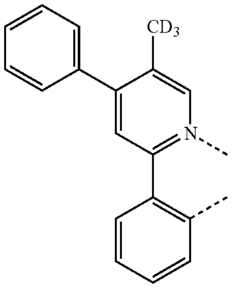
,
L$_{B220}$
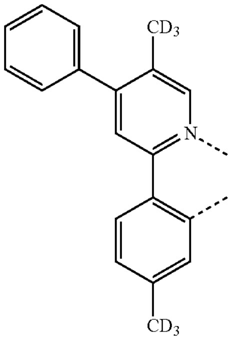
,
L$_{B222}$
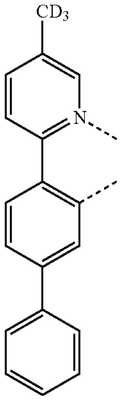
,
L$_{B231}$
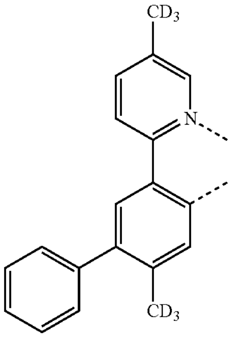
, -continued
$L_{B233}$
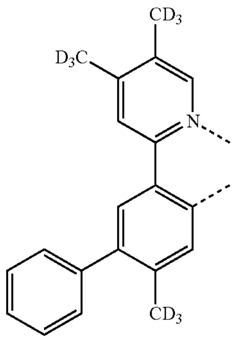
,
$L_{B235}$
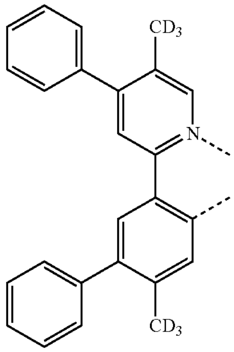
,
$L_{B237}$
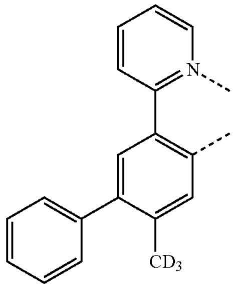
,
$L_{B240}$
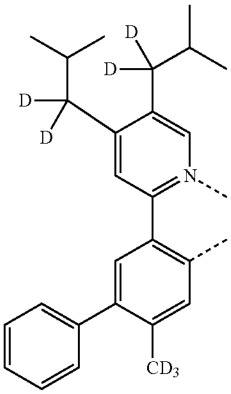
,
-continued
$L_{B242}$
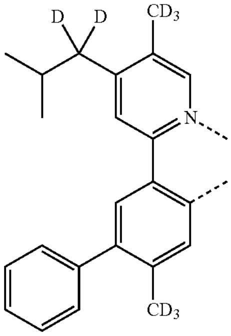
,
$L_{B244}$
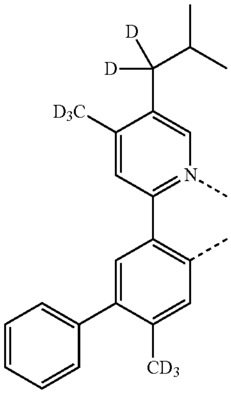
,
$L_{B246}$
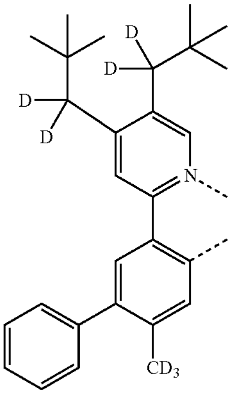
,
$L_{B248}$
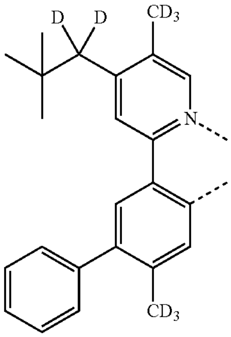
, $L_{B250}$
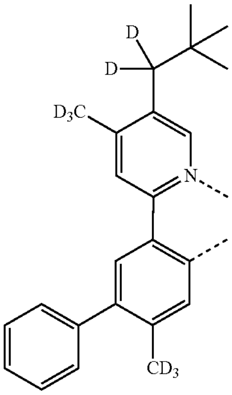
,
$L_{B252}$
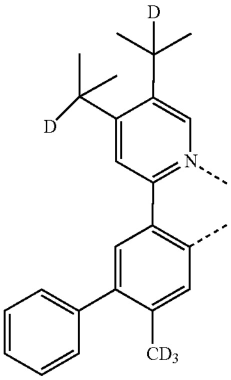
,
$L_{B254}$
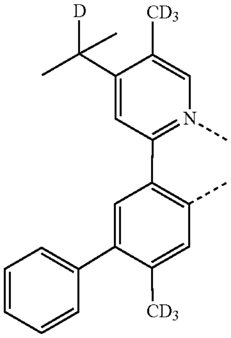
,
$L_{B256}$
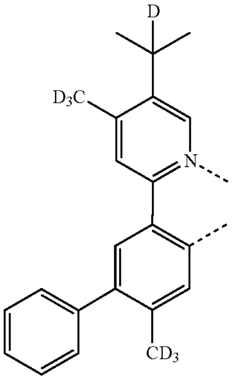
,
$L_{B258}$
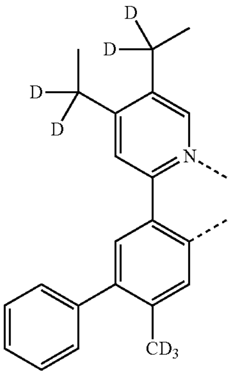
,
$L_{B260}$
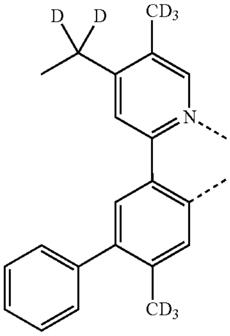
,
$L_{B262}$
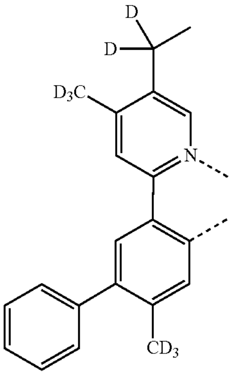
,
$L_{B264}$
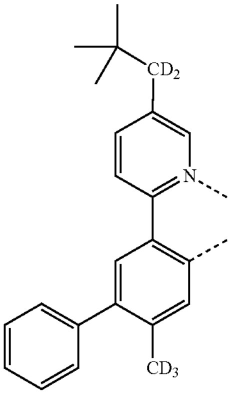
, -continued
$L_{B164}$
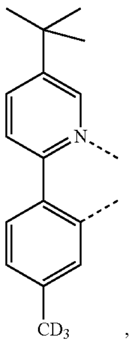
,
$L_{B124}$
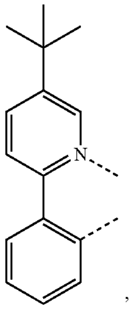
,
$L_{B168}$
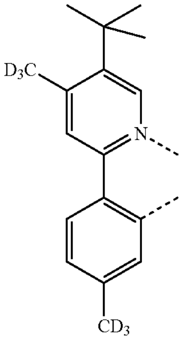
,
$L_{B172}$
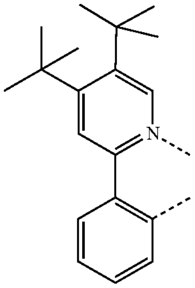
,
-continued
$L_{B175}$
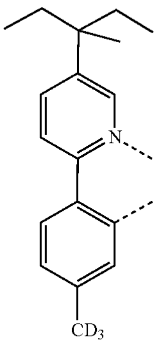
,
$L_{BB1}$
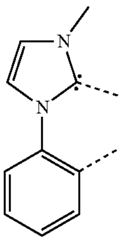
,
$L_{BB2}$
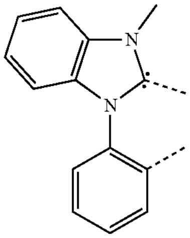
,
$L_{BB3}$
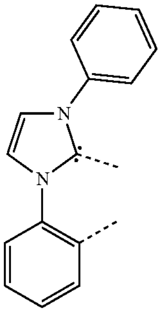
,
$L_{BB4}$
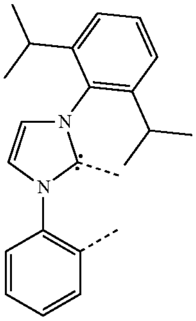
, -continued
$L_{BB5}$
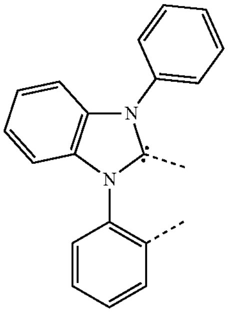
,
$L_{BB6}$
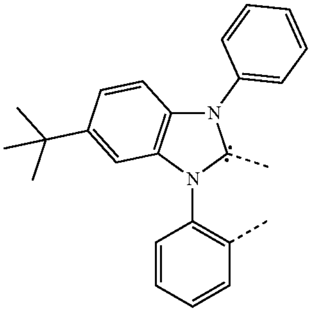
,
$L_{BB7}$
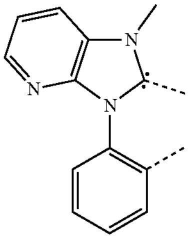
,
$L_{BB8}$
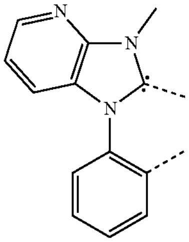
,
$L_{BB9}$
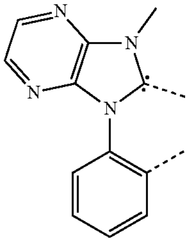
,
-continued
$L_{BB10}$
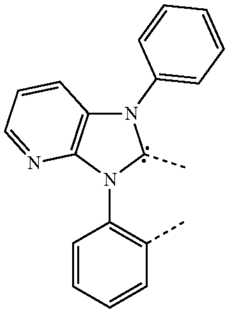
,
$L_{BB11}$
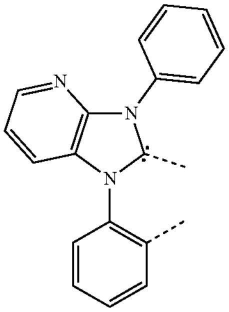
,
$L_{BB12}$
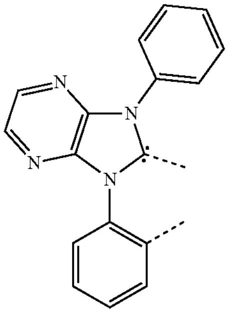
,
$L_{BB13}$
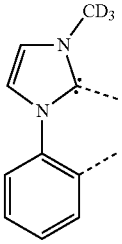
,
$L_{BB14}$
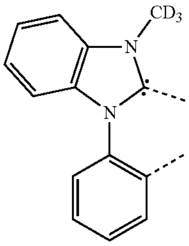
, -continued
$L_{BB15}$
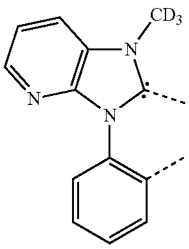
,
$L_{BB16}$
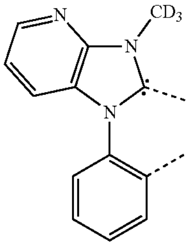
,
$L_{BB17}$
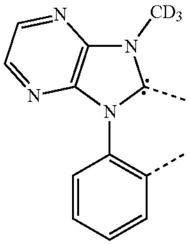
,
$L_{BB18}$
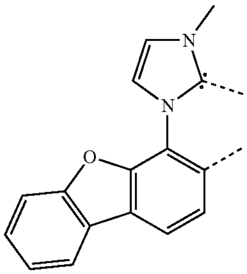
,
$L_{BB20}$
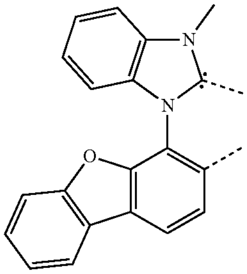
,
-continued
$L_{BB22}$
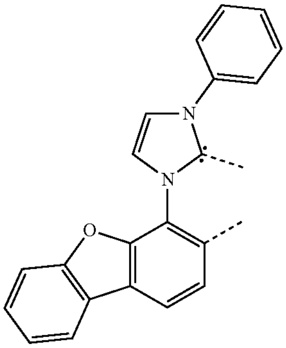
,
$L_{BB24}$
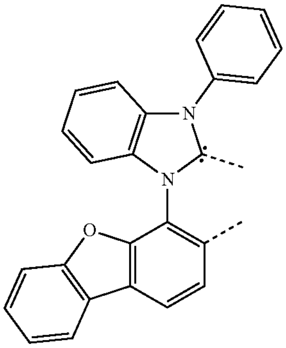
,
$L_{BB34}$
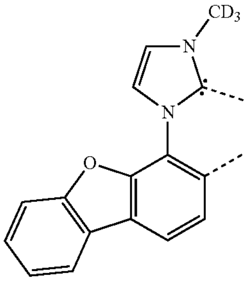
,
$L_{BB37}$
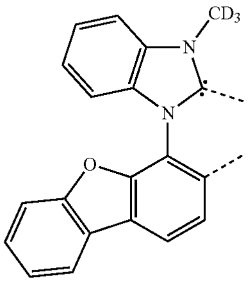
,
$L_{BB71}$
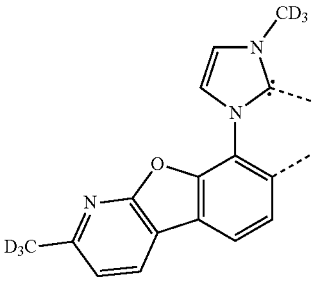
, -continued
$L_{BB74}$
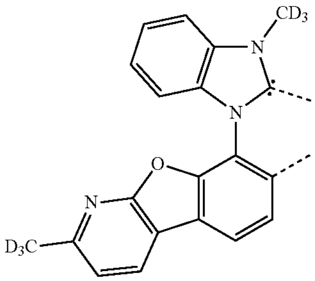
,
$L_{BB88}$
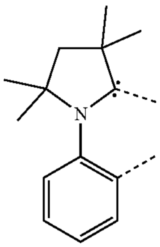
,
$L_{BB90}$
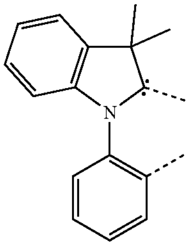
,
$L_{BB97}$
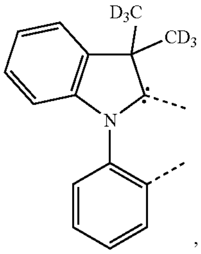
,
$L_{BB103}$
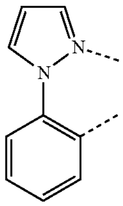
,
$L_{BB104}$
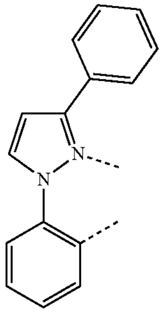
,
-continued
$L_{BB105}$
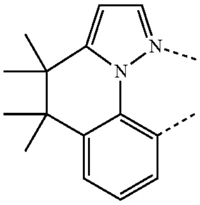
,
$L_{BB106}$
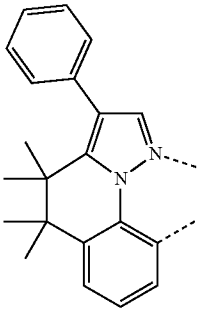
,
$L_{BB107}$
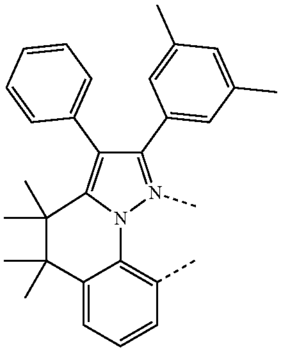
,
$L_{BB112}$
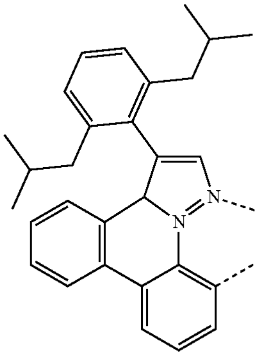
,
$L_{BB113}$
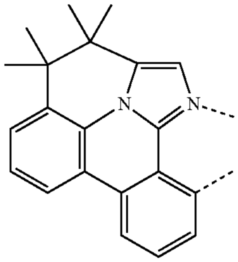
, -continued

L$_{BB115}$

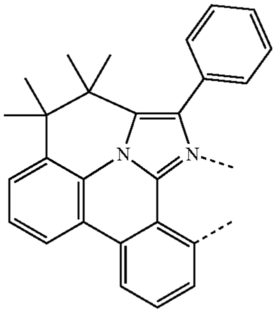

,

L$_{BB116}$

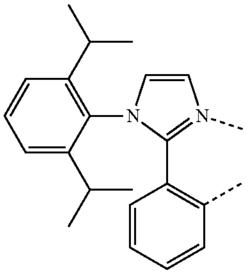

,

L$_{BB117}$

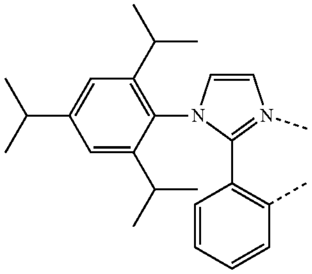

,

L$_{BB118}$

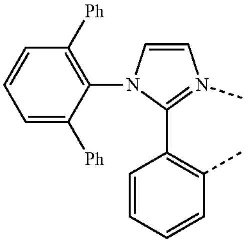

,

L$_{BB119}$

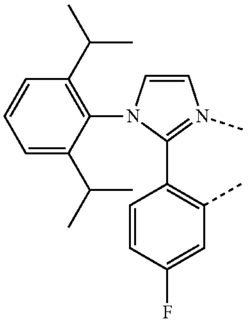

,

-continued

L$_{BB121}$

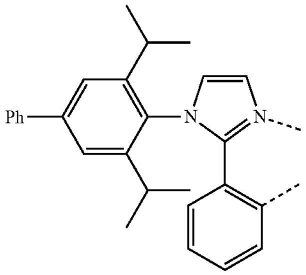

,

L$_{BB122}$

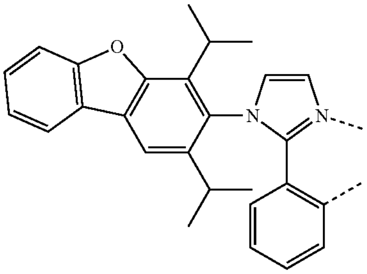

, and

L$_{BB123}$

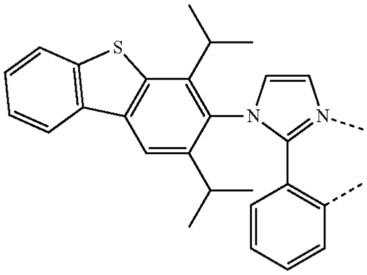

.

In some embodiments, the compound can have the formula Ir(L$_A$)(L$_{Bk}$)$_2$, Ir(L$_A$)(L$_{BBn}$)$_2$, Ir(L$_A$)$_2$(L$_{Bk}$), or Ir(L$_A$)$_2$(L$_{BBn}$), wherein k is an integer from 1 to 324 and n is an integer from 1 to 195, wherein the compound is selected from the group consisting of only those compounds whose L$_{Bk}$ or L$_{BBn}$ ligand is one of the structures in the following LIST 8:

L$_{B1}$

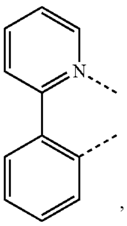

,

L$_{B2}$

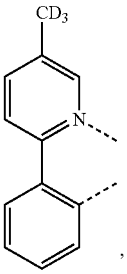

,

-continued
$L_{B18}$
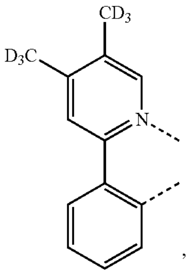
$L_{B28}$
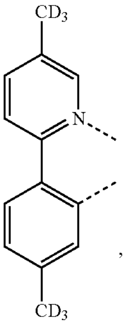
$L_{B38}$
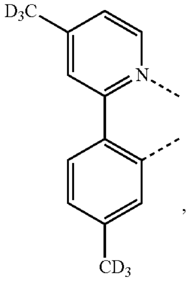
$L_{B108}$
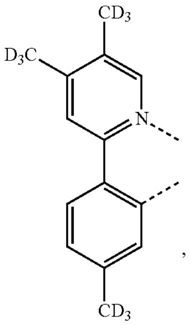
$L_{B118}$
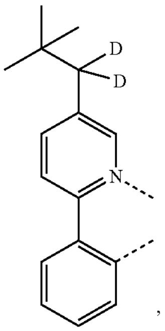
-continued
$L_{B122}$
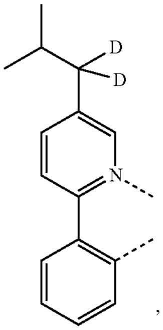
$L_{B126}$
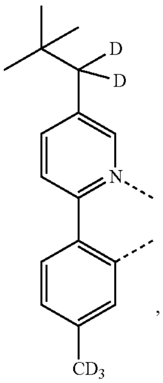
$L_{B128}$
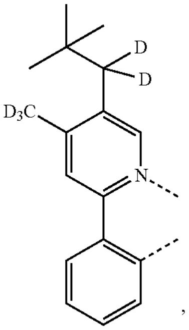
$L_{B132}$
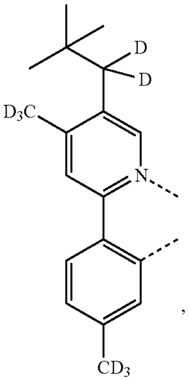

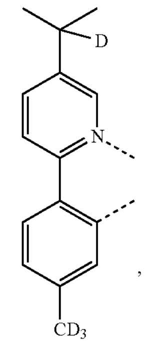
$L_{B136}$
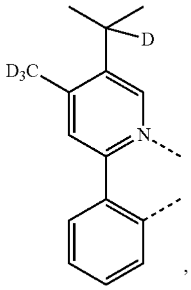
$L_{B138}$
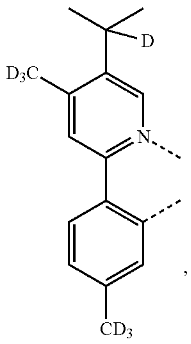
$L_{B142}$
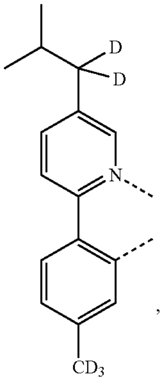
$L_{B156}$
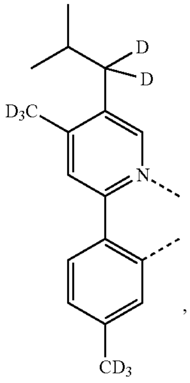
$L_{B162}$
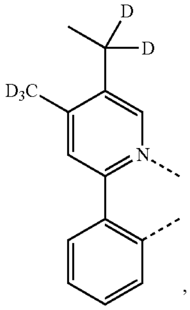
$L_{B204}$
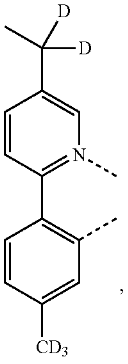
$L_{B206}$
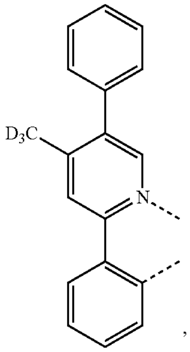
$L_{B214}$ -continued
$L_{B216}$
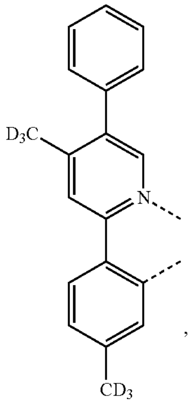
,
$L_{B218}$
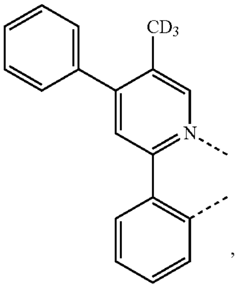
,
$L_{B220}$
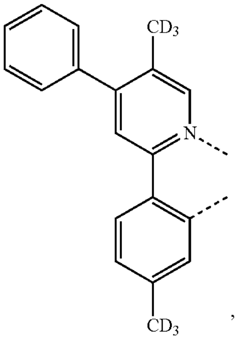
,
$L_{B231}$
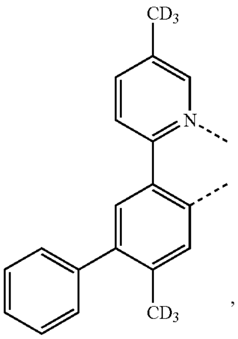
,
-continued
$L_{B233}$
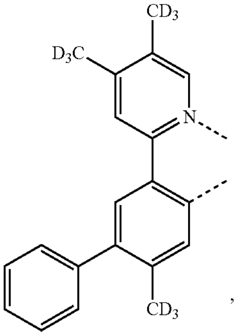
,
$L_{B237}$
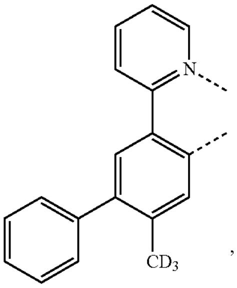
,
$L_{B238}$
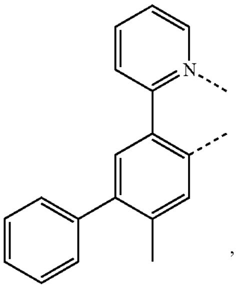
,
$L_{BB1}$
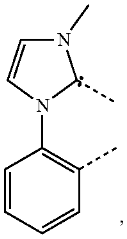
,
$L_{BB2}$
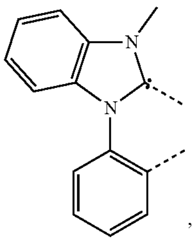
, -continued
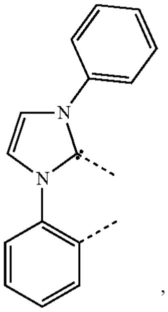
$L_{BB3}$
,
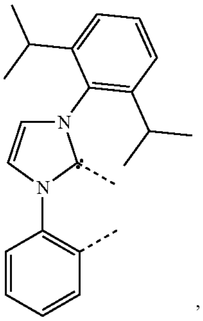
$L_{BB4}$
,
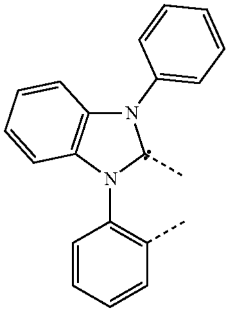
$L_{BB5}$
,
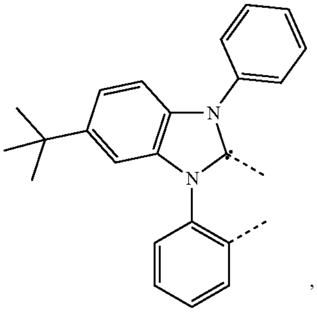
$L_{BB6}$
,
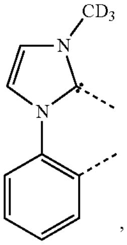
$L_{BB13}$
,
-continued
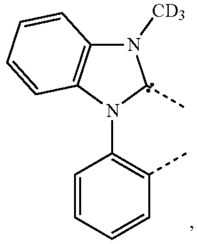
$L_{BB14}$
,
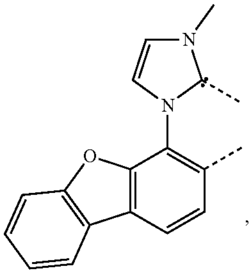
$L_{BB18}$
,
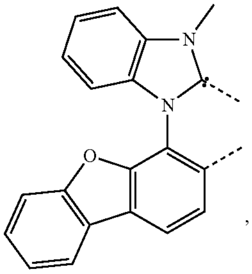
$L_{BB20}$
,
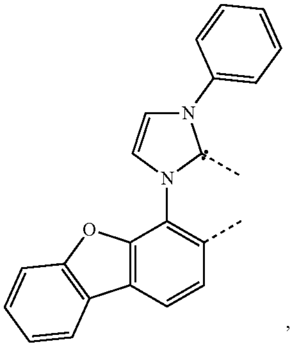
$L_{BB22}$
,
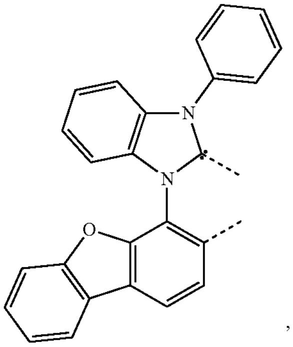
$L_{BB24}$
, -continued
$L_{BB34}$
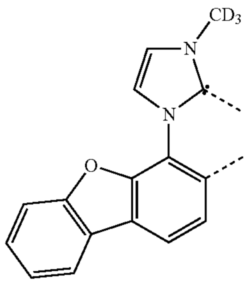
,
$L_{BB37}$
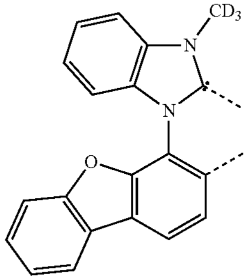
,
$L_{BB103}$
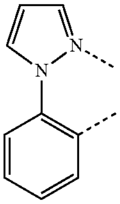
,
$L_{BB104}$
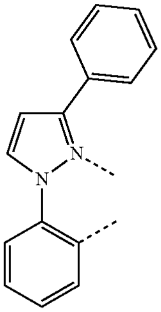
,
$L_{BB105}$
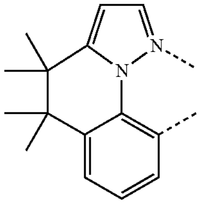
,
-continued
$L_{BB106}$
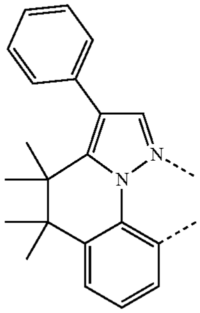
,
$L_{BB107}$
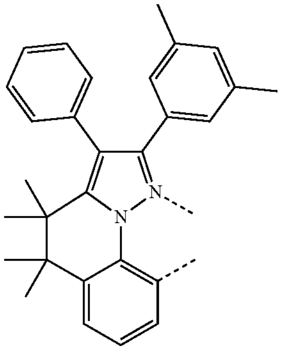
,
$L_{BB113}$
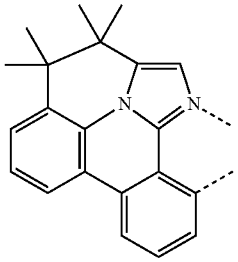
,
$L_{BB115}$
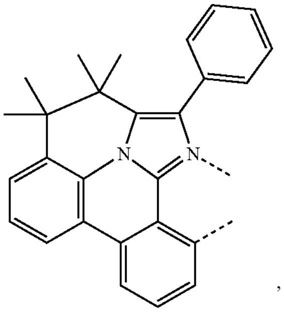
,
$L_{BB116}$
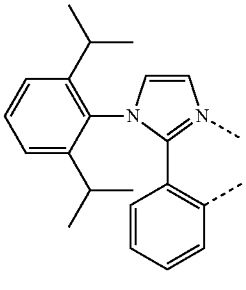
, and -continued $L_{BB121}$

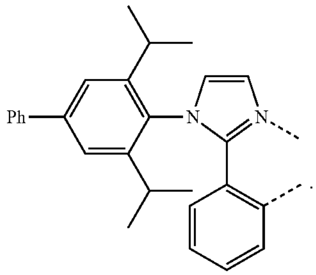

In some embodiments, the compound can have the formula $Ir(L_A)_2(L_{Cj\text{-}I})$, or $Ir(L_A)_2(L_{Cj\text{-}II})$, wherein j is an integer from 1 to 1416, wherein the compound is selected from the group consisting of only those compounds having $L_{Cj\text{-}I}$ or $L_{Cj\text{-}II}$ ligand whose corresponding $R^{201}$ and $R^{202}$ are defined to be one the following structures in LIST 6a.

$R^{D1}$

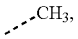

$R^{D3}$

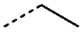, $R^{D4}$

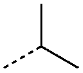, $R^{D5}$

, $R^{D9}$

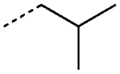, $R^{D10}$

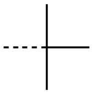, $R^{D17}$

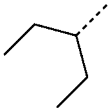, $R^{D18}$

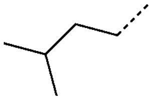, $R^{D20}$

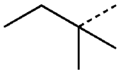, $R^{D22}$

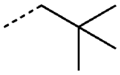, $R^{D37}$

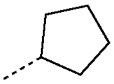,

-continued $R^{D40}$

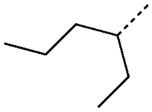, $R^{D41}$

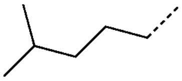, $R^{D42}$

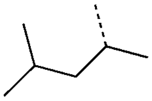, $R^{D43}$

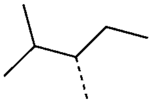, $R^{D48}$

, $R^{D49}$

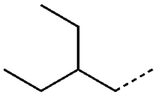, $R^{D50}$

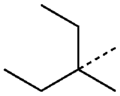, $R^{D54}$

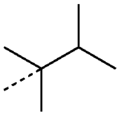, $R^{D55}$

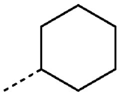, $R^{D58}$

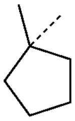, $R^{D59}$

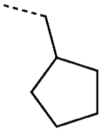, $R^{D78}$

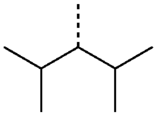, $R^{D79}$

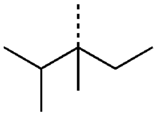,

-continued
$R^{D81}$
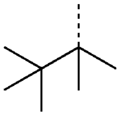,
$R^{D87}$
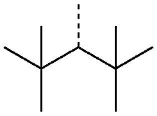,
$R^{D88}$
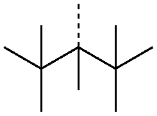,
$R^{D89}$
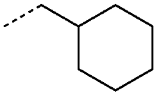,
$R^{D93}$
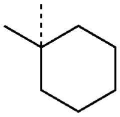,
$R^{D116}$
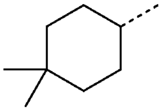,
$R^{D117}$
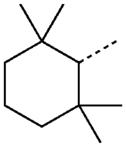,
$R^{D118}$
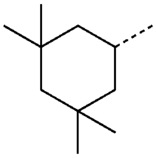,
$R^{D119}$
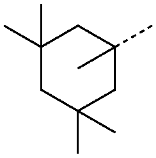,
$R^{D120}$
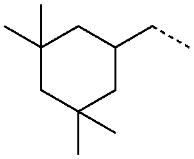,
-continued
$R^{D133}$
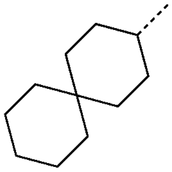,
$R^{D134}$
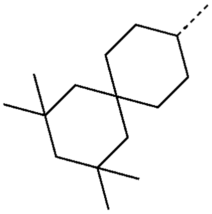,
$R^{D135}$
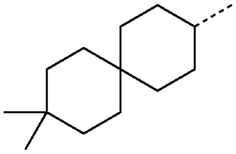,
$R^{D136}$
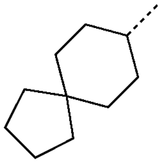,
$R^{D143}$
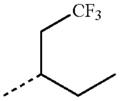,
$R^{D144}$
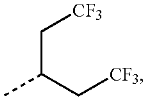
$R^{D145}$
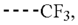
$R^{D146}$
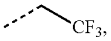
$R^{D147}$
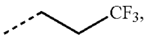
$R^{D149}$
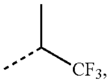
$R^{D151}$
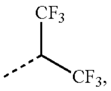
$R^{D154}$
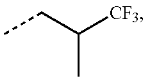
$R^{D155}$
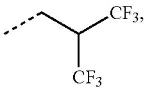

-continued
$R^{D161}$
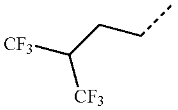
,
$R^{D175}$
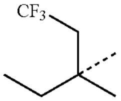
,
$R^{D190}$
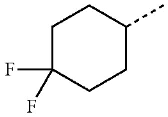
,
$R^{D193}$
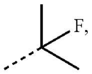
$R^{D200}$
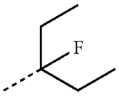
,
$R^{D201}$
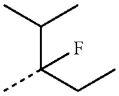
,
$R^{D206}$
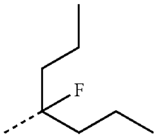
,
$R^{D210}$
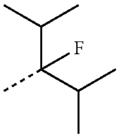
,
$R^{D214}$
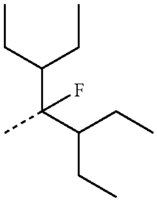
,
$R^{D215}$
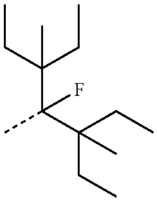
,
-continued
$R^{D216}$
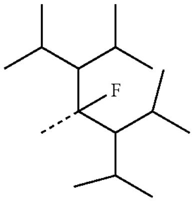
,
$R^{D218}$
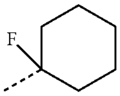
,
$R^{D219}$
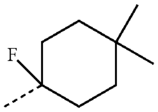
,
$R^{D220}$
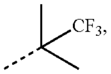
$R^{D227}$
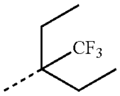
,
$R^{D237}$
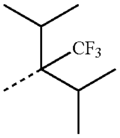
,
$R^{D241}$
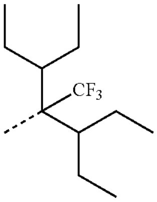
,
$R^{D242}$
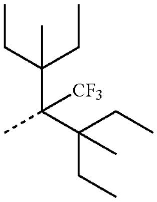
,
$R^{D245}$
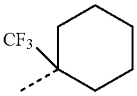
, and
$R^{D246}$
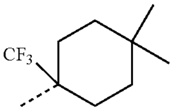
.
In some embodiments, the compound can have the formula $Ir(L_A)_2(L_{Cj-I})$, or $Ir(L_A)_2(L_{Cj-II})$, wherein j is an integer from 1 to 1416, wherein the compound is selected from the group consisting of only those compounds having $L_{Cj-I}$ or $L_{Cj\text{-}II}$ ligand whose corresponding $R^{201}$ and $R^{202}$ are defined to be one the following structures in LIST 6b:
$R^{D1}$
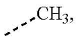
$R^{D3}$
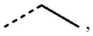
$R^{D4}$
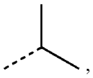
$R^{D5}$
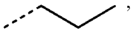
$R^{D9}$
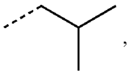
$R^{D17}$
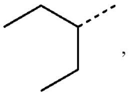
$R^{D22}$
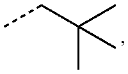
$R^{D43}$
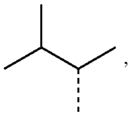
$R^{D50}$
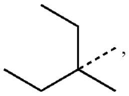
$R^{D76}$
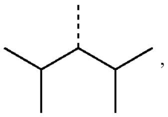
$R^{D116}$
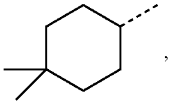
$R^{D118}$
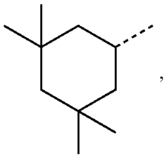
$R^{D133}$
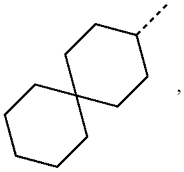
-continued
$R^{D134}$
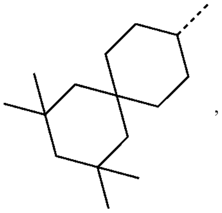
$R^{D135}$
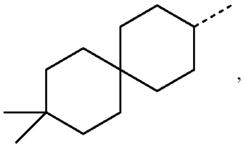
$R^{D136}$
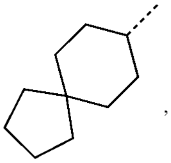
$R^{D143}$
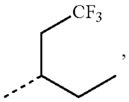
$R^{D144}$
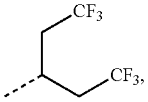
$R^{D145}$
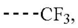
$R^{D146}$
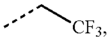
$R^{D149}$
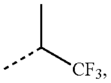
$R^{D151}$
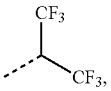
$R^{D154}$
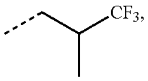
$R^{D155}$
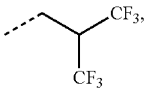
$R^{D190}$
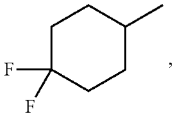
$R^{D193}$
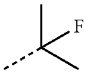

-continued $R^{D200}$

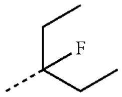

$R^{D214}$

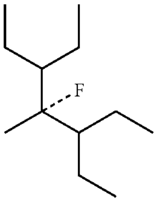

, $R^{D218}$

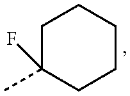

, $R^{D220}$

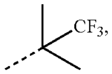

$R^{D241}$

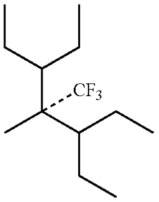

, and $R^{D245}$

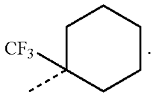

.

In some embodiments, the compound can have the formula $Ir(L_A)_2(L_{Cj\text{-}I})$, wherein j is an integer from 1 to 1416 and the compound is selected from the group consisting of only those compounds having one of the structures in the following LIST 6c for the $L_{Cj\text{-}I}$ ligand:

$L_{C1\text{-}I}$

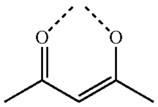

, $L_{C4\text{-}I}$

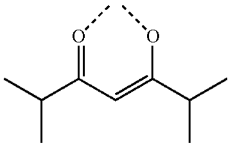

, $L_{C9\text{-}I}$

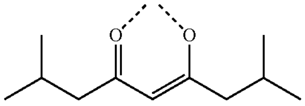

,

-continued $L_{C10\text{-}I}$

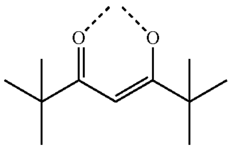

$L_{C17\text{-}I}$

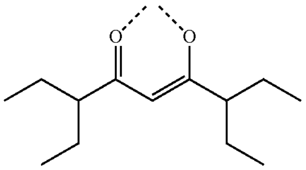

, $L_{C55\text{-}I}$

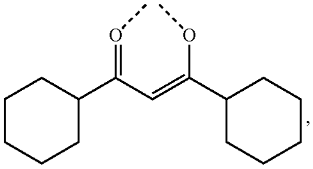

, $L_{C116\text{-}I}$

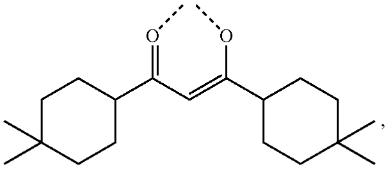

, $L_{C50\text{-}I}$

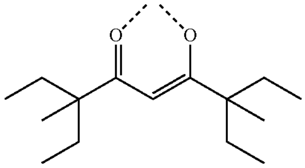

, $L_{C190\text{-}I}$

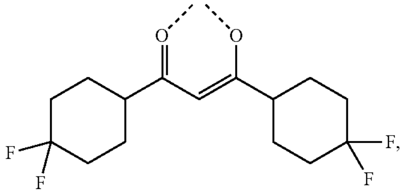

$L_{C144\text{-}I}$

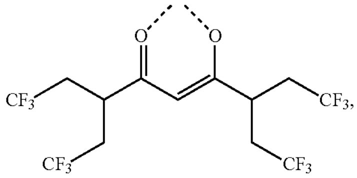

$L_{C145\text{-}I}$

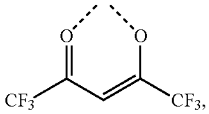

$L_{C143\text{-}I}$

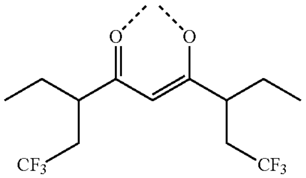

,

-continued
$L_{C232-I}$
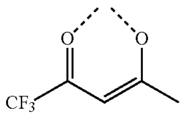,
$L_{C279-I}$
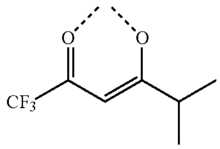,
$L_{C325-I}$
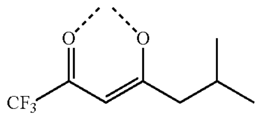,
$L_{C414-I}$
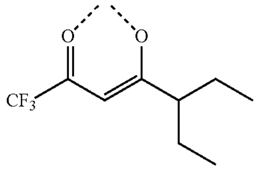,
$L_{C457-I}$
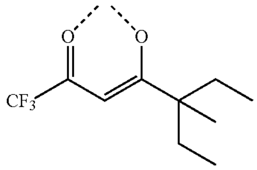,
$L_{C230-I}$
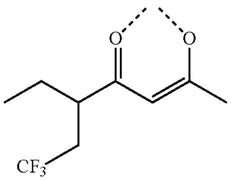,
$L_{C277-I}$
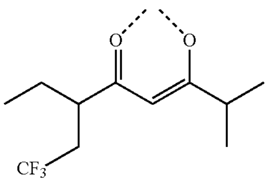,
$L_{C412-I}$
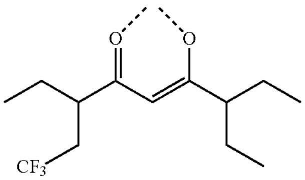,
$L_{C231-I}$
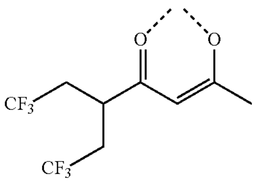,
-continued
$L_{C278-I}$
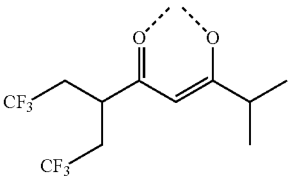,
$L_{C413-I}$
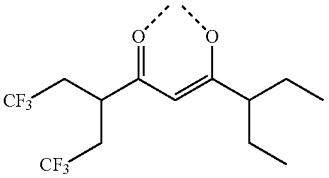,
$L_{C985-I}$
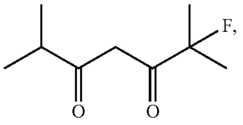
$L_{C1093-I}$
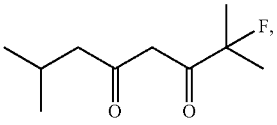
$L_{C823-I}$
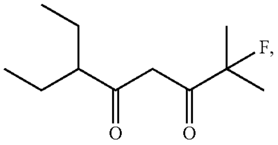
$L_{C1039-I}$
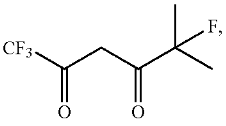
$L_{C1147-I}$
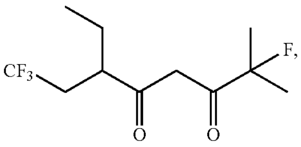
$L_{C1012-I}$
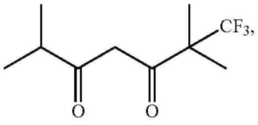
$L_{C1120-I}$
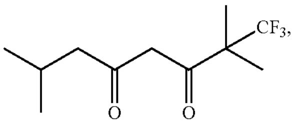
$L_{C850-I}$
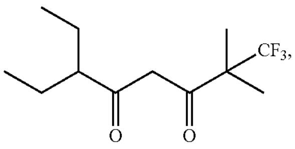

-continued
$L_{C1066-I}$
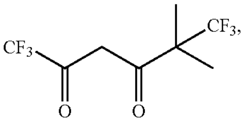
$L_{C1174-I}$
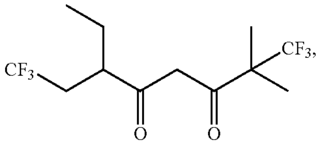
$L_{C769-I}$
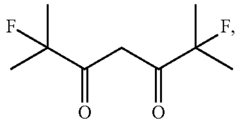
$L_{C1201-I}$
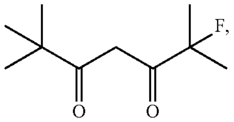
$L_{C796-I}$
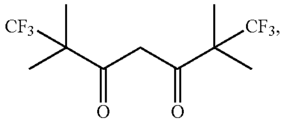
$L_{C1228-I}$
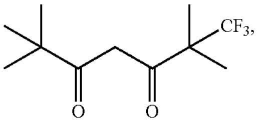
$L_{C803-I}$
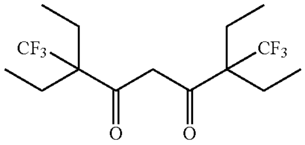
and
$L_{C776-I}$
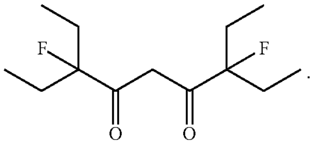
In some embodiments, the compound can be selected from the group consisting of the structures below in LIST 9a:
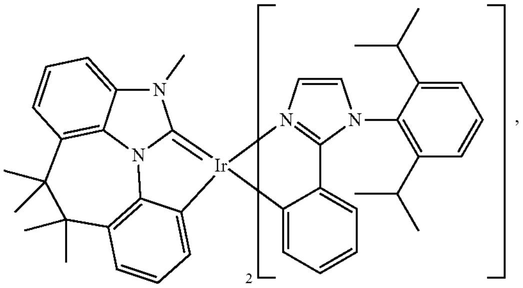
-continued
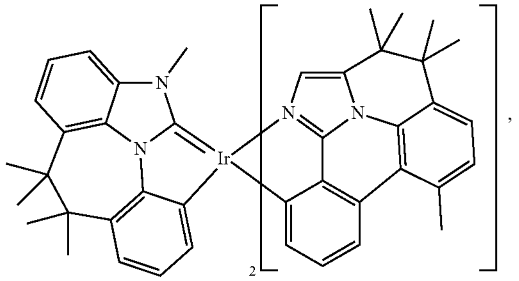
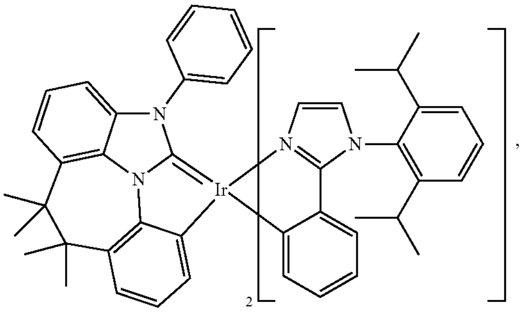
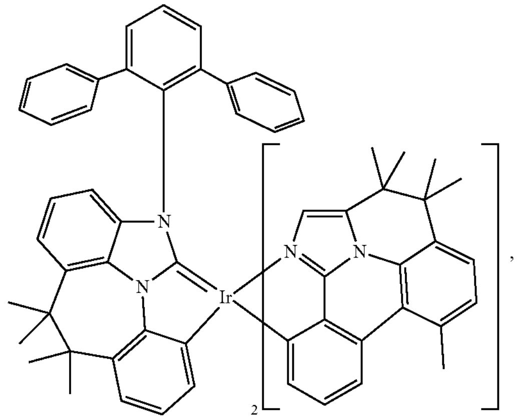
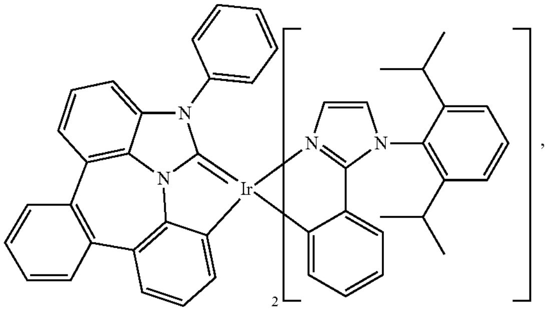
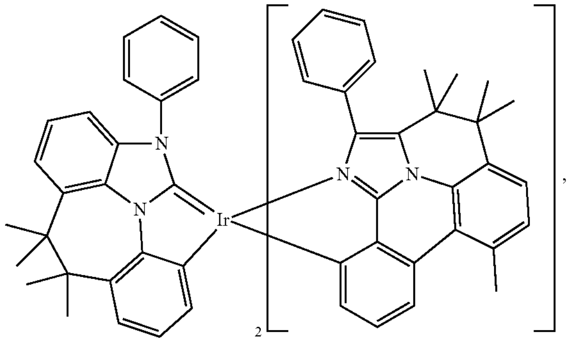

-continued
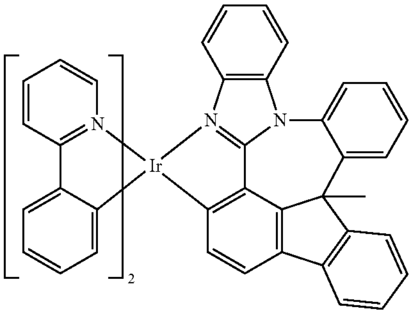
,
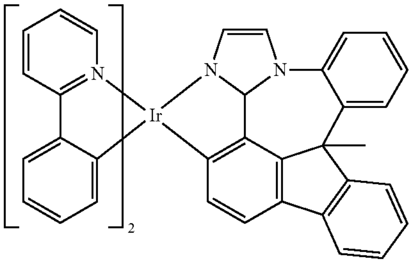
,
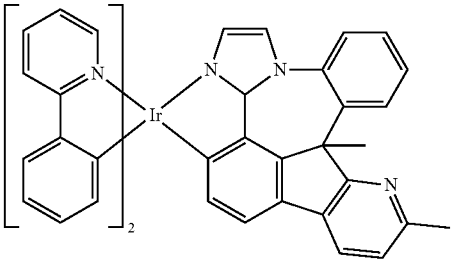
,
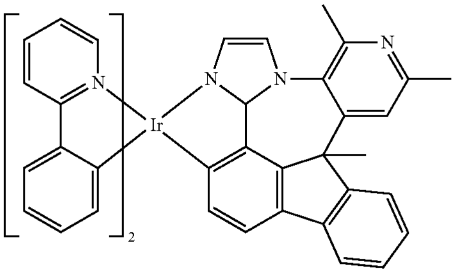
,
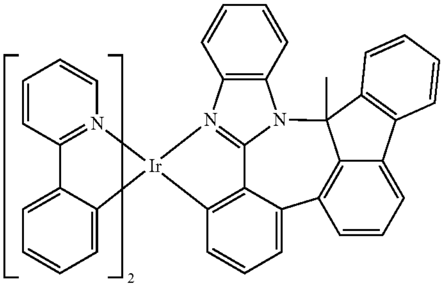
,
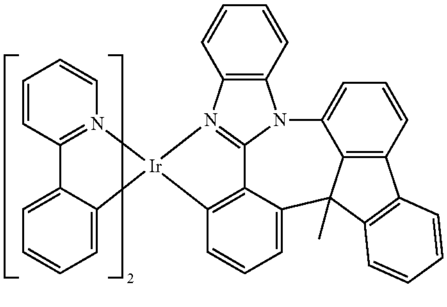
,
-continued
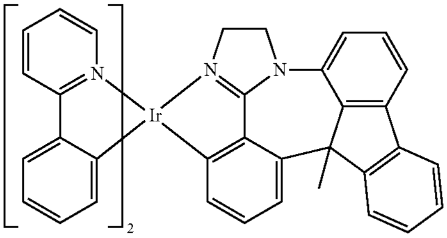
,
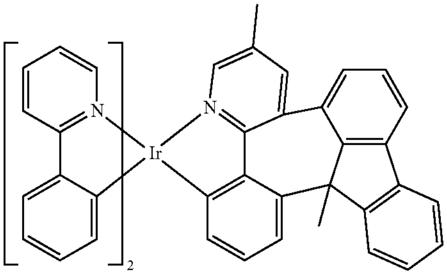
,
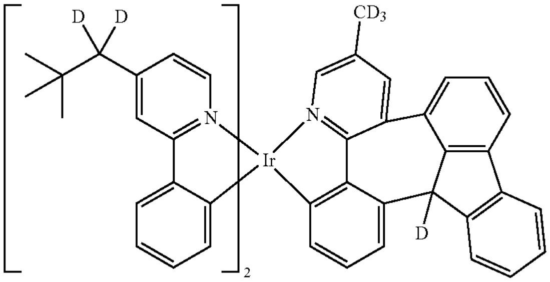
,
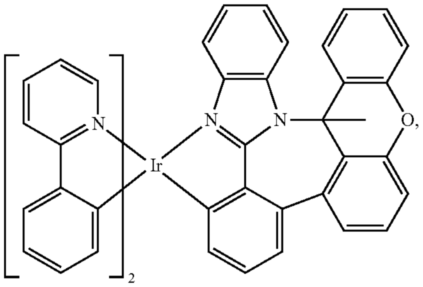
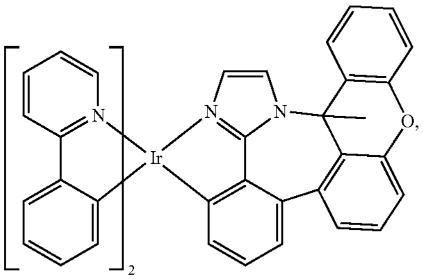
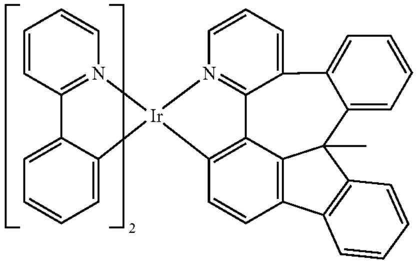
, -continued
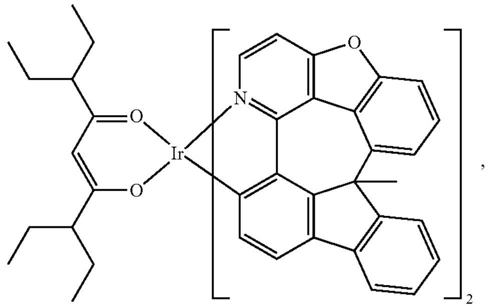
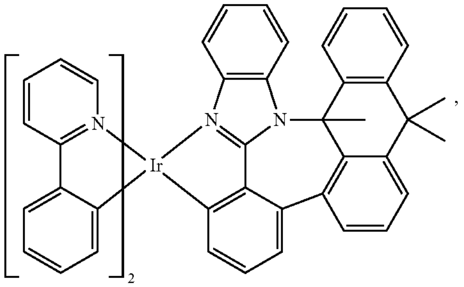
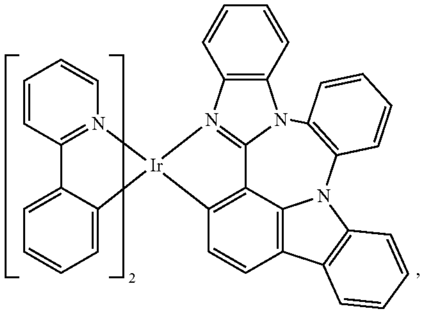
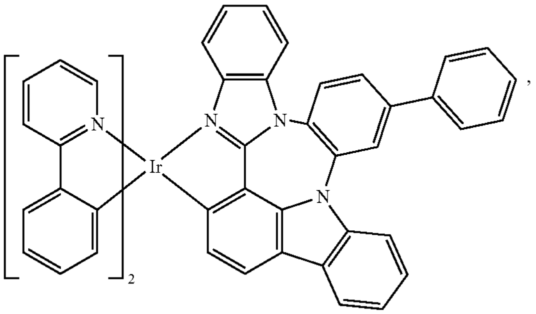
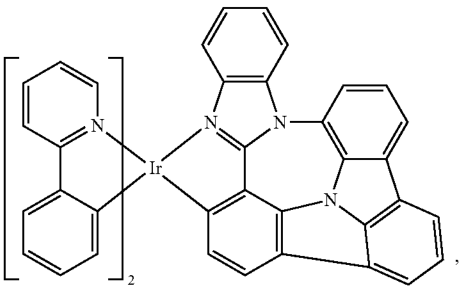
-continued
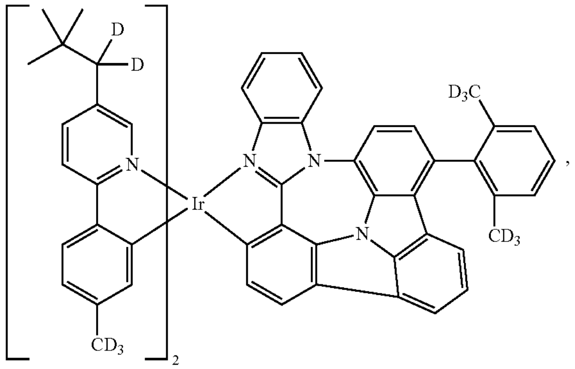
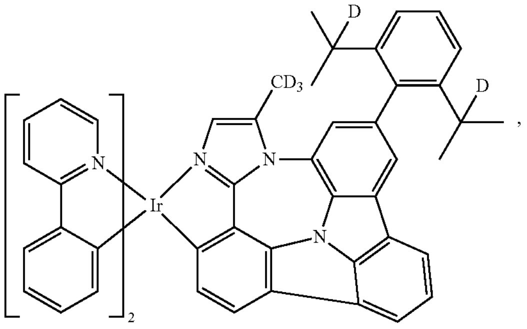
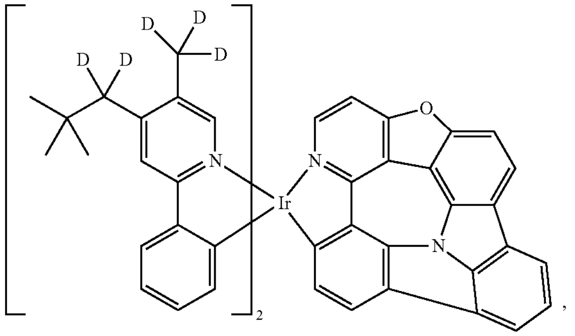
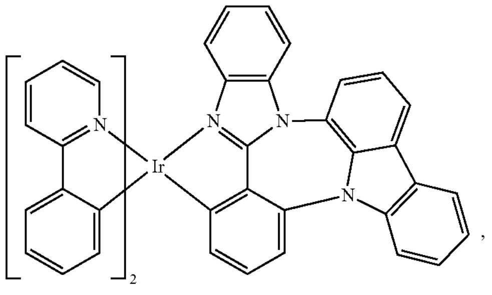
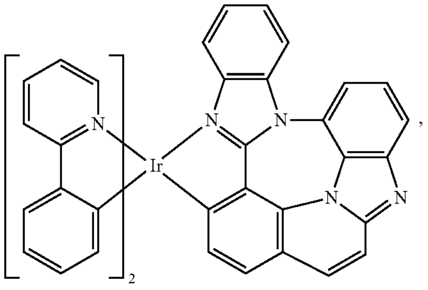

-continued
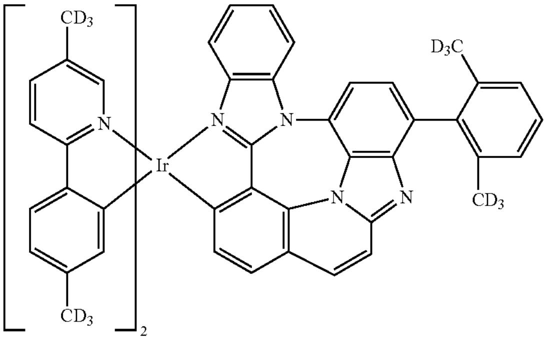
,
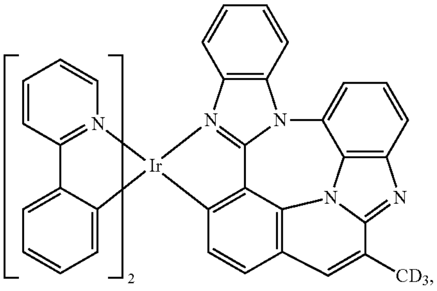
,
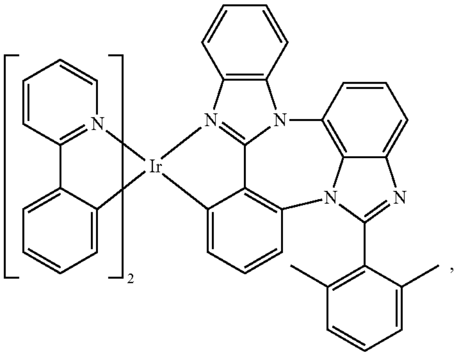
,
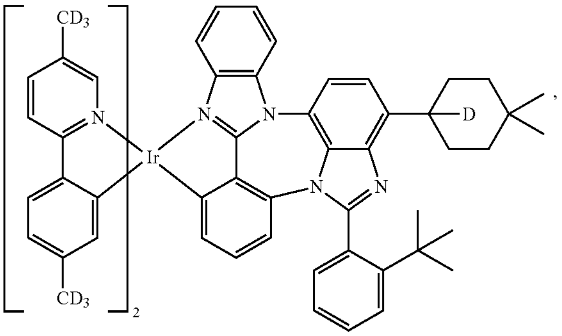
,
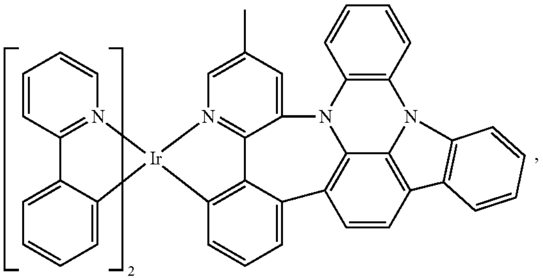
,
-continued
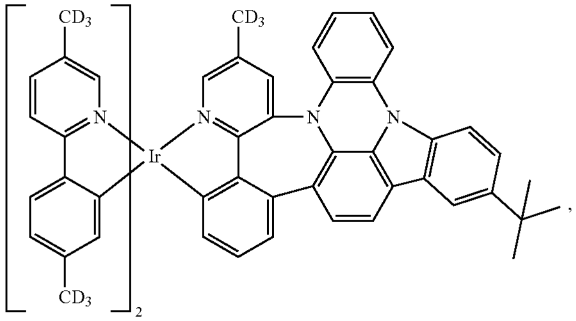
,
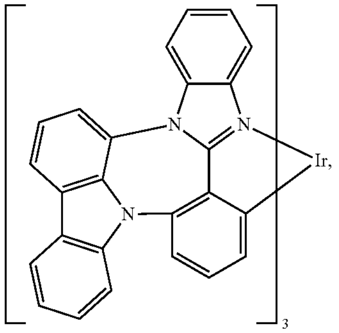
,
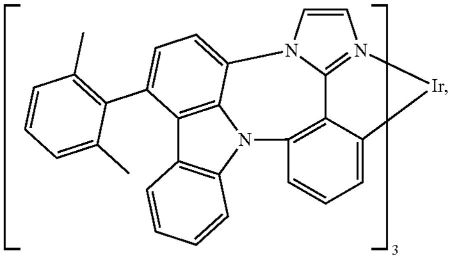
,
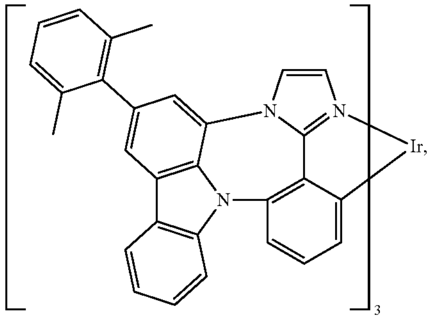
,
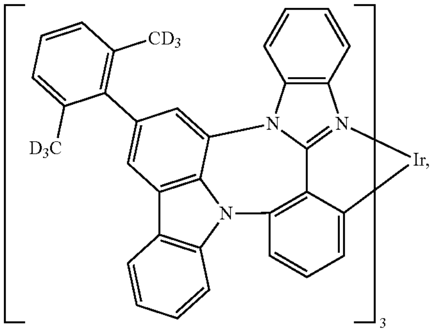
, -continued
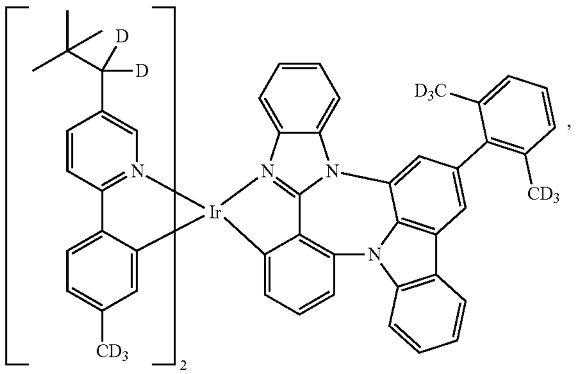
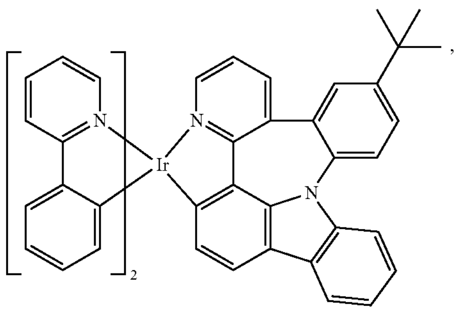
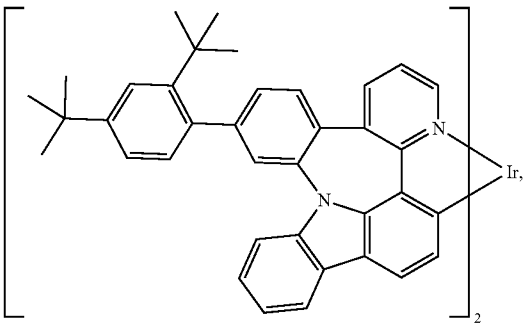
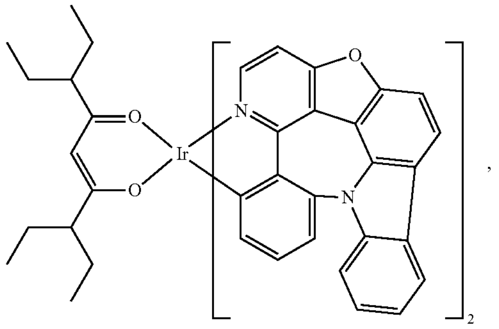
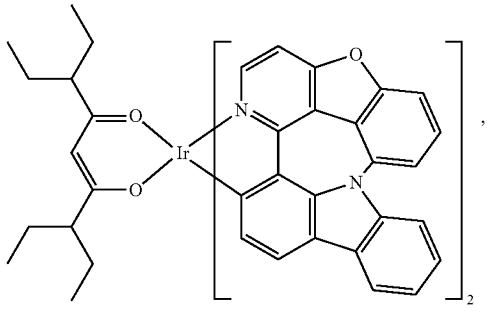
-continued
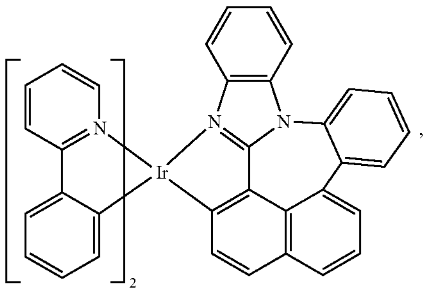
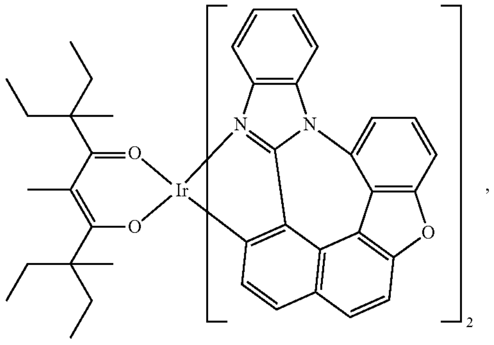
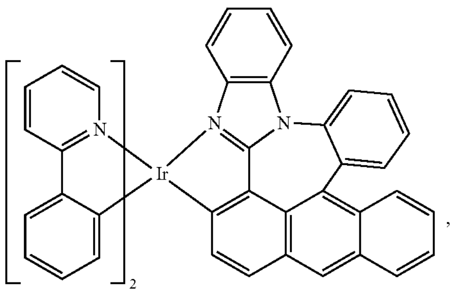
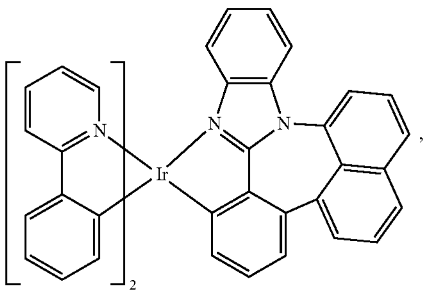
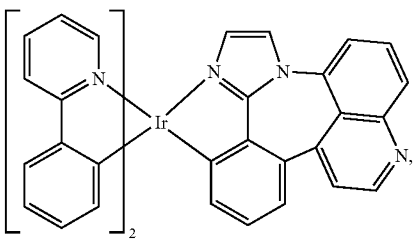

-continued
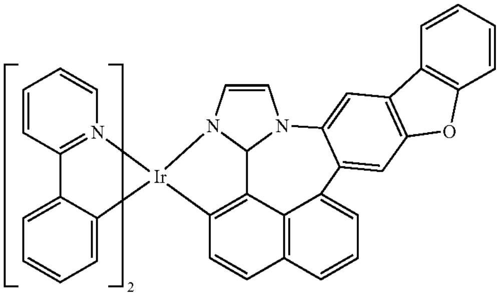
,
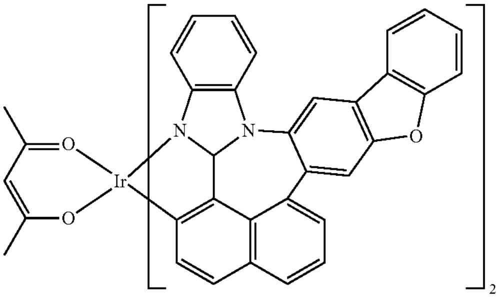
,
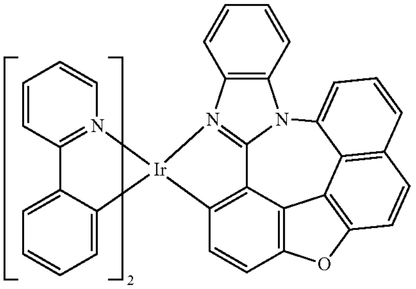
,
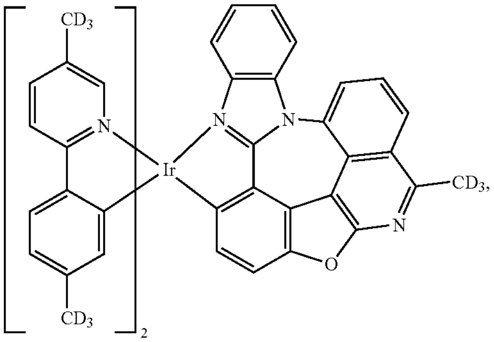
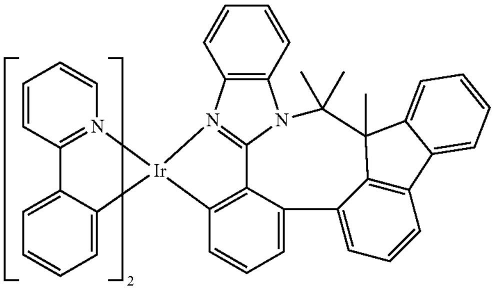
,
-continued
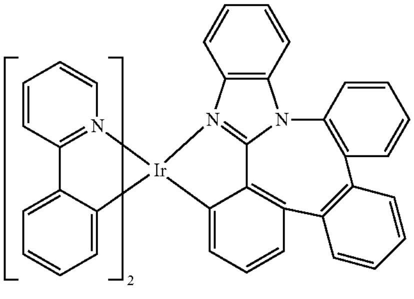
,
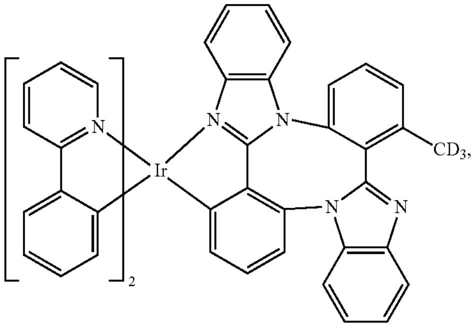
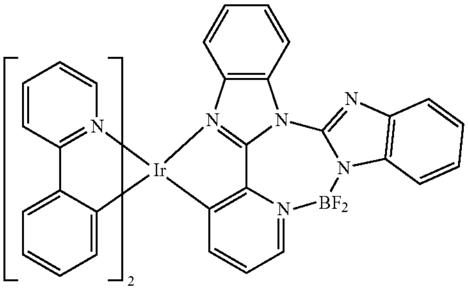
,
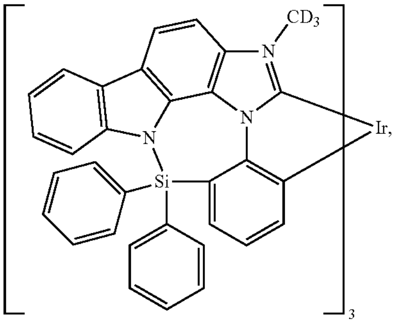
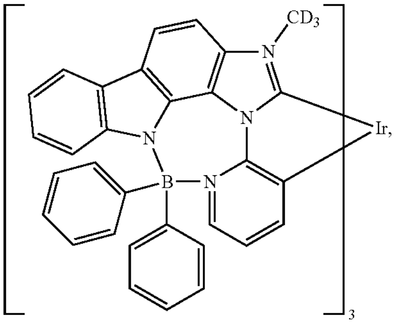

-continued
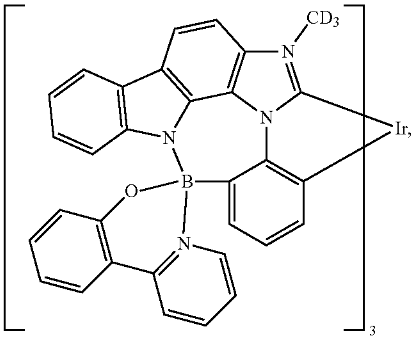
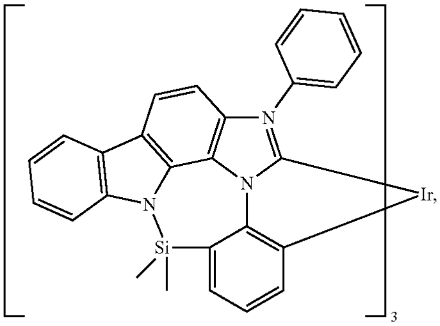
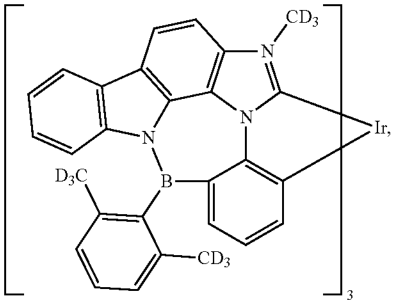
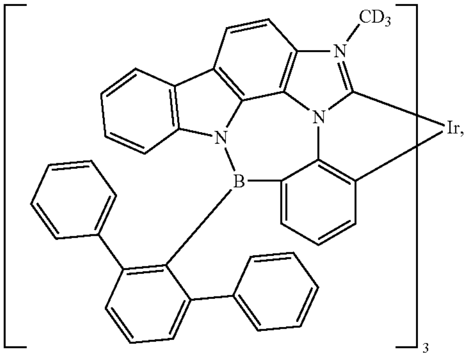
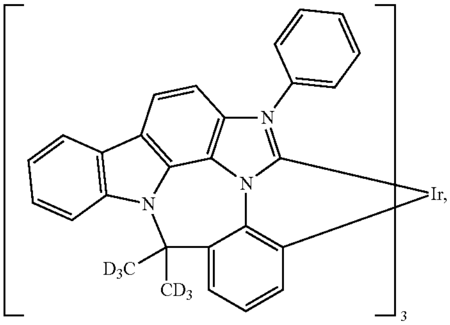
-continued
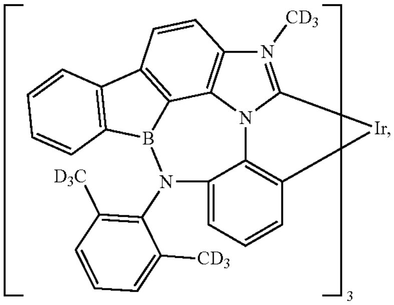
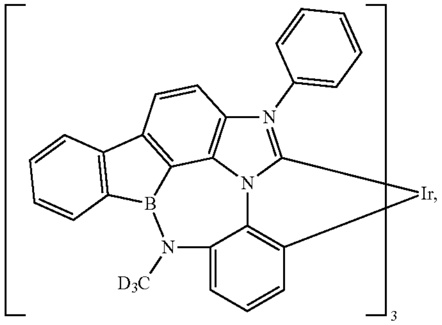
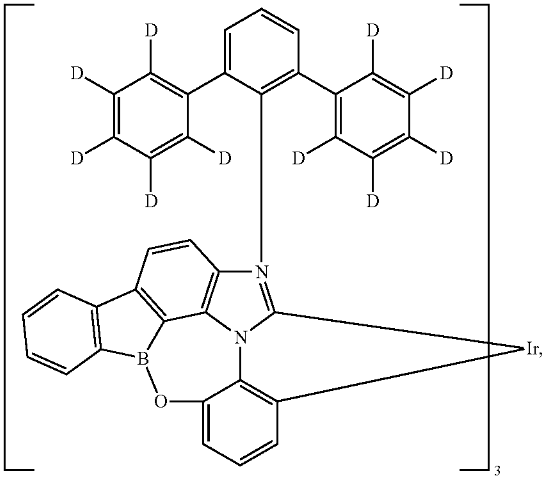
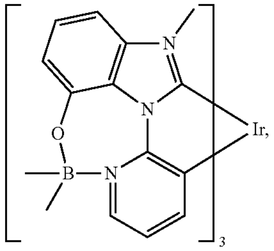
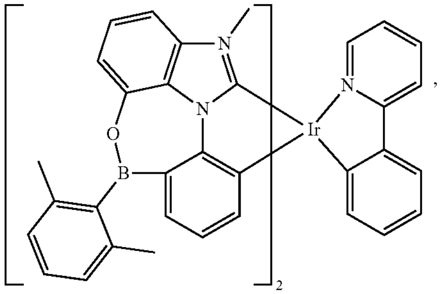

-continued

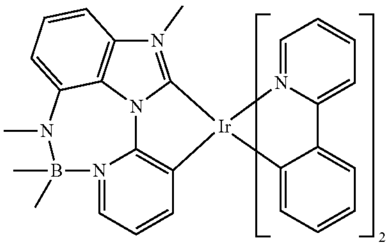

,

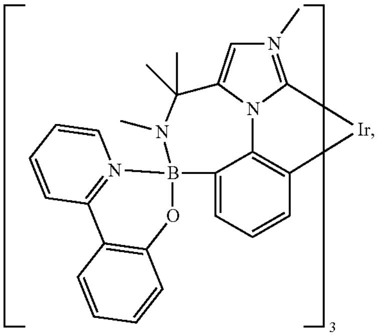

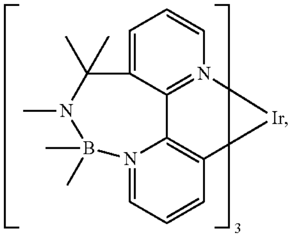

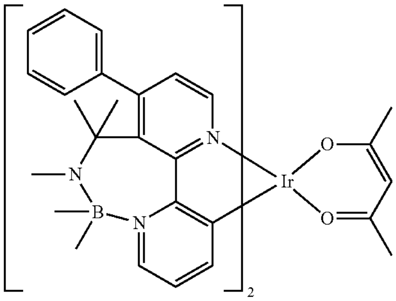

,

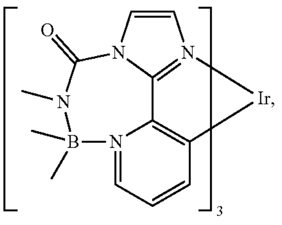

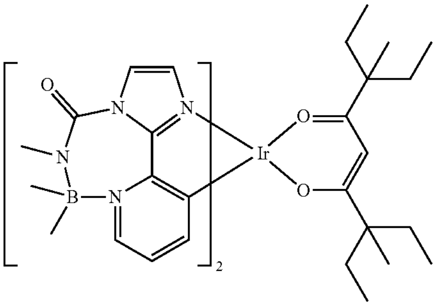

,

-continued

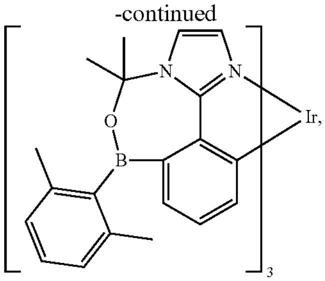

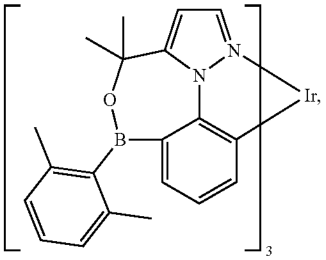

and

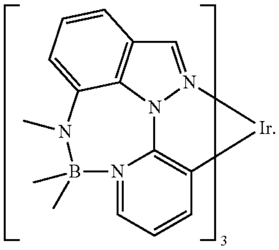

In some embodiments, the compound can have a structure of

Formula II

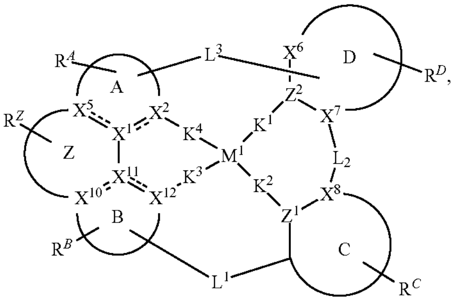

wherein:

$M^1$ is Pd or Pt;

moieties C and D are each independently a monocyclic or polycyclic ring structure comprising 5-membered and/or 6-membered carbocyclic or heterocyclic rings;

$Z^1$ and $Z^2$ are each independently C or N;

$K^1$, $K^2$, $K^3$, and $K^4$ are each independently selected from the group consisting of a direct bond, 0, and S, wherein at least two of them are direct bonds;

$L^1$, $L^2$, and $L^3$ are each independently selected from the group consisting of a single bond, absent a bond, O, Se, S, SO, $SO_2$, C═0, C═CR"R"', C═NR", CR"R"', SiR"R"', BR", P(O)R", and NR", wherein at least one of $L^1$ and $L^2$ is present;

$X^6$-$X^8$ are each independently C or N;

$R^C$ and $R^D$ each independently represents zero, mono, or up to the maximum allowed number of substitutions to its associated ring;

each of R'', R''', $R^C$, and $R^D$ is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof;

any two adjacent R, R'', $R^A$, $R^B$, $R^C$, $R^D$, or $R^Z$ can be joined or fused together to form a ring where chemically feasible; and the remaining variables are the same as previously defined.

In some embodiments, moiety E and moiety F can be both 6-membered aromatic rings. In some embodiments, moiety F is a 5-membered or 6-membered heteroaromatic ring.

In some embodiments, $Z^2$ can be N and $Z^1$ can be C. In some embodiments, $Z^2$ can be C and $Z^1$ can be N.

In some embodiments, $L^2$ can be a direct bond. In some embodiments, $L^1$ can be O or CR'R''. In some embodiments, $L^2$ can be NR'.

In some embodiments, $K^1$ and $K^2$ can be both direct bonds. In some embodiments, $K^1$, $K^2$, and $K^3$ can be each a direct bond. In some embodiments, $K^1$, $K^2$, $K^3$, and $K^4$ can be each a direct bond. In some embodiments, one of $K^1$, $K^2$, $K^3$, and $K^4$ can be O. In some embodiments, one of $K^1$ and $K^2$ can be O. In some embodiments, one of $K^3$ and $K^4$ can be O.

In some embodiments, $X^6$-$X^8$ can be all C.

In some embodiments, the compound can be selected from the group consisting of the following structures in LIST 9:

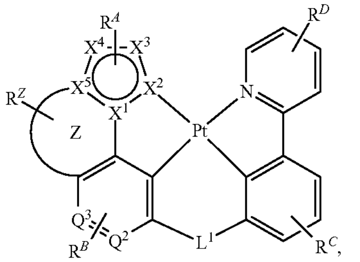

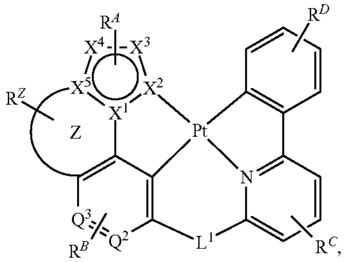

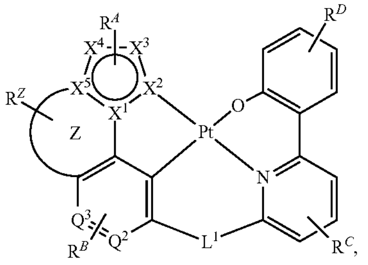

-continued

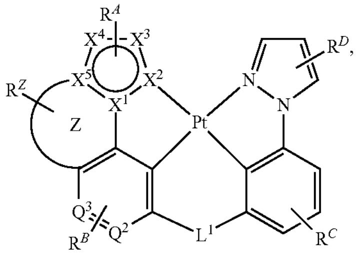

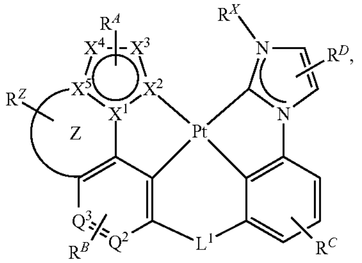

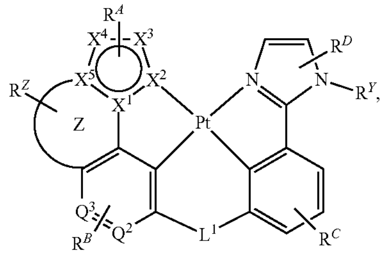

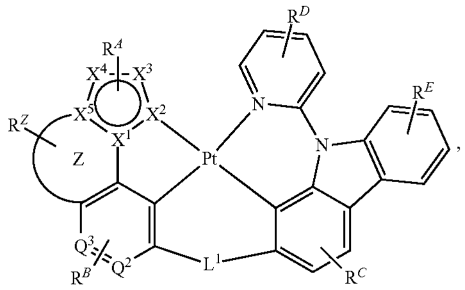

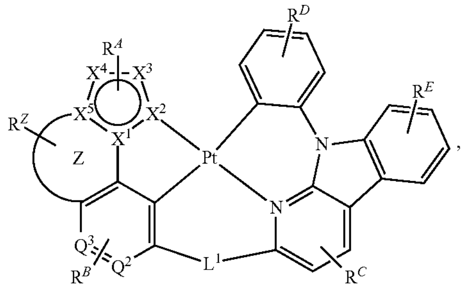

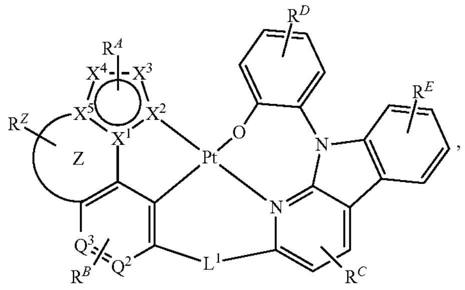

-continued
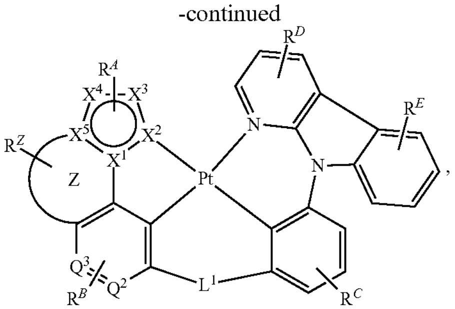
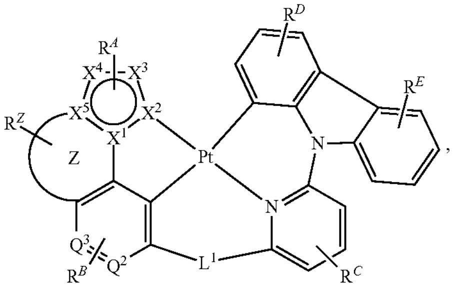
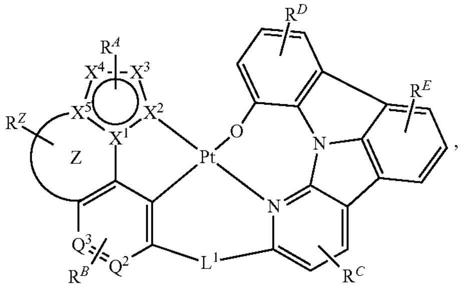
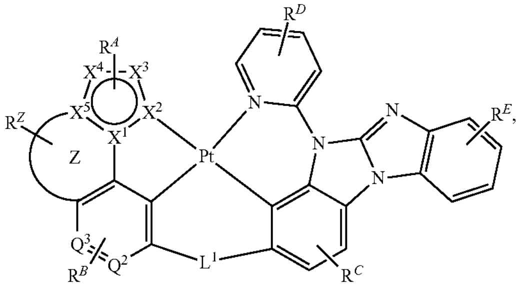
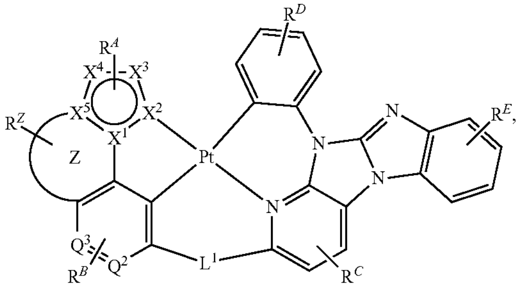
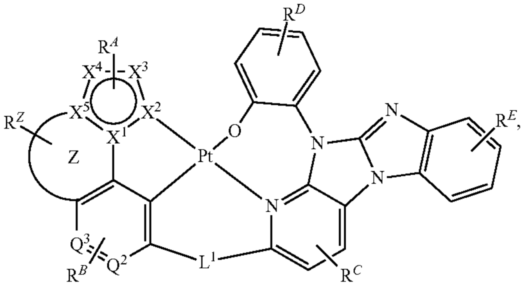
-continued
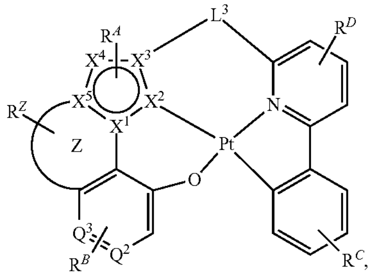
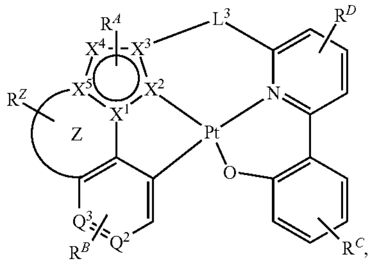
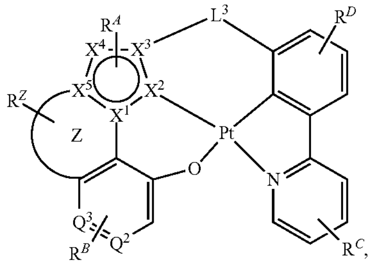
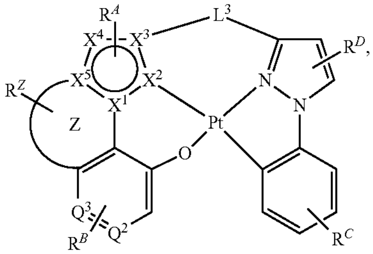
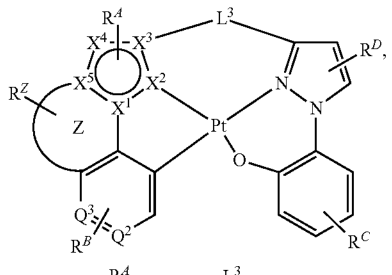
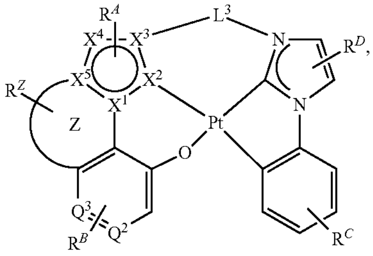

-continued
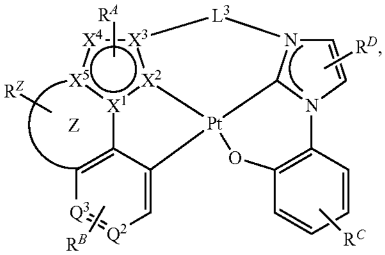
,
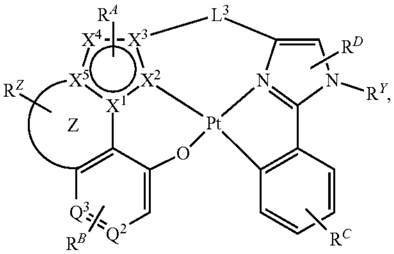
,
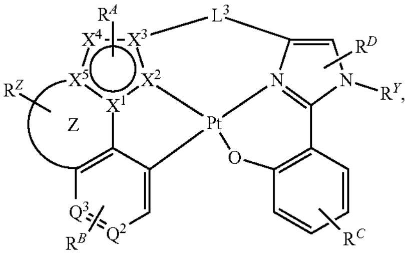
,
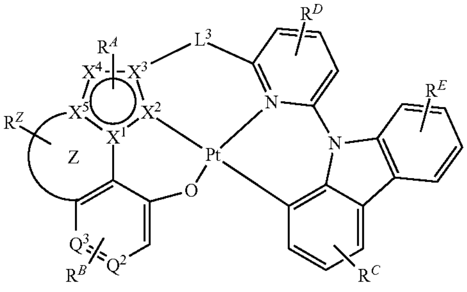
,
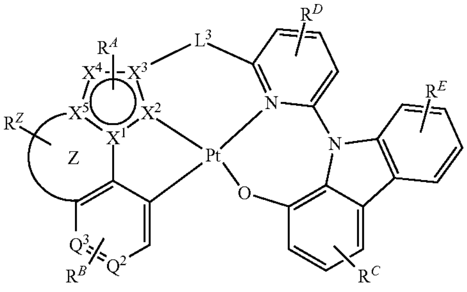
,
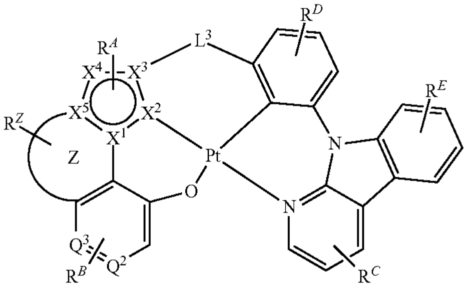
,
-continued
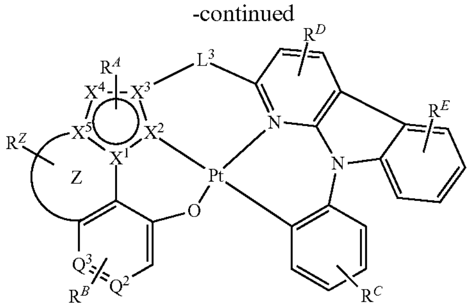
,
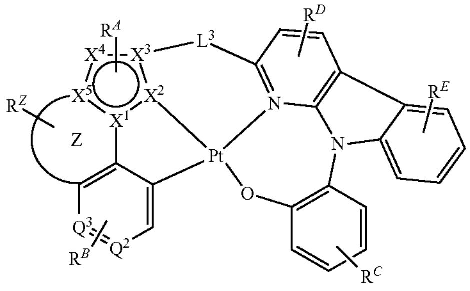
,
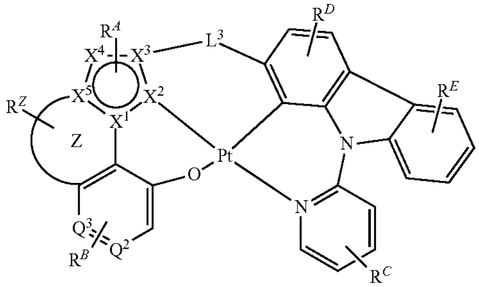
,
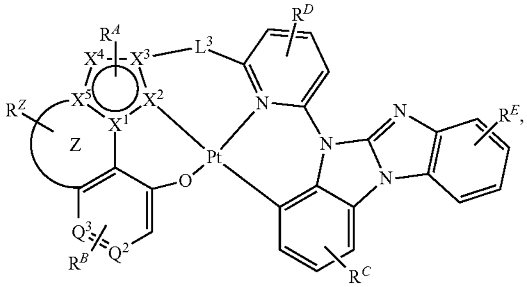
,
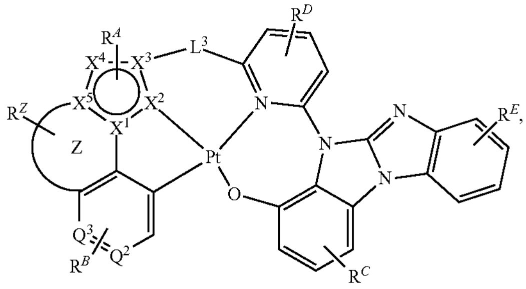
,
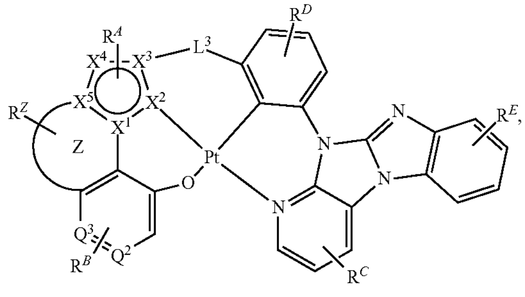
, -continued
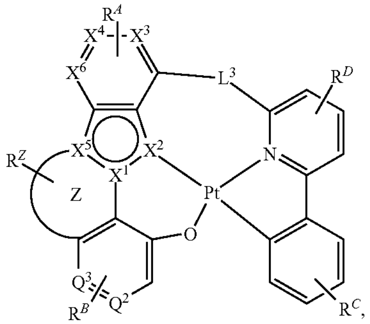
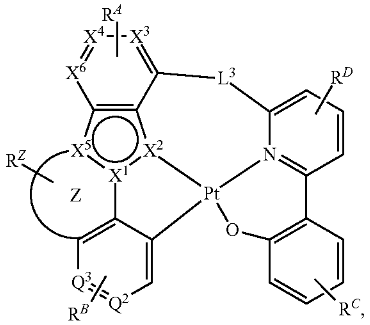
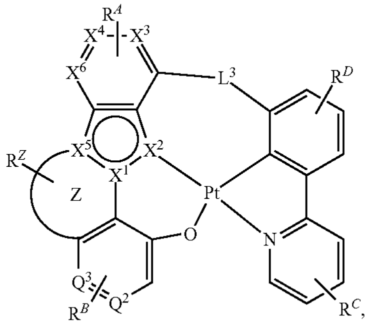
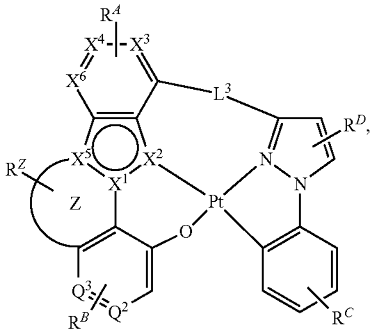
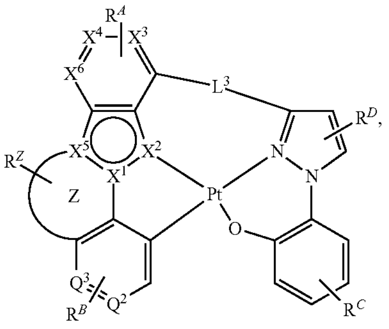
-continued
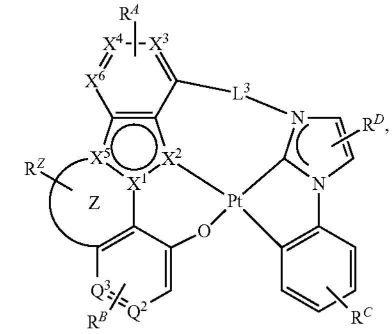
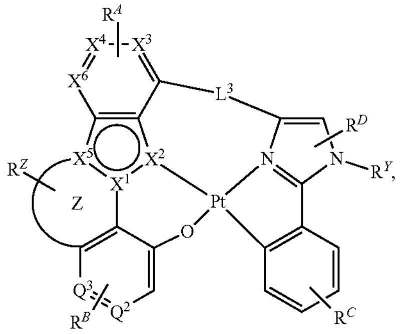
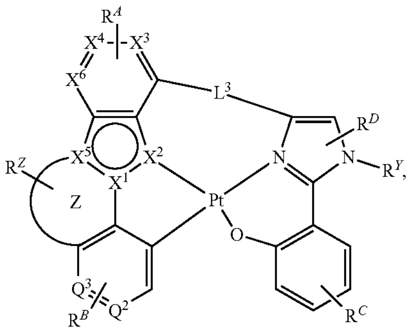
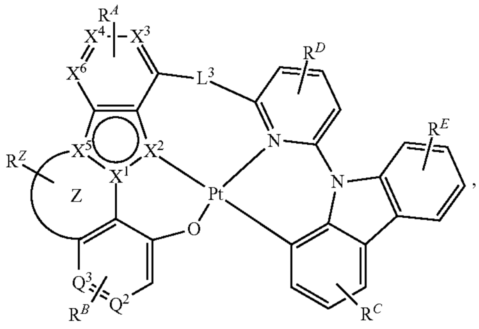
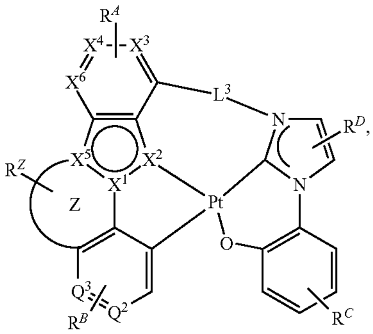

-continued
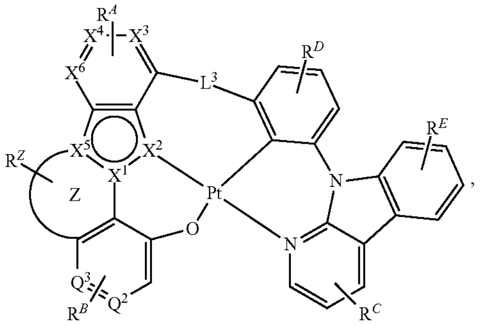
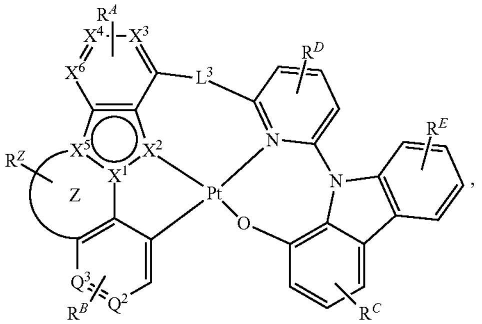
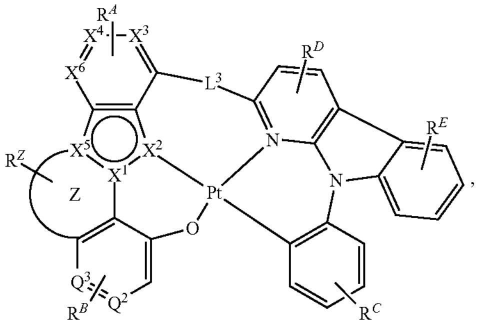
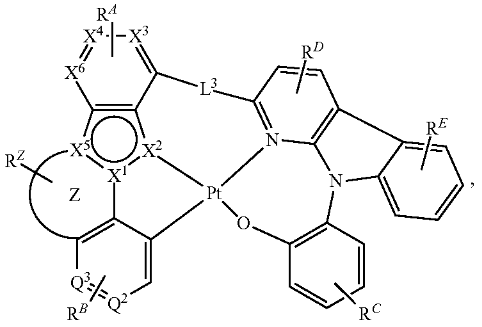
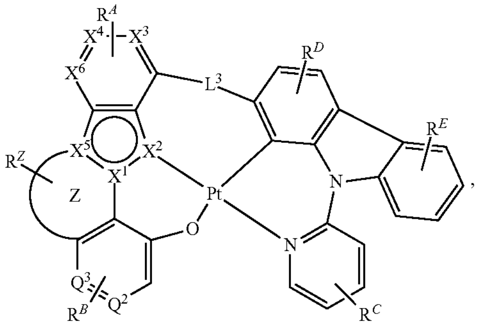
-continued
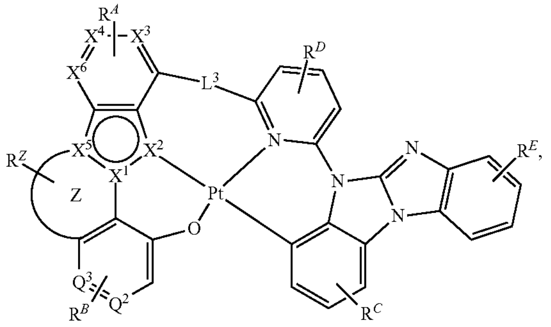
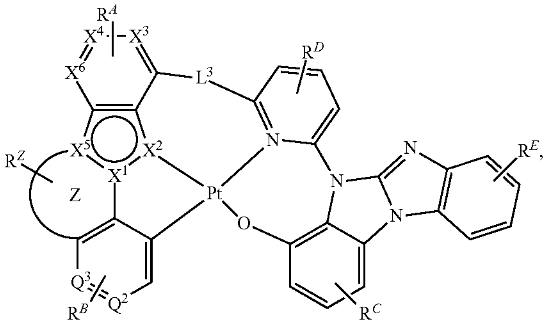
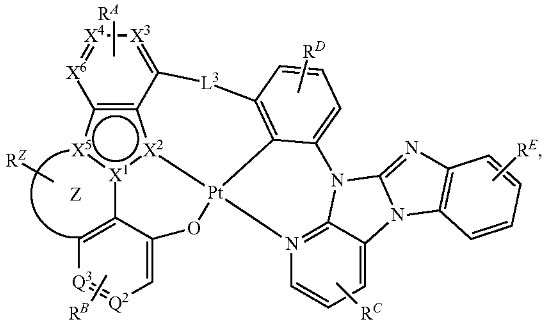
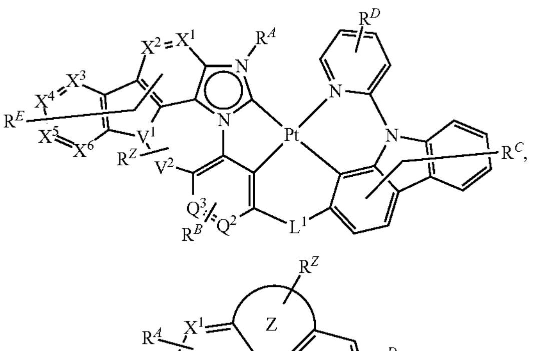
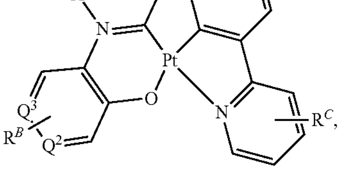

-continued

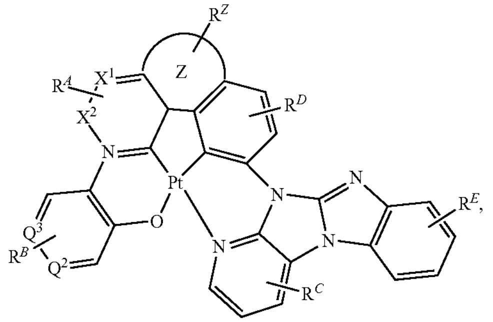

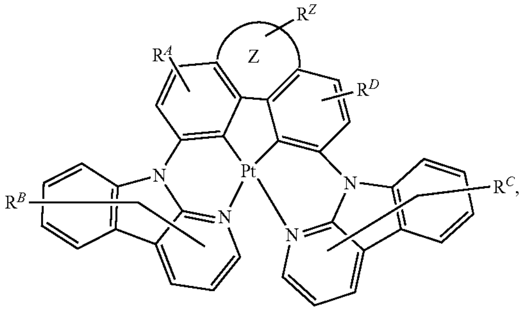

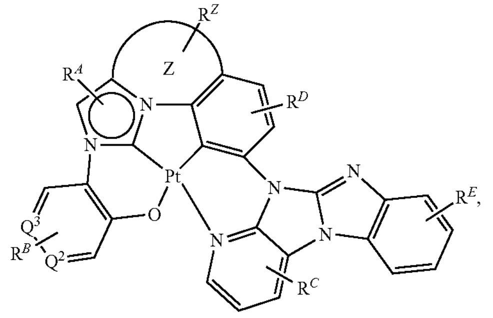

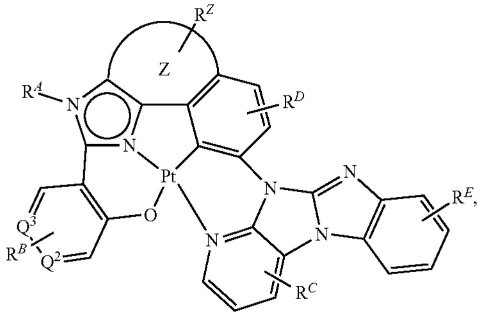

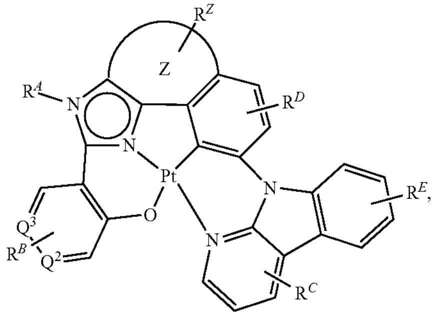

-continued

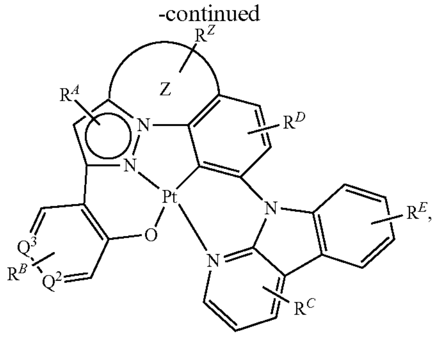

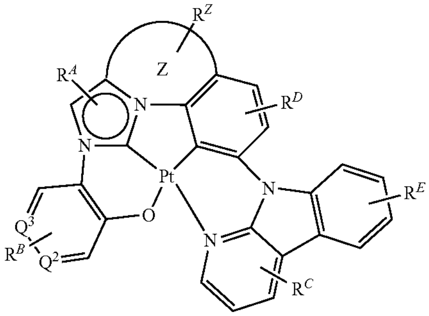

and

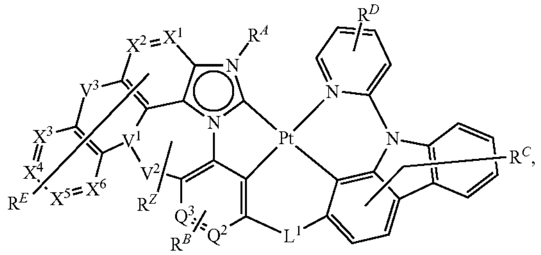

wherein:

$R^x$ and $R^y$ are each selected from the group consisting of alkyl, cycloalkyl, heteroalkyl, heterocycloalkyl, aryl, heteroaryl, and combinations thereof;

$R^E$ for each occurrence is independently a hydrogen or a substituent selected from the group consisting of deuterium, fluorine, alkyl, cycloalkyl, heteroalkyl, alkoxy, aryloxy, amino, silyl, germyl, boryl, selenyl, alkenyl, cycloalkenyl, heteroalkenyl, aryl, heteroaryl, nitrile, isonitrile, sulfanyl, and combinations thereof; and $X^1$-$X^5$, $Q^2$-$Q^3$, $R^A$, $R^B$, $R^C$, $R^D$, $R^Z$, $L^1$, and ring Z are all defined the same as for Formula I and/or Formula II.

In some embodiments, the compound can have a structure of

Formula II

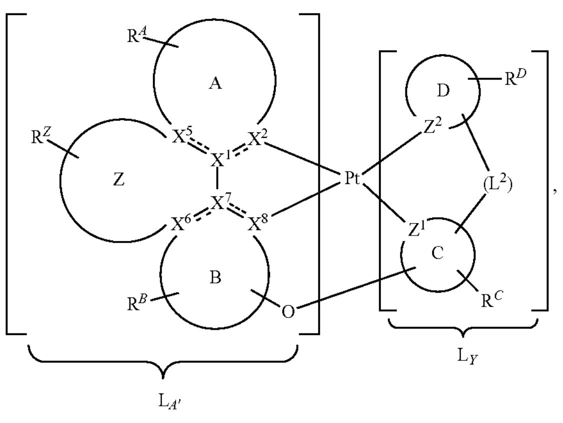

where $L_{A'}$ is selected from the group consisting of the following structures defined in LIST 10 below, wherein l, m, n, and o are each independently an integer from 1 to 307:

| Ligand $L_{A'}$ | Structure of $L_{A'}$ |
|---|---|
| $L_{A'}$1-(Rl)(Rm)(Rn)(Ro), wherein $L_{A'}$1-(R1)(R1)(R1)(R1) to $L_{A'}$1-(R307)(R307)(R307)(R307), having the structure | 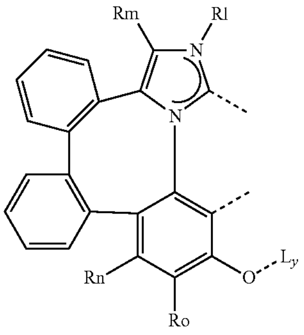 |
| $L_{A'}$2-(Rl)(Rm)(Rn)(Ro), wherein $L_{A'}$2-(R1)(R1)(R1)(R1) to $L_{A'}$2-(R307)(R307)(R307)(R307), having the structure | 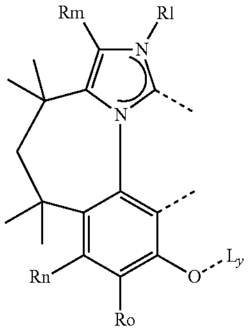 |
| $L_{A'}$3-(Rl)(Rm)(Rn)(Ro), wherein $L_{A'}$3-(R1)(R1)(R1)(R1) to $L_{A'}$3-(R307)(R307)(R307)(R307), having the structure | 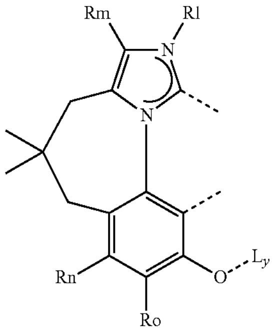 |
| $L_{A'}$4-(Rl)(Rm)(Rn)(Ro), wherein $L_{A'}$4-(R1)(R1)(R1)(R1) to $L_{A'}$4-(R307)(R307)(R307)(R307), having the structure | 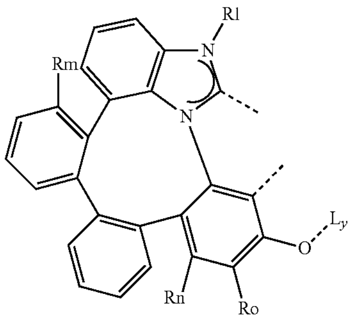 |

-continued
| Ligand $L_{A'}$ | Structure of $L_{A'}$ |
| --- | --- |
| $L_{A'}$5-(Rl)(Rm)(Rn)(Ro), wherein $L_{A'}$5-(R1)(R1)(R1)(R1) to $L_{A'}$5-(R307)(R307)(R307)(R307), having the structure | 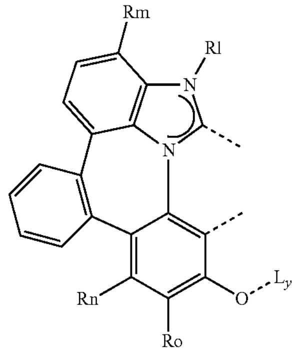 |
| $L_{A'}$6-(Rl)(Rm)(Rn)(Ro), wherein $L_{A'}$6-(R1)(R1)(R1)(R1) to $L_{A'}$6-(R307)(R307)(R307)(R307), having the structure | 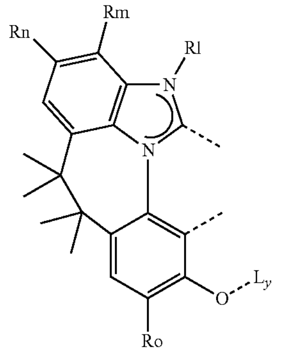 |
| $L_{A'}$7-(Rl)(Rm)(Rn)(Ro), wherein $L_{A'}$7-(R1)(R1)(R1)(R1) to $L_{A'}$7-(R307)(R307)(R307)(R307), having the structure | 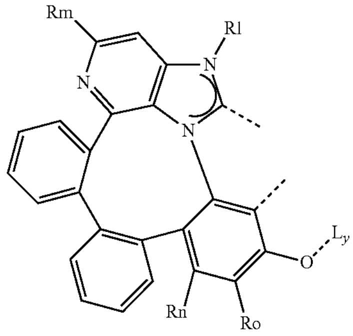 |
| $L_{A'}$8-(Rl)(Rm)(Rn)(Ro), wherein $L_{A'}$8-(R1)(R1)(R1)(R1) to $L_{A'}$8-(R307)(R307)(R307)(R307), having the structure | 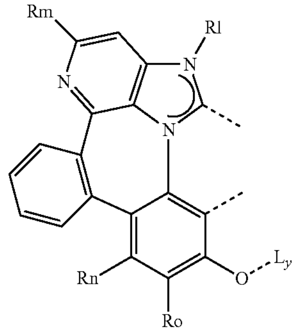 |

-continued
| Ligand $L_{A'}$ | Structure of $L_{A'}$ |
| --- | --- |
| $L_{A'}$9-(Rl)(Rm)(Rn)(Ro), wherein $L_{A'}$9-(R1)(R1)(R1)(R1) to $L_{A'}$9-(R307)(R307)(R307)(R307), having the structure | 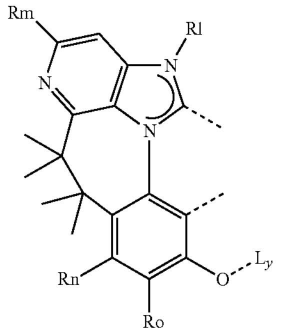 |
| $L_{A'}$10-(Rl)(Rm)(Rn)(Ro), wherein $L_{A'}$10-(R1)(R1)(R1)(R1) to $L_{A'}$10-(R307)(R307)(R307)(R307), having the structure | 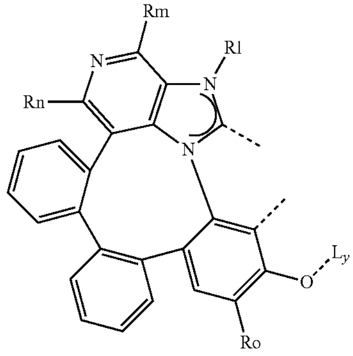 |
| $L_{A'}$11-(Rl)(Rm)(Rn)(Ro), wherein $L_{A'}$11-(R1)(R1)(R1)(R1) to $L_{A'}$11-(R307)(R307)(R307)(R307), having the structure | 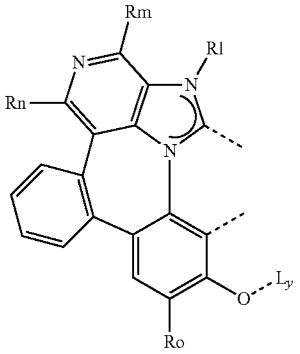 |
| $L_{A'}$12-(Rl)(Rm)(Rn)(Ro), wherein $L_{A'}$12-(R1)(R1)(R1)(R1) to $L_{A'}$12-(R307)(R307)(R307)(R307), having the structure | 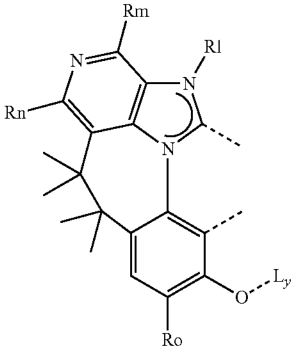 |

-continued
| Ligand $L_{A'}$ | Structure of $L_{A'}$ |
|---|---|
| $L_{A'}$13-(Rl)(Rm)(Rn)(Ro), wherein $L_{A'}$13-(R1)(R1)(R1)(R1) to $L_{A'}$13-(R307)(R307)(R307)(R307), having the structure | 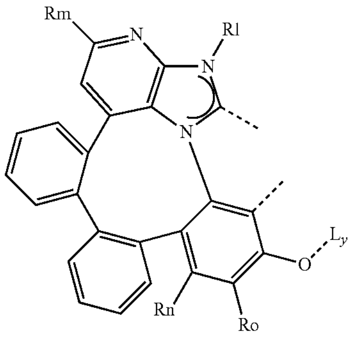 |
| $L_{A'}$14-(Rl)(Rm)(Rn)(Ro), wherein $L_{A'}$14-(R1)(R1)(R1)(R1) to $L_{A'}$14-(R307)(R307)(R307)(R307), having the structure | 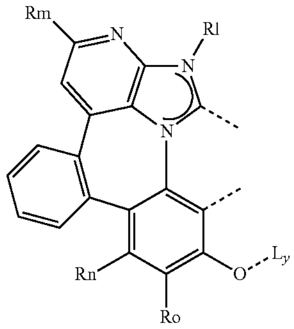 |
| $L_{A'}$15-(Rl)(Rm)(Rn)(Ro), wherein $L_{A'}$15-(R1)(R1)(R1)(R1) to $L_{A'}$15-(R307)(R307)(R307)(R307), having the structure | 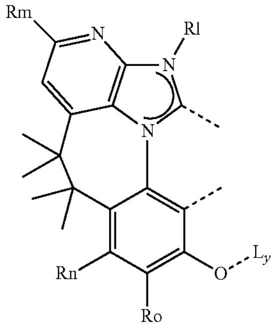 |
| $L_{A'}$16-(Rl)(Rm)(Rn)(Ro), wherein $L_{A'}$16-(R1)(R1)(R1)(R1) to $L_{A'}$16-(R307)(R307)(R307)(R307), having the structure | 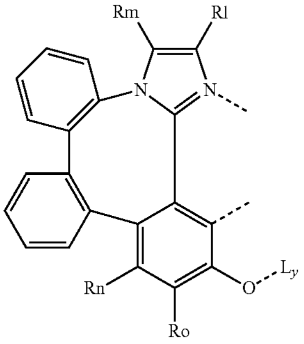 |

-continued

| Ligand $L_{A'}$ | Structure of $L_{A'}$ |
|---|---|
| $L_{A'}$17-(Rl)(Rm)(Rn)(Ro), wherein $L_{A'}$17-(R1)(R1)(R1)(R1) to $L_{A'}$17-(R307)(R307)(R307)(R307), having the structure | 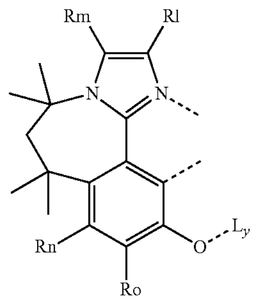 |
| $L_{A'}$18-(Rl)(Rm)(Rn)(Ro), wherein $L_{A'}$18-(R1)(R1)(R1)(R1) to $L_{A'}$18-(R307)(R307)(R307)(R307), having the structure | 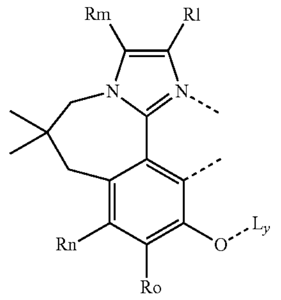 |
| $L_{A'}$19-(Rl)(Rm)(Rn)(Ro), wherein $L_{A'}$19-(R1)(R1)(R1)(R1) to $L_{A'}$19-(R307)(R307)(R307)(R307), having the structure | 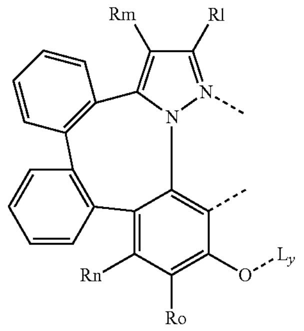 |
| $L_{A'}$20-(Rl)(Rm)(Rn)(Ro), wherein $L_{A'}$20-(R1)(R1)(R1)(R1) to $L_{A'}$20-(R307)(R307)(R307)(R307), having the structure | 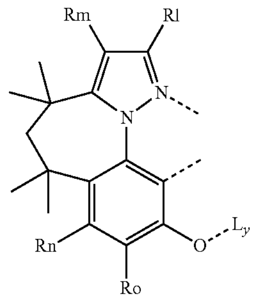 |
| $L_{A'}$21-(Rl)(Rm)(Rn)(Ro), wherein $L_{A'}$21-(R1)(R1)(R1)(R1) to $L_{A'}$21-(R307)(R307)(R307)(R307), having the structure | 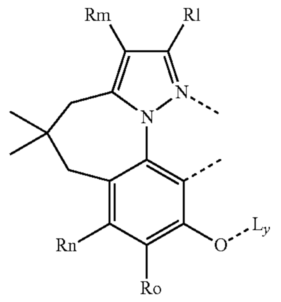 |

-continued
| Ligand $L_{A'}$ | Structure of $L_{A'}$ |
| --- | --- |
| $L_{A'}$22-(Rl)(Rm)(Rn)(Ro), wherein $L_{A'}$22-(R1)(R1)(R1)(R1) to $L_{A'}$22-(R307)(R307)(R307)(R307), having the structure | 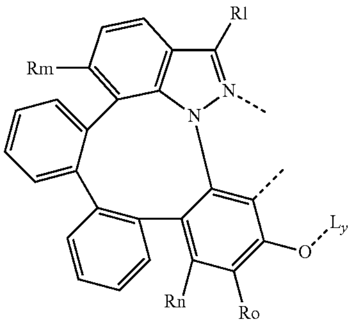 |
| $L_{A'}$23-(Rl)(Rm)(Rn)(Ro), wherein $L_{A'}$23-(R1)(R1)(R1)(R1) to $L_{A'}$23-(R307)(R307)(R307)(R307), having the structure | 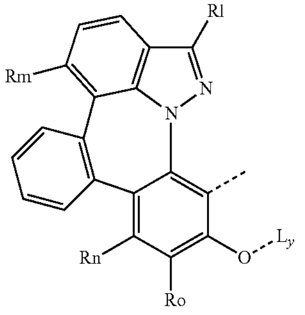 |
| $L_{A'}$24-(Rl)(Rm)(Rn)(Ro), wherein $L_{A'}$24-(R1)(R1)(R1)(R1) to $L_{A'}$24-(R307)(R307)(R307)(R307), having the structure | 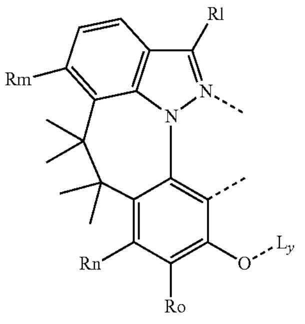 |
| $L_{A'}$25-(Rl)(Rm)(Rn)(Ro), wherein $L_{A'}$25-(R1)(R1)(R1)(R1) to $L_{A'}$25-(R307)(R307)(R307)(R307), having the structure | 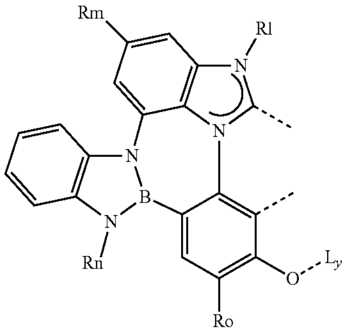 |

-continued
| Ligand $L_{A'}$ | Structure of $L_{A'}$ |
| --- | --- |
| $L_{A'}$26-(Rl)(Rm)(Rn)(Ro), wherein $L_{A'}$26-(R1)(R1)(R1)(R1) to $L_{A'}$26-(R307)(R307)(R307)(R307), having the structure | 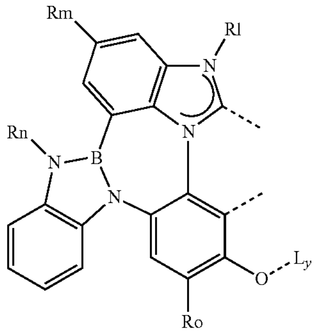 |
| $L_{A'}$27-(Rl)(Rm)(Rn)(Ro), wherein $L_{A'}$27-(R1)(R1)(R1)(R1) to $L_{A'}$27-(R307)(R307)(R307)(R307), having the structure | 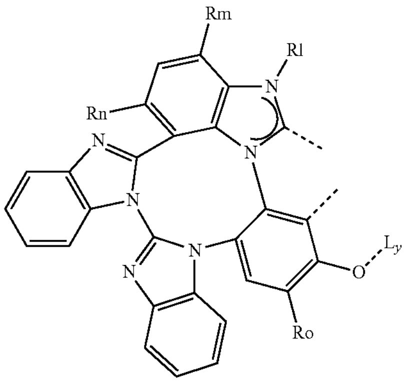 |
| $L_{A'}$28-(Rl)(Rm)(Rn)(Ro), wherein $L_{A'}$28-(R1)(R1)(R1)(R1) to $L_{A'}$28-(R307)(R307)(R307)(R307), having the structure | 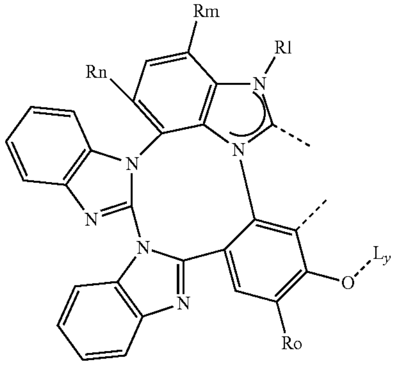 |
| $L_{A'}$29-(Rl)(Rm)(Rn)(Ro), wherein $L_{A'}$29-(R1)(R1)(R1)(R1) to $L_{A'}$29-(R307)(R307)(R307)(R307), having the structure | 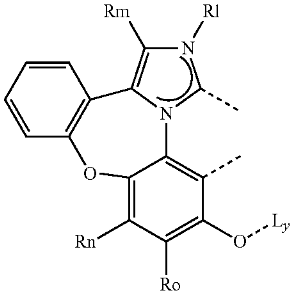 |

-continued
| Ligand $L_{A'}$ | Structure of $L_{A'}$ |
| --- | --- |
| $L_{A'}$30-(Rl)(Rm)(Rn)(Ro), wherein $L_{A'}$30-(R1)(R1)(R1)(R1) to $L_{A'}$30-(R307)(R307)(R307)(R307), having the structure | 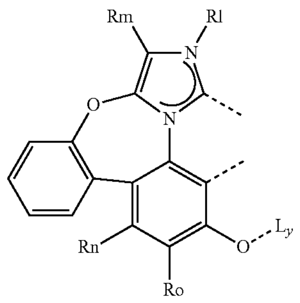 |
| $L_{A'}$31-(Rl)(Rm)(Rn)(Ro), wherein $L_{A'}$31-(R1)(R1)(R1)(R1) to $L_{A'}$31-(R307)(R307)(R307)(R307), having the structure | 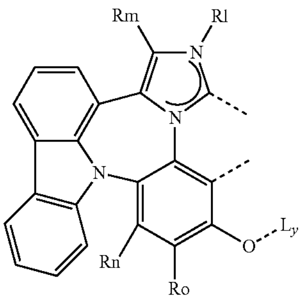 |
| $L_{A'}$32-(Rl)(Rm)(Rn)(Ro), wherein $L_{A'}$32-(R1)(R1)(R1)(R1) to $L_{A'}$32-(R307)(R307)(R307)(R307), having the structure | 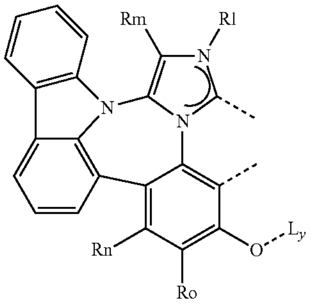 |
| $L_{A'}$33-(Rl)(Rm)(Rn)(Ro), wherein $L_{A'}$33-(R1)(R1)(R1)(R1) to $L_{A'}$33-(R307)(R307)(R307)(R307), having the structure | 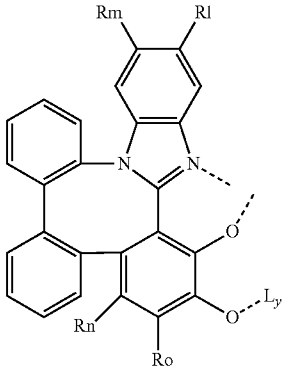 |

-continued
| Ligand $L_{A'}$ | Structure of $L_{A'}$ |
|---|---|
| $L_{A'}$34-(Rl)(Rm)(Rn)(Ro), wherein $L_{A'}$34-(R1)(R1)(R1)(R1) to $L_{A'}$34-(R307)(R307)(R307)(R307), having the structure | 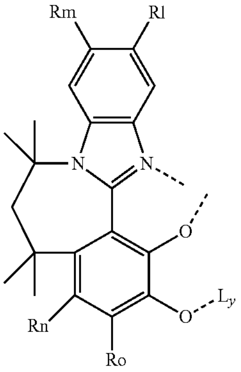 |
| $L_{A'}$35-(Rl)(Rm)(Rn)(Ro), wherein $L_{A'}$35-(R1)(R1)(R1)(R1) to $L_{A'}$35-(R307)(R307)(R307)(R307), having the structure | 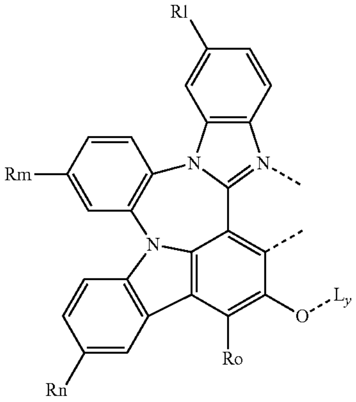 |
| $L_{A'}$36-(Rl)(Rm)(Rn)(Ro), wherein $L_{A'}$36-(R1)(R1)(R1)(R1) to $L_{A'}$36-(R307)(R307)(R307)(R307), having the structure | 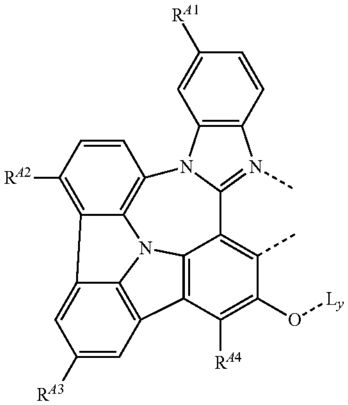 |
| $L_{A'}$37-(Rl)(Rm)(Rn)(Ro), wherein $L_{A'}$37-(R1)(R1)(R1)(R1) to $L_{A'}$37-(R307)(R307)(R307)(R307), having the structure | 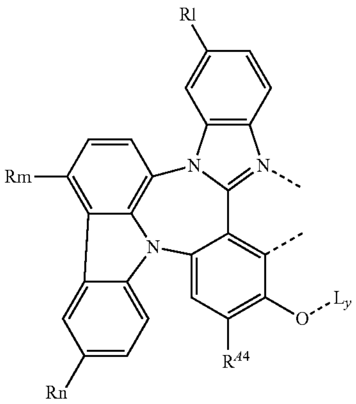 |

-continued
| Ligand $L_{A'}$ | Structure of $L_{A'}$ |
|---|---|
| $L_{A'}$38-(Rl)(Rm)(Rn)(Ro), wherein $L_{A'}$38-(R1)(R1)(R1)(R1) to $L_{A'}$38-(R307)(R307)(R307)(R307), having the structure | 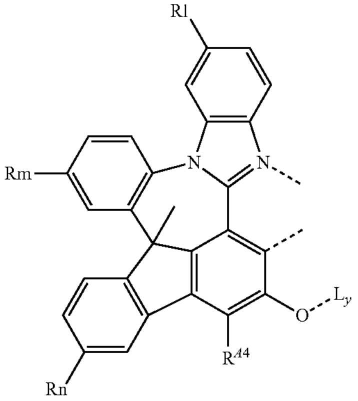 |
| $L_{A'}$39-(Rl)(Rm)(Rn)(Ro), wherein $L_{A'}$39-(R1)(R1)(R1)(R1) to $L_{A'}$39-(R307)(R307)(R307)(R307), having the structure | 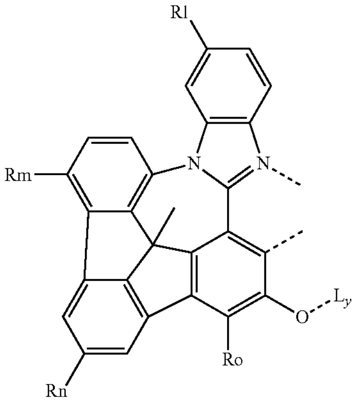 |
| $L_{A'}$40-(Rl)(Rm)(Rn)(Ro), wherein $L_{A'}$40-(R1)(R1)(R1)(R1) to $L_{A'}$40-(R307)(R307)(R307)(R307), having the structure | 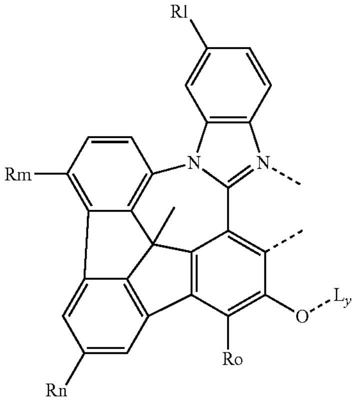 |
| $L_{A'}$41-(Rl)(Rm)(Rn)(Ro), wherein $L_{A'}$41-(R1)(R1)(R1)(R1) to $L_{A'}$41-(R307)(R307)(R307)(R307), having the structure | 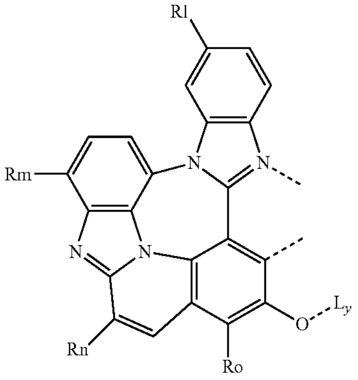 |

-continued

| Ligand $L_{A'}$ | Structure of $L_{A'}$ |
| --- | --- |
| $L_{A'}$42-(Rl)(Rm)(Rn)(Ro), wherein $L_{A'}$42-(R1)(R1)(R1)(R1) to $L_{A'}$42-(R307)(R307)(R307)(R307), having the structure | 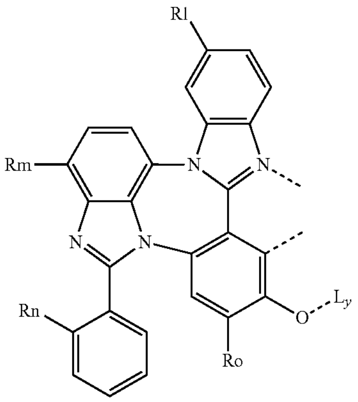 |
| $L_{A'}$43-(Rl)(Rm)(Rn)(Ro), wherein $L_{A'}$43-(R1)(R1)(R1)(R1) to $L_{A'}$43-(R307)(R307)(R307)(R307), having the structure | 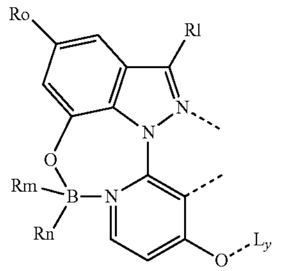 |
| $L_{A'}$44-(Rl)(Rm)(Ro)(Rq), wherein $L_{A'}$44-(R1)(R1)(R1)(R1) to $L_{A'}$44-(R307)(R307)(R307)(R307), having the structure | 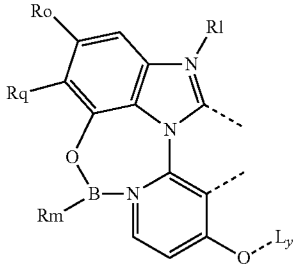 |
| $L_{A'}$45-(Rl)(Rm)(Rn)(Ro)(Rq), wherein $L_{A'}$45-(R1)(R1)(R1)(R1)(R1) to $L_{A'}$45-(R307)(R307)(R307)(R307)(R307), having the structure | 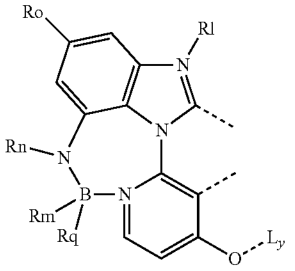 |
| $L_{A'}$46-(Rl)(Rm)(Rn)(Ro)(Rp), wherein $L_{A'}$46-(R1)(R1)(R1)(R1)(R1) to $L_{A'}$46-(R307)(R307)(R307)(R307)(R307), having the structure | 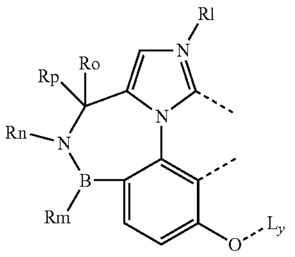 |

-continued

| Ligand $L_{A'}$ | Structure of $L_{A'}$ |
| --- | --- |
| $L_{A'}$47-(Rl)(Rm)(Rn)(Ro)(Rp), wherein $L_{A'}$47-(R1)(R1)(R1)(R1)(R1) to $L_{A'}$47-(R307)(R307)(R307)(R307)(R307), having the structure | 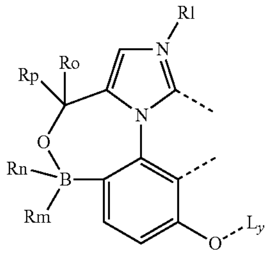 |
| $L_{A'}$48-(Rm)(Ro)(Rp), wherein $L_{A'}$48-(R1)(R1)(R1) to $L_{A'}$48-(R307)(R307)(R307), having the structure | 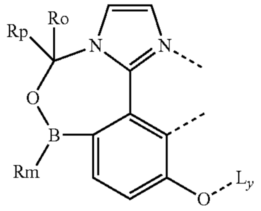 |
| $L_{A'}$49-(Rm)(Rn)(Ro)(Rq)(Rr), wherein $L_{A'}$49-(R1)(R1)(R1)(R1)(R1) to $L_{A'}$49-(R307)(R307)(R307)(R307)(R307), having the structure | 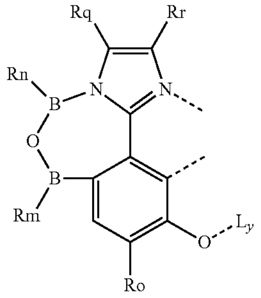 |
| $L_{A'}$50-(Rl)(Rm)(Ro)(Rq)(Rr), wherein $L_{A'}$50-(R1)(R1)(R1)(R1)(R1) to $L_{A'}$50-(R307)(R307)(R307)(R307)(R307), having the structure | 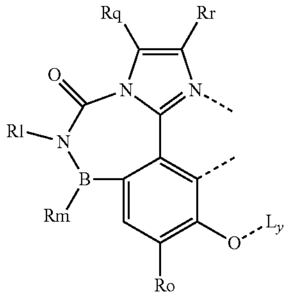 |
| $L_{A'}$51-(Rl)(Rm)(Rn)(Ro), wherein $L_{A'}$51-(R1)(R1)(R1)(R1) to $L_{A'}$51-(R307)(R307)(R307)(R307), having the structure | 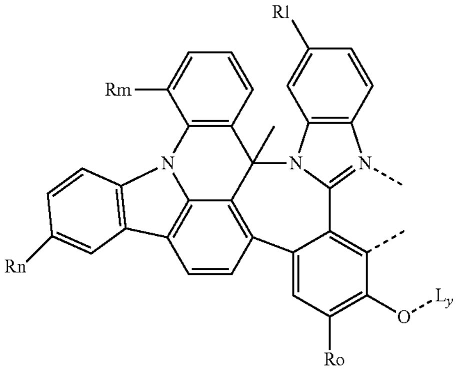 |

-continued
| Ligand $L_{A'}$ | Structure of $L_{A'}$ |
| --- | --- |
| $L_{A'}$52-(Rl)(Rm)(Rn)(Ro), wherein $L_{A'}$52-(R1)(R1)(R1)(R1) to $L_{A'}$52-(R307)(R307)(R307)(R307), having the structure | 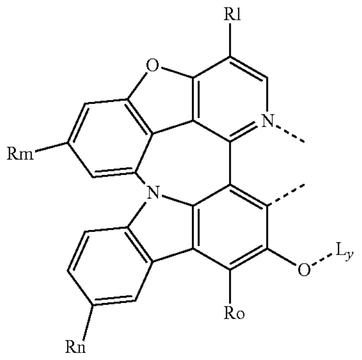 |
| $L_{A'}$53-(Rl)(Rm)(Rn)(Ro), wherein $L_{A'}$53-(R1)(R1)(R1)(R1) to $L_{A'}$53-(R307)(R307)(R307)(R307), having the structure | 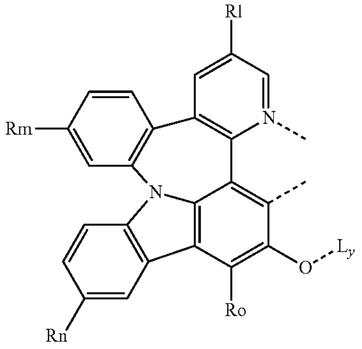 |
| $L_{A'}$54-(Rl)(Rm)(Rn)(Ro), wherein $L_{A'}$54-(R1)(R1)(R1)(R1) to $L_{A'}$54-(R307)(R307)(R307)(R307), having the structure | 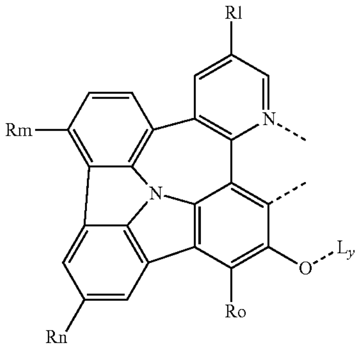 |
| $L_{A'}$55-(Rl)(Rm)(Rn)(Ro), wherein $L_{A'}$55-(R1)(R1)(R1)(R1) to $L_{A'}$55-(R307)(R307)(R307)(R307), having the structure | 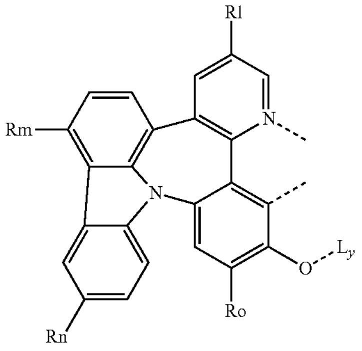 |

-continued
| Ligand $L_{A'}$ | Structure of $L_{A'}$ |
| --- | --- |
| $L_{A'}$56-(Rl)(Rm)(Rn)(Ro), wherein $L_{A'}$56-(R1)(R1)(R1)(R1) to $L_{A'}$56-(R307)(R307)(R307)(R307), having the structure | 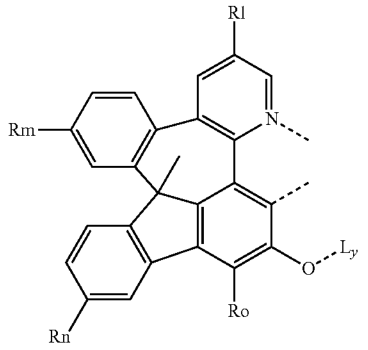 |
| $L_{A'}$57-(Rl)(Rm)(Rn)(Ro), wherein $L_{A'}$57-(R1)(R1)(R1)(R1) to $L_{A'}$57-(R307)(R307)(R307)(R307), having the structure | 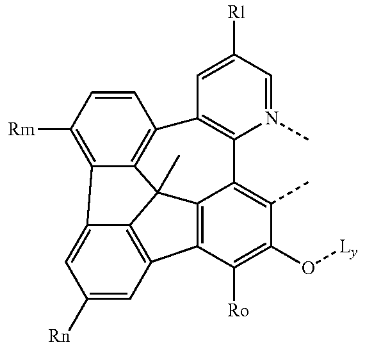 |
| $L_{A'}$58-(Rl)(Rm)(Rn)(Ro), wherein $L_{A'}$58-(R1)(R1)(R1)(R1) to $L_{A'}$58-(R307)(R307)(R307)(R307), having the structure | 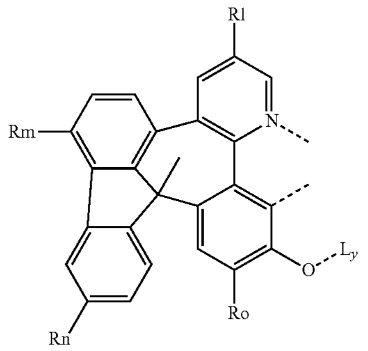 |
| $L_{A'}$59-(Rl)(Rm)(Rn)(Ro), wherein $L_{A'}$59-(R1)(R1)(R1)(R1) to $L_{A'}$59-(R307)(R307)(R307)(R307), having the structure | 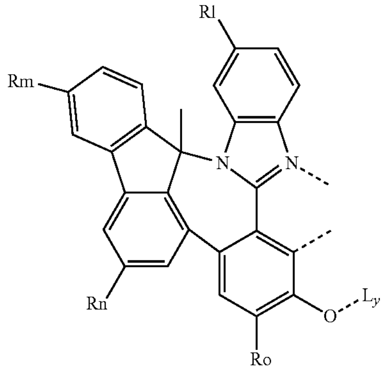 |

-continued
| Ligand $L_{A'}$ | Structure of $L_{A'}$ |
|---|---|
| $L_{A'}$60-(Rl)(Rm)(Rn)(Ro), wherein $L_{A'}$60-(R1)(R1)(R1)(R1) to $L_{A'}$60-(R307)(R307)(R307)(R307), having the structure | 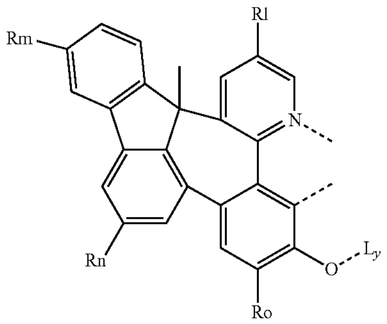 |
| $L_{A'}$61-(Rl)(Rm)(Rn)(Ro), wherein $L_{A'}$61-(R1)(R1)(R1)(R1) to $L_{A'}$61-(R307)(R307)(R307)(R307), having the structure | 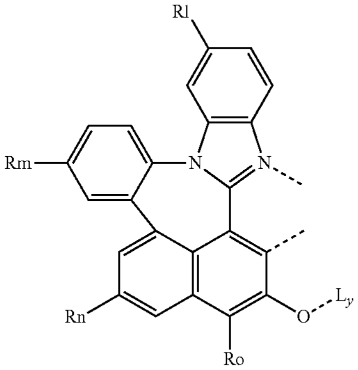 |
| $L_{A'}$62-(Rl)(Rm)(Rn)(Ro), wherein $L_{A'}$62-(R1)(R1)(R1)(R1) to $L_{A'}$62-(R307)(R307)(R307)(R307), having the structure | 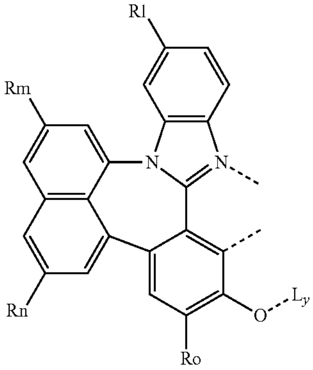 |
| $L_{A'}$63-(Rl)(Rm)(Rn)(Ro), wherein $L_{A'}$63-(R1)(R1)(R1)(R1) to $L_{A'}$63-(R307)(R307)(R307)(R307), having the structure | 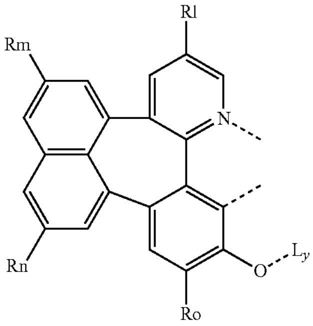 |

-continued
| Ligand $L_{A'}$ | Structure of $L_{A'}$ |
|---|---|
| $L_{A'}$64-(Rl)(Rm)(Rn)(Ro), wherein $L_{A'}$64-(R1)(R1)(R1)(R1) to $L_{A'}$64-(R307)(R307)(R307)(R307), having the structure | 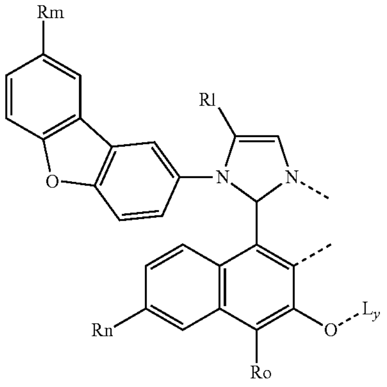 |
| $L_{A'}$65-(Rl)(Rm)(Rn)(Ro), wherein $L_{A'}$65-(R1)(R1)(R1)(R1) to $L_{A'}$65-(R307)(R307)(R307)(R307), having the structure | 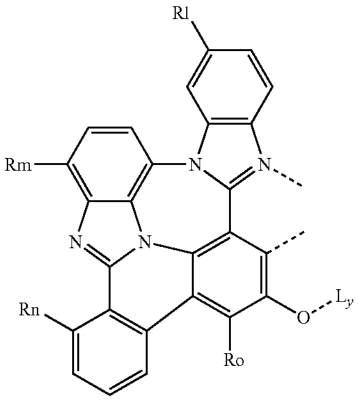 |
| $L_{A'}$66-(Rl)(Rm)(Rn)(Ro), wherein $L_{A'}$66-(R1)(R1)(R1)(R1) to $L_{A'}$66-(R307)(R307)(R307)(R307), having the structure | 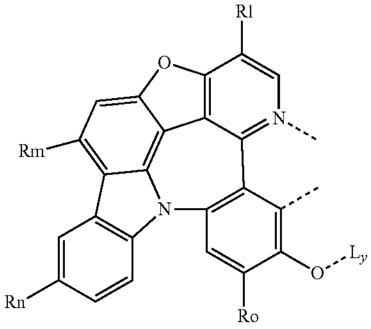 |
| $L_{A'}$67-(Rl)(Rm)(Rn)(Ro), wherein $L_{A'}$67-(R1)(R1)(R1)(R1) to $L_{A'}$67-(R307)(R307)(R307)(R307), having the structure | 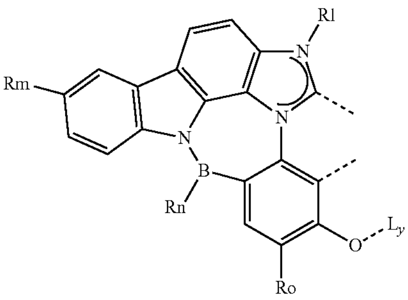 |

-continued

| Ligand $L_{A'}$ | Structure of $L_{A'}$ |
|---|---|
| $L_{A'}$68-(Rl)(Rm)(Rn)(Ro), wherein $L_{A'}$68-(R1)(R1)(R1)(R1) to $L_{A'}$68-(R307)(R307)(R307)(R307), having the structure | 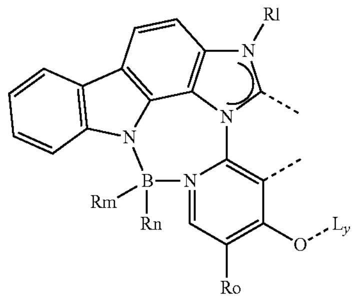 |
| $L_{A'}$69-(Rl)(Rm)(Rn)(Ro), wherein $L_{A'}$69-(R1)(R1)(R1)(R1) to $L_{A'}$69-(R307)(R307)(R307)(R307), having the structure | 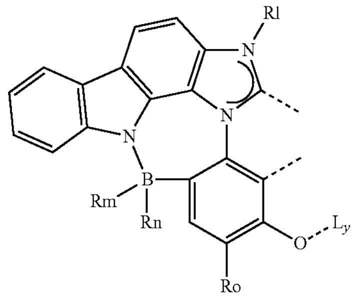 |
| $L_{A'}$70-(Rl)(Rm)(Rn)(Ro), wherein $L_{A'}$70-(R1)(R1)(R1)(R1) to $L_{A'}$70-(R307)(R307)(R307)(R307), having the structure | 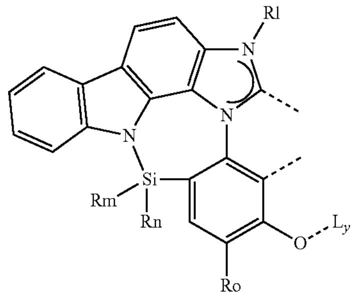 |
| $L_{A'}$71-(Rl)(Rm)(Rn)(Ro), wherein $L_{A'}$71-(R1)(R1)(R1)(R1) to $L_{A'}$71-(R307)(R307)(R307)(R307), having the structure | 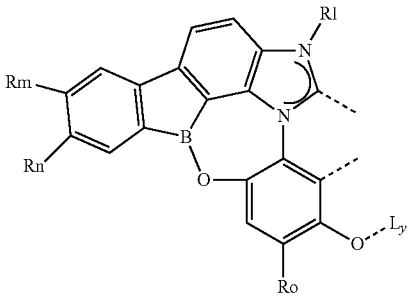 |
| $L_{A'}$72-(Rl)(Rm)(Rn)(Ro), wherein $L_{A'}$72-(R1)(R1)(R1)(R1) to $L_{A'}$72-(R307)(R307)(R307)(R307), having the structure | 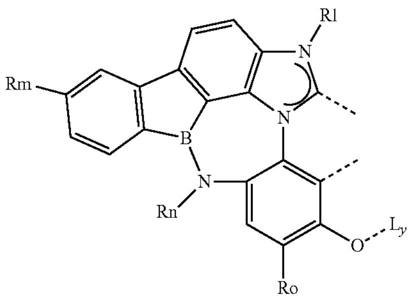 |

-continued
| Ligand $L_{A'}$ | Structure of $L_{A'}$ |
|---|---|
| $L_{A'}$73-(Rl)(Rm)(Rn)(Ro), wherein $L_{A'}$73-(R1)(R1)(R1)(R1) to $L_{A'}$73-(R307)(R307)(R307)(R307), having the structure | 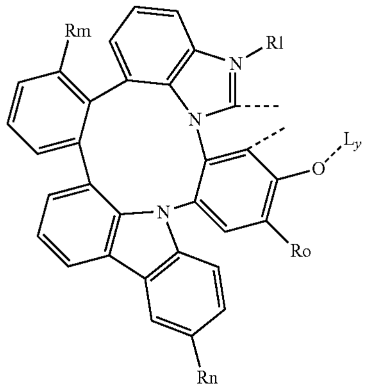 |
| $L_{A'}$74-(Rl)(Rm)(Rn)(Ro), wherein $L_{A'}$74-(R1)(R1)(R1)(R1) to $L_{A'}$74-(R307)(R307)(R307)(R307), having the structure | 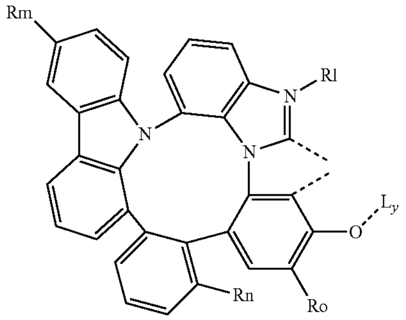 |
| $L_{A'}$75-(Rl)(Rm)(Rn)(Ro), wherein $L_{A'}$75-(R1)(R1)(R1)(R1) to $L_{A'}$75-(R307)(R307)(R307)(R307), having the structure | 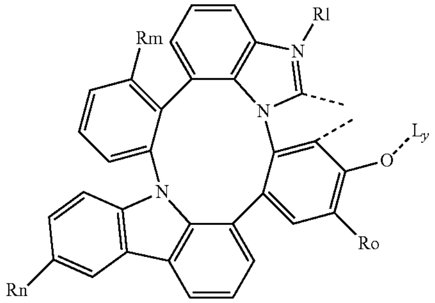 |
| $L_{A'}$76-(Rl)(Rm)(Rn)(Ro), wherein $L_{A'}$76-(R1)(R1)(R1)(R1) to $L_{A'}$76-(R307)(R307)(R307)(R307), having the structure | 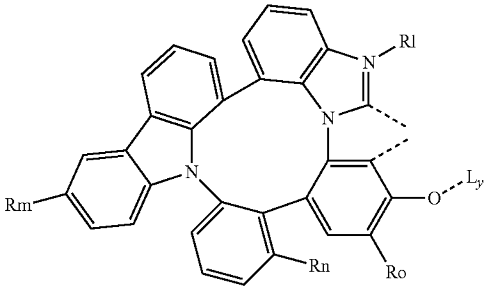 |

-continued

| Ligand $L_{A'}$ | Structure of $L_{A'}$ |
|---|---|
| $L_{A'}$77-(Rl)(Rm)(Rn)(Ro), wherein $L_{A'}$77-(R1)(R1)(R1)(R1) to $L_{A'}$77-(R307)(R307)(R307)(R307), having the structure | 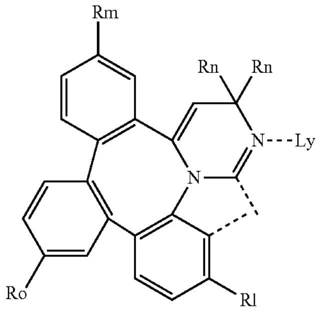 |
| $L_{A'}$78-(Rl)(Rm)(Rn)(Ro), wherein $L_{A'}$78-(R1)(R1)(R1)(R1) to $L_{A'}$78-(R307)(R307)(R307)(R307), having the structure | 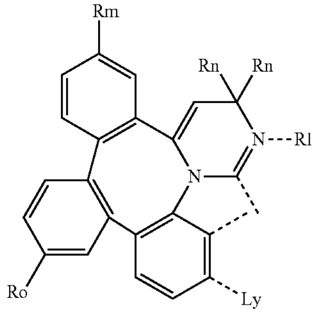 |
| $L_{A'}$79-(Rl)(Rm)(Rn)(Ro), wherein $L_{A'}$79-(R1)(R1)(R1)(R1) to $L_{A'}$79-(R307)(R307)(R307)(R307), having the structure | 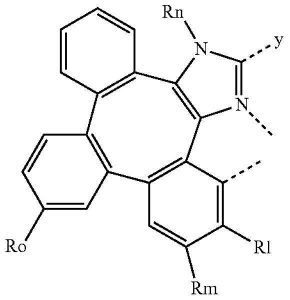 |
| $L_{A'}$80-(Rl)(Rm)(Rn)(Ro), wherein $L_{A'}$80-(R1)(R1)(R1)(R1) to $L_{A'}$80-(R307)(R307)(R307)(R307), having the structure | 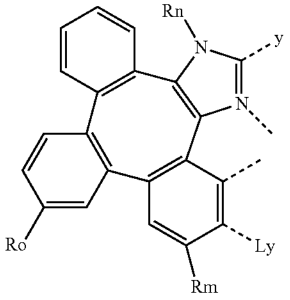 |
| $L_{A'}$81-(Rl)(Rm)(Rn)(Ro), wherein $L_{A'}$81-(R1)(R1)(R1)(R1) to $L_{A'}$81-(R307)(R307)(R307)(R307), having the structure | 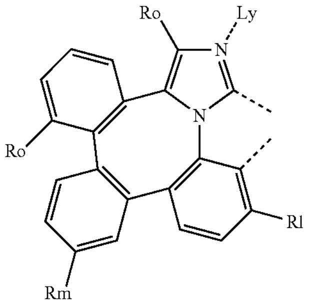 |

-continued

| Ligand $L_{A'}$ | Structure of $L_{A'}$ |
| --- | --- |
| $L_{A'}$82-(Rl)(Rm)(Rn)(Ro), wherein $L_{A'}$82-(R1)(R1)(R1)(R1) to $L_{A'}$82-(R307)(R307)(R307)(R307), having the structure | 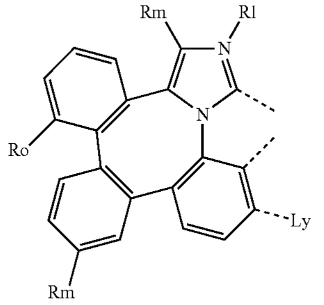 |
| $L_{A'}$83-(Rl)(Rm)(Rn)(Ro), wherein $L_{A'}$83-(R1)(R1)(R1)(R1) to $L_{A'}$83-(R307)(R307)(R307)(R307), having the structure | 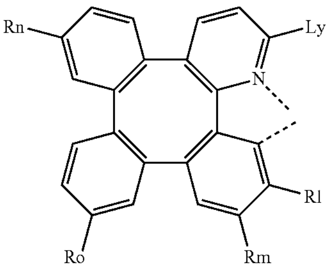 |
| $L_{A'}$84-(Rl)(Rm)(Rn)(Ro), wherein $L_{A'}$84-(R1)(R1)(R1)(R1) to $L_{A'}$84-(R307)(R307)(R307)(R307), having the structure | 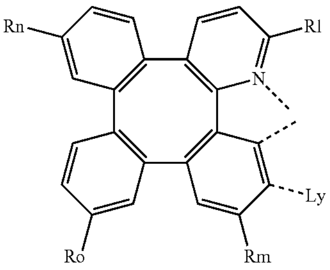 |
| $L_{A'}$85-(Rl)(Rm)(Rn)(Ro), wherein $L_{A'}$85-(R1)(R1)(R1)(R1) to $L_{A'}$85-(R307)(R307)(R307)(R307), having the structure | 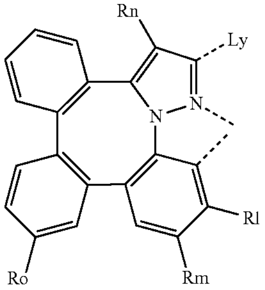 |
| $L_{A'}$86-(Rl)(Rm)(Rn)(Ro), wherein $L_{A'}$86-(R1)(R1)(R1)(R1) to $L_{A'}$86-(R307)(R307)(R307)(R307), having the structure | 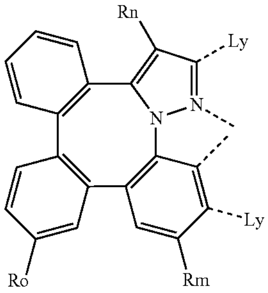 |

-continued

| Ligand $L_{A'}$ | Structure of $L_{A'}$ |
|---|---|
| $L_{A'}$87-(Rl)(Rm)(Rn)(Ro), wherein $L_{A'}$87-(R1)(R1)(R1)(R1) to $L_{A'}$87-(R307)(R307)(R307)(R307), having the structure | 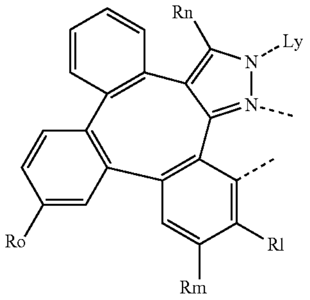 |
| $L_{A'}$88-(Rl)(Rm)(Rn)(Ro), wherein $L_{A'}$88-(R1)(R1)(R1)(R1) to $L_{A'}$88-(R307)(R307)(R307)(R307), having the structure | 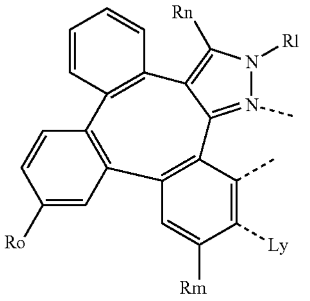 |
| $L_{A'}$89-(Rl)(Rm)(Rn)(Ro), wherein $L_{A'}$89-(R1)(R1)(R1)(R1) to $L_{A'}$89-(R307)(R307)(R307)(R307), having the structure | 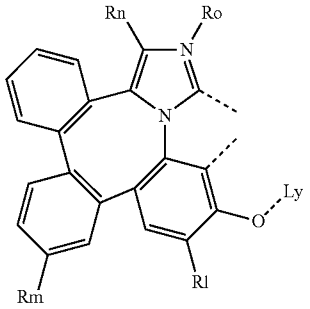 |
| $L_{A'}$90-(Rl)(Rm)(Rn)(Ro), wherein $L_{A'}$90-(R1)(R1)(R1)(R1) to $L_{A'}$90-(R307)(R307)(R307)(R307), having the structure | 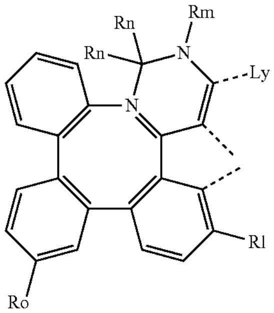 |
| $L_{A'}$91-(Rl)(Rm)(Rn)(Ro), wherein $L_{A'}$91-(R1)(R1)(R1)(R1) to $L_{A'}$91-(R307)(R307)(R307)(R307), having the structure | 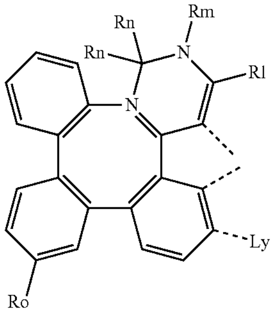 |

-continued

| Ligand $L_{A'}$ | Structure of $L_{A'}$ |
| --- | --- |
| $L_{A'}$92-(Rl)(Rm)(Ro)(Rp), wherein $L_{A'}$92-(R1)(R1)(R1)(R1) to $L_{A'}$92-(R307)(R307)(R307)(R307), having the structure | 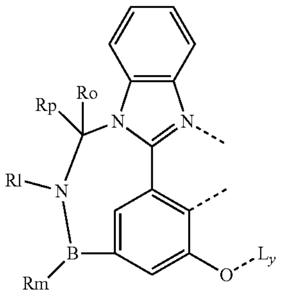 |
| $L_{A'}$93-(Rm)(Ro)(Rp)(Rq), wherein $L_{A'}$93-(R1)(R1)(R1)(R1) to $L_{A'}$93-(R307)(R307)(R307)(R307), having the structure | 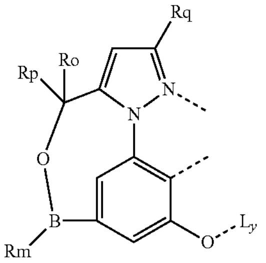 |
| $L_{A'}$94-(Rm)(Ro)(Rp), wherein $L_{A'}$94-(R1)(R1)(R1) to $L_{A'}$94-(R307)(R307)(R307), having the structure | 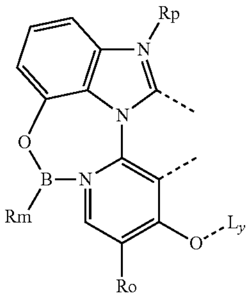 |
| $L_{A'}$95-(Rl)(Rm)(Rn)(Rp), wherein $L_{A'}$95-(R1)(R1)(R1)(R1) to $L_{A'}$95-(R307)(R307)(R307)(R307), having the structure | 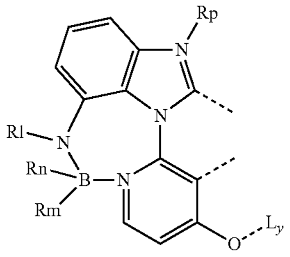 |
| $L_{A'}$96-(Rl)(Rm)(Rn)(Ro)(Rp), wherein $L_{A'}$96-(R1)(R1)(R1)(R1)(R1) to $L_{A'}$96-(R307)(R307)(R307)(R307)(R307), having the structure | 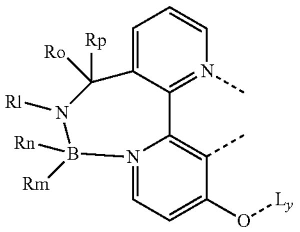 |
| $L_{A'}$97-(Rl)(Rm)(Rn)(Ro)(Rp), wherein $L_{A'}$97-(R1)(R1)(R1)(R1)(R1) to $L_{A'}$97-(R307)(R307)(R307)(R307)(R307), having the structure | 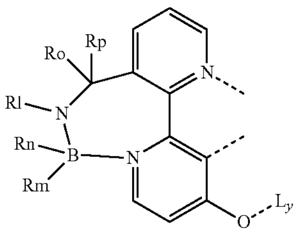 |

-continued
| Ligand $L_{A'}$ | Structure of $L_{A'}$ |
|---|---|
| $L_{A'}$98-(Rl)(Rm)(Ro)(Rp), wherein $L_{A'}$98-(R1)(R1)(R1)(R1) to $L_{A'}$98-(R307)(R307)(R307)(R307), having the structure | 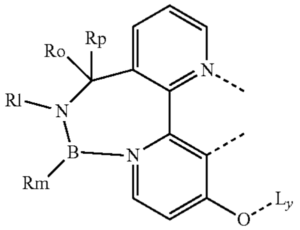 |
| $L_{A'}$99-(Rm)(Ro)(Rp)(Rr), wherein $L_{A'}$99-(R1)(R1)(R1)(R1) to $L_{A'}$99-(R307)(R307)(R307)(R307), having the structure | 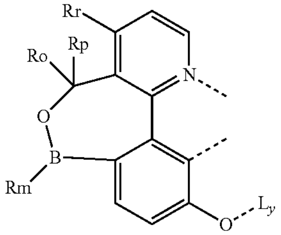 |
| $L_{A'}$100-(Rl)(Rm)(Rn)(Ro), wherein $L_{A'}$100-(R1)(R1)(R1)(R1) to $L_{A'}$100-(R307)(R307)(R307)(R307), having the structure | 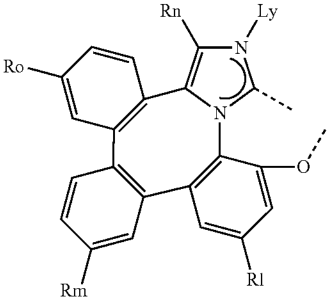 |
| $L_{A'}$101-(Rl)(Rm)(Rn)(Ro), wherein $L_{A'}$101-(R1)(R1)(R1)(R1) to $L_{A'}$101-(R307)(R307)(R307)(R307), having the structure | 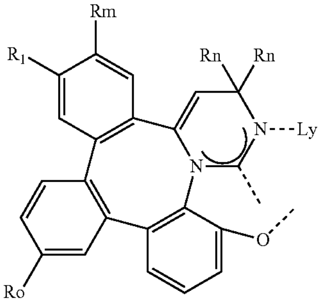 |

wherein $L_y$ is selected from the group consisting of the structures $L_y$1-(Rs)(Rt)(Ru) to $L_y$33-(Rs)(Rt)(Ru), defined in LIST 11 below, wherein s, t, and u are each independently an integer from 1 to 307:

| $L_y$ | Structure of $L_y$ |
|---|---|
| $L_y$1-(Rs)(Rt)(Ru), wherein $L_y$1-(R1)(R1)(R1) to $L_y$1-(R307)(R307)(R307), having the structure | 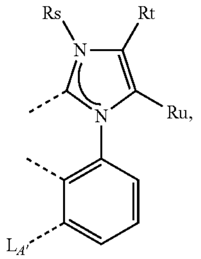 |
| $L_y$2-(Rs)(Rt)(Ru), wherein $L_y$2-(R1)(R1)(R1) to $L_y$2-(R307)(R307)(R307), having the structure | 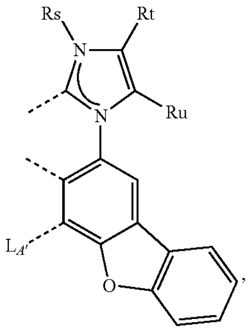 |
| $L_y$3-(Rs)(Rt)(Ru), wherein $L_y$3-(R1)(R1)(R1) to $L_y$3-(R307)(R307)(R307), having the structure | 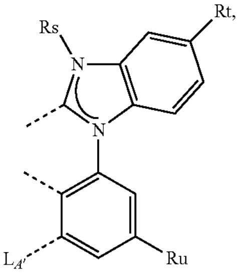 |
| $L_y$4-(s)(t)(u), wherein $L_y$4-(1)(1)(1) to $L_y$4-(307)(307)(307), having the structure | 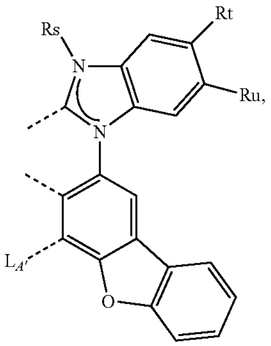 |
| $L_y$5-(Rs)(Rt)(Ru), wherein $L_y$5-(R1)(R1)(R1) to $L_y$5-(R307)(R307)(R307), having the structure | 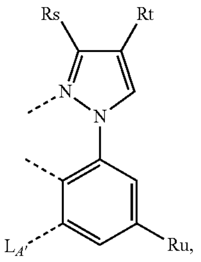 |

-continued

| $L_y$ | Structure of $L_y$ |
|---|---|
| $L_y$6-(Rs)(Rt)(Ru), wherein $L_y$6-(R1)(R1)(R1) to $L_y$6-(R307)(R307)(R307), having the structure | 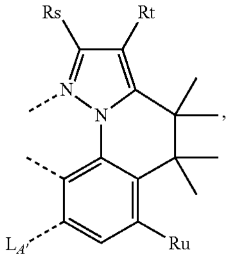 |
| $L_y$7-(Rs)(Rt)(Ru), wherein $L_y$7-(R1)(R1)(R1) to $L_y$7-(R307)(R307)(R307), having the structure | 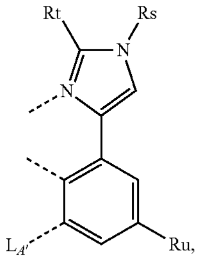 |
| $L_y$8-(Rs)(Rt)(Ru), wherein $L_y$8-(R1)(R1)(R1) to $L_y$8-(R307)(R307)(R307), having the structure | 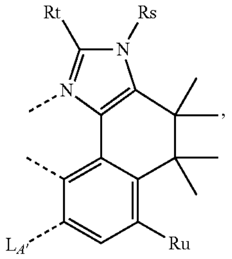 |
| $L_y$9-(Rs)(Rt)(Ru), wherein $L_y$9-(R1)(R1)(R1) to $L_y$9-(R307)(R307)(R307), having the structure | 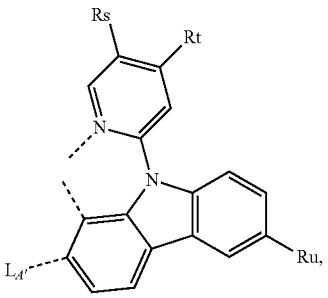 |
| $L_y$10-(Rs)(Rt)(Ru), wherein $L_y$10-(R1)(R1)(R1) to $L_y$10-(R307)(R307)(R307), having the structure | 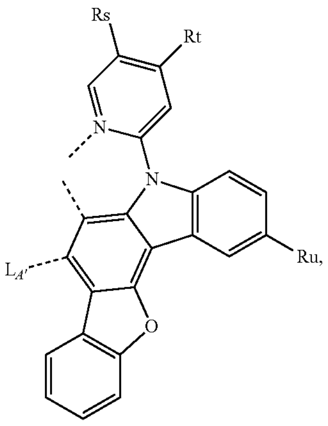 |

-continued

| $L_y$ | Structure of $L_y$ |
|---|---|
| $L_y$11-(Rs)(Rt)(Ru), wherein $L_y$11-(R1)(R1)(R1) to $L_y$11-(R307)(R307)(R307), having the structure | 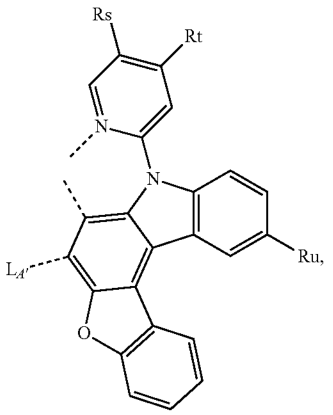 |
| $L_y$12-(Rs)(Rt)(Ru), wherein $L_y$12-(R1)(R1)(R1) to $L_y$12-(R307)(R307)(R307), having the structure | 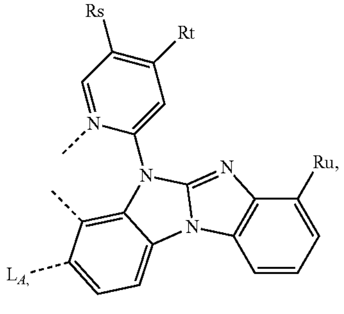 |
| $L_y$13-(Rs)(Rt)(Ru), wherein $L_y$13-(R1)(R1)(R1) to $L_y$13-(R307)(R307)(R307), having the structure | 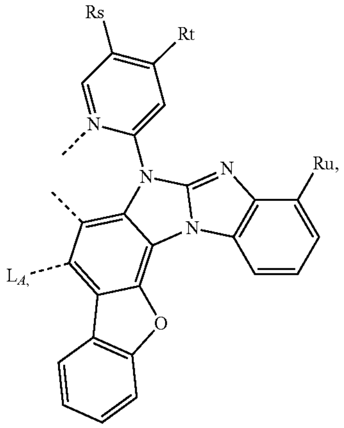 |
| $L_y$14-(Rs)(Rt)(Ru), wherein $L_y$14-(R1)(R1)(R1) to $L_y$14-(R307)(R307)(R307), having the structure | 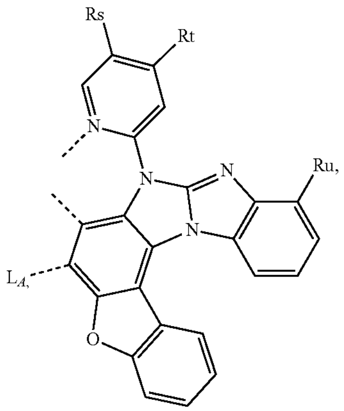 |

-continued

| $L_y$ | Structure of $L_y$ |
|---|---|
| $L_y$15-(Rs)(Rt)(Ru), wherein $L_y$15-(R1)(R1)(R1) to $L_y$15-(R307)(R307)(R307), having the structure | 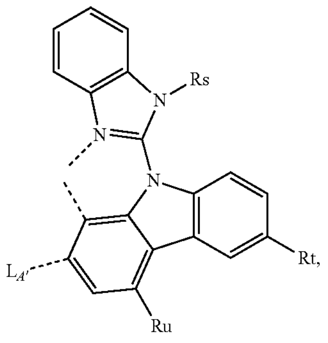 |
| $L_y$16-(Rs)(Rt)(Ru), wherein $L_y$16-(R1)(R1)(R1) to $L_y$16-(R307)(R307)(R307), having the structure | 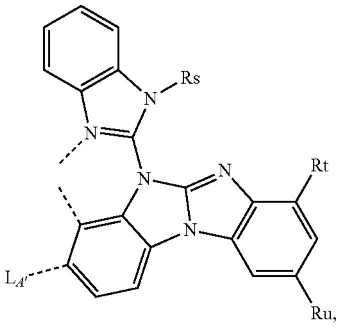 |
| $L_y$17-(Rs)(Rt)(Ru), wherein $L_y$17-(R1)(R1)(R1) to $L_y$17-(R307)(R307)(R307), having the structure | 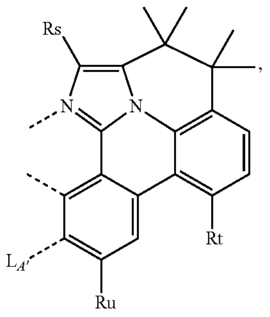 |
| $L_y$18-(Rs)(Rt)(Ru), wherein $L_y$18-(R1)(R1)(R1) to $L_y$18-(R307)(R307)(R307), having the structure | 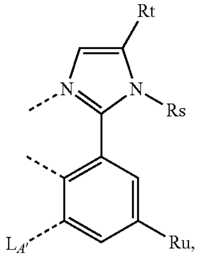 |
| $L_y$19-(Rs)(Rt)(Ru), wherein $L_y$19-(R1)(R1)(R1) to $L_y$19-(R307)(R307)(R307), having the structure | 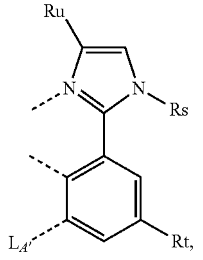 |

-continued

| $L_y$ | Structure of $L_y$ |
|---|---|
| $L_y$20-(Rs)(Rt)(Ru), wherein $L_y$20-(R1)(R1)(R1) to $L_y$20-(R307)(R307)(R307), having the structure | 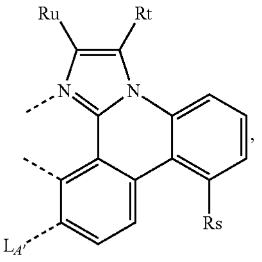 |
| $L_y$21-(Rs)(Rt)(Ru), wherein $L_y$21-(R1)(R1)(R1) to $L_y$21-(R307)(R307)(R307), having the structure | 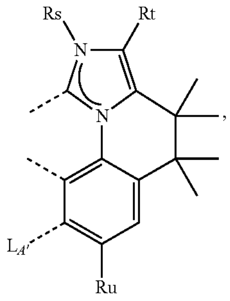 |
| $L_y$22-(Rs)(Rt)(Ru), wherein $L_y$22-(R1)(R1)(R1) to $L_y$22-(R307)(R307)(R307), having the structure | 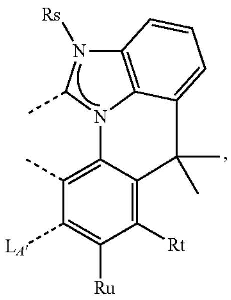 |
| $L_y$23-(Rs)(Rt)(Ru), wherein $L_y$23-(R1)(R1)(R1) to $L_y$23-(R307)(R307)(R307), having the structure | 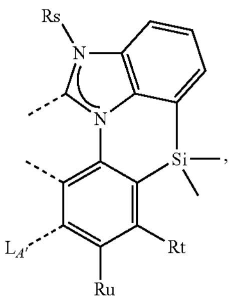 |
| $L_y$24-(Rs)(Rt)(Ru), wherein $L_y$24-(R1)(R1)(R1) to $L_y$24-(R307)(R307)(R307), having the structure | 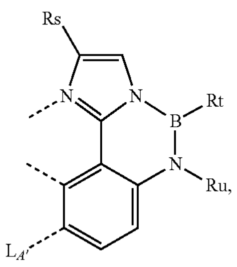 |

-continued

| $L_y$ | Structure of $L_y$ |
|---|---|
| $L_y$25-(Rs)(Rt)(Ru), wherein $L_y$25-(R1)(R1)(R1) to $L_y$25-(R307)(R307)(R307), having the structure | 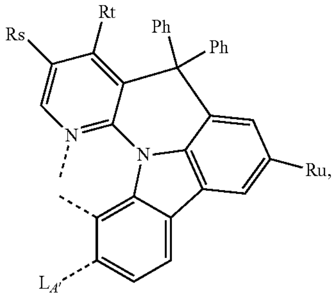 |
| $L_y$26-(Rs)(Rt)(Ru), wherein $L_y$26-(R1)(R1)(R1) to $L_y$26-(R307)(R307)(R307), having the structure | 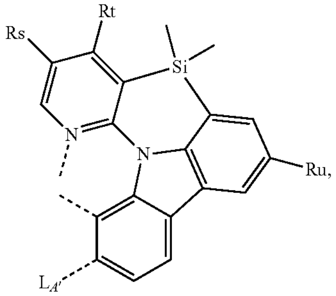 |
| $L_y$27-(Rs)(Rt)(Ru), wherein $L_y$27-(R1)(R1)(R1) to $L_y$27-(R307)(R307)(R307), having the structure | 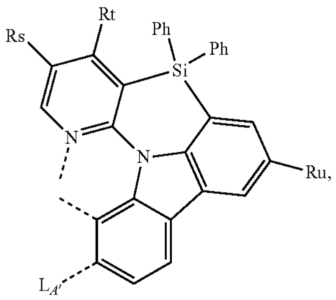 |
| $L_y$28-(Rs)(Rt)(Ru), wherein $L_y$28-(R1)(R1)(R1) to $L_y$28-(R307)(R307)(R307), having the structure | 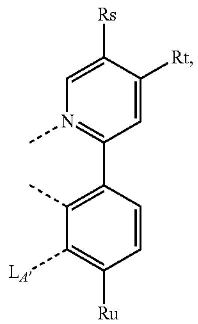 |
| $L_y$29-(Rs)(Rt)(Ru), wherein $L_y$29-(R1)(R1)(R1) to $L_y$29-(R307)(R307)(R307), having the structure | 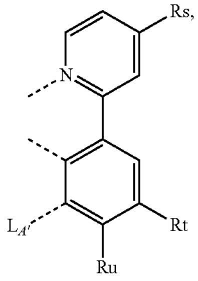 |

-continued

| $L_y$ | Structure of $L_y$ |
|---|---|
| $L_y30$-(Rs)(Rt)(Ru), wherein $L_y30$-(R1)(R1)(R1) to $L_y30$-(R307)(R307)(R307), having the structure | 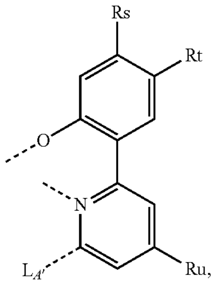 |
| $L_y31$-(Rs)(Rt)(Ru), wherein $L_y31$-(R1)(R1)(R1) to $L_y31$-(R307)(R307)(R307), having the structure | 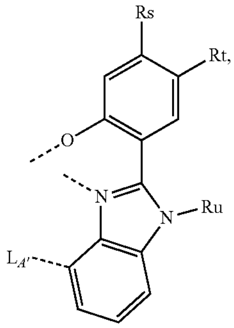 |
| $L_y32$-(Rs)(Rt)(Ru), wherein $L_y32$-(R1)(R1)(R1) to $L_y32$-(R307)(R307)(R307), having the structure | 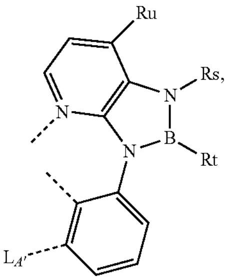 |
| $L_y33$-(Rs)(Rt)(Ru), wherein $L_y33$-(R1)(R1)(R1) to $L_y33$-(R307)(R307)(R307), having the structure | 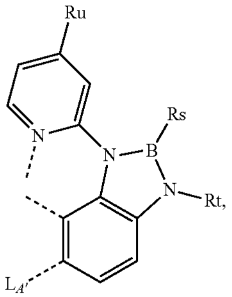 |

wherein R1 to R307 have the structures defined in the R-LIST provided herein.

In some embodiments, the compound can be selected from the group consisting of the structures in the following LIST 12:

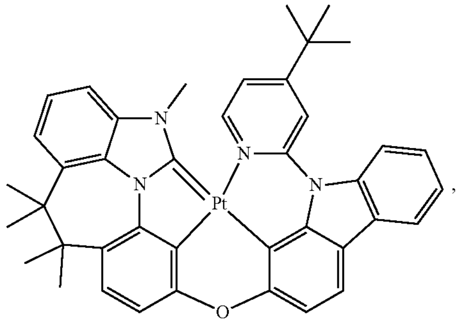

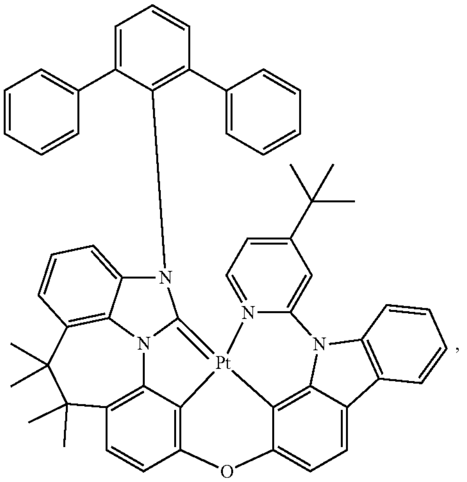

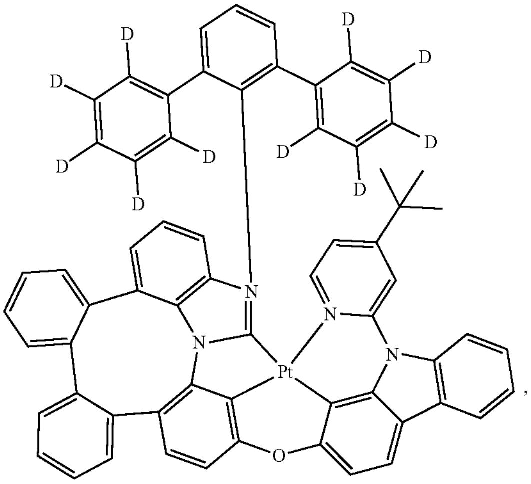

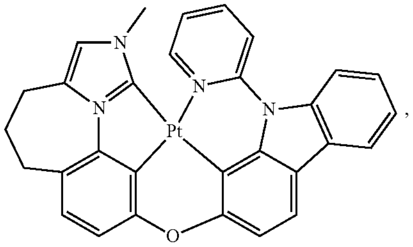

-continued
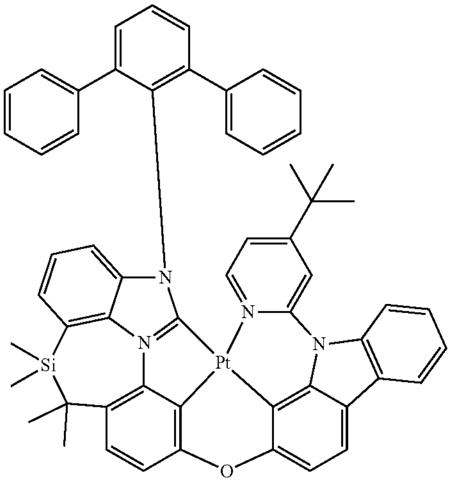
,
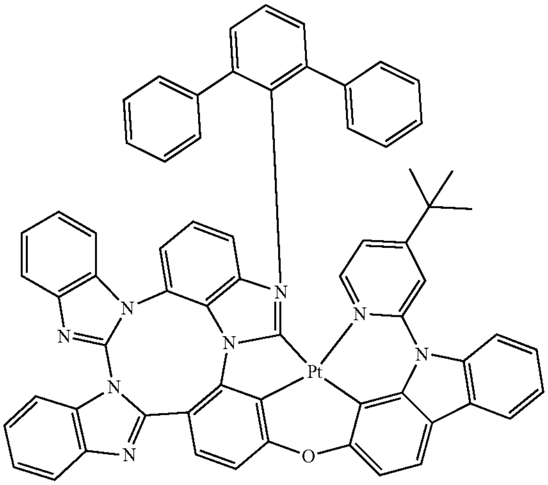
,
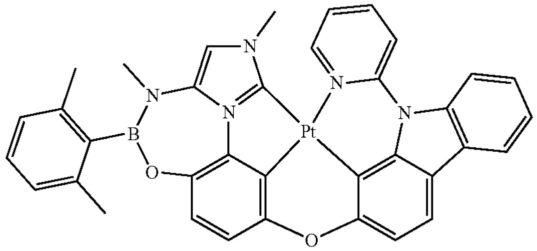
,
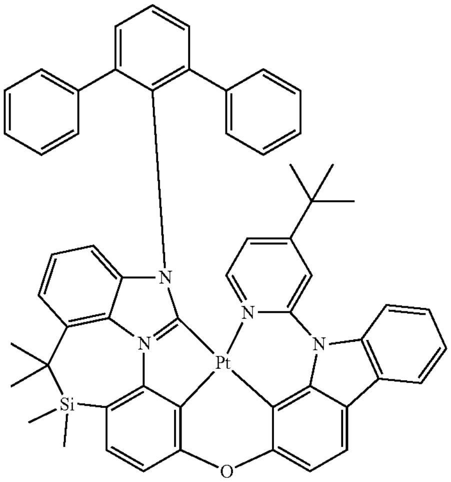
,
-continued
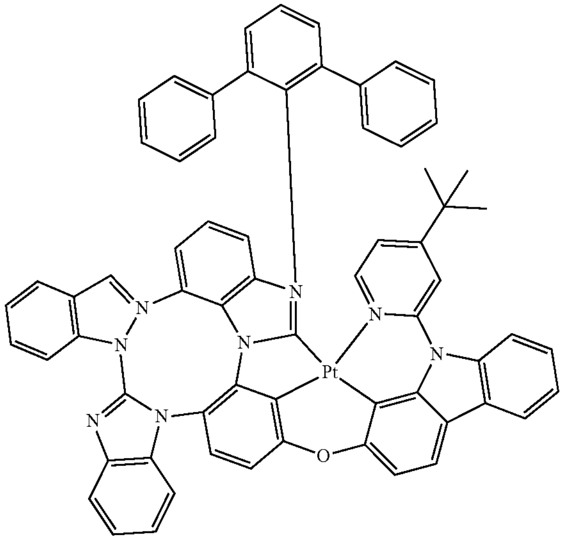
,
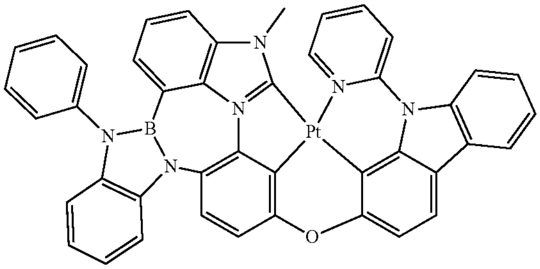
,
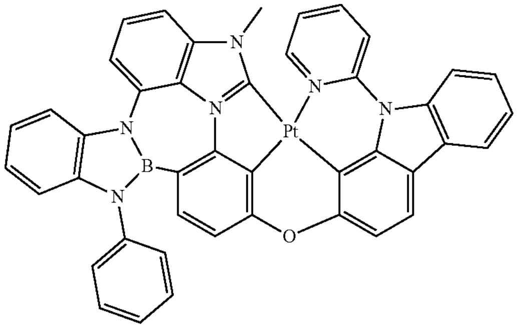
,
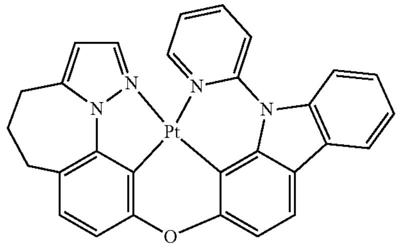
,
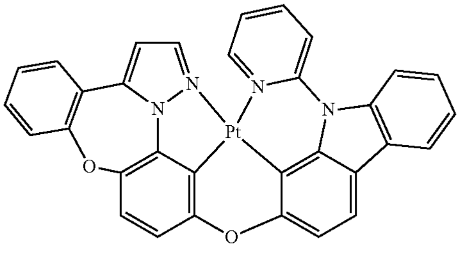
, -continued
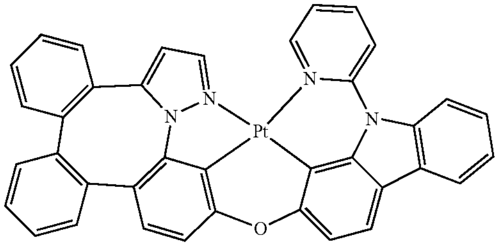,
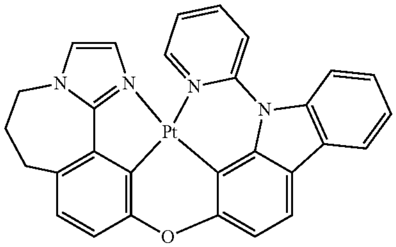,
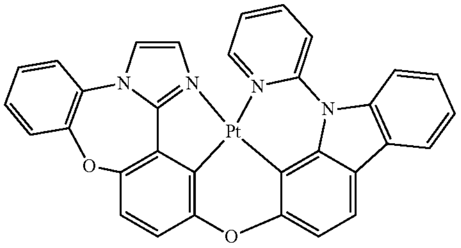,
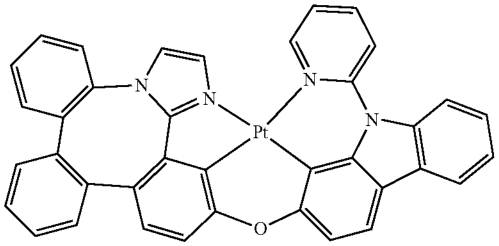,
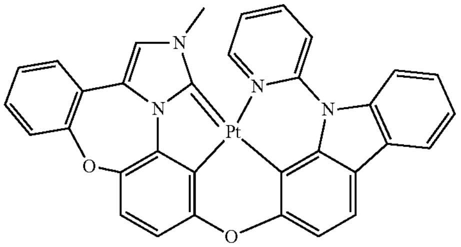,
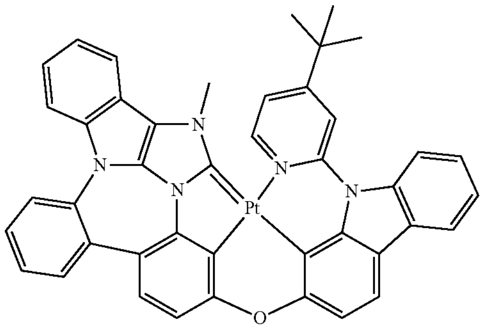,
-continued
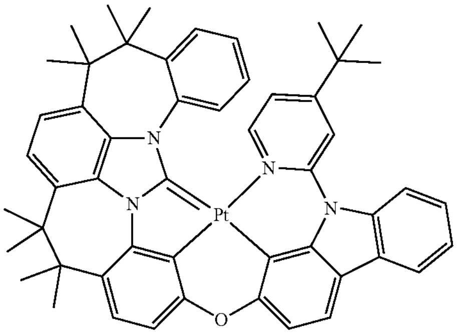,
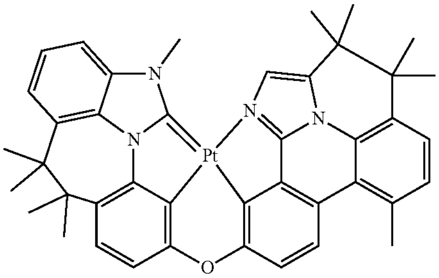,
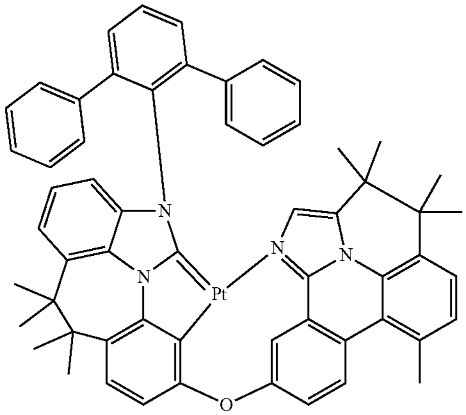,
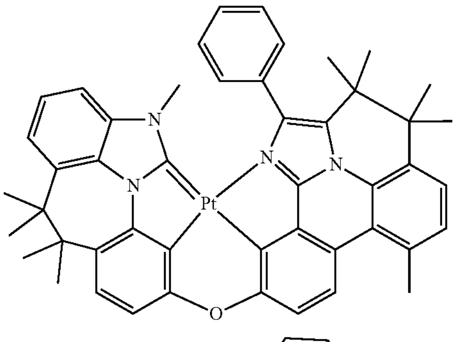,
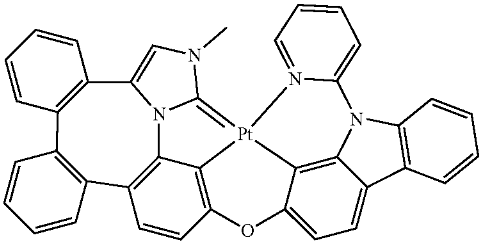, -continued
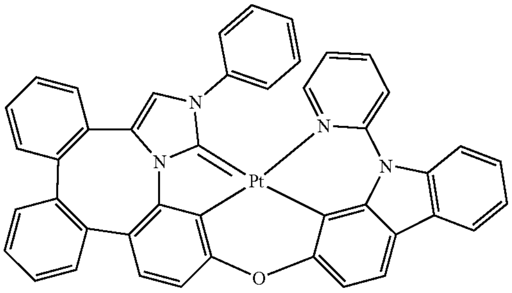
,
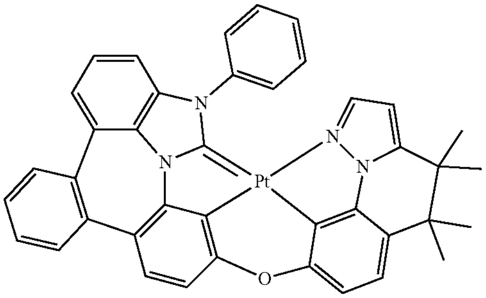
,
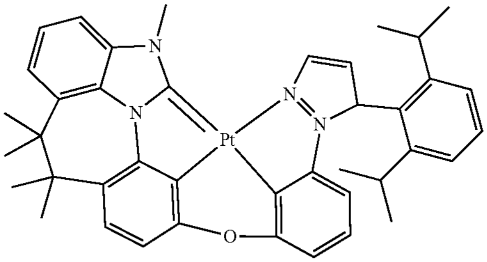
,
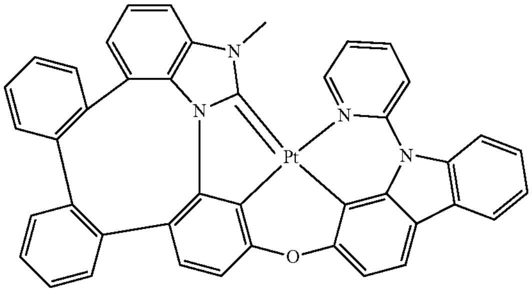
,
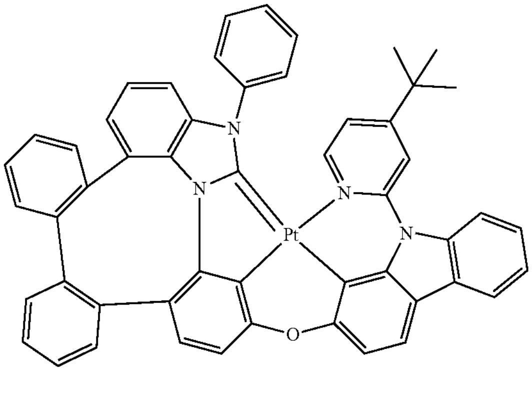
,
-continued
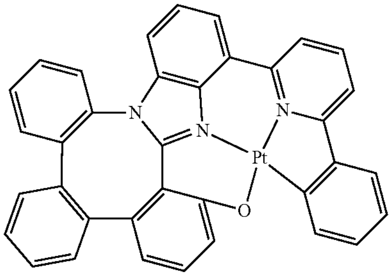
,
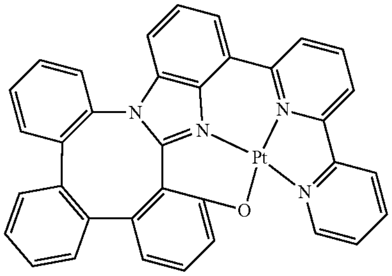
,
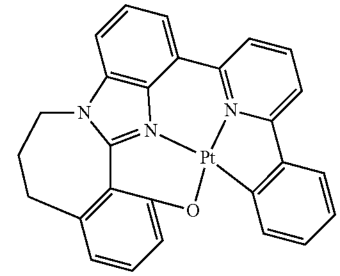
,
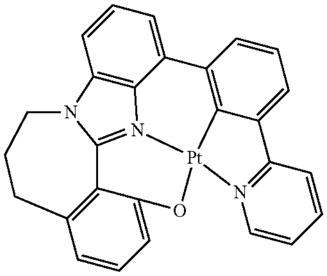
,
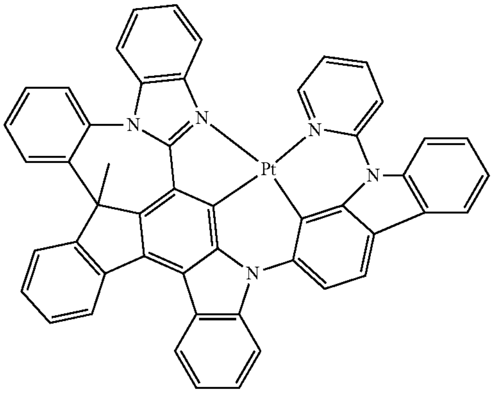
, -continued
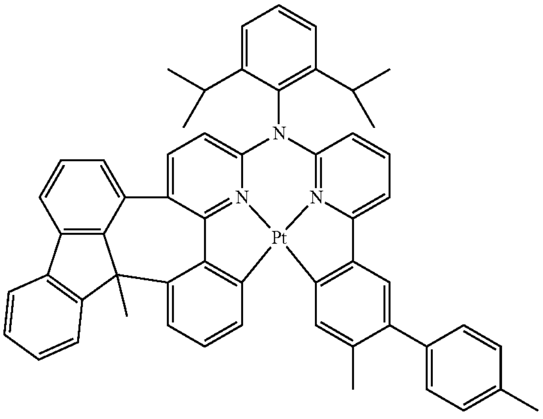
,
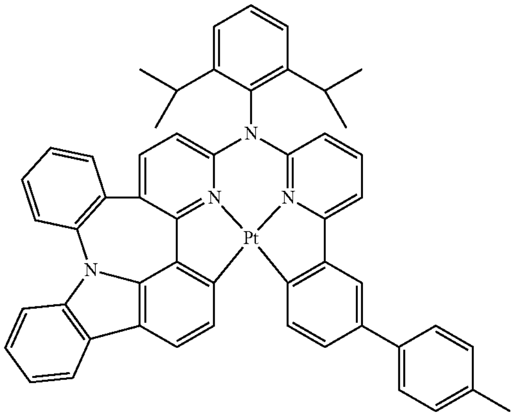
,
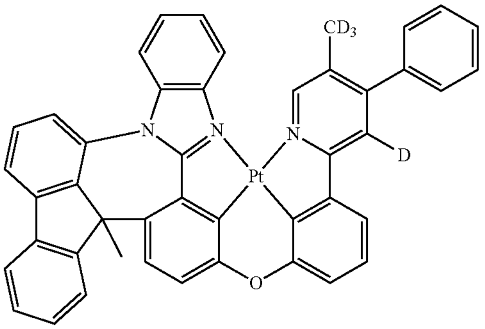
,
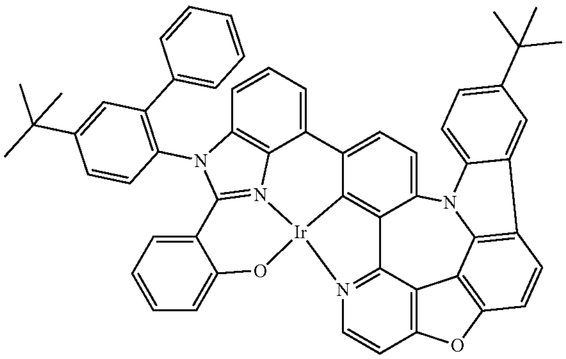
,
-continued
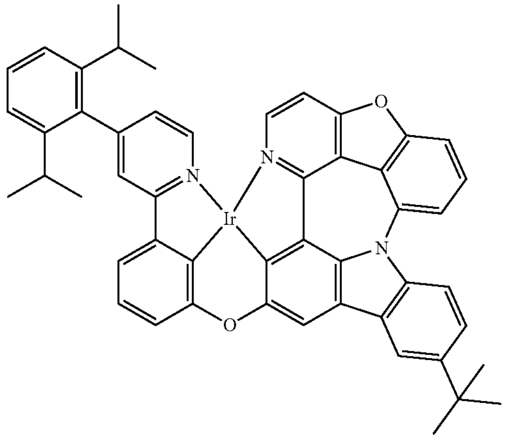
,
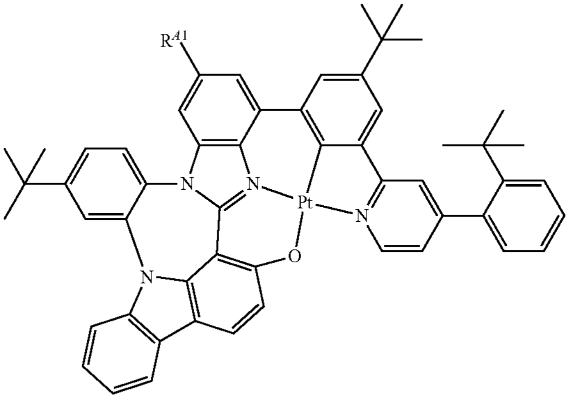
,
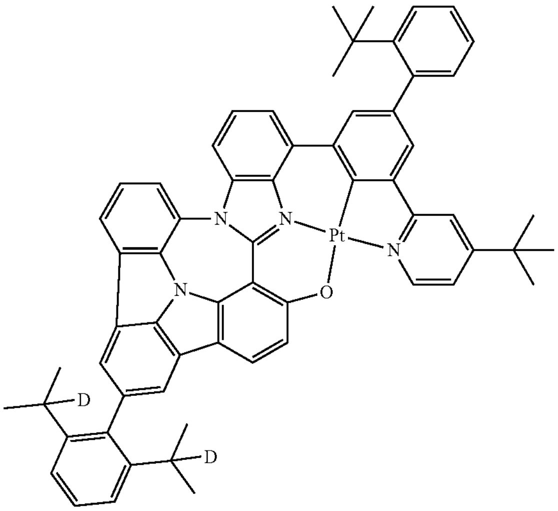
,
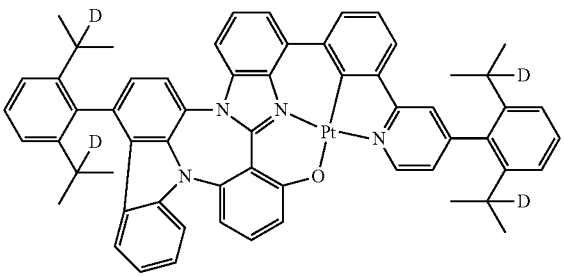
, -continued
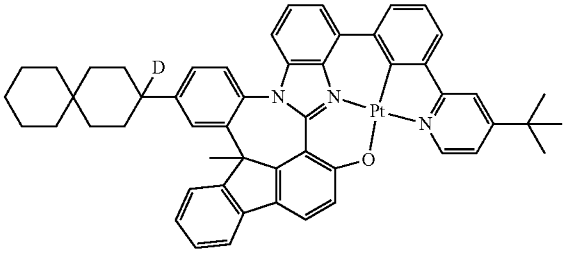
,
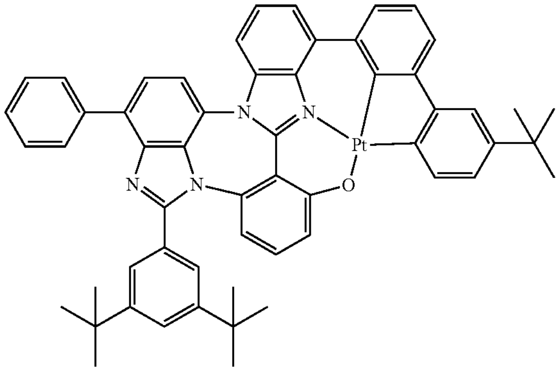
,
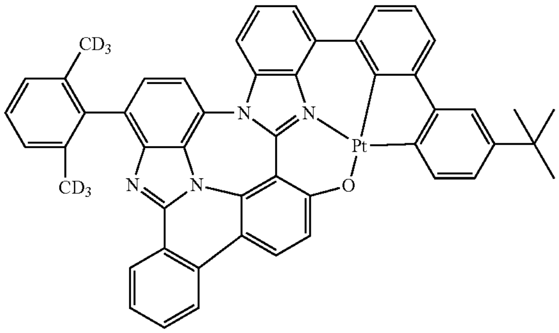
,
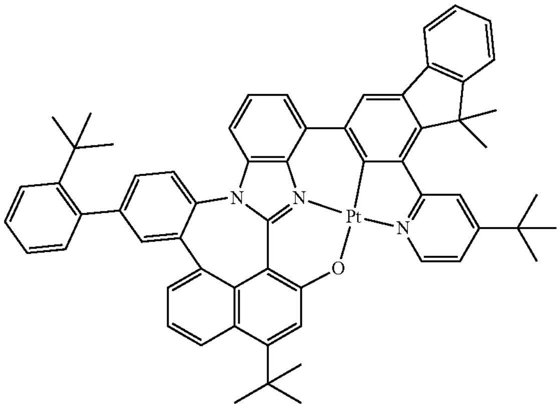
,
-continued
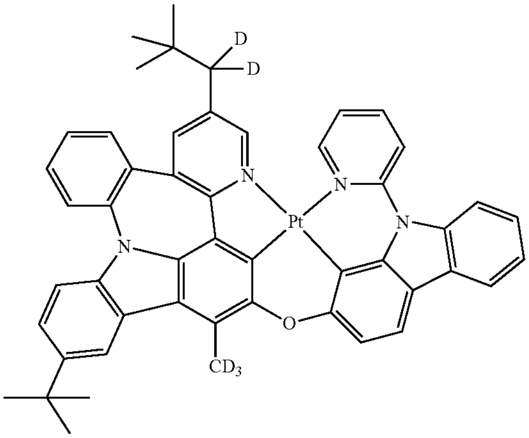
,
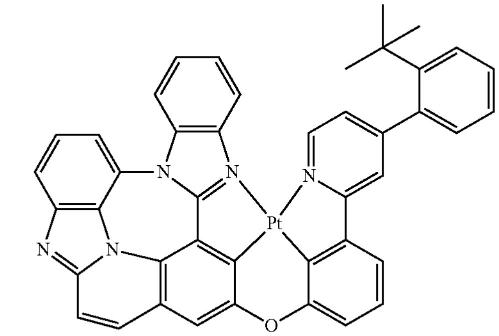
,
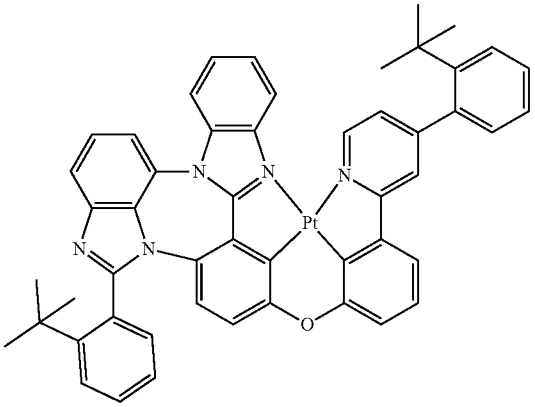
,
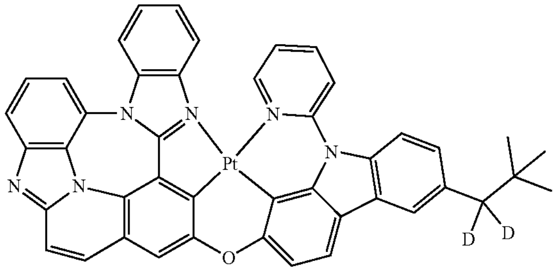
, -continued
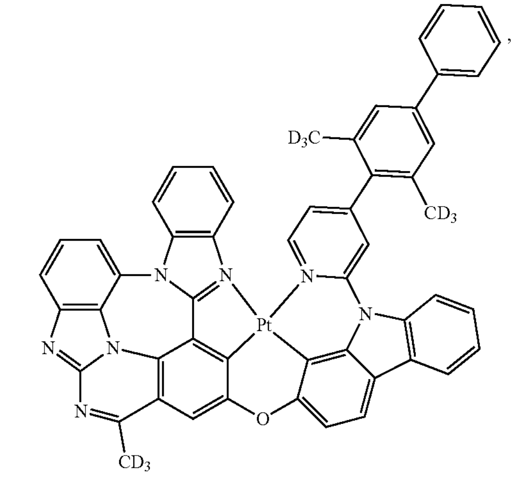
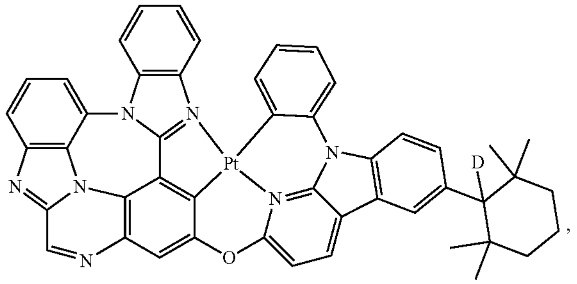
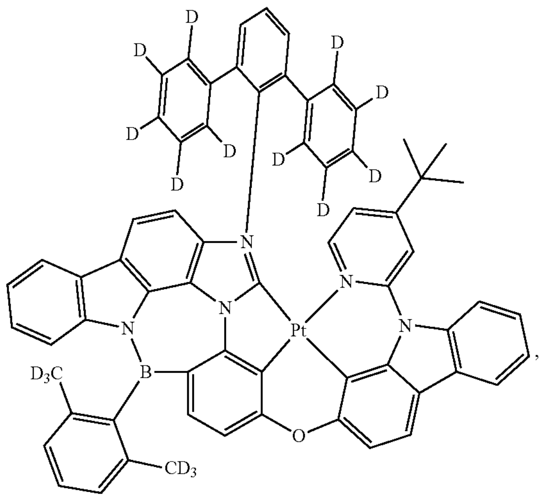
-continued
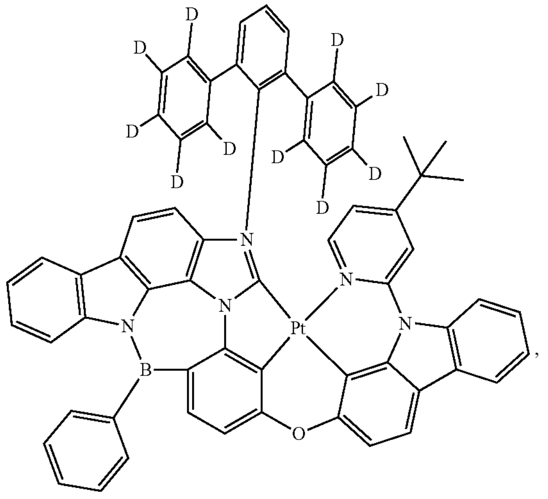
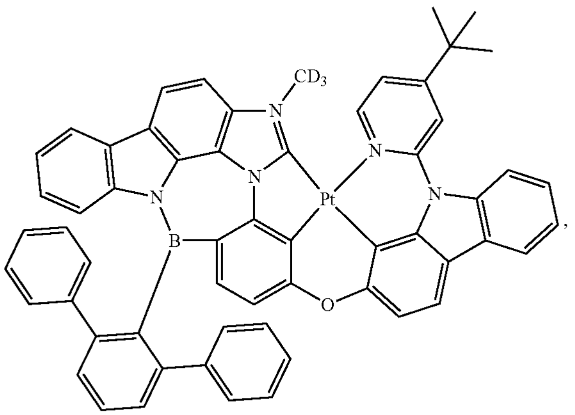
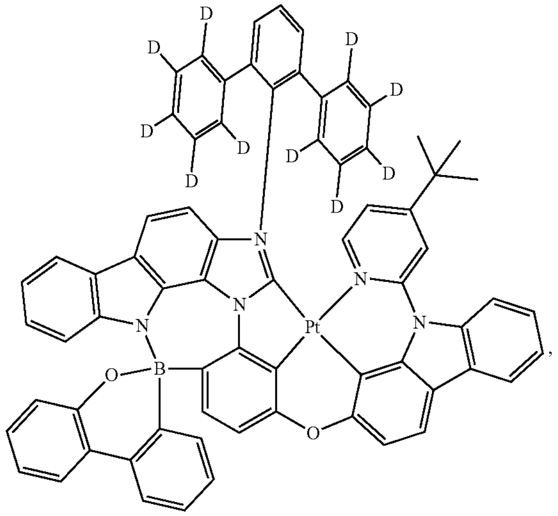

-continued
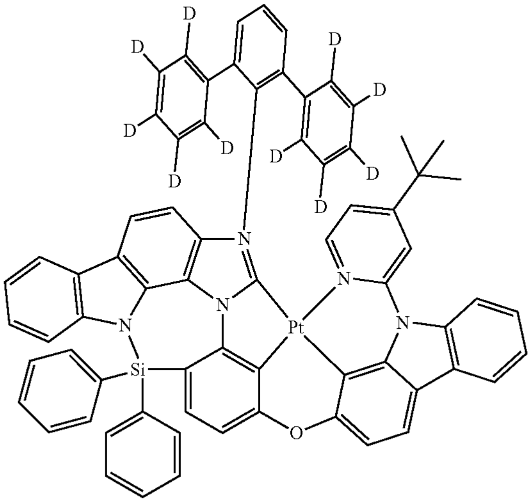
,
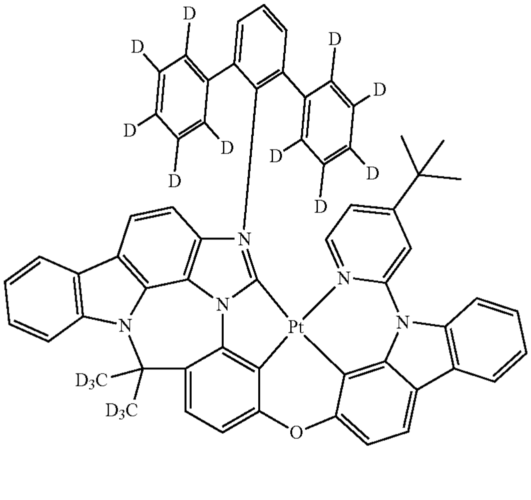
,
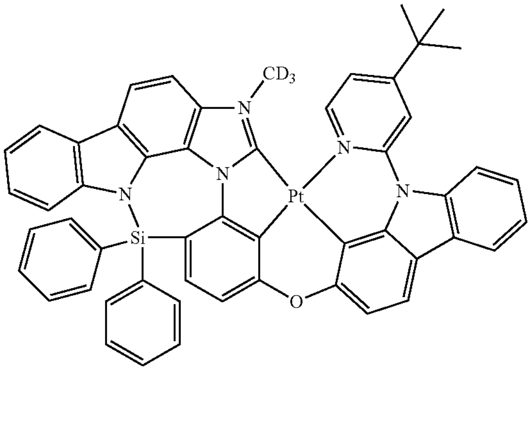
,
-continued
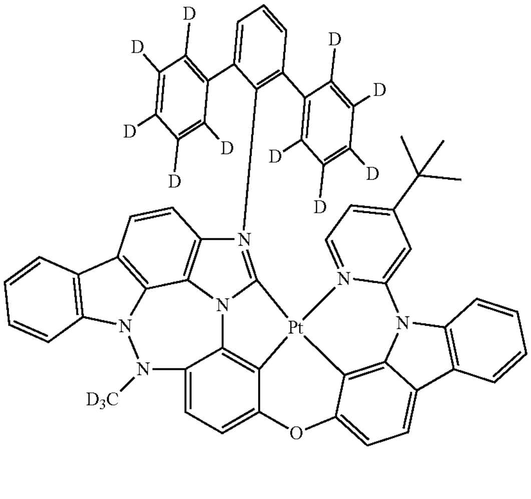
,
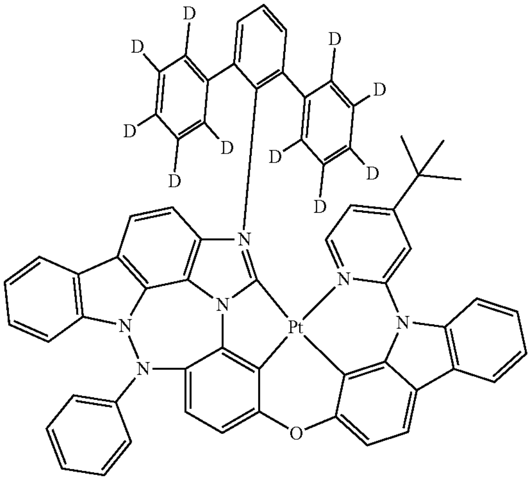
,
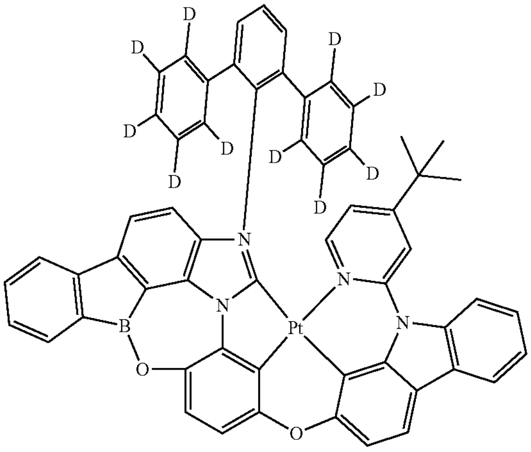
, -continued
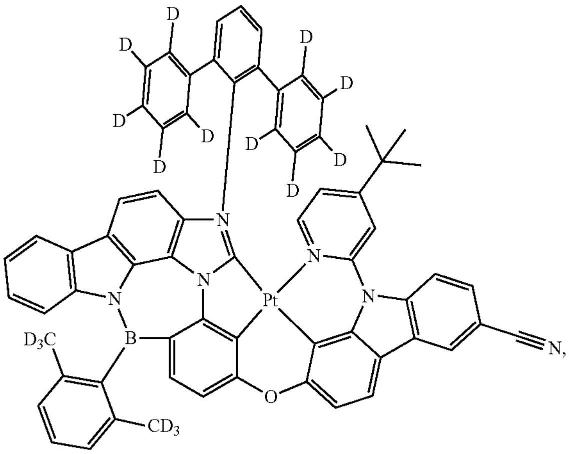
,
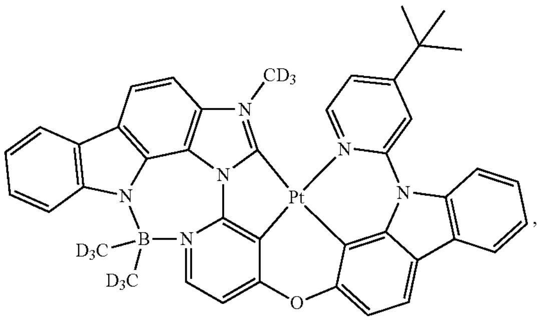
,
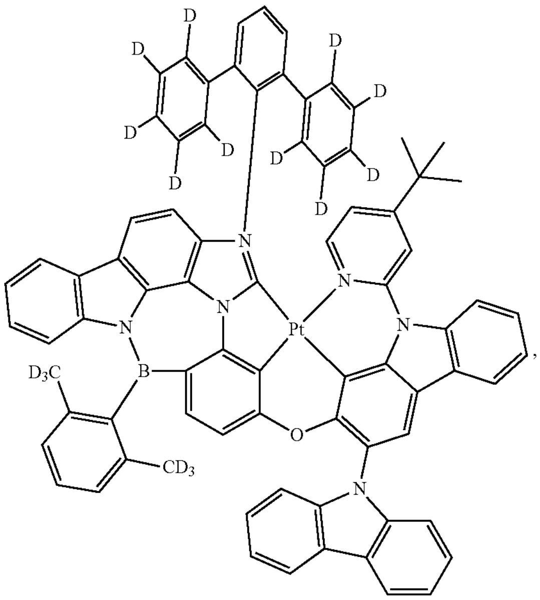
,
-continued
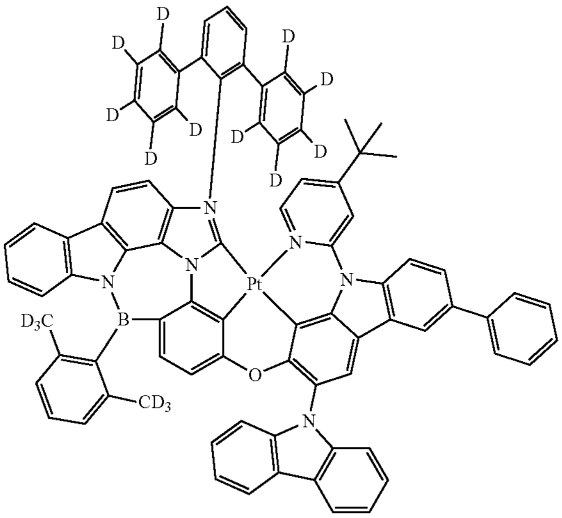
,
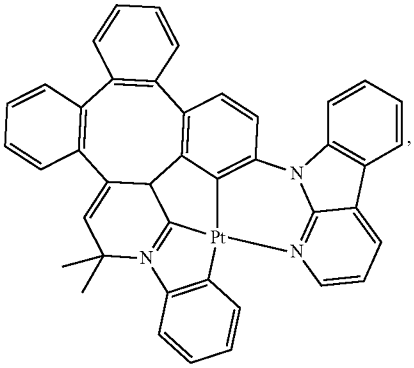
,
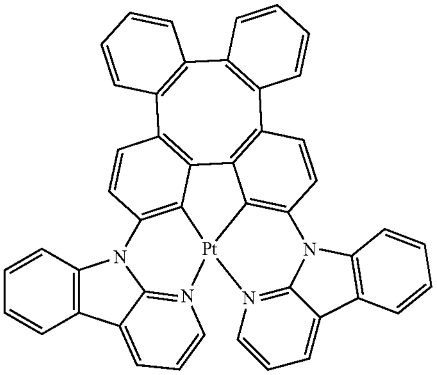
,
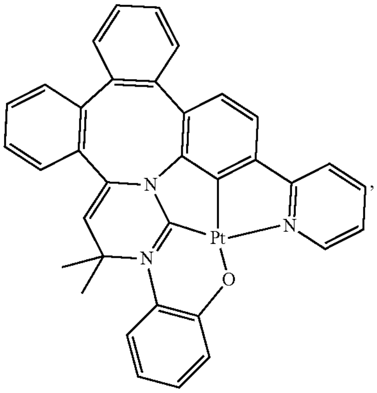
, -continued
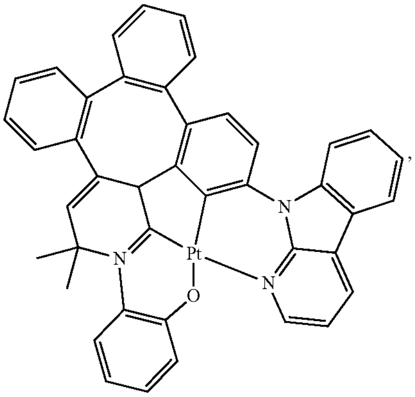,
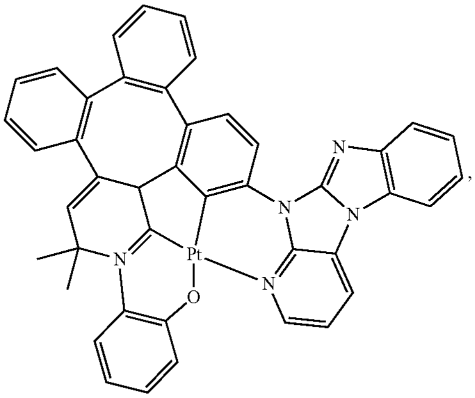,
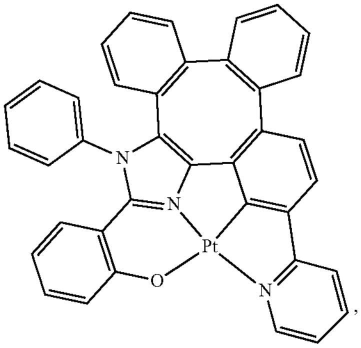,
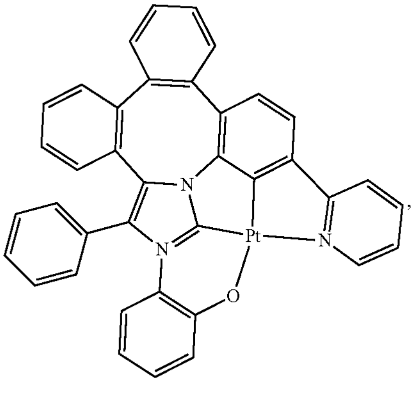,
-continued
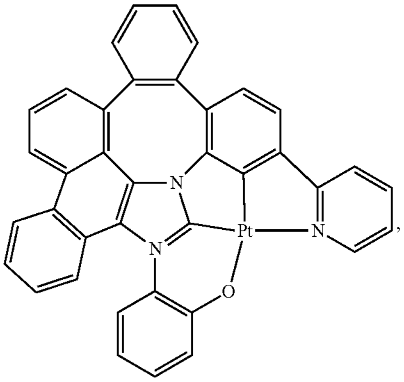,
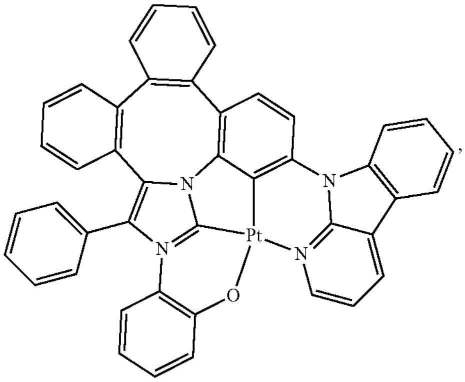,
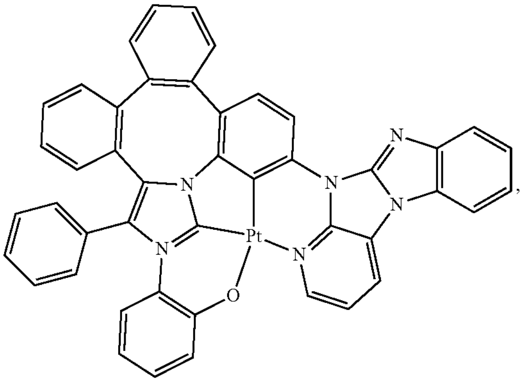,
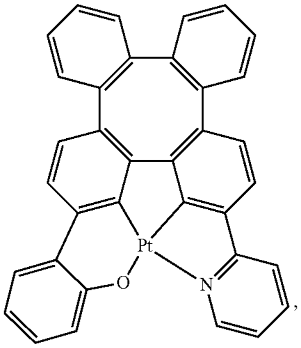, -continued
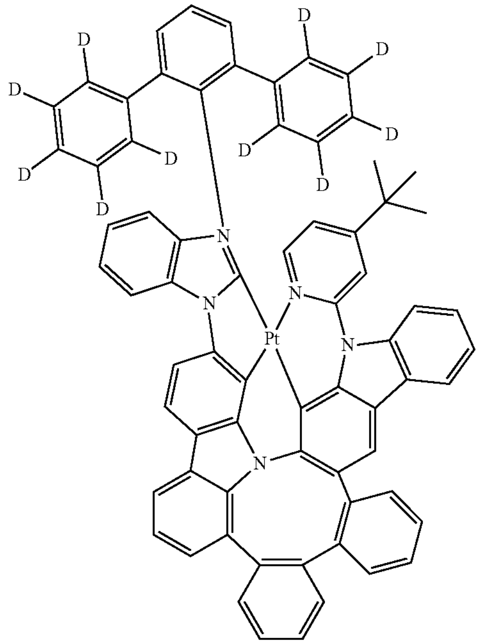
,
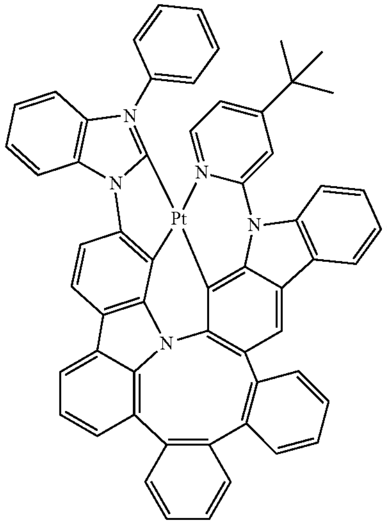
,
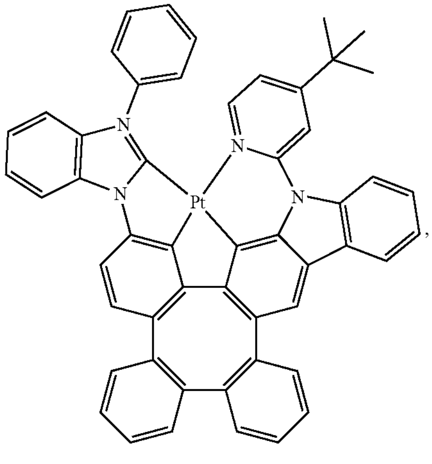
,
-continued
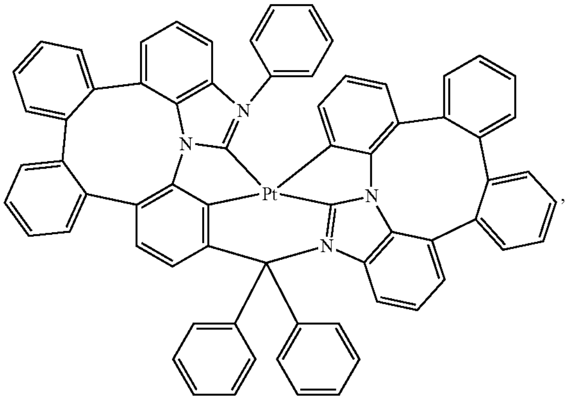
,
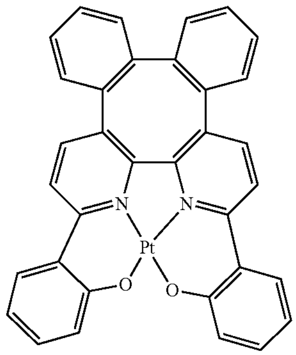
,
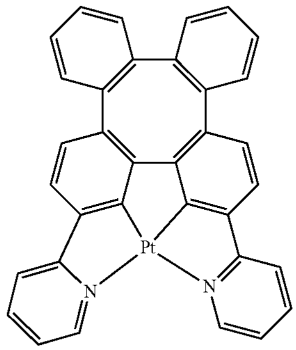
,
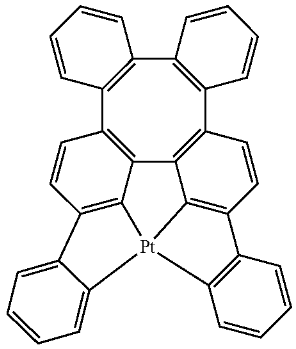
, -continued
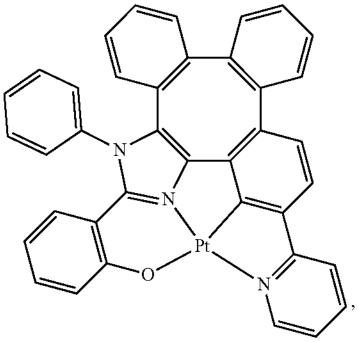
,
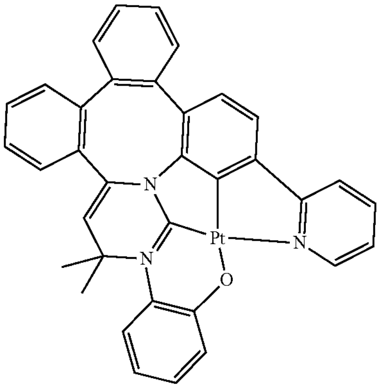
,
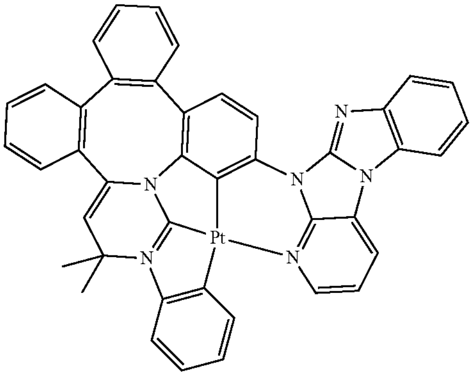
,
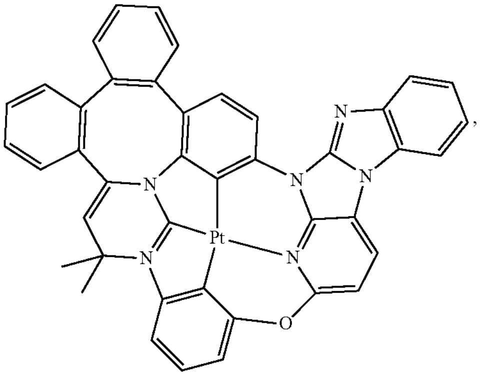
,
-continued
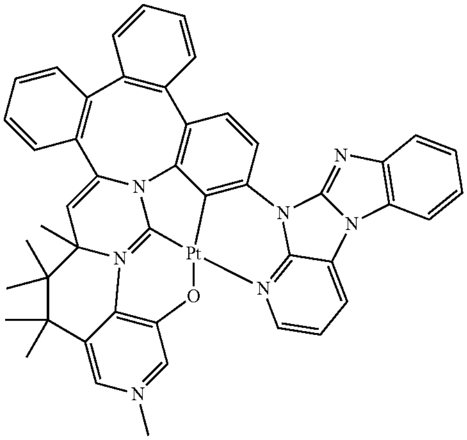
,
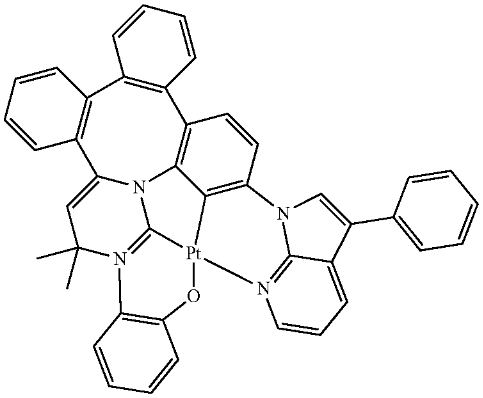
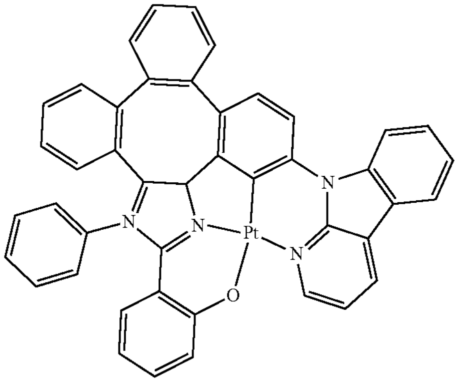
,
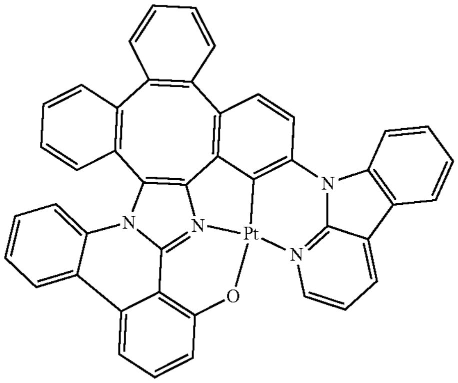
, -continued
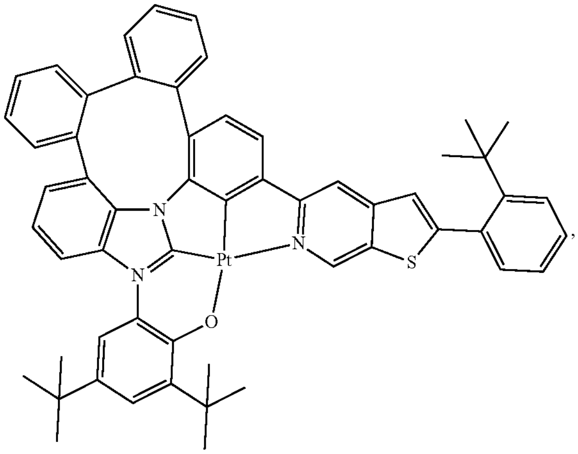
,
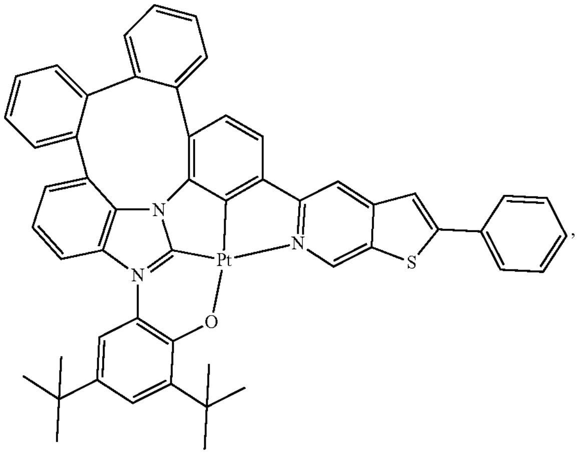
,
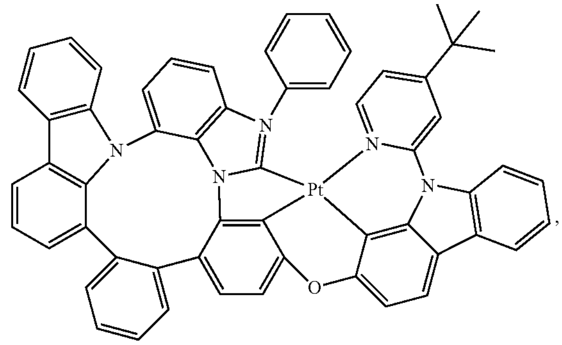
,
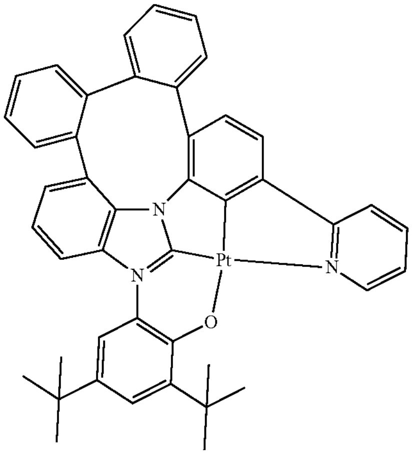
,
-continued
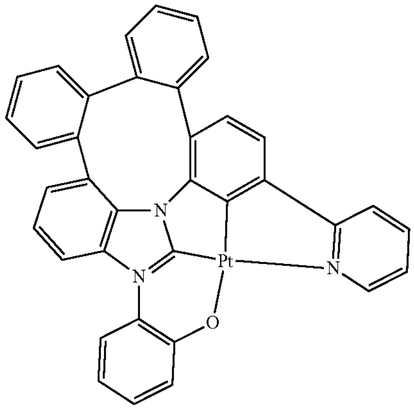
,
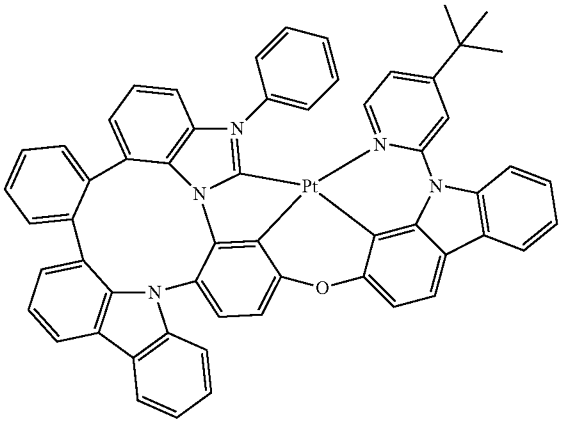
,
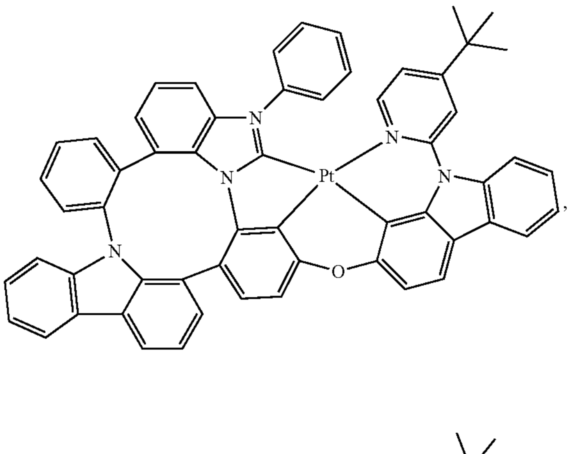
,
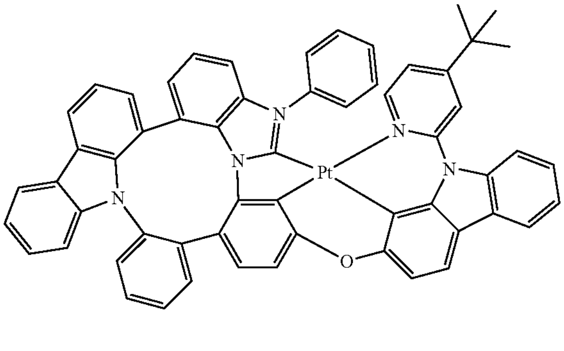
, -continued
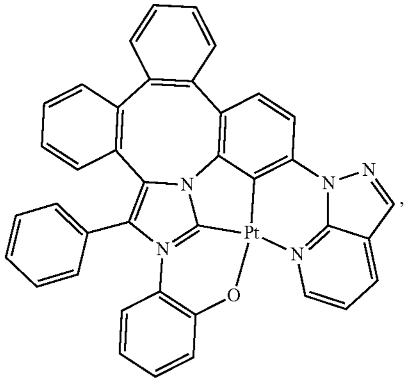
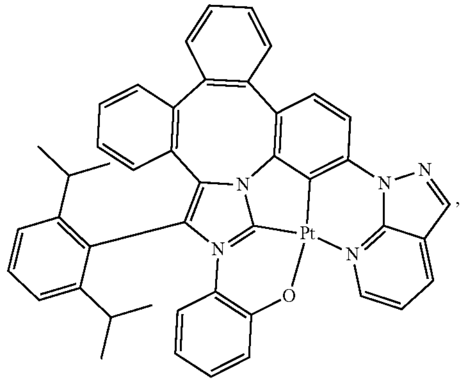
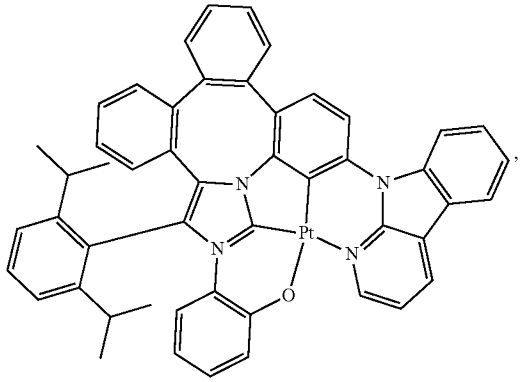
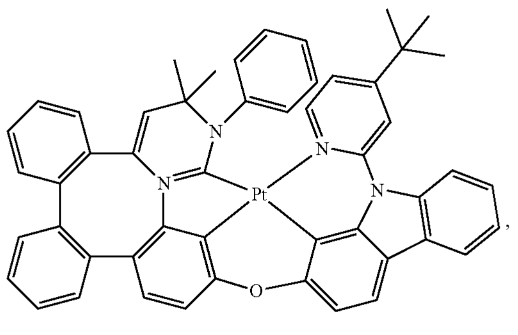
-continued
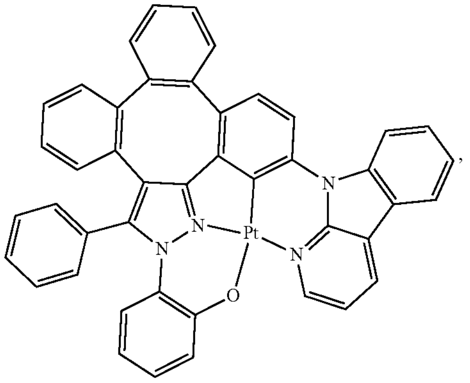
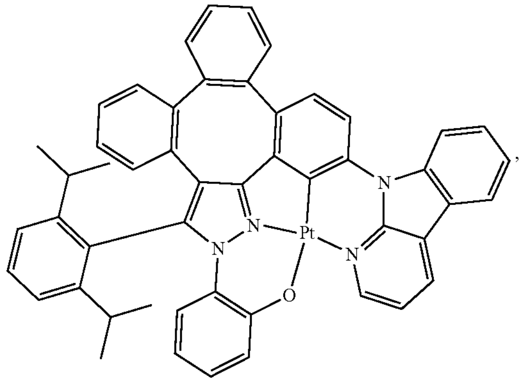
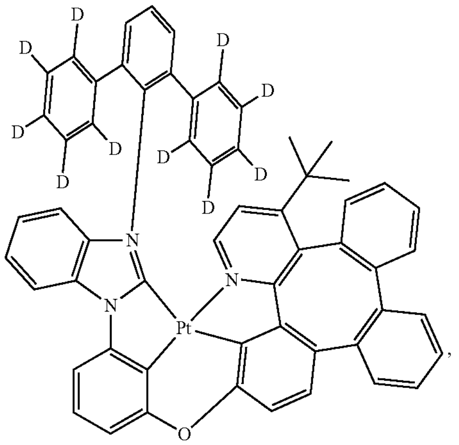
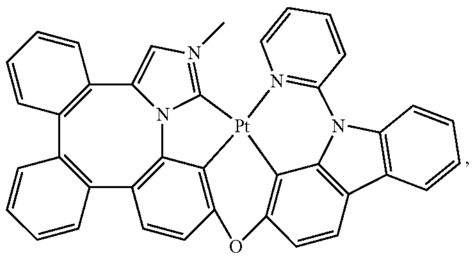

-continued
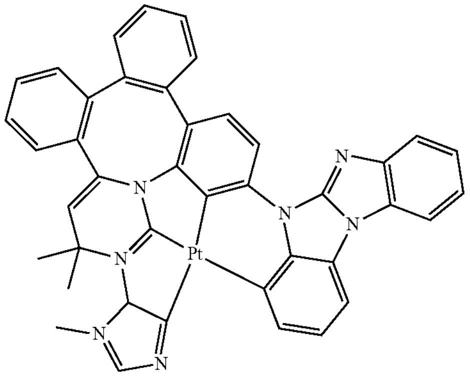
,
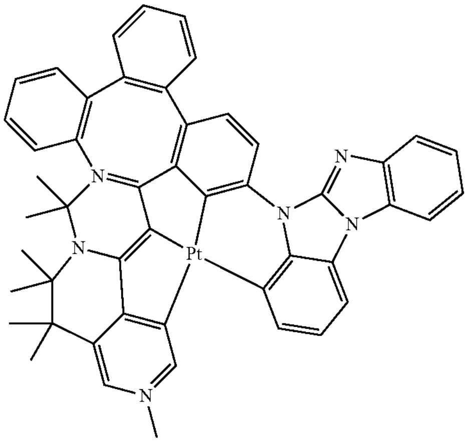
,
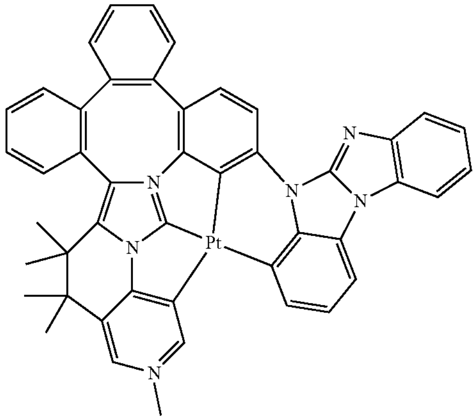
,
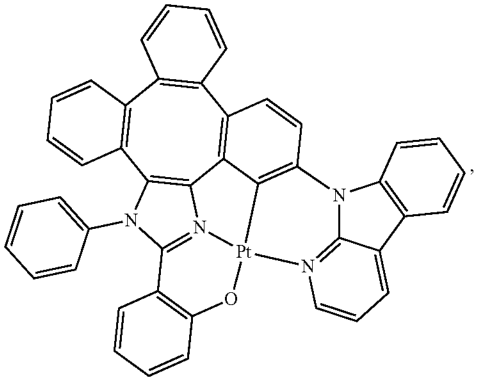
,
-continued
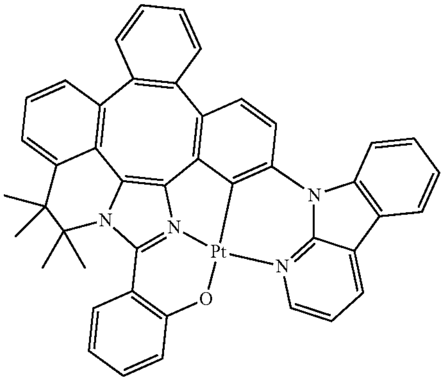
,
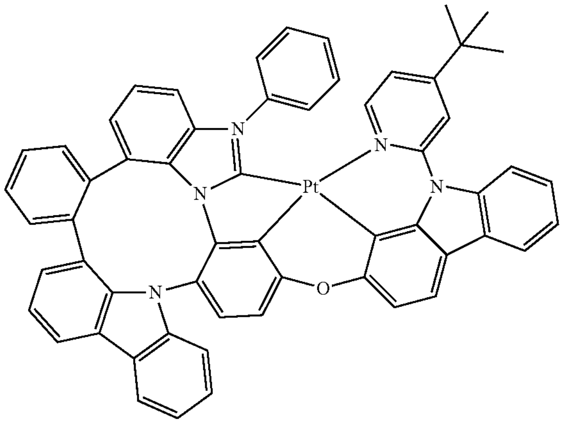
,
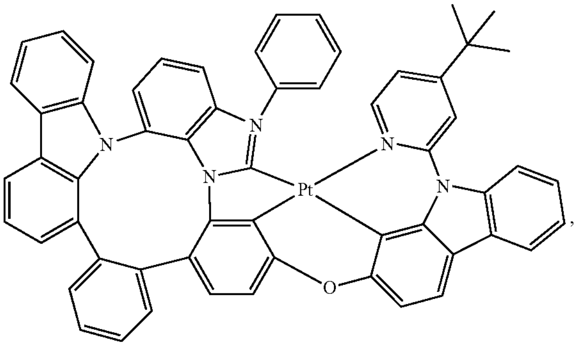
,
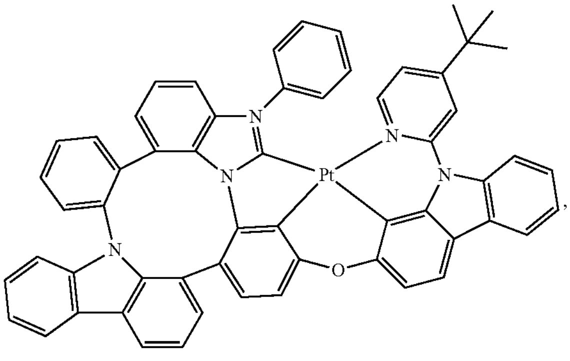
, -continued
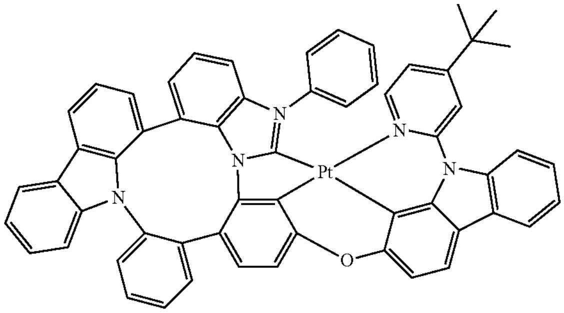
,
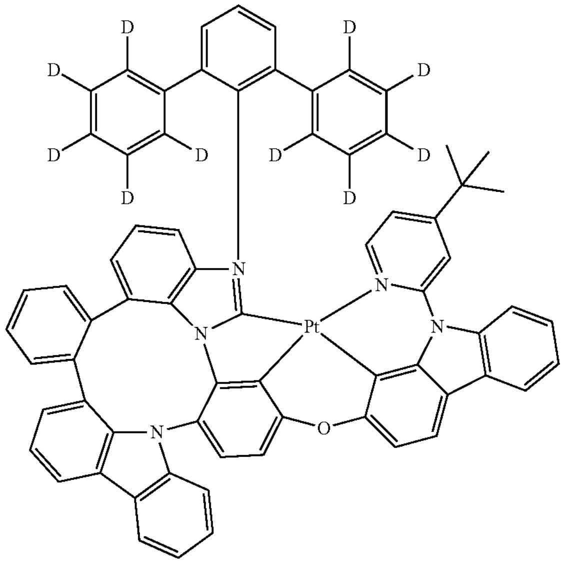
,
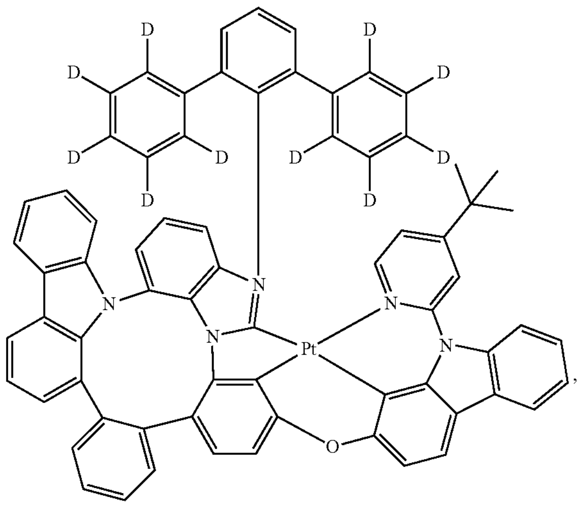
,
-continued
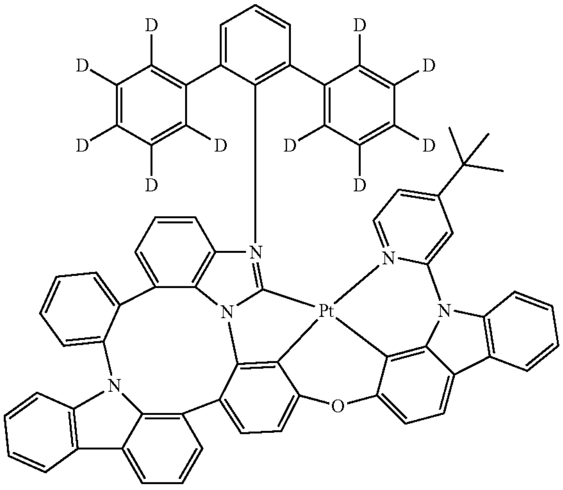
,
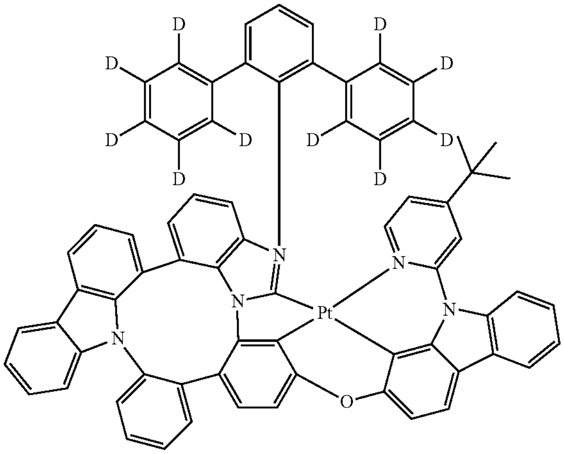
,
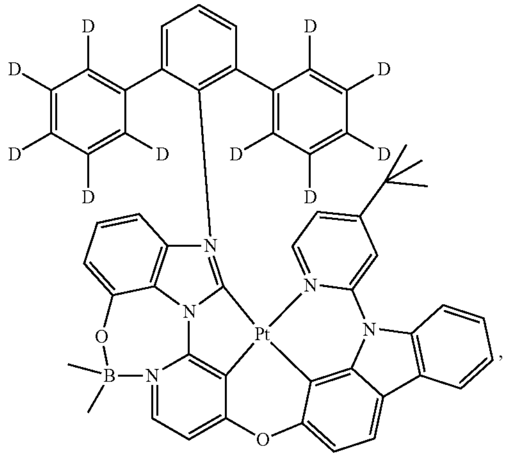
,
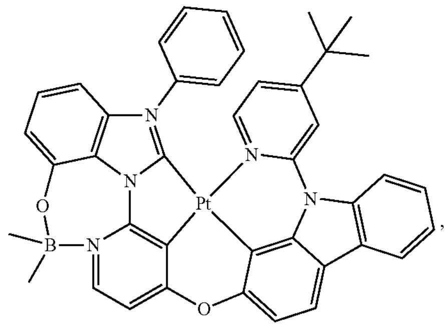
, -continued
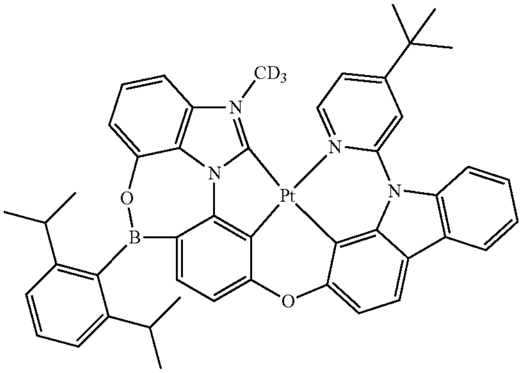
,
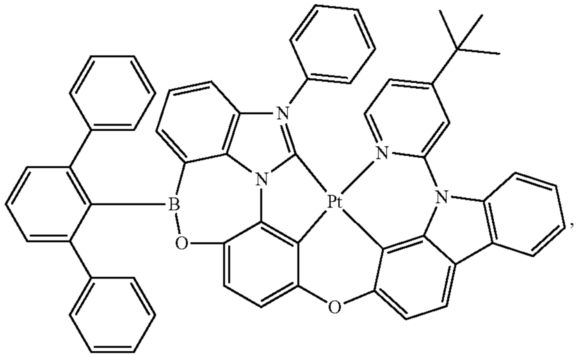
,
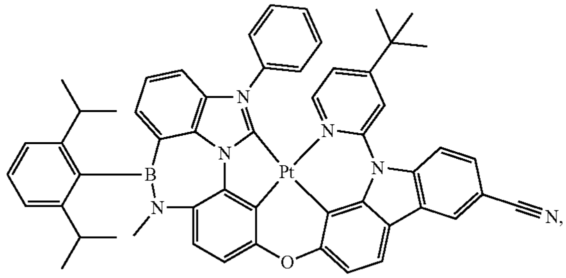
,
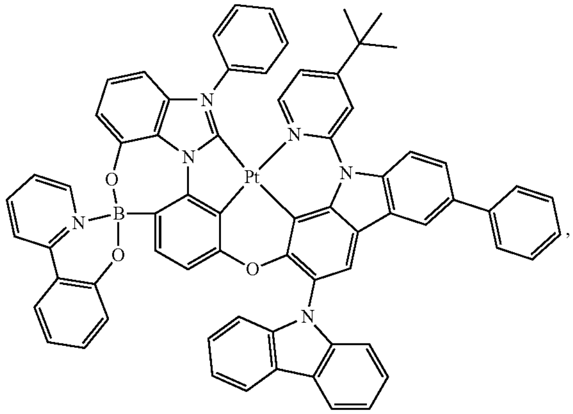
,
-continued
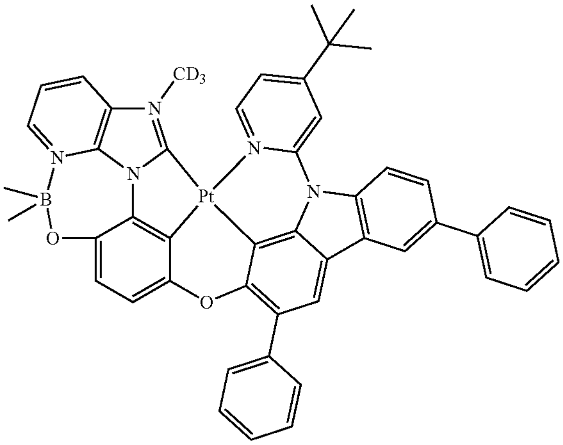
,
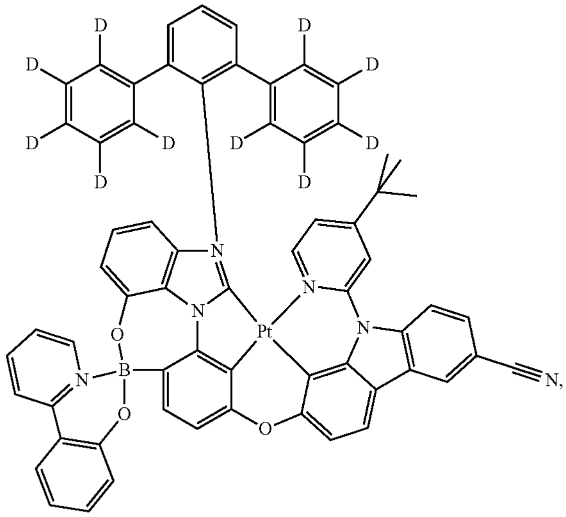
,
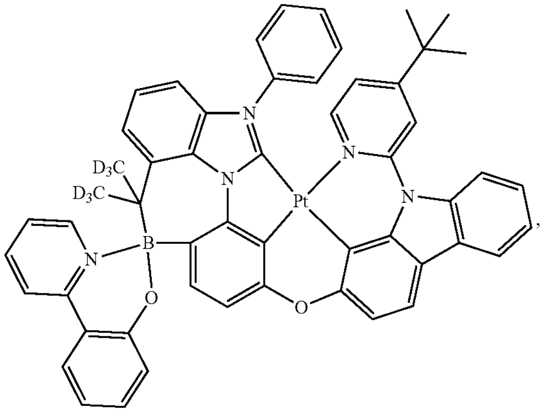
, -continued

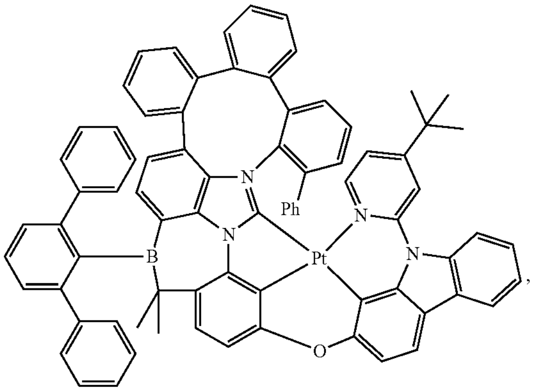

, and

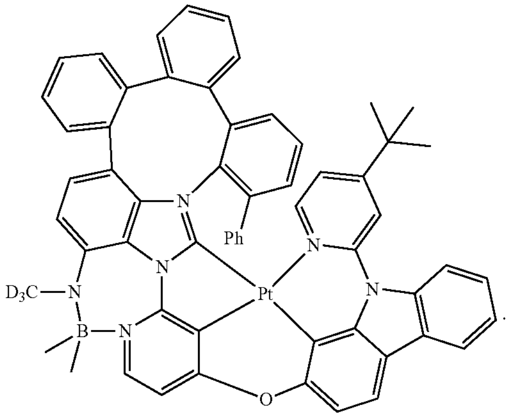

.

In some embodiments, the compound having a ligand $L_A$ of Formula I described herein can beat least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of possible hydrogen atoms (e.g., positions that are hydrogen or deuterium) that are replaced by deuterium atoms.

C. The OLEDs and the Devices of the Present Disclosure

In another aspect, the present disclosure also provides an OLED device comprising an organic layer that contains a compound as disclosed in the above compounds section of the present disclosure.

In some embodiments, the organic layer may comprise a compound comprising a ligand $L_A$ of a structure of Formula I

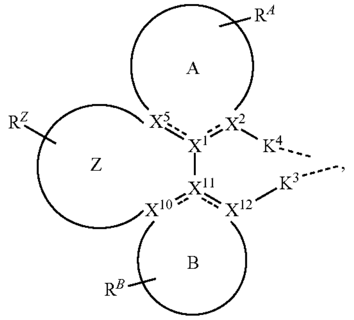

wherein moieties A and B can be each independently a monocyclic or polycyclic fused ring structure comprising 5-membered and/or 6-membered carbocyclic or heterocyclic rings; ring Z is a 7-, 8-, 9-, or 10-membered ring; $X^1$, $X^2$, $X^5$, $X^{10}$, $X^{11}$, and $X^{12}$ are each independently C or N, with at least one of $X^1$ or $X^{11}$ being C; ⚌ is either a single bond or a double bond; $K^3$ and $K^4$ are each independently selected from the group consisting of a direct bond, O, and S; $R^A$, $R^B$, and $R^Z$ each independently represents zero, mono, or up to a maximum allowed number of substitutions to its associated ring; each of $R^A$, $R^B$, and $R^Z$ is independently a hydrogen or a substituent selected from the group consisting of the general substituents defined herein; and any two adjacent $R^A$, $R^B$, or $R^Z$ can be joined or fused to form a ring, wherein the ligand $L_A$ is coordinated to a metal M through the two indicated dashed lines; wherein M is selected from the group consisting of Ru, Os, Ir, Pd, Pt, Cu, Ag, and Au, and can be coordinated to other ligands; and wherein the ligand $L_A$ can be joined with other ligands to form a tridentate, tetradentate, pentadentate, or hexadentate ligand.

In some embodiments, the organic layer may be an emissive layer and the compound as described herein may be an emissive dopant or a non-emissive dopant.

In some embodiments, the organic layer may further comprise a host, wherein the host comprises a triphenylene containing benzo-fused thiophene or benzo-fused furan, wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}CC_nH_{2n+1}$, $Ar_1$, $Ar_1$-$Ar_2$, $C_nH_{2n}{-}Ar_1$, or no substitution, wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments, the organic layer may further comprise a host, wherein host comprises at least one chemical moiety selected from the group consisting of triphenylene, carbazole, indolocarbazole, dibenzothiophene, dibenzofuran, dibenzoselenophene, 5a2-benzo[d]benzo[4,5]imidazo[3,2-a]imidazole, 5,9-dioxa-13b-boranaphtho[3,2,1-de]anthracene, triazine, aza-triphenylene, aza-carbazole, aza-indolocarbazole, aza-dibenzothiophene, aza-dibenzofuran, aza-dibenzoselenophene, aza-5λ2-benzo[d]benzo[4,5]imidazo[3,2-a]imidazole, and aza-(5,9-dioxa-13b-boranaphtho[3,2,1-de]anthracene).

In some embodiments, the host may be selected from the group consisting of:

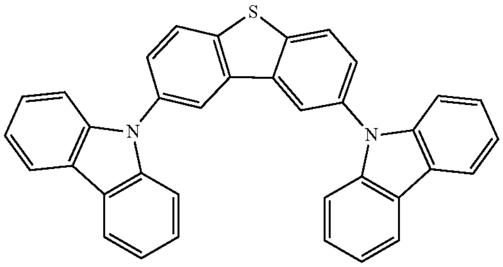
,
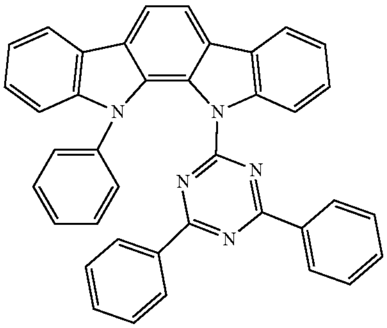
,
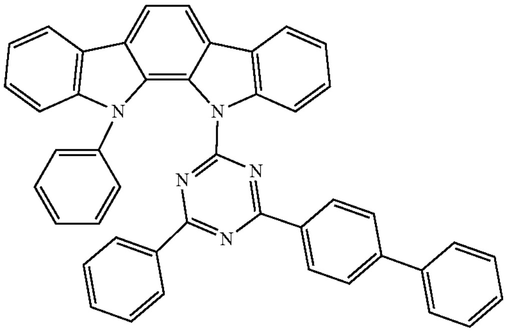
,
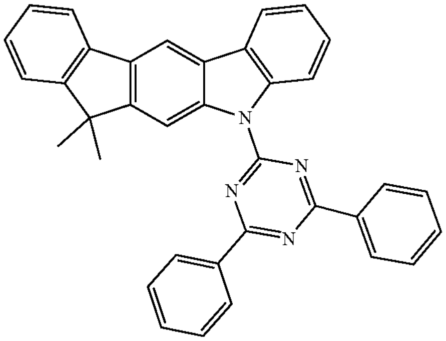
,
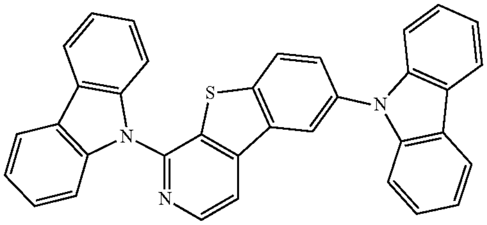
,
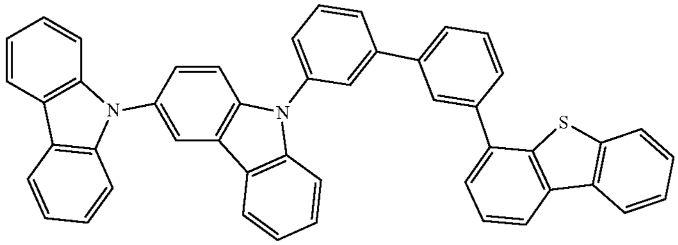
,
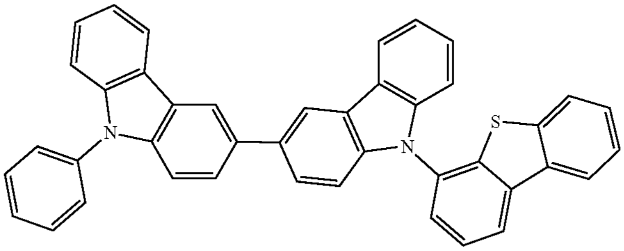
,
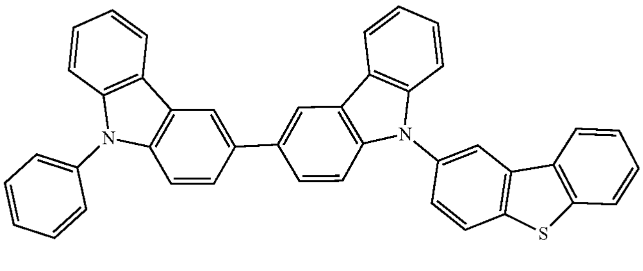
,
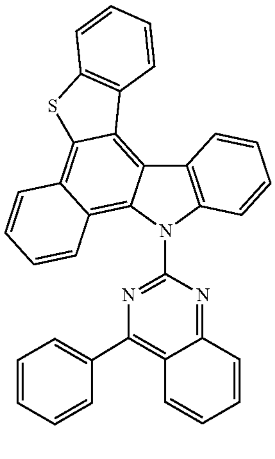
, -continued
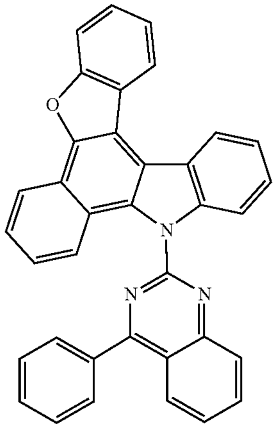
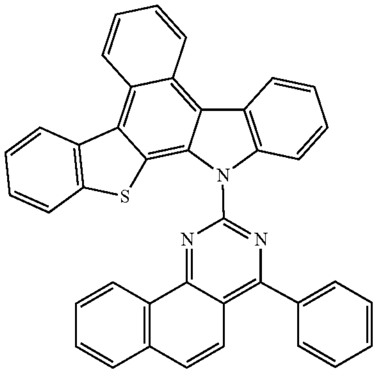
,
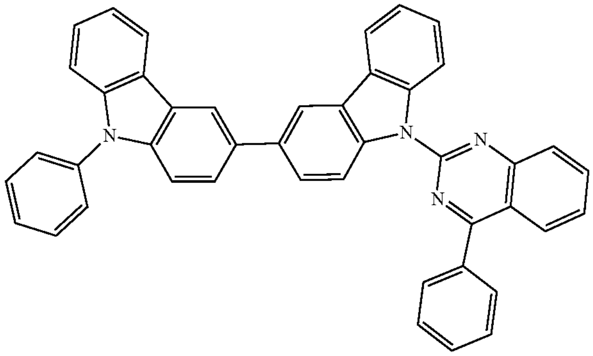
,
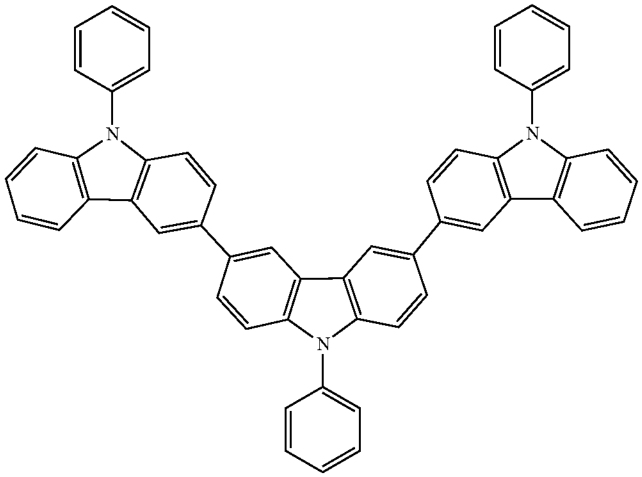
,
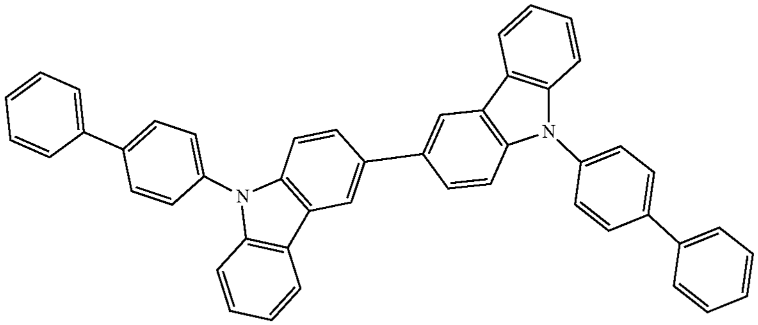
, -continued
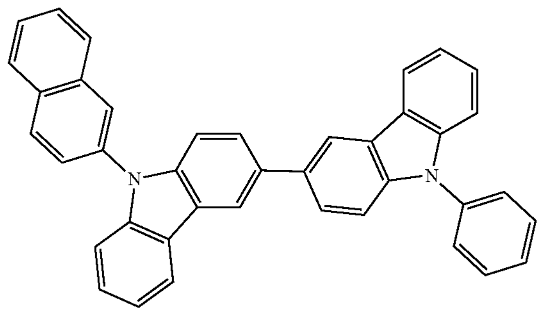
,
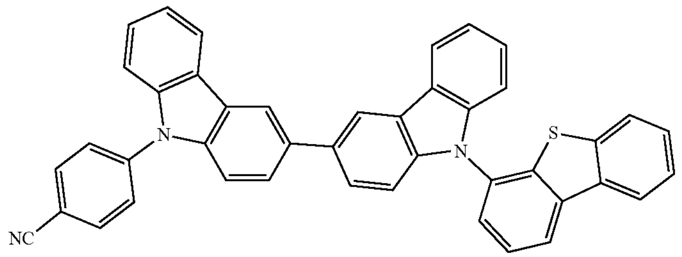
,
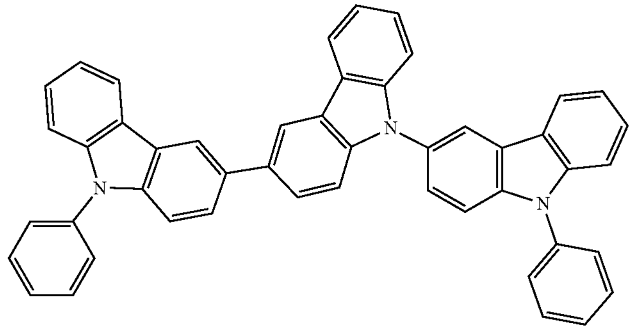
,
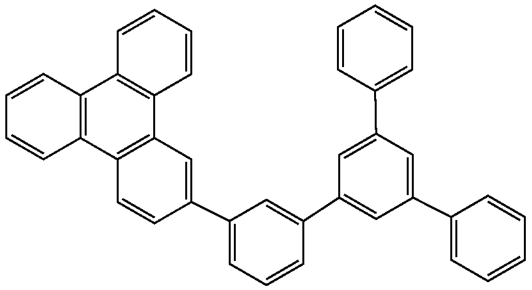
,
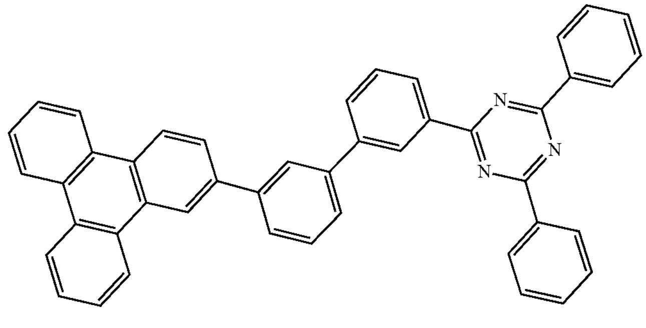
,
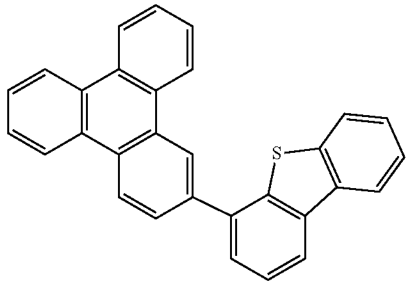
,
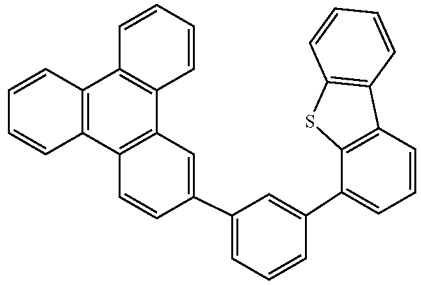
,
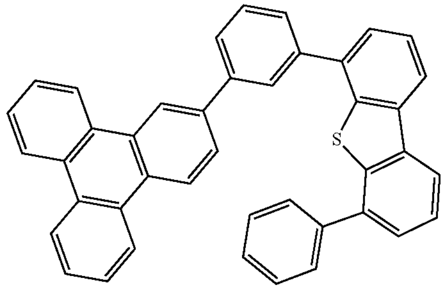
, -continued
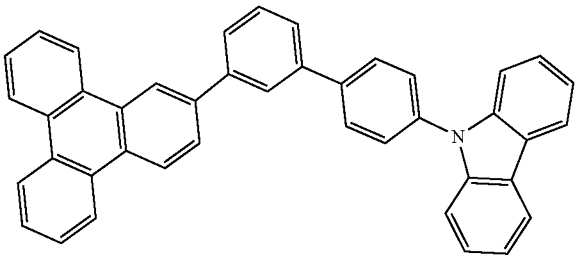,
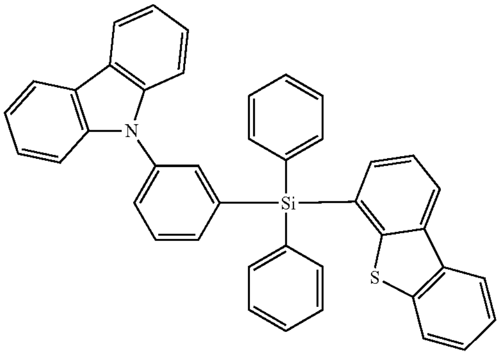,
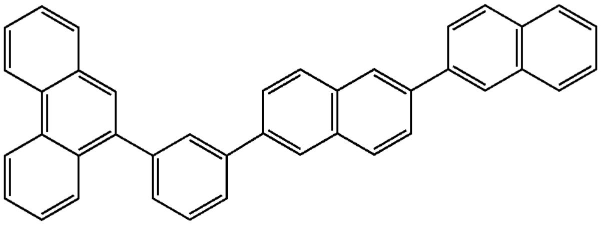,
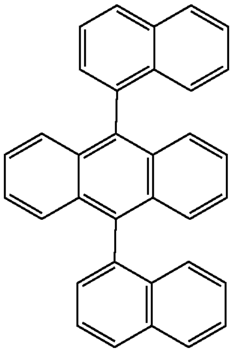,
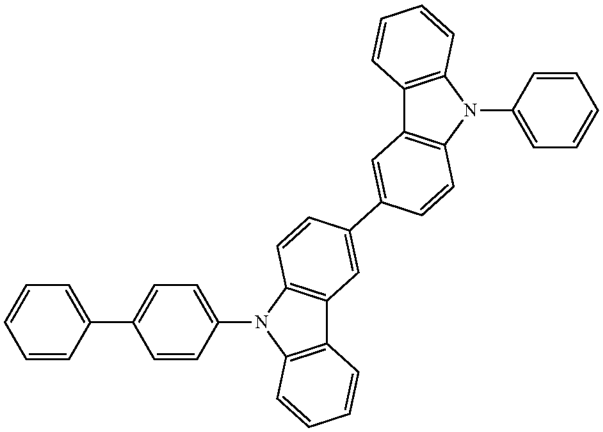,
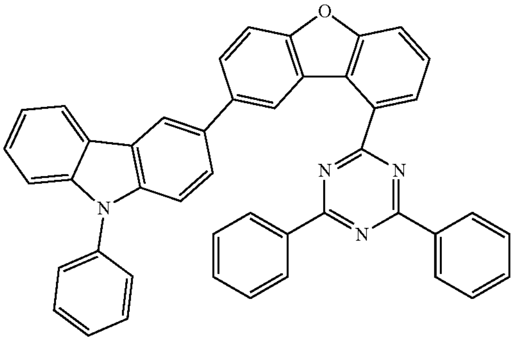,
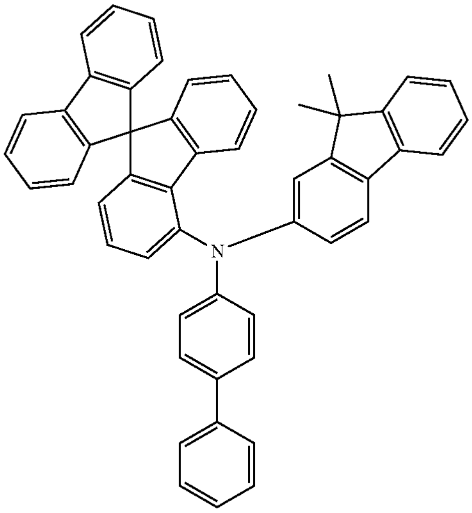,
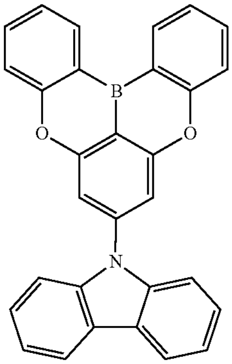,
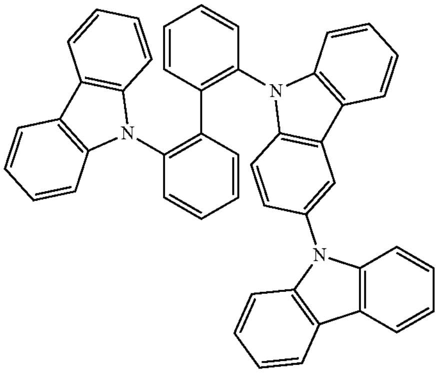, -continued

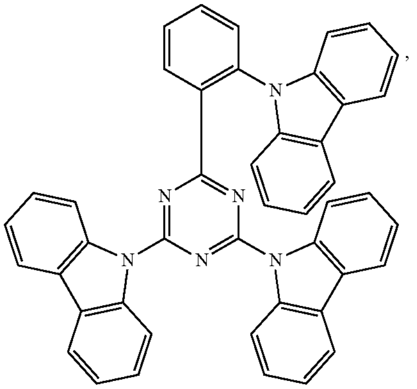

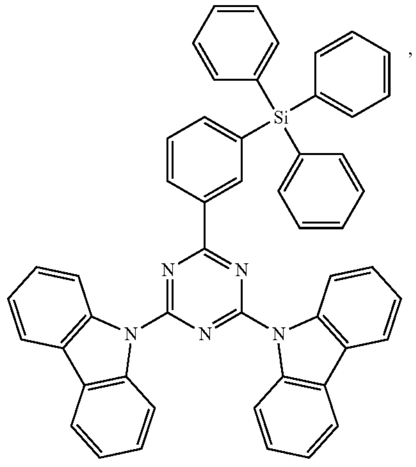

and combinations thereof.

In some embodiments, the organic layer may further comprise a host, wherein the host comprises a metal complex.

In some embodiments, the compound as described herein may be a sensitizer; wherein the device may further comprise an acceptor; and wherein the acceptor may be selected from the group consisting of fluorescent emitter, delayed fluorescence emitter, and combination thereof.

In yet another aspect, the OLED of the present disclosure may also comprise an emissive region containing a compound as disclosed in the above compounds section of the present disclosure.

In some embodiments, the emissive region may comprise a compound comprising a ligand $L_A$ of a structure of Formula I

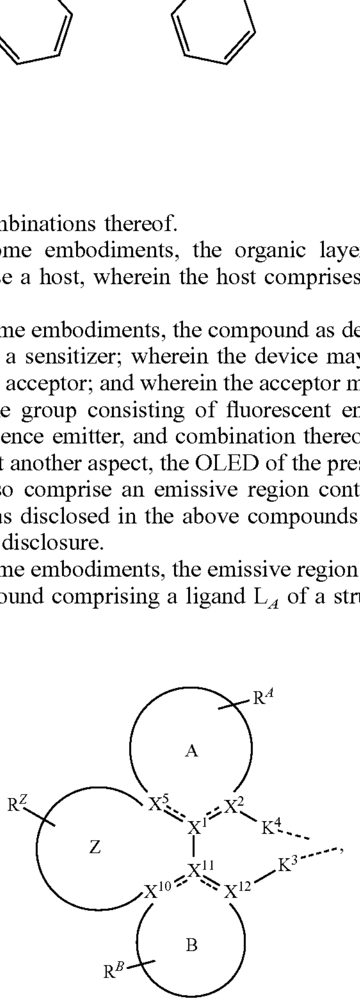

wherein moieties A and B can be each independently a monocyclic or polycyclic fused ring structure comprising 5-membered and/or 6-membered carbocyclic or heterocyclic rings; ring Z is a 7-, 8-, 9-, or 10-membered ring; $X^1$, $X^2$, $X^5$, $X^{10}$, $X^{11}$, and $X^{12}$ are each independently C or N, with at least one of $X^1$ or $X^{11}$ being C; ═══ is either a single bond or a double bond; $K^3$ and $K^4$ are each independently selected from the group consisting of a direct bond, O, and S; $R^A$, $R^B$, and $R^Z$ each independently represents zero, mono, or up to a maximum allowed number of substitutions to its associated ring; each of $R^A$, $R^B$, and $R^Z$ is independently a hydrogen or a substituent selected from the group consisting of the general substituents defined herein; and any two adjacent $R^A$, $R^B$, or $R^Z$ can be joined or fused to form a ring, wherein the ligand $L_A$ is coordinated to a metal M through the two indicated dashed lines; wherein M is selected from the group consisting of Ru, Os, Ir, Pd, Pt, Cu, Ag, and Au, and can be coordinated to other ligands; and wherein the ligand $L_A$ can be joined with other ligands to form a tridentate, tetradentate, pentadentate, or hexadentate ligand.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

In yet another aspect, the present disclosure also provides a consumer product comprising an organic light-emitting device (OLED) having an anode; a cathode; and an organic layer disposed between the anode and the cathode, wherein the organic layer may comprise a compound as disclosed in the above compounds section of the present disclosure.

In some embodiments, the consumer product comprises an organic light-emitting device (OLED) having an anode; a cathode; and an organic layer disposed between the anode and the cathode, wherein the organic layer may comprise a compound comprising a ligand $L_A$ of a structure of Formula I

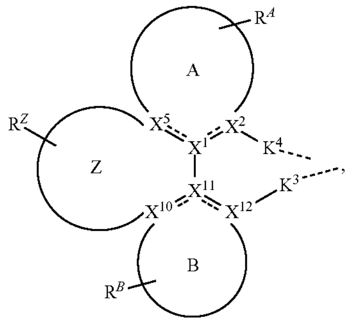

wherein moieties A and B can be each independently a monocyclic or polycyclic fused ring structure comprising 5-membered and/or 6-membered carbocyclic or heterocyclic rings; ring Z is a 7-, 8-, 9-, or 10-membered ring; $X^1$, $X^2$, $X^5$, $X^{10}$, $X^{11}$, and $X^{12}$ are each independently C or N, with at least one of $X^1$ or $X^{11}$ being C; ⚌ is either a single bond or a double bond; $K^3$ and $K^4$ are each independently selected from the group consisting of a direct bond, O, and S; $R^A$, $R^B$, and $R^Z$ each independently represents zero, mono, or up to a maximum allowed number of substitutions to its associated ring; each of $R^A$, $R^B$, and $R^Z$ is independently a hydrogen or a substituent selected from the group consisting of the general substituents defined herein; and any two adjacent $R^A$, $R^B$, or $R^Z$ can be joined or fused to form a ring, wherein the ligand $L_A$ is coordinated to a metal M through the two indicated dashed lines; wherein M is selected from the group consisting of Ru, Os, Ir, Pd, Pt, Cu, Ag, and Au, and can be coordinated to other ligands; and wherein the ligand $L_A$ can be joined with other ligands to form a tridentate, tetradentate, pentadentate, or hexadentate ligand.

In some embodiments, the consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
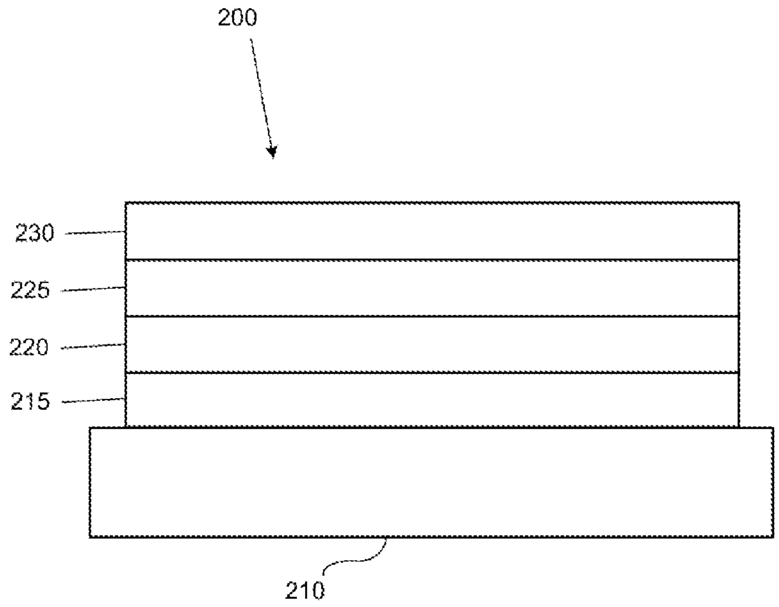
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP, also referred to as organic vapor jet deposition (OVJD)). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a “mixture”, the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

D. Combination of the Compounds of the Present Disclosure with Other Materials The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

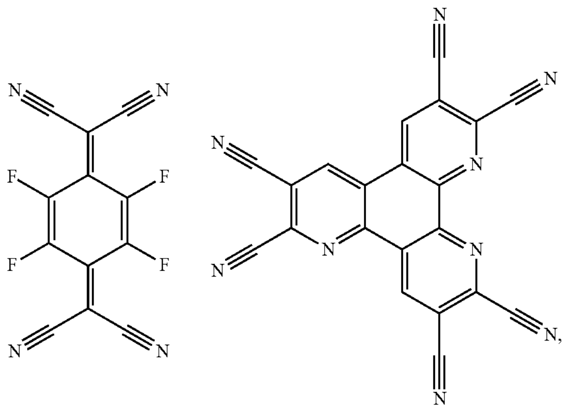

-continued

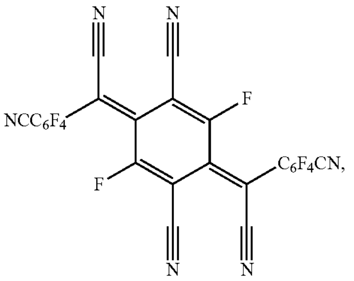

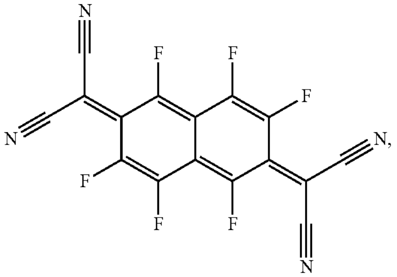

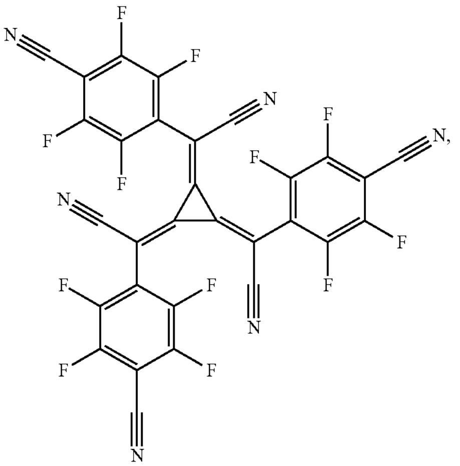

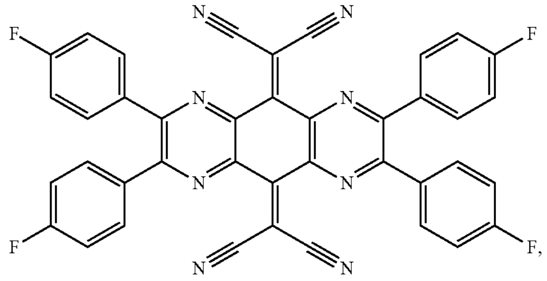

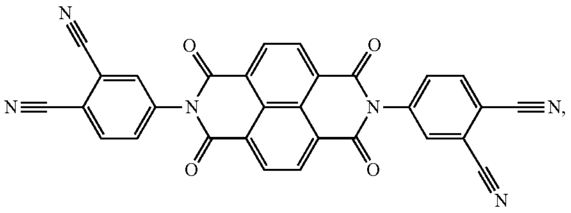

-continued

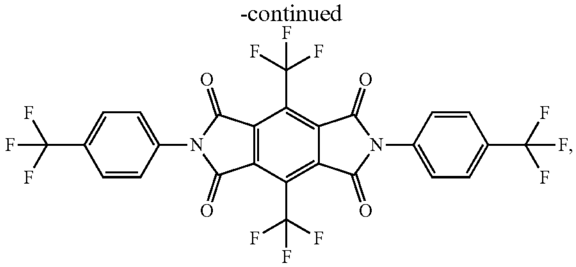

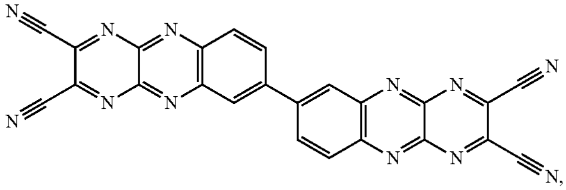

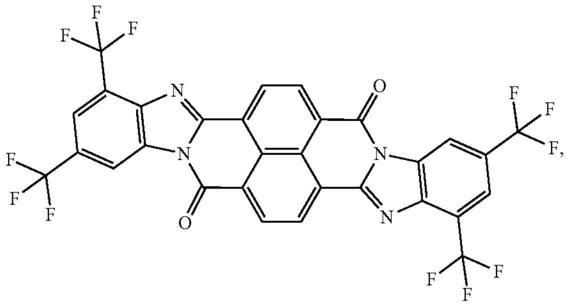

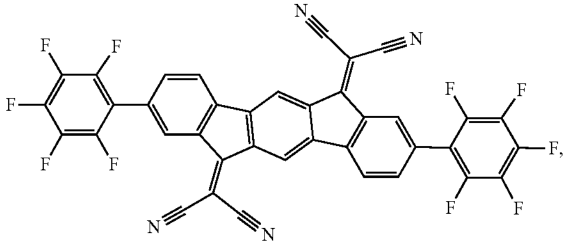

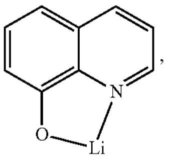

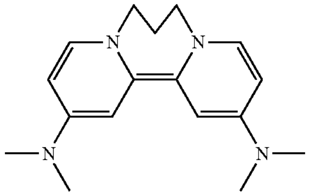

and

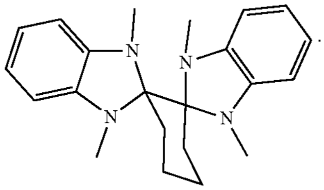

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5, 8,9,12-Hexaazatriphenylenehexacarbonitrile; a metal complex, and a cross-linkable compounds.

HIL/HTL examples can be found in paragraphs [0111] through [0117] of Universal Display Corporation's US application publication number US2020/0,295,281A1, and the contents of these paragraphs and the whole publication are herein incorporated by reference in their entireties.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

d) Hosts:

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Hosts examples can be found in paragraphs [0119] through [0125] of Universal Display Corporation's US application publication number US2020/0,295,281A1, and the contents of these paragraphs and the whole publication are herein incorporated by reference in their entireties.

e) Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified in paragraphs [0126] through [0127] of Universal Display Corporation's US application publication number US2020/0,295,281A1, and the contents of these paragraphs and the whole publication are herein incorporated by reference in their entireties.

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

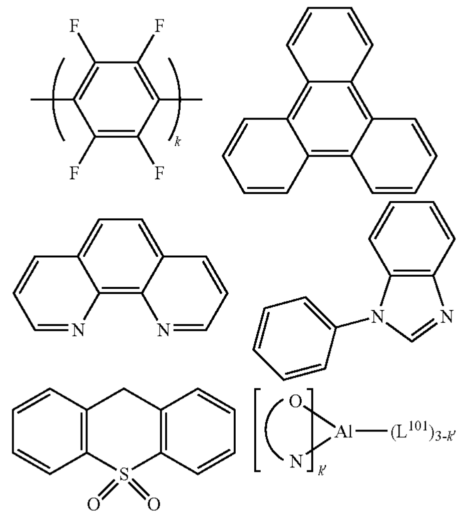

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

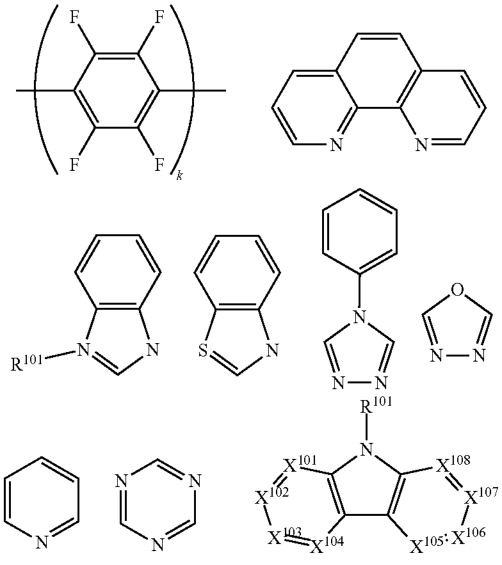

-continued

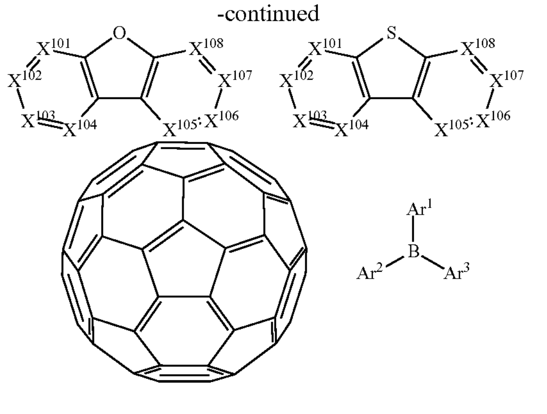

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

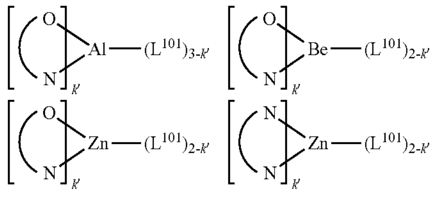

wherein (O—N) or (N—N) is a bidentate ligand, having metal coordinated to atoms O, N or N, N; $L^{101}$ is another ligand; k' is an integer value from 1 to the maximum number of ligands that may be attached to the metal. Non-limiting examples of the ETL materials that may be used in an OLED in combination with materials disclosed herein are exemplified in paragraphs [0131] through [0134] of Universal Display Corporation's US application publication number US2020/0,295,281A1, and the contents of these paragraphs and the whole publication are herein incorporated by reference in their entireties.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

E. Experimental Section

Synthesis

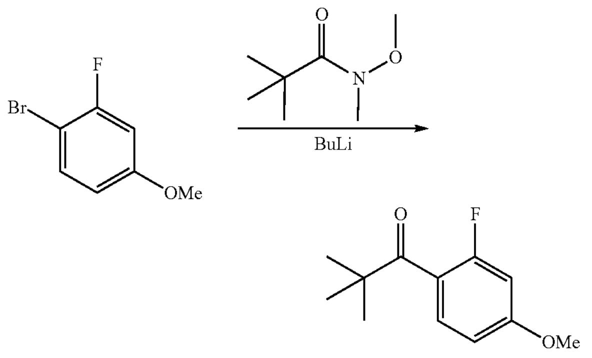

N-butyllithium (2.5 M in hexanes; 55 mL, 138 mmol) was added dropwise to a solution of 1-bromo-2-fluoro-4-methoxybenzene (16 mL, 125 mmol) in THF (200 mL) at −70° C. over 13 minutes (internal temperature was maintained below −60° C.). The mixture was stirred at −70° C. for 30 minutes. N-methoxy-N-methylpivalamide (23 g, 158 mmol) was added over 6 minutes (internal temperature rose to −64° C.) and the mixture was stirred at −70° C. for 2 hours, then allowed to warm to room temperature (RT) overnight. The reaction mixture was diluted with TBME (400 mL), washed with saturated $NH_4Cl_{(aq)}$ (200 mL) and saturated brine (200 mL), dried over $MgSO_4$, filtered and concentrated. Purification by column chromatography (silica gel, 330 g RediSep Gold cart, isohexane load, 0-15% EtOAc/heptane) gave 1-(2-fluoro-4-methoxyphenyl)-2,2-dimethylpropan-1-one (18.7 g, 84.4 mmol, 68% yield) as a pale yellow liquid.

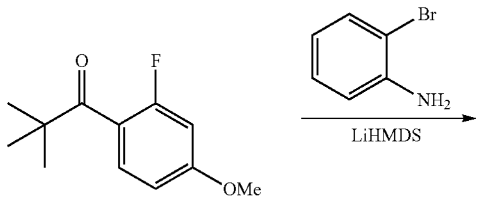

-continued

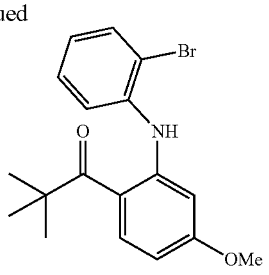

A solution of 2-bromoaniline (15.0 g, 87 mmol) in THF (50 mL) was cooled to 5° C. (internal). LiHMDS (1 M in THF; 180 mL, 180 mmol) was added over about 15 minutes (internal temperature maintained <15° C.), followed by 1-(2-fluoro-4-methoxyphenyl)-2,2-dimethylpropan-1-one (18.5 g, 88 mmol). The mixture was stirred at RT for 16 hours. The mixture was diluted with TBME (250 mL), washed with sat. $NH_4Cl_{(aq)}$ (250 mL) and saturated brine (250 mL), dried over $MgSO_4$, filtered and concentrated. Purification by column chromatography (silica gel, 330 g, 0-15% EtOAc/isohexane) gave 1-(2-((2-bromophenyl)amino)-4-methoxyphenyl)-2,2-dimethylpropan-1-one (25.8 g, 67.7 mmol, 78% yield) as a yellow syrup.

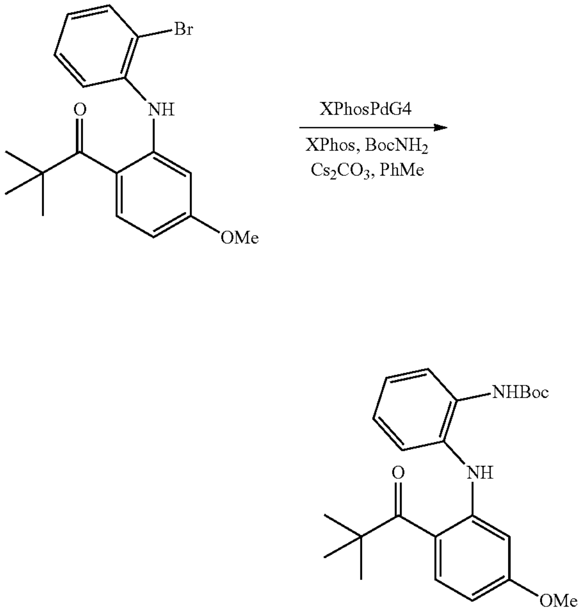

Toluene (60 mL) and a solution of 1-(2-((2-bromophenyl)amino)-4-methoxyphenyl)-2,2-dimethylpropan-1-one (12.3 g, 34.0 mmol) in toluene (60 mL) was added to a nitrogen-purged flask containing XPhos-Pd-G4 (1.5 g, 1.743 mmol), XPhos (0.80 g, 1.678 mmol), tert-butyl carbamate (5.0 g, 42.7 mmol) and cesium carbonate (25 g, 77 mmol). The mixture was stirred at 80° C. (internal) for 16 hours. The mixture was cooled to RT, diluted with EtOAc (200 mL), washed with 1:1 water/saturated brine (200 mL) and saturated brine (100 mL), dried over $MgSO_4$, filtered and concentrated. Purification by column chromatography (silica gel, 0-100% DCM/isohexane) gave tert-butyl (2-((5-methoxy-2-pivaloylphenyl)amino)phenyl)carbamate (10.1 g, 24.6 mmol, 72% yield) as a yellow solid.

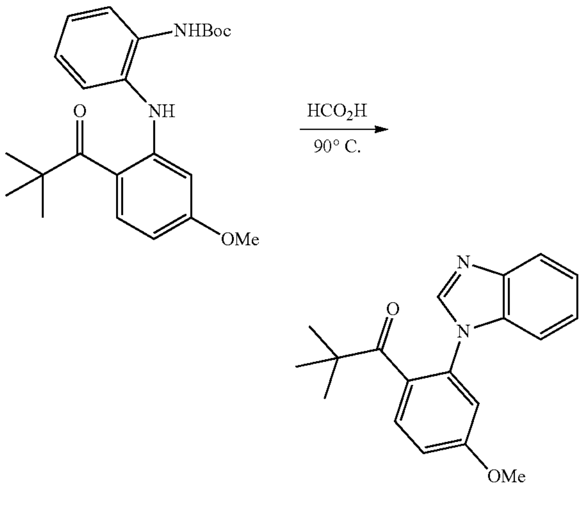

A mixture of tert-butyl (2-((5-methoxy-2-pivaloylphenyl)amino)phenyl)carbamate (13.3 g, 33.4 mmol) and formic acid (90 mL) was heated to reflux until the solid dissolved. Water (30 mL) was added and stirring was continued at reflux for 16 hours. The mixture was concentrated, dissolved in EtOAc (250 mL), washed with saturated $NaHCO_{3(aq)}$ (250 mL) and saturated brine (120 mL), dried over $MgSO_4$, filtered and concentrated. Purification by column chromatography (silica gel, 330 g cart. DCM load, 0-100% EtOAc/isohexane) gave 1-(2-(1H-benzo[d]imidazol-1-yl)-4-methoxyphenyl)-2,2-dimethylpropan-1-one (7.6 g, 23.7 mmol, 71% yield) as a yellow gummy substance.

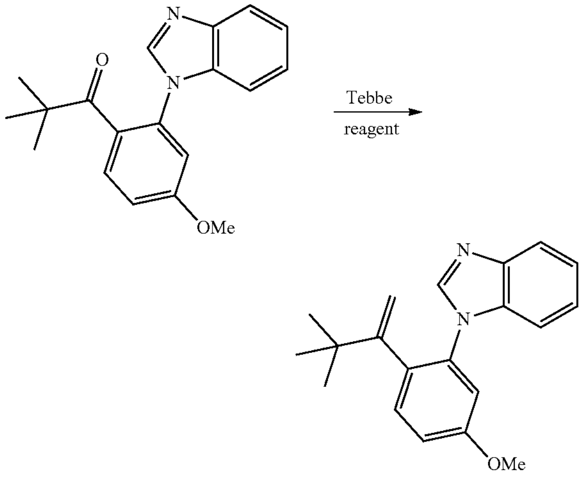

A mixture of Tebbe reagent (0.5 M in toluene) (35 mL, 17.50 mmol) and THF (20 mL) was cooled to 15° C. The cooling bath was removed, and a solution of 1-(2-(1H-benzo[d]imidazol-1-yl)-4-methoxyphenyl)-2,2-dimethylpropan-1-one (3.5 g, 11.35 mmol) in THF (50 mL) was added via syringe pump over 3 hours. The mixture was stirred at RT for 48 hours. The mixture was added in portions over about 15 mm to a cold, stirring mixture of TBME (100 mL), 2M $NaOH_{(aq)}$ (20 mL) and 1M potassium sodium $tartrate_{(aq)}$ (100 mL) [Caution: gas evolution, temp was maintained below 15° C. during addition]. The mixture was warmed to RT and stirred for 1 hour. The phases were separated, then the organic layer was washed with saturated brine (100 mL), dried over $MgSO_4$, filtered and concentrated. Purification by column chromatography (silica gel, DCM load, 0-50% [5% MeOH/EtOAc]/heptane) gave 1-(2-(3,3-dimethylbut-1-en-2-yl)-5-methoxyphenyl)-1H-benzo[d]imidazole (1.92 g, 5.64 mmol, 50% yield) as a yellow gummy substance.

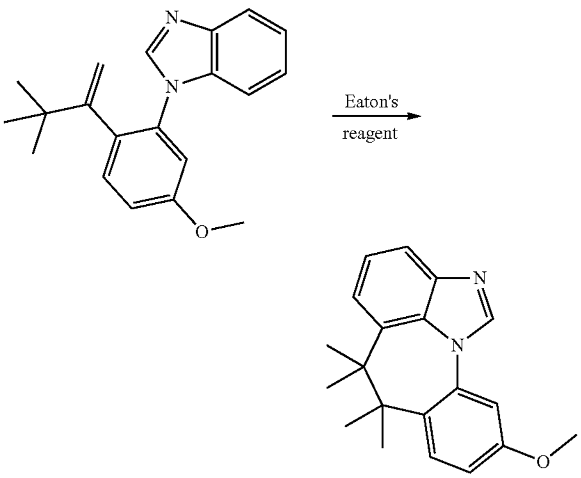

1-(2-(3,3-Dimethylbut-1-en-2-yl)-5-methoxyphenyl)-1H-benzo[d]imidazole (ca 90% purity; 2.75 g, 8.08 mmol) was stirred in Eaton's reagent (7.7 wt % $P_2O_5$ in MsOH) (25 mL, 20.33 mmol) at 90° C. for 3 hours. The reaction mixture was cooled to RT and added slowly to an ice-cold stirring mixture of TBME (250 mL) and 2M $NaOH_{(aq)}$ (250 mL) such that the temperature was maintained <20° C. The layers were separated, and the organic layer was washed with saturated brine (2×100 mL), dried over $MgSO_4$, filtered and concentrated. Purification by flash column chromatography (silica gel, 0-100% EtOAc/isohexane) gave 10-methoxy-6,6,7,7-tetramethyl-6,7-dihydro-2,11b-diazadibenzo[cd,h]azulene (0.37 g, 1.087 mmol, 13% yield) as a tan solid.

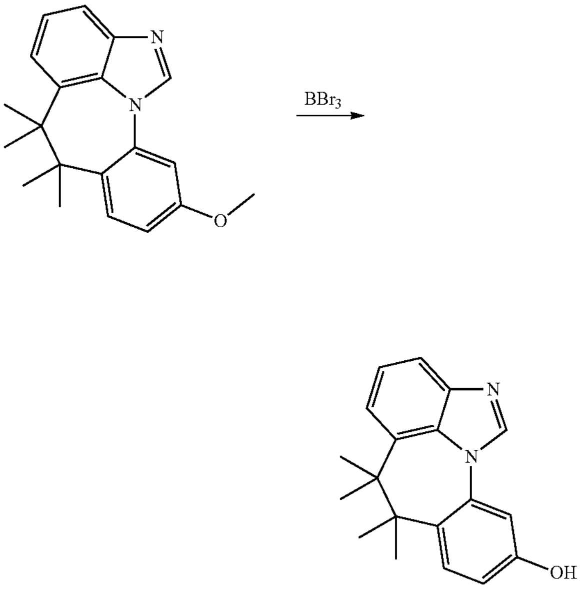

To a solution of 10-methoxy-6,6,7,7-tetramethyl-6,7-dihydro-2,11b-diazadibenzo[cd,h]azulene (0.36 g, 1.17 mmol) in DCM (4.0 mL) at 0° C. was added boron tribromide (1 M in DCM; 2.0 mL, 2.00 mmol). The mixture was stirred at RT for 3 hours. The reaction mixture was cooled to 0° C., quenched by dropwise addition of conc. $NH_{3(aq)}$ (1 mL), diluted with water (5 mL) and stirred at RT for 16 hours. The solid was collected by filtration, rinsed with water (3×1 mL) and MeCN (2×1 mL), then dried in vacuo to give 6,6,7,7-tetramethyl-6,7-dihydro-2,11b-diazadibenzo[cd,h]azulen-10-ol (0.20 g, 0.670 mmol, 57% yield) as a white solid. A second batch of the same material (0.12 g) was made in a similar fashion, and the two batches were combined and sonicated in TBME (3 mL) for 30 seconds. The solid was collected by filtration and dried in vacuo to give 6,6,7,7-tetramethyl-6,7-dihydro-2,11b-diazadibenzo[cd,h]azulen-10-ol (0.30 g, 1.00 mmol, 92% yield) as a white solid. $^1H$ NMR (400 MHz, DMSO $d_6$) d 9.71 (s, 1H), 8.78 (s, 1H), 7.61 (dd, 1H), 7.44 (d, 1H), 7.40 (d, 1H), 7.24 (t, 1H), 7.10 (d, 1H), 6.75 (d, 1H), 1.50 (s, 3H), 1.49 (s, 3H), 0.71 (s, 3H), 0.64 (s, 3H).

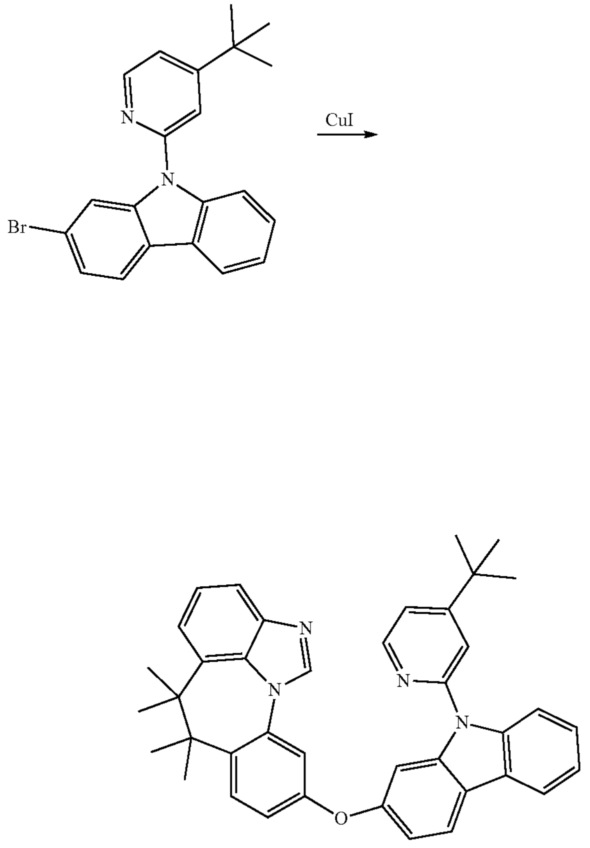

Phenol (0.29 grams, 1.0 mmol), bromocarbazole pyridine (0.414 grams, 1.10 mmol), copper (I) iodide (38.0 mg, 0.198 mmol), picolinic acid (49.0 mg, 0.397 mmol) and potassium phosphate (0.421 grams, 1.98 mmol) were added to a 25 mL Schlenk tube. DMSO (5 mL) was added and the reaction was stirred in an oil bath at 115° C. for 18 hours. The crude mix was then diluted with ethyl acetate and water. The organic layer was washed with water, dried and concentrated in vacuo. The product was purified on a silica gel column eluted with 5-10% ethyl acetate in dichloromethane to give 0.42 grams, (72% yield) of desired product.

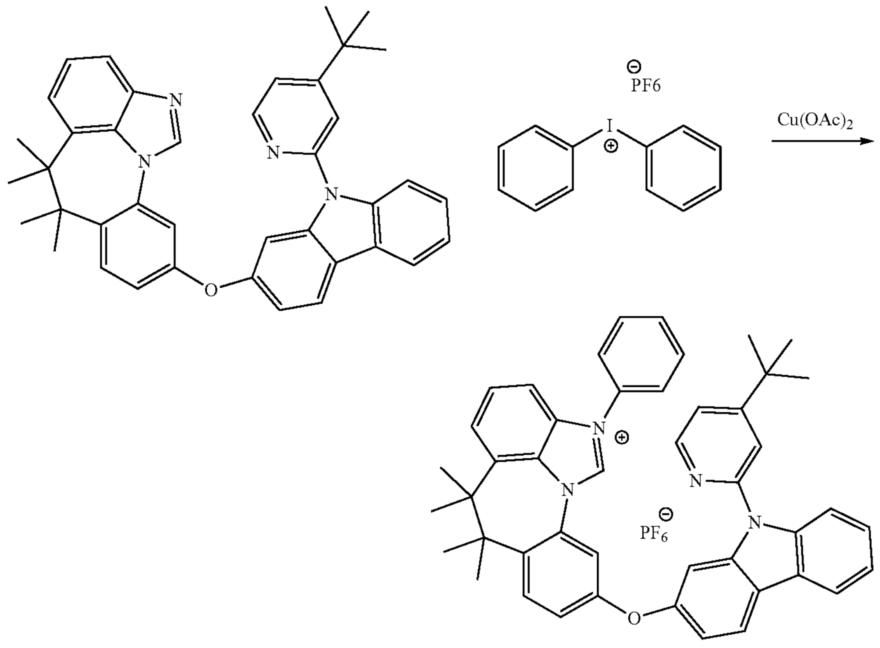

Starting ether (0.42 grams, 0.71 mmol), diphenyliodonium salt (0.363 grams, 0.853 mmol) and copper (II) acetate (7.10 mg, 0.036 mmol) were added to a 25 mL Schlenk tube. Dimethylformamide (3 mL) was added and the reaction was stirred at 120° C. for 20 hours. The crude mix was diluted with dichloromethane and successively washed with water. Column chromatography (silica gel) eluting with 20% ethyl acetate in DCM gave 0.38 grams (66% yield) of desire product as a white solid.

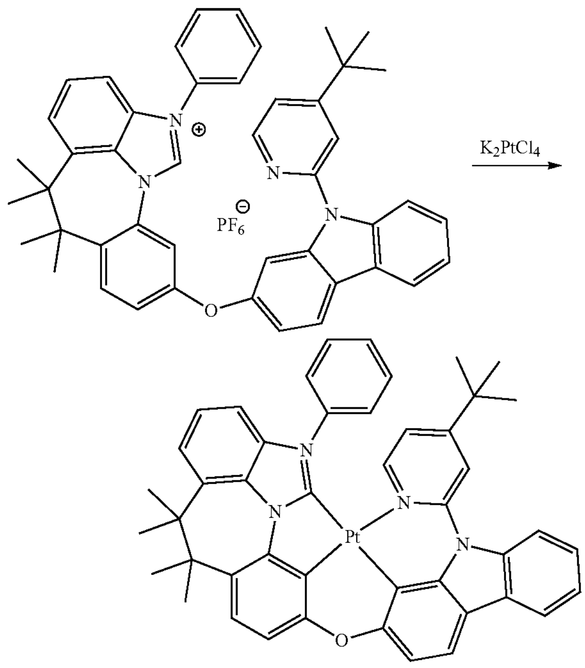

Imidazolium salt (0.38 grams, 0.47 mmol) and Potassium tetrachloroplatinate(II) (194 mg, 0.47 mmol) were placed into a 25 mL Schlenk tube. Acetic acid (5 mL) was added and the reaction was stirred in an oil bath hat 125° C. for 20 hours. Evaporation of solvent in vacuo gave a residue which was chromatographed on silica gel eluted with dichloromethane to give the desired complex. MALDI positive mode 860.27 negative mode 858.21. LCMS 860.

Photophysical Characterization

Compound 1

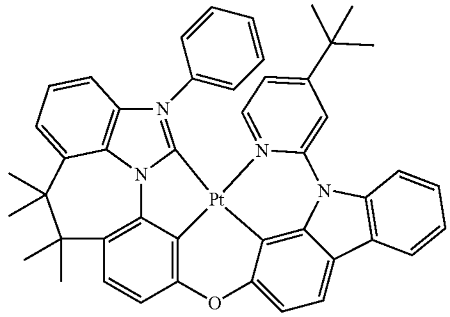

Comparison Compound 2

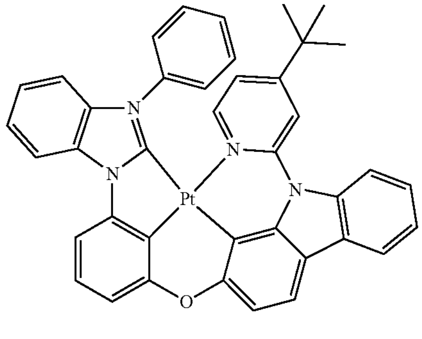

Emission spectra were collected on a Horiba Fluorolog-3 spectrofluorometer equipped with a Synapse Plus CCD detector. All samples were excited at 340 nm. Transient data was measured by time correlated single photon counting (TCSPC) in the Fluorolog-3 using a 335 nm NanoLED pulsed excitation source. PLQY values were measured using a Hamamatsu Quantaurus-QY Plus UV-NIR absolute PL quantum yield spectrometer with an excitation wavelength of 340 inn. Solutions of 1% emitter with PMMA in toluene were prepared, filtered, and dropcast onto Quartz substrates.

Solution cyclic voltammetry and differential pulsed voltammetry were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroconium redox couple (Fc/Fc+) by measuring the peak potential differences from differential pulsed voltammetry. The corresponding highest occupied molecular orbital (HOMO) and lowest unoccupied molecular orbital (LUMO) energies were determined by referencing the cationic and anionic redox potentials to ferrocene (4.8 eV vs. vacuum) according to literature ((a) Fink, R.; Heischkel, Y.; Thelakkat, M.; Schmidt, H.-W. *Chem. Mater.* 1998, 10, 3620-3625. (b) Pommerehne, J.; Vestweber, H.; Guss, W.; Mahrt, R. F.; Bassler, H.; Porsch, M.; Daub, *J. Adv. Mater.* 1995, 7, 551.

The $T_1$ energy was obtained from the emission spectrum of frozen sample in 2-MeTHF at 77 K.

TABLE 1

Photoluminescent properties of compound 1 and comparison compound 2.

| | PLQY (%) PMMA | τ (μs) PMMA | $k_r$ ($s^{-1}$) | $k_{nr}$ ($s^{-1}$) | $\lambda_{max}$ (nm) PMMA | $\lambda_{max}$ (nm) 77K |
|---|---|---|---|---|---|---|
| Compound 1 | 64 | 3.4 | $1.9 \times 10^5$ | $1.1 \times 10^5$ | 458 | 449 |
| Comparison Compound 2 | 56 | 2.9 | $1.9 \times 10^5$ | $1.5 \times 10^5$ | 452 | 444 |

Compound 1 exhibited blue phosphorescence with a PLQY=64% in PMMA ($\lambda_{max}$=458 nm) and an excited state lifetime, τ=3.4 μs. In contrast with Comparison Compound 2, the tetramethylethyl side strap in Compound 1 appears to improve PLQY (from 56% to 64%) by mitigating non-radiative deactivation: $k_{nr}$ in Compound 1 is reduced to $1.1 \times 10^5$ $s^{-1}$ from $1.5 \times 10^5$ $s^{-1}$ in Comparison Compound 2.

What is claimed is:

1. A compound comprising a ligand $L_A$ of a structure of

Formula I

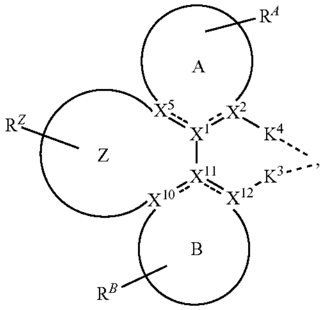

wherein:

moieties A and B can be each independently a monocyclic or polycyclic fused ring structure comprising 5-membered and/or 6-membered carbocyclic or heterocyclic rings;

ring Z is a 7-, 8-, 9-, or 10-membered ring;

$X^1$, $X^2$, $X^5$, $X^{10}$, $X^{11}$, and $X^{12}$ are each independently C or N, with at least one of $X^1$ or $X^{11}$ being C;

$\equiv$ is either a single bond or a double bond;

$K^3$ and $K^4$ are each independently selected from the group consisting of a direct bond, O, and S;

$R^A$, $R^B$, and $R^Z$ each independently represent zero, mono, or up to a maximum allowed number of substitutions to its associated ring;

each of $R^A$, $R^B$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two adjacent $R^A$, $R^B$, or $R^Z$ can be joined or fused to form a ring, wherein the ligand $L_A$ is coordinated to a metal M through the two indicated dashed lines;

wherein M is selected from the group consisting of Ru, Os, Ir, Pd, Pt, Cu, Ag, and Au, and can be coordinated to other ligands;

wherein the ligand $L_A$ can be joined with other ligands to form a tridentate, tetradentate, pentadentate, or hexadentate ligand; and at least one of the following is true:

(1) one $R^Z$ is joined or fused with an $R^A$ to form a ring, (2)

one $R^Z$ is joined or fused with an $R^B$ to form a ring; or (3) $L_A$ is joined with another ligand to form a tetradentate ligand.

2. The compound of claim 1, wherein at least one of $R^A$, $R^B$, and $R^Z$ is a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof.

3. The compound of claim 1, wherein moiety A and moiety B are each a 6-membered aromatic ring, or moiety A is a 5-membered aromatic ring, and moiety B is a 6-membered aromatic ring.

4. The compound of claim 1, wherein the compound comprises a ligand $L_A$ of

Formula IA

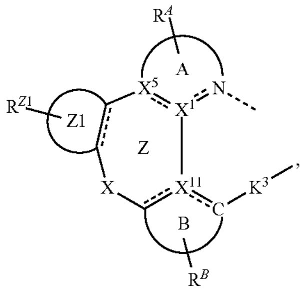

or

-continued

Formula IB

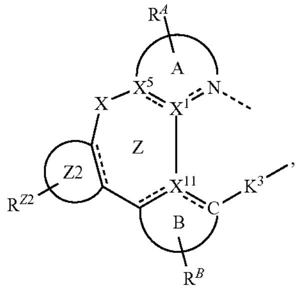

wherein:

rings Z1 and Z2 are each independently 5-membered or 6-membered carbocyclic or heterocyclic rings;

X is selected from the group consisting of CRR', SiRR', C═CRR', NR, CRR'—CRR', C—NR, CR—CR, CR-NR, CRR'—O and BRR';

$R^{Z1}$ and $R^{Z2}$ each independently represents zero, mono, or up to the maximum allowed number of substitutions to its associated ring; and each of R, R', $R^{Z1}$ and $R^{Z2}$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

any two adjacent R, R', $R^A$, $R^B$, $R^{Z1}$, and $R^{Z2}$ can be joined or fused to form a ring, when the ligand $L_A$ is of Formula IA, if X is CRR', SiRR', NR, or C-CRR', then R or R' forms a ring with $R^B$ or $R^{Z1}$, and R and R' do not form a ring with each other;

when the ligand $L_A$ is of Formula IB, if X is CRR', SiRR', NR, or C-CRR', then R or R' does not form a ring with $R^A$, and R and R' do not form ring with each other.

5. The compound of claim 1, wherein the compound comprises a ligand $L_A$ of a structure of Formula IC

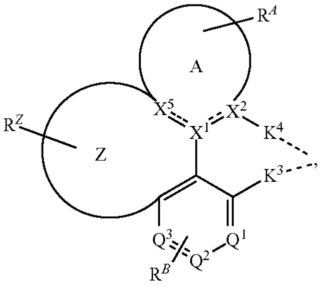

or

-continued

Formula ID

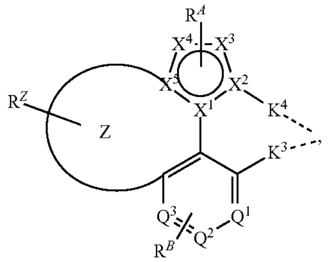

wherein:

$X^3$ and $X^4$ are each independently C or N, with at least two of $X^1$-$X^5$ being C for Formula ID;

$Q^1$-$Q^3$ are each independently C or N, with at least one of $Q^1$-$Q^3$ being C;

$K^3$ and $K^4$ are each independently selected from the group consisting of a direct bond, O, and S, with $K^4$ being a direct bond when $X^2$ is N;

the remaining variables are the same as defined with respect to Formula I of claim 1; and wherein for Formula ID, if $X^2$ and $X^5$ are both N, two neighboring $R^Z$ do not form a benzene ring fused to ring Z if ring Z is a 7-membered ring.

6. The compound of claim 1, wherein the compound has a structure of

Formula II

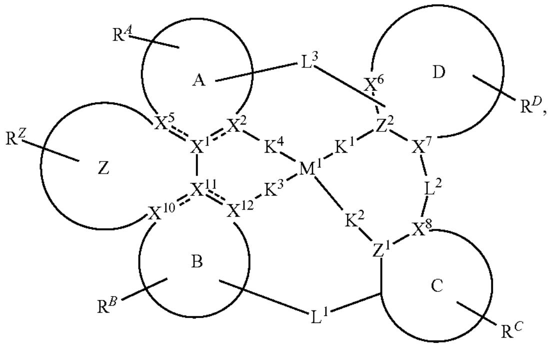

wherein:

$M^1$ is Pd or Pt;

moieties C and D are each independently a monocyclic or polycyclic ring structure comprising 5-membered and/or 6-membered carbocyclic or heterocyclic rings;

Z1 and Z2 are each independently C or N;

$K^1$, $K^2$, $K^3$, and $K^4$ are each independently selected from the group consisting of a direct bond, O, and S, wherein at least two of them are direct bonds;

$L^1$, $L^2$, and $L^3$ are each independently selected from the group consisting of a single bond, absent a bond, O, S, C-O, C=CR"R", CR"R", SiR "R'", BR", and NR", wherein at least one of $L^1$ and $L^2$ is present;

$X^6$-$X^8$ are each independently C or N;

$R^C$ and $R^D$ each independently represent zero, mono, or up to the maximum allowed number of substitutions to its associated ring;

each of R", R'", $R^C$, and $R^D$ is independently a hydrogen or a substituent selected from the group consisting of deuterium, fluorine, alkyl, cycloalkyl, heteroalkyl, alkoxy, aryloxy, amino, silyl, germyl, boryl, selenyl, alkenyl, cycloalkenyl, heteroalkenyl, aryl, heteroaryl, nitrile, isonitrile, sulfanyl, and combinations thereof;

any two adjacent R, R", $R^A$, $R^B$, $R^C$, $R^D$, or $R^Z$ can be joined or fused together to form a ring where chemically feasible; and the remaining variables are the same as previously defined.

7. The compound of claim 6, wherein moiety C and moiety D are both 6-membered aromatic rings, or moiety D is a 5-membered or 6-membered heteroaromatic ring.

8. The compound of claim 6, wherein L' is O, SiR"R'", or CR"R'".

9. The compound of claim 6, wherein $Z^2$ is N and $Z^1$ is C, or $Z^2$ is C and $Z^1$ is N.

10. The compound of claim 6, wherein $L^2$ is a direct bond, or NR".

11. The compound of claim 6, wherein the compound is selected from the group consisting of:

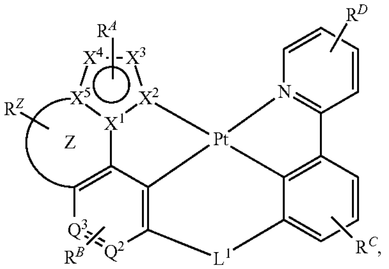

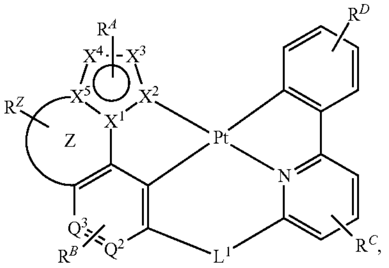

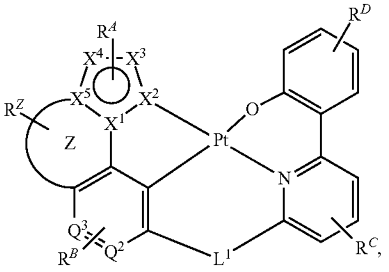

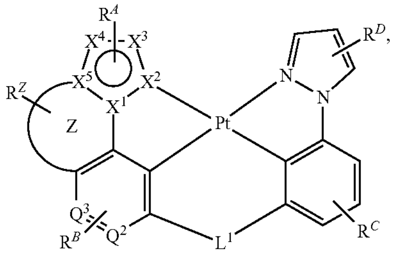

-continued

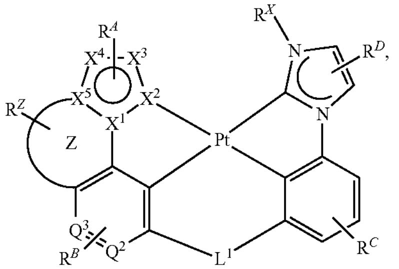

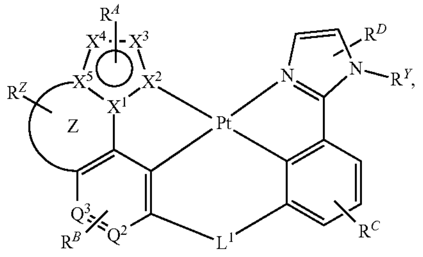

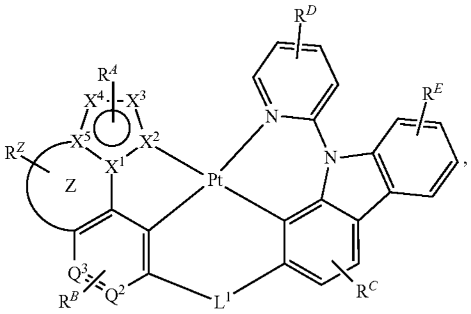

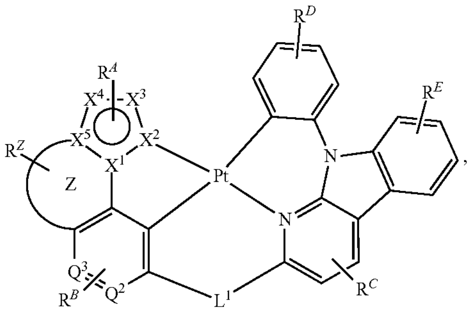

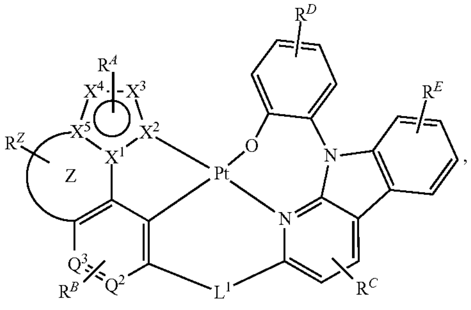

-continued
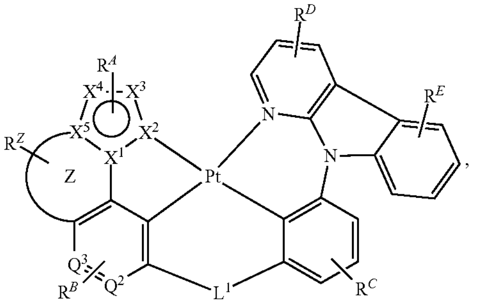
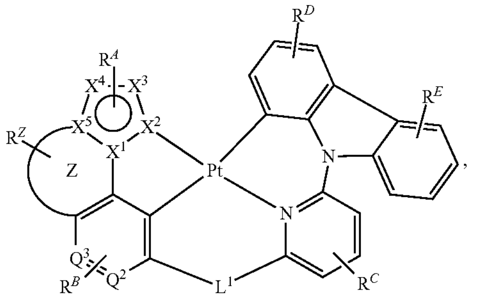
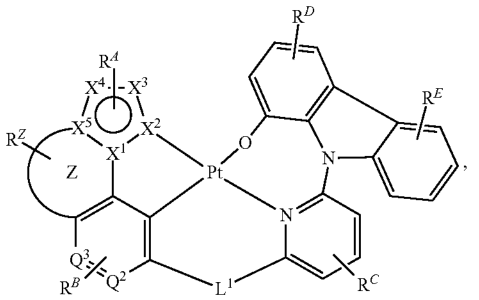
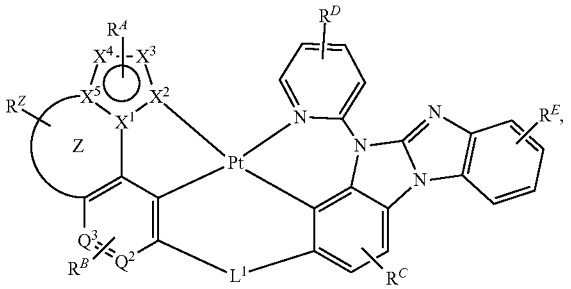
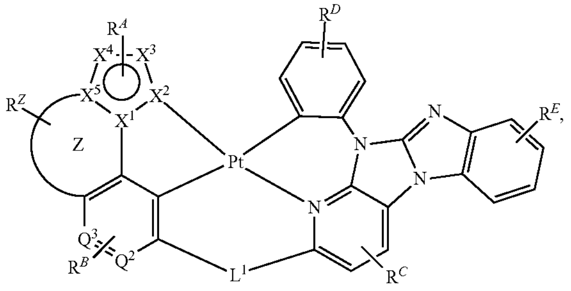
-continued
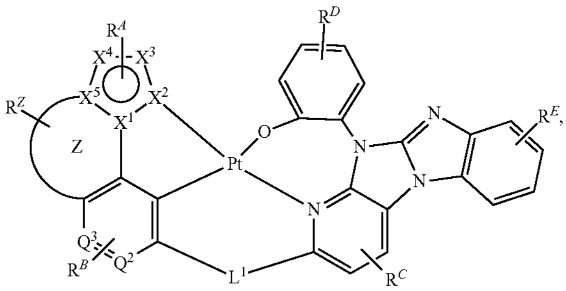
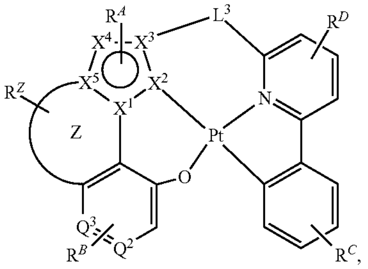
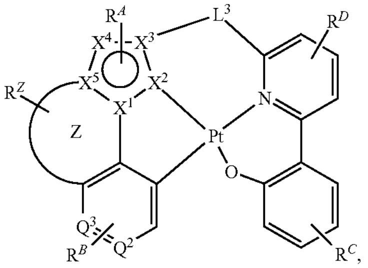
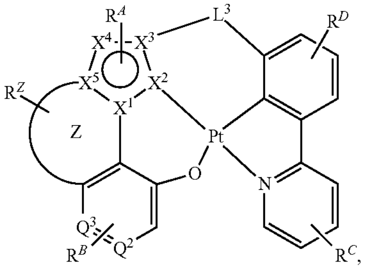
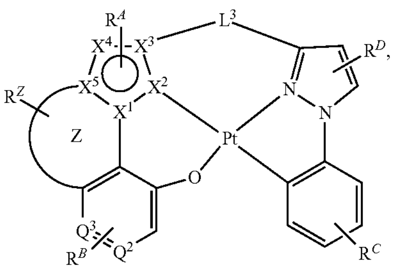
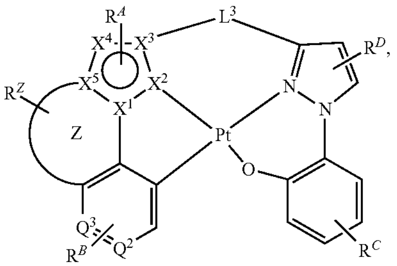

-continued
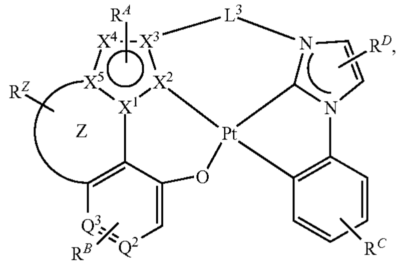
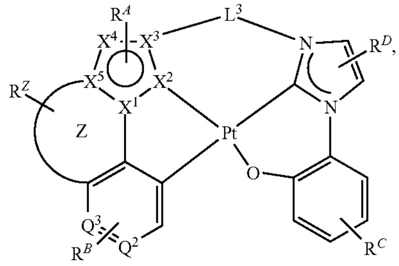
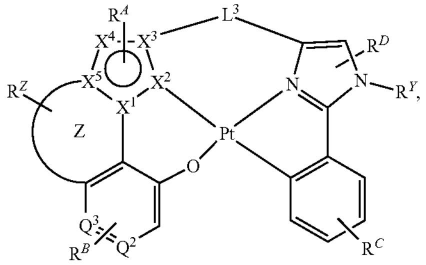
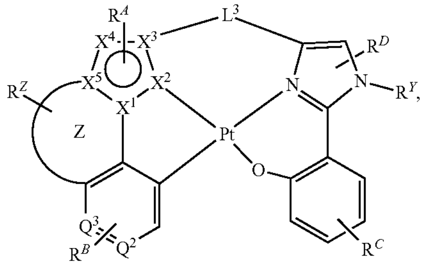
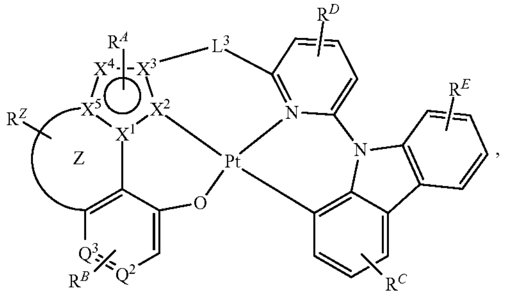
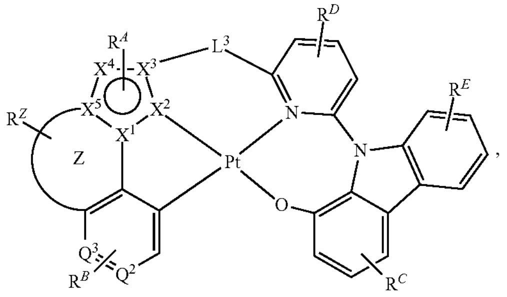
-continued
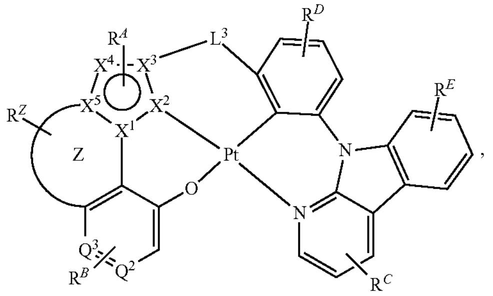
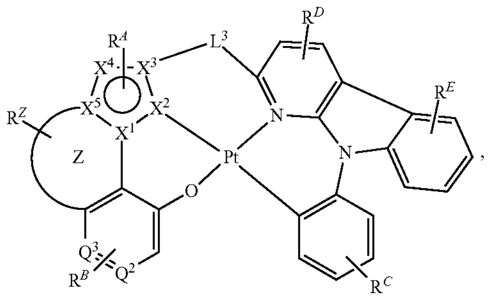
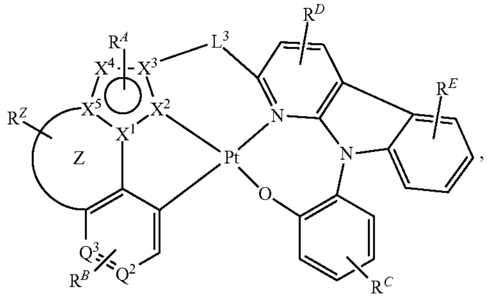
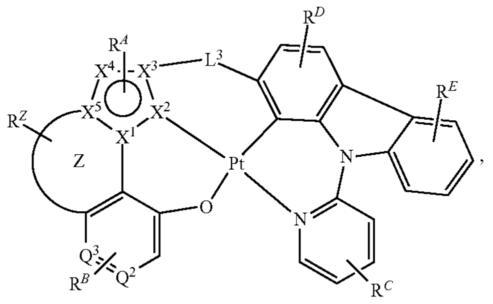
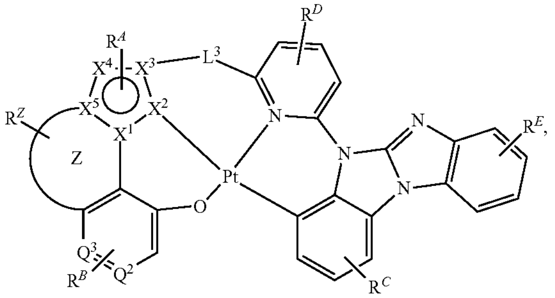

-continued
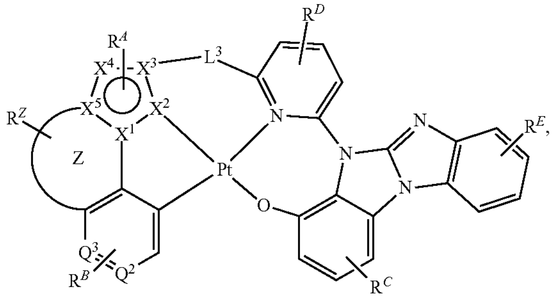
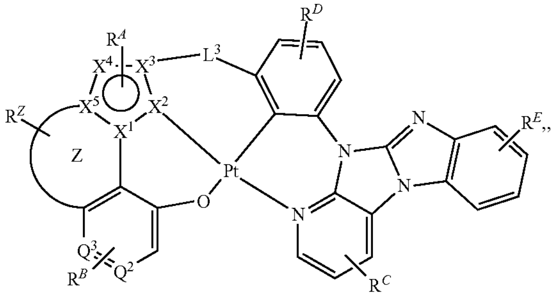
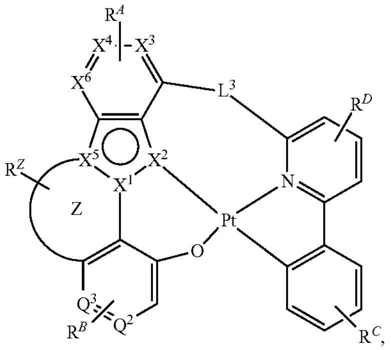
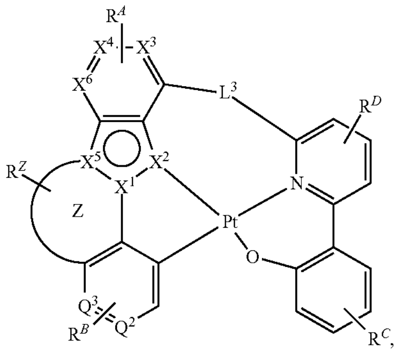
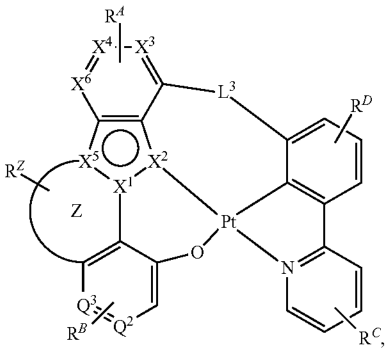
-continued
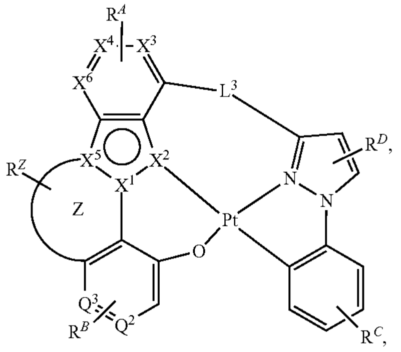
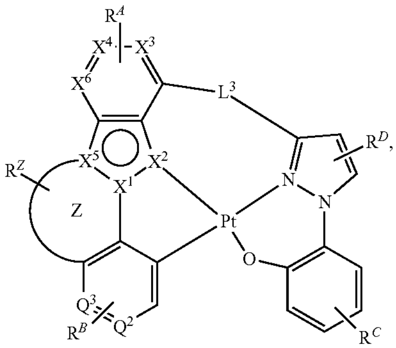
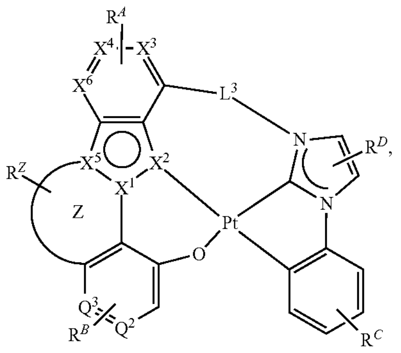
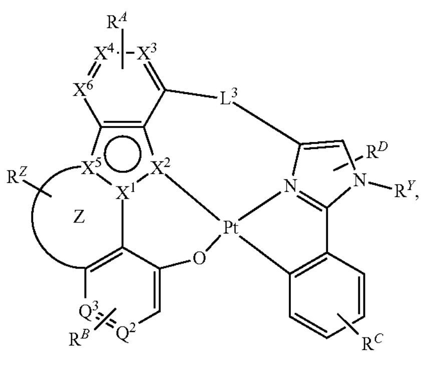

-continued
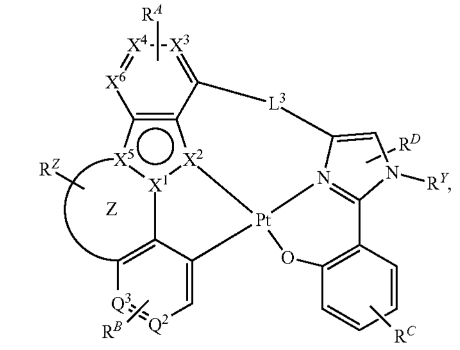
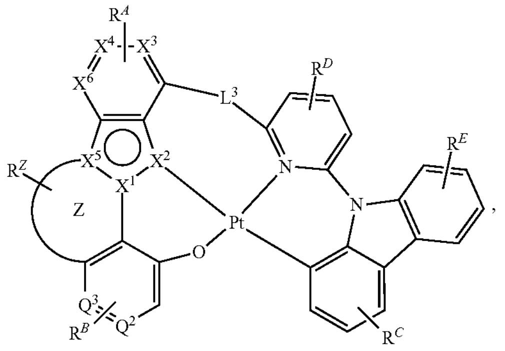
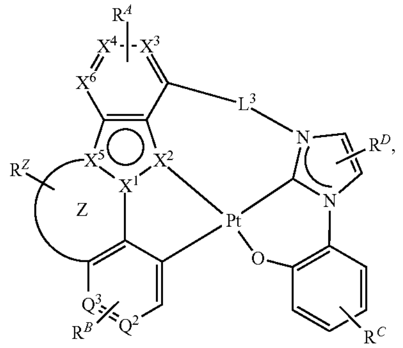
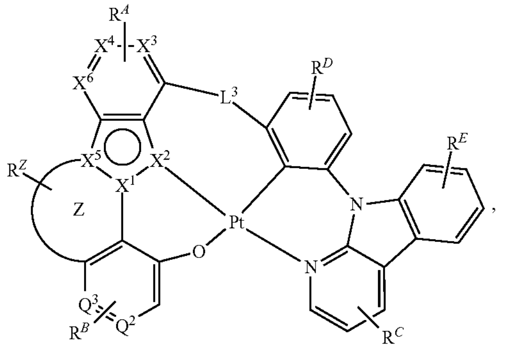
-continued
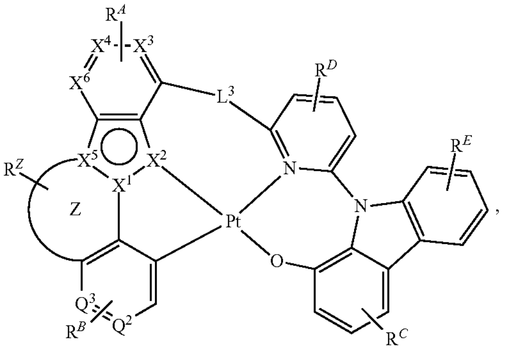
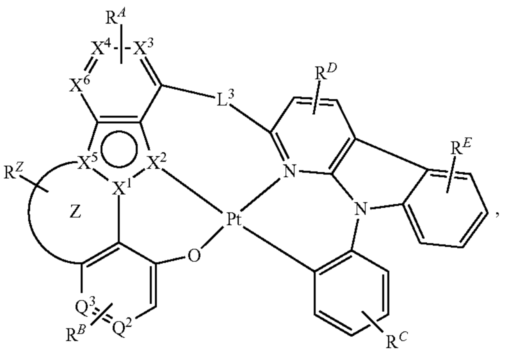
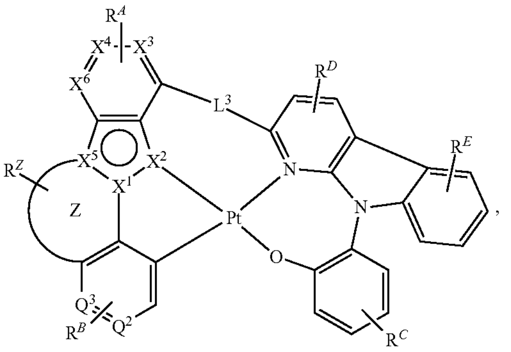
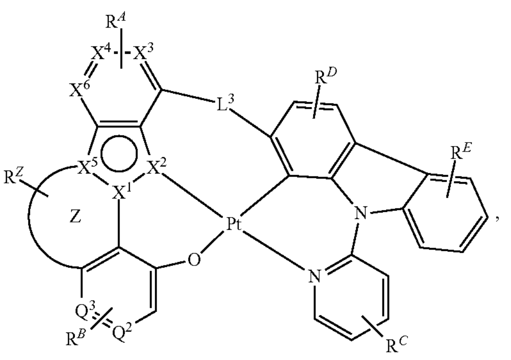

-continued
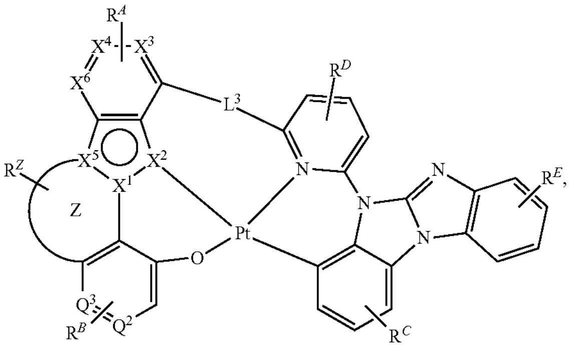
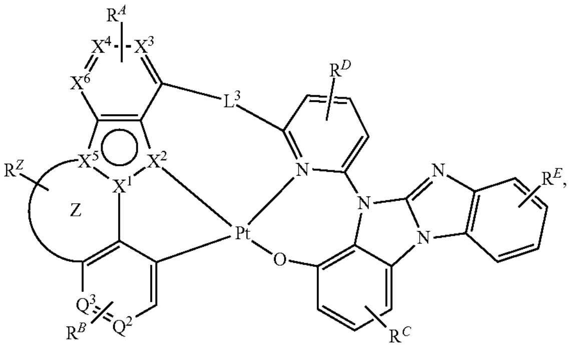
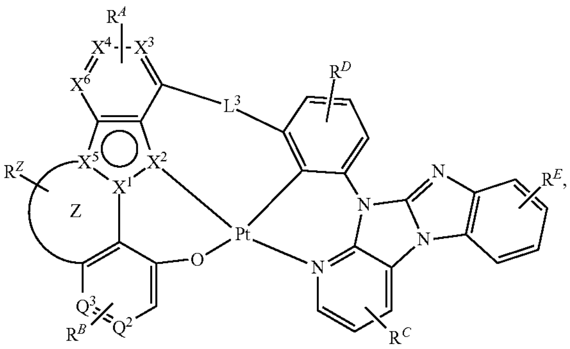
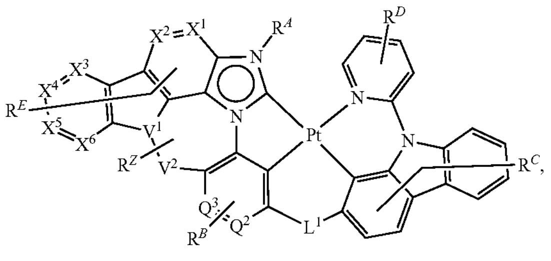
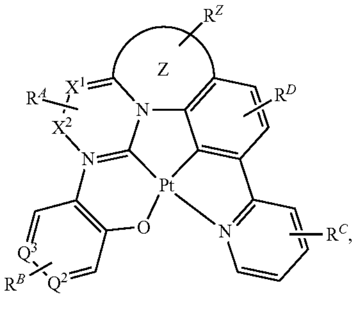
-continued
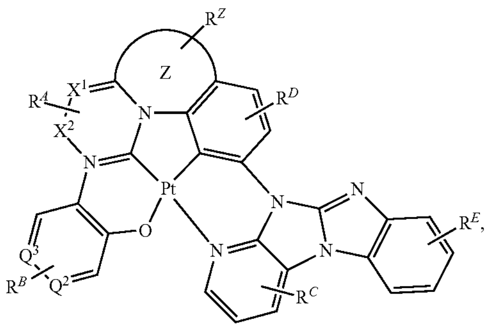
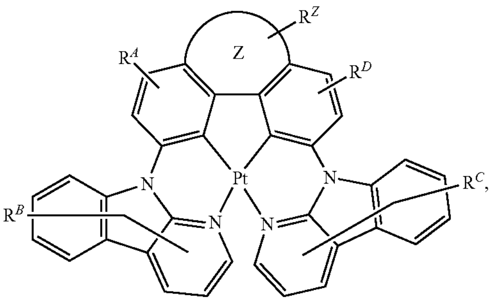
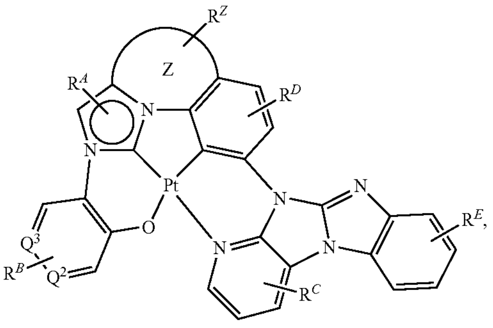
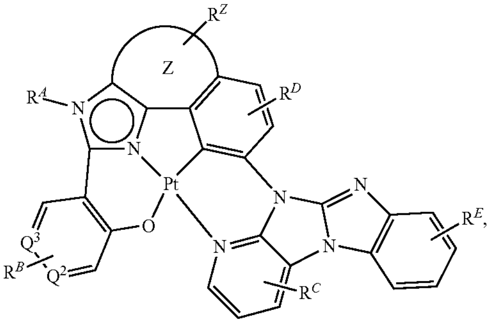
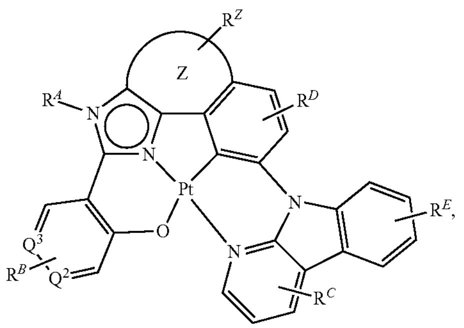

-continued

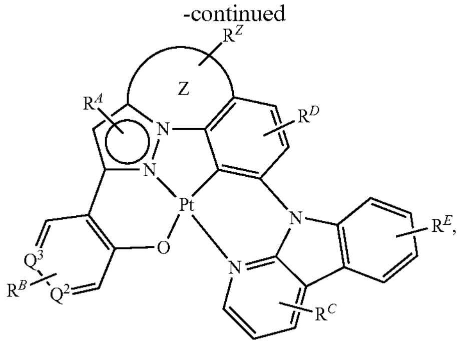

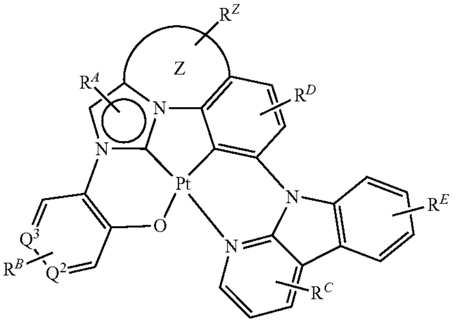

and

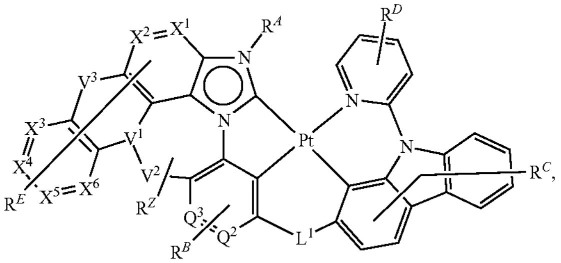, wherein:

$R^X$ and $R^Y$ are each selected from the group consisting of alkyl, cycloalkyl, heteroalkyl, heterocycloalkyl, aryl, heteroaryl, and combinations thereof;

$R^E$ for each occurrence is independently a hydrogen or a substituent selected from the group consisting of deuterium, fluorine, alkyl, cycloalkyl, heteroalkyl, alkoxy, aryloxy, amino, silyl, boryl, alkenyl, cycloalkenyl, heteroalkenyl, aryl, heteroaryl, nitrile, isonitrile, sulfanyl, and combinations thereof; and $X^1$-$X^5$, $Q^2$-$Q^3$, $R^A$, $R^B$, $R^C$, $R^D$, $R^Z$, $L^1$, and ring Z are all defined the same as for Formula I and/or Formula II.

12. The compound of claim 6, wherein the compound has a structure of

Formula II

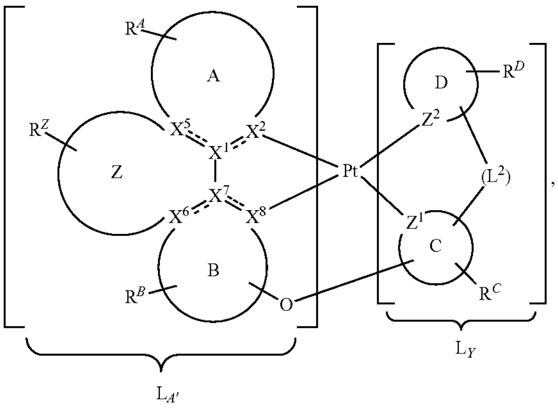, wherein $L_{A'}$ is selected from the group consisting of:

| Ligand $L_{A'}$ | Structure of $L_{A'}$ |
|---|---|
| $L_{A'}$1-(Rl)(Rm)(Rn)(Ro), wherein $L_{A'}$1-(R1)(R1)(R1)(R1) to $L_{A'}$1-(R307)(R307)(R307)(R307), having the structure | 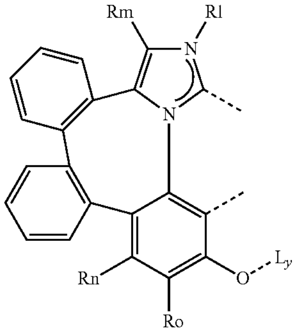 |
| $L_{A'}$2-(Rl)(Rm)(Rn)(Ro), wherein $L_{A'}$2-(R1)(R1)(R1)(R1) to $L_{A'}$2-(R307)(R307)(R307)(R307), having the structure | 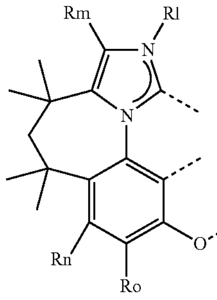 |
| $L_{A'}$3-(Rl)(Rm)(Rn)(Ro), wherein $L_{A'}$3-(R1)(R1)(R1)(R1) to $L_{A'}$3-(R307)(R307)(R307)(R307), having the structure | 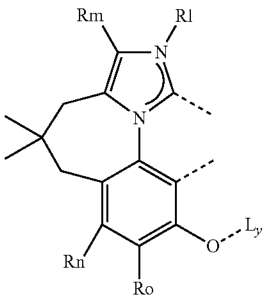 |

-continued

| Ligand $L_{A'}$ | Structure of $L_{A'}$ |
|---|---|
| $L_{A'}$4-(Rl)(Rm)(Rn)(Ro), wherein $L_{A'}$4-(R1)(R1)(R1)(R1) to $L_{A'}$4-(R307)(R307)(R307)(R307), having the structure | 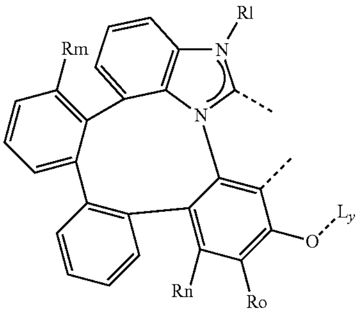 |
| $L_{A'}$5-(Rl)(Rm)(Rn)(Ro), wherein $L_{A'}$5-(R1)(R1)(R1)(R1) to $L_{A'}$5-(R307)(R307)(R307)(R307), having the structure | 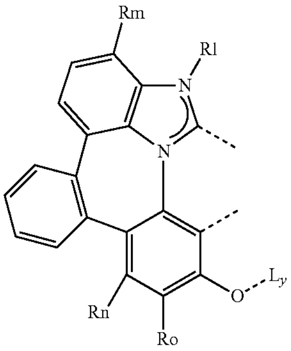 |
| $L_{A'}$6-(Rl)(Rm)(Rn)(Ro), wherein $L_{A'}$6-(R1)(R1)(R1)(R1) to $L_{A'}$6-(R307)(R307)(R307)(R307), having the structure | 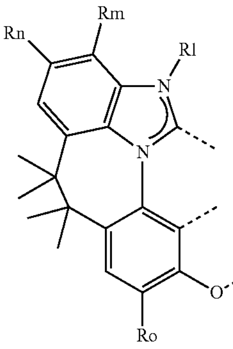 |
| $L_{A'}$7-(Rl)(Rm)(Rn)(Ro), wherein $L_{A'}$7-(R1)(R1)(R1)(R1) to $L_{A'}$7-(R307)(R307)(R307)(R307), having the structure | 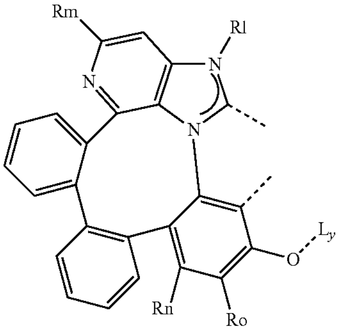 |
| $L_{A'}$8-(Rl)(Rm)(Rn)(Ro), wherein $L_{A'}$8-(R1)(R1)(R1)(R1) to $L_{A'}$8-(R307)(R307)(R307)(R307), having the structure | 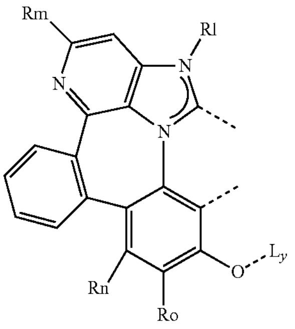 |
| $L_{A'}$9-(Rl)(Rm)(Rn)(Ro), wherein $L_{A'}$9-(R1)(R1)(R1)(R1) to $L_{A'}$9-(R307)(R307)(R307)(R307), having the structure | 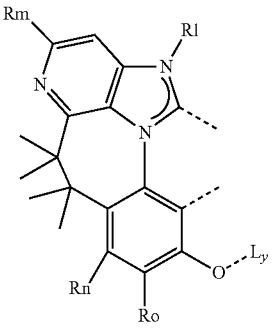 |
| $L_{A'}$10-(Rl)(Rm)(Rn)(Ro), wherein $L_{A'}$10-(R1)(R1)(R1)(R1) to $L_{A'}$10-(R307)(R307)(R307)(R307), having the structure | 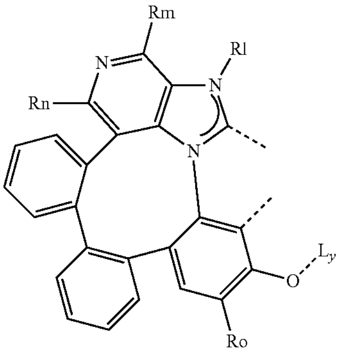 |
| $L_{A'}$11-(Rl)(Rm)(Rn)(Ro), wherein $L_{A'}$11-(R1)(R1)(R1)(R1) to $L_{A'}$11-(R307)(R307)(R307)(R307), having the structure | 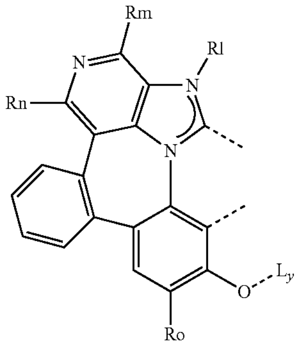 |

-continued

| Ligand $L_{A'}$ | Structure of $L_{A'}$ |
| --- | --- |
| $L_{A'}$12-(Rl)(Rm)(Rn)(Ro), wherein $L_{A'}$12-(R1)(R1)(R1)(R1) to $L_{A'}$12-(R307)(R307)(R307)(R307), having the structure | 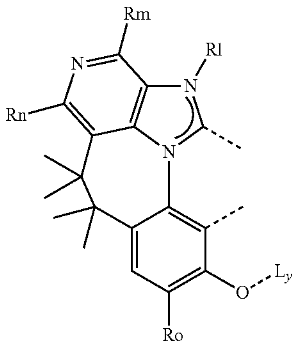 |
| $L_{A'}$13-(Rl)(Rm)(Rn)(Ro), wherein $L_{A'}$13-(R1)(R1)(R1)(R1) to $L_{A'}$13-(R307)(R307)(R307)(R307), having the structure | 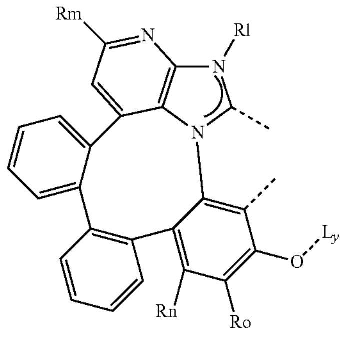 |
| $L_{A'}$14-(Rl)(Rm)(Rn)(Ro), wherein $L_{A'}$14-(R1)(R1)(R1)(R1) to $L_{A'}$14-(R307)(R307)(R307)(R307), having the structure | 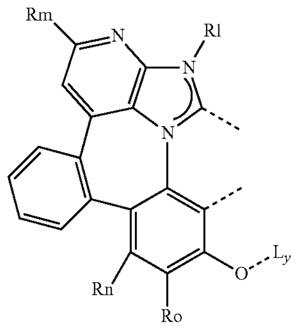 |
| $L_{A'}$15-(Rl)(Rm)(Rn)(Ro), wherein $L_{A'}$15-(R1)(R1)(R1)(R1) to $L_{A'}$15-(R307)(R307)(R307)(R307), having the structure | 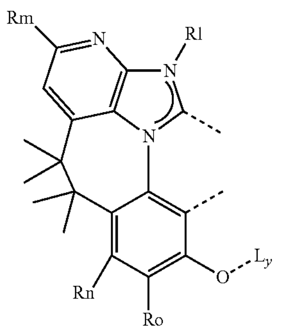 |

-continued

| Ligand $L_{A'}$ | Structure of $L_{A'}$ |
| --- | --- |
| $L_{A'}$16-(Rl)(Rm)(Rn)(Ro), wherein $L_{A'}$16-(R1)(R1)(R1)(R1) to $L_{A'}$16-(R307)(R307)(R307)(R307), having the structure | 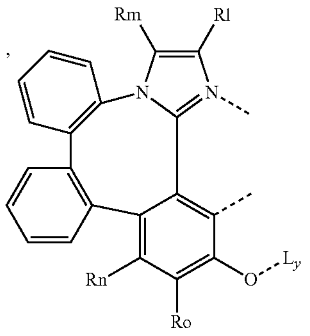 |
| $L_{A'}$17-(Rl)(Rm)(Rn)(Ro), wherein $L_{A'}$17-(R1)(R1)(R1)(R1) to $L_{A'}$17-(R307)(R307)(R307)(R307), having the structure | 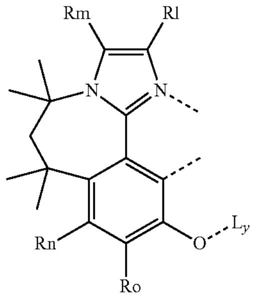 |
| $L_{A'}$18-(Rl)(Rm)(Rn)(Ro), wherein $L_{A'}$18-(R1)(R1)(R1)(R1) to $L_{A'}$18-(R307)(R307)(R307)(R307), having the structure | 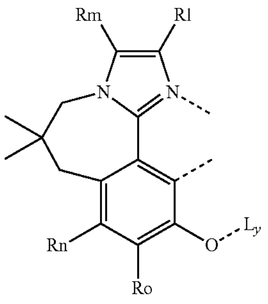 |
| $L_{A'}$19-(Rl)(Rm)(Rn)(Ro), wherein $L_{A'}$19-(R1)(R1)(R1)(R1) to $L_{A'}$19-(R307)(R307)(R307)(R307), having the structure | 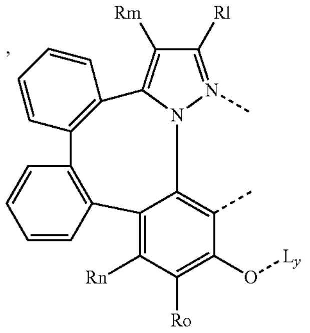 |
| $L_{A'}$20-(Rl)(Rm)(Rn)(Ro), wherein $L_{A'}$20-(R1)(R1)(R1)(R1) to $L_{A'}$20-(R307)(R307)(R307)(R307), having the structure | 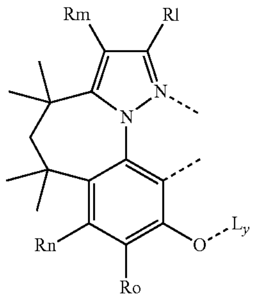 |

-continued

| Ligand $L_{A'}$ | Structure of $L_{A'}$ |
|---|---|
| $L_{A'}$21-(Rl)(Rm)(Rn)(Ro), wherein $L_{A'}$21-(R1)(R1)(R1)(R1) to $L_{A'}$21-(R307)(R307)(R307)(R307), having the structure | 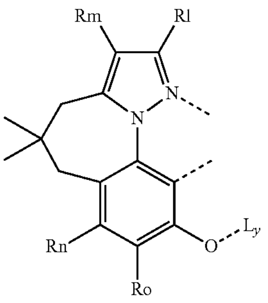 |
| $L_{A'}$22-(Rl)(Rm)(Rn)(Ro), wherein $L_{A'}$22-(R1)(R1)(R1)(R1) to $L_{A'}$22-(R307)(R307)(R307)(R307), having the structure | 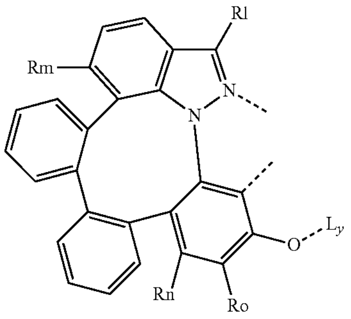 |
| $L_{A'}$23-(Rl)(Rm)(Rn)(Ro), wherein $L_{A'}$23-(R1)(R1)(R1)(R1) to $L_{A'}$23-(R307)(R307)(R307)(R307), having the structure | 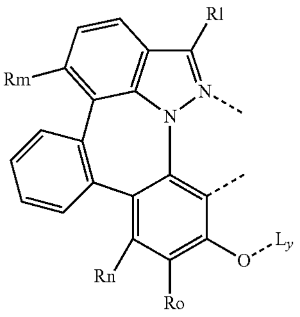 |
| $L_{A'}$24-(Rl)(Rm)(Rn)(Ro), wherein $L_{A'}$24-(R1)(R1)(R1)(R1) to $L_{A'}$24-(R307)(R307)(R307)(R307), having the structure | 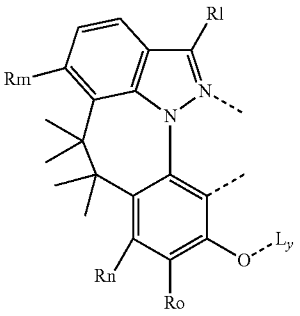 |
| $L_{A'}$25-(Rl)(Rm)(Rn)(Ro), wherein $L_{A'}$25-(R1)(R1)(R1)(R1) to $L_{A'}$25-(R307)(R307)(R307)(R307), having the structure | 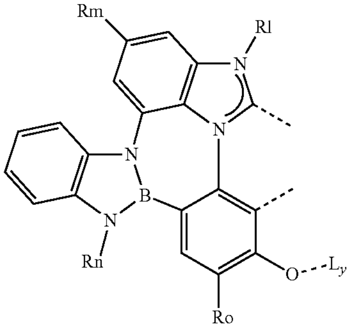 |

-continued

| Ligand $L_{A'}$ | Structure of $L_{A'}$ |
|---|---|
| $L_{A'}$26-(Rl)(Rm)(Rn)(Ro), wherein $L_{A'}$26-(R1)(R1)(R1)(R1) to $L_{A'}$26-(R307)(R307)(R307)(R307), having the structure | 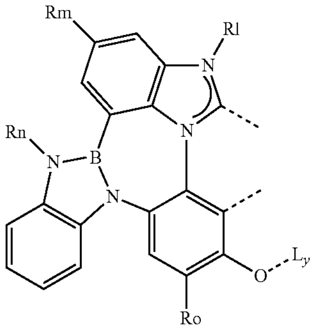 |
| $L_{A'}$27-(Rl)(Rm)(Rn)(Ro), wherein $L_{A'}$27-(R1)(R1)(R1)(R1) to $L_{A'}$27-(R307)(R307)(R307)(R307), having the structure | 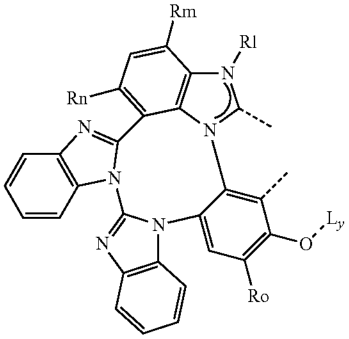 |
| $L_{A'}$28-(Rl)(Rm)(Rn)(Ro), wherein $L_{A'}$28-(R1)(R1)(R1)(R1) to $L_{A'}$28-(R307)(R307)(R307)(R307), having the structure | 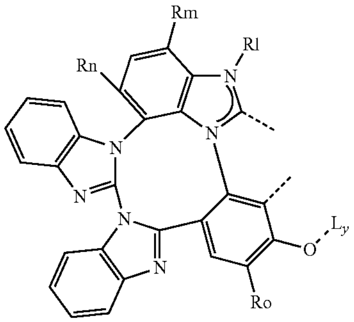 |
| $L_{A'}$29-(Rl)(Rm)(Rn)(Ro), wherein $L_{A'}$29-(R1)(R1)(R1)(R1) to $L_{A'}$29-(R307)(R307)(R307)(R307), having the structure | 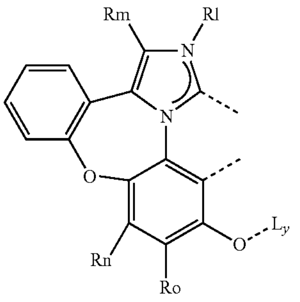 |
| $L_{A'}$30-(Rl)(Rm)(Rn)(Ro), wherein $L_{A'}$30-(R1)(R1)(R1)(R1) to $L_{A'}$30-(R307)(R307)(R307)(R307), having the structure | 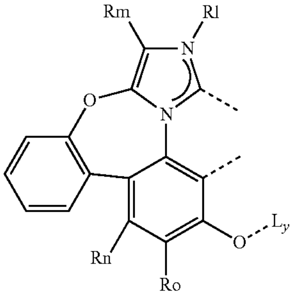 |

-continued

| Ligand $L_{A'}$ | Structure of $L_{A'}$ |
|---|---|
| $L_{A'}$31-(Rl)(Rm)(Rn)(Ro), wherein $L_{A'}$31-(R1)(R1)(R1)(R1) to $L_{A'}$31-(R307)(R307)(R307)(R307), having the structure | 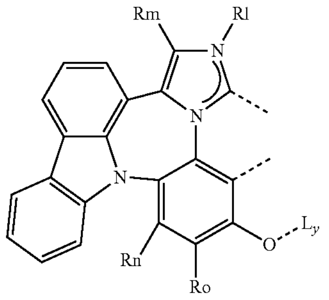 |
| $L_{A'}$32-(Rl)(Rm)(Rn)(Ro), wherein $L_{A'}$32-(R1)(R1)(R1)(R1) to $L_{A'}$32-(R307)(R307)(R307)(R307), having the structure | 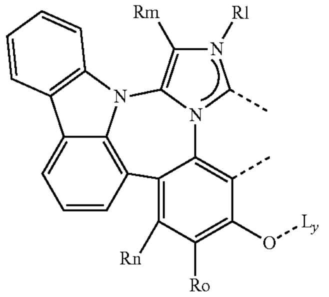 |
| $L_{A'}$33-(Rl)(Rm)(Rn)(Ro), wherein $L_{A'}$33-(R1)(R1)(R1)(R1) to $L_{A'}$33-(R307)(R307)(R307)(R307), having the structure | 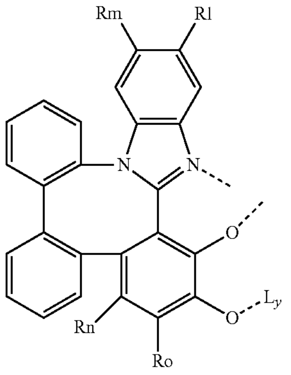 |
| $L_{A'}$34-(Rl)(Rm)(Rn)(Ro), wherein $L_{A'}$34-(R1)(R1)(R1)(R1) to $L_{A'}$34-(R307)(R307)(R307)(R307), having the structure | 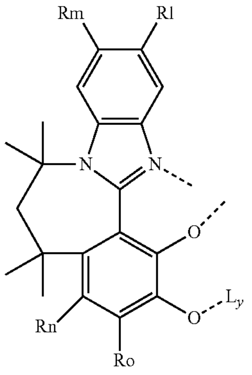 |

-continued

| Ligand $L_{A'}$ | Structure of $L_{A'}$ |
|---|---|
| $L_{A'}$35-(Rl)(Rm)(Rn)(Ro), wherein $L_{A'}$35-(R1)(R1)(R1)(R1) to $L_{A'}$35-(R307)(R307)(R307)(R307), having the structure | 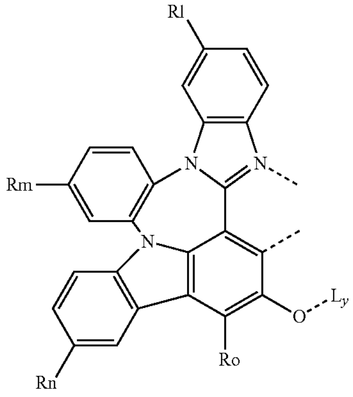 |
| $L_{A'}$36-(Rl)(Rm)(Rn)(Ro), wherein $L_{A'}$36-(R1)(R1)(R1)(R1) to $L_{A'}$36-(R307)(R307)(R307)(R307), having the structure | 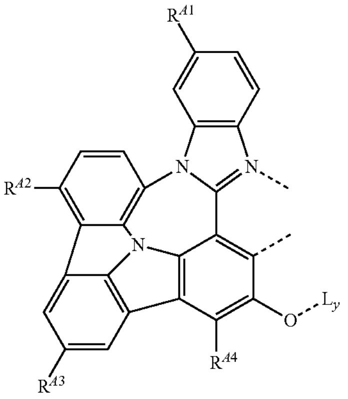 |
| $L_{A'}$37-(Rl)(Rm)(Rn)(Ro), wherein $L_{A'}$37-(R1)(R1)(R1)(R1) to $L_{A'}$37-(R307)(R307)(R307)(R307), having the structure | 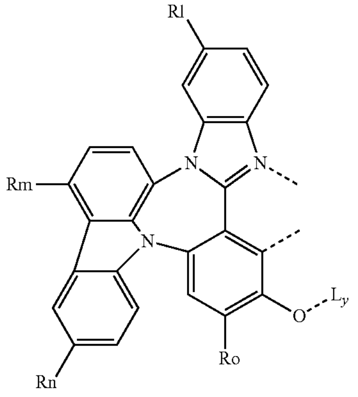 |
| $L_{A'}$38-(Rl)(Rm)(Rn)(Ro), wherein $L_{A'}$38-(R1)(R1)(R1)(R1) to $L_{A'}$38-(R307)(R307)(R307)(R307), having the structure | 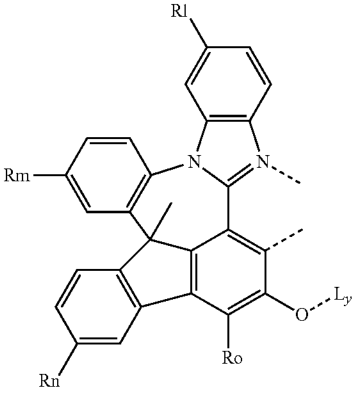 |

-continued

| Ligand $L_{A'}$ | Structure of $L_{A'}$ |
|---|---|
| $L_{A'}$39-(Rl)(Rm)(Rn)(Ro), wherein $L_{A'}$39-(R1)(R1)(R1)(R1) to $L_{A'}$39-(R307)(R307)(R307)(R307), having the structure | 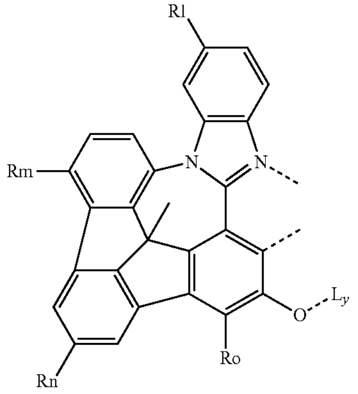 |
| $L_{A'}$40-(Rl)(Rm)(Rn)(Ro), wherein $L_{A'}$40-(R1)(R1)(R1)(R1) to $L_{A'}$40-(R307)(R307)(R307)(R307), having the structure | 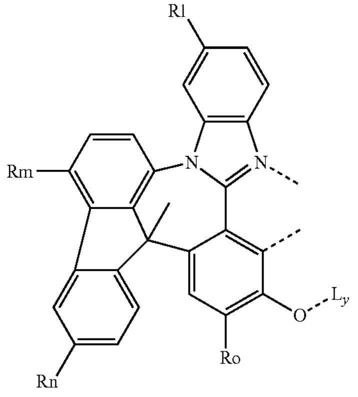 |
| $L_{A'}$41-(Rl)(Rm)(Rn)(Ro), wherein $L_{A'}$41-(R1)(R1)(R1)(R1) to $L_{A'}$41-(R307)(R307)(R307)(R307), having the structure | 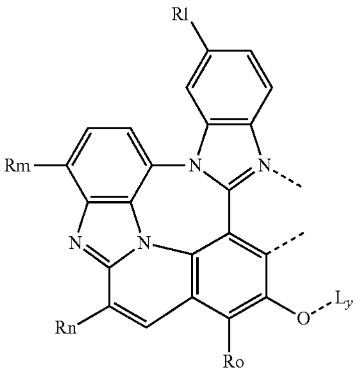 |
| $L_{A'}$42-(Rl)(Rm)(Rn)(Ro), wherein $L_{A'}$42-(R1)(R1)(R1)(R1) to $L_{A'}$42-(R307)(R307)(R307)(R307), having the structure | 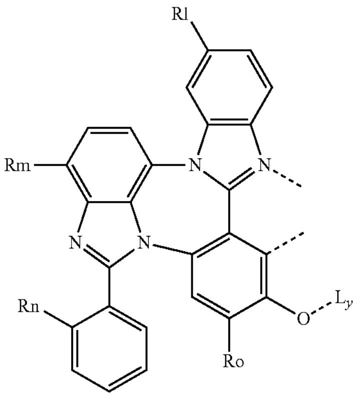 |
| $L_{A'}$43-(Rl)(Rm)(Rn)(Ro), wherein $L_{A'}$43-(R1)(R1)(R1)(R1) to $L_{A'}$43-(R307)(R307)(R307)(R307), having the structure | 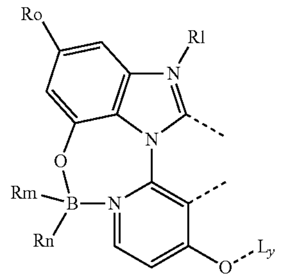 |
| $L_{A'}$44-(Rl)(Rm)(Ro)(Rq), wherein $L_{A'}$44-(R1)(R1)(R1)(R1) to $L_{A'}$44-(R307)(R307)(R307)(R307), having the structure | 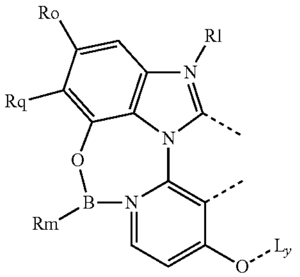 |
| $L_{A'}$45-(Rl)(Rm)(Rn)(Ro)(Rq), wherein $L_{A'}$45-(R1)(R1)(R1)(R1)(R1) to $L_{A'}$45-(R307)(R307)(R307)(R307)(R307), having the structure | 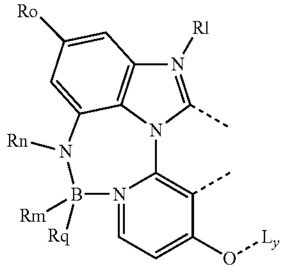 |
| $L_{A'}$46-(Rl)(Rm)(Rn)(Ro)(Rp), wherein $L_{A'}$46-(R1)(R1)(R1)(R1)(R1) to $L_{A'}$46-(R307)(R307)(R307)(R307)(R307), having the structure | 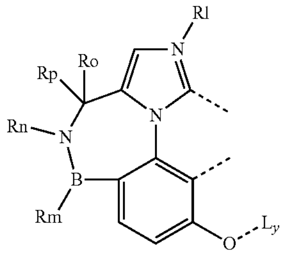 |
| $L_{A'}$47-(Rl)(Rm)(Rn)(Ro)(Rp), wherein $L_{A'}$47-(R1)(R1)(R1)(R1)(R1) to $L_{A'}$47-(R307)(R307)(R307)(R307)(R307), having the structure | 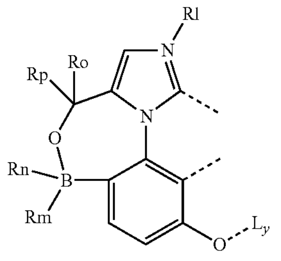 |
| $L_{A'}$48-(Rm)(Ro)(Rp), wherein $L_{A'}$48-(R1)(R1)(R1) to $L_{A'}$48-(R307)(R307)(R307), having the structure | 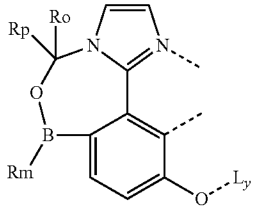 |

-continued

| Ligand $L_{A'}$ | Structure of $L_{A'}$ |
|---|---|
| $L_{A'}$49-(Rm)(Rn)(Ro)(Rq)(Rr), wherein $L_{A'}$49-(R1)(R1)(R1)(R1)(R1) to $L_{A'}$49-(R307)(R307)(R307)(R307)(R307), having the structure | 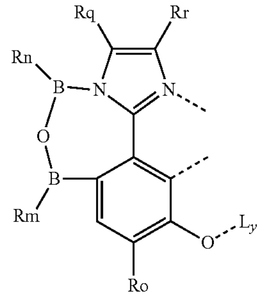 |
| $L_{A'}$50-(Rl)(Rm)(Ro)(Rq)(Rr), wherein $L_{A'}$50-(R1)(R1)(R1)(R1)(R1) to $L_{A'}$50-(R307)(R307)(R307)(R307)(R307), having the structure | 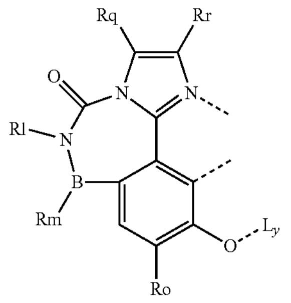 |
| $L_{A'}$51-(Rl)(Rm)(Rn)(Ro), wherein $L_{A'}$51-(R1)(R1)(R1)(R1) to $L_{A'}$51-(R307)(R307)(R307)(R307), having the structure | 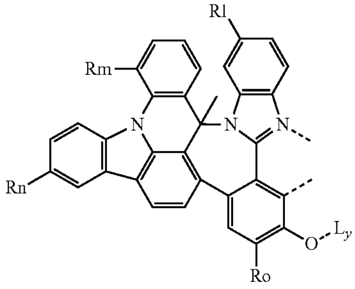 |
| $L_{A'}$52-(Rl)(Rm)(Rn)(Ro), wherein $L_{A'}$52-(R1)(R1)(R1)(R1) to $L_{A'}$52-(R307)(R307)(R307)(R307), having the structure | 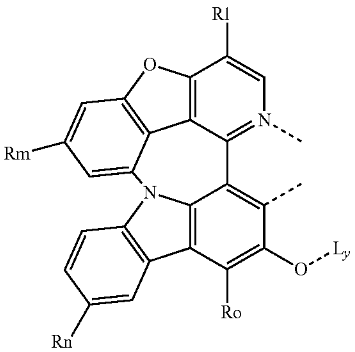 |
| $L_{A'}$53-(Rl)(Rm)(Rn)(Ro), wherein $L_{A'}$53-(R1)(R1)(R1)(R1) to $L_{A'}$53-(R307)(R307)(R307)(R307), having the structure | 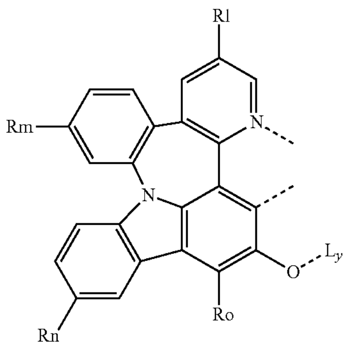 |

-continued

| Ligand $L_{A'}$ | Structure of $L_{A'}$ |
|---|---|
| $L_{A'}$54-(Rl)(Rm)(Rn)(Ro), wherein $L_{A'}$54-(R1)(R1)(R1)(R1) to $L_{A'}$54-(R307)(R307)(R307)(R307), having the structure | 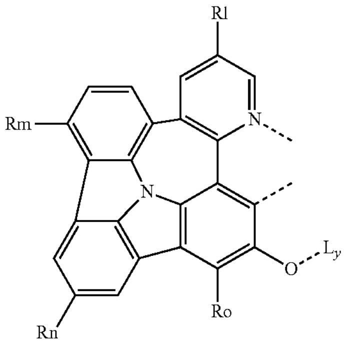 |
| $L_{A'}$55-(Rl)(Rm)(Rn)(Ro), wherein $L_{A'}$55-(R1)(R1)(R1)(R1) to $L_{A'}$55-(R307)(R307)(R307)(R307), having the structure | 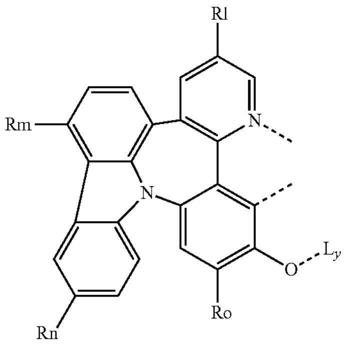 |
| $L_{A'}$56-(Rl)(Rm)(Rn)(Ro), wherein $L_{A'}$56-(R1)(R1)(R1)(R1) to $L_{A'}$56-(R307)(R307)(R307)(R307), having the structure | 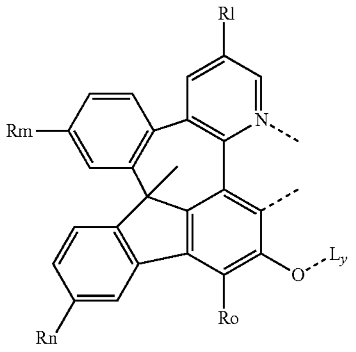 |
| $L_{A'}$57-(Rl)(Rm)(Rn)(Ro), wherein $L_{A'}$57-(R1)(R1)(R1)(R1) to $L_{A'}$57-(R307)(R307)(R307)(R307), having the structure | 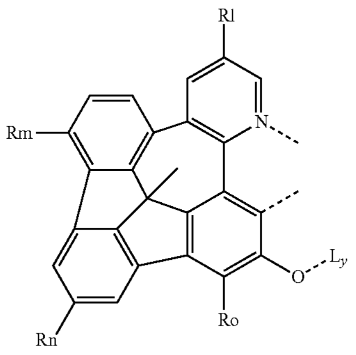 |

-continued

| Ligand $L_{A'}$ | Structure of $L_{A'}$ |
|---|---|
| $L_{A'}58$-(Rl)(Rm)(Rn)(Ro), wherein $L_{A'}58$-(R1)(R1)(R1)(R1) to $L_{A'}58$-(R307)(R307)(R307)(R307), having the structure | 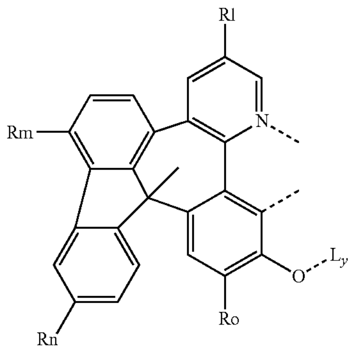 |
| $L_{A'}59$-(Rl)(Rm)(Rn)(Ro), wherein $L_{A'}59$-(R1)(R1)(R1)(R1) to $L_{A'}59$-(R307)(R307)(R307)(R307), having the structure | 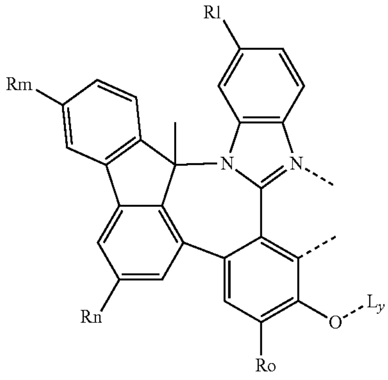 |
| $L_{A'}60$-(Rl)(Rm)(Rn)(Ro), wherein $L_{A'}60$-(R1)(R1)(R1)(R1) to $L_{A'}60$-(R307)(R307)(R307)(R307), having the structure | 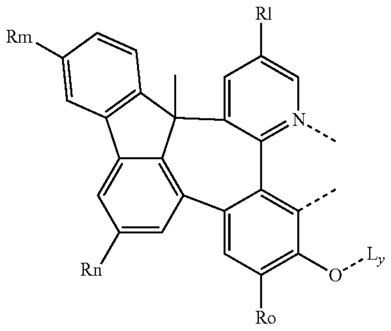 |
| $L_{A'}61$-(Rl)(Rm)(Rn)(Ro), wherein $L_{A'}61$-(R1)(R1)(R1)(R1) to $L_{A'}61$-(R307)(R307)(R307)(R307), having the structure | 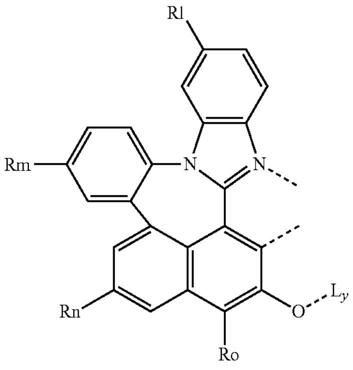 |
| $L_{A'}62$-(Rl)(Rm)(Rn)(Ro), wherein $L_{A'}62$-(R1)(R1)(R1)(R1) to $L_{A'}62$-(R307)(R307)(R307)(R307), having the structure | 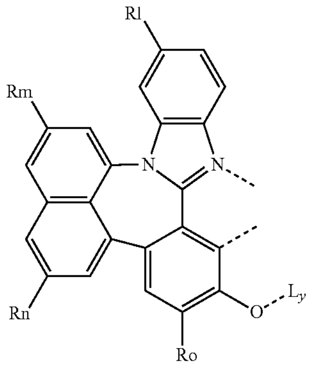 |
| $L_{A'}63$-(Rl)(Rm)(Rn)(Ro), wherein $L_{A'}63$-(R1)(R1)(R1)(R1) to $L_{A'}63$-(R307)(R307)(R307)(R307), having the structure | 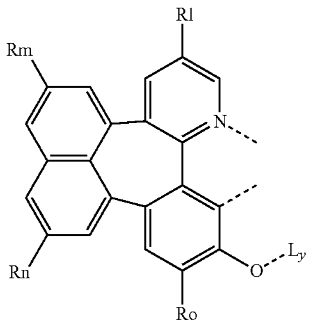 |
| $L_{A'}64$-(Rl)(Rm)(Rn)(Ro), wherein $L_{A'}64$-(R1)(R1)(R1)(R1) to $L_{A'}64$-(R307)(R307)(R307)(R307), having the structure | 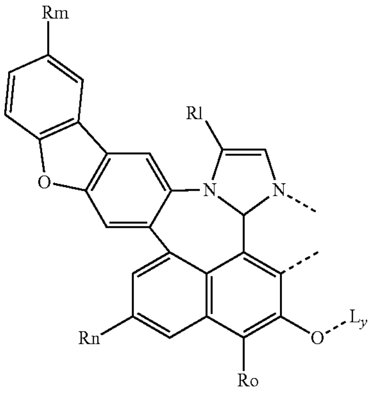 |
| $L_{A'}65$-(Rl)(Rm)(Rn)(Ro), wherein $L_{A'}65$-(R1)(R1)(R1)(R1) to $L_{A'}65$-(R307)(R307)(R307)(R307), having the structure | 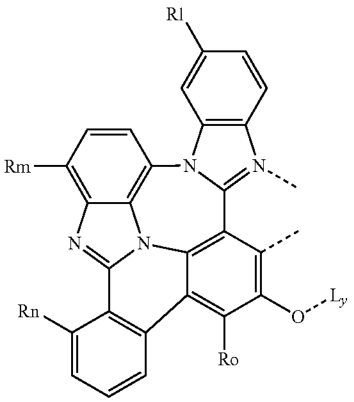 |

-continued

| Ligand $L_{A'}$ | Structure of $L_{A'}$ |
|---|---|
| $L_{A'}$66-(Rl)(Rm)(Rn)(Ro), wherein $L_{A'}$66-(R1)(R1)(R1)(R1) to $L_{A'}$66-(R307)(R307)(R307)(R307), having the structure | 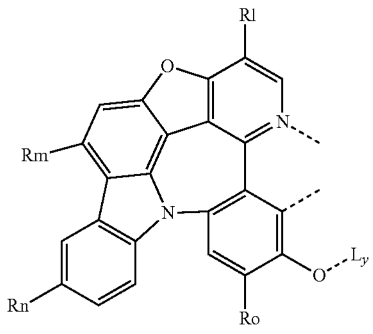 |
| $L_{A'}$67-(Rl)(Rm)(Rn)(Ro), wherein $L_{A'}$67-(R1)(R1)(R1)(R1) to $L_{A'}$67-(R307)(R307)(R307)(R307), having the structure | 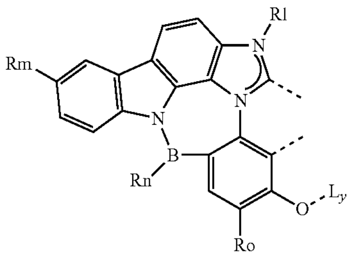 |
| $L_{A'}$68-(Rl)(Rm)(Rn)(Ro), wherein $L_{A'}$68-(R1)(R1)(R1)(R1) to $L_{A'}$68-(R307)(R307)(R307)(R307), having the structure | 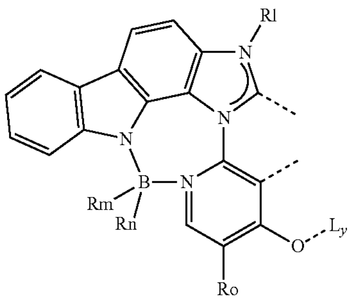 |
| $L_{A'}$69-(Rl)(Rm)(Rn)(Ro), wherein $L_{A'}$69-(R1)(R1)(R1)(R1) to $L_{A'}$69-(R307)(R307)(R307)(R307), having the structure | 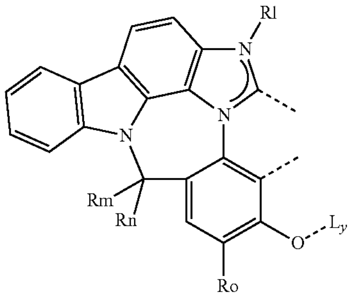 |
| $L_{A'}$70-(Rl)(Rm)(Rn)(Ro), wherein $L_{A'}$70-(R1)(R1)(R1)(R1) to $L_{A'}$70-(R307)(R307)(R307)(R307), having the structure | 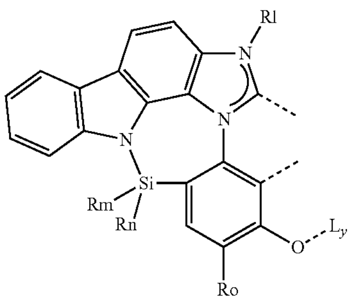 |

-continued

| Ligand $L_{A'}$ | Structure of $L_{A'}$ |
|---|---|
| $L_{A'}$71-(Rl)(Rm)(Rn)(Ro), wherein $L_{A'}$71-(R1)(R1)(R1)(R1) to $L_{A'}$71-(R307)(R307)(R307)(R307), having the structure | 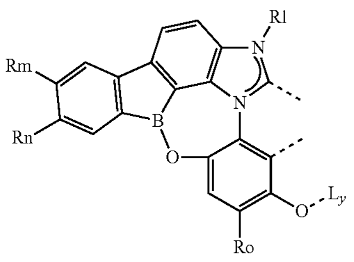 |
| $L_{A'}$72-(Rl)(Rm)(Rn)(Ro), wherein $L_{A'}$72-(R1)(R1)(R1)(R1) to $L_{A'}$72-(R307)(R307)(R307)(R307), having the structure | 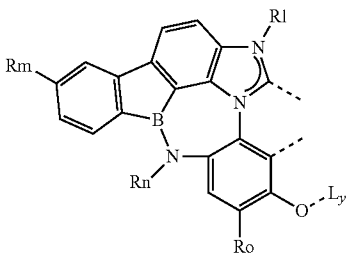 |
| $L_{A'}$73-(Rl)(Rm)(Rn)(Ro), wherein $L_{A'}$73-(R1)(R1)(R1)(R1) to $L_{A'}$73-(R307)(R307)(R307)(R307), having the structure | 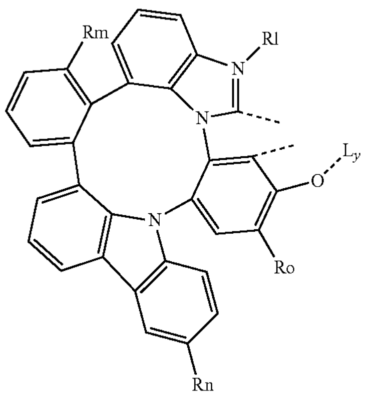 |
| $L_{A'}$74-(Rl)(Rm)(Rn)(Ro), wherein $L_{A'}$74-(R1)(R1)(R1)(R1) to $L_{A'}$74-(R307)(R307)(R307)(R307), having the structure | 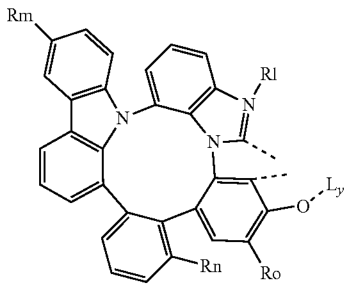 |
| $L_{A'}$75-(Rl)(Rm)(Rn)(Ro), wherein $L_{A'}$75-(R1)(R1)(R1)(R1) to $L_{A'}$75-(R307)(R307)(R307)(R307), having the structure | 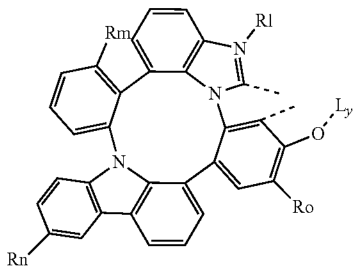 |

-continued

| Ligand $L_{A'}$ | Structure of $L_{A'}$ |
| --- | --- |
| $L_{A'}$76-(Rl)(Rm)(Rn)(Ro), wherein $L_{A'}$76-(R1)(R1)(R1)(R1) to $L_{A'}$76-(R307)(R307)(R307)(R307), having the structure | 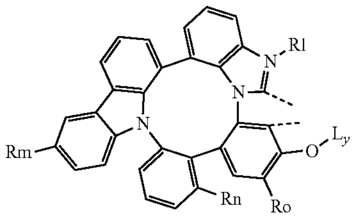 |
| $L_{A'}$77-(Rl)(Rm)(Rn)(Ro), wherein $L_{A'}$77-(R1)(R1)(R1)(R1) to $L_{A'}$77-(R307)(R307)(R307)(R307), having the structure | 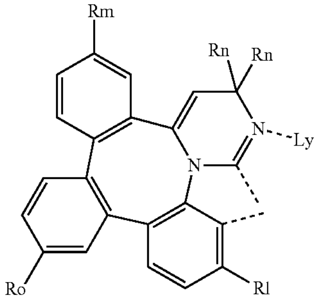 |
| $L_{A'}$78-(Rl)(Rm)(Rn)(Ro), wherein $L_{A'}$78-(R1)(R1)(R1)(R1) to $L_{A'}$78-(R307)(R307)(R307)(R307), having the structure | 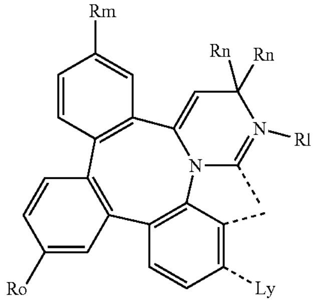 |
| $L_{A'}$79-(Rl)(Rm)(Rn)(Ro), wherein $L_{A'}$79-(R1)(R1)(R1)(R1) to $L_{A'}$79-(R307)(R307)(R307)(R307), having the structure | 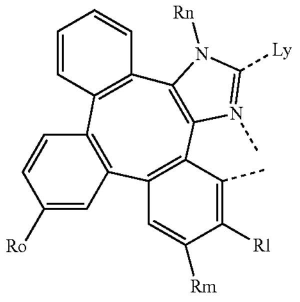 |
| $L_{A'}$80-(Rl)(Rm)(Rn)(Ro), wherein $L_{A'}$80-(R1)(R1)(R1)(R1) to $L_{A'}$80-(R307)(R307)(R307)(R307), having the structure | 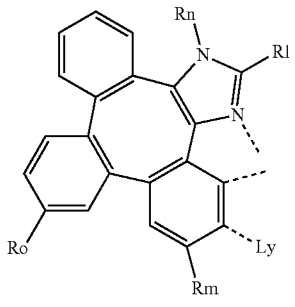 |

-continued

| Ligand $L_{A'}$ | Structure of $L_{A'}$ |
| --- | --- |
| $L_{A'}$81-(Rl)(Rm)(Rn)(Ro), wherein $L_{A'}$81-(R1)(R1)(R1)(R1) to $L_{A'}$81-(R307)(R307)(R307)(R307), having the structure | 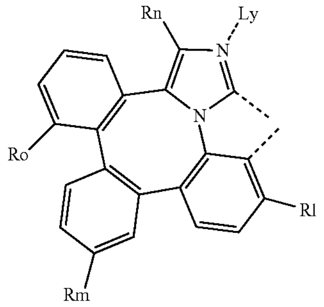 |
| $L_{A'}$82-(Rl)(Rm)(Rn)(Ro), wherein $L_{A'}$82-(R1)(R1)(R1)(R1) to $L_{A'}$82-(R307)(R307)(R307)(R307), having the structure | 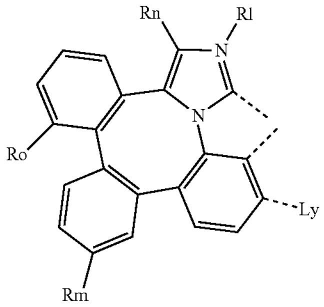 |
| $L_{A'}$83-(Rl)(Rm)(Rn)(Ro), wherein $L_{A'}$83-(R1)(R1)(R1)(R1) to $L_{A'}$83-(R307)(R307)(R307)(R307), having the structure | 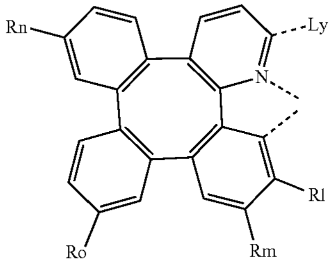 |
| $L_{A'}$84-(Rl)(Rm)(Rn)(Ro), wherein $L_{A'}$84-(R1)(R1)(R1)(R1) to $L_{A'}$84-(R307)(R307)(R307)(R307), having the structure | 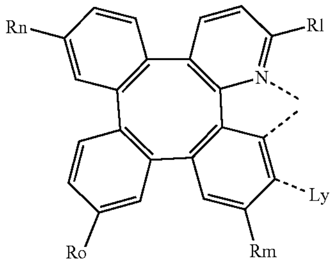 |
| $L_{A'}$85-(Rl)(Rm)(Rn)(Ro), wherein $L_{A'}$85-(R1)(R1)(R1)(R1) to $L_{A'}$85-(R307)(R307)(R307)(R307), having the structure | 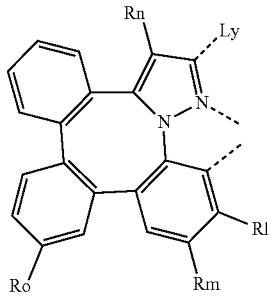 |

-continued

| Ligand $L_{A'}$ | Structure of $L_{A'}$ |
|---|---|
| $L_{A'}$86-(Rl)(Rm)(Rn)(Ro), wherein $L_{A'}$86-(R1)(R1)(R1)(R1) to $L_{A'}$86-(R307)(R307)(R307)(R307), having the structure | 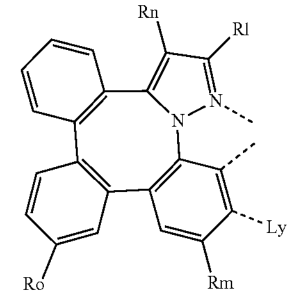 |
| $L_{A'}$87-(Rl)(Rm)(Rn)(Ro), wherein $L_{A'}$87-(R1)(R1)(R1)(R1) to $L_{A'}$87-(R307)(R307)(R307)(R307), having the structure | 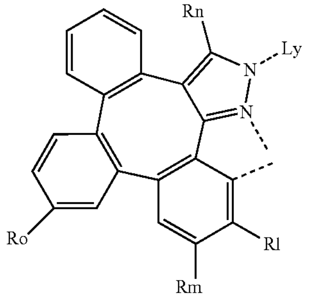 |
| $L_{A'}$88-(Rl)(Rm)(Rn)(Ro), wherein $L_{A'}$88-(R1)(R1)(R1)(R1) to $L_{A'}$88-(R307)(R307)(R307)(R307), having the structure | 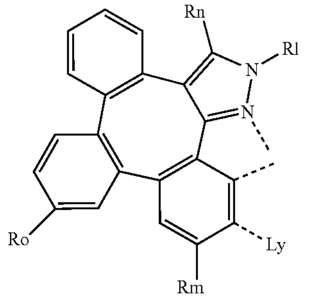 |
| $L_{A'}$89-(Rl)(Rm)(Rn)(Ro), wherein $L_{A'}$89-(R1)(R1)(R1)(R1) to $L_{A'}$89-(R307)(R307)(R307)(R307), having the structure | 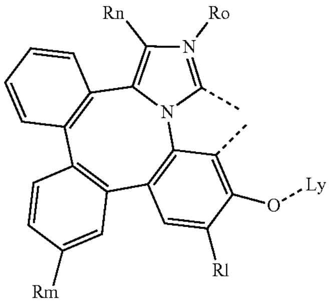 |
| $L_{A'}$90-(Rl)(Rm)(Rn)(Ro), wherein $L_{A'}$90-(R1)(R1)(R1)(R1) to $L_{A'}$90-(R307)(R307)(R307)(R307), having the structure | 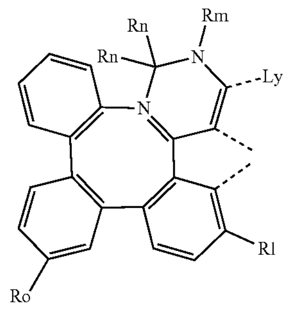 |

-continued

| Ligand $L_{A'}$ | Structure of $L_{A'}$ |
|---|---|
| $L_{A'}$91-(Rl)(Rm)(Rn)(Ro), wherein $L_{A'}$91-(R1)(R1)(R1)(R1) to $L_{A'}$91-(R307)(R307)(R307)(R307), having the structure | 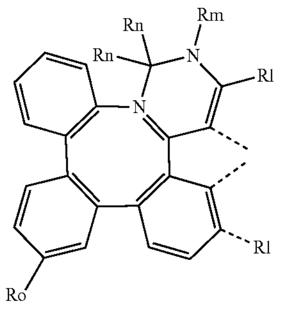 |
| $L_{A'}$92-(Rl)(Rm)(Ro)(Rp), wherein $L_{A'}$92-(R1)(R1)(R1)(R1) to $L_{A'}$92-(R307)(R307)(R307)(R307), having the structure | 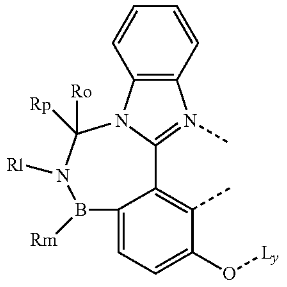 |
| $L_{A'}$93-(Rm)(Ro)(Rp)(Rq), wherein $L_{A'}$93-(R1)(R1)(R1)(R1) to $L_{A'}$93-(R307)(R307)(R307)(R307), having the structure | 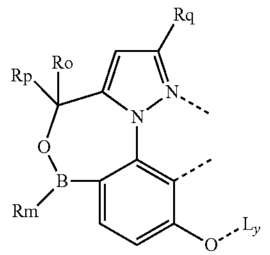 |
| $L_{A'}$94-(Rm)(Ro)(Rp), wherein $L_{A'}$94-(R1)(R1)(R1) to $L_{A'}$94-(R307)(R307)(R307), having the structure | 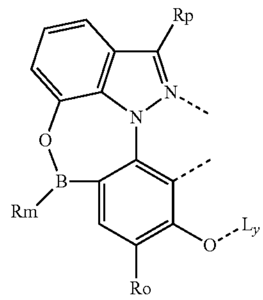 |
| $L_{A'}$95-(Rl)(Rm)(Rn)(Rp), wherein $L_{A'}$95-(R1)(R1)(R1)(R1) to $L_{A'}$95-(R307)(R307)(R307)(R307), having the structure | 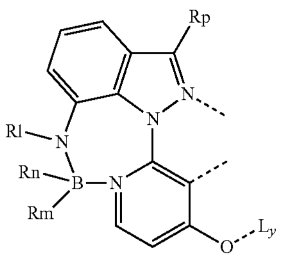 |

-continued

| Ligand $L_{A'}$ | Structure of $L_{A'}$ |
|---|---|
| $L_{A'}$96-(Rl)(Rm)(Rn)(Ro)(Rp), wherein $L_{A'}$96-(R1)(R1)(R1)(R1)(R1) to $L_{A'}$90-(R307)(R307)(R307)(R307)(R307), having the structure | 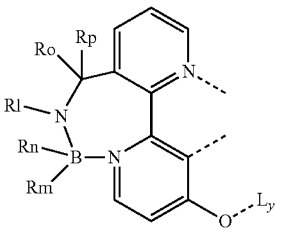 |
| $L_{A'}$97-(Rl)(Rm)(Rn)(Ro)(Rp), wherein $L_{A'}$97-(R1)(R1)(R1)(R1)(R1) to $L_{A'}$97-(R307)(R307)(R307)(R307)(R307), having the structure | 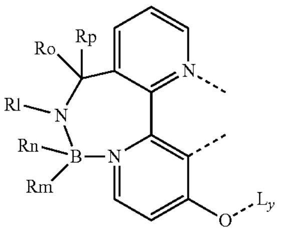 |
| $L_{A'}$98-(Rl)(Rm)(Ro)(Rp), wherein $L_{A'}$98-(R1)(R1)(R1)(R1) to $L_{A'}$98-(R307)(R307)(R307)(R307), having the structure | 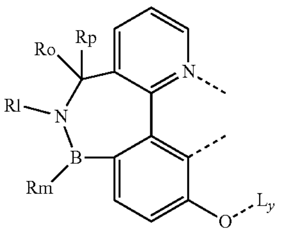 |
| $L_{A'}$99-(Rm)(Ro)(Rp)(Rr), wherein $L_{A'}$99-(R1)(R1)(R1)(R1) to $L_{A'}$99-(R307)(R307)(R307)(R307), having the structure | 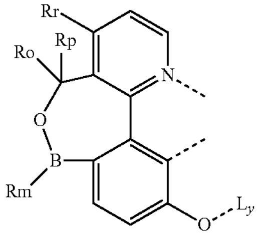 |
| $L_{A'}$100-(Rl)(Rm)(Rn)(Ro), wherein $L_{A'}$100-(R1)(R1)(R1)(R1) to $L_{A'}$100-(R307)(R307)(R307)(R307), having the structure | 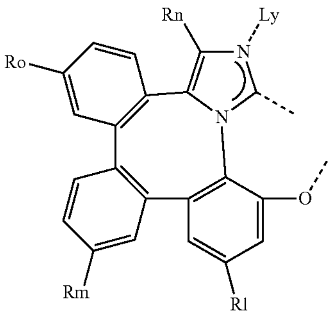 |
| $L_{A'}$101-(Rl)(Rm)(Rn)(Ro), wherein $L_{A'}$101-(R1)(R1)(R1)(R1) to $L_{A'}$101-(R307)(R307)(R307)(R307), having the structure | 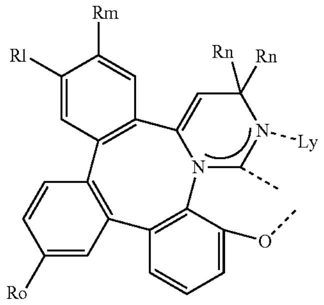 |

wherein $L_y$ is selected from the group consisting of the structures $L_y$1-(Rs)(Rt)(Ru) to $L_y$33-(Rs)(Rt)(Ru), defined below, wherein s, t, and u are each independently an integer from 1 to 307:

| $L_y$ | Structure of $L_y$ |
|---|---|
| $L_y$1-(Rs)(Rt)(Ru), wherein $L_y$1-(R1)(R1)(R1) to $L_y$1-(R307)(R307)(R307), having the structure | 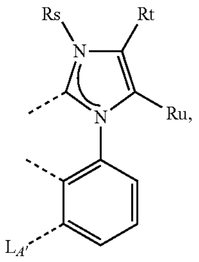 |
| $L_y$2-(Rs)(Rt)(Ru), wherein $L_y$2-(R1)(R1)(R1) to $L_y$2-(R307)(R307)(R307), having the structure | 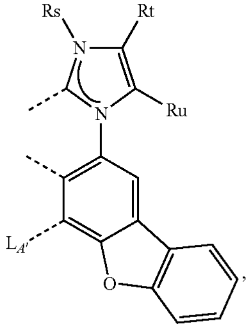 |
| $L_y$3-(Rs)(Rt)(Ru), wherein $L_y$3-(R1)(R1)(R1) to $L_y$3-(R307)(R307)(R307), having the structure | 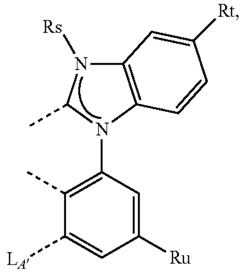 |

-continued

| $L_y$ | Structure of $L_y$ |
|---|---|
| $L_y$4-(s)(t)(u), wherein $L_y$4-(1)(1)(1) to $L_y$4-(307)(307)(307), having the structure | 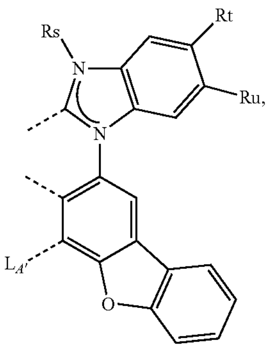 |
| $L_y$5-(Rs)(Rt)(Ru), wherein $L_y$5-(R1)(R1)(R1) to $L_y$5-(R307)(R307)(R307), having the structure | 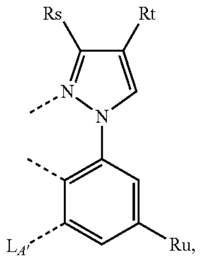 |
| $L_y$6-(Rs)(Rt)(Ru), wherein $L_y$6-(R1)(R1)(R1) to $L_y$6-(R307)(R307)(R307), having the structure | 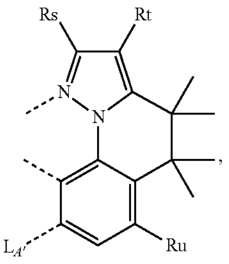 |
| $L_y$7-(Rs)(Rt)(Ru), wherein $L_y$7-(R1)(R1)(R1) to $L_y$7-(R307)(R307)(R307), having the structure | 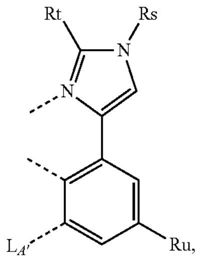 |
| $L_y$8-(Rs)(Rt)(Ru), wherein $L_y$8-(R1)(R1)(R1) to $L_y$8-(R307)(R307)(R307), having the structure | 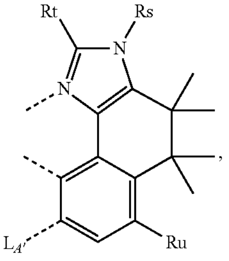 |
| $L_y$9-(Rs)(Rt)(Ru), wherein $L_y$9-(R1)(R1)(R1) to $L_y$9-(R307)(R307)(R307), having the structure | 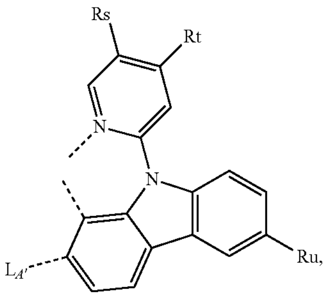 |
| $L_y$10-(Rs)(Rt)(Ru), wherein $L_y$10-(R1)(R1)(R1) to $L_y$10-(R307)(R307)(R307), having the structure | 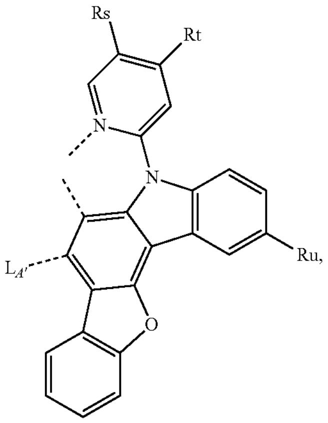 |
| $L_y$11-(Rs)(Rt)(Ru), wherein $L_y$11-(R1)(R1)(R1) to $L_y$11-(R307)(R307)(R307), having the structure | 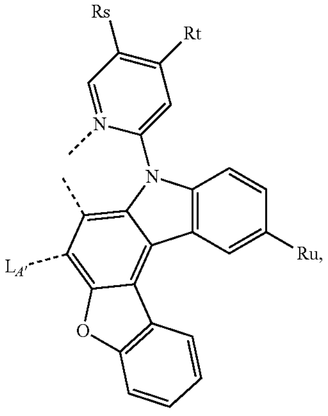 |
| $L_y$12-(Rs)(Rt)(Ru), wherein $L_y$12-(R1)(R1)(R1) to $L_y$12-(R307)(R307)(R307), having the structure | 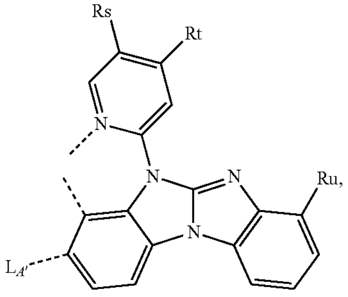 |

-continued

| $L_y$ | Structure of $L_y$ |
| --- | --- |
| $L_y$13-(Rs)(Rt)(Ru), wherein $L_y$13-(R1)(R1)(R1) to $L_y$13-(R307)(R307)(R307), having the structure | 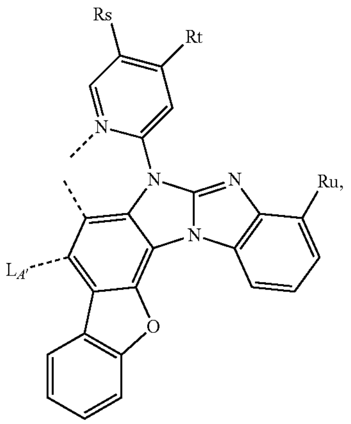 |
| $L_y$14-(Rs)(Rt)(Ru), wherein $L_y$14-(R1)(R1)(R1) to $L_y$14-(R307)(R307)(R307), having the structure | 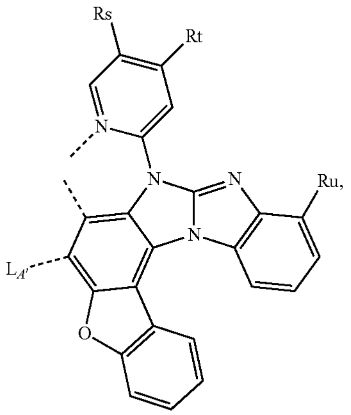 |
| $L_y$15-(Rs)(Rt)(Ru), wherein $L_y$15-(R1)(R1)(R1) to $L_y$15-(R307)(R307)(R307), having the structure | 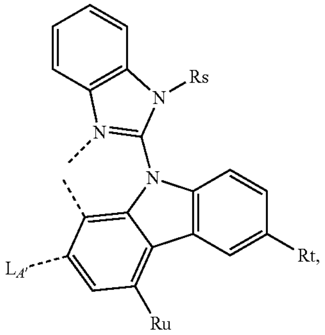 |
| $L_y$16-(Rs)(Rt)(Ru), wherein $L_y$16-(R1)(R1)(R1) to $L_y$16-(R307)(R307)(R307), having the structure | 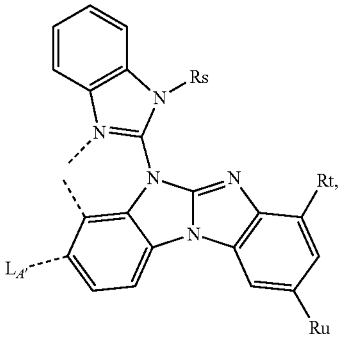 |
| $L_y$17-(Rs)(Rt)(Ru), wherein $L_y$17-(R1)(R1)(R1) to $L_y$17-(R307)(R307)(R307), having the structure | 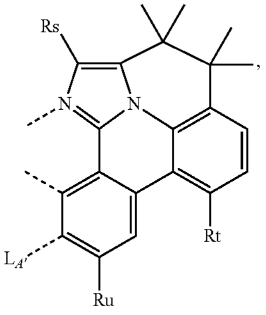 |
| $L_y$18-(Rs)(Rt)(Ru), wherein $L_y$18-(R1)(R1)(R1) to $L_y$18-(R307)(R307)(R307), having the structure | 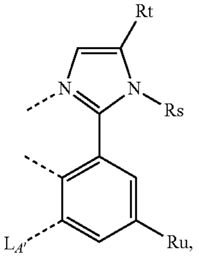 |
| $L_y$19-(Rs)(Rt)(Ru), wherein $L_y$19-(R1)(R1)(R1) to $L_y$19-(R307)(R307)(R307), having the structure | 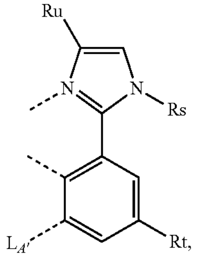 |
| $L_y$20-(Rs)(Rt)(Ru), wherein $L_y$20-(R1)(R1)(R1) to $L_y$20-(R307)(R307)(R307), having the structure | 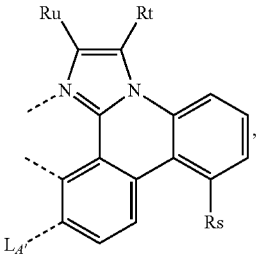 |
| $L_y$21-(Rs)(Rt)(Ru), wherein $L_y$21-(R1)(R1)(R1) to $L_y$21-(R307)(R307)(R307), having the structure | 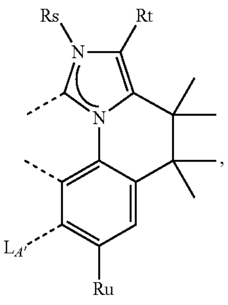 |

-continued

| $L_y$ | Structure of $L_y$ |
|---|---|
| $L_y$22-(Rs)(Rt)(Ru), wherein $L_y$22-(R1)(R1)(R1) to $L_y$22-(R307)(R307)(R307), having the structure | 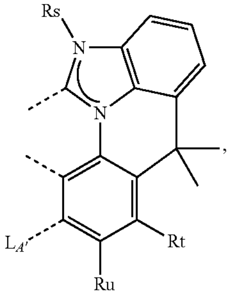 |
| $L_y$23-(Rs)(Rt)(Ru), wherein $L_y$23-(R1)(R1)(R1) to $L_y$23-(R307)(R307)(R307), having the structure | 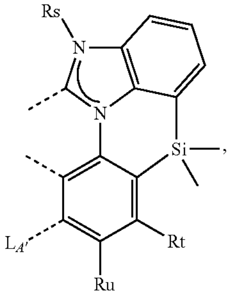 |
| $L_y$24-(Rs)(Rt)(Ru), wherein $L_y$24-(R1)(R1)(R1) to $L_y$24-(R307)(R307)(R307), having the structure | 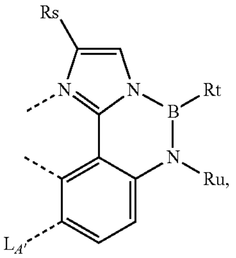 |
| $L_y$25-(Rs)(Rt)(Ru), wherein $L_y$25-(R1)(R1)(R1) to $L_y$25-(R307)(R307)(R307), having the structure | 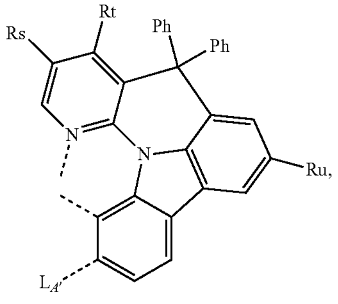 |
| $L_y$26-(Rs)(Rt)(Ru), wherein $L_y$26-(R1)(R1)(R1) to $L_y$26-(R307)(R307)(R307), having the structure | 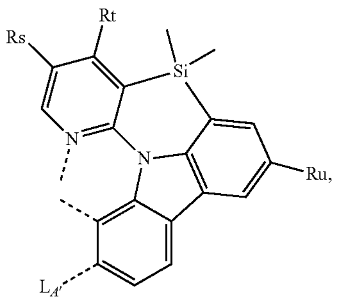 |

-continued

| $L_y$ | Structure of $L_y$ |
|---|---|
| $L_y$27-(Rs)(Rt)(Ru), wherein $L_y$27-(R1)(R1)(R1) to $L_y$27-(R307)(R307)(R307), having the structure | 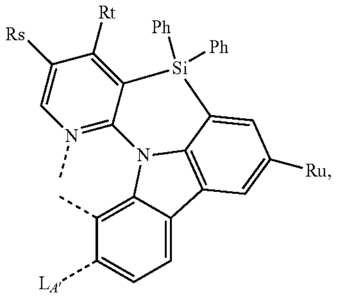 |
| $L_y$28-(Rs)(Rt)(Ru), wherein $L_y$28-(R1)(R1)(R1) to $L_y$28-(R307)(R307)(R307), having the structure | 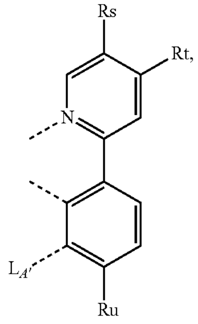 |
| $L_y$29-(Rs)(Rt)(Ru), wherein $L_y$29-(R1)(R1)(R1) to $L_y$29-(R307)(R307)(R307), having the structure | 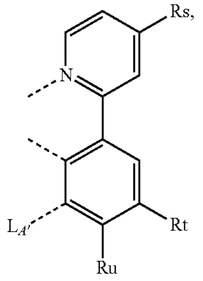 |
| $L_y$30-(Rs)(Rt)(Ru), wherein $L_y$30-(R1)(R1)(R1) to $L_y$30-(R307)(R307)(R307), having the structure | 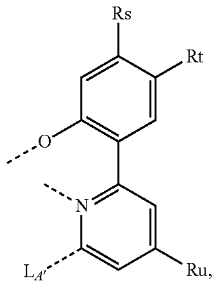 |
| $L_y$31-(Rs)(Rt)(Ru), wherein $L_y$31-(R1)(R1)(R1) to $L_y$31-(R307)(R307)(R307), having the structure | 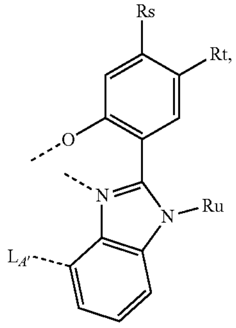 |

-continued
| $L_y$ | Structure of $L_y$ |
|---|---|
| $L_y$32-(Rs)(Rt)(Ru), wherein $L_y$32-(R1)(R1)(R1) to $L_y$32-(R307)(R307)(R307), having the structure | 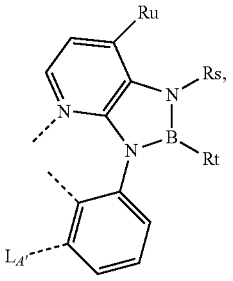 |
| $L_y$33-(Rs)(Rt)(Ru), wherein $L_y$33-(R1)(R1)(R1) to $L_y$33-(R307)(R307)(R307), having the structure | 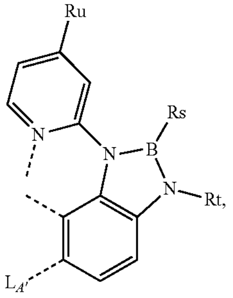 |
wherein R1 to R307 have the following structures:
R1
Me,
R2
iPr,
R3
tBu,
R4
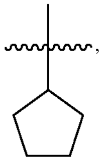
R5
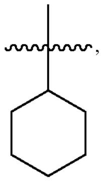
R6
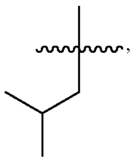
R7
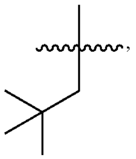
-continued
R8
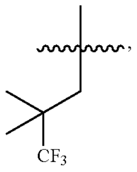
R9
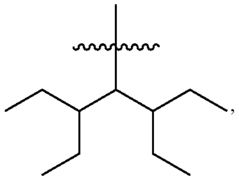
R10
$CD_3$,
R11
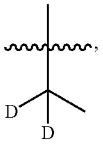
R12
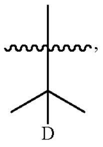
R13
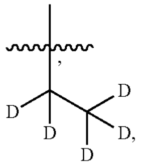
R14
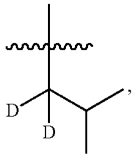
R15
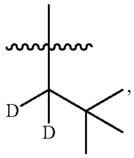
R16
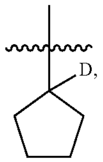
R17
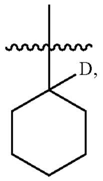

R18
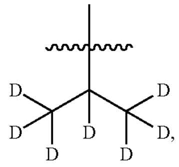
R19
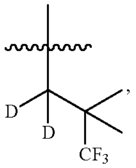
R20
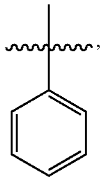
R21
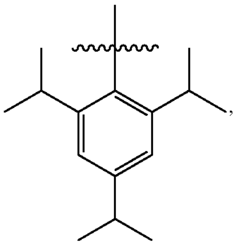
R22
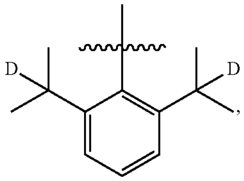
R23
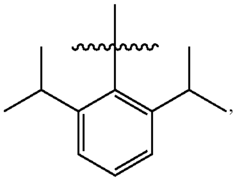
R24
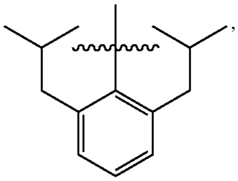
R25
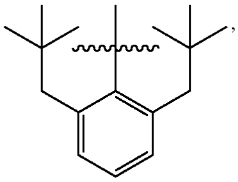
R26
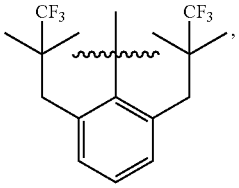
R27
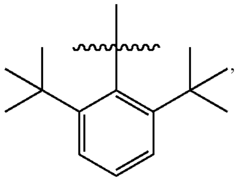
R28
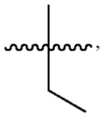
R29
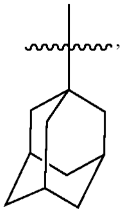
R30
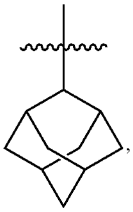
R31
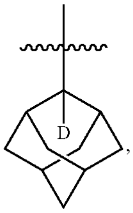
R32
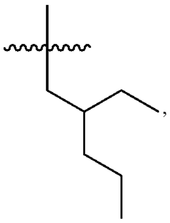

-continued
R33
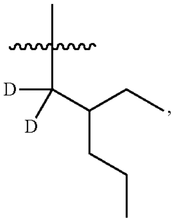
R34
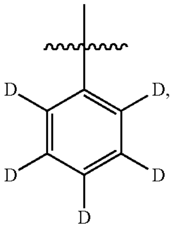
R35
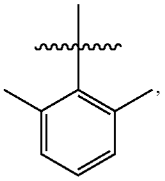
R36
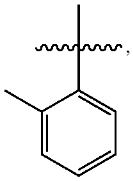
R37
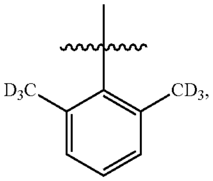
R38
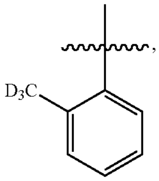
R39
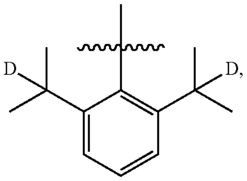
R40
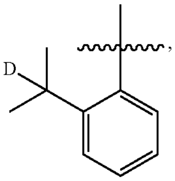
-continued
R41
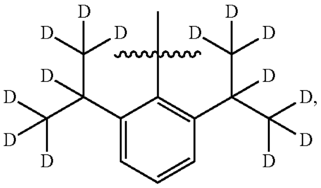
R42
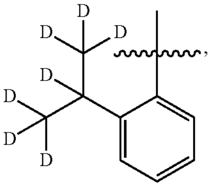
R43
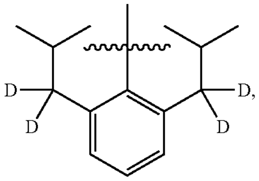
R44
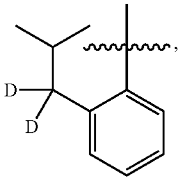
R45
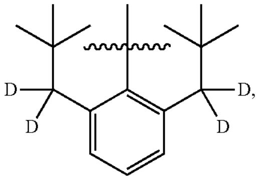
R46
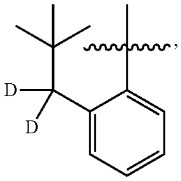
R47
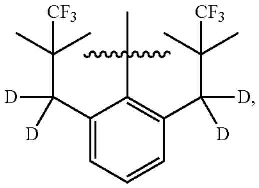
R48
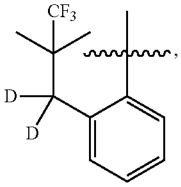

-continued
R49
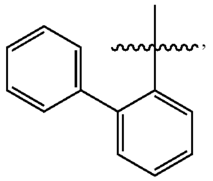
R50
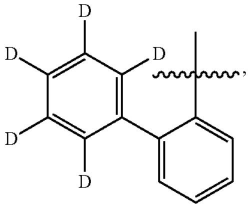
R51
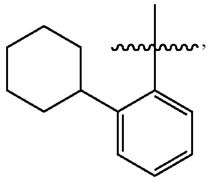
R52
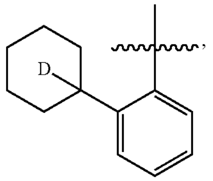
R53
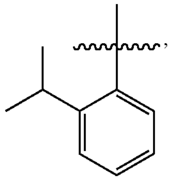
R54
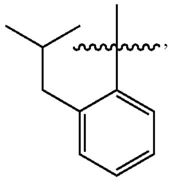
R55
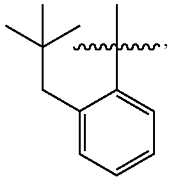
R56
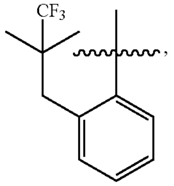
-continued
R57
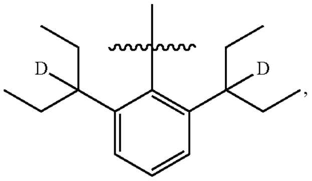
R58
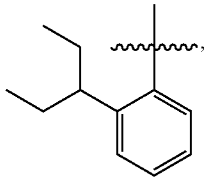
R59
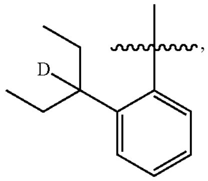
R60
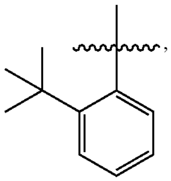
R61
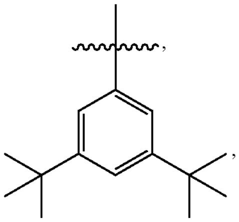
R62
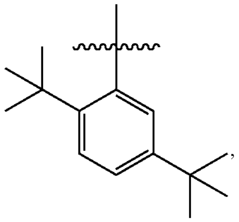
R63
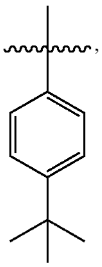

-continued
R64
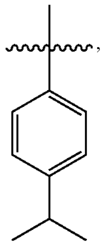
R65
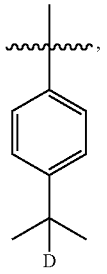
R66
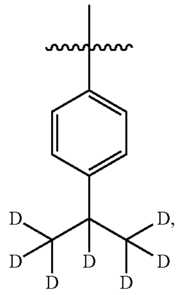
R67
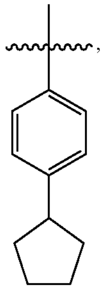
R68
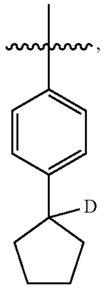
-continued
R69
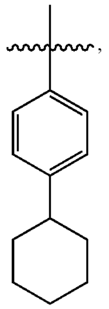
R70
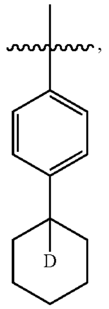
R71
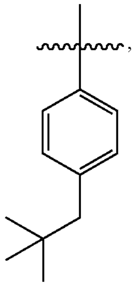
R72
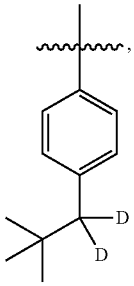
R73
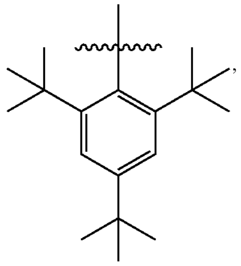

-continued
R74
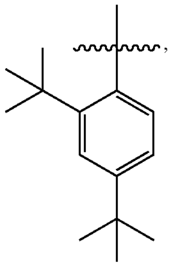
R75
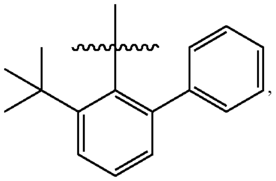
R76
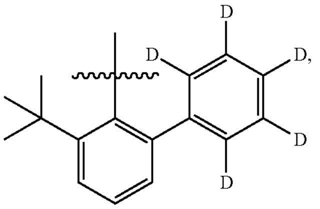
R77
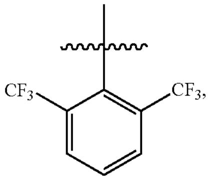
R78
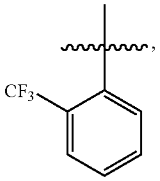
R79
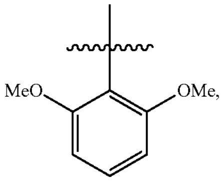
R80
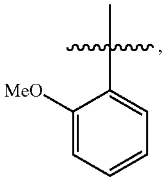
R81
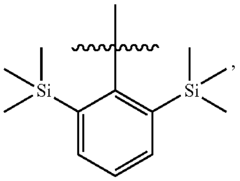
-continued
R92
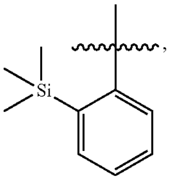
R83
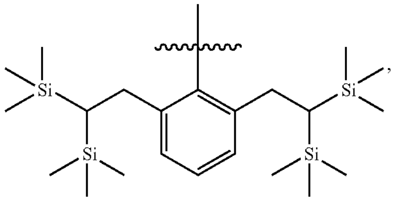
R84
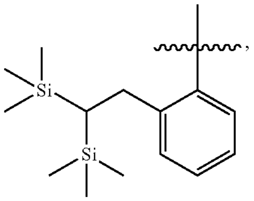
R85
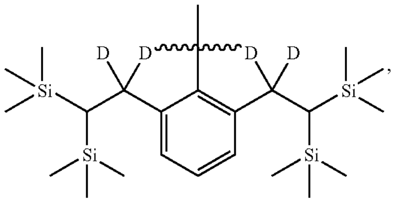
R86
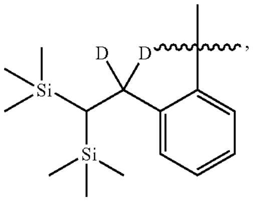
R87
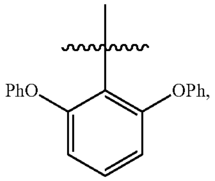
R88
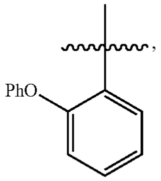
R89
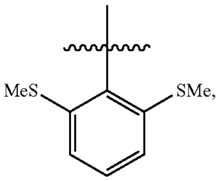

-continued
R90
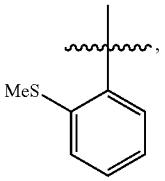
R91
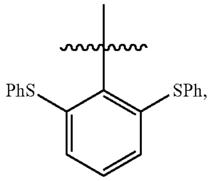
R92
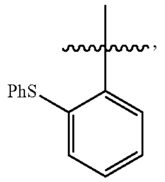
R93
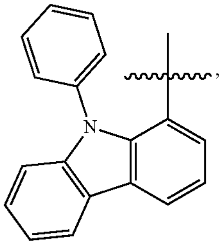
R94
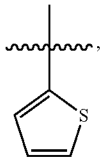
R95
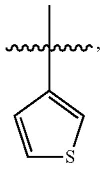
R96
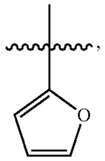
R97
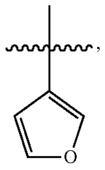
-continued
R98
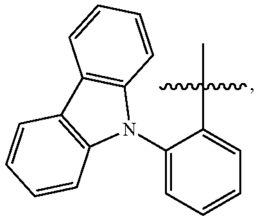
R99
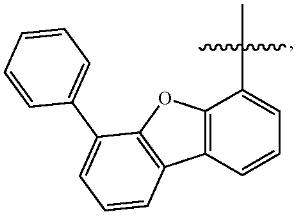
R100
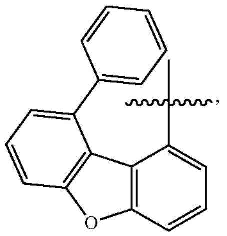
R101
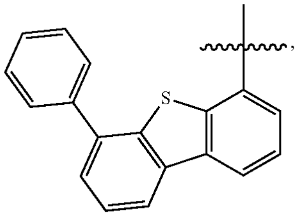
R102
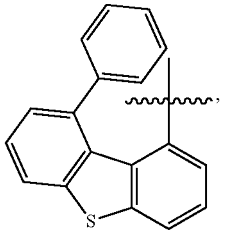
R103
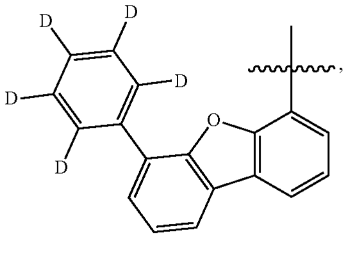

R104
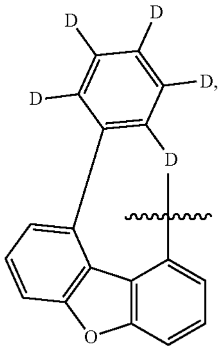
R105
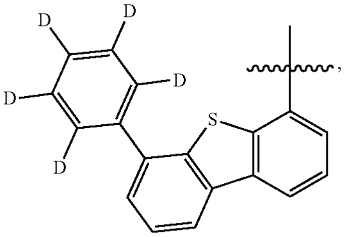
R106
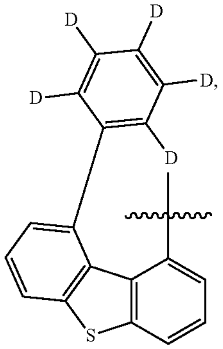
R107
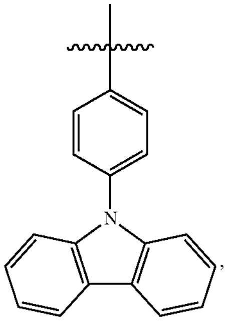
R108
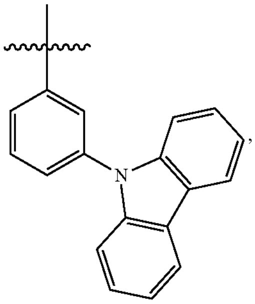
R109
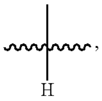
R110
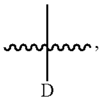
R111
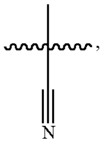
R112
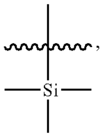
R113
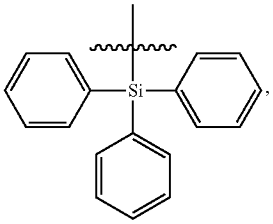
R114
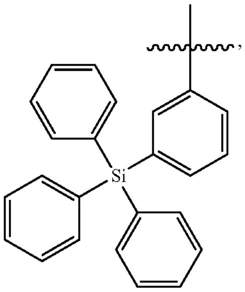
R115
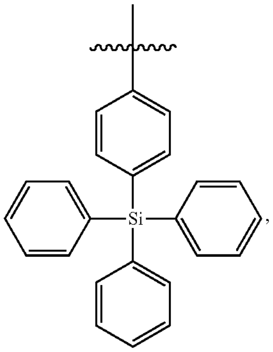
R116
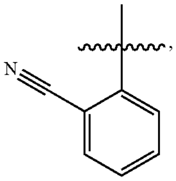

-continued
R117
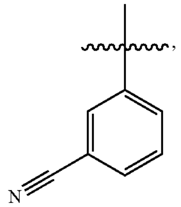
R118
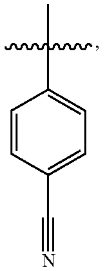
R119
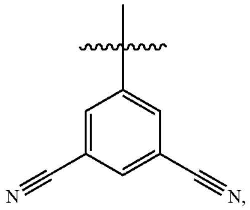
R120
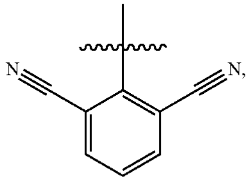
R121
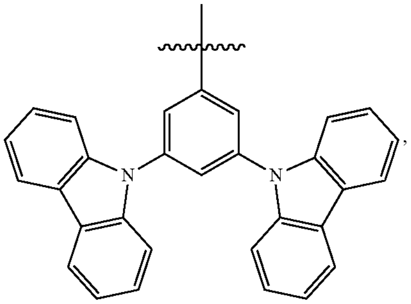
R122
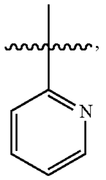
-continued
R123
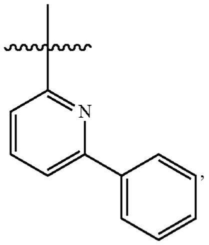
R124
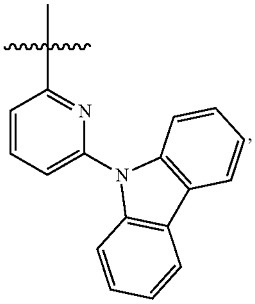
R125
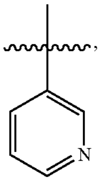
R126
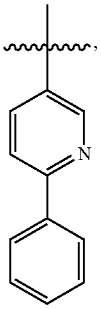
R127
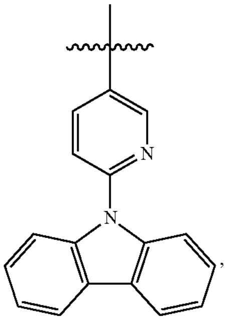
R128
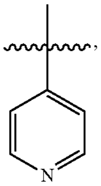

R129
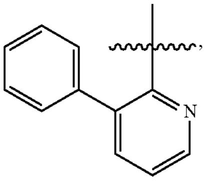
R130
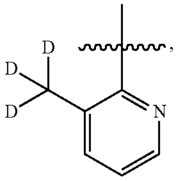
R131
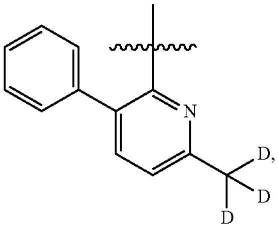
R132
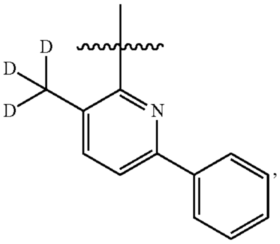
R133
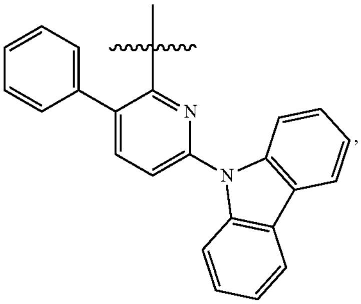
R134
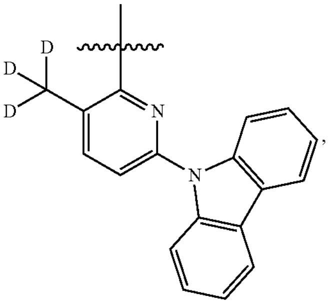
R135
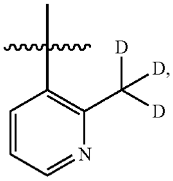
R136
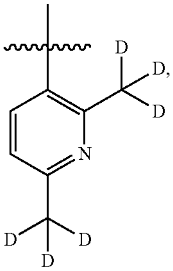
R137
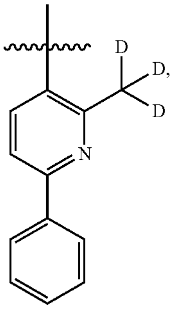
R138
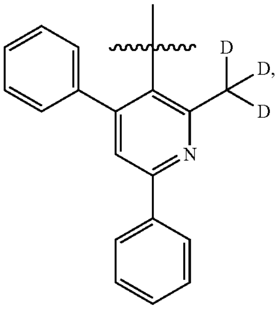
R139
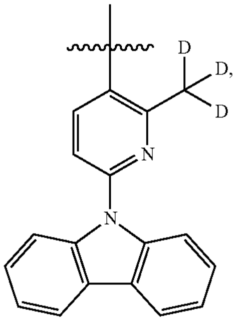

R140
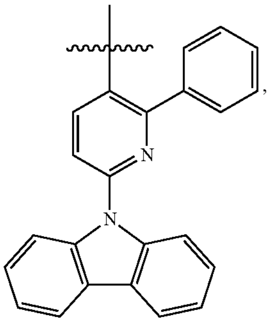
R141
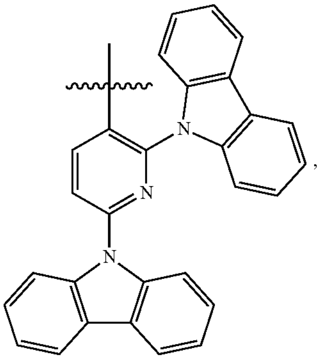
R142
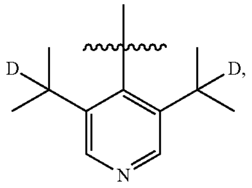
R143
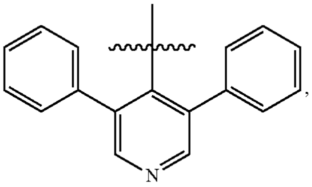
R144
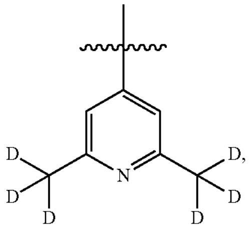
R145
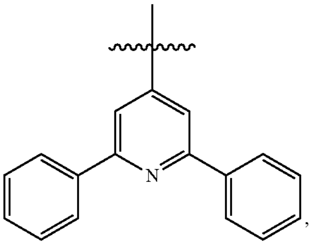
R146
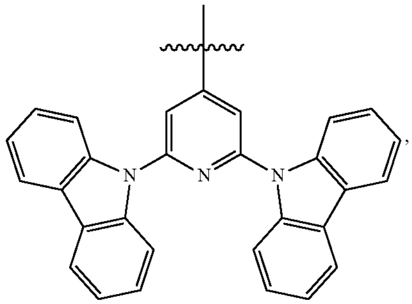
R147
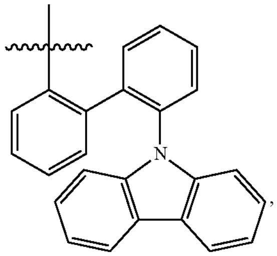
R148
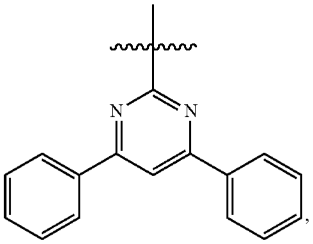
R149
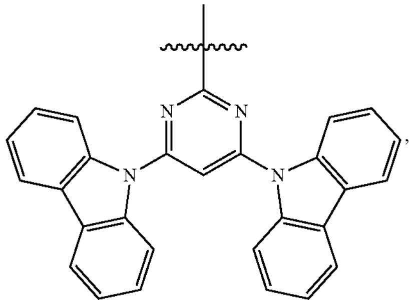
R150
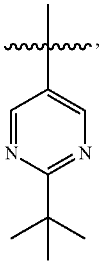

-continued
R151
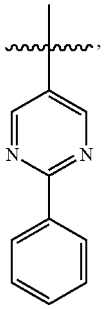
R152
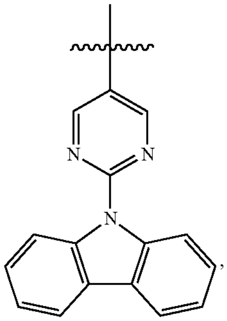
R153
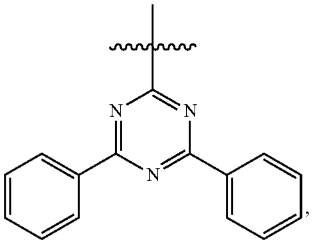
R154
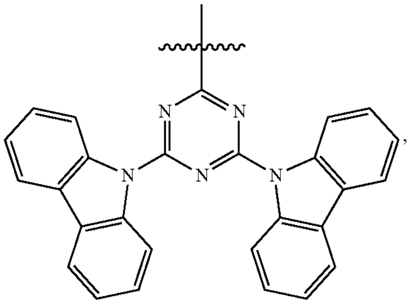
R155
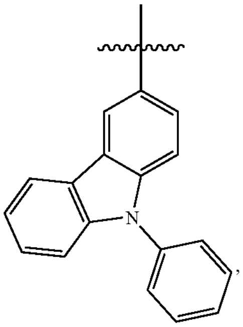
-continued
R156
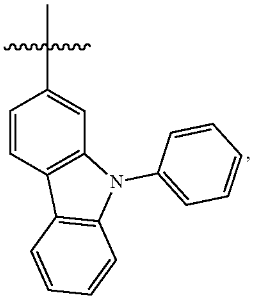
R157
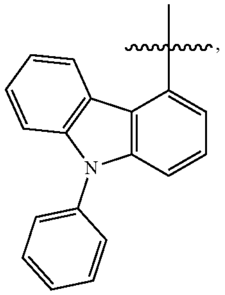
R158
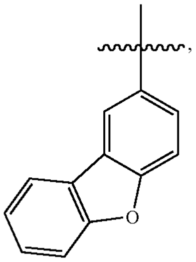
R159
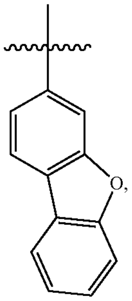
R160
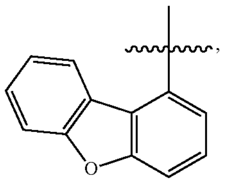
R161
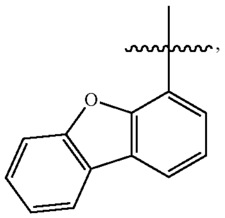

-continued
R162
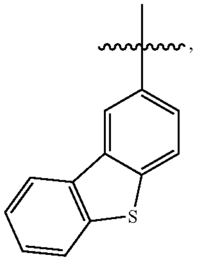
R163
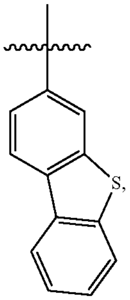
R164
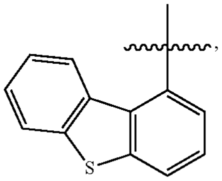
R165
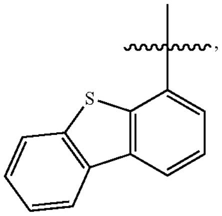
R166
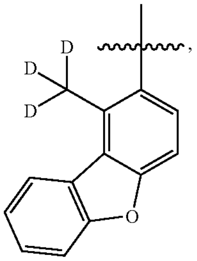
R167
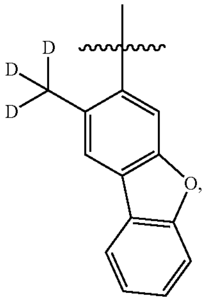
-continued
R168
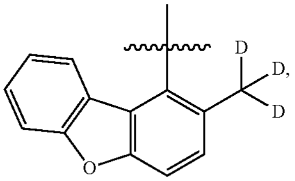
R169
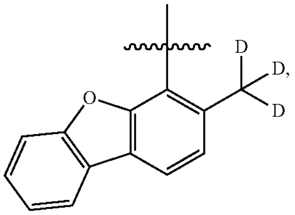
R170
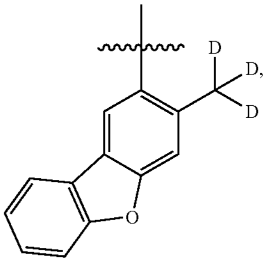
R171
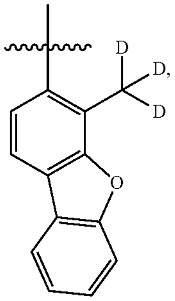
R172
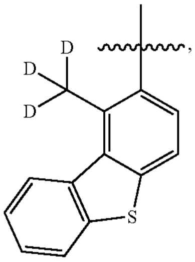
R173
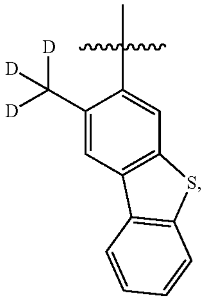

-continued
R174
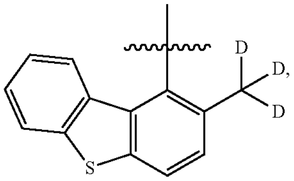
R175
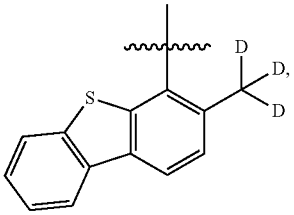
R176
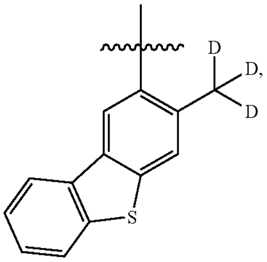
R177
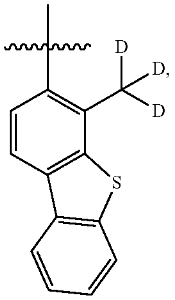
R178
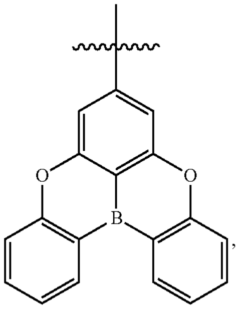
R179
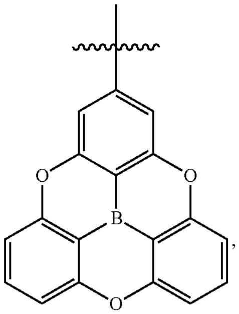
-continued
R180
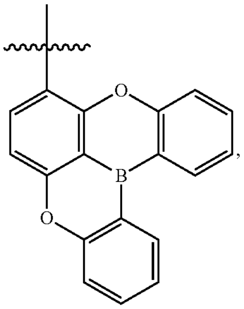
R181
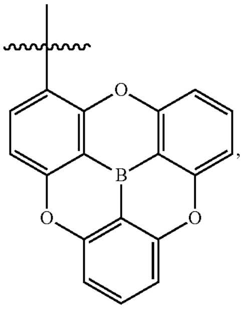
R182
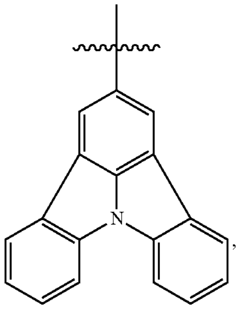
R183
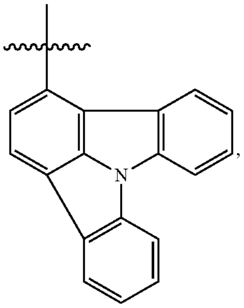
R184
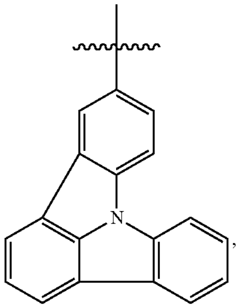

-continued
R185
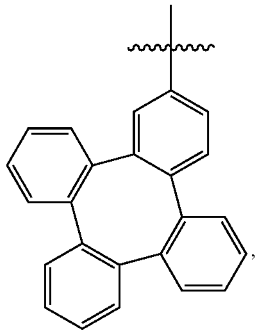
R186
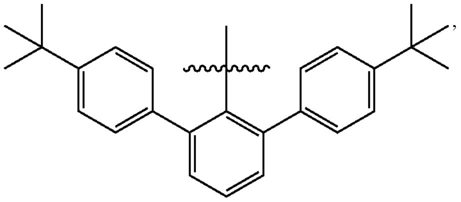
R187
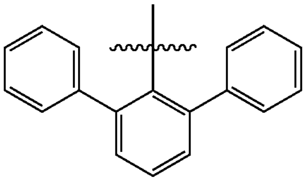
R188
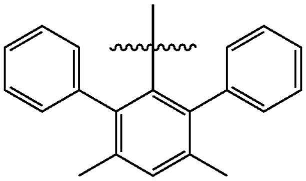
R189
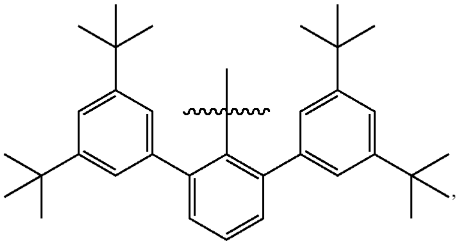
R190
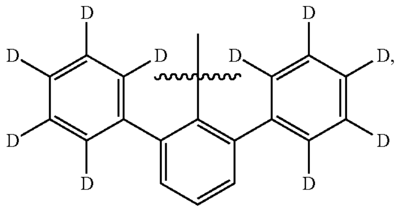
R191
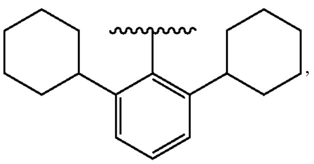
-continued
R192
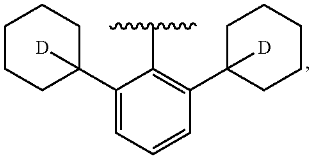
R193
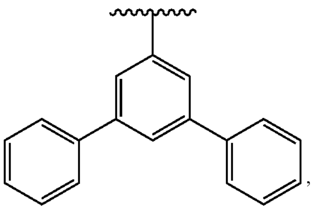
R194
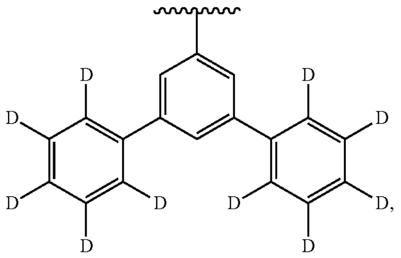
R195
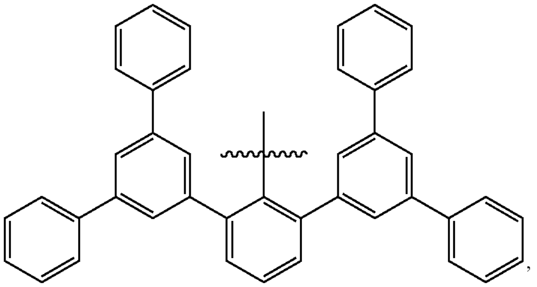
R196
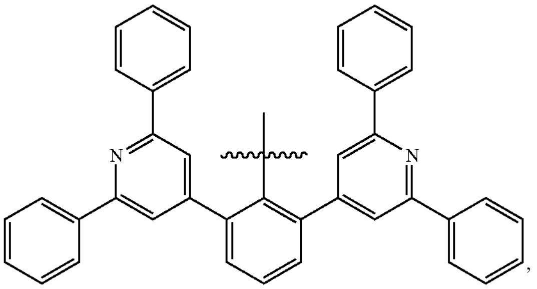
R197
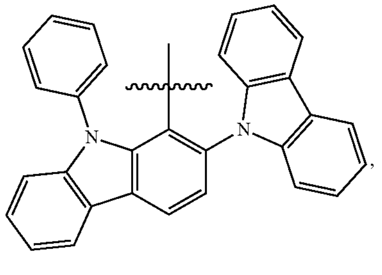

-continued
R198
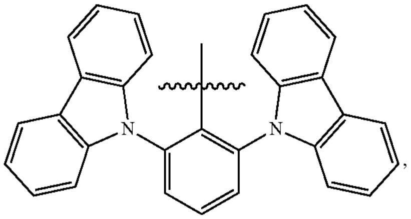
R199
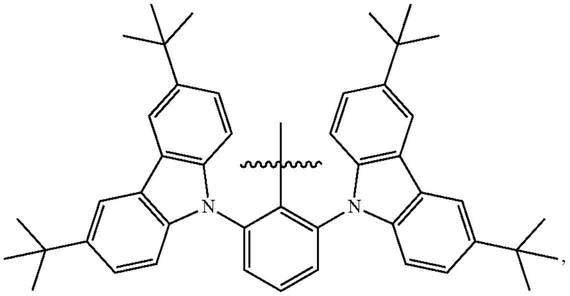
R200
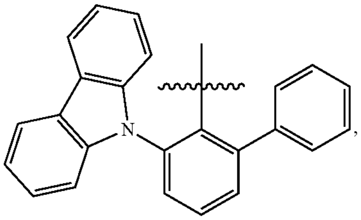
R201
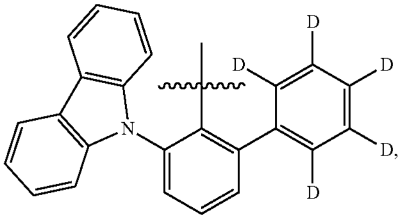
R202
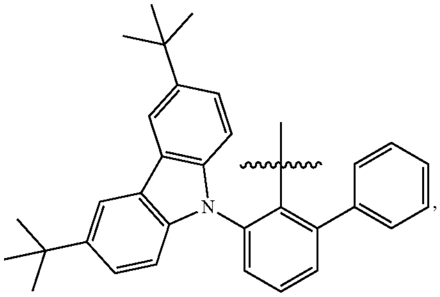
R203
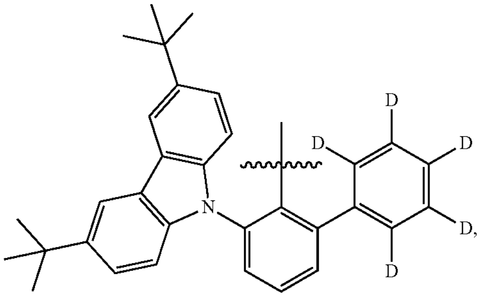
-continued
R204
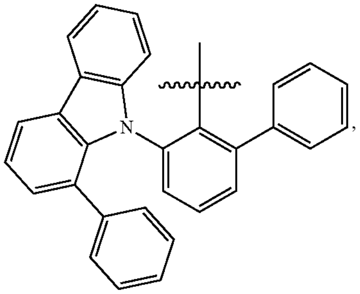
R205
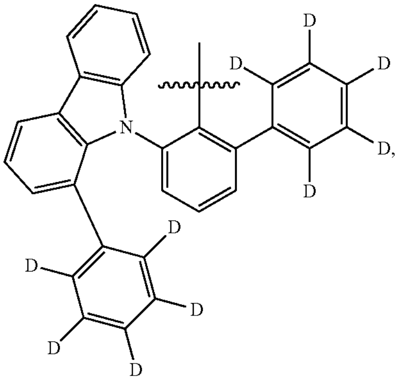
R206
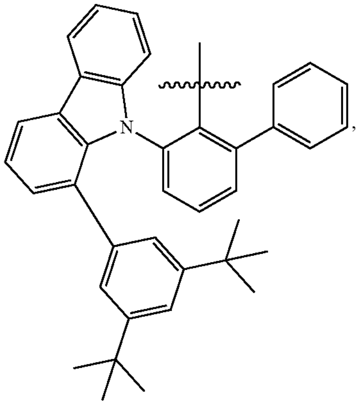
R207
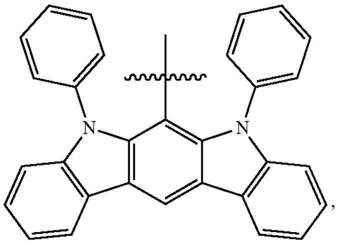
R208
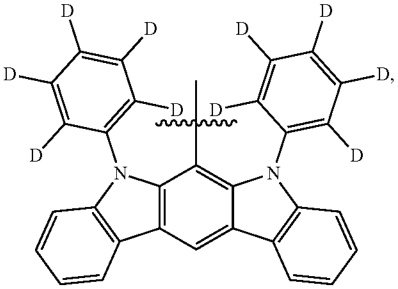

-continued
R209
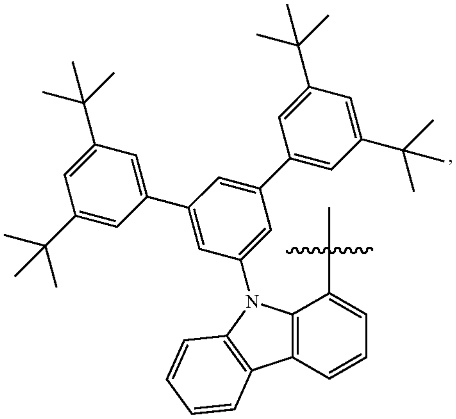
R210
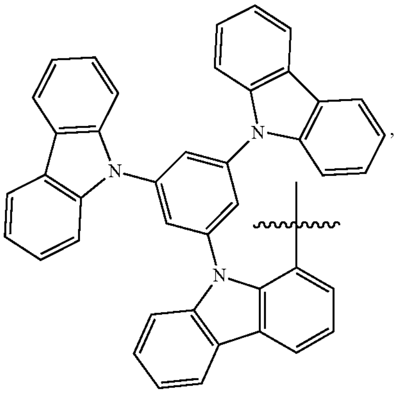
R211
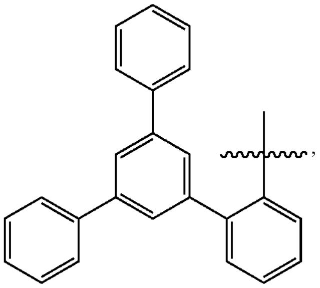
R212
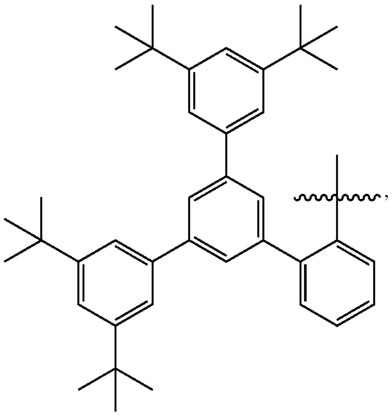
-continued
R213
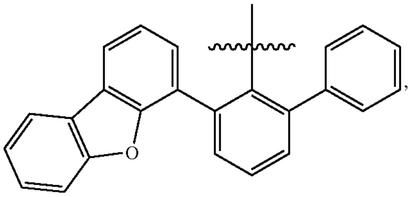
R214
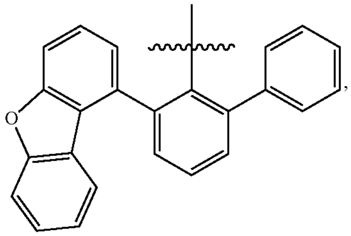
R215
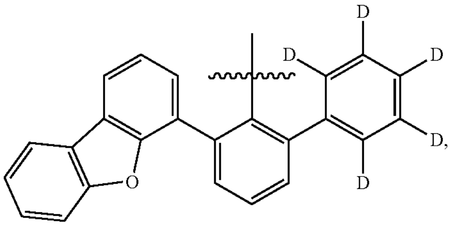
R216
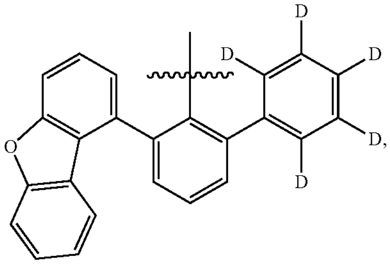
R217
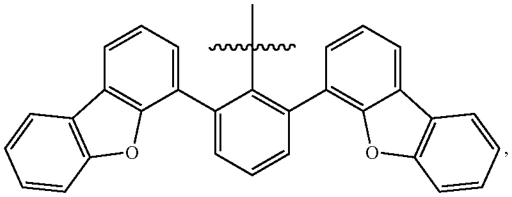
R218
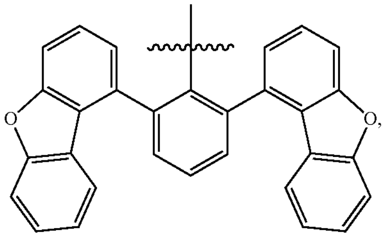
R219
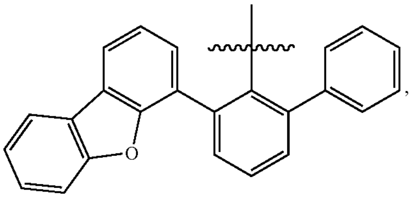

-continued
R220
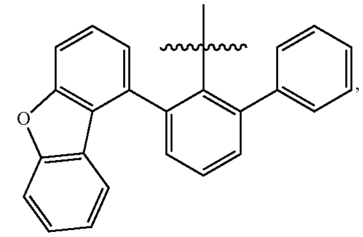
,
R221
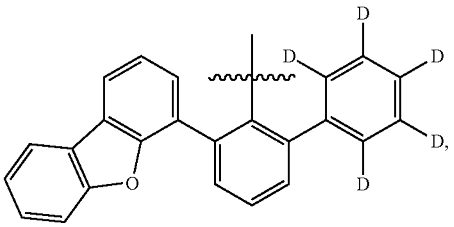
,
R222
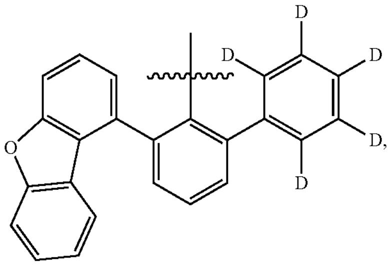
,
R223
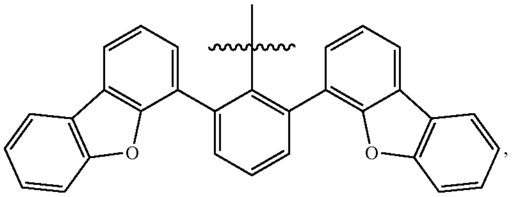
,
R224
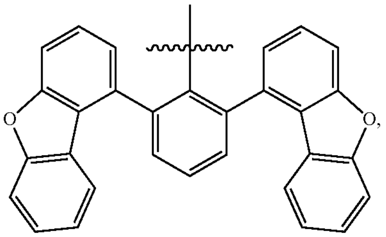
,
R225
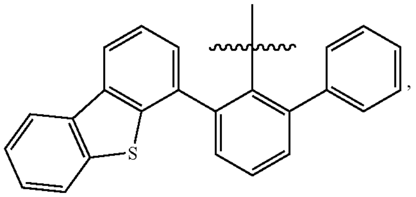
,
-continued
R226
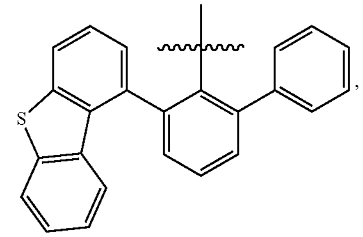
,
R227
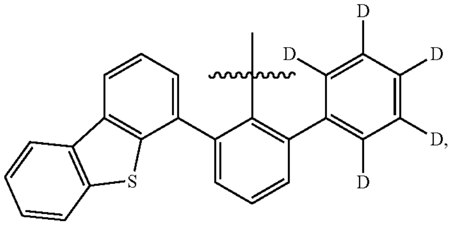
,
R228
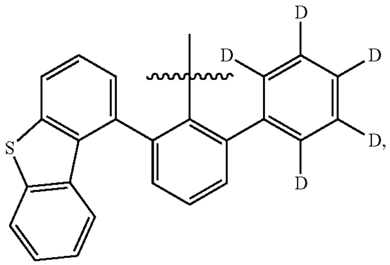
,
R229
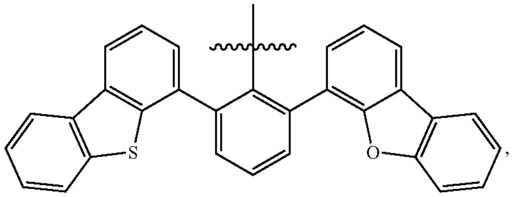
,
R230
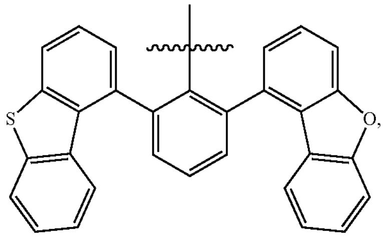
,
R231
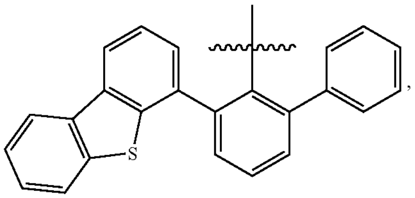
, -continued
R232
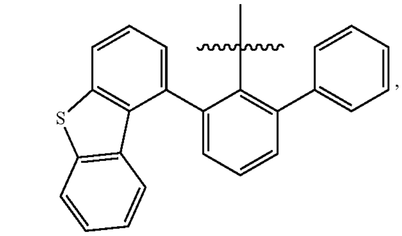
R233
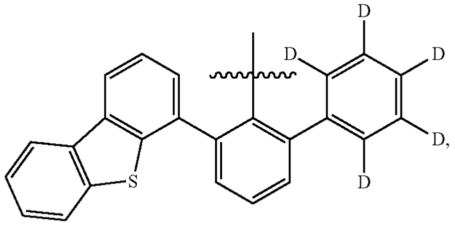
R234
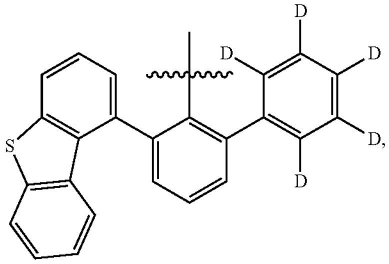
R235
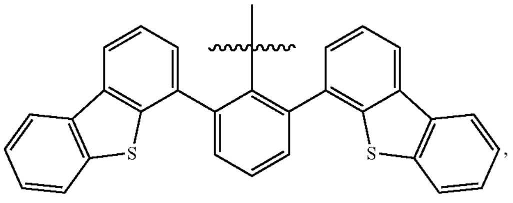
R236
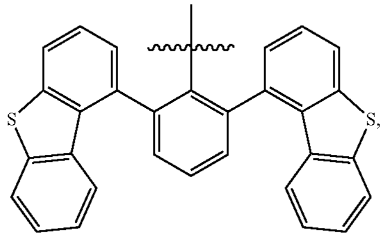
R237
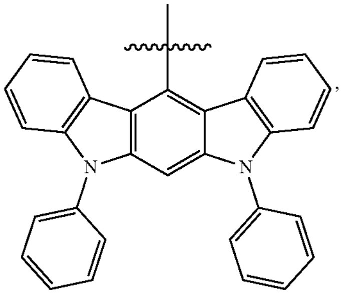
-continued
R238
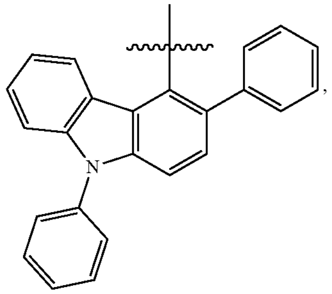
R239
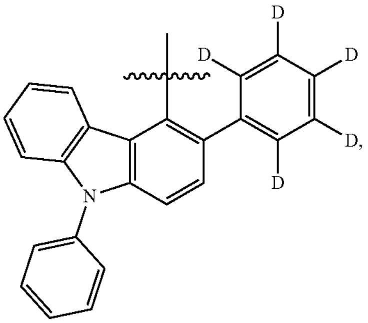
R240
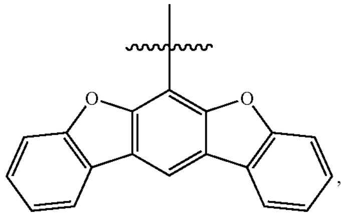
R241
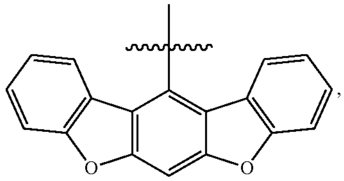
R242
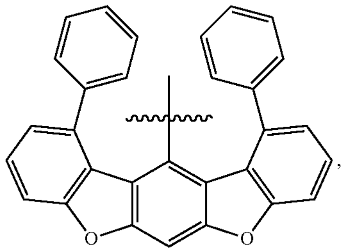
R243
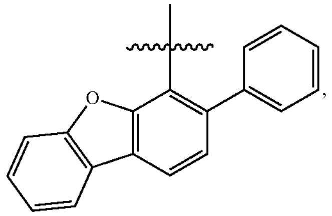

-continued
R244
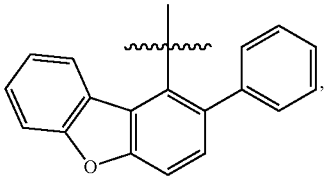
,
R245
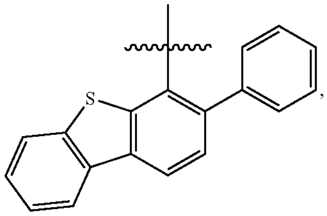
,
R246
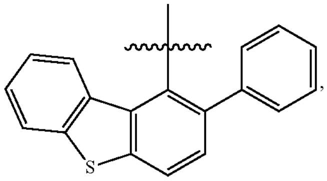
,
R247
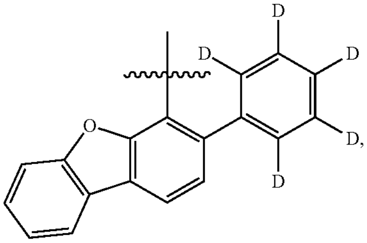
,
R248
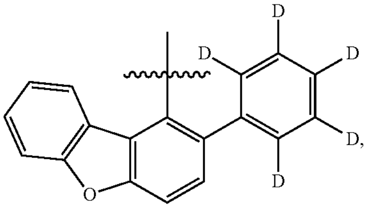
,
R249
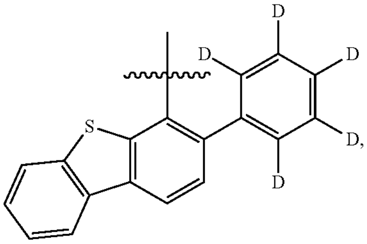
,
R250
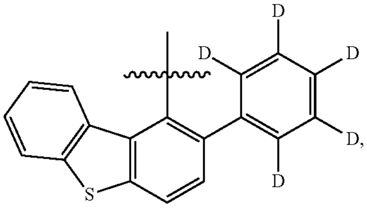
,
-continued
R251
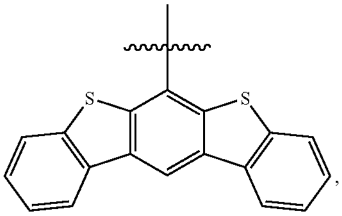
,
R252
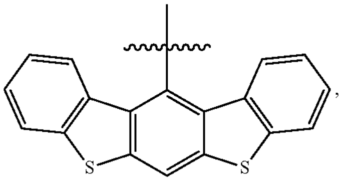
,
R253
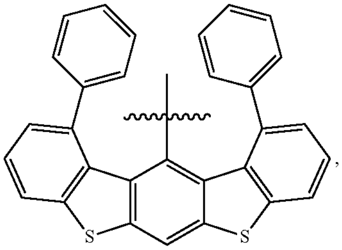
,
R254
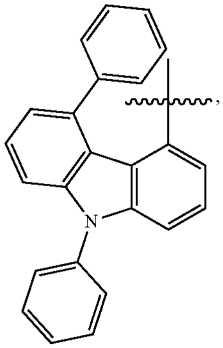
,
R255
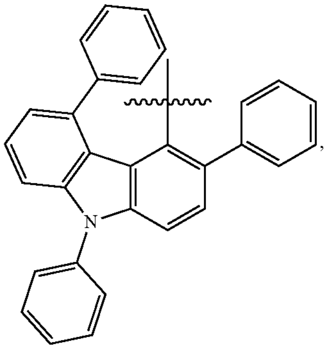
, -continued
R256
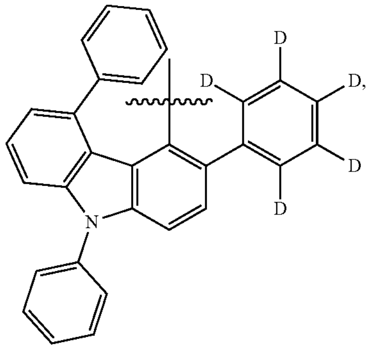
R257
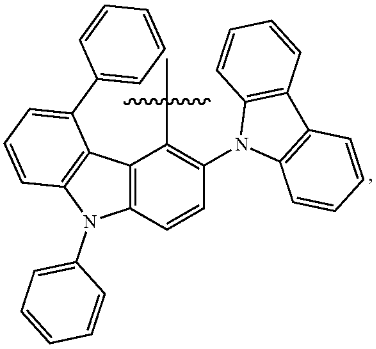
R258
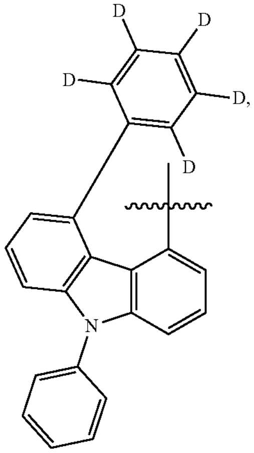
R259
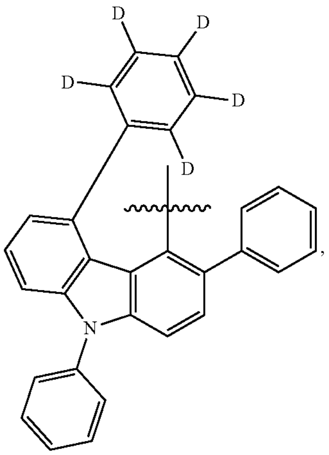
-continued
R260
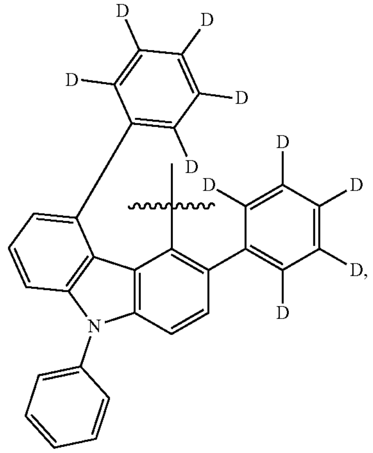
R261
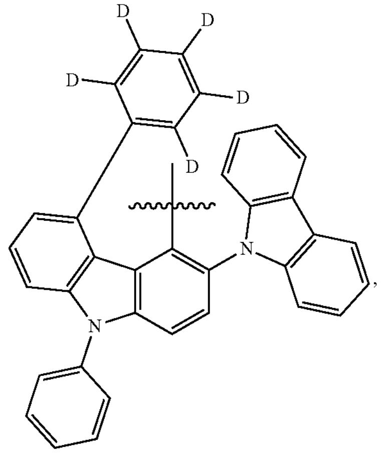
R262
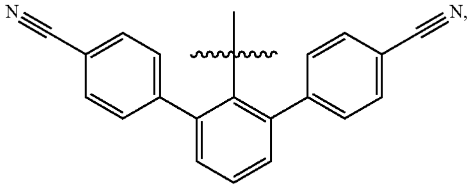
R263
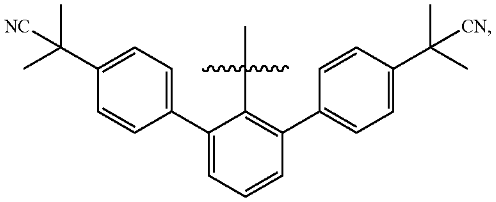

-continued
R264
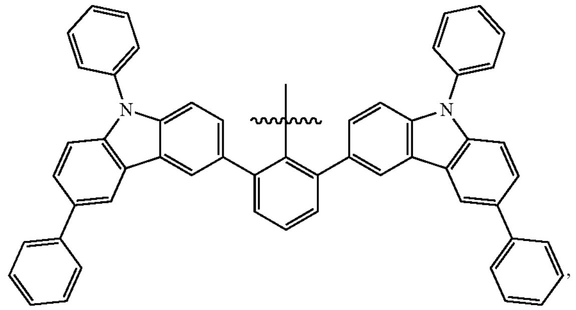
R265
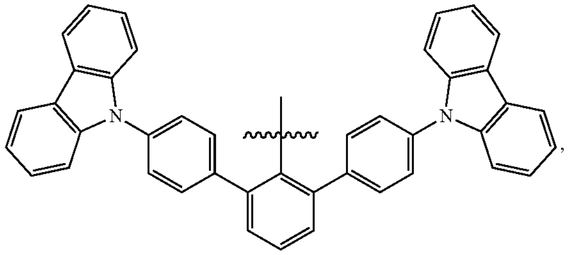
R266
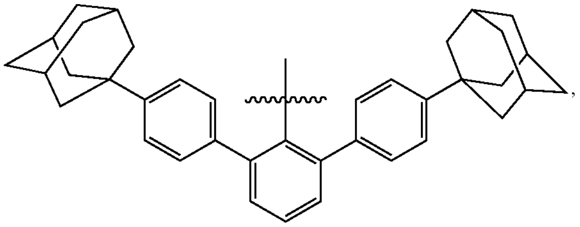
R267
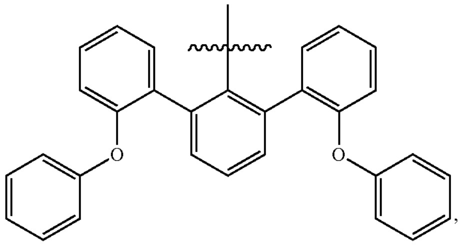
R268
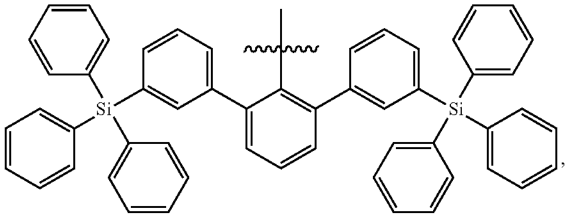
R269
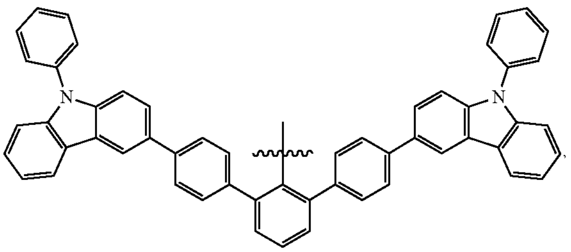
-continued
R270
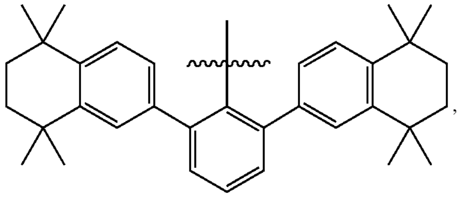
R271
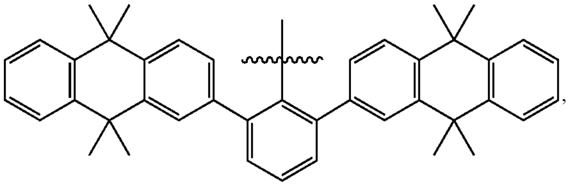
R272
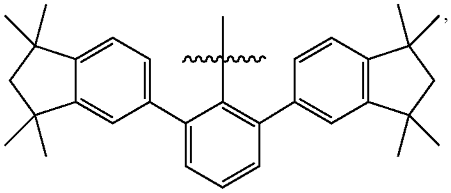
R273
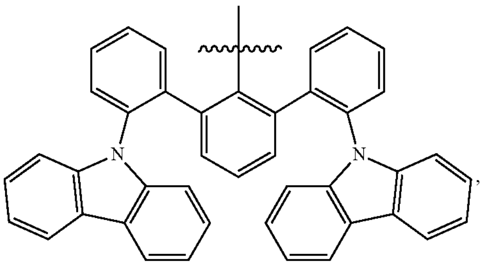
R274
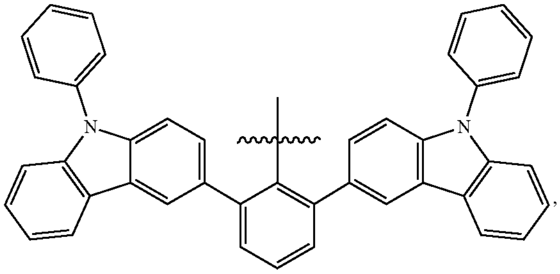
R275
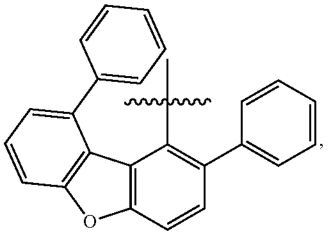

-continued
R276
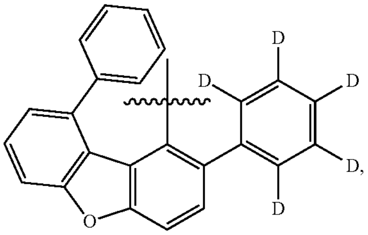
R277
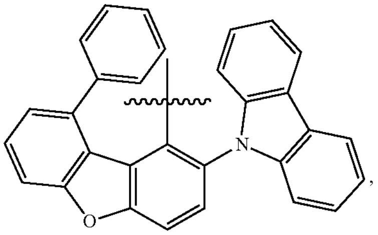
R278
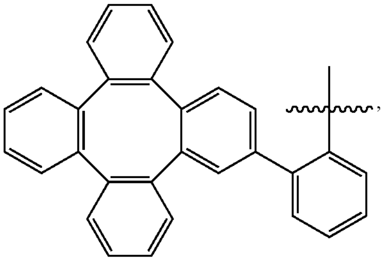
R279
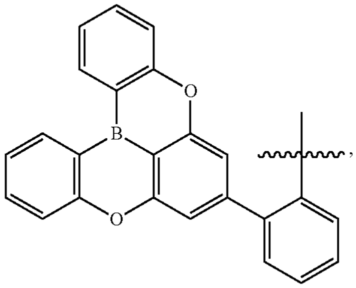
R280
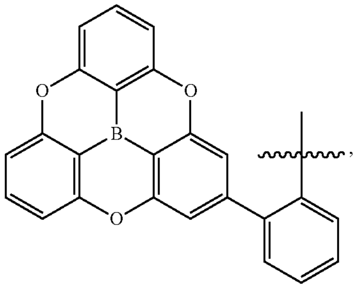
R281
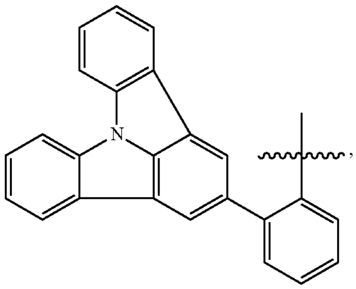
-continued
R282
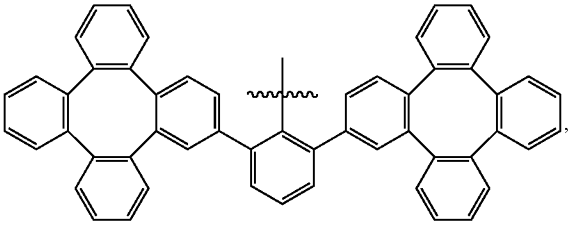
R283
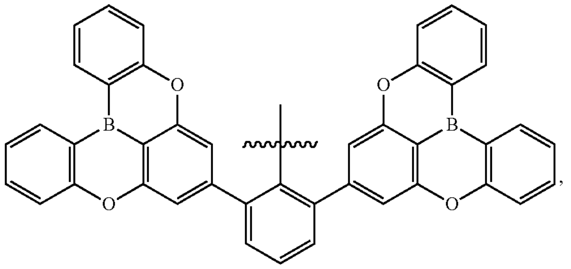
R284
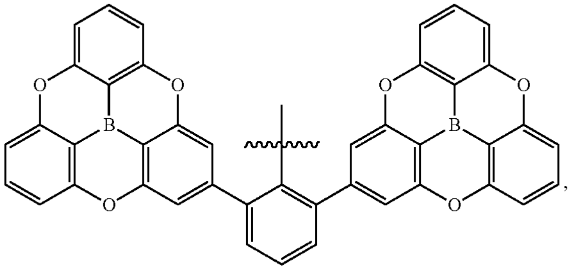
R285
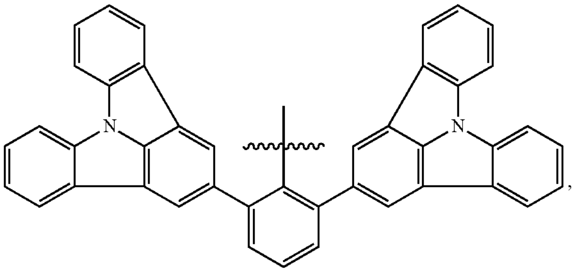
R286
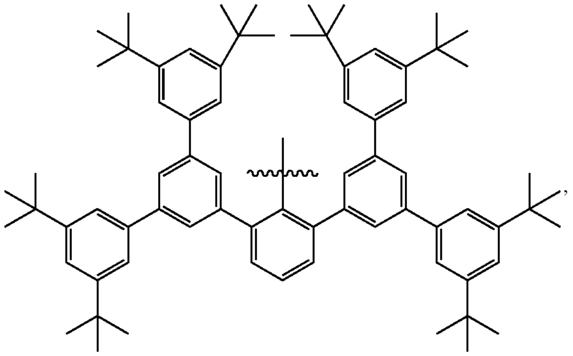

-continued
R287
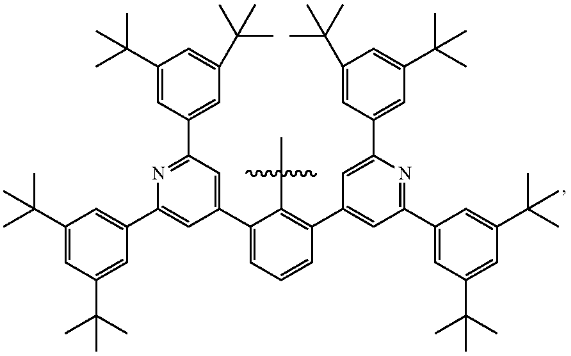
R288
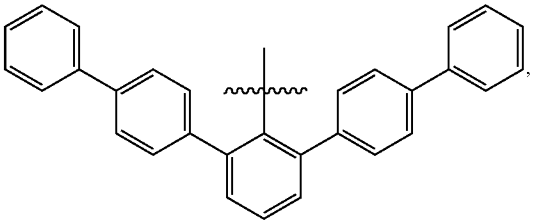
R289
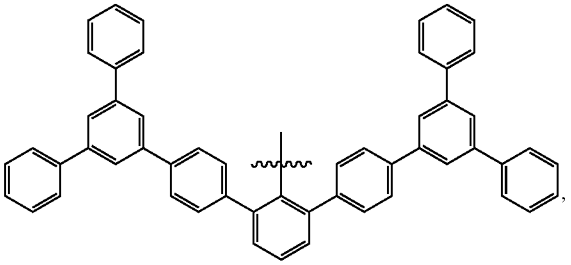
R290
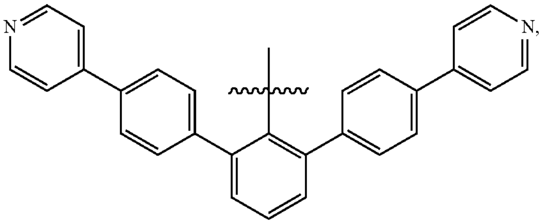
R291
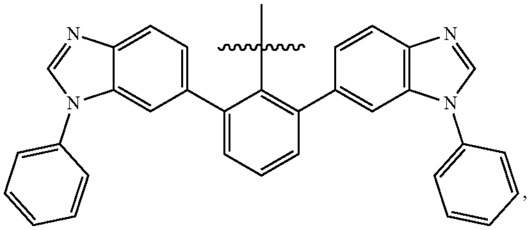
-continued
R292
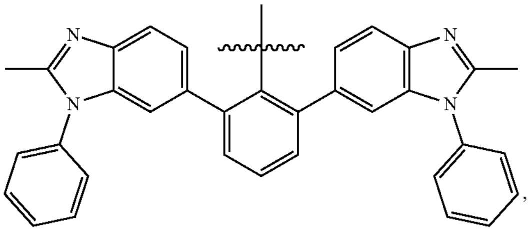
R293
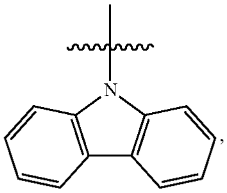
R294
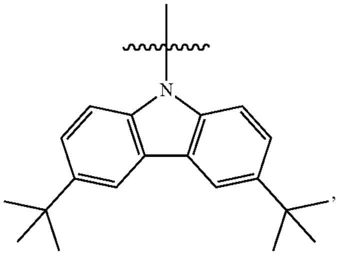
R295
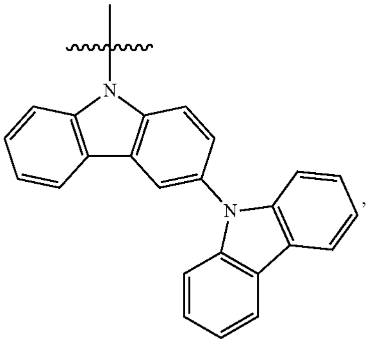
R296
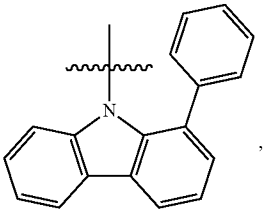
R297
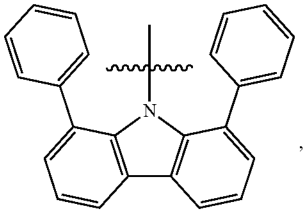
R298
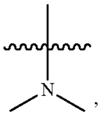

-continued
R299
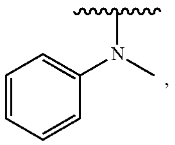
,
R300
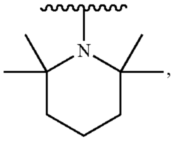
,
R301
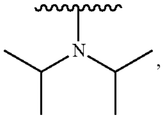
,
R302
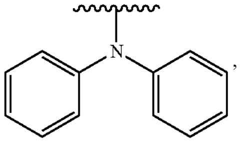
,
R303
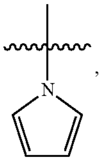
,
R304
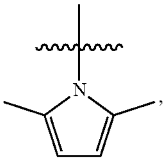
,
R305
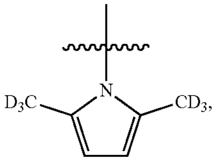
,
R306
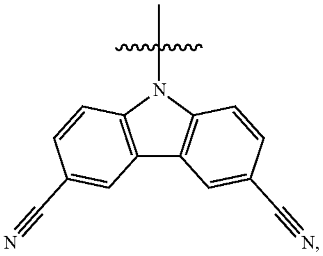
, and
-continued
R307
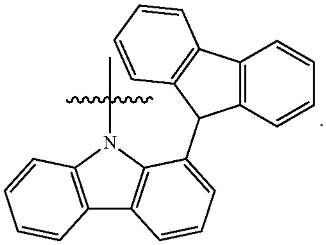
.
13. The compound of claim 6, wherein the compound is selected from the group consisting of:
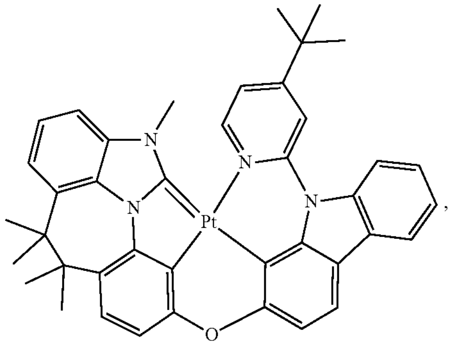
,
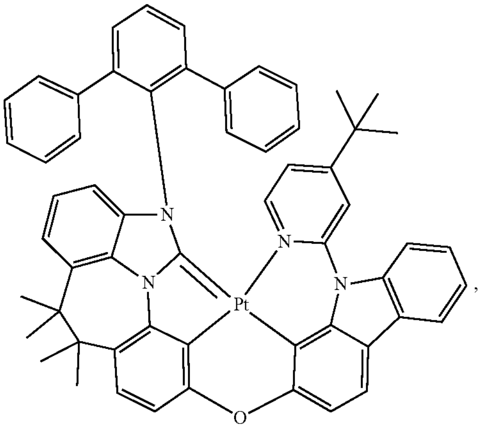
,
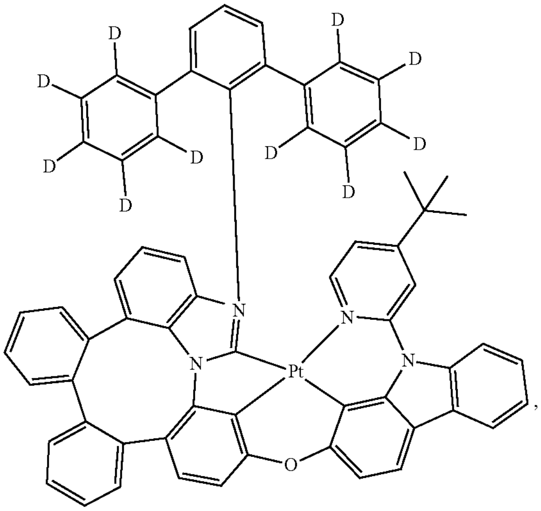
, -continued
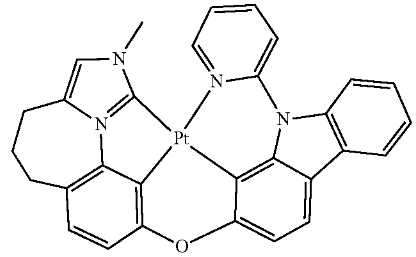
,
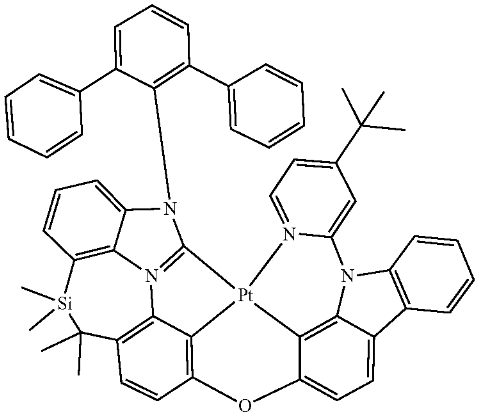
,
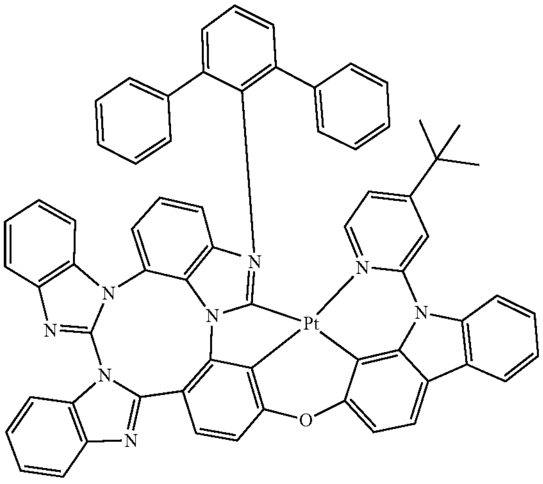
,
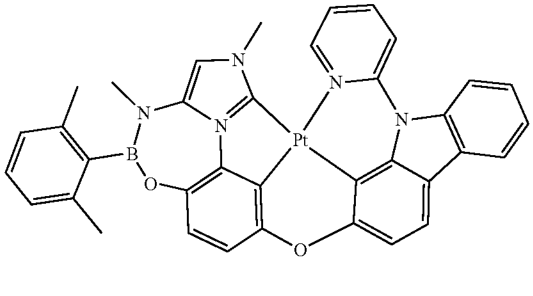
,
-continued
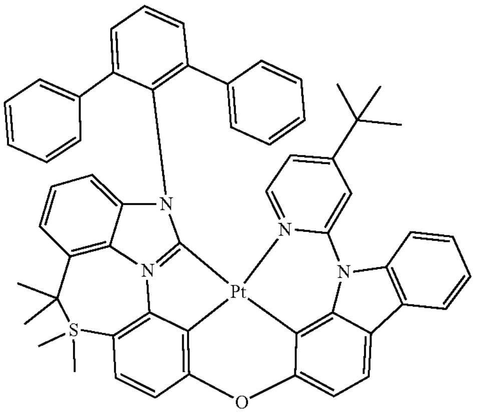
,
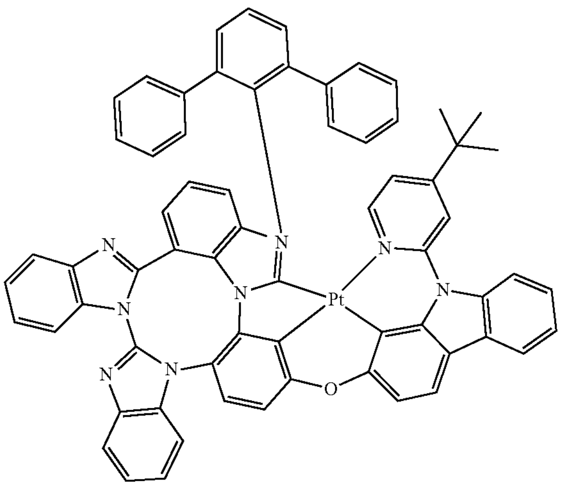
,
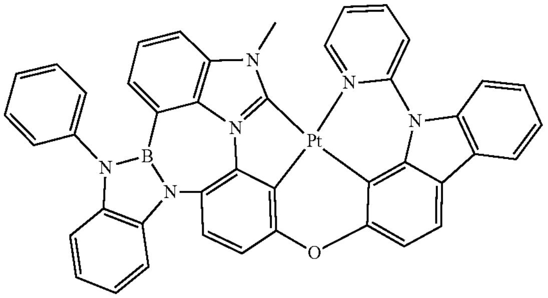
,
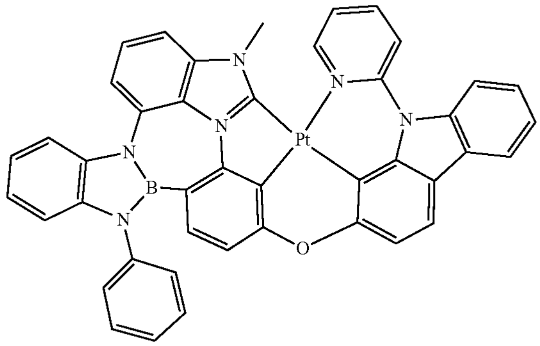
, -continued
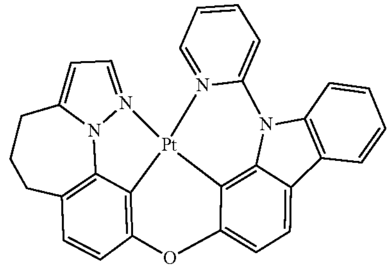
,
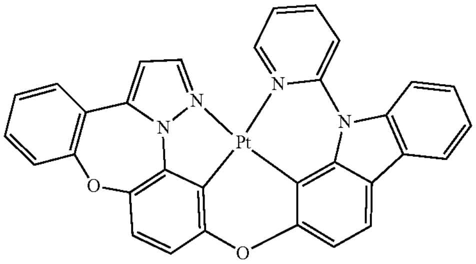
,
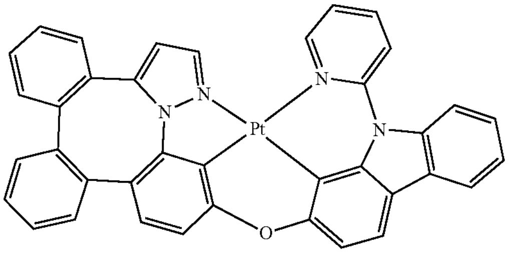
,
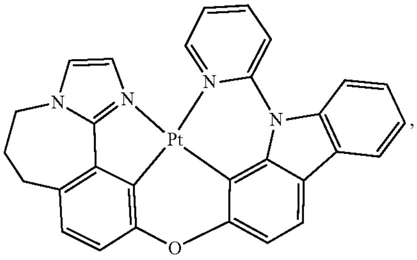
,
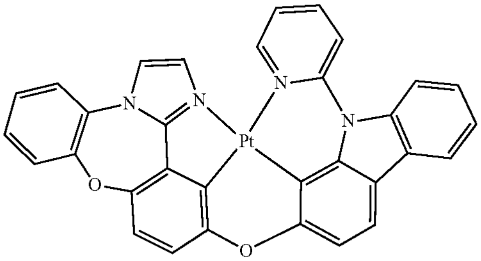
,
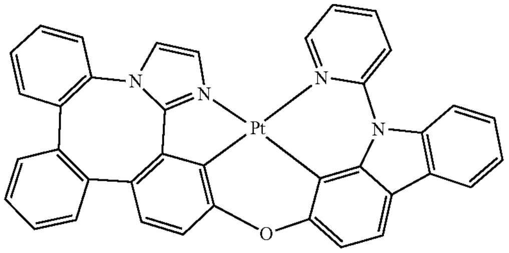
,
-continued
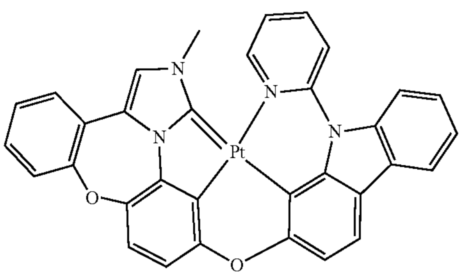
,
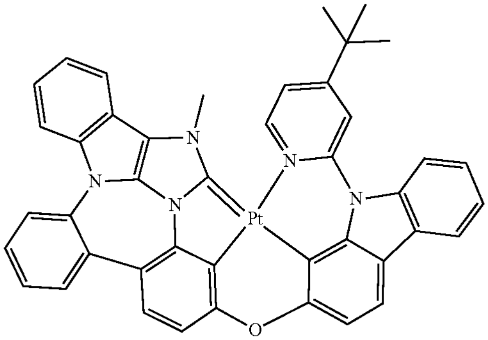
,
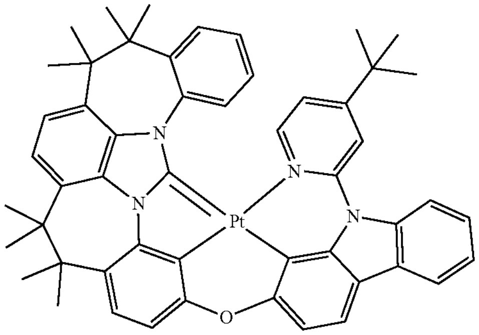
,
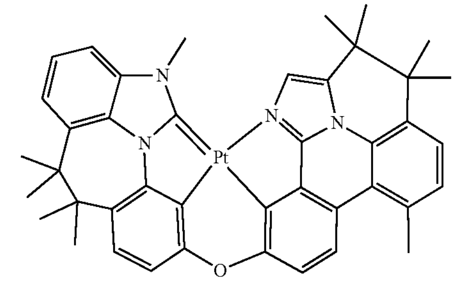
,
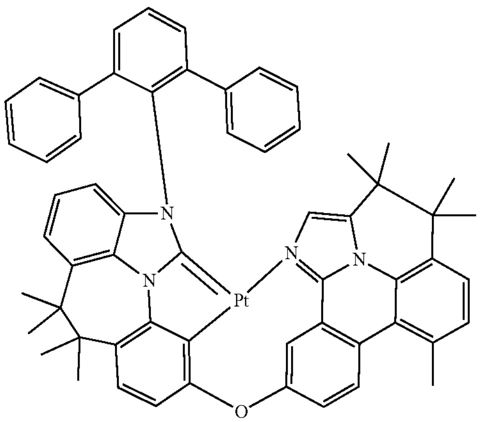
, -continued
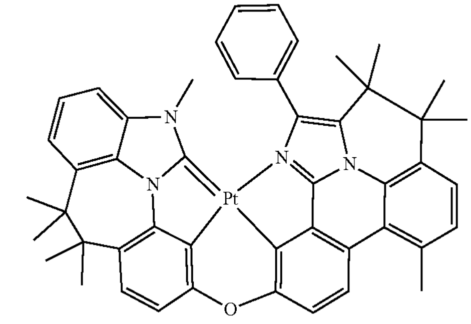
,
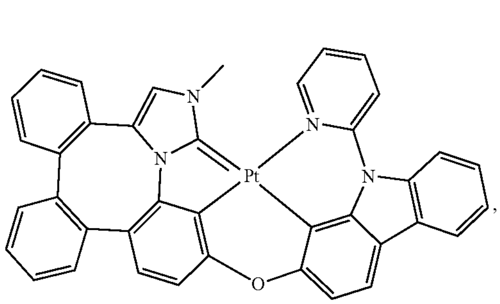
,
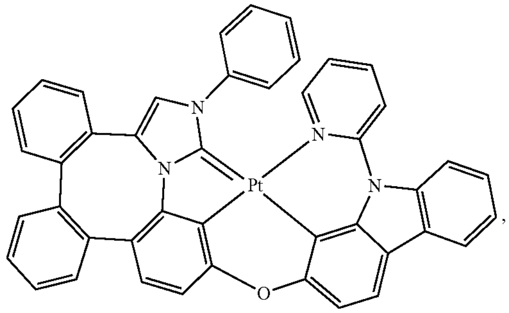
,
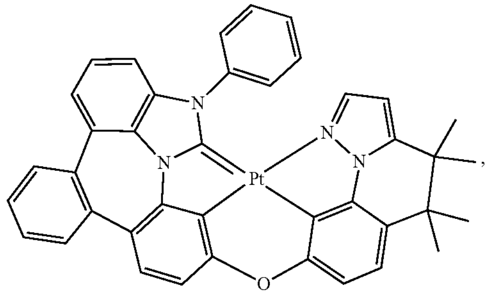
,
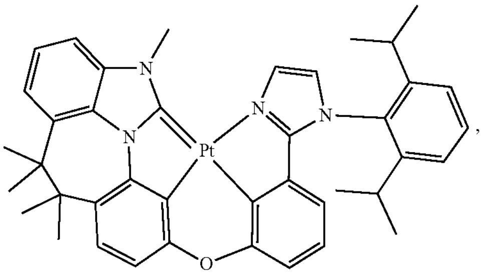
,
-continued
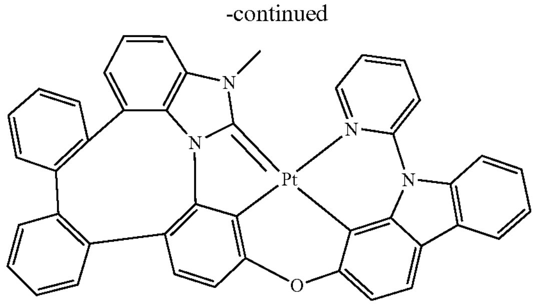
,
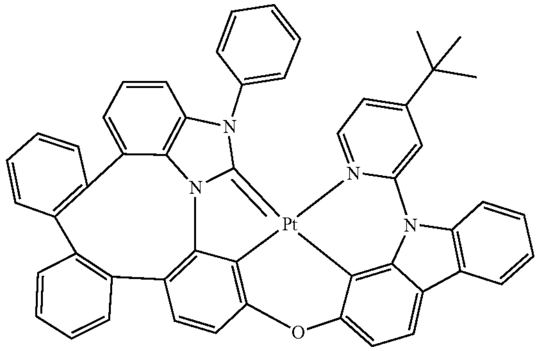
,
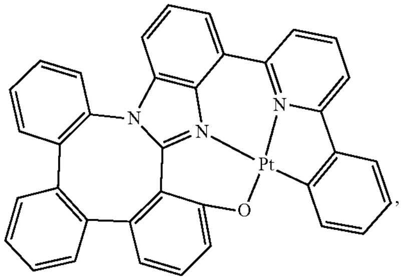
,
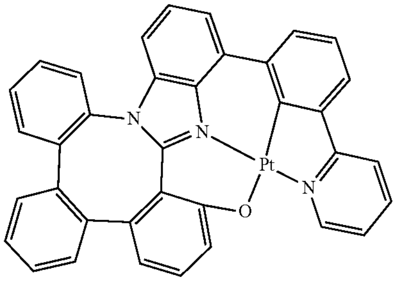
,
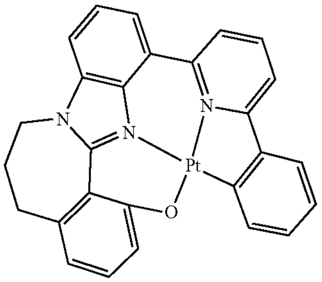
, -continued
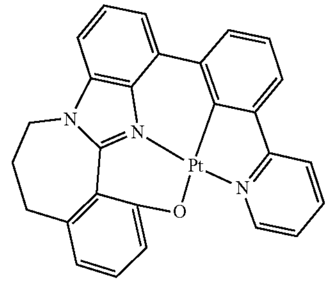
,
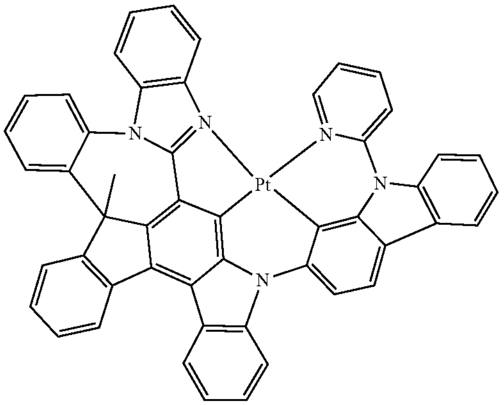
,
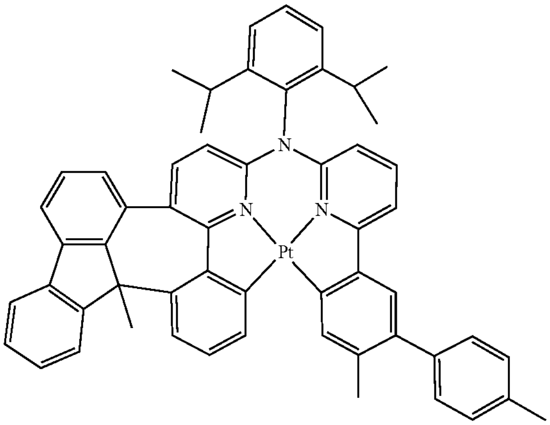
,
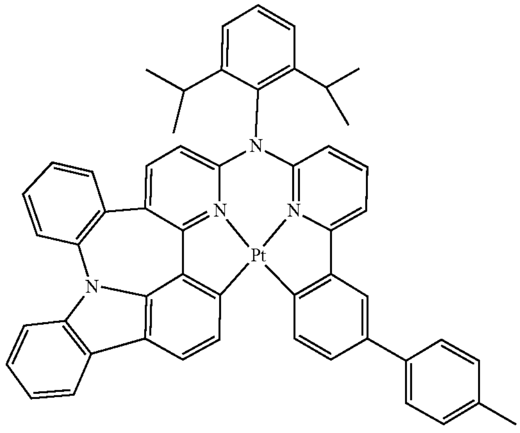
,
-continued
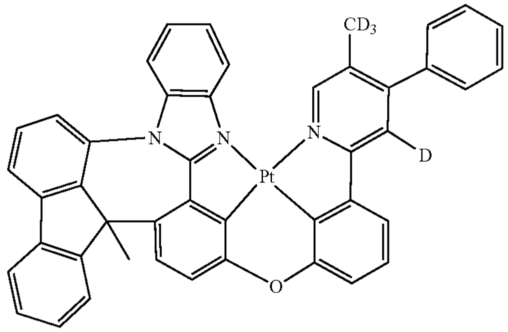
,
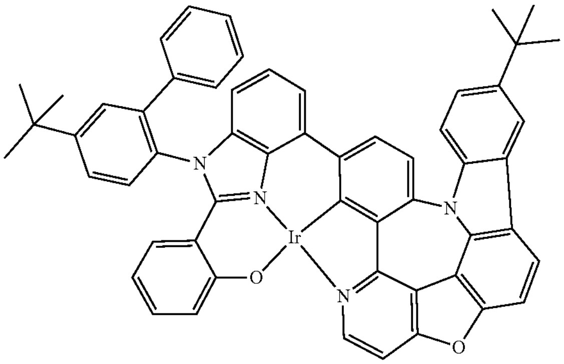
,
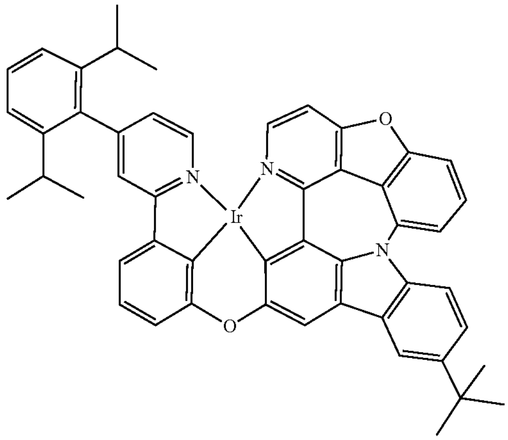
,
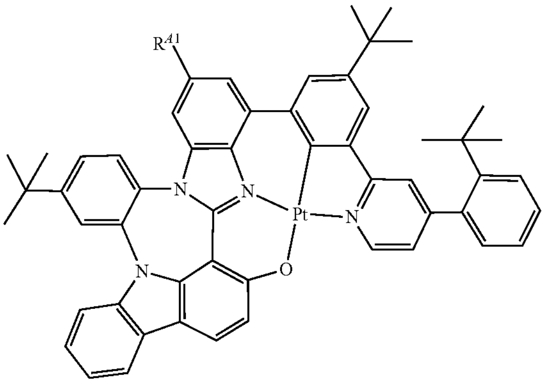
, -continued
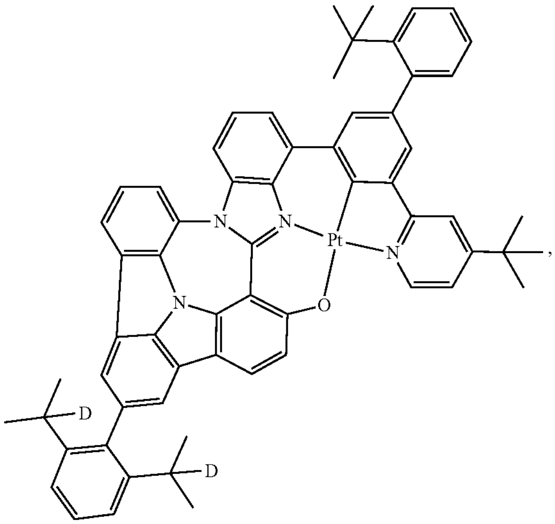
,
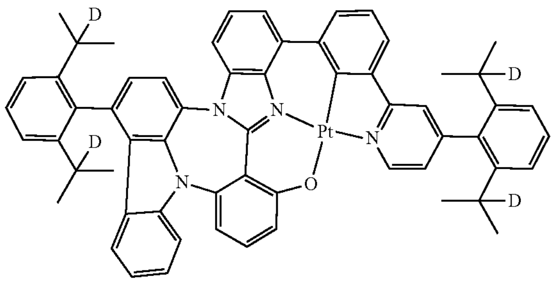
,
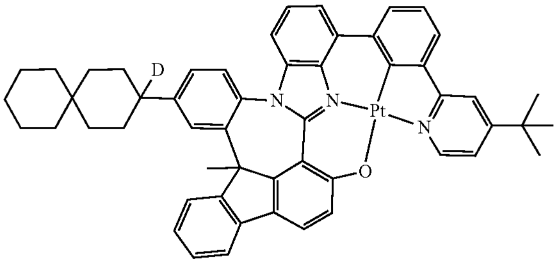
,
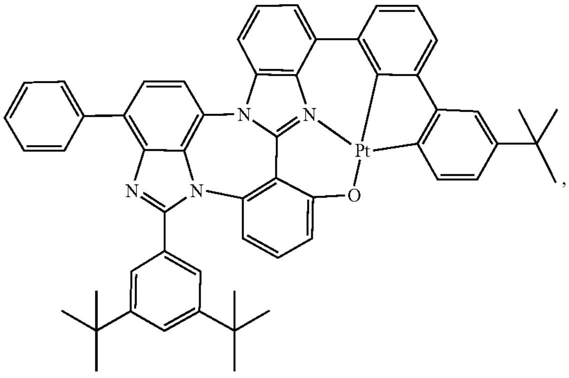
,
-continued
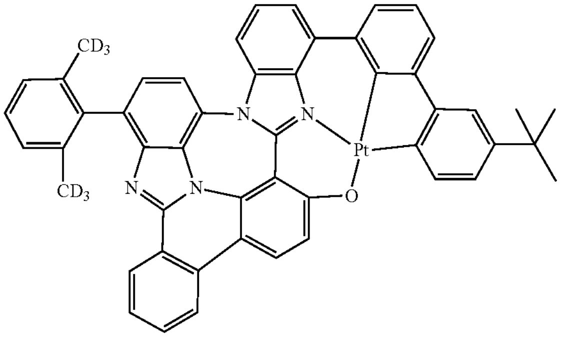
,
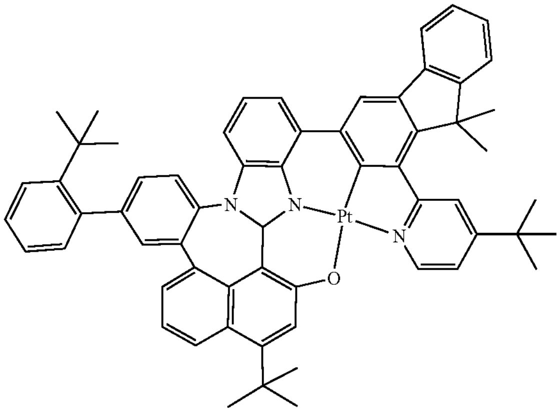
,
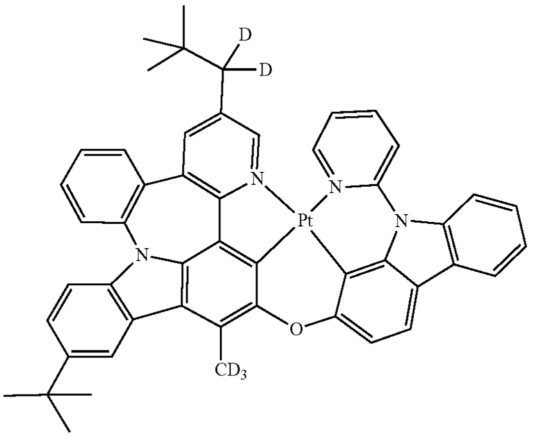
,
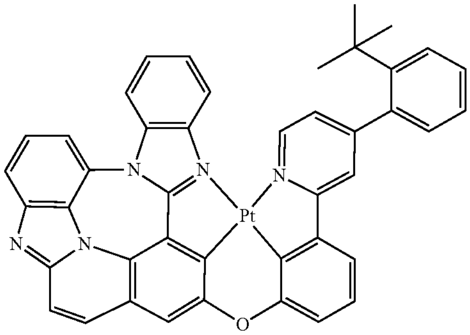
, -continued
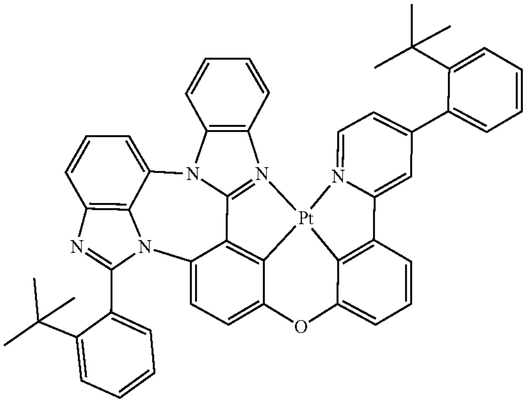
,
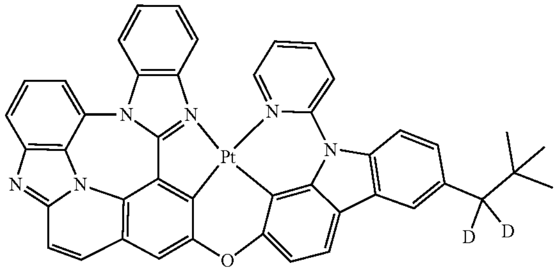
,
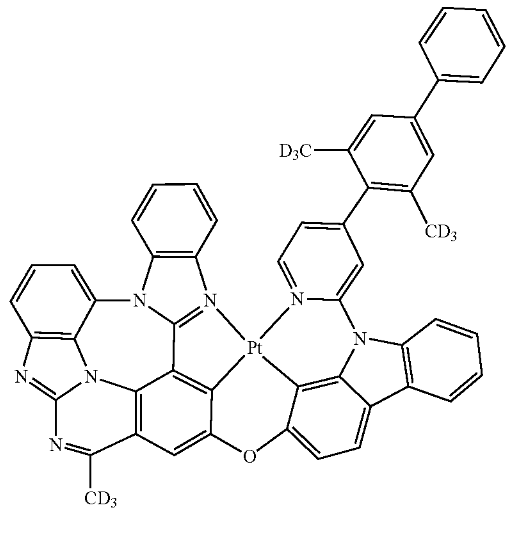
,
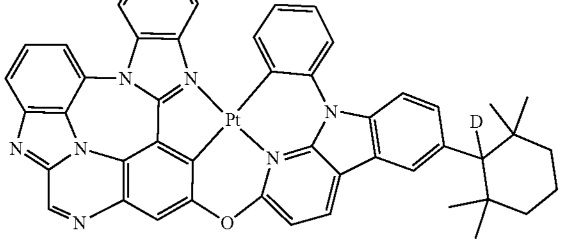
,
-continued
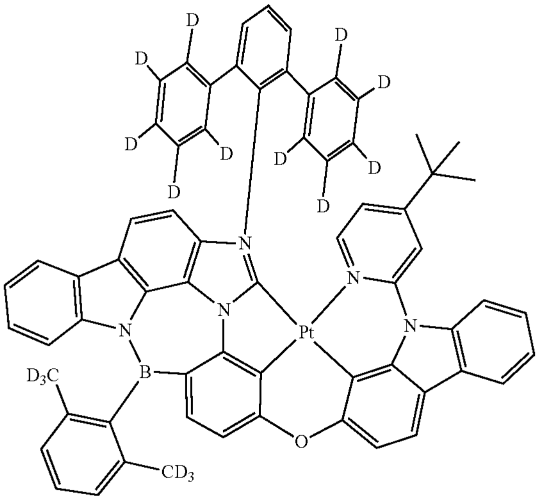
,
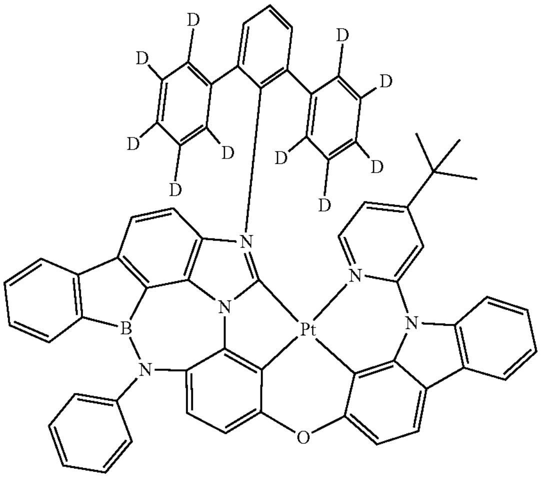
,
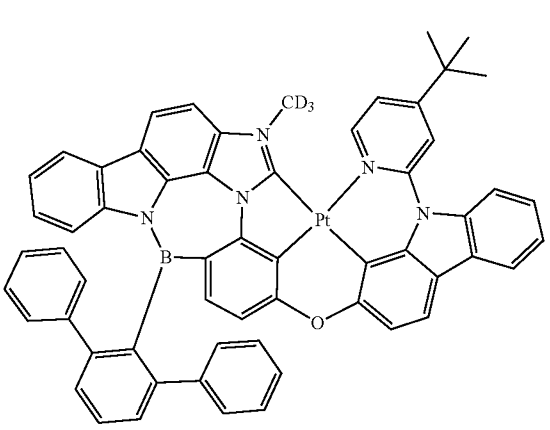
, -continued
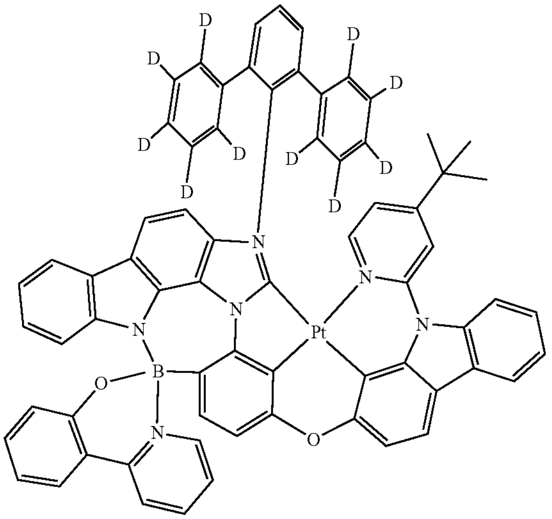
,
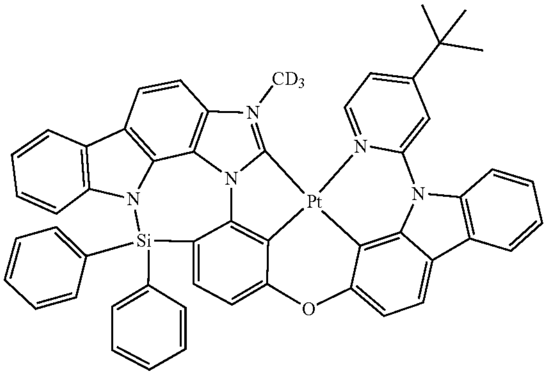
,
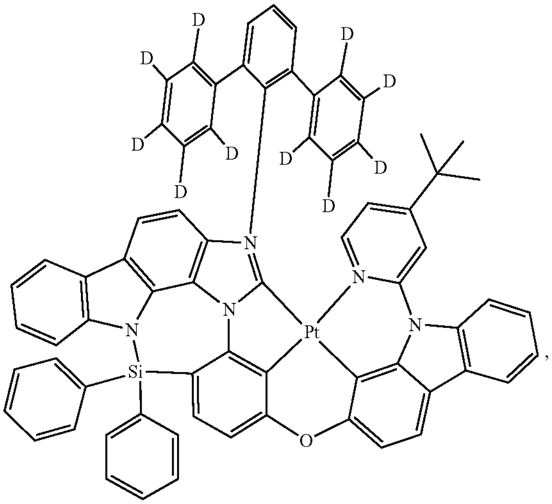
,
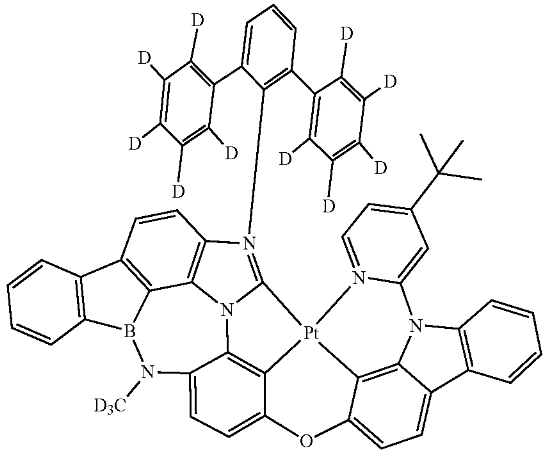
,
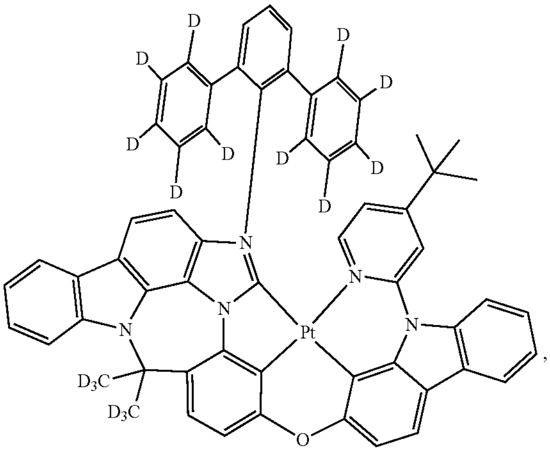
,
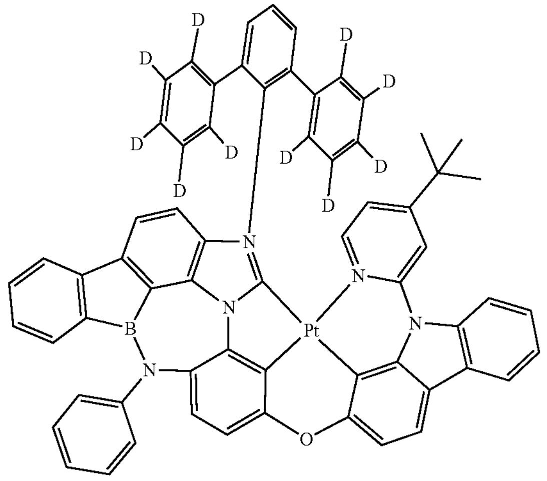
, -continued
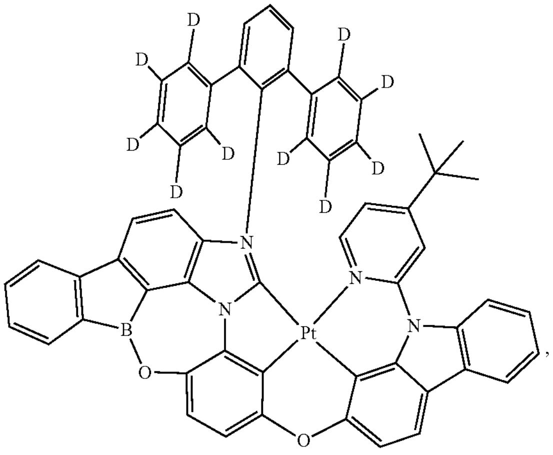
,
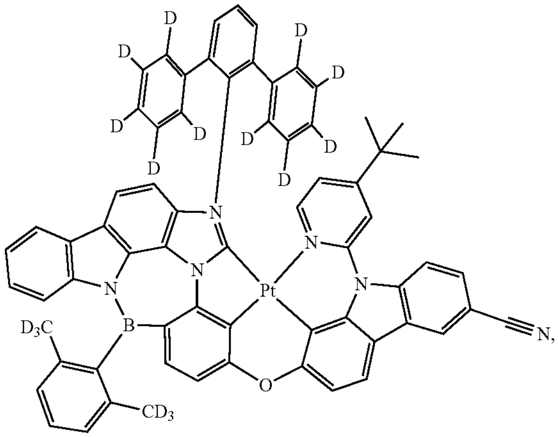
,
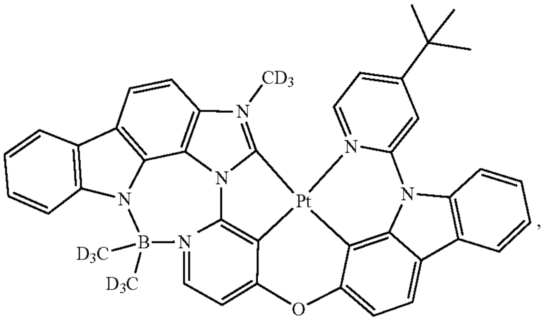
,
-continued
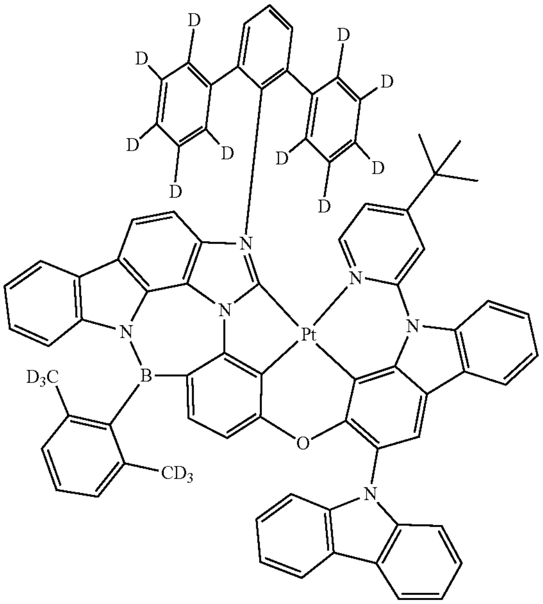
,
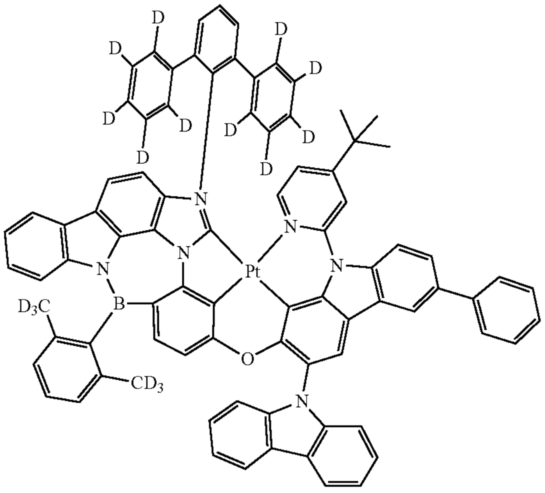
,
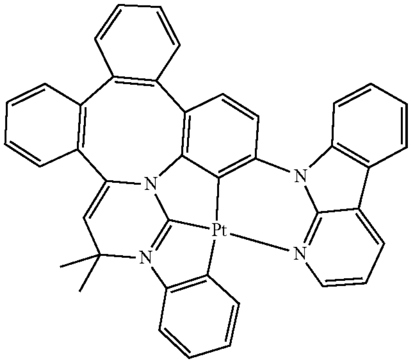
, -continued
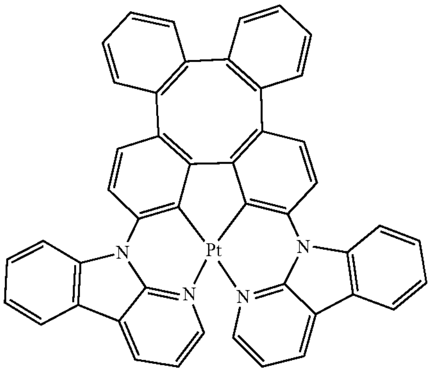
,
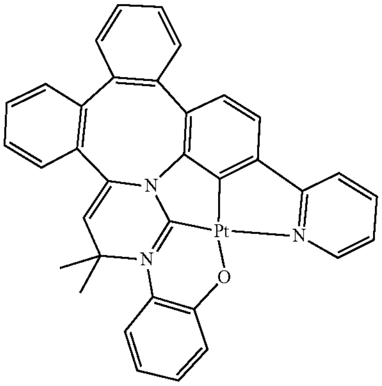
,
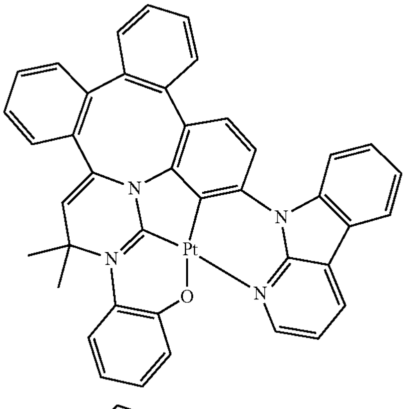
,
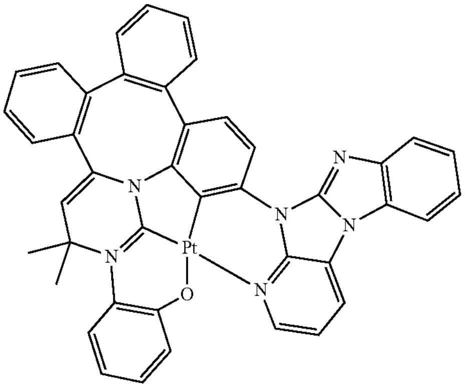
,
-continued
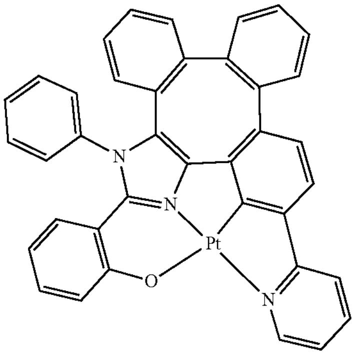
,
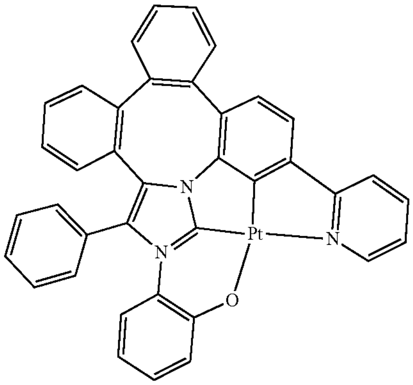
,
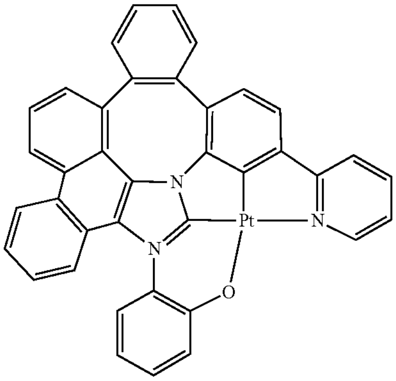
,
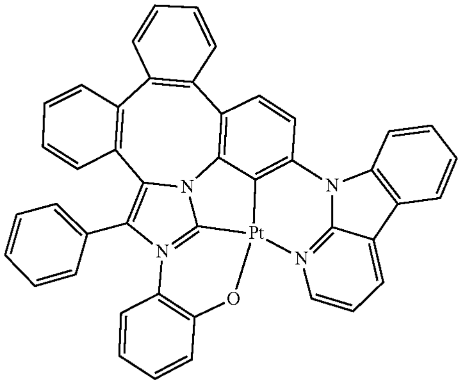
, -continued
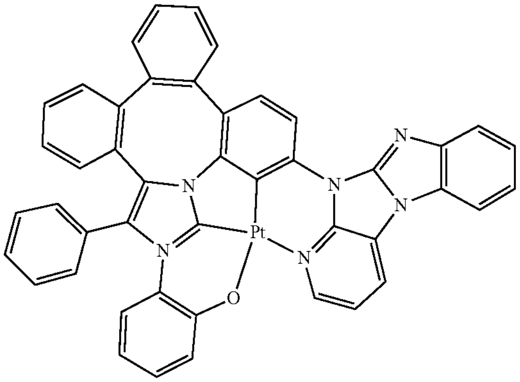
,
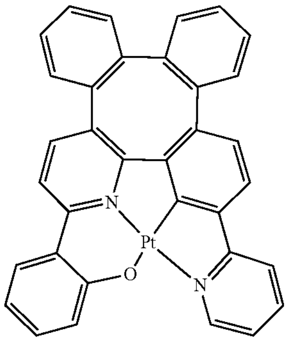
,
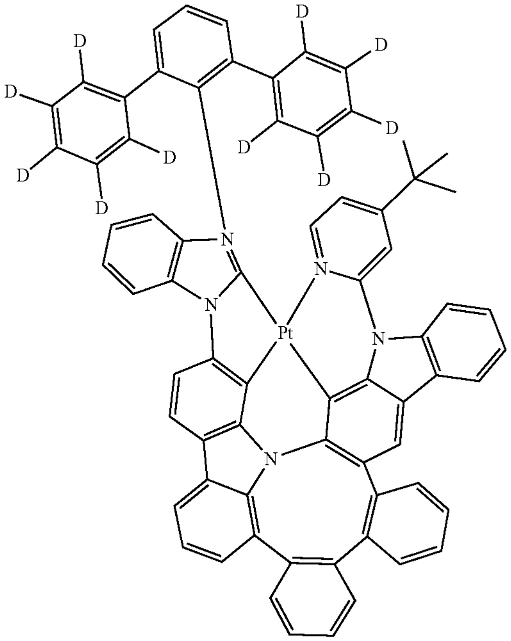
,
-continued
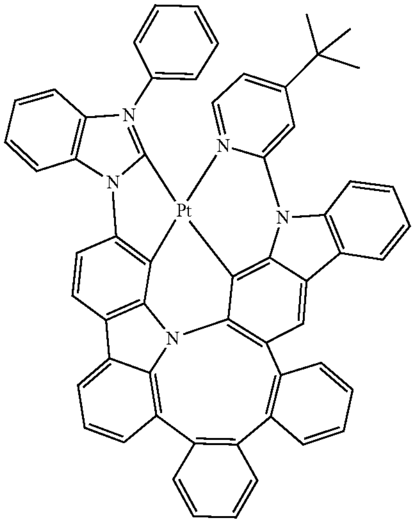
,
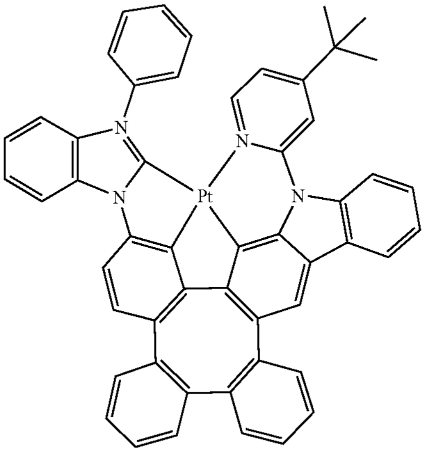
,
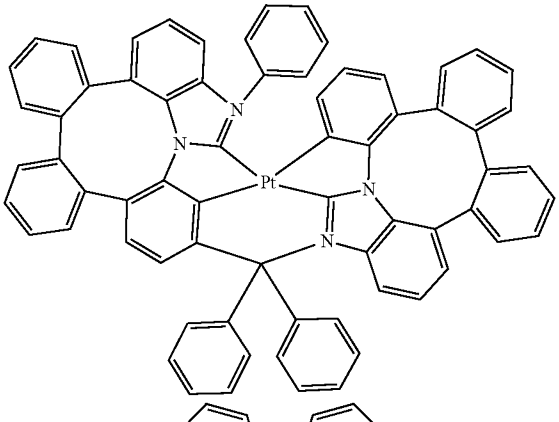
,
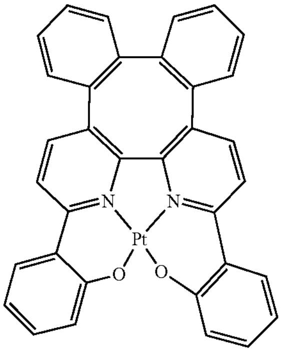
, -continued
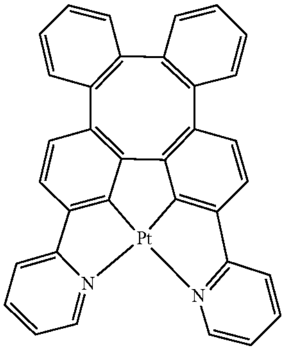
,
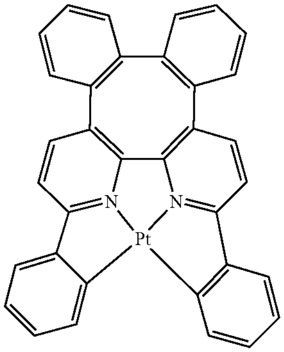
,
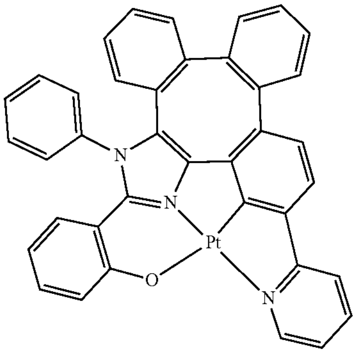
,
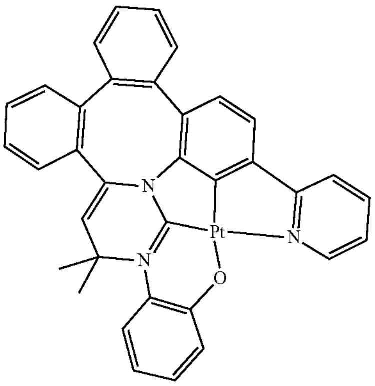
,
-continued
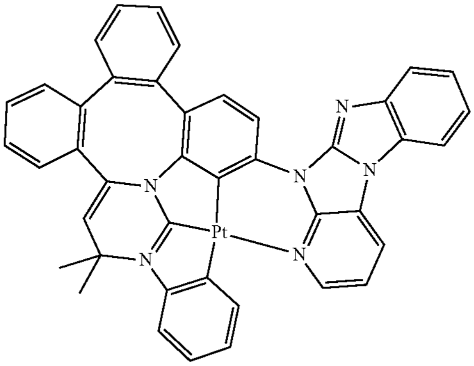
,
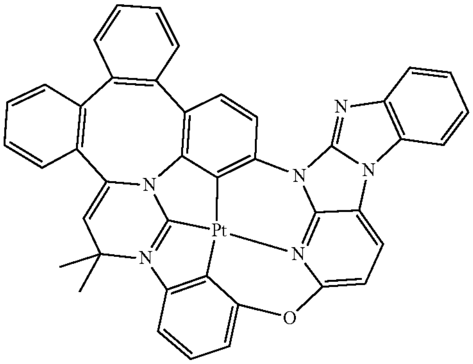
,
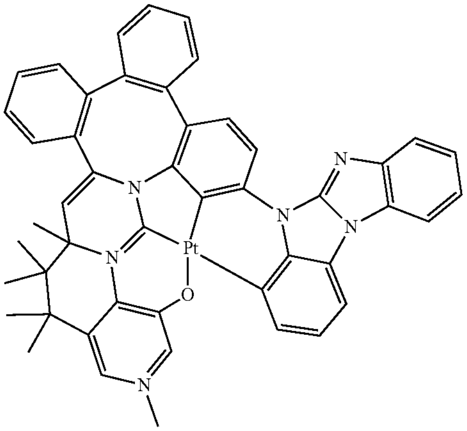
,
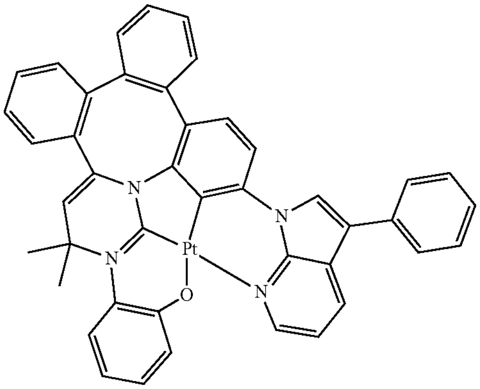
, -continued
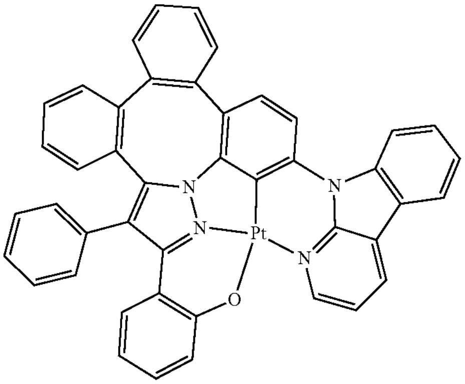
,
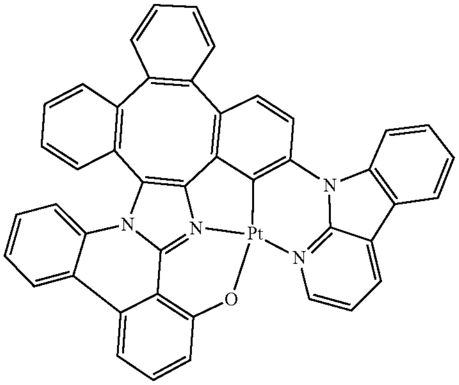
,
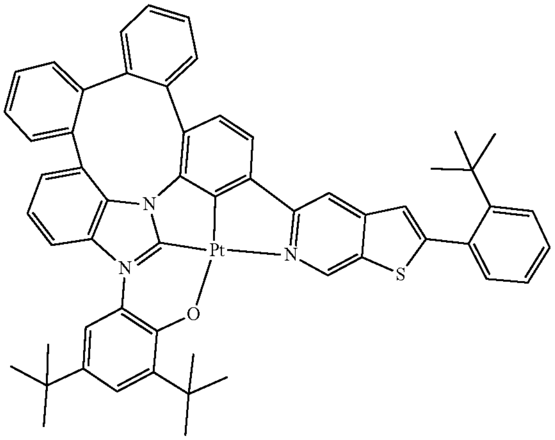
,
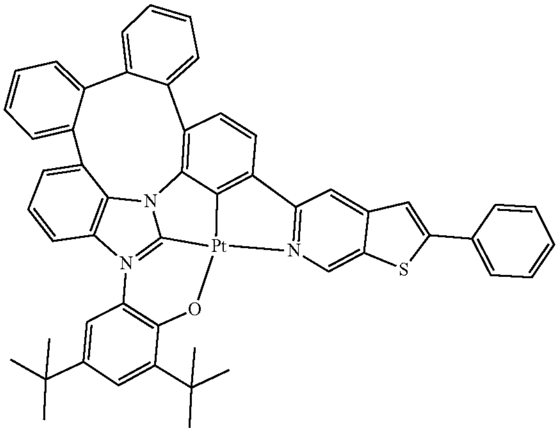
,
-continued
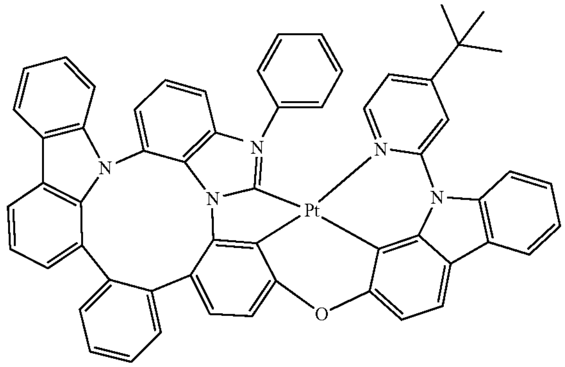
,
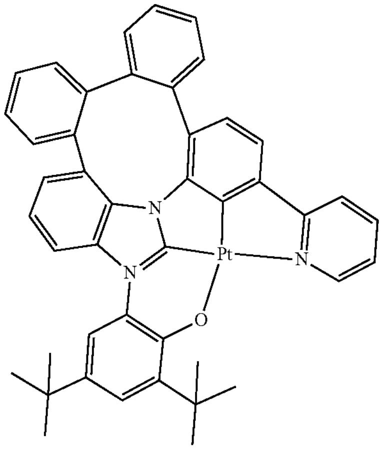
,
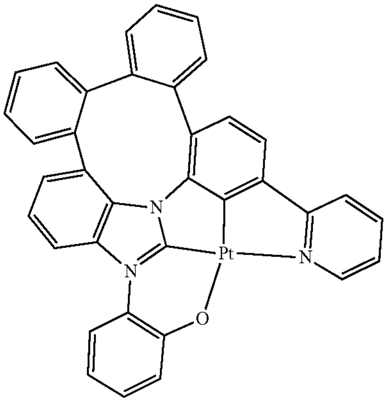
,
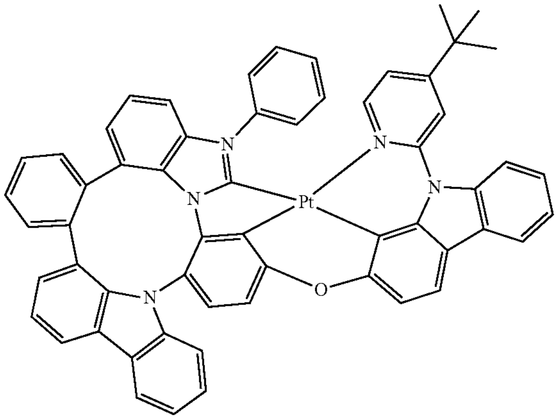
, -continued
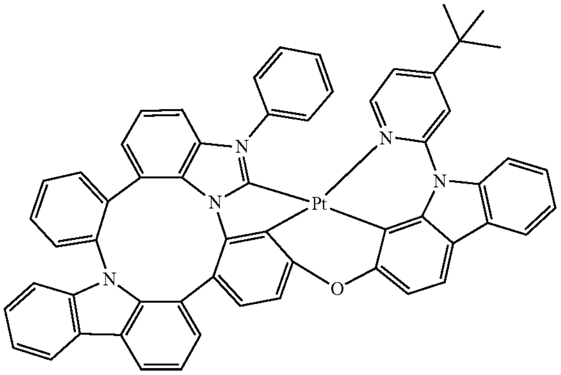
,
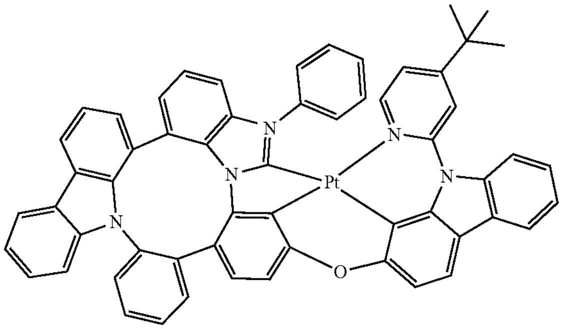
,
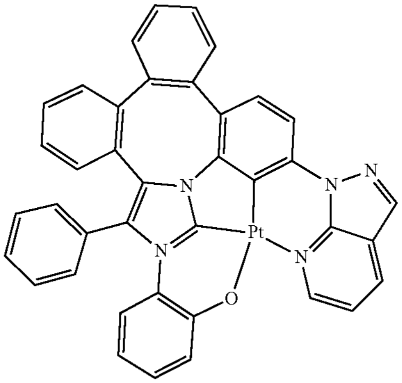
,
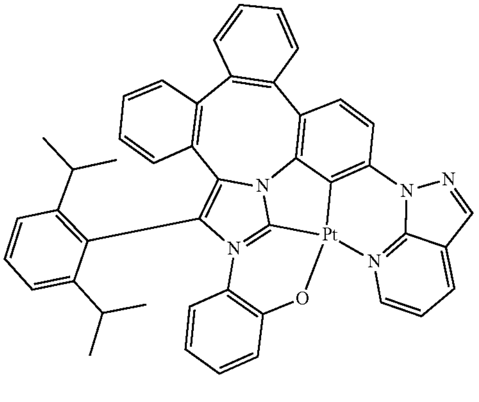
,
-continued
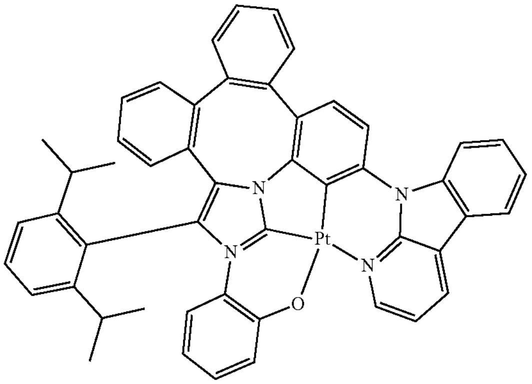
,
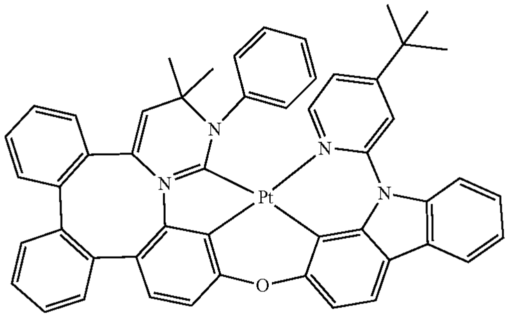
,
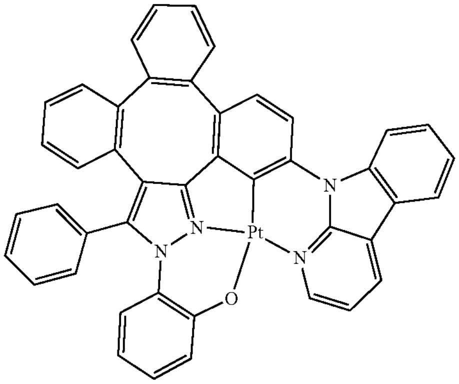
,
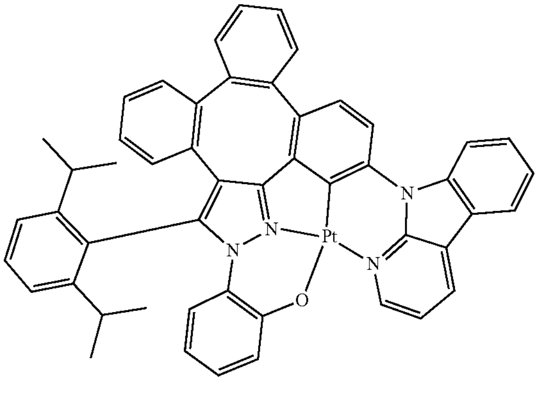
, -continued
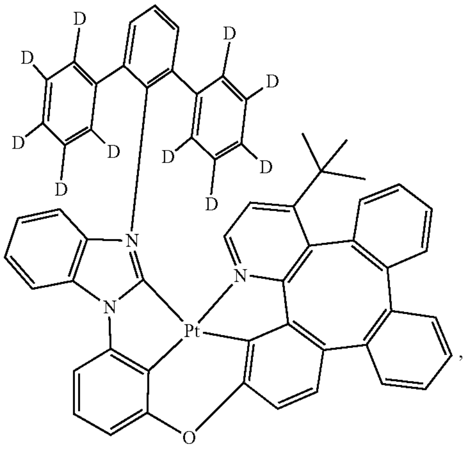
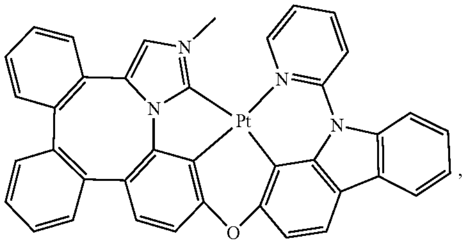
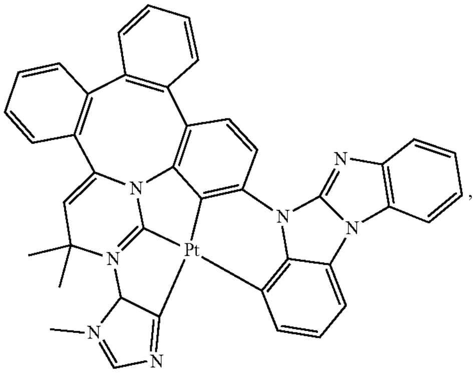
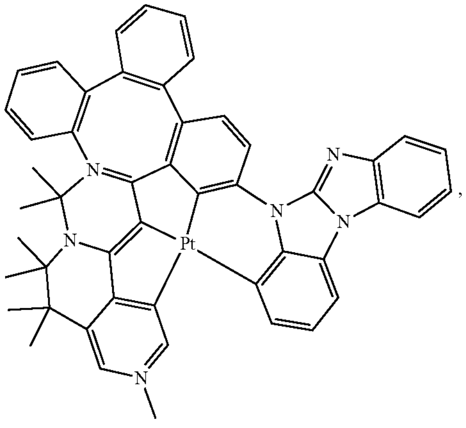
-continued
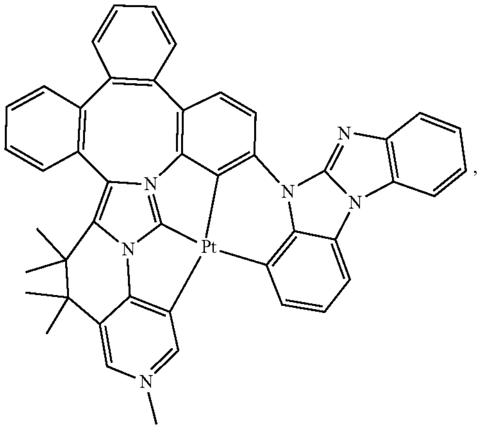
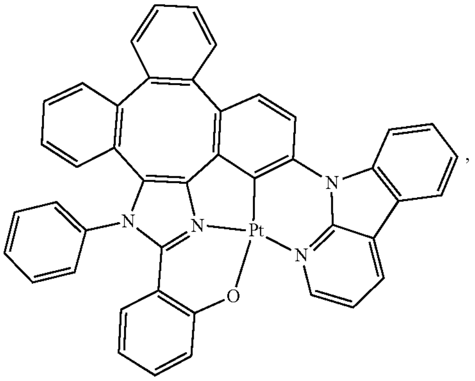
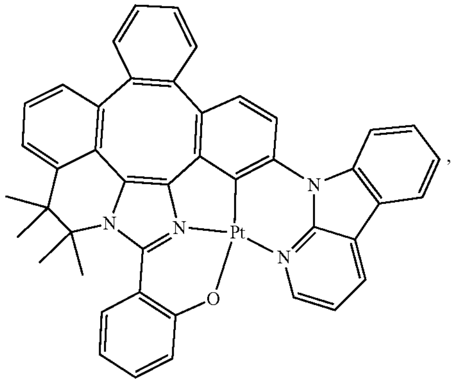
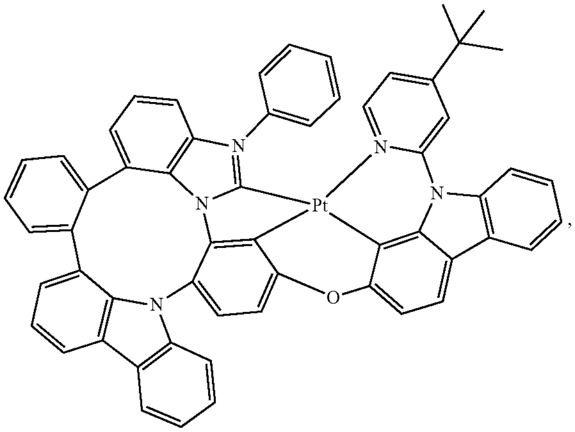

-continued
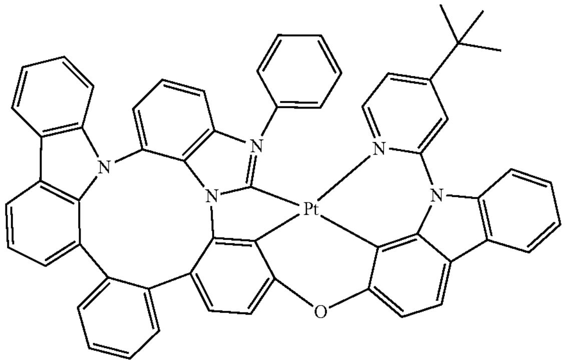
,
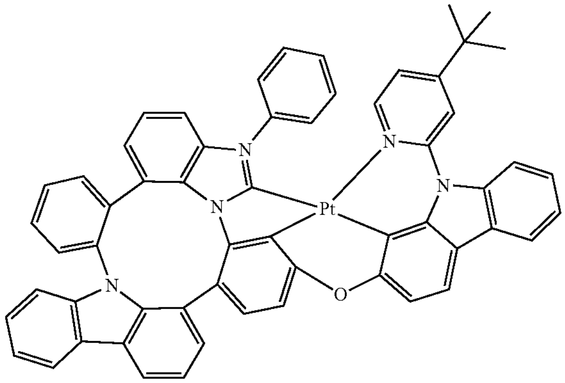
,
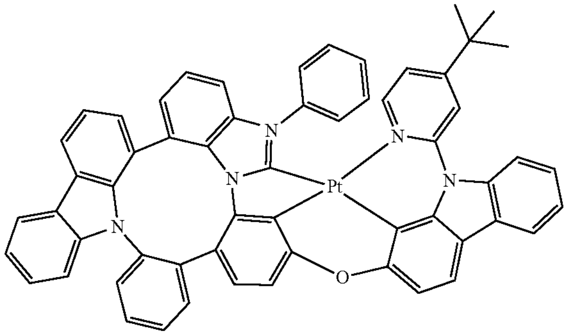
,
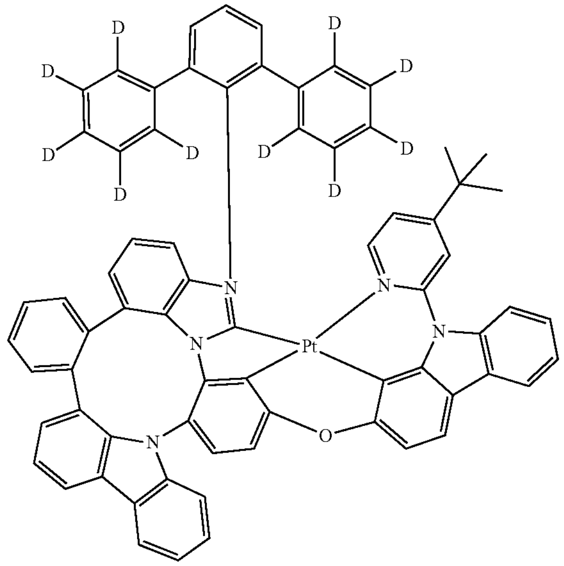
,
-continued
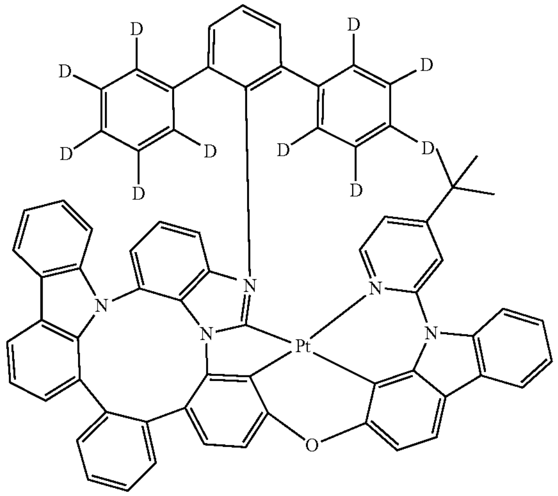
,
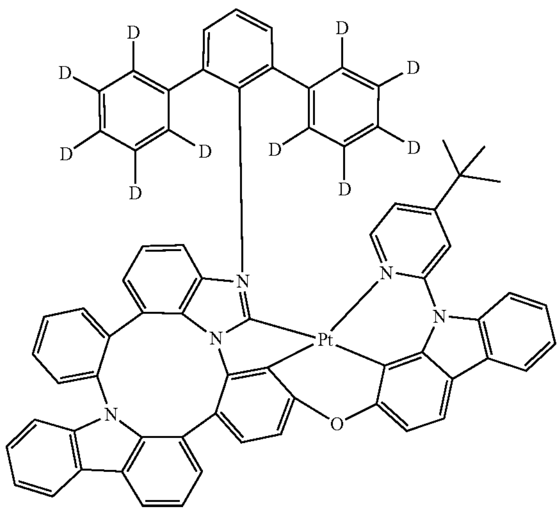
,
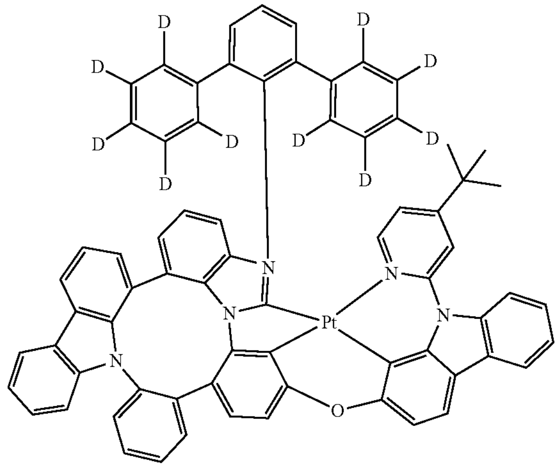
, -continued
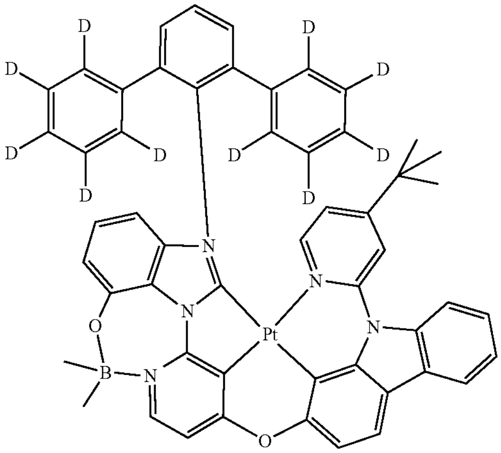,
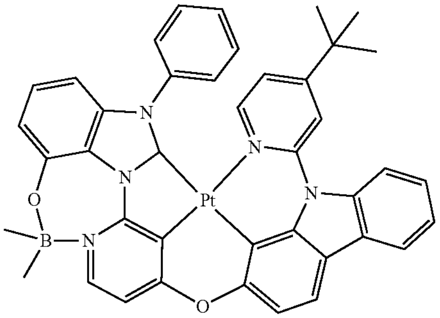,
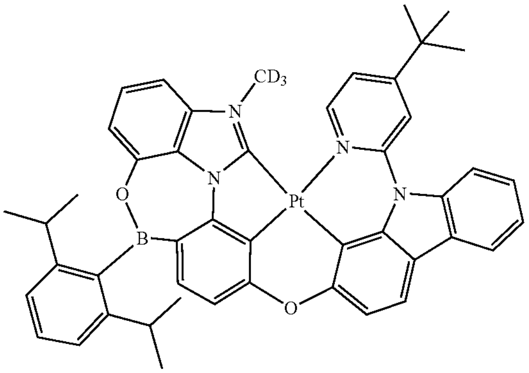,
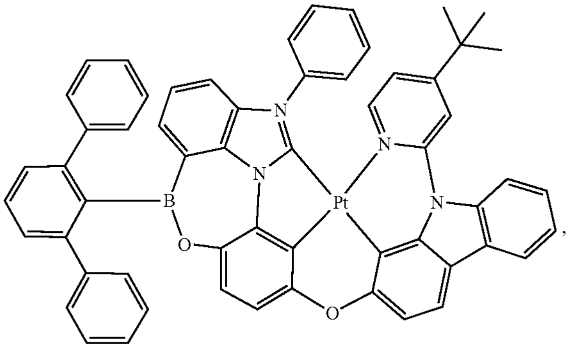,
-continued
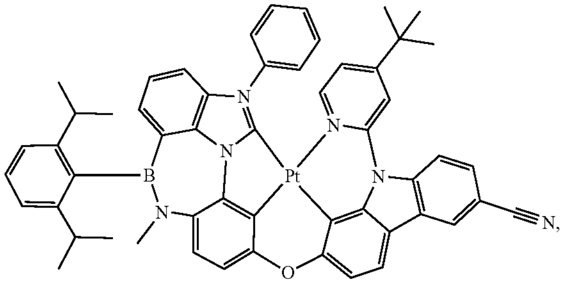,
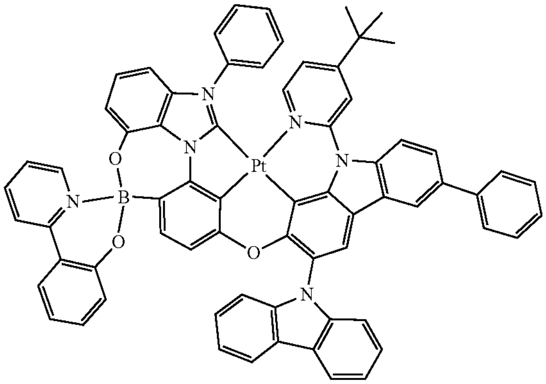,
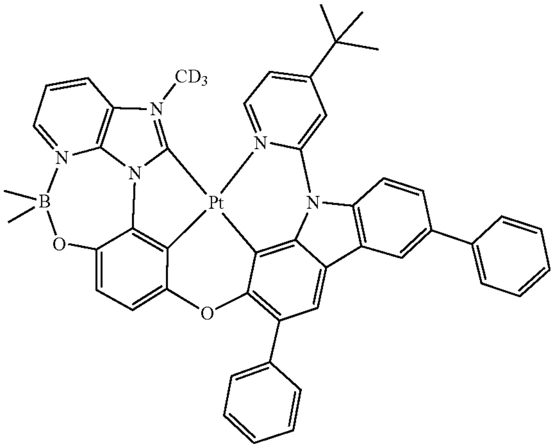,
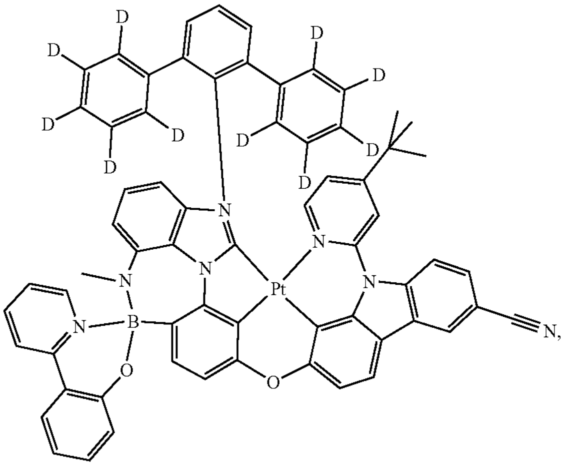, -continued

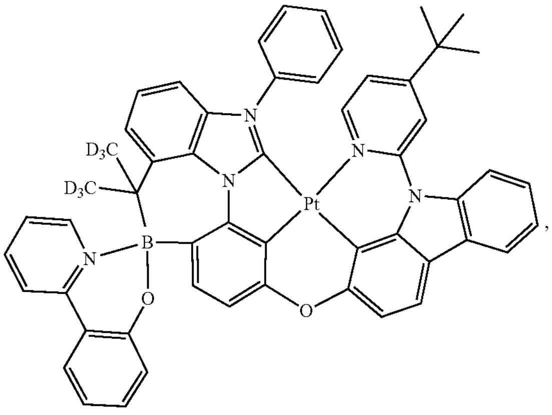

,

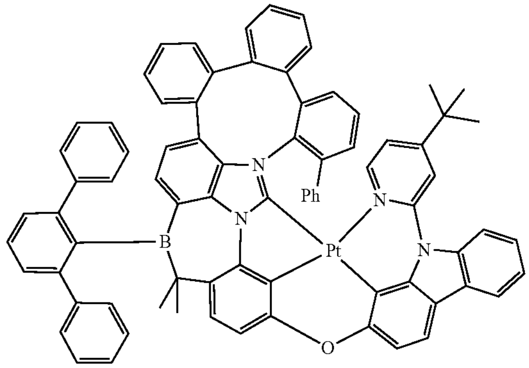

, and

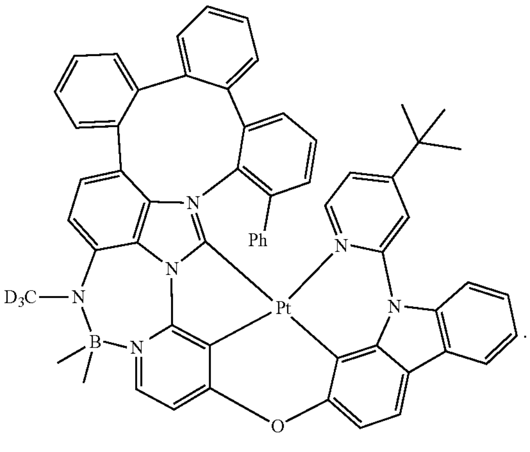

.

14. An organic light emitting device (OLED) comprising:

an anode;

a cathode; and an organic layer disposed between the anode and the cathode, wherein the organic layer comprises a compound comprising a ligand $L_A$ of a structure of Formula I

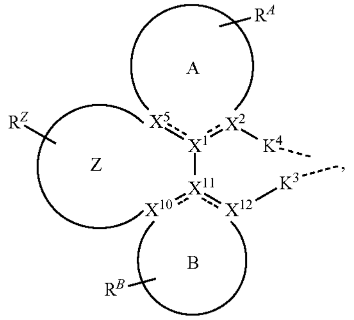

, wherein:

moieties A and B can be each independently a monocyclic or polycyclic fused ring structure comprising 5-membered and/or 6-membered carbocyclic or heterocyclic rings;

ring Z is a 7-, 8-, 9-, or 10-membered ring;

$X^1$, $X^2$, $X^5$, $X^{10}$, $X^{11}$, and $X^{12}$ are each independently C or N, with at least one of $X^1$ or $X^{11}$ being C;

==== is either a single bond or a double bond;

$K^3$ and $K^4$ are each independently selected from the group consisting of a direct bond, O, and S;

$R^A$, $R^B$, and $R^Z$ each independently represent zero, mono, or up to a maximum allowed number of substitutions to its associated ring;

each of $R^A$, $R^B$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two adjacent $R^A$, $R^B$, or $R^Z$ can be joined or fused to form a ring, wherein the ligand $L_A$ is coordinated to a metal M through the two indicated dashed lines;

wherein M is selected from the group consisting of Ru, Os, Ir, Pd, Pt, Cu, Ag, and Au, and can be coordinated to other ligands;

wherein the ligand $L_A$ can be joined with other ligands to form a tridentate, tetradentate, pentadentate, or hexadentate ligand; and at least one of the following is true:

(1) one $R^Z$ is joined or fused with an $R^A$ to form a ring, (2)

(2) one $R^Z$ is joined or fused with an $R^B$ to form a ring; or (3) $L_A$ is joined with another ligand to form a tetradentate ligand.

15. The OLED of claim 14, wherein the organic layer further comprises a host, wherein host comprises at least one chemical moiety selected from the group consisting of triphenylene, carbazole, indolocarbazole, dibenzothiophene, dibenzofuran, dibenzoselenophene, 5,9-dioxa-13b-boranaphtho [3,2,1-de] anthracene, aza-triphenylene, aza-carbazole, aza-indolocarbazole, aza-dibenzothiophene, aza-dibenzofuran, aza-dibenzoselenophene, and aza-(5,9-dioxa-13b-boranaphtho [3,2,1-de] anthracene).

16. A consumer product comprising an organic light-emitting device comprising:

an anode;

a cathode; and an organic layer disposed between the anode and the cathode, wherein the organic layer comprises a compound comprising a ligand $L_A$ of a structure of Formula I

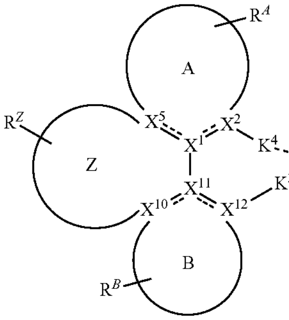

wherein:

moieties A and B can be each independently a monocyclic or polycyclic fused ring structure comprising 5-membered and/or 6-membered carbocyclic or heterocyclic rings;

ring Z is a 7-, 8-, 9-, or 10-membered ring;

$X^1$, $X^2$, $X^5$, $X^{10}$, $X^{11}$, and $X^{12}$ are each independently C or N, with at least one of $X^1$ or $X^{11}$ being C;

$\overset{---}{---}$ is either a single bond or a double bond;

$K^3$ and $K^4$ are each independently selected from the group consisting of a direct bond, O, and S;

$R^A$, $R^B$, and $R^Z$ each independently represent zero, mono, or up to a maximum allowed number of substitutions to its associated ring;

each of $R^A$, $R^B$, and $R^Z$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, germyl, boryl, selenyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; and any two adjacent $R^A$, $R^B$, or $R^Z$ can be joined or fused to form a ring, wherein the ligand $L_A$ is coordinated to a metal M through the two indicated dashed lines;

wherein M is selected from the group consisting of Ru, Os, Ir, Pd, Pt, Cu, Ag, and Au, and can be coordinated to other ligands;

wherein the ligand $L_A$ can be joined with other ligands to form a tridentate, tetradentate, pentadentate, or hexadentate ligand; and at least one of the following is true:

(1) one $R^Z$ is joined or fused with an $R^A$ to form a ring, (2)

(2)one $R^Z$ is joined or fused with an $R^B$ to form a ring: or (3) $L_A$ is joined with another ligand to form a tetradentate ligand.

17. The compound of claim 1, wherein $L_A$ is joined with another ligand to form a tetradentate ligand.

18. The compound of claim 1, wherein one $R^Z$ is joined or fused with an $R^A$ to form a ring.

19. The compound of claim 18, wherein metal M is Ir.

20. The compound of claim 18, wherein ligand $L_A$ is selected from the group consisting of:

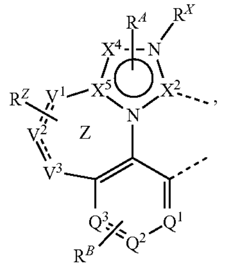

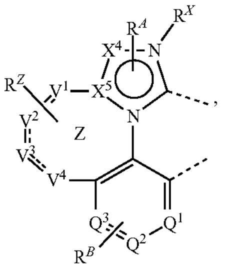

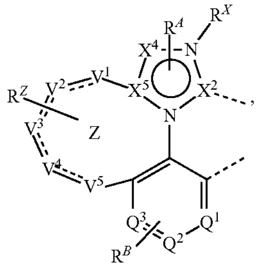

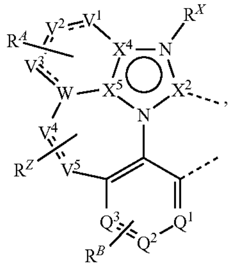

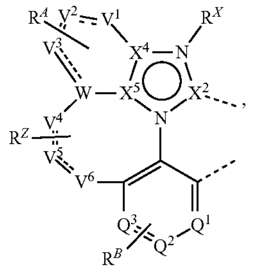

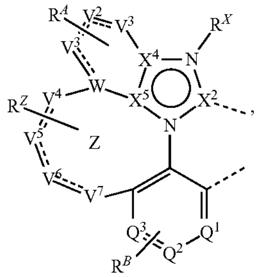

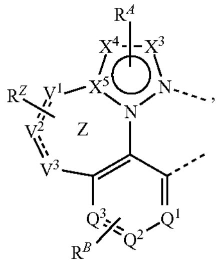

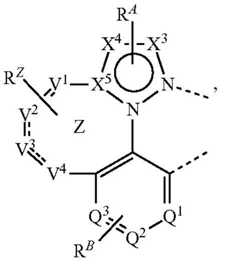

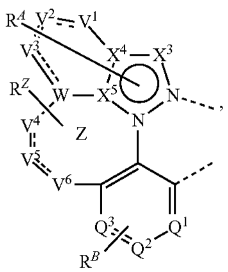

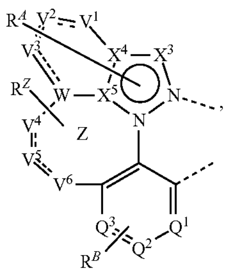

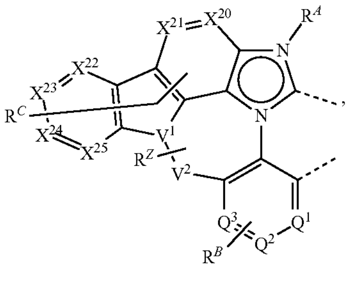

-continued

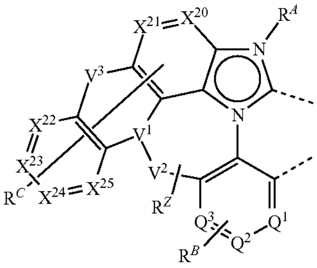
,
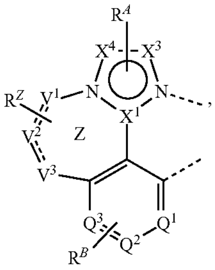
,
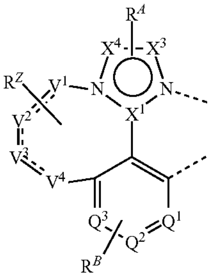
,
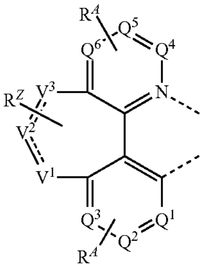
,

-continued

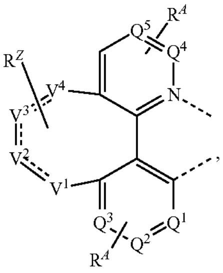
, and
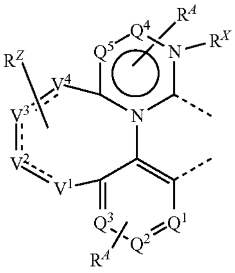
;

wherein:

each of W, $X^3$, $X^4$, and $X^{20}$ to $X^{25}$ is independently C or N;

each of $Q^1$, $Q^2$, $Q^3$, $Q^4$, $Q^5$, and $Q^6$ is each independently C or N;

each of $V^1$, $V^2$, $V^3$, $V^4$, $V^5$, $V^6$, and V is independently C, N, S, O, B, or Si;

$R^X$ for each occurrence is independently a hydrogen or a substituent selected from the group consisting of hydrogen, deuterium, halide, alkyl, cycloalkyl, heteroalkyl, arylalkyl, alkoxy, aryloxy, amino, silyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; and each ══ is independently a single bond or double bond.

* * * * *